United States Patent
Owen et al.

(10) Patent No.: US 11,664,631 B2
(45) Date of Patent: May 30, 2023

(54) ENVIRONMENT SENSING ACTIVE UNITS

(71) Applicant: SNAPRAYS, LLC, Vineyard, UT (US)

(72) Inventors: D. Scott Owen, Bluffdale, UT (US); Jeremy C. Smith, Orem, UT (US); Darren C. Knight, Pleasant Grove, UT (US); R. Camden Robinson, Lindon, UT (US); Jonathan S. Jensen, Pocatello, ID (US); Jesse J Leishman, Orem, UT (US)

(73) Assignee: SnapRays, LLC, Vineyard, UT (US)

( * ) Notice: Subject to any disclaimer, the term of this patent is extended or adjusted under 35 U.S.C. 154(b) by 459 days.

(21) Appl. No.: 16/989,817

(22) Filed: Aug. 10, 2020

(65) Prior Publication Data
US 2020/0412070 A1   Dec. 31, 2020

Related U.S. Application Data

(63) Continuation-in-part of application No. 16/166,965, filed on Oct. 22, 2018, now Pat. No. 11,158,982, and
(Continued)

(51) Int. Cl.
*H02G 3/14* (2006.01)
*H01R 13/66* (2006.01)
(Continued)

(52) U.S. Cl.
CPC .......... *H01R 13/6675* (2013.01); *G05F 3/02* (2013.01); *H02G 3/14* (2013.01); *H04L 43/16* (2013.01);
(Continued)

(58) Field of Classification Search
CPC ............ H02G 3/14; H02G 3/18; H02G 3/081; H05K 5/00; H05K 5/03; H01R 13/7175;
(Continued)

(56) References Cited

U.S. PATENT DOCUMENTS

| 1,938,309 A | 12/1933 | Williams |
| 2,015,698 A | 10/1935 | Tiffany |

(Continued)

FOREIGN PATENT DOCUMENTS

| CA | 2732657 | 2/2011 |
| CN | 201311835 | 9/2009 |

(Continued)

OTHER PUBLICATIONS

Written Opinion of the International Searching Authority for PCT/US2011/050524, pp. 1-3, dated Mar. 26, 2012.
(Continued)

*Primary Examiner* — Angel R Estrada
(74) *Attorney, Agent, or Firm* — Young Basile Hanlon & MacFarlane, P.C.

(57) ABSTRACT

A variety of active units that sense environmental variables and take various actions are described. In one embodiment, an active unit includes at least one sensor to detect a change in an environmental variable and generate a sensor signal and an action module configured to influence the environmental. The active unit may also include a communication module and a processor module configured to accept the sensor signal and determine if the environmental variable exceeds a threshold and to instruct the action module not to take action to influence the environmental variable, and instruct the communication module to transmit a signal to other active units that the environmental variable has exceeded the threshold.

32 Claims, 148 Drawing Sheets

Related U.S. Application Data a continuation-in-part of application No. 15/870,832, filed on Jan. 12, 2018, now Pat. No. 10,109,945, said application No. 16/166,965 is a continuation-in-part of application No. 15/708,082, filed on Sep. 18, 2017, now Pat. No. 10,644,461, which is a continuation-in-part of application No. 29/608,292, filed on Jun. 20, 2017, now Pat. No. Des. 847,608, and a continuation-in-part of application No. 29/608,294, filed on Jun. 20, 2017, now Pat. No. Des. 842,075, and a continuation-in-part of application No. 29/608,295, filed on Jun. 20, 2017, now Pat. No. Des. 842,076, and a continuation-in-part of application No. 29/608,296, filed on Jun. 20, 2017, now Pat. No. Des. 877,599, and a continuation-in-part of application No. 29/608,297, filed on Jun. 20, 2017, now Pat. No. Des. 849,510, and a continuation-in-part of application No. 29/608,300, filed on Jun. 20, 2017, now Pat. No. Des. 849,512, and a continuation-in-part of application No. 29/608,301, filed on Jun. 20, 2017, now Pat. No. Des. 849,513, and a continuation-in-part of application No. 15/496,872, filed on Apr. 25, 2017, now Pat. No. 10,291,007, and a continuation-in-part of application No. 15/486,273, filed on Apr. 12, 2017, now Pat. No. 9,871,324, and a continuation-in-part of application No. 15/486,277, filed on Apr. 12, 2017, now Pat. No. 9,899,814, and a continuation-in-part of application No. 15/486,280, filed on Apr. 12, 2017, now Pat. No. 9,917,430, and a continuation-in-part of application No. 15/481,318, filed on Apr. 6, 2017, now Pat. No. 9,882,361, and a continuation-in-part of application No. 29/599,679, filed on Apr. 5, 2017, now Pat. No. Des. 845,108, and a continuation-in-part of application No. 29/598,255, filed on Mar. 23, 2017, now Pat. No. Des. 819,426, and a continuation-in-part of application No. 29/594,003, filed on Feb. 14, 2017, now Pat. No. Des. 913,963, which is a continuation-in-part of application No. 29/594,005, filed on Feb. 14, 2017, now abandoned, and a continuation-in-part of application No. 29/594,007, filed on Feb. 14, 2017, now Pat. No. Des. 832,224, and a continuation-in-part of application No. 15/428,099, filed on Feb. 8, 2017, now Pat. No. 9,832,841, and a continuation-in-part of application No. 15/409,508, filed on Jan. 18, 2017, now Pat. No. 9,807,829, which is a continuation-in-part of application No. 29/551,208, filed on Jan. 11, 2016, now Pat. No. Des. 809,899, which is a continuation-in-part of application No. 29/522,406, filed on Mar. 30, 2015, now Pat. No. Des. 810,697, and a continuation-in-part of application No. 15/481,280, filed on Apr. 6, 2017, now Pat. No. 9,882,318, which is a continuation-in-part of application No. 15/406,404, filed on Jan. 13, 2017, now Pat. No. 9,742,111, said application No. 16/166,965 is a continuation-in-part of application No. 15/708,082, filed on Sep. 18, 2017, now Pat. No. 10,644,461, which is a continuation-in-part of application No. 15/145,749, filed on May 3, 2016, now Pat. No. 9,787,025, which is a continuation-in-part of application No. 14/549,143, filed on Nov. 20, 2014, now Pat. No. 9,362,728, which is a continuation-in-part of application No. 14/066,621, filed on Oct. 29, 2013, said application No. 16/166,965 is a continuation-in-part of application No. 15/708,082, filed on Sep. 18, 2017, now Pat. No. 10,644,461, which is a continuation-in-part of application No. 14/678,746, filed on Apr. 3, 2015, now Pat. No. 9,768,562, which is a continuation of application No. 14/066,637, filed on Oct. 29, 2013, now Pat. No. 9,035,181, which is a continuation-in-part of application No. 13/461,915, filed on May 2, 2012, now Pat. No. 8,912,442, said application No. 16/166,965 is a continuation-in-part of application No. 15/920,047, filed on Mar. 13, 2018, now Pat. No. 10,404,045, and a continuation-in-part of application No. 29/629,812, filed on Dec. 15, 2017, now Pat. No. Des. 887,819, said application No. 16/989,817 is a continuation-in-part of application No. 16/538,722, filed on Aug. 12, 2019, now Pat. No. 11,394,157, which is a continuation of application No. 16/244,819, filed on Jan. 10, 2019, now Pat. No. 10,381,788, which is a continuation-in-part of application No. 29/676,102, filed on Jan. 8, 2019, now Pat. No. Des. 881,137, and a continuation-in-part of application No. 29/676,104, filed on Jan. 8, 2019, now abandoned, and a continuation-in-part of application No. 16/166,965, filed on Oct. 22, 2018, now Pat. No. 11,158,982, and a continuation-in-part of application No. 15/708,082, filed on Sep. 18, 2017, now Pat. No. 10,644,461.

(60) Provisional application No. 62/579,033, filed on Oct. 30, 2017, provisional application No. 62/536,452, filed on Jul. 24, 2017, provisional application No. 62/522,691, filed on Jun. 21, 2017, provisional application No. 62/460,094, filed on Feb. 17, 2017, provisional application No. 62/279,831, filed on Jan. 18, 2016, provisional application No. 62/081,539, filed on Nov. 18, 2014, provisional application No. 62/027,784, filed on Jul. 23, 2014, provisional application No. 61/906,651, filed on Nov. 20, 2013, provisional application No. 61/836,972, filed on Jun. 19, 2013, provisional application No. 61/778,386, filed on Mar. 12, 2013, provisional application No. 61/720,131, filed on Oct. 30, 2012, provisional application No. 61/574,344, filed on Aug. 1, 2011.

(51) Int. Cl.
  *G05F 3/02* (2006.01)
  *H05K 5/03* (2006.01)
  *H04L 43/16* (2022.01)
  *H05B 47/115* (2020.01)
  *H05B 47/11* (2020.01)

(52) U.S. Cl.
  CPC ........... *H05B 47/11* (2020.01); *H05B 47/115* (2020.01); *H05K 5/03* (2013.01)

(58) Field of Classification Search
  CPC .... H01R 27/02; H01R 13/665; H01R 25/006; H01R 13/04; H01R 13/447; H01R 13/6683; H01R 13/6675; H05B 33/00; H05B 47/115; H05B 47/11; H01H 9/0264; H01H 21/04; H01H 9/0271; H01H 13/04; H02B 1/46; F21V 33/00; F21V 23/0442; F21S 8/033; F21S 9/022; G05F 3/02; F21Y 2115/10; H04L 43/16
  USPC ............ 174/66, 67; 220/241, 242; 439/136, 439/143; 362/95
  See application file for complete search history.

(56) References Cited

U.S. PATENT DOCUMENTS

| | | |
|---|---|---|
| 2,045,199 A | 6/1936 | Petersen |
| 2,193,740 A | 9/1938 | Reed |
| 2,134,695 A | 11/1938 | Bigman |
| 2,227,549 A | 1/1941 | McNeill |
| D141,030 S | 4/1945 | Wheeler, Jr. |
| 2,385,620 A | 9/1945 | Fleckenstein |
| 2,428,167 A | 9/1947 | Linton |
| 2,515,820 A | 7/1950 | Clark |
| 2,575,820 A | 11/1951 | Linton |
| 2,580,056 A | 12/1951 | Wheeler, Jr. |
| 2,749,381 A | 6/1956 | Farish, Jr. |
| 2,880,285 A | 3/1959 | Robison et al. |
| 2,908,743 A | 10/1959 | Premoshis |
| 2,934,590 A | 4/1960 | Thompson et al. |
| 3,120,414 A | 2/1964 | Farish, Jr. |
| 3,168,612 A | 2/1965 | Sorenson |
| 3,307,030 A | 2/1967 | Francisco |
| D212,760 S | 11/1968 | Bordner |
| 3,522,595 A | 8/1970 | White |
| 3,588,489 A | 6/1971 | Gaines |
| 3,680,237 A | 8/1972 | Finnerty, Sr. |
| 3,739,226 A | 6/1973 | Seiter et al. |
| D230,274 S | 2/1974 | Pulos |
| 3,859,454 A | 1/1975 | Mann |
| 3,879,101 A | 4/1975 | McKissic |
| 3,895,225 A | 7/1975 | Prior |
| 4,000,405 A | 12/1976 | Horwinski |
| 4,038,582 A | 7/1977 | Horwinski |
| 4,117,258 A | 9/1978 | Shanker |
| 4,255,780 A | 3/1981 | Sakellaris |
| 4,282,591 A | 8/1981 | Andreuccetti |
| 4,494,815 A | 1/1985 | Brzostek et al. |
| 4,514,789 A | 4/1985 | Jester |
| 4,534,486 A | 8/1985 | Eidson |
| 4,546,419 A | 10/1985 | Johnson |
| 4,611,264 A | 9/1986 | Bradley |
| 4,616,285 A | 10/1986 | Sackett |
| 4,617,613 A | 10/1986 | Rice |
| 4,755,913 A | 7/1988 | Sleveland |
| 4,774,641 A | 9/1988 | Rice |
| 4,801,271 A | 1/1989 | Piper |
| 4,952,755 A | 8/1990 | Engel et al. |
| 4,970,349 A | 11/1990 | Jones |
| 5,009,618 A | 4/1991 | Black et al. |
| 5,016,398 A | 5/1991 | Fukunaga |
| 5,096,439 A | 3/1992 | Arnett |
| D330,267 S | 10/1992 | Hendrix |
| 5,153,816 A | 10/1992 | Griffin |
| 5,186,682 A | 2/1993 | Iida |
| 5,248,919 A | 9/1993 | Hanna |
| 5,290,175 A | 3/1994 | Robinson |
| 5,384,428 A | 1/1995 | Luu |
| 5,406,439 A | 4/1995 | Crane et al. |
| 5,473,517 A | 12/1995 | Blackman |
| 5,477,010 A | 12/1995 | Buckshaw et al. |
| D366,339 S | 1/1996 | Waller |
| 5,481,442 A | 1/1996 | Dickie et al. |
| 5,485,356 A | 1/1996 | Nguyen |
| 5,584,725 A | 12/1996 | Tseng |
| 5,622,424 A | 4/1997 | Brady |
| 5,660,459 A | 8/1997 | Appelberg |
| 5,670,776 A | 9/1997 | Rothbaum |
| 5,683,166 A | 11/1997 | Lutzker |
| D395,314 S | 6/1998 | Oikawa |
| D399,825 S | 10/1998 | Heung et al. |
| 5,816,682 A | 10/1998 | Marischen |
| D401,566 S | 11/1998 | Gesmondi |
| 5,833,350 A | 11/1998 | Moreland |
| D407,072 S | 3/1999 | Gaule |
| 5,914,826 A | 6/1999 | Smallwood |
| 5,998,735 A | 12/1999 | Patterson, Jr. |
| 6,000,807 A | 12/1999 | Moreland |
| 6,010,228 A | 1/2000 | Blackman |
| 6,023,021 A | 2/2000 | Matthews et al. |
| D427,086 S | 6/2000 | Gaule |
| 6,087,588 A | 7/2000 | Soules |
| 6,089,893 A | 7/2000 | Yu et al. |
| D429,829 S | 8/2000 | Doran |
| D443,500 S | 6/2001 | Luu |
| 6,310,291 B1 | 10/2001 | Clough |
| 6,341,981 B1 | 1/2002 | Gorman |
| D456,239 S | 4/2002 | Luu |
| 6,390,647 B1 | 5/2002 | Shaeffer |
| 6,395,981 B1 | 5/2002 | Ford et al. |
| 6,423,900 B1 | 7/2002 | Soules |
| D464,865 S | 10/2002 | Luu |
| 6,457,843 B1 | 10/2002 | Kester et al. |
| D473,528 S | 4/2003 | Wengrower |
| 6,547,411 B1 | 4/2003 | Dornbusch |
| 6,608,253 B1 | 8/2003 | Rintz |
| 6,648,496 B1 | 11/2003 | Elghoroury et al. |
| 6,765,149 B1 | 7/2004 | Ku |
| 6,774,328 B2 | 8/2004 | Adams et al. |
| 6,805,469 B1 | 10/2004 | Barton |
| 6,808,283 B2 | 10/2004 | Tsao |
| D500,743 S | 1/2005 | Savicki, Jr. et al. |
| 6,867,370 B2 | 3/2005 | Compagnone |
| 6,883,927 B2 | 4/2005 | Cunningham et al. |
| 6,891,284 B2 | 5/2005 | Tilley |
| 6,895,177 B2 | 5/2005 | He et al. |
| 6,974,910 B2 | 12/2005 | Rohmer |
| 7,011,422 B2 | 3/2006 | Robertson et al. |
| 7,019,212 B1 | 3/2006 | Esmailzadeh |
| 7,036,948 B1 | 5/2006 | Wyatt |
| 7,064,498 B2 | 6/2006 | Dowling et al. |
| D542,627 S | 5/2007 | Rohmer et al. |
| 7,247,793 B2 | 7/2007 | Hinkson et al. |
| 7,270,436 B2 | 9/2007 | Jasper |
| 7,273,983 B1 | 9/2007 | Rintz |
| 7,318,653 B2 | 1/2008 | Chien |
| 7,321,348 B2 | 1/2008 | Cok et al. |
| D561,558 S | 2/2008 | Jackson |
| D561,559 S | 2/2008 | Krumpe |
| D567,633 S | 4/2008 | Anderson |
| 7,360,912 B1 | 4/2008 | Savicki, Jr. |
| D573,005 S | 7/2008 | Huang |
| D576,566 S | 9/2008 | Wu et al. |
| D577,985 S | 10/2008 | Kidman |
| 7,480,123 B2 | 1/2009 | Jones |
| 7,506,990 B2 | 3/2009 | Glazner |
| 7,511,231 B2 | 3/2009 | Drane et al. |
| 7,547,131 B2 | 6/2009 | Faunce |
| 7,549,785 B2 | 6/2009 | Faunce |
| 7,576,285 B1 | 8/2009 | Savicki, Jr. |
| D603,984 S | 11/2009 | Richter |
| D606,029 S | 12/2009 | Chou |
| 7,674,976 B2 | 3/2010 | Eastin |
| 7,745,750 B2 | 6/2010 | Hewson et al. |
| 7,821,160 B1 | 10/2010 | Roosli et al. |
| 7,850,322 B2 | 12/2010 | Glazner et al. |
| 7,918,667 B1 | 4/2011 | Shim |
| 7,946,871 B1 | 5/2011 | Yu et al. |
| 8,003,886 B1 | 8/2011 | Rintz |
| 8,063,303 B1 | 11/2011 | McBain |
| D650,112 S | 12/2011 | Bryant |
| 8,148,637 B2 | 4/2012 | Davidson |
| 8,158,885 B2 | 4/2012 | Eastin |
| 8,175,533 B2 | 5/2012 | Schubert |
| D666,471 S | 9/2012 | Peckham |
| 8,304,652 B2 | 11/2012 | McBain |
| 8,393,747 B2 | 3/2013 | Kevelos et al. |
| 8,467,734 B2 | 6/2013 | Schubert |
| 8,511,866 B1 | 8/2013 | Mendez |
| 8,558,710 B1 | 10/2013 | Nitz |
| 8,564,279 B2 | 10/2013 | Johnson et al. |
| 8,629,617 B2 | 1/2014 | Richards et al. |
| 8,638,085 B2 | 1/2014 | Hilton et al. |
| 8,668,347 B2 | 3/2014 | Ebeling |
| 8,697,991 B2 | 4/2014 | Davidson |
| 8,770,424 B1 | 7/2014 | Shaw et al. |
| 8,797,723 B2 | 8/2014 | Hilton et al. |
| D719,699 S | 12/2014 | Bryant |
| 8,912,442 B2 | 12/2014 | Smith |
| D721,043 S | 1/2015 | Tonnesen |

(56) References Cited

U.S. PATENT DOCUMENTS

| | | | |
|---|---|---|---|
| 9,035,180 B2 | 5/2015 | Smith et al. | |
| 9,035,181 B2 | 5/2015 | Smith et al. | |
| 9,362,728 B2 | 6/2016 | Smith et al. | |
| 9,464,795 B2 | 10/2016 | Ebeling | |
| 9,482,426 B2 | 11/2016 | Diotte | |
| 9,575,587 B2 | 2/2017 | O'Keeffe | |
| 9,742,111 B2 | 8/2017 | Smith et al. | |
| 9,755,374 B2 | 9/2017 | St. Laurent et al. | |
| 9,768,562 B2 | 9/2017 | Smith et al. | |
| 9,774,154 B2 | 9/2017 | St. Laurent et al. | |
| 9,807,829 B2 | 10/2017 | Jensen | |
| 9,832,841 B2 | 11/2017 | Knight et al. | |
| 9,871,324 B2 | 1/2018 | Smith et al. | |
| 9,882,318 B2 | 1/2018 | Smith et al. | |
| 9,882,361 B2 | 1/2018 | Smith et al. | |
| 9,899,814 B2 | 2/2018 | Smith et al. | |
| 9,917,430 B2 | 3/2018 | Smith et al. | |
| D819,426 S | 6/2018 | Smith et al. | |
| 9,997,860 B1 | 6/2018 | Hernandez, Jr. | |
| 10,109,945 B2 | 10/2018 | Smith et al. | |
| 10,136,534 B2 | 11/2018 | Ebeling | |
| 10,364,977 B2 * | 7/2019 | O'Reilly | H02G 3/14 |
| 10,506,316 B2 | 12/2019 | Ebeling et al. | |
| 10,586,666 B2 | 3/2020 | Bailey et al. | |
| 10,630,031 B1 | 4/2020 | Baldwin | |
| 10,644,465 B2 * | 5/2020 | O'Reilly | H01R 13/70 |
| 10,667,347 B2 | 5/2020 | Fadell et al. | |
| 10,720,727 B1 | 7/2020 | Shotey et al. | |
| 11,394,157 B2 * | 7/2022 | Smith | H05K 5/03 |
| 11,489,298 B2 * | 11/2022 | O'Reilly | H02G 3/14 |
| 2001/0046130 A1 | 11/2001 | Cunningham et al. | |
| 2002/0131262 A1 | 9/2002 | Amburgey | |
| 2003/0013503 A1 | 1/2003 | Menard et al. | |
| 2003/0124022 A1 | 7/2003 | Georges et al. | |
| 2004/0247300 A1 | 12/2004 | He et al. | |
| 2005/0264383 A1 | 12/2005 | Zhang | |
| 2006/0065510 A1 | 3/2006 | Kiko et al. | |
| 2006/0072302 A1 | 4/2006 | Chien | |
| 2006/0077684 A1 | 4/2006 | Yuen | |
| 2006/0161270 A1 | 7/2006 | Luskin et al. | |
| 2006/0170380 A1 | 8/2006 | Evans | |
| 2006/0262462 A1 | 11/2006 | Barton | |
| 2007/0120978 A1 | 5/2007 | Jones | |
| 2007/0206375 A1 | 9/2007 | Piepgras et al. | |
| 2008/0073117 A1 | 3/2008 | Misener | |
| 2008/0233780 A1 | 9/2008 | Waters et al. | |
| 2008/0266121 A1 | 10/2008 | Ellul | |
| 2009/0153438 A1 | 6/2009 | Miller et al. | |
| 2009/0225480 A1 | 9/2009 | Baxter | |
| 2009/0284385 A1 | 11/2009 | Tang et al. | |
| 2009/0322159 A1 | 12/2009 | Dubose et al. | |
| 2010/0033950 A1 | 2/2010 | Farrell | |
| 2011/0056720 A1 | 3/2011 | Davidson | |
| 2011/0082599 A1 | 4/2011 | Shinde et al. | |
| 2011/0210833 A1 | 9/2011 | McNeely et al. | |
| 2011/0228552 A1 | 9/2011 | Kevelos et al. | |
| 2012/0008307 A1 | 1/2012 | Delany | |
| 2012/0013257 A1 | 1/2012 | Sibert | |
| 2012/0068612 A1 | 3/2012 | Ebeling | |
| 2012/0156937 A1 | 6/2012 | Almouli | |
| 2012/0182172 A1 | 7/2012 | Sorensen | |
| 2012/0215470 A1 | 8/2012 | Maguire | |
| 2012/0316808 A1 | 12/2012 | Frader-Thompson et al. | |
| 2013/0043978 A1 | 2/2013 | Brooks | |
| 2013/0063848 A1 | 3/2013 | Thorpe et al. | |
| 2013/0076242 A1 | 3/2013 | Moreland | |
| 2013/0221868 A1 | 8/2013 | Diotte | |
| 2013/0240470 A1 | 9/2013 | Huang | |
| 2015/0371534 A1 | 12/2015 | Dimberg et al. | |
| 2017/0018890 A1 | 1/2017 | St. Laurent | |
| 2017/0018897 A1 | 1/2017 | St. Laurent | |
| 2017/0214188 A1 | 7/2017 | Smith | |
| 2018/0048099 A1 | 2/2018 | Diotte | |
| 2019/0090372 A1 | 3/2019 | Ebeling | |
| 2019/0122832 A1 | 4/2019 | Smith | |
| 2019/0195445 A1 | 6/2019 | Chien | |
| 2020/0154186 A1 | 5/2020 | Ebeling et al. | |

FOREIGN PATENT DOCUMENTS

| | | |
|---|---|---|
| DE | 202006006354 | 10/2007 |
| EP | 2211210 | 7/2010 |
| KR | 1019930025223 | 6/1995 |
| KR | 1019950015932 | 6/1995 |
| KR | 1020090098056 | 9/2009 |
| KR | 1020080047328 | 11/2009 |
| KR | 1020090121424 | 11/2009 |
| KR | 100955064 | 4/2010 |
| WO | 2007122141 | 11/2007 |
| WO | 2012006812 | 1/2012 |
| WO | 2012033746 | 3/2012 |
| WO | 2013019394 | 2/2013 |
| WO | 2014070863 | 5/2014 |

OTHER PUBLICATIONS

Written Opinion of the International Searching Authority for PCT/US2020/045678, pp. 1-5, dated Apr. 29, 2021.
Permaglo Night Light, www.costco.ca, accessed Mar. 21, 2017, pp. 1-4.
PermaGLO Safety Lighting Products, www.permaglo.com, accessed Mar. 21, 2017, 1 page.
Request for Ex Parte Reexamination for U.S. Pat. No. 9,035,180, May 19, 2015.
TekSkCo Technical Systems Company—Plug into The Future, at least as early as Jul. 16, 2009.
Request for Ex Parte Reexamination for U.S. Pat. No. 8,912,442, May 19, 2015.
Ontel answer and Affirmative Defenses to Plaintiffs Second Amended Complaint, U.S. District Court filing, Jun. 5, 2017.
Ontel Defendants LPR 2.2(b) Initial Disclosures, U.S. District Court filing, Jul. 14, 2017.
Ontel Defendants LPR 2.4 Preliminary Non-Infringement and Invalidity Contentions, Aug. 8, 2017.
Ontel Defendants Memorandum in Opposition to Plaintiffs Motion for Leave to File a Second Amended Complaint, U.S. District Court filing, Apr. 11, 2017.
U.S. Appl. No. 61/380,561 made publicly accessible with U.S. Patent Application Publication No. 2013/0221868 on Aug. 29, 2013, pp. 1-19.
Office Action dated Jan. 26, 2018 for U.S. Appl. No. 90/014,022.
Office Action dated Feb. 23, 2018 for U.S. Appl. No. 90/014,022.
Office Action dated Sep. 20, 2018 for U.S. Appl. No. 15/920,047.
Initial Expert Report of Michael Thuma.
UL warns of night light with unauthorized UL Mark, Product Safety Alert, Jul. 13, 2009, pp. 1-2, Electrical Safety Authority.
Plate Pals Wallplate Thermometers, http://www.platepals.com/home.html. Last visited Apr. 12, 2017. ,2006.
Respondent Alltrade Tools LLC's Notice of Prior Art.
Respondent Alltrade Tools LLC's Second Supplemental Invalidity Contentions.
Respondent Alltrade Tools LLC's Supplemental Invalidity Contentions.
Respondent Enstant Technology Co., Ltd,'s Response to Compainant Snaprays, LLC's Invalidity Contentions Interrogatories.
Respondent Ontel Products Corporation's Notice of Prior Art.
Respondent Enstant Technology Co., Ltd. and Vistek Technology Co., Lts.'s Notice of Prior Art.
International Search Report for PCT/US2011/050524, pp. 1-3, dated Mar. 28, 2012.
Written Opinion of the International Searching Authority for PCT/US2011/050524, pp. 1-3, dated Mar. 7, 2013.
International Preliminary Report on Patentability for PCT/US2011/050524, pp. 1-4, dated Mar. 13, 2013.

* cited by examiner

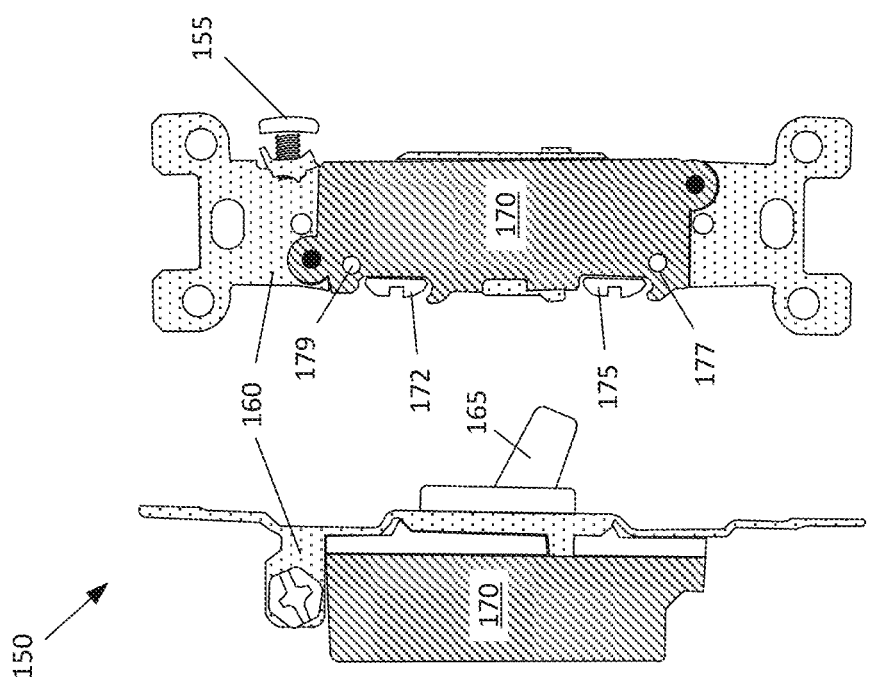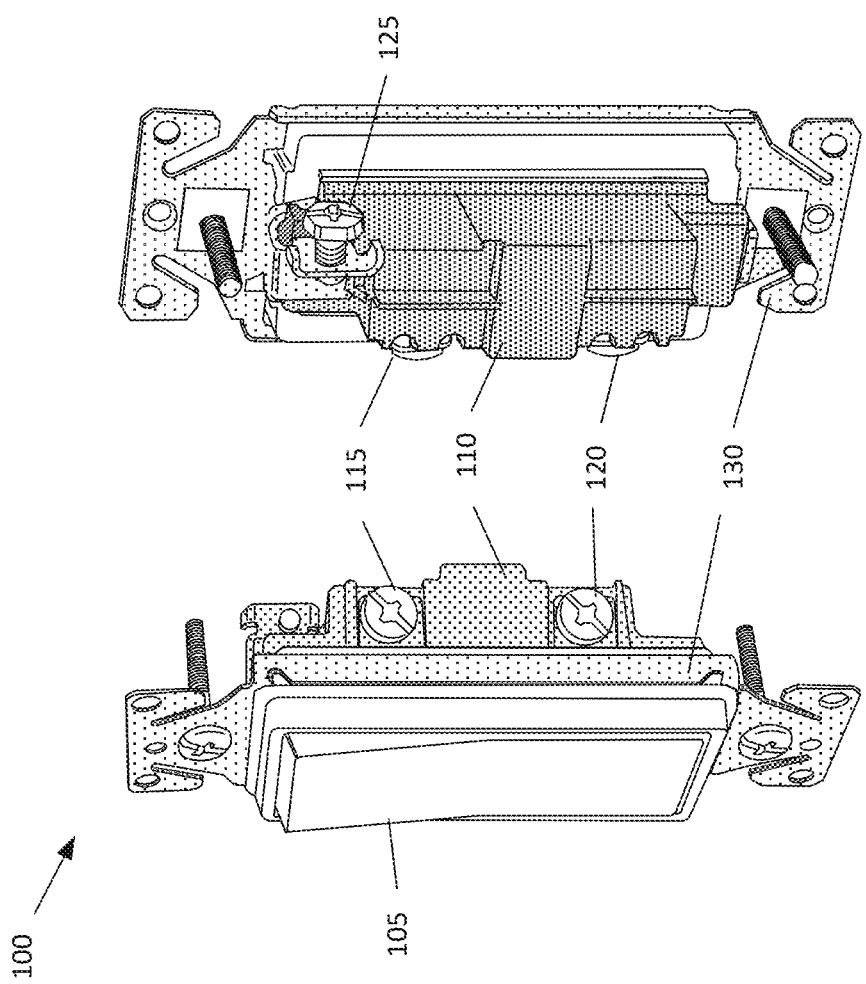

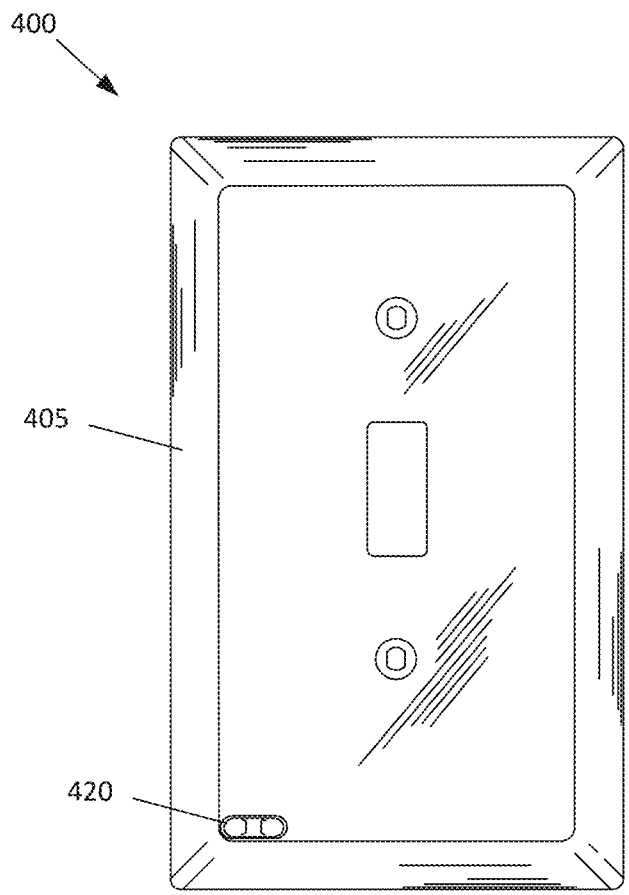
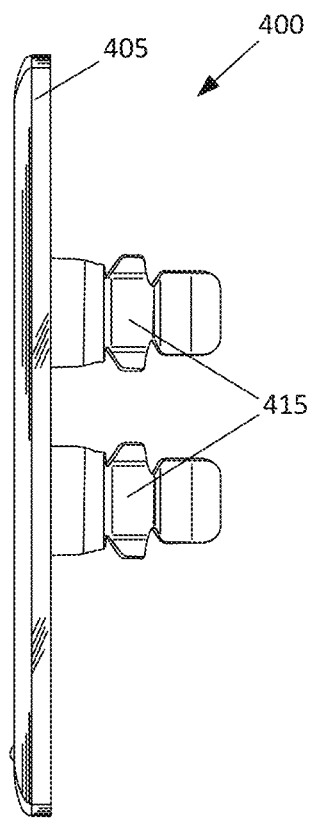
*Fig. 4A*  *Fig. 4B*
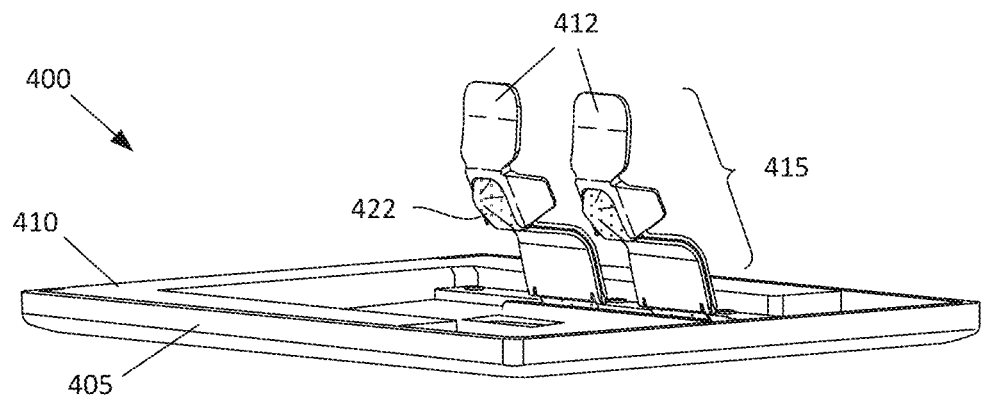
*Fig. 4C*

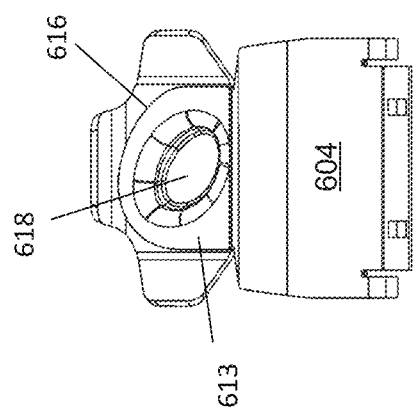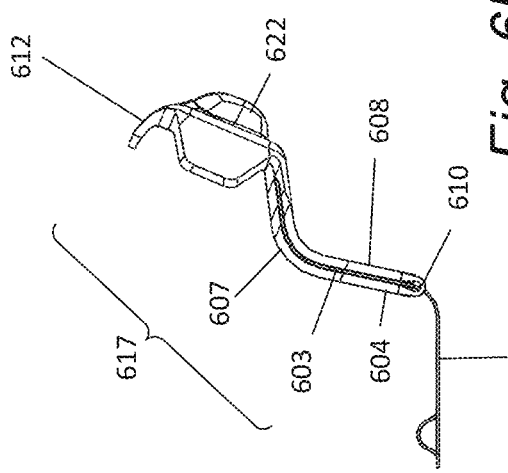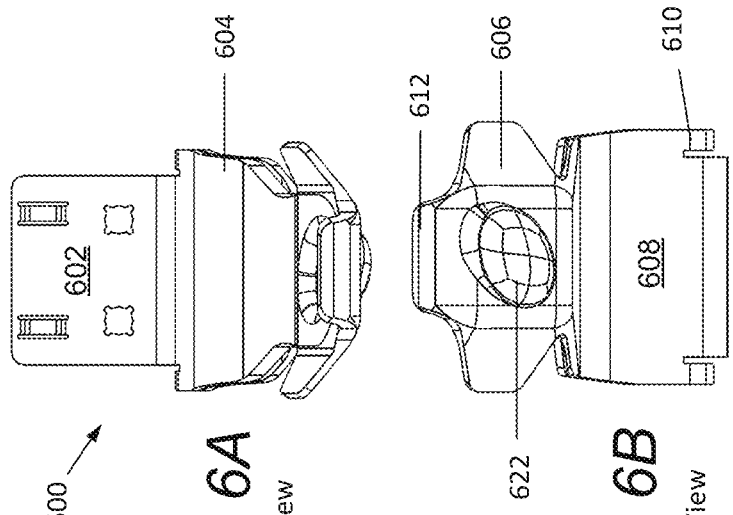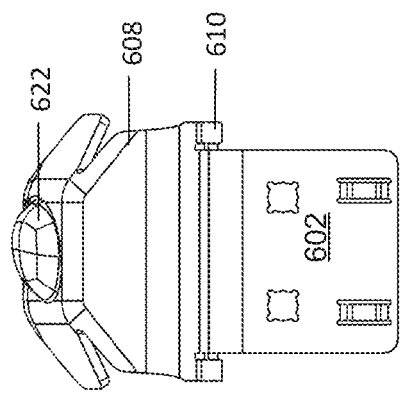

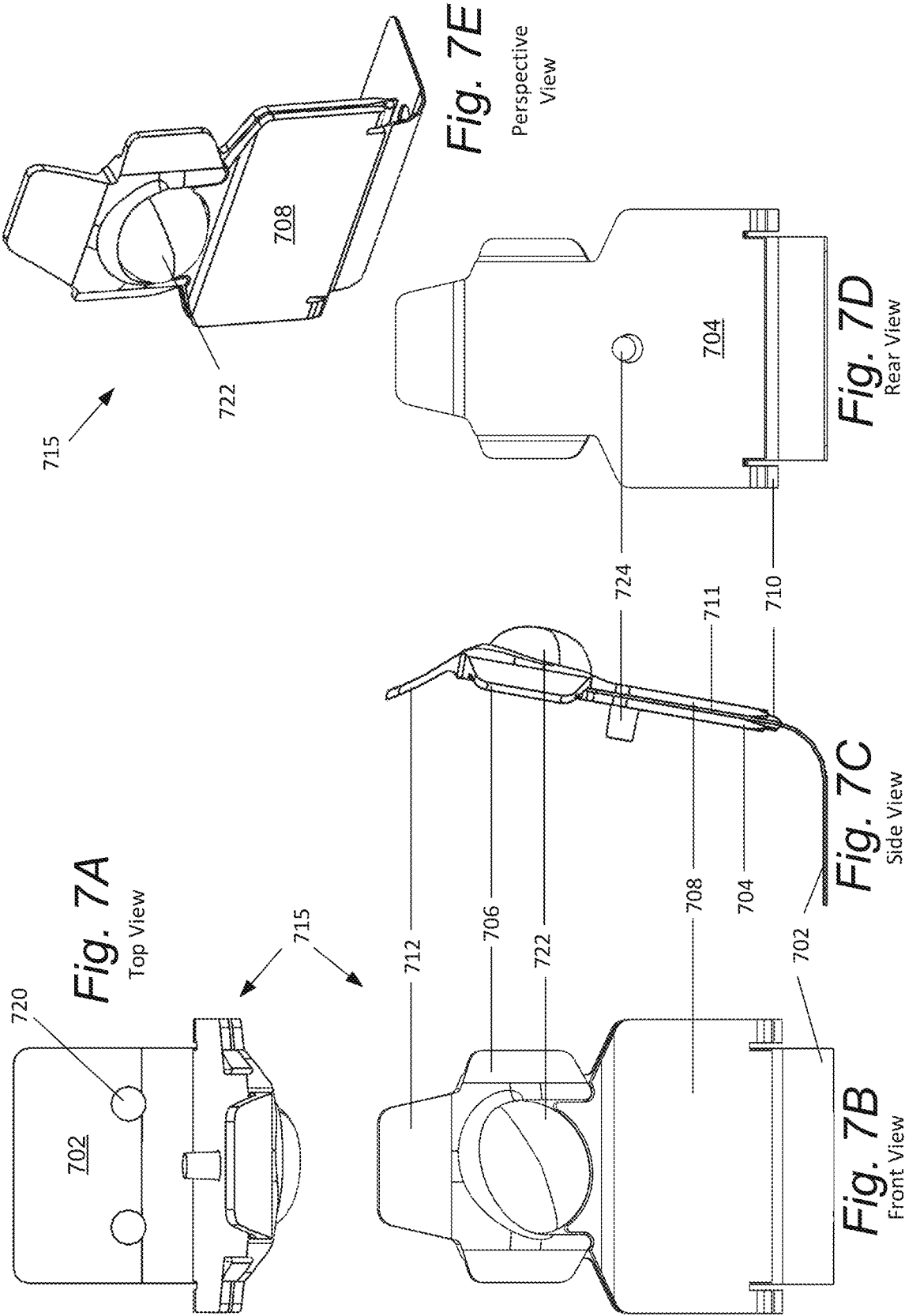

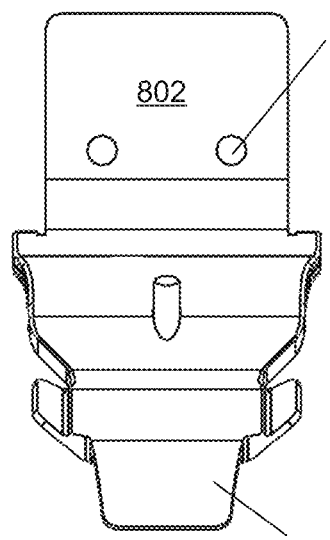
*Fig. 8A*
Top View
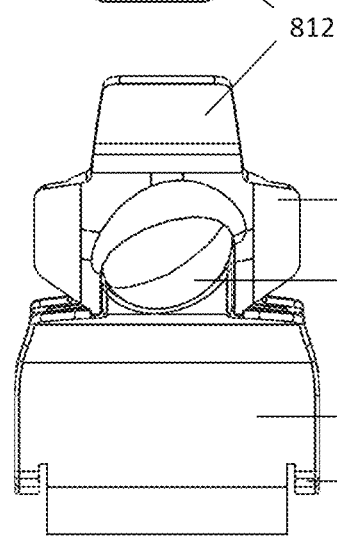
*Fig. 8B*
Front View
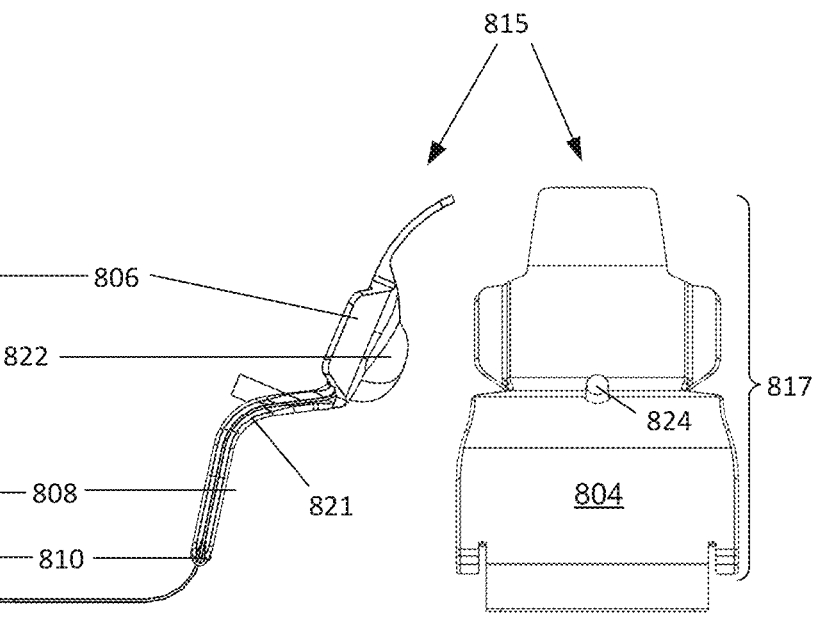
*Fig. 8D*
Side View
*Fig. 8E*
Rear View
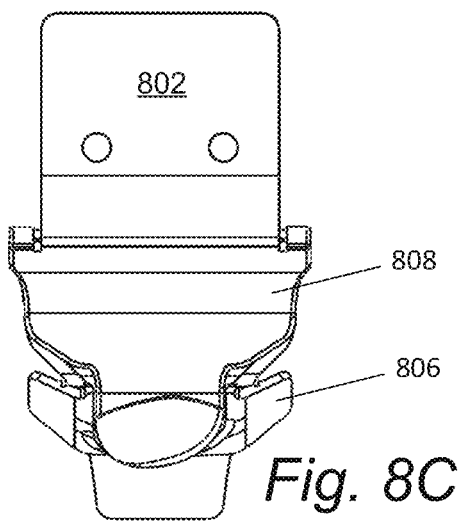
*Fig. 8C*
Bottom View

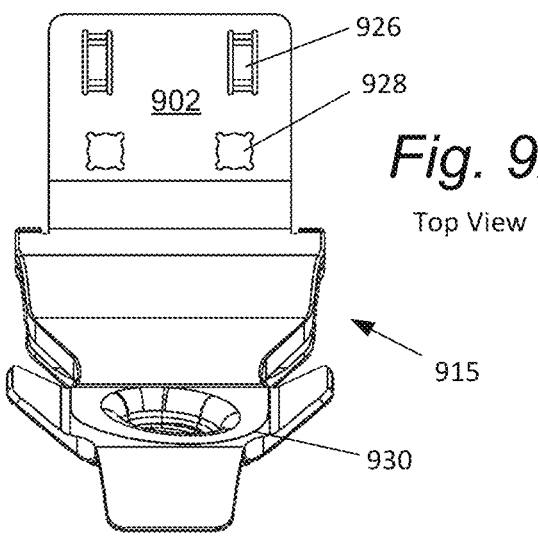
Fig. 9A
Top View
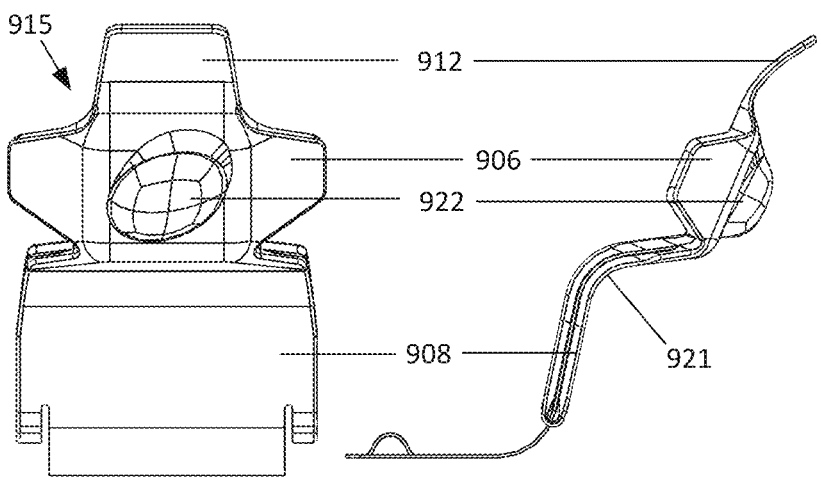
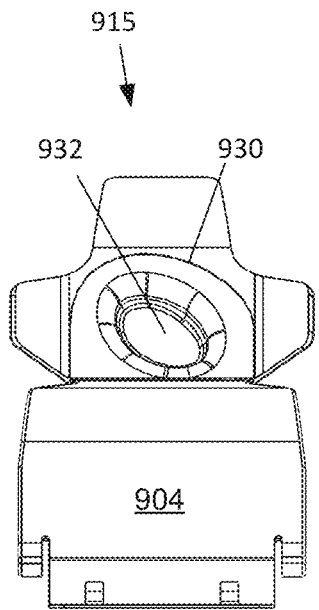
Fig. 9B
Front View
Fig. 9C
Side View
Fig. 9D
Rear View
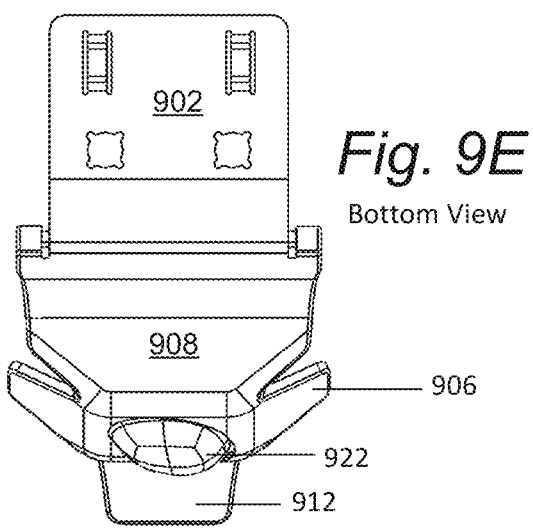
Fig. 9E
Bottom View

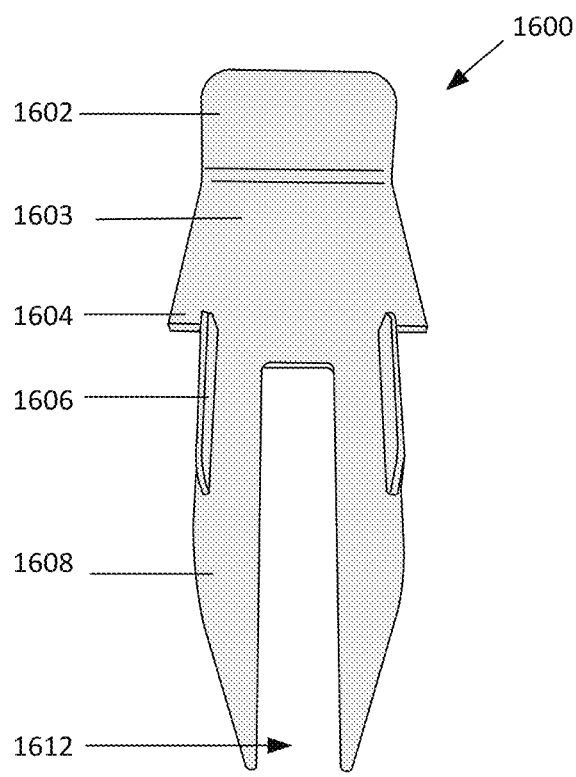
Fig. 16A
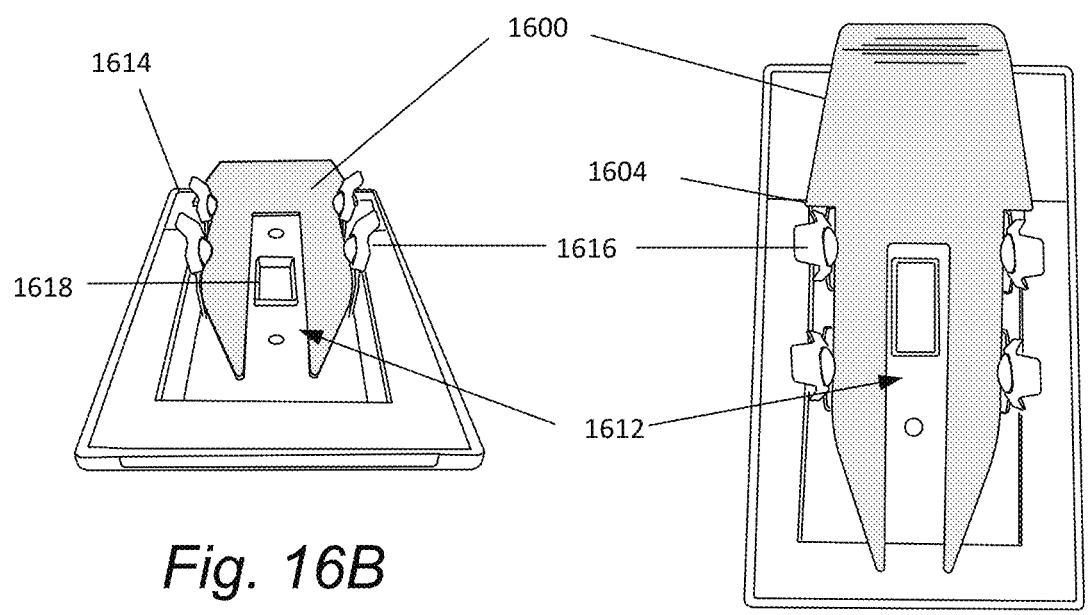
Fig. 16B
Fig. 16C

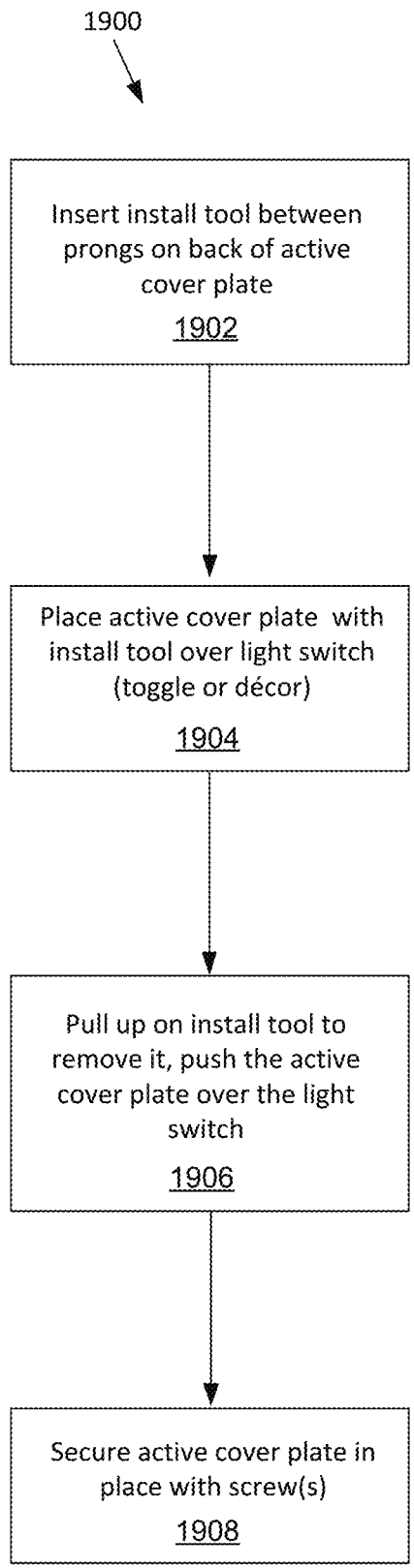
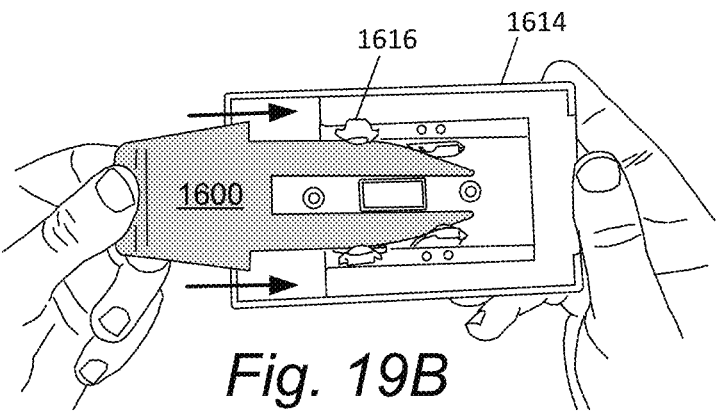
Fig. 19B
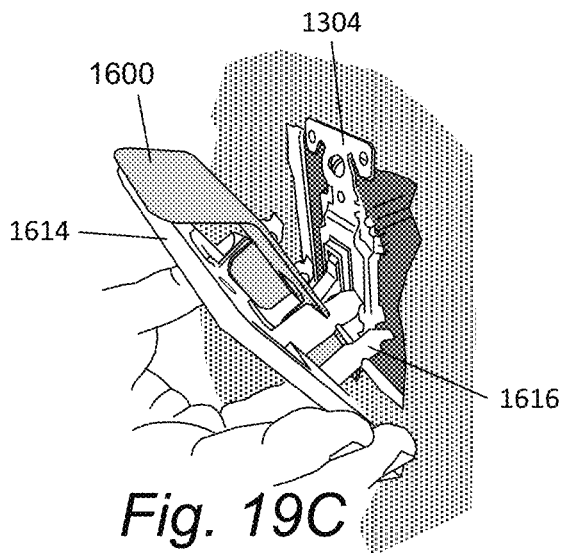
Fig. 19C
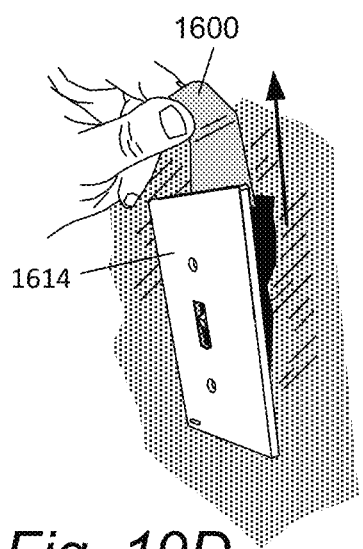
Fig. 19D
Fig. 19A

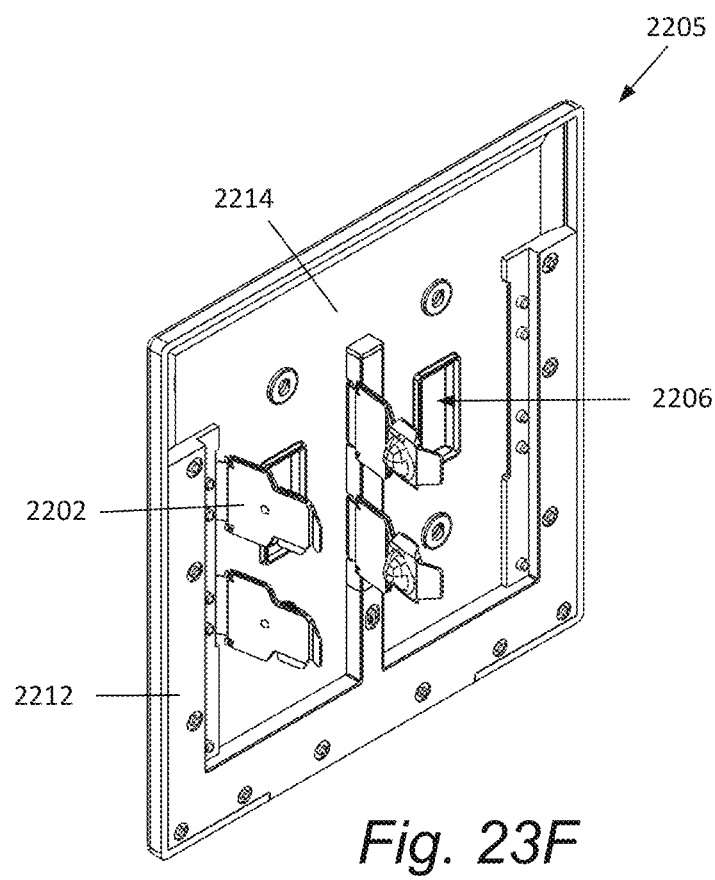
Fig. 23F
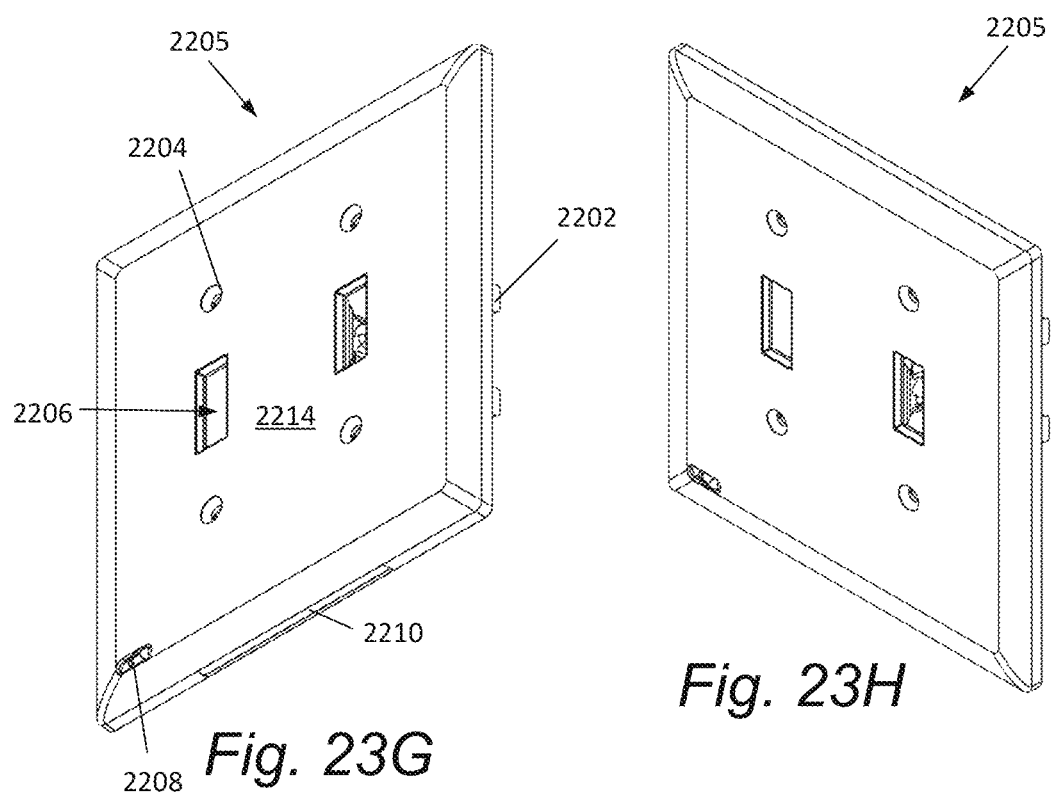
Fig. 23G
Fig. 23H

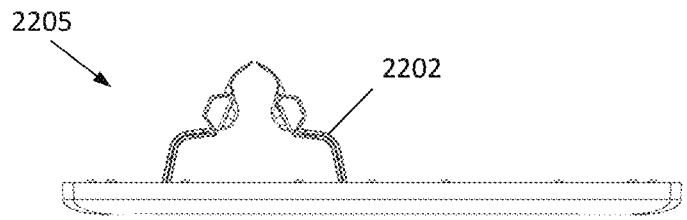
*Fig. 25A*
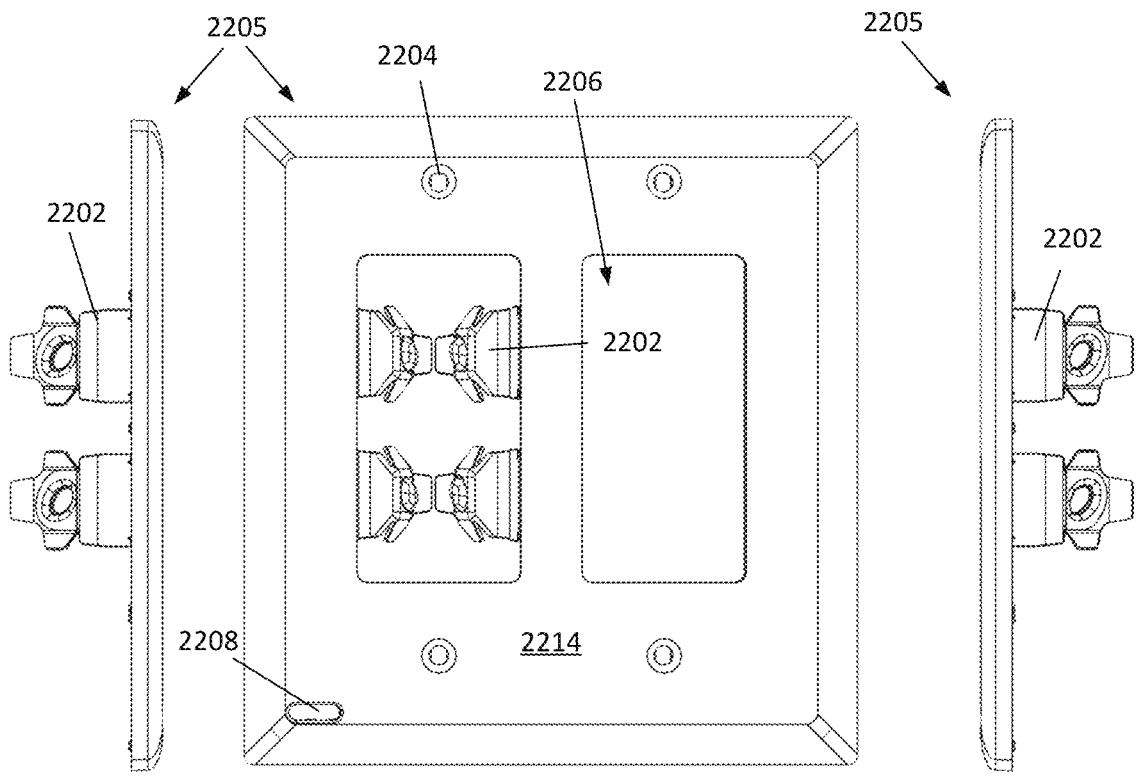
*Fig. 25B*  *Fig. 25C*  *Fig. 25D*
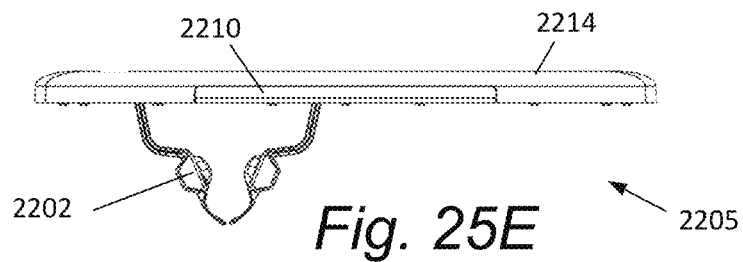
*Fig. 25E*

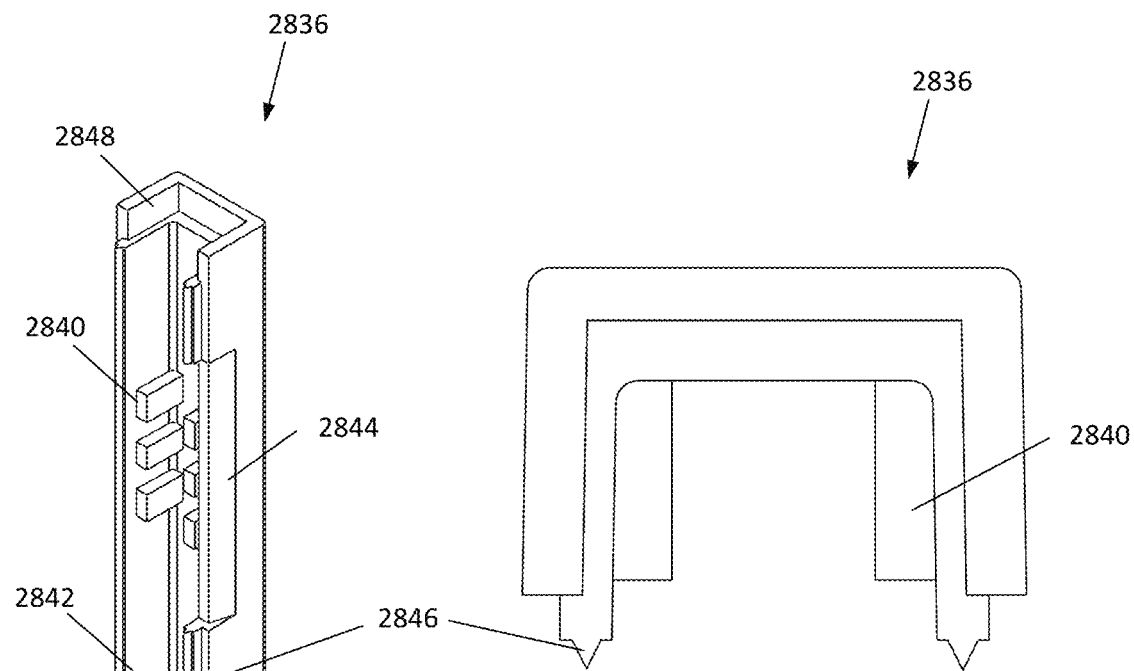
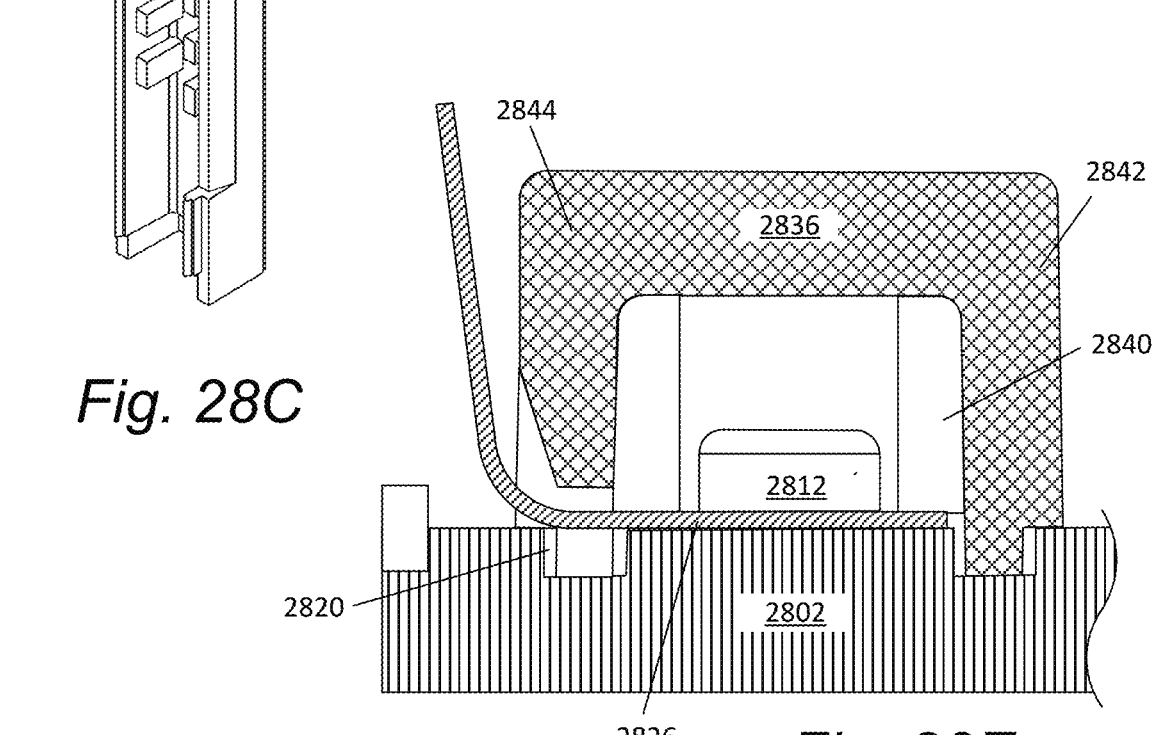

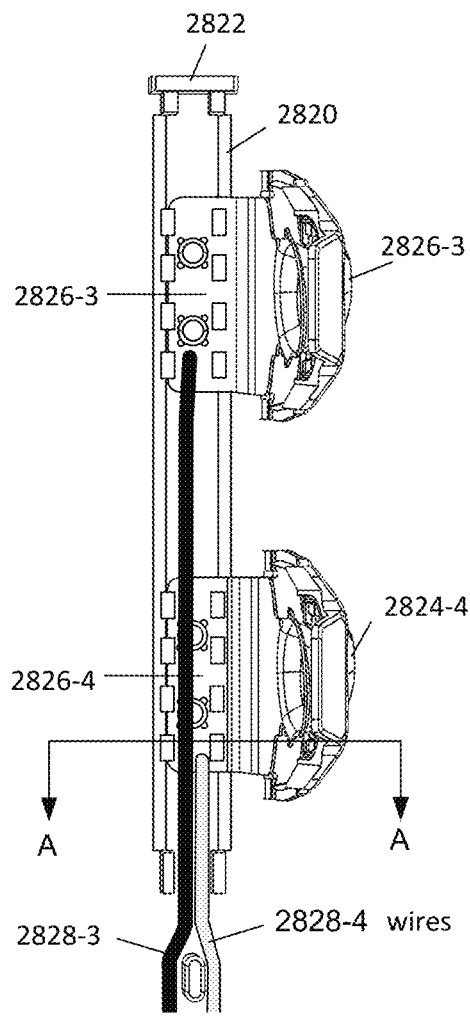
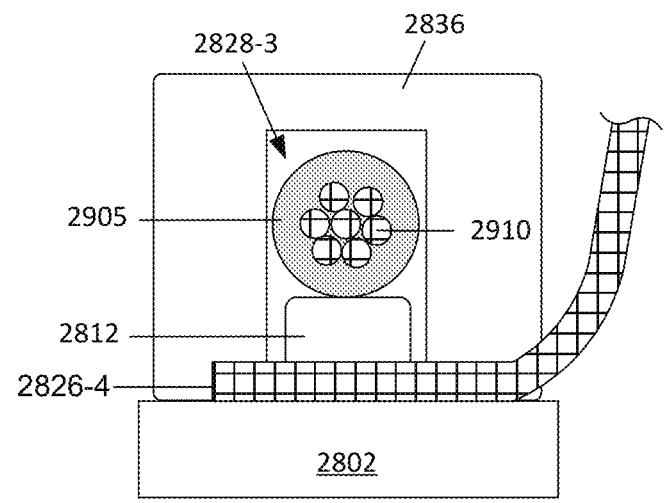
Fig. 29F
Section A-A
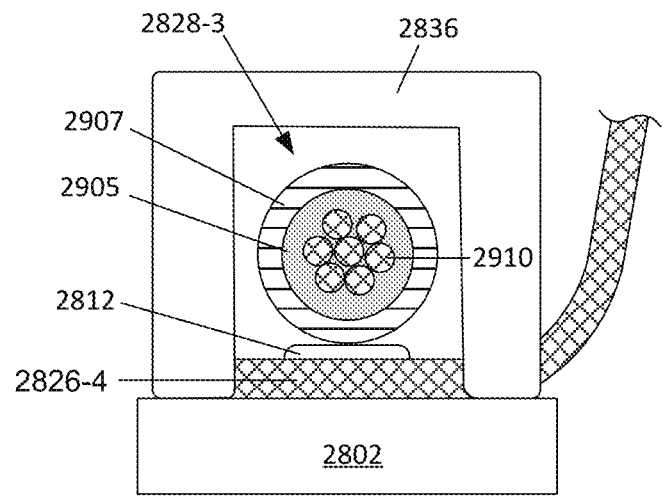
Fig. 29G
Section A-A
Fig. 29E

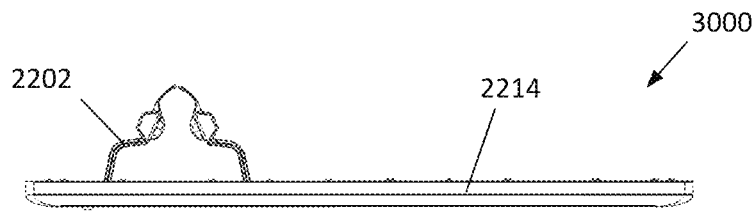
Fig. 30A
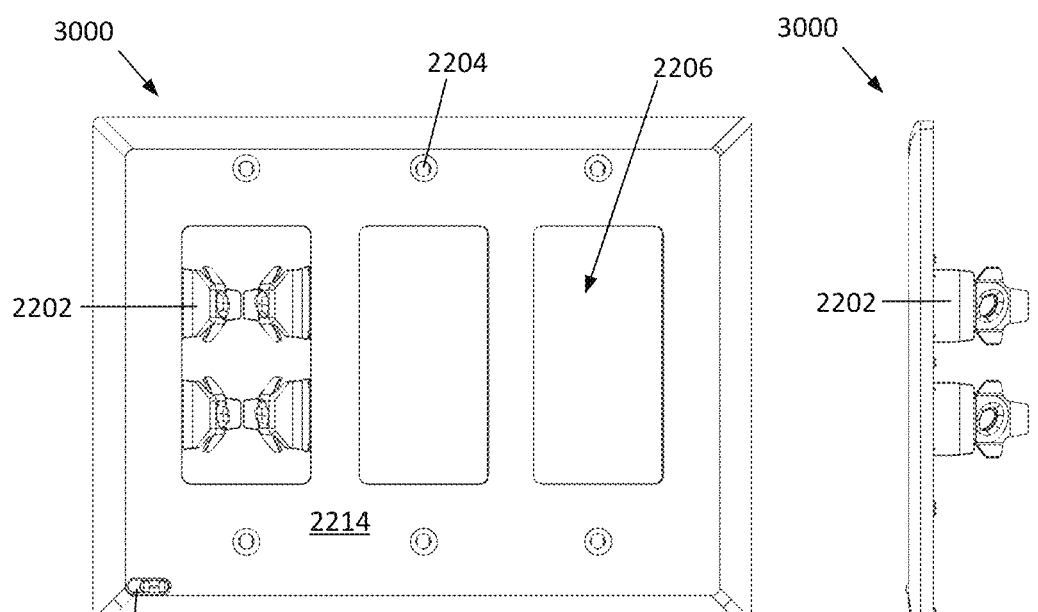
Fig. 30B
Fig. 30C
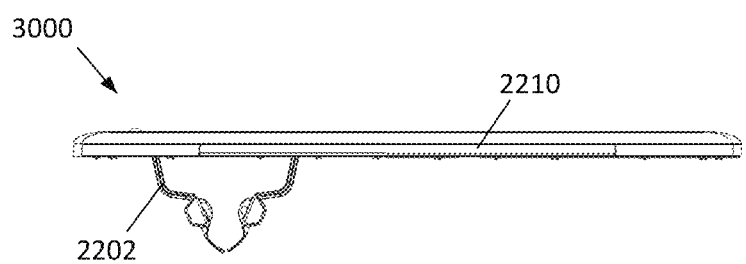
Fig. 30D

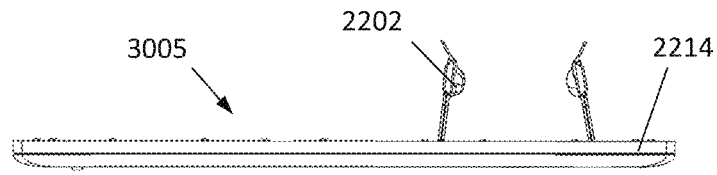
Fig. 30E
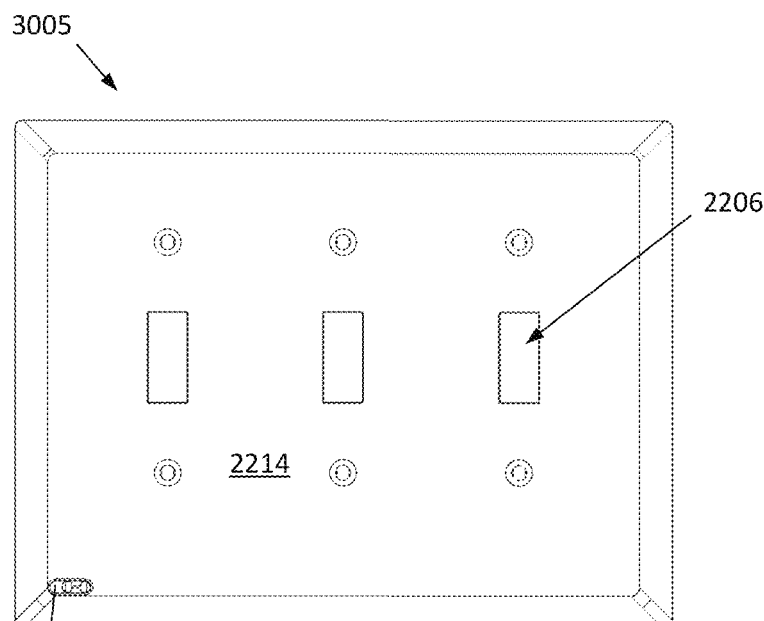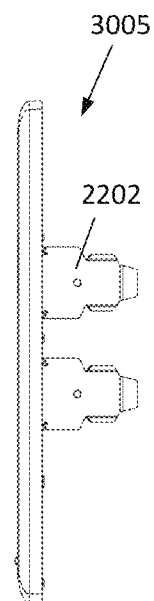
Fig. 30F      Fig. 30G
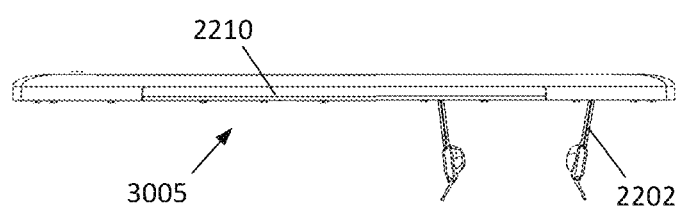
Fig. 30H

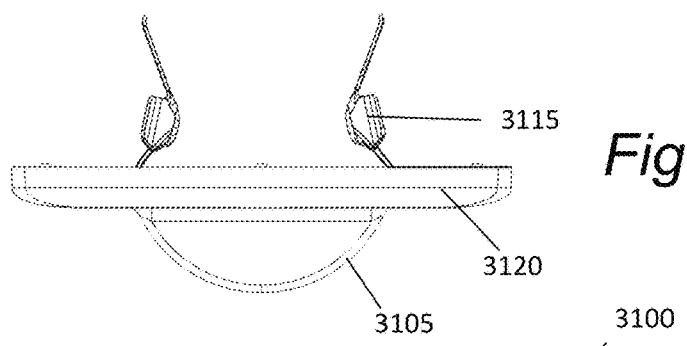
*Fig. 31A*
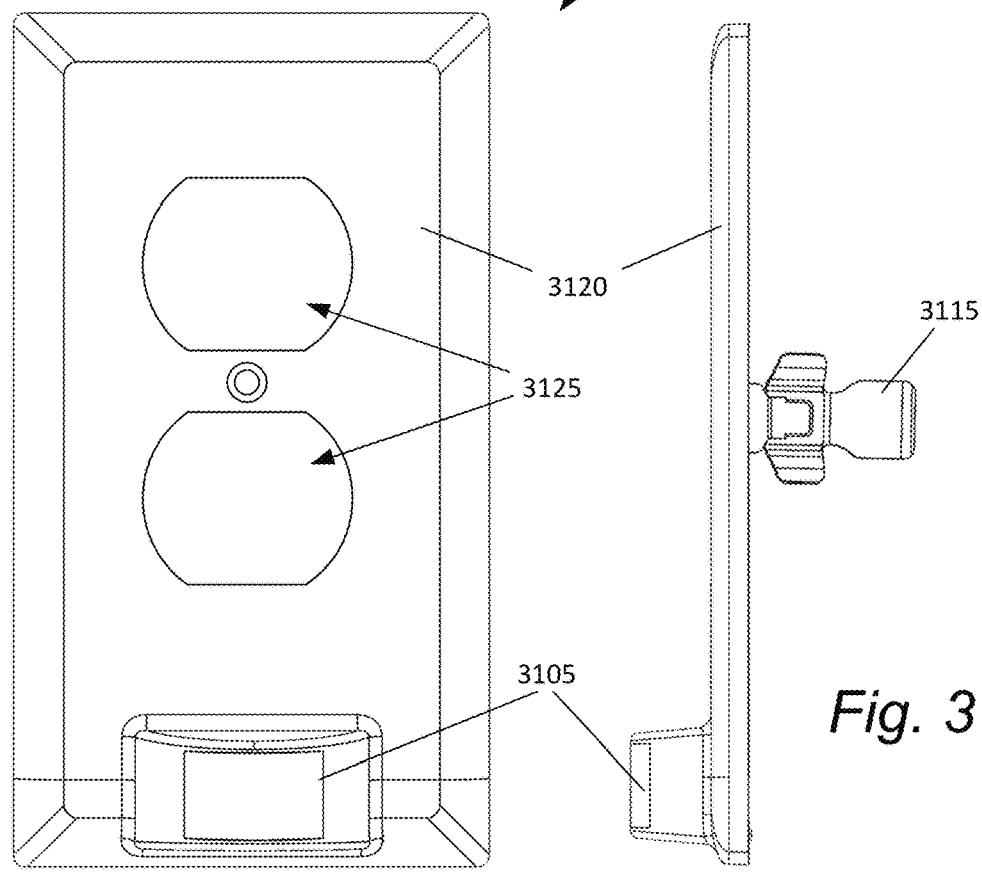
*Fig. 31B*
*Fig. 31C*
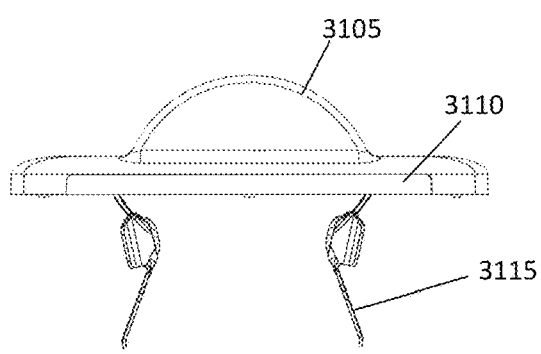
*Fig. 31D*

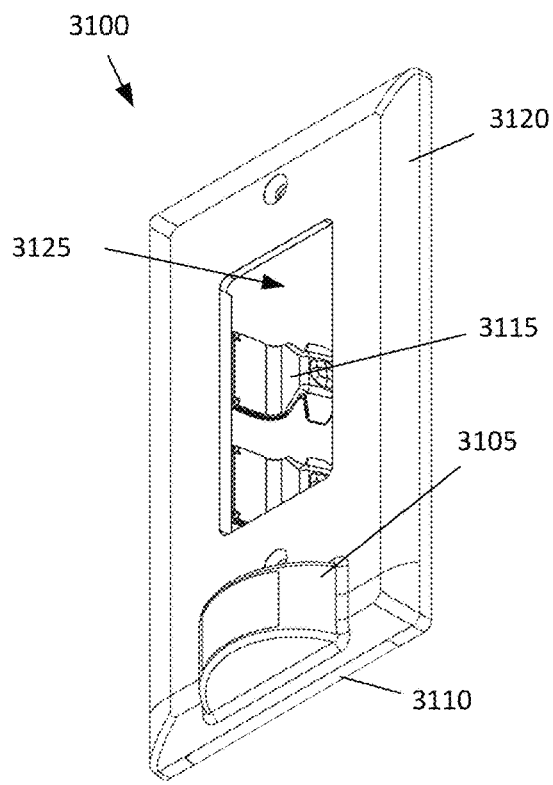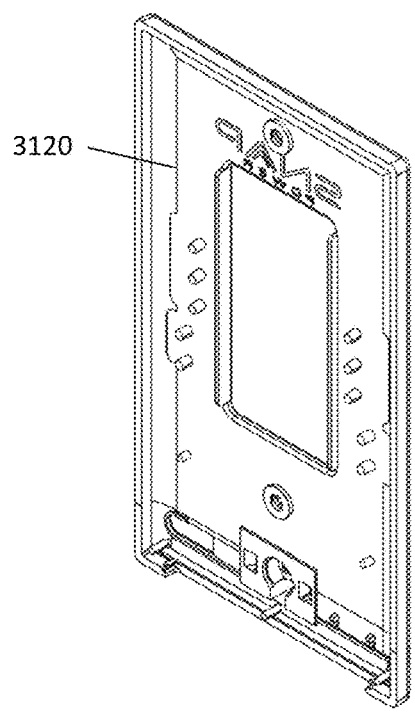
Fig. 31E
Fig. 31F
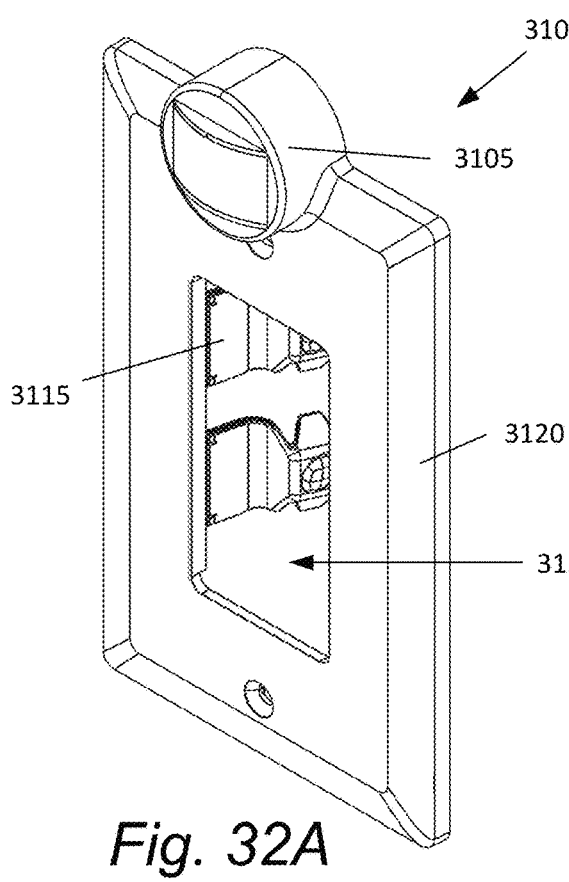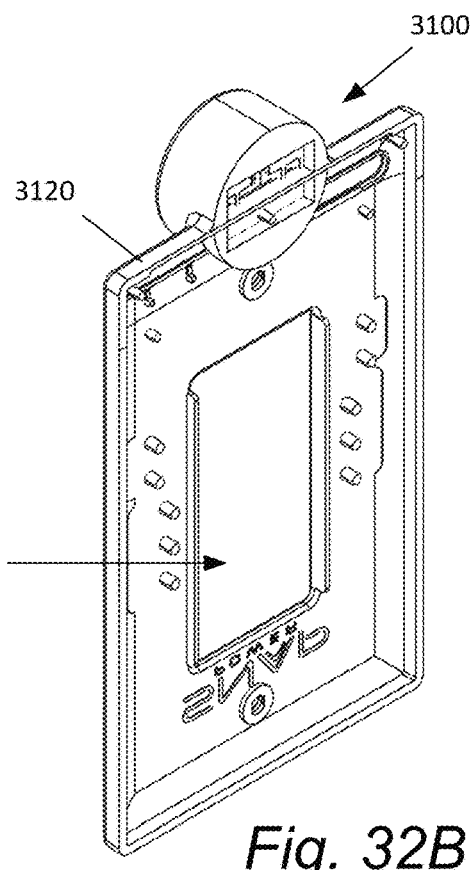
Fig. 32A
Fig. 32B

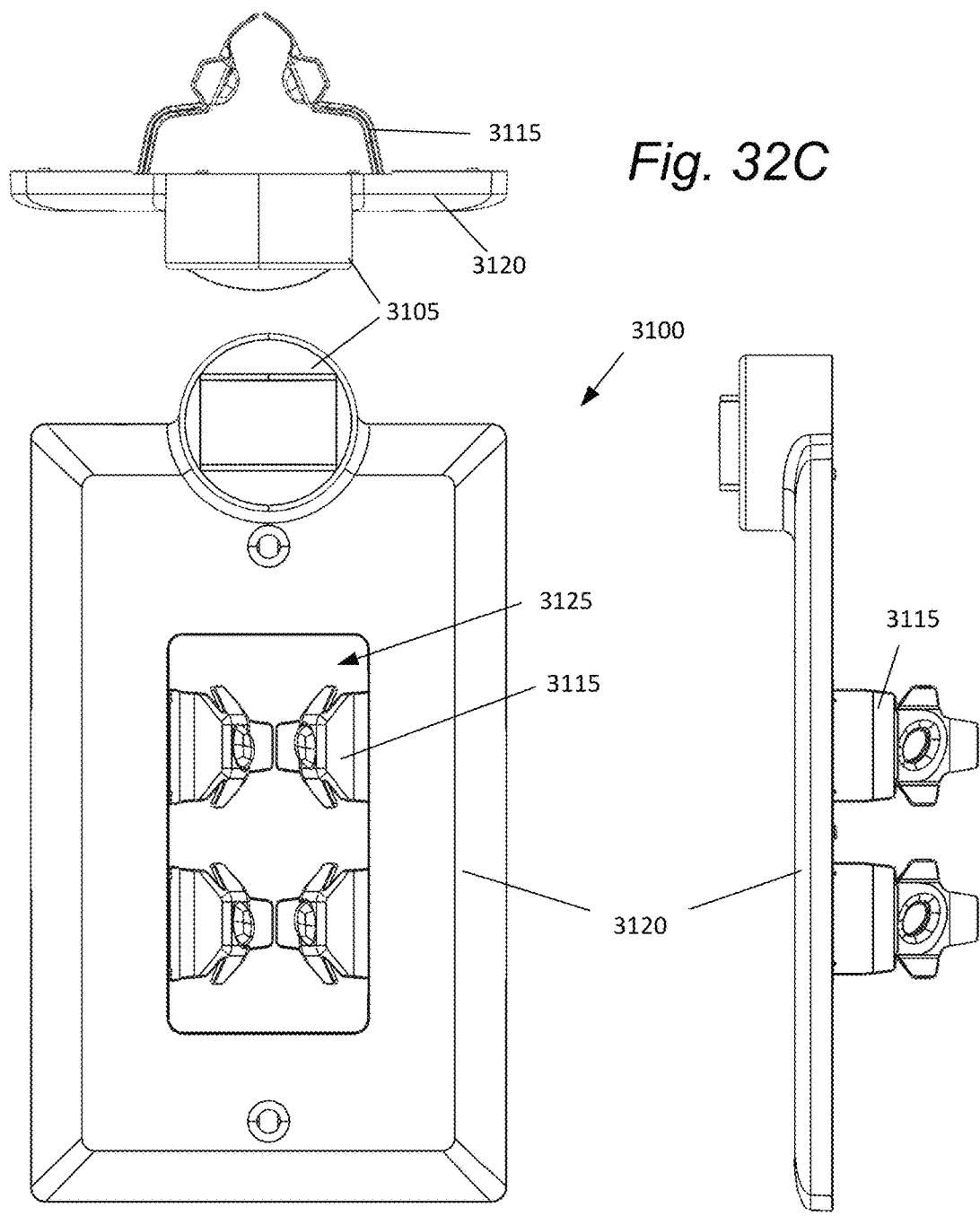
*Fig. 32C*
*Fig. 32D*
*Fig. 32E*
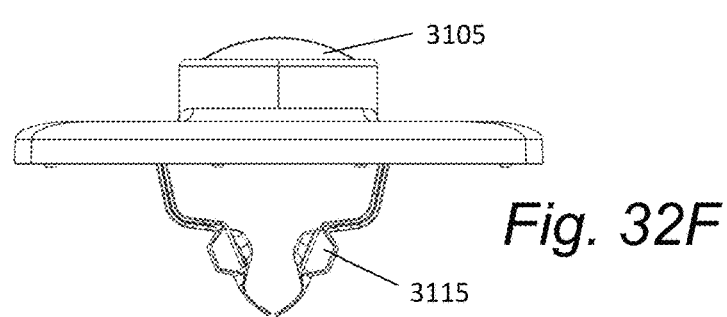
*Fig. 32F*

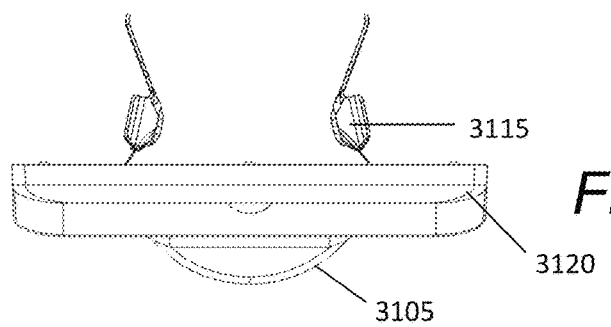
*Fig. 33A*
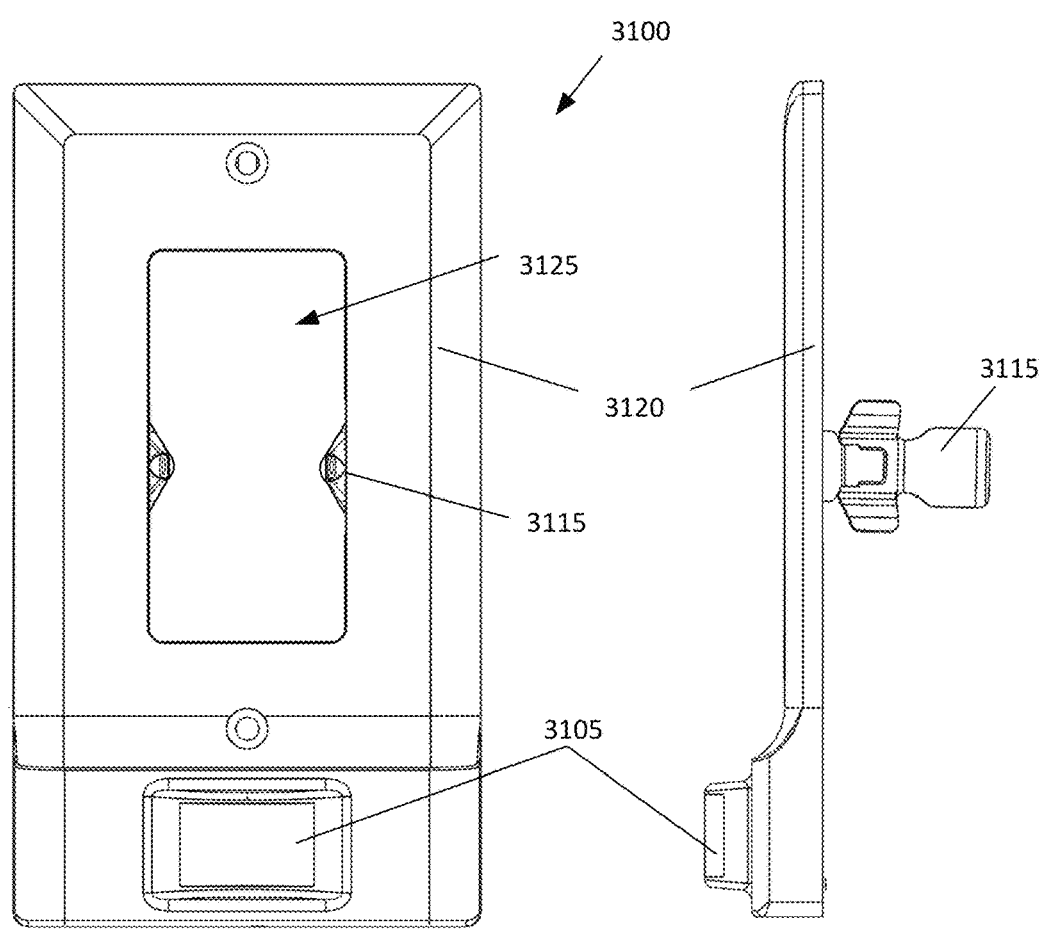
*Fig. 33B*   *Fig. 33C*
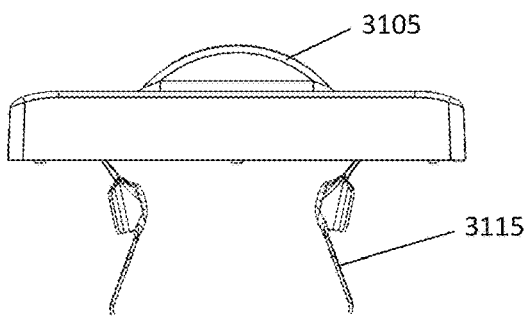
*Fig. 33D*

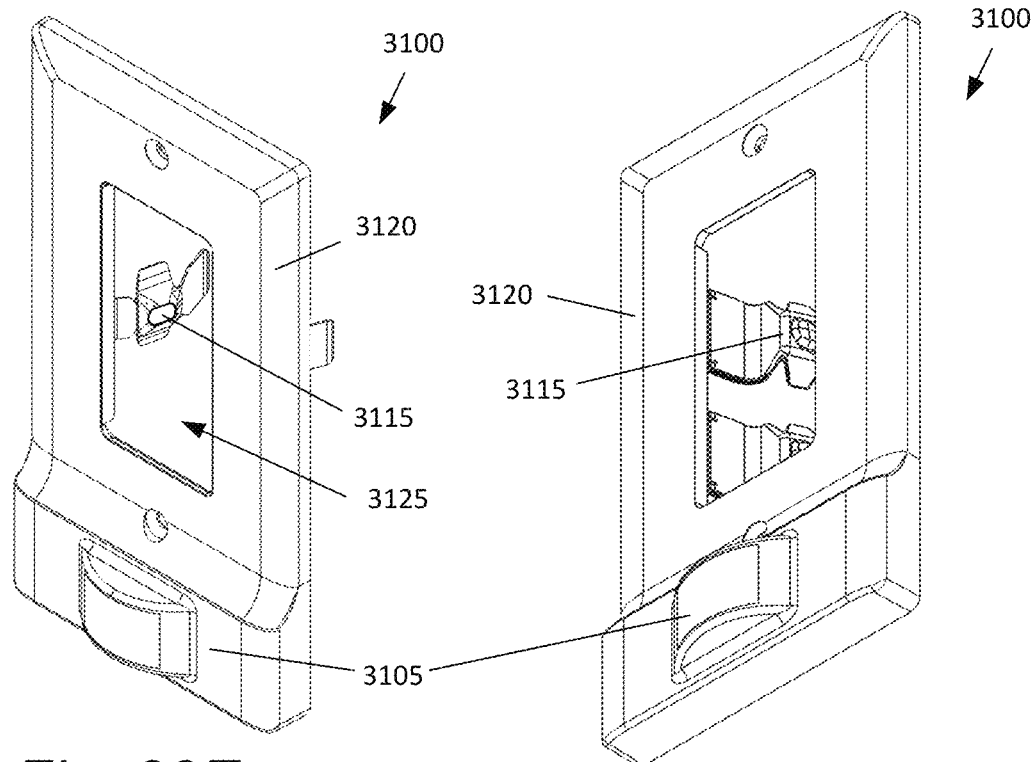
*Fig. 33E*  *Fig. 33F*
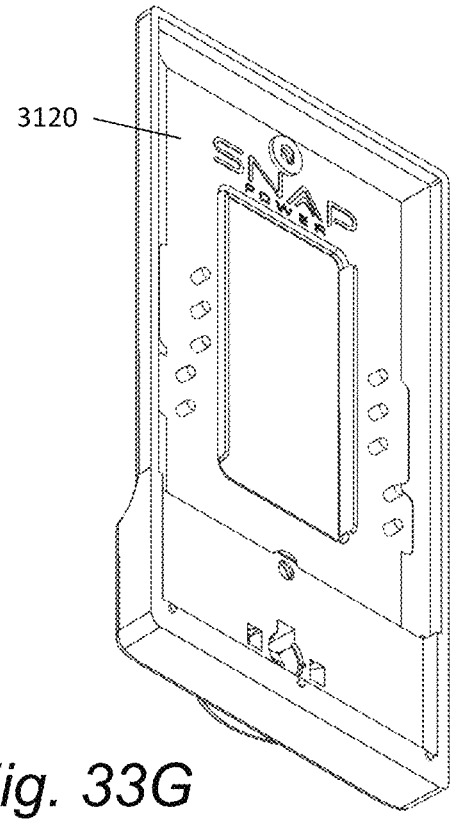
*Fig. 33G*

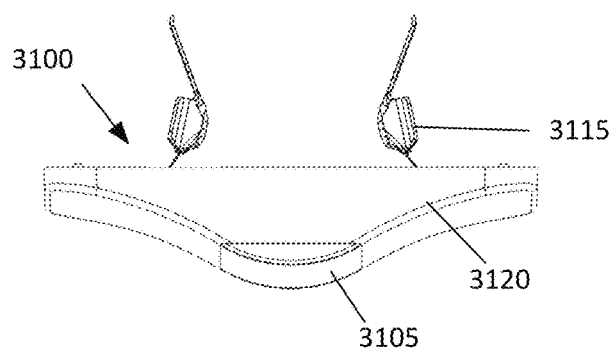
Fig. 34A
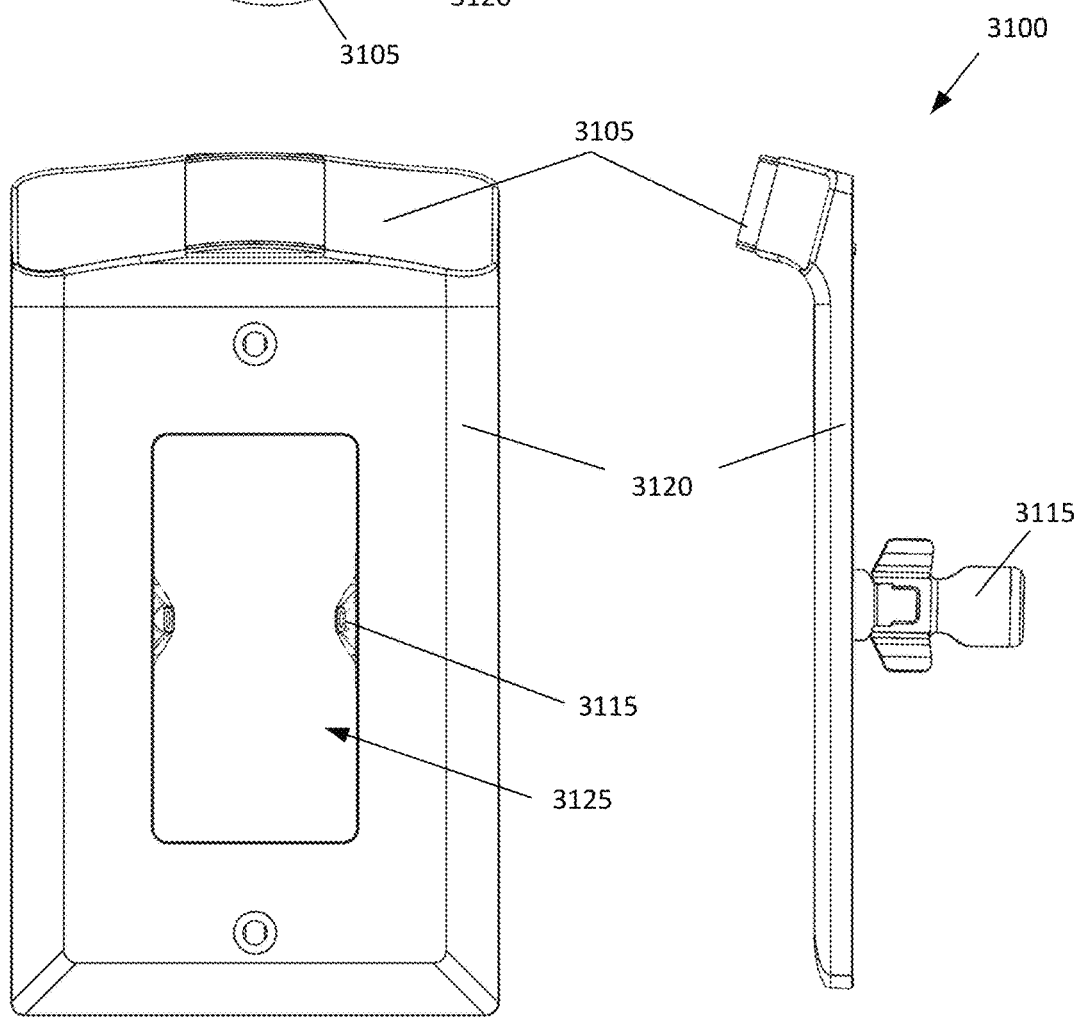
Fig. 34B
Fig. 34C
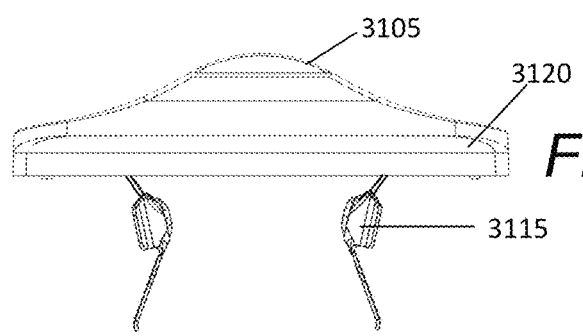
Fig. 34D

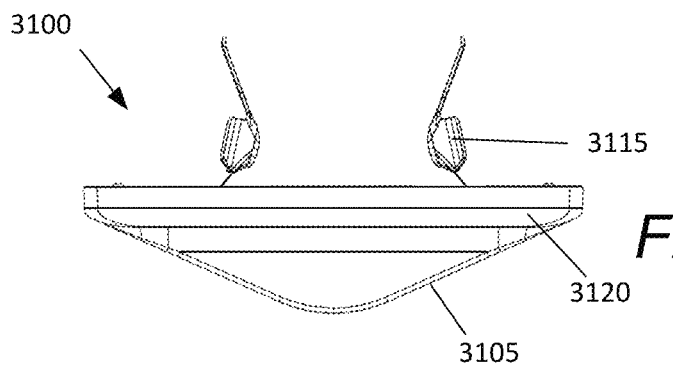
Fig. 35A
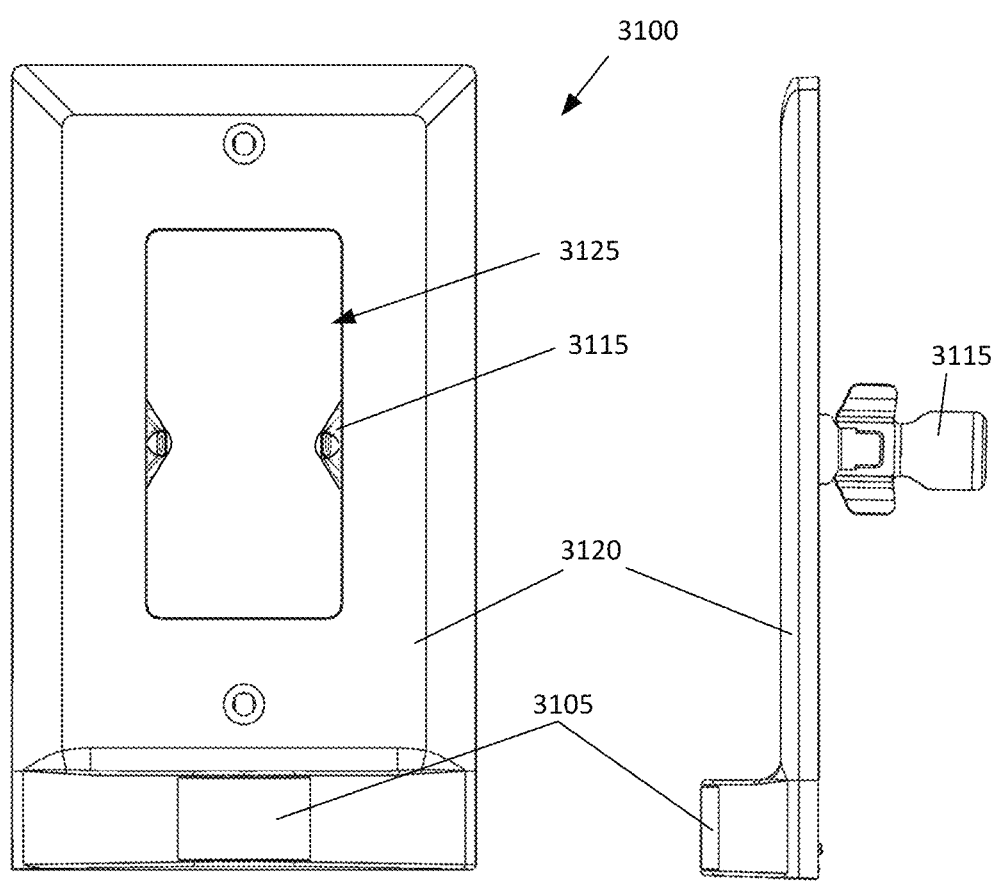
Fig. 35B
Fig. 35C
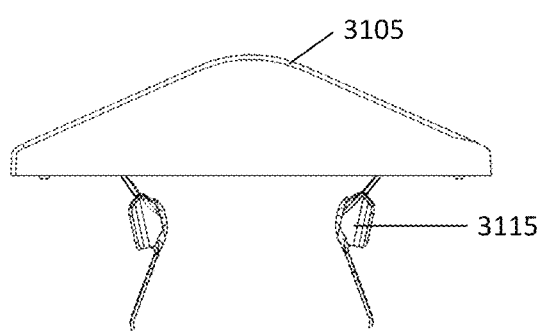
Fig. 35D

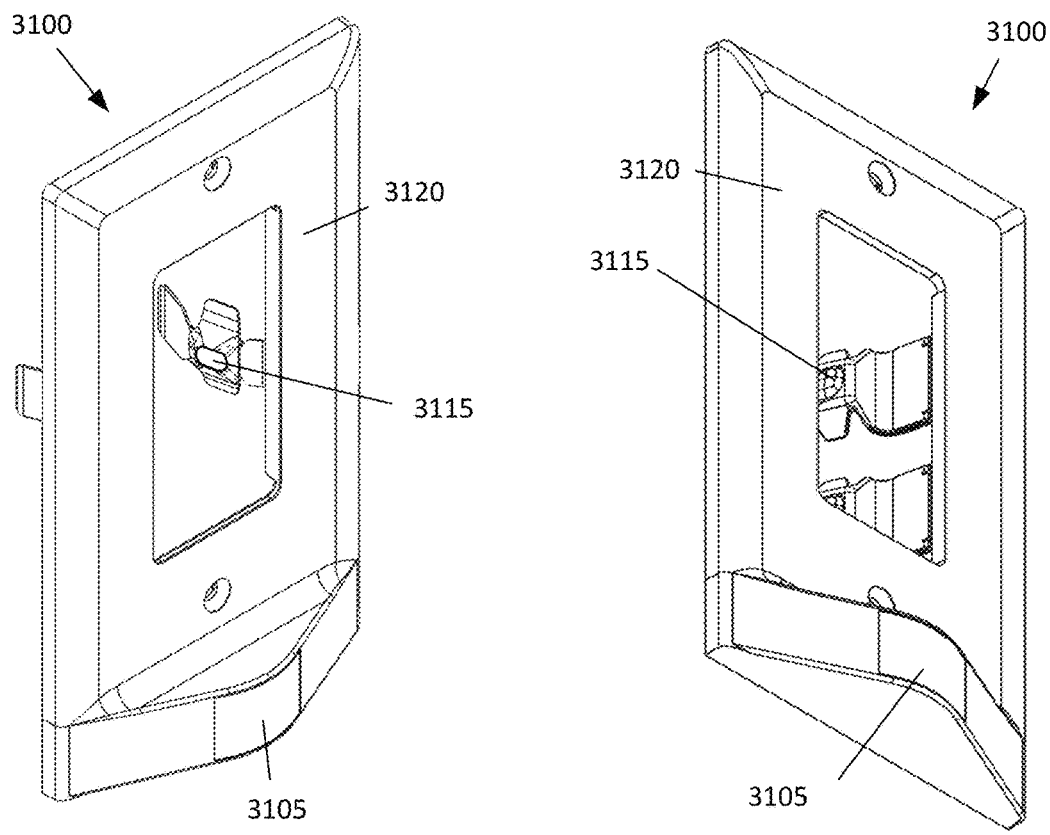
Fig. 35E
Fig. 35F
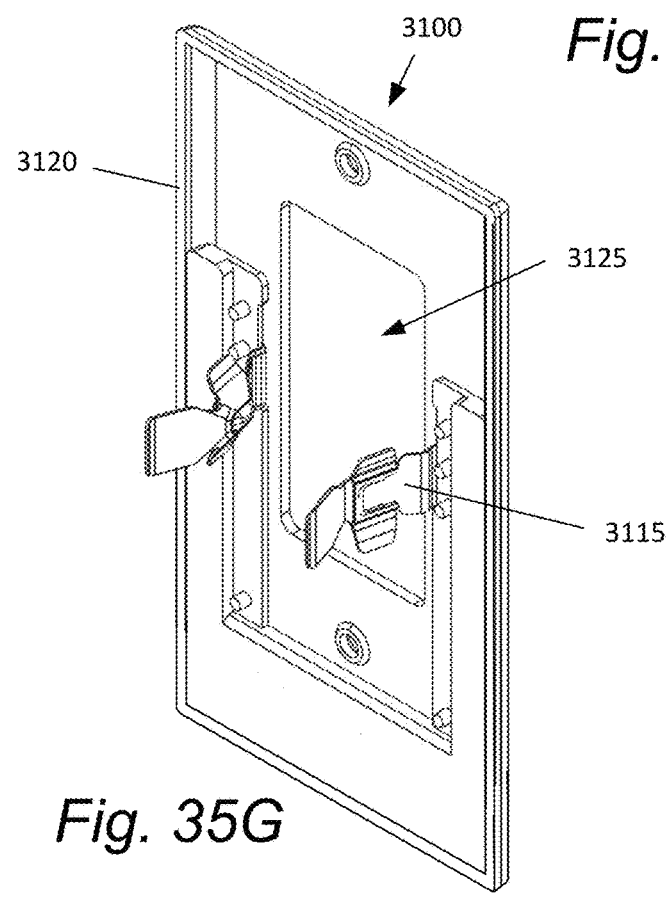
Fig. 35G

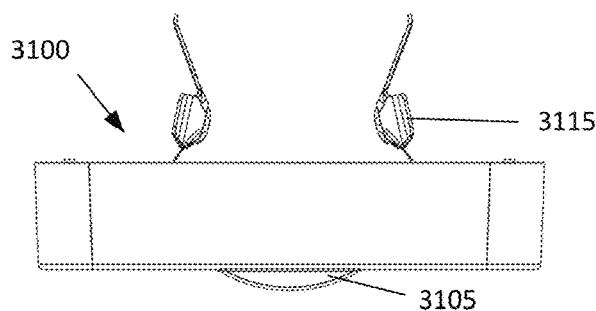
*Fig. 36A*
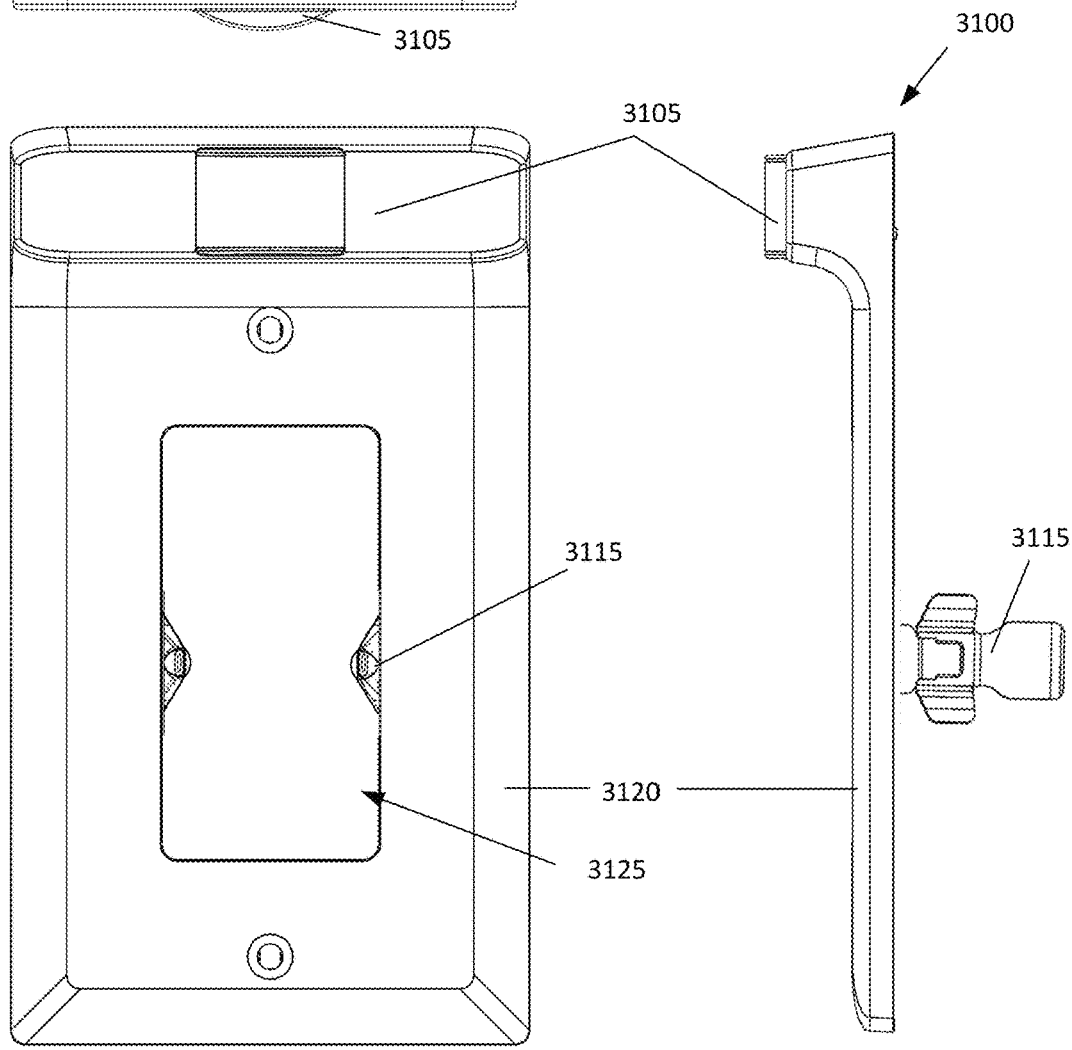
*Fig. 36B*  *Fig. 36C*
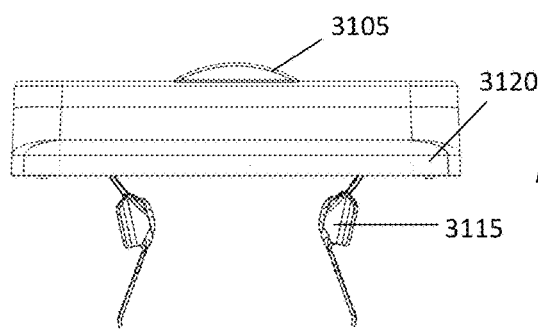
*Fig. 36D*

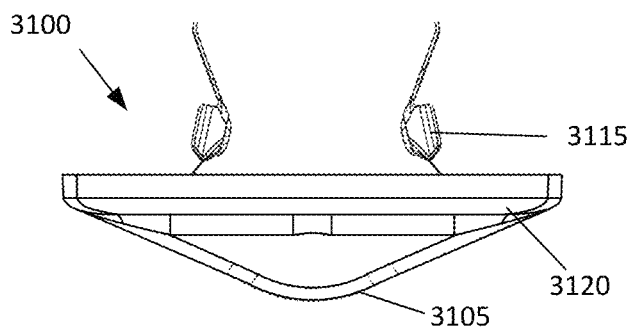
*Fig. 37A*
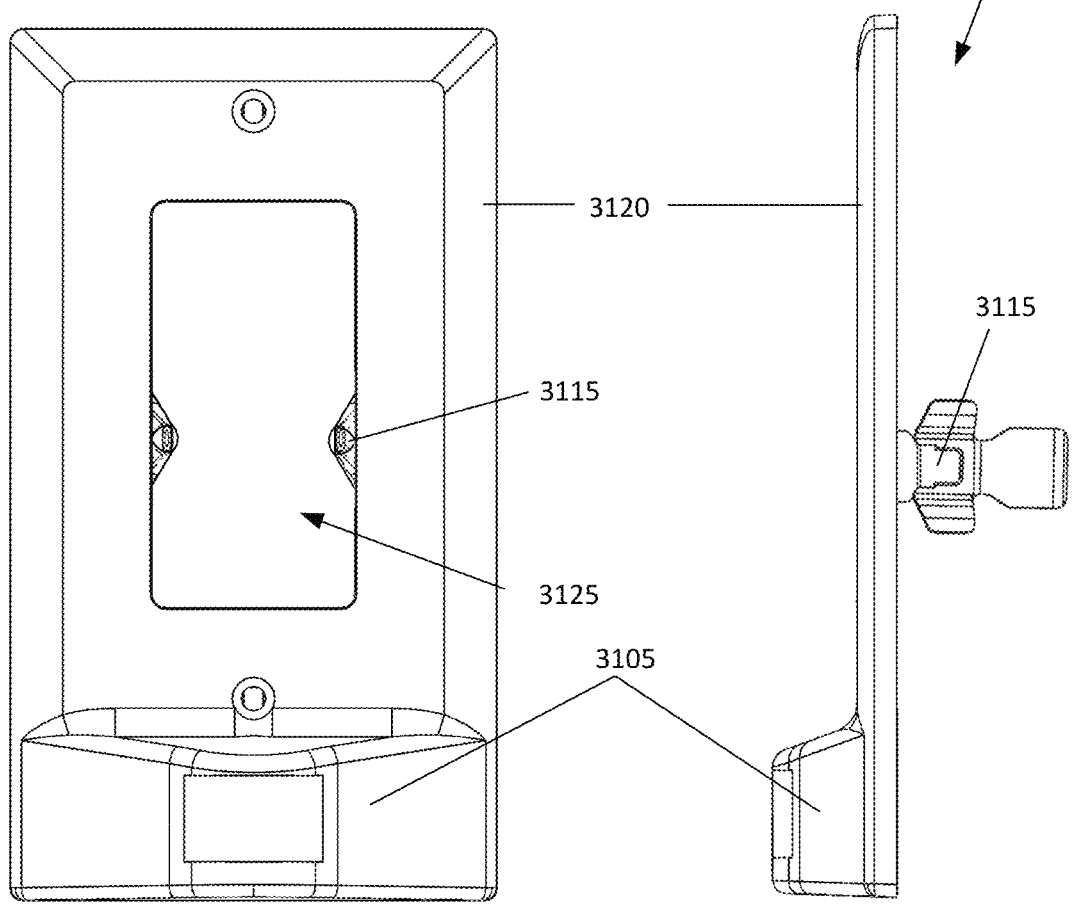
*Fig. 37B*
*Fig. 37C*
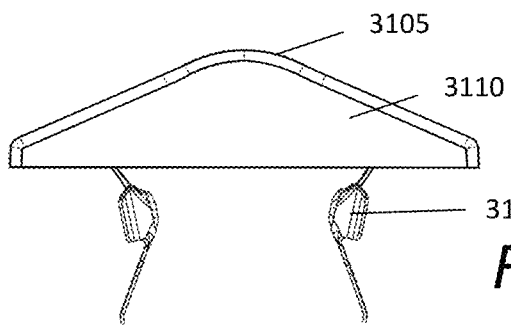
*Fig. 37D*

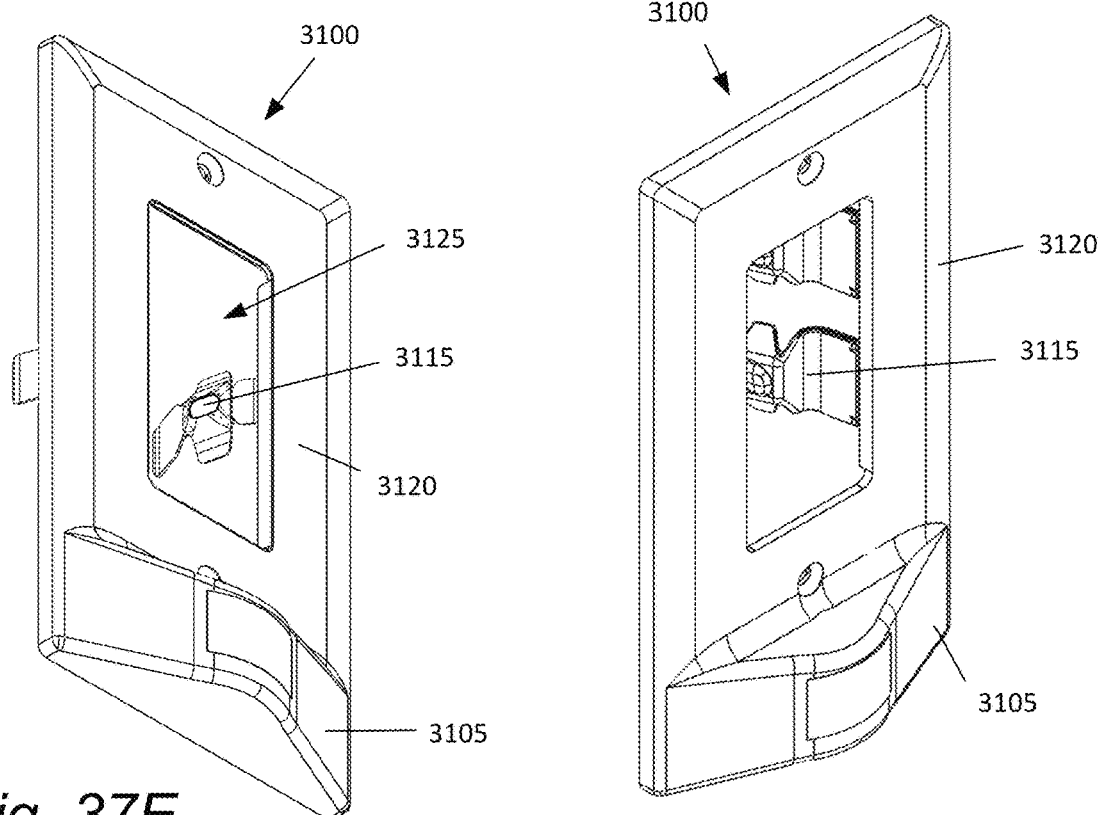
*Fig. 37E*
*Fig. 37F*
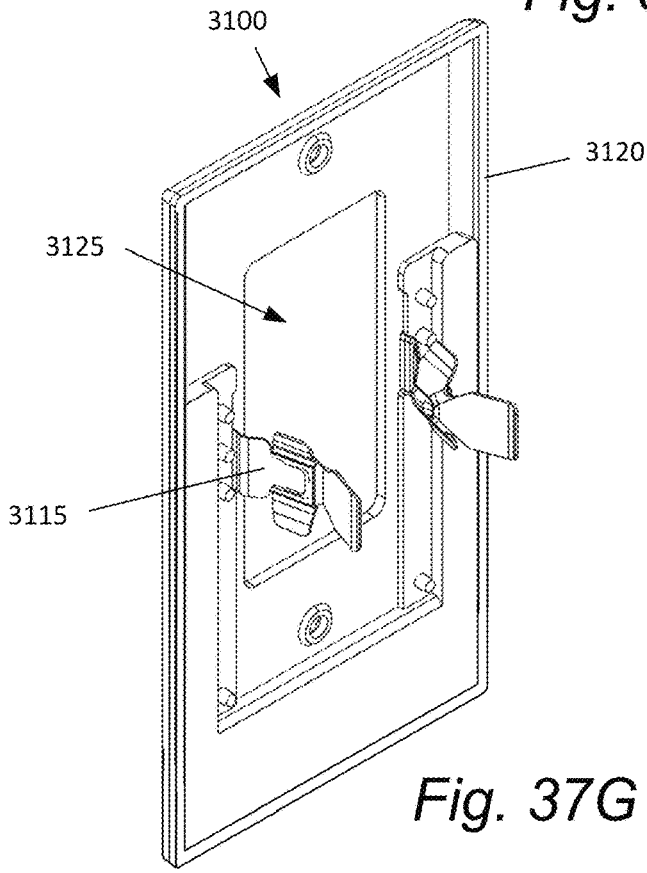
*Fig. 37G*

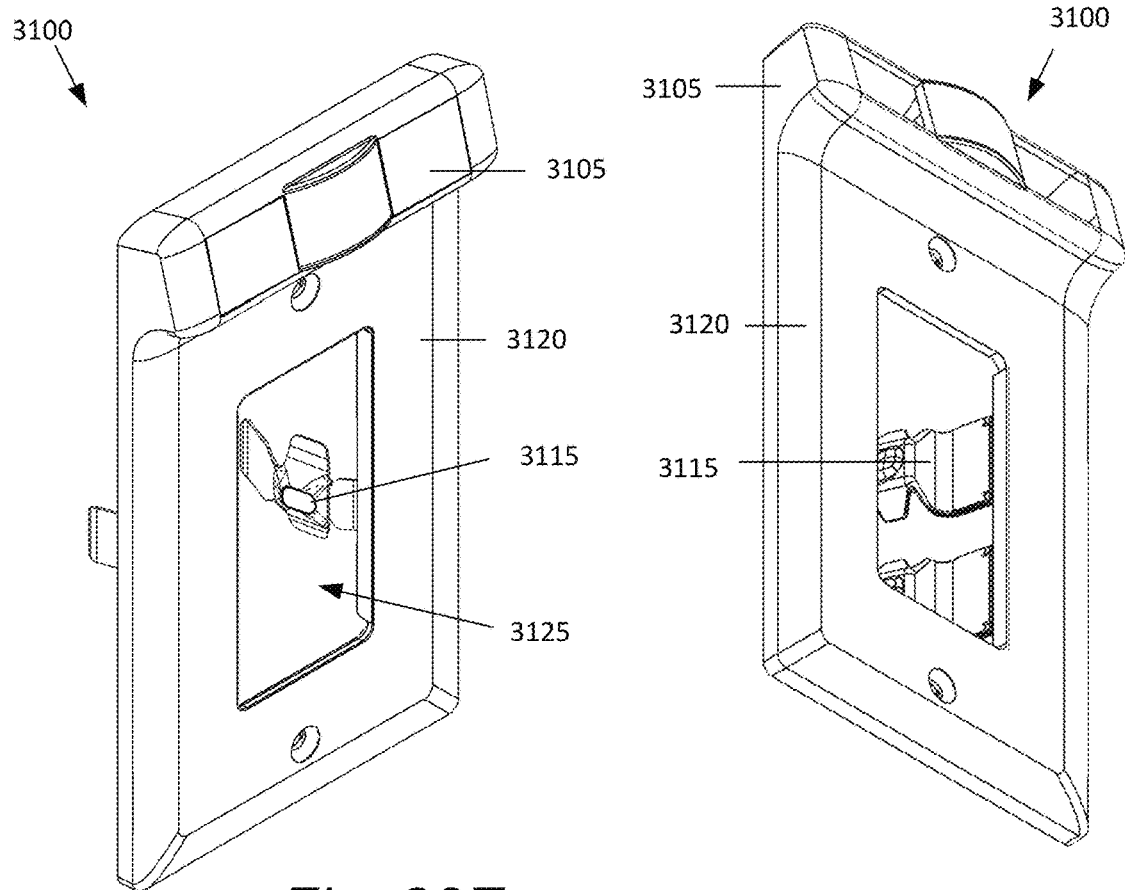
Fig. 38E
Fig. 38F
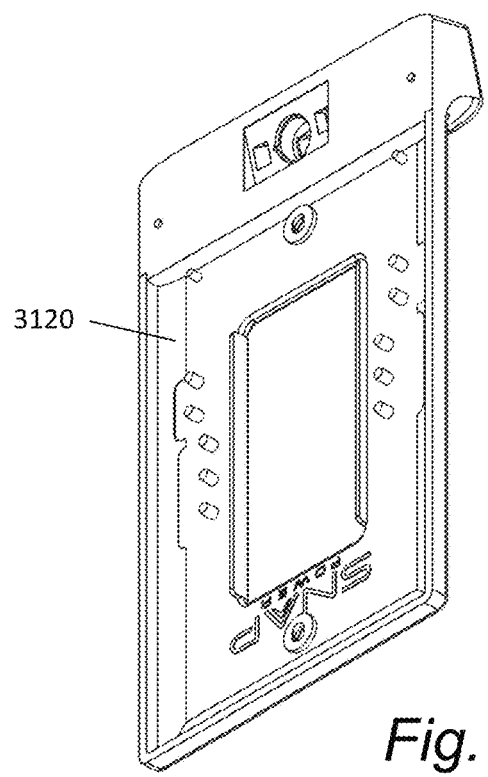
Fig. 38G

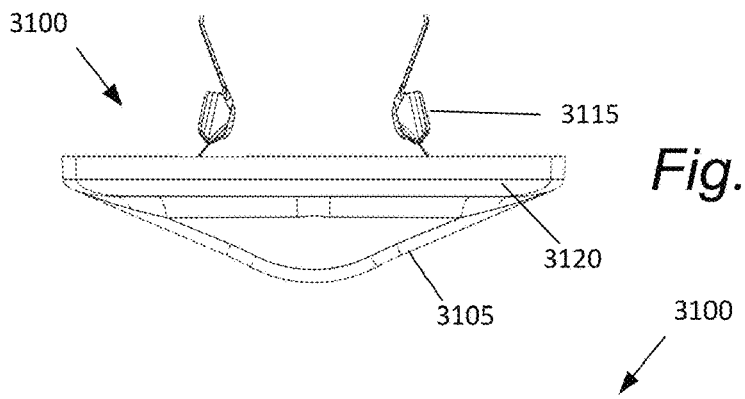
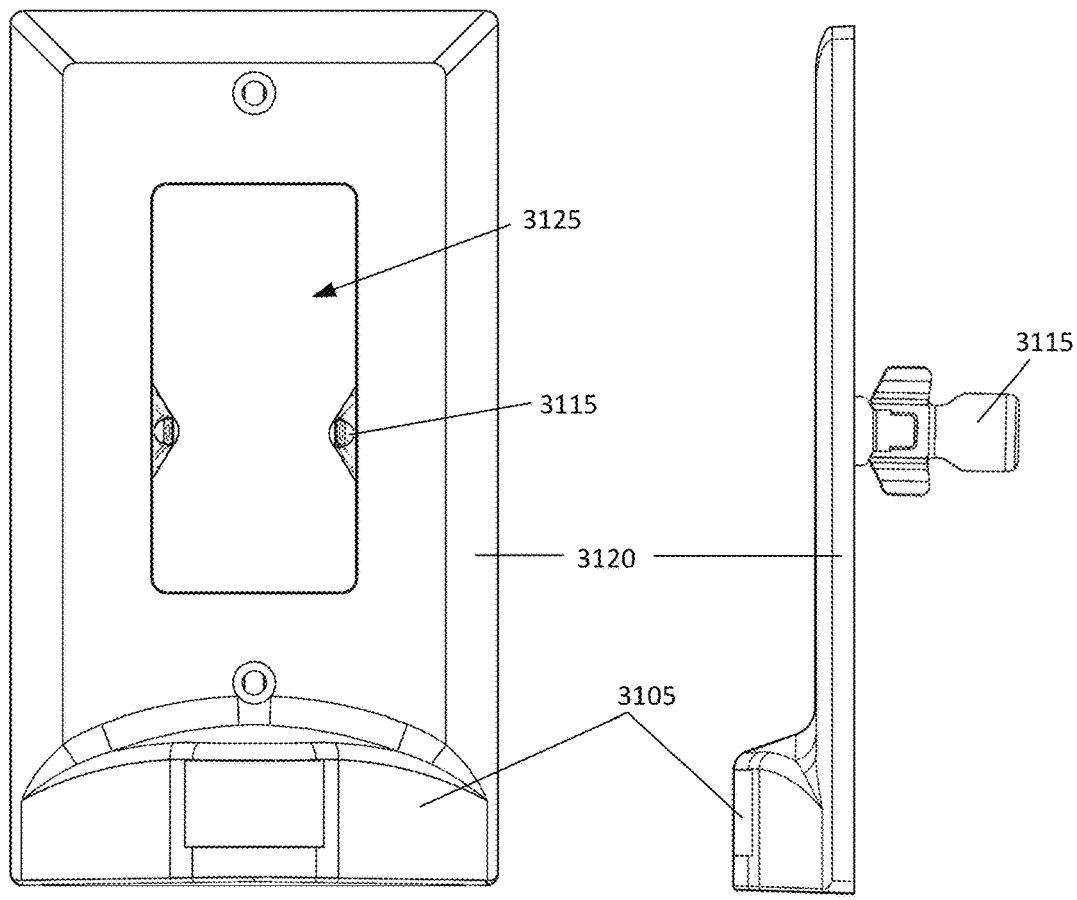
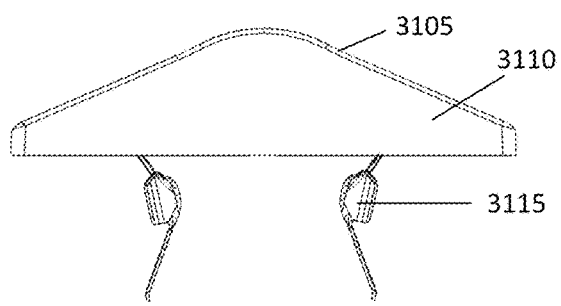
Fig. 39A
Fig. 39B
Fig. 39C
Fig. 39D

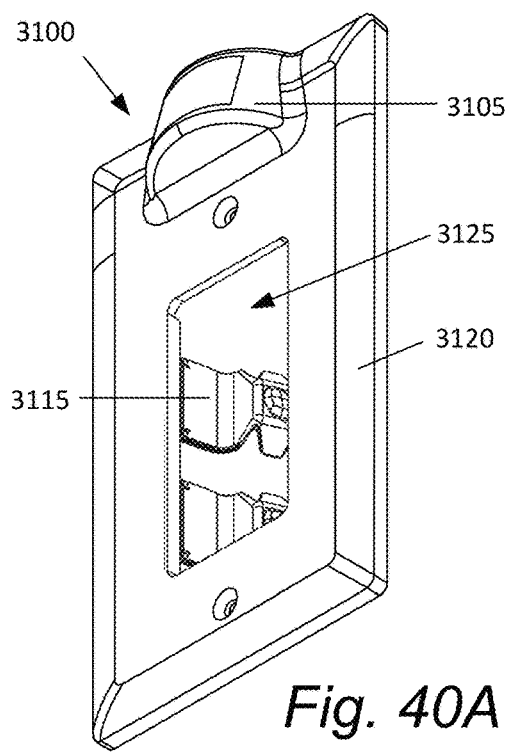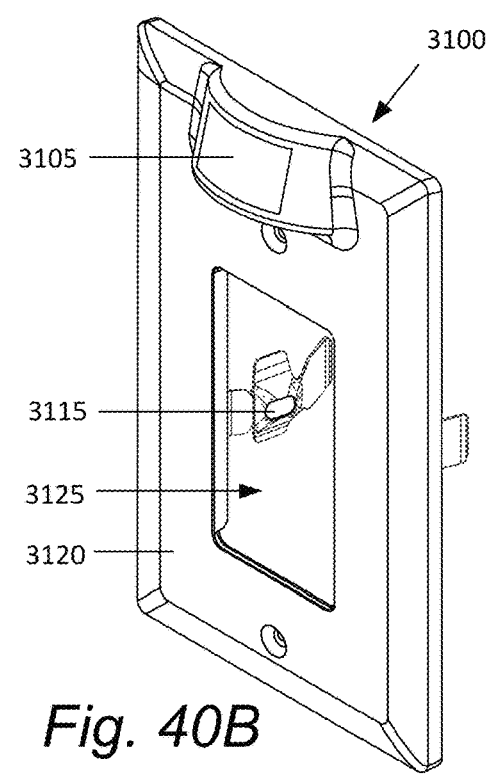
Fig. 40A  Fig. 40B
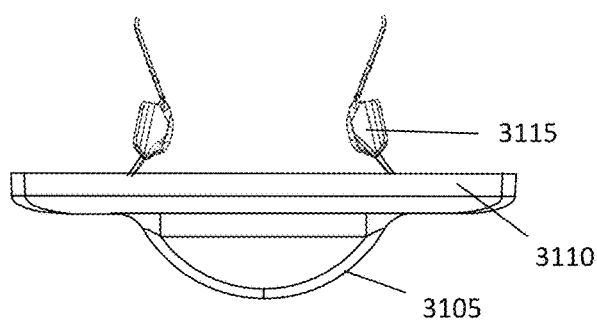
Fig. 40C
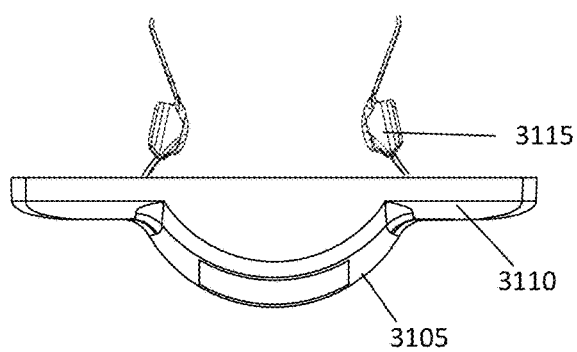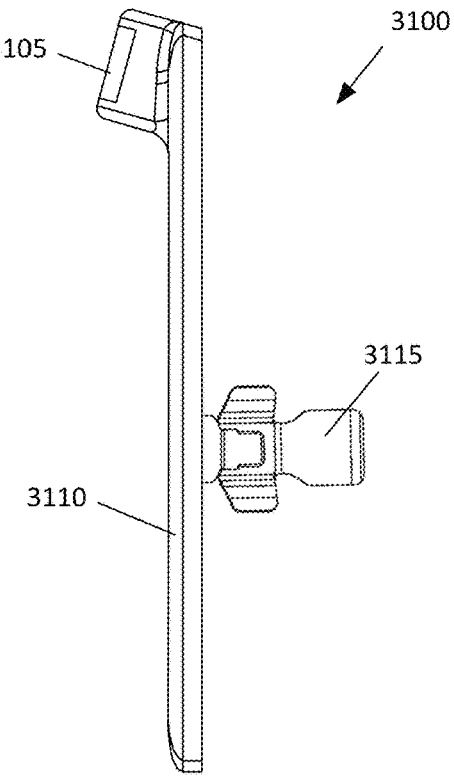
Fig. 40D  Fig. 40E

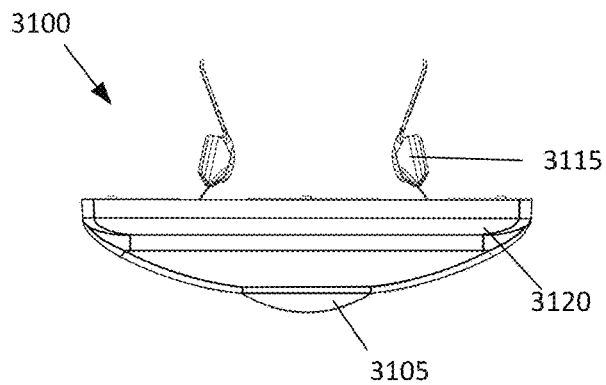
*Fig. 41A*
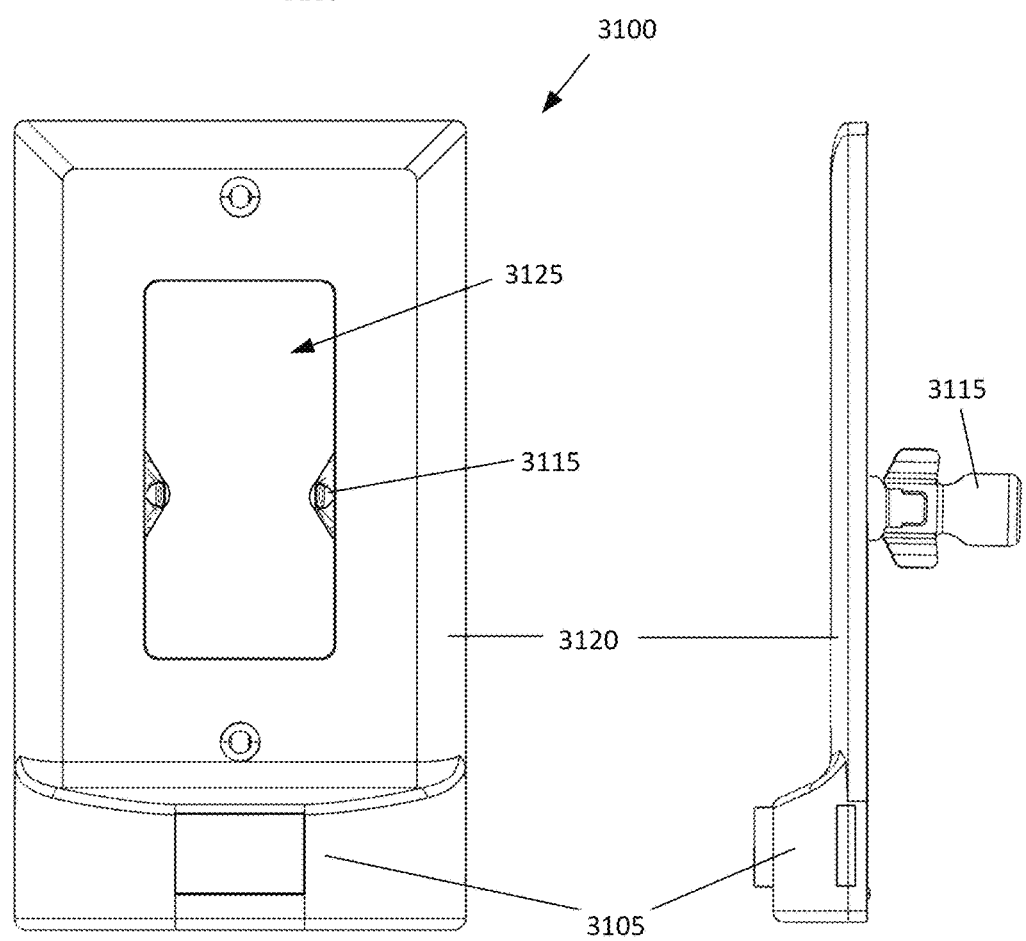
*Fig. 41B*   *Fig. 41C*
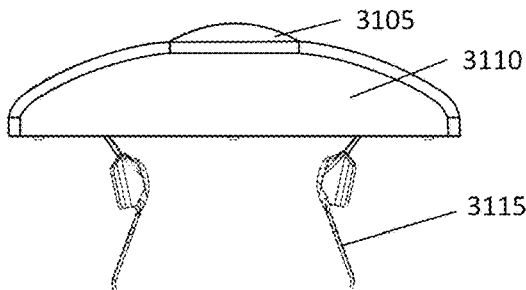
*Fig. 41D*

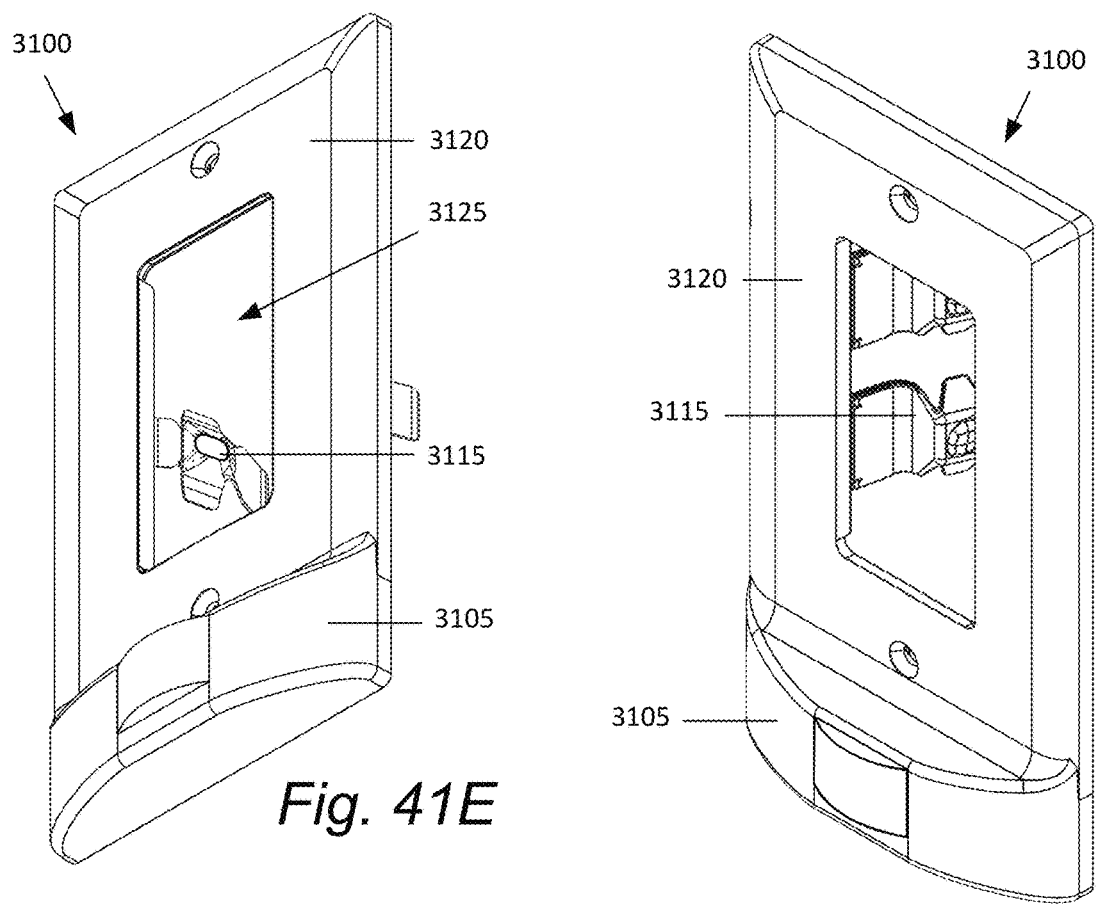
Fig. 41E
Fig. 41F
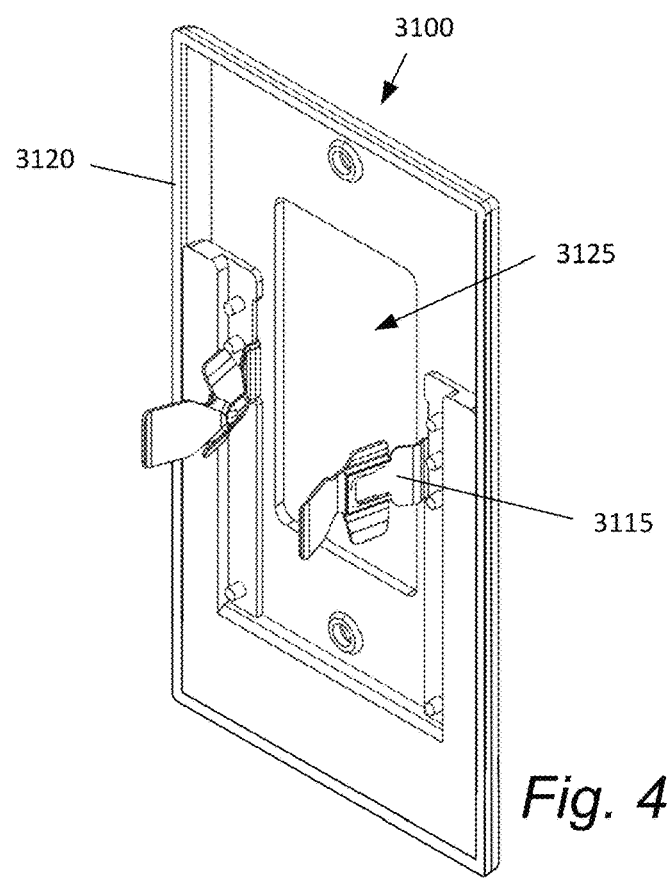
Fig. 41G

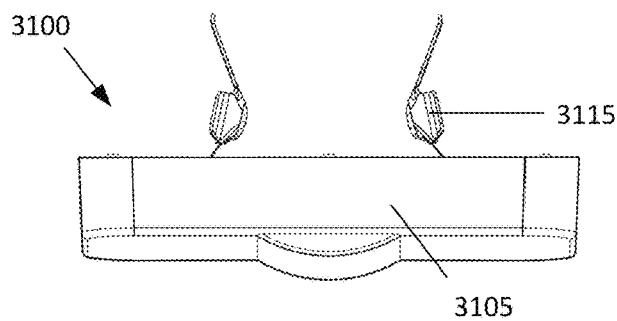
*Fig. 42A*
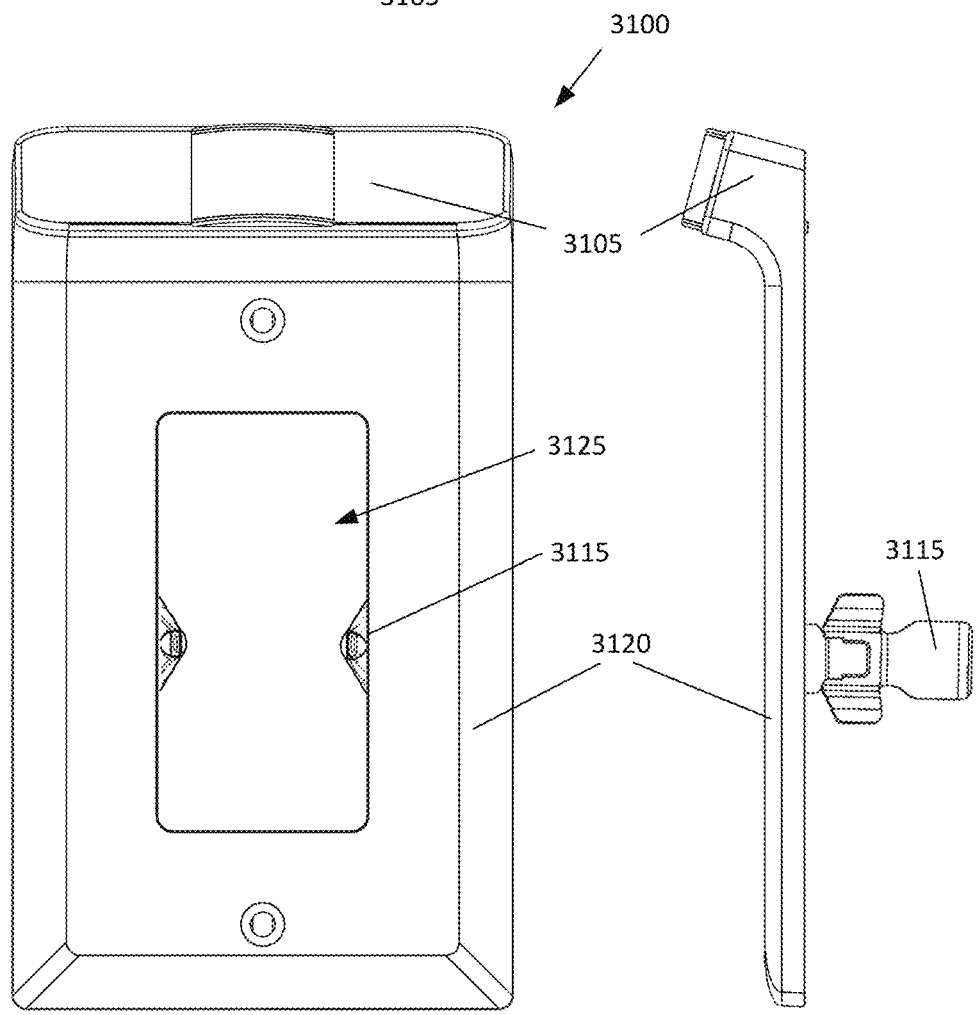
*Fig. 42B*  *Fig. 42C*
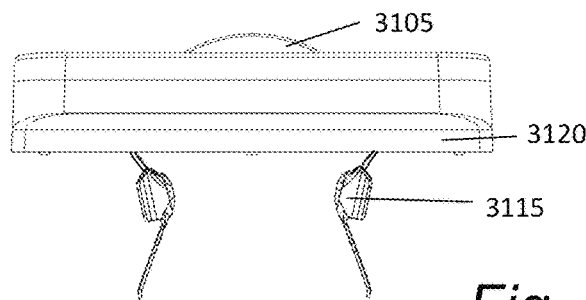
*Fig. 42D*

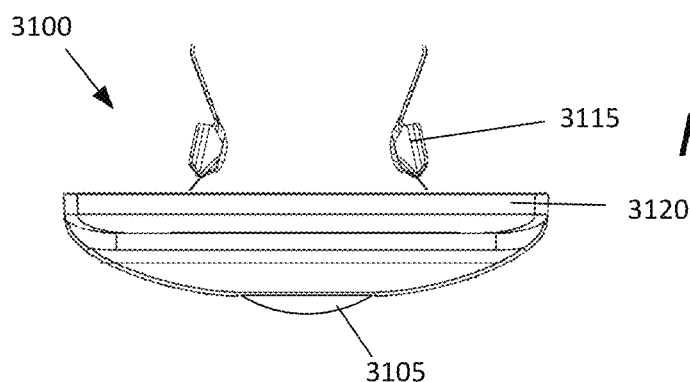
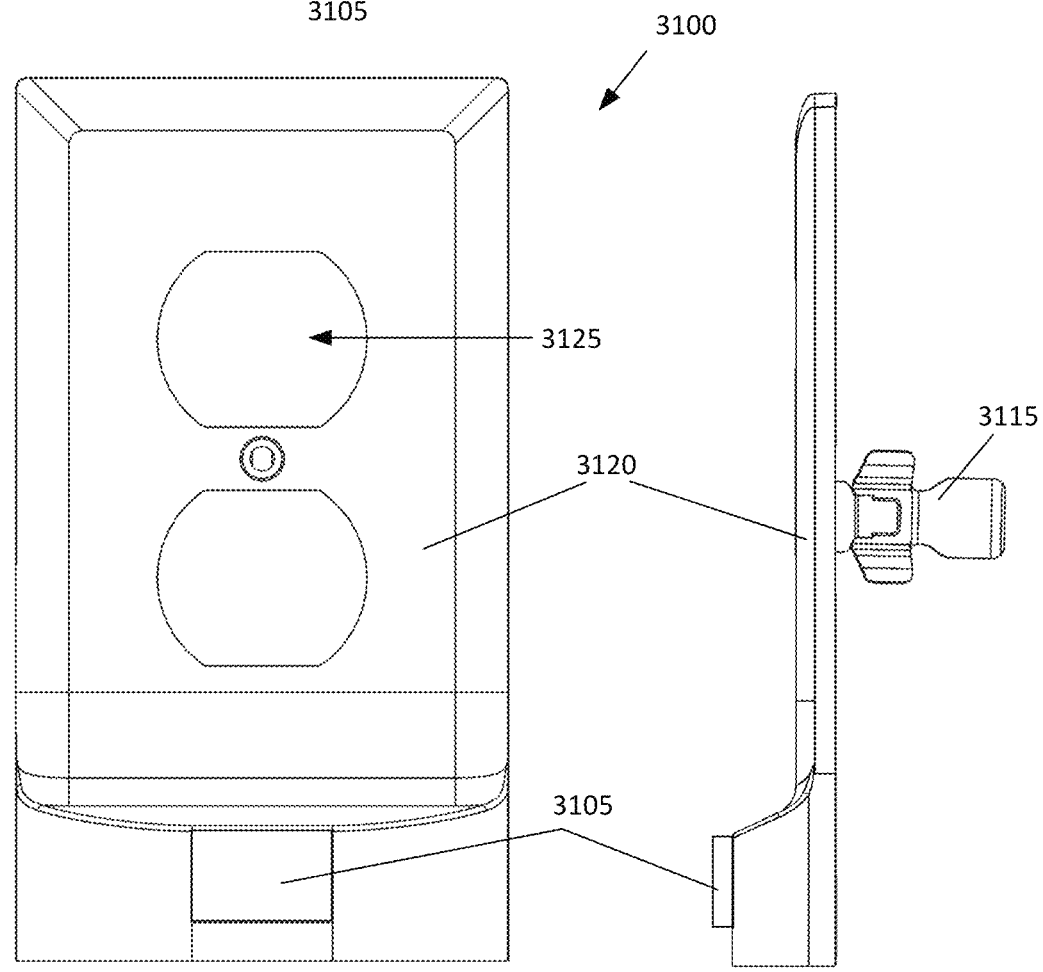
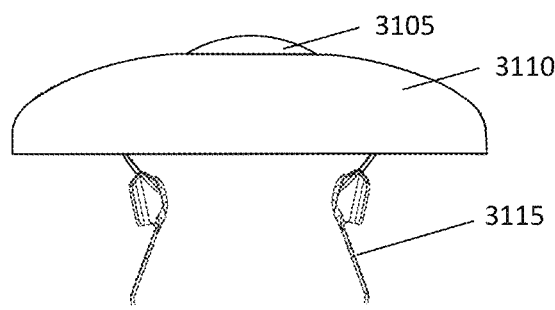

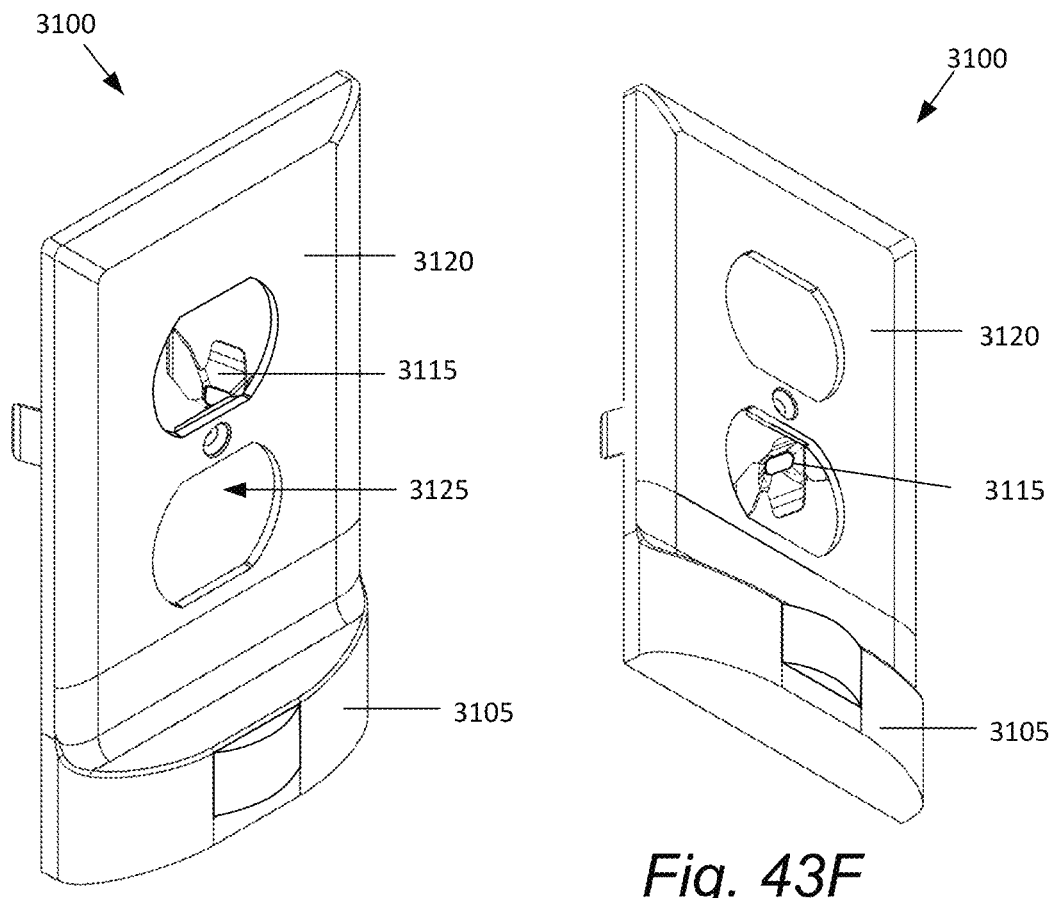
*Fig. 43E*
*Fig. 43F*
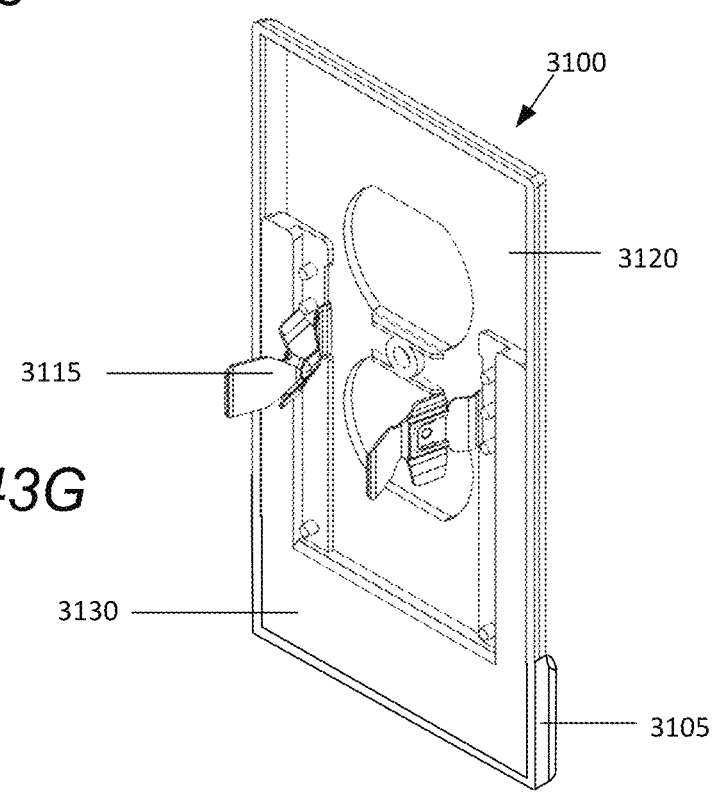
*Fig. 43G*

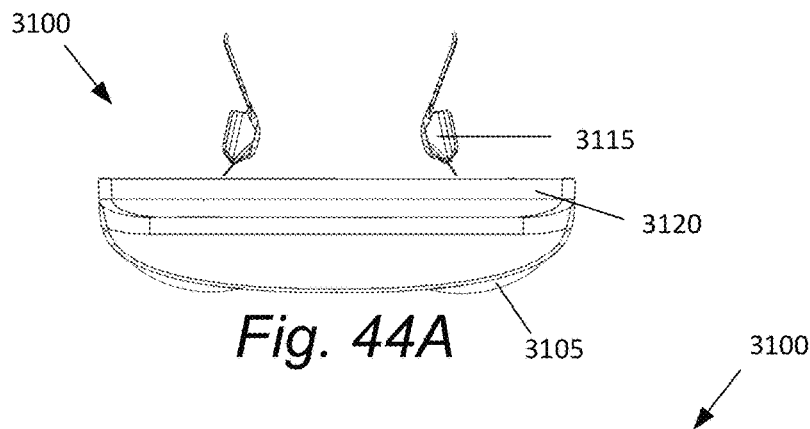
*Fig. 44A*
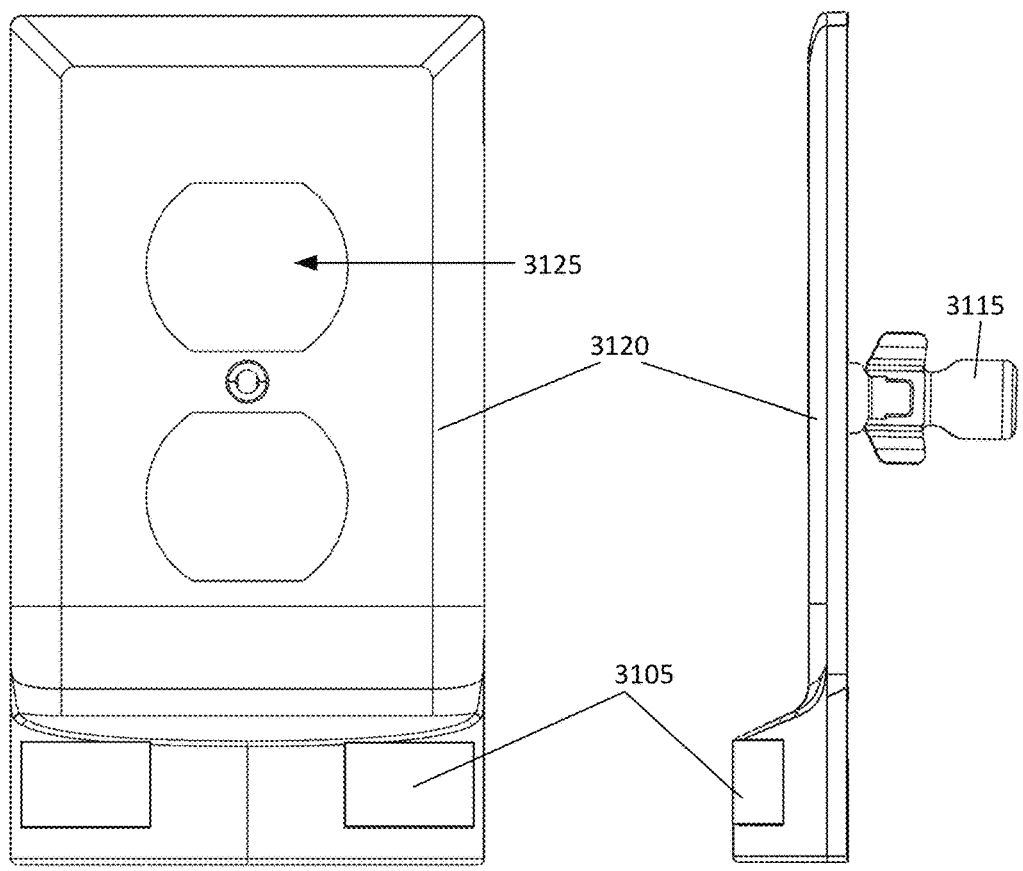
*Fig. 44B*   *Fig. 44C*
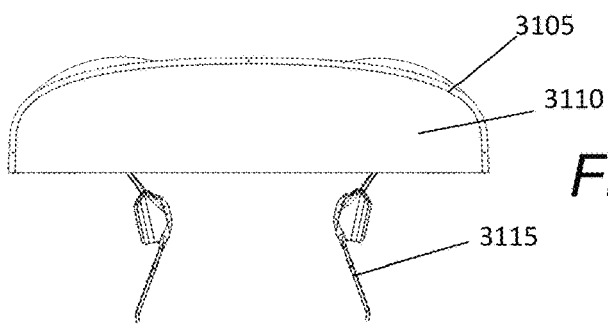
*Fig. 44D*

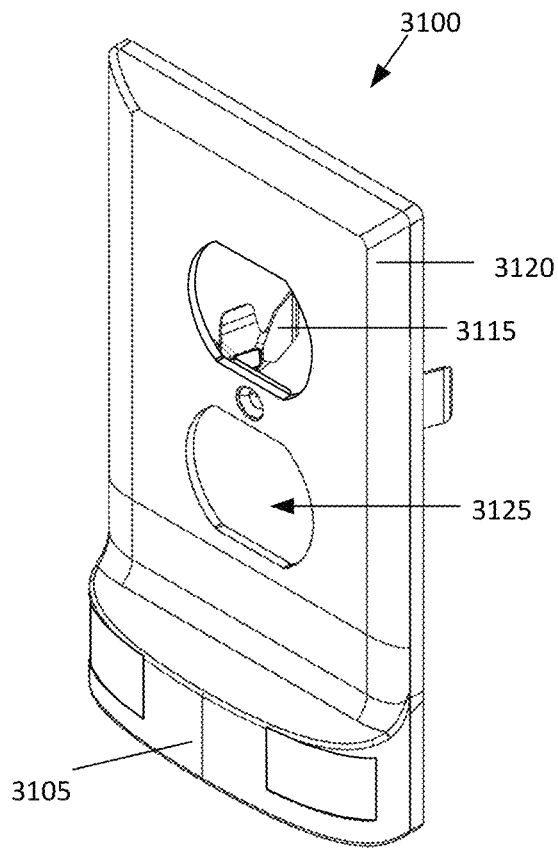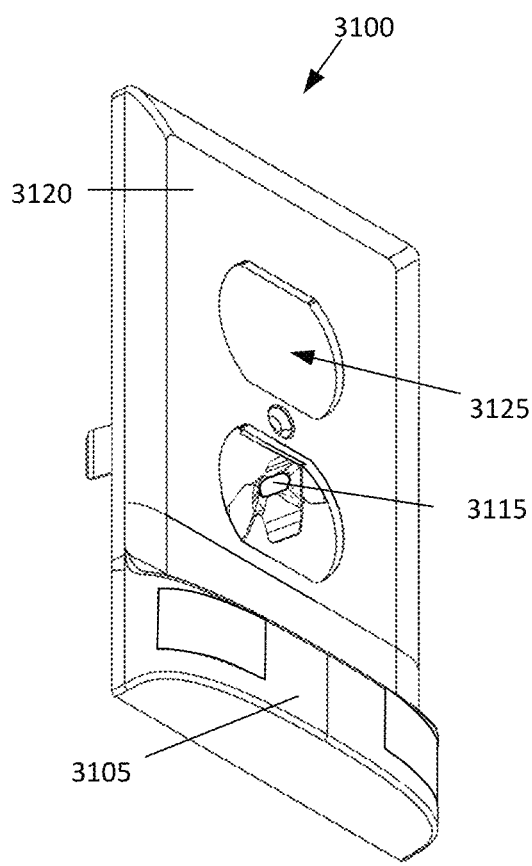
Fig. 44L
Fig. 44M
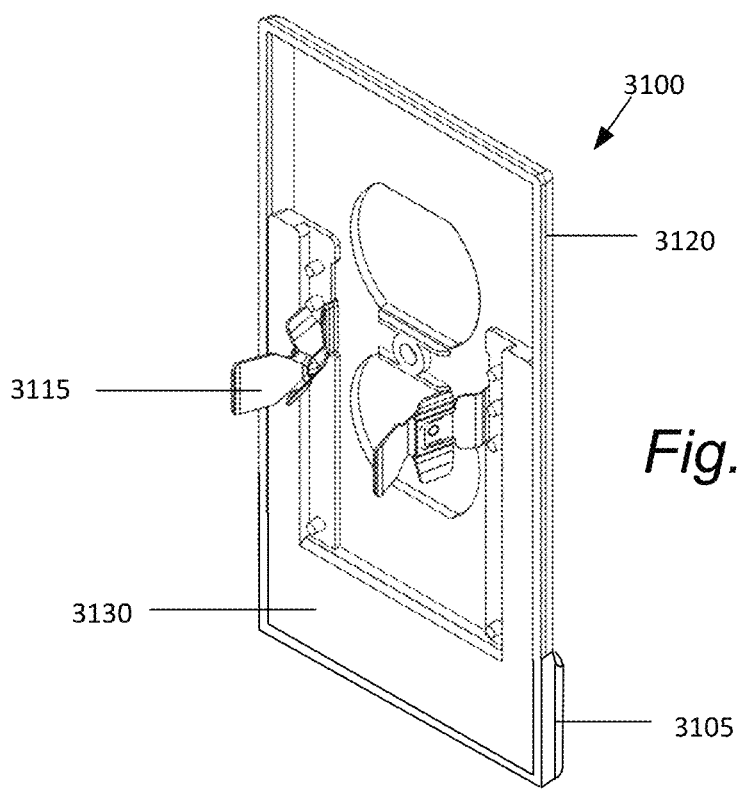
Fig. 44N

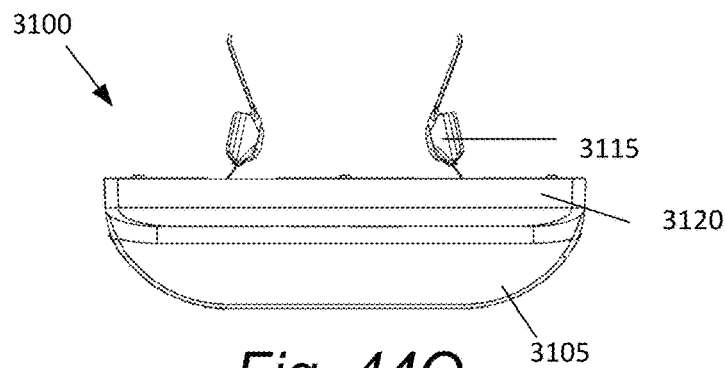
Fig. 44O
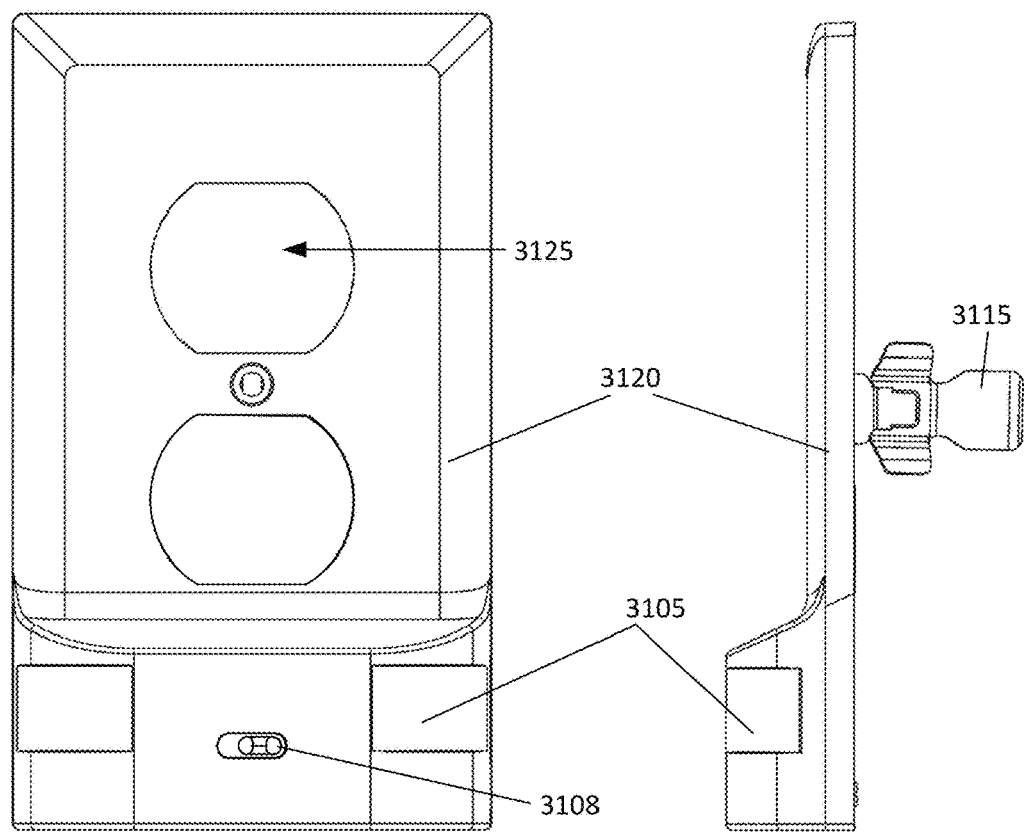
Fig. 44P
Fig. 44Q
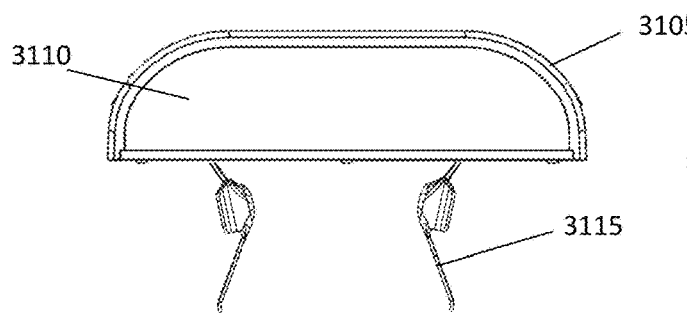
Fig. 44R

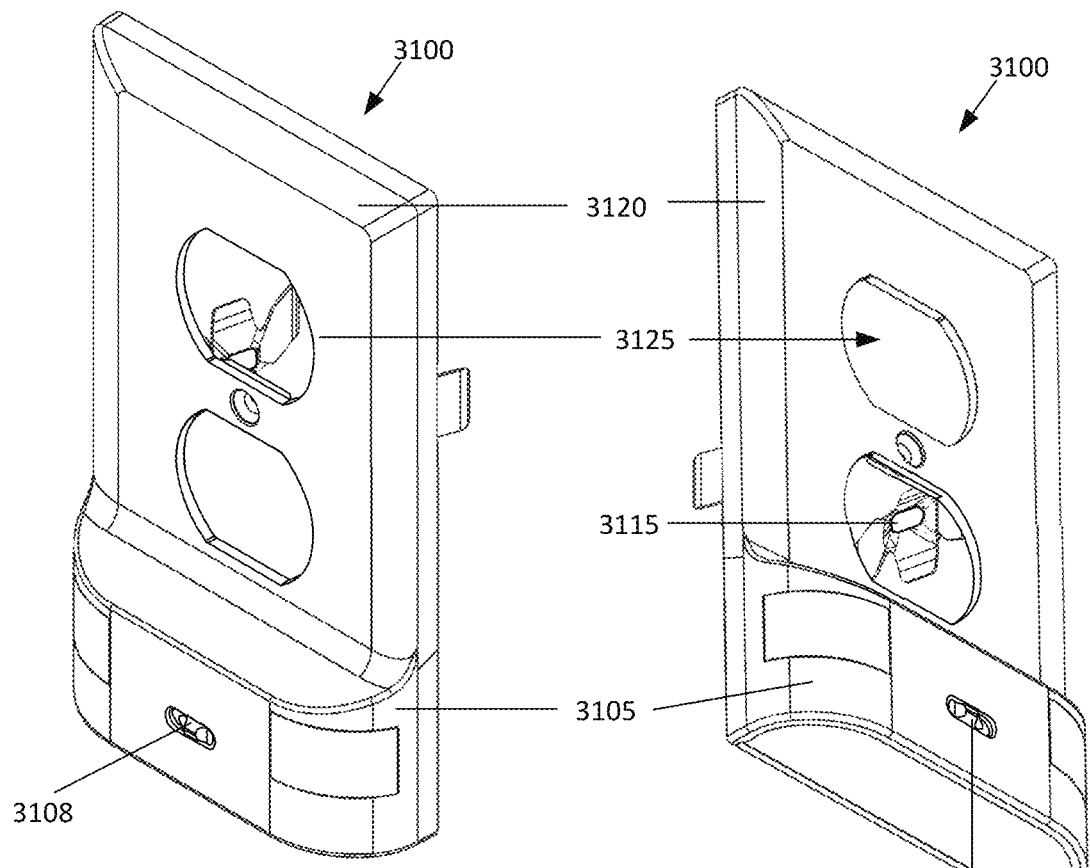
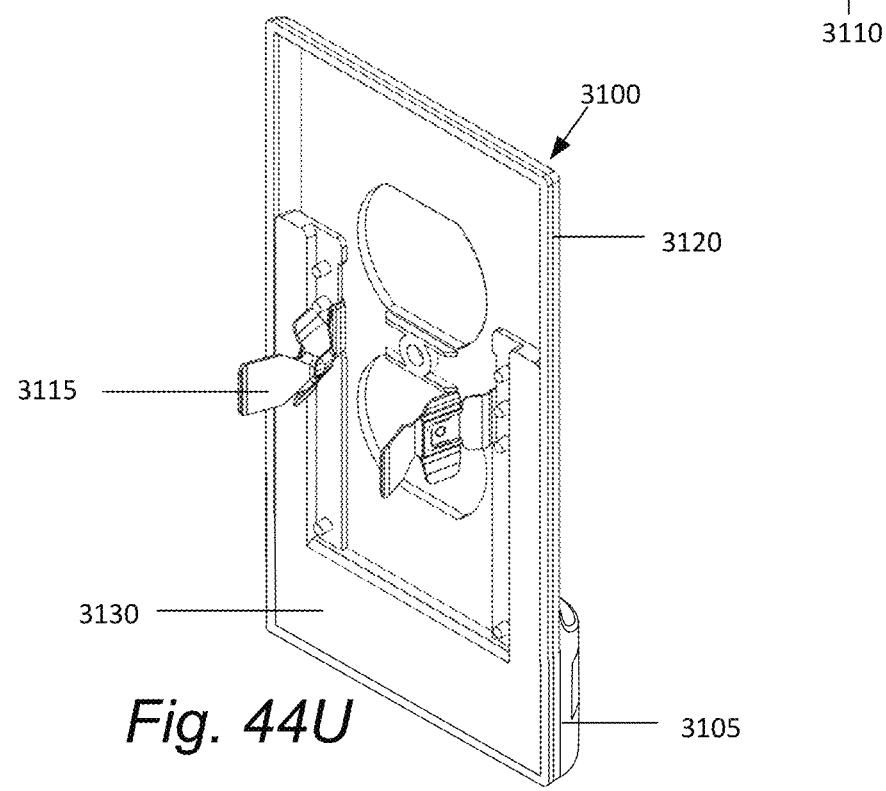
Fig. 44S
Fig. 44T
Fig. 44U

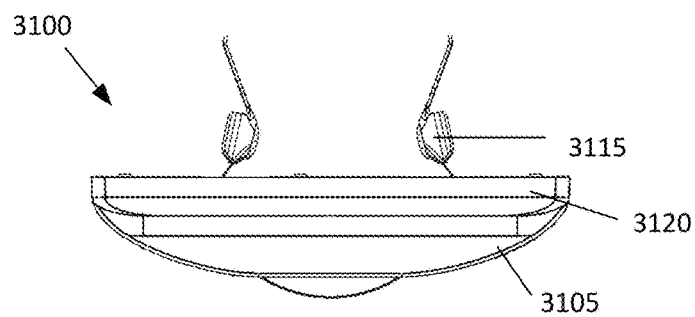
Fig. 44V
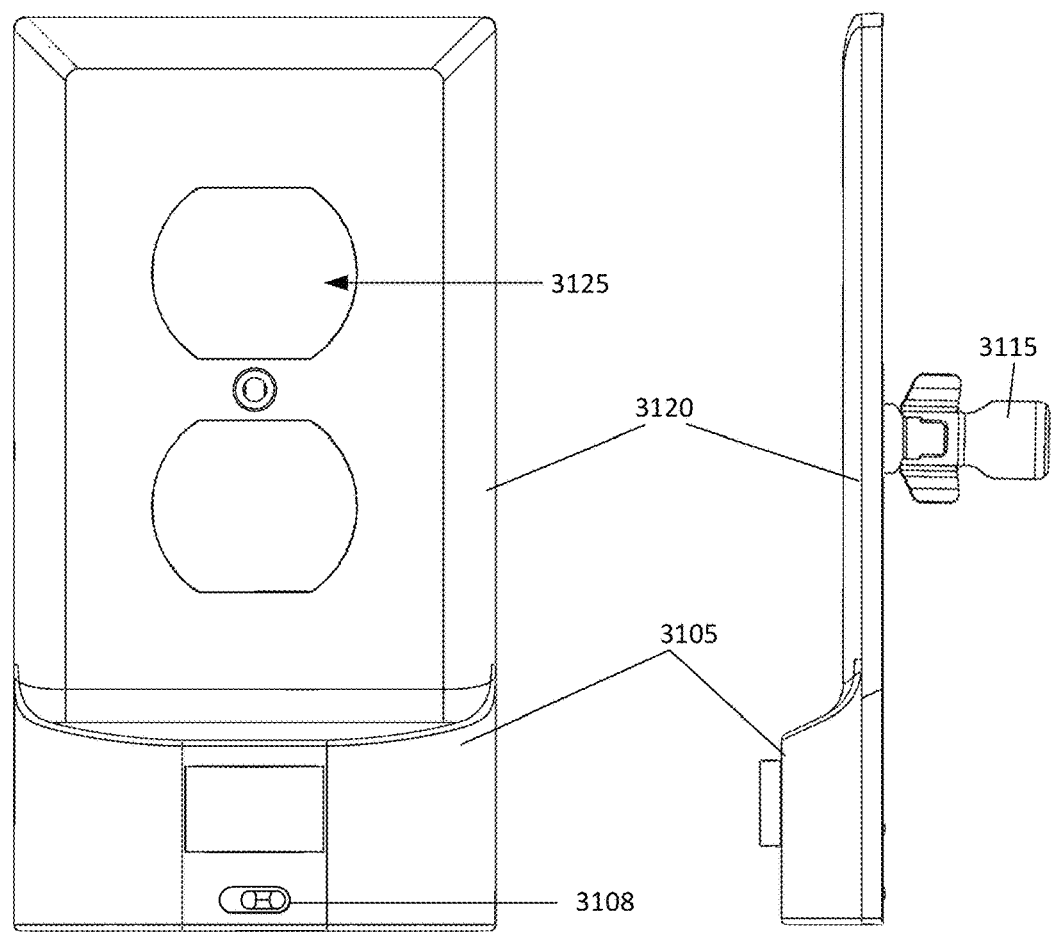
Fig. 44W
Fig. 44X
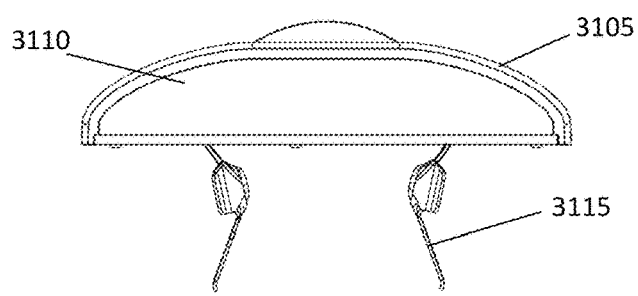
Fig. 44Y

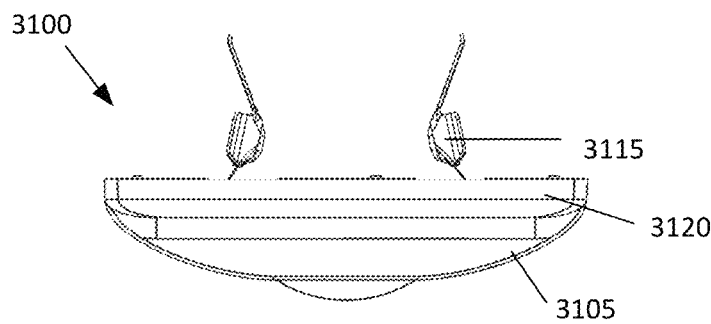
Fig. 44AC
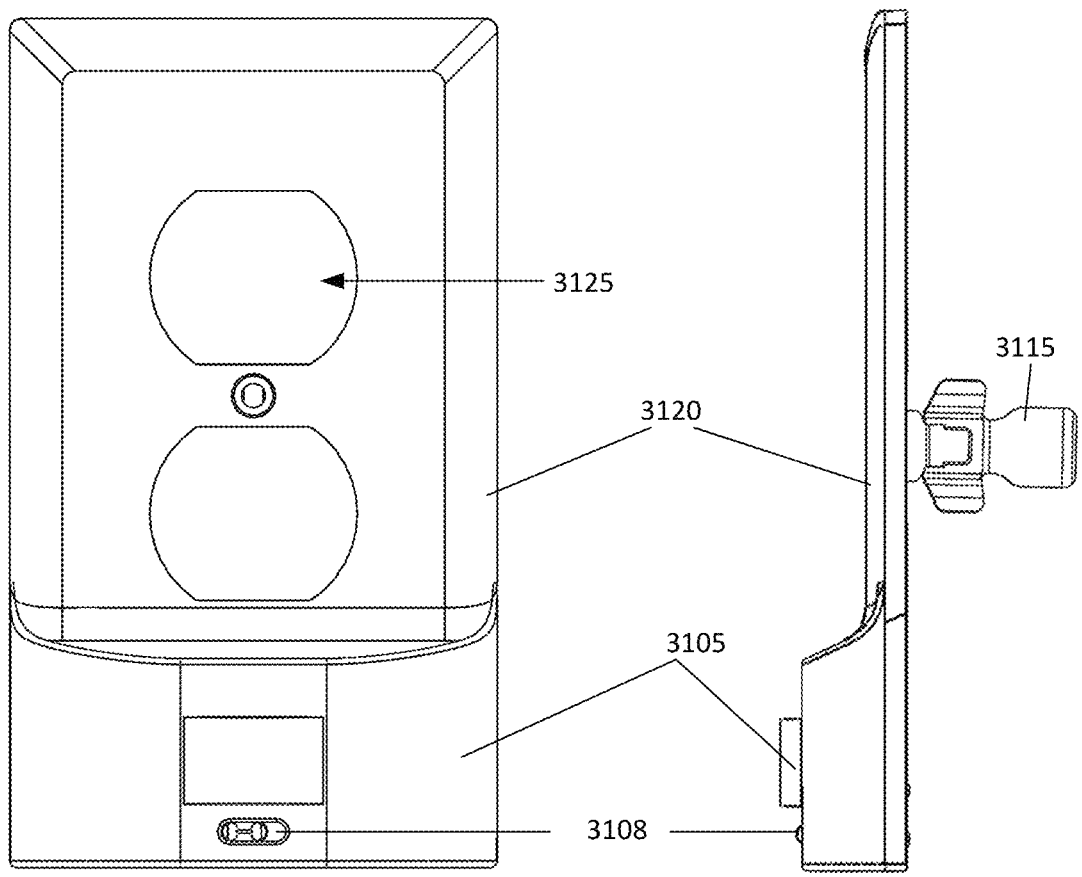
Fig. 44AD
Fig. 44AE
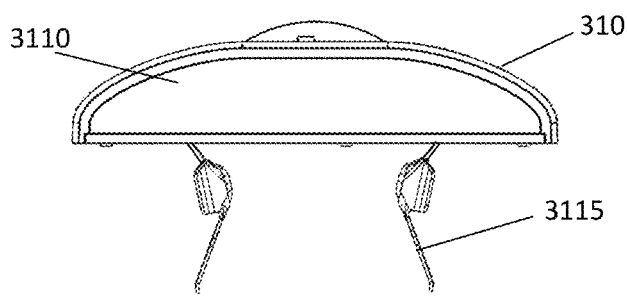
Fig. 44AF

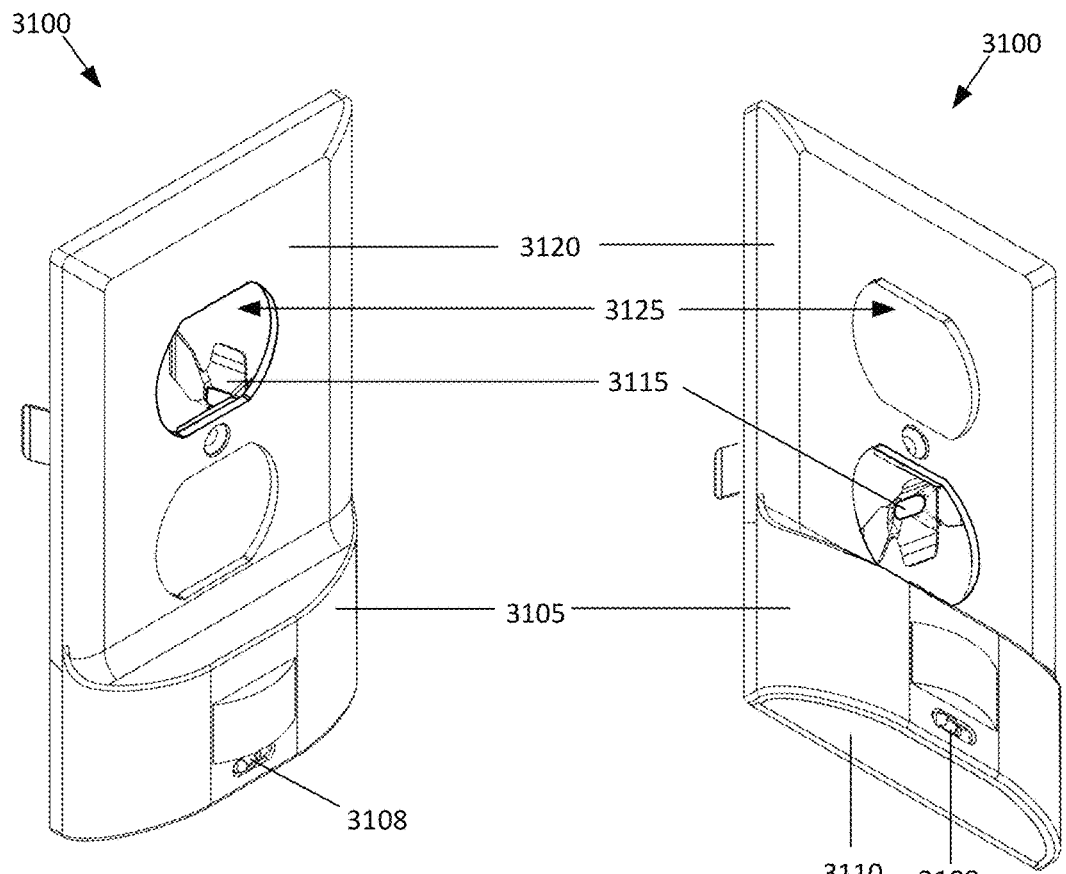
Fig. 44AG
Fig. 44AH
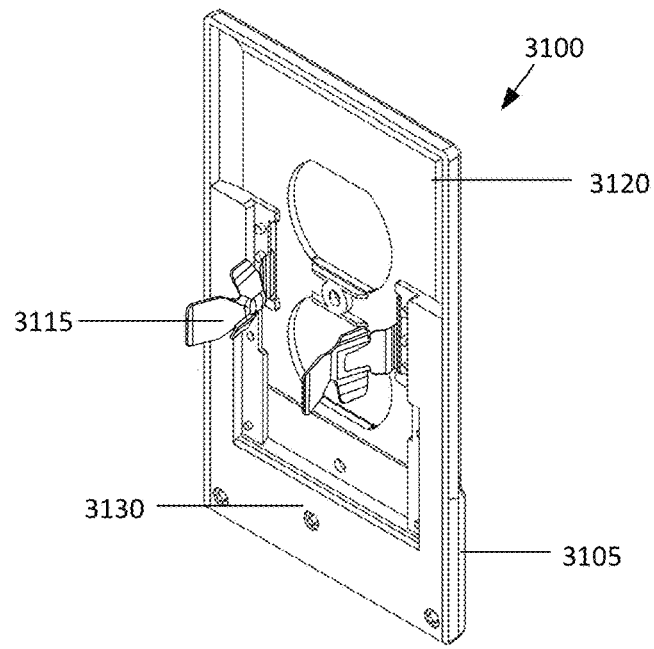
Fig. 44AI

*Fig. 45A*
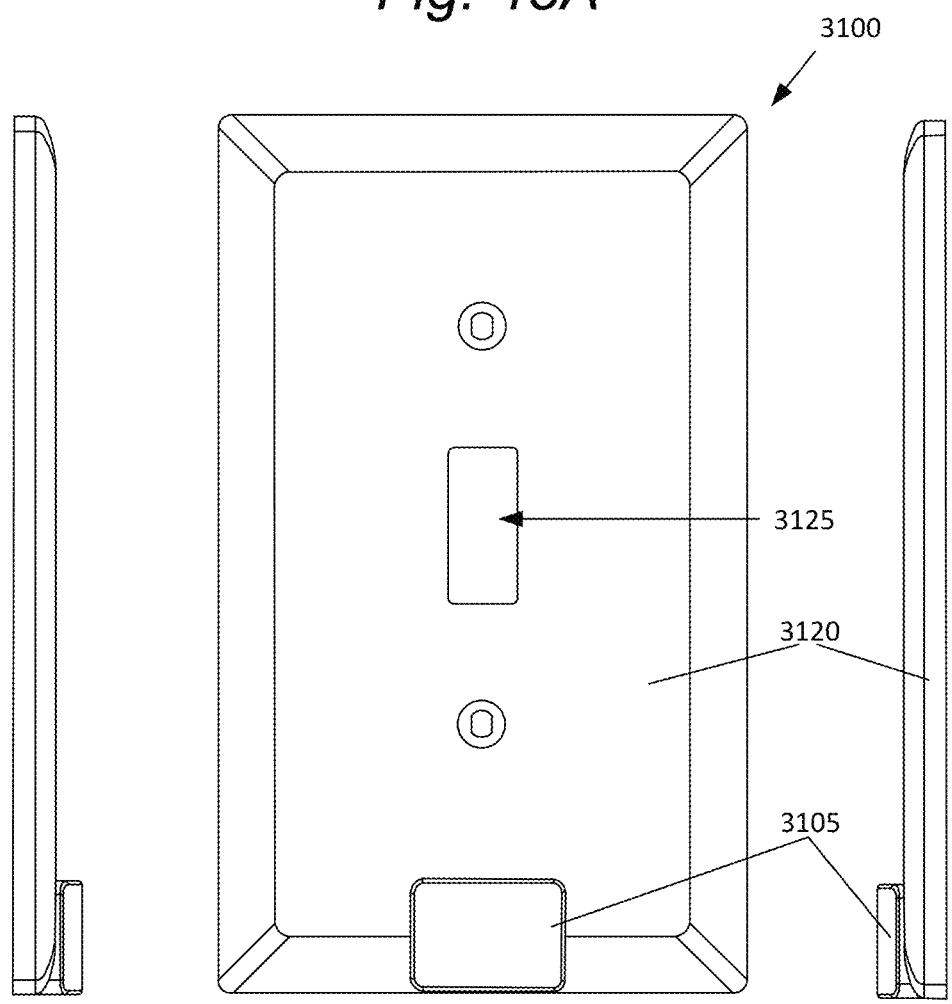
*Fig. 45B*   *Fig. 45C*   *Fig. 45D*
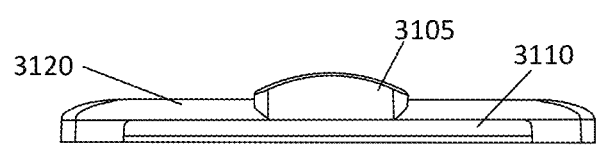
*Fig. 45E*

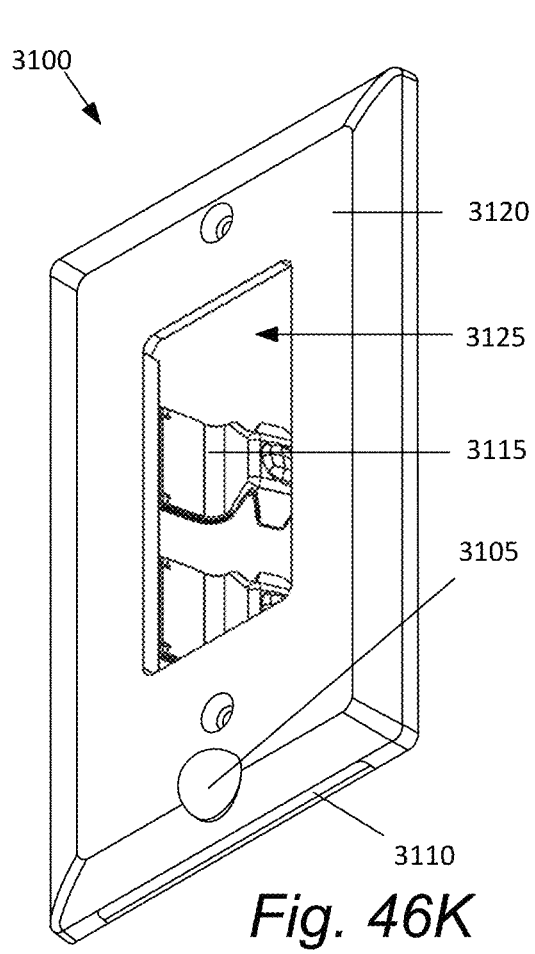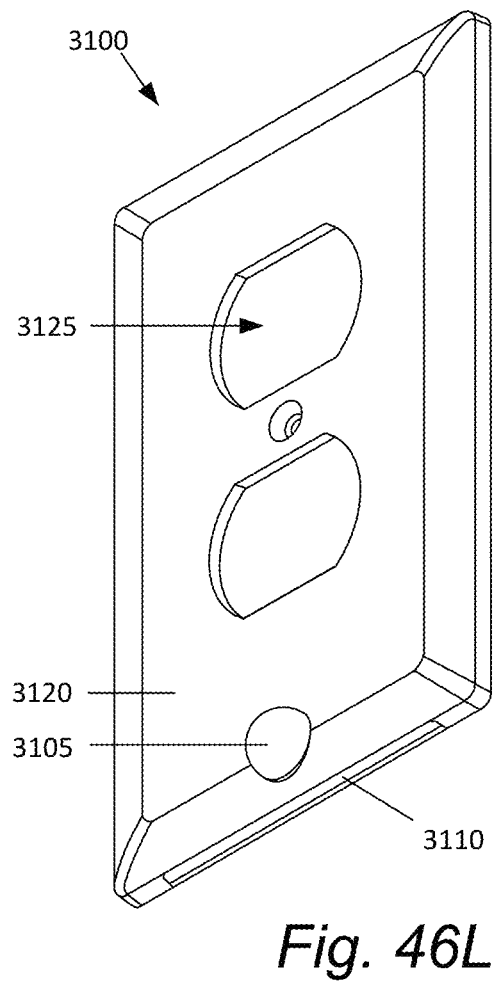
Fig. 46K
Fig. 46L

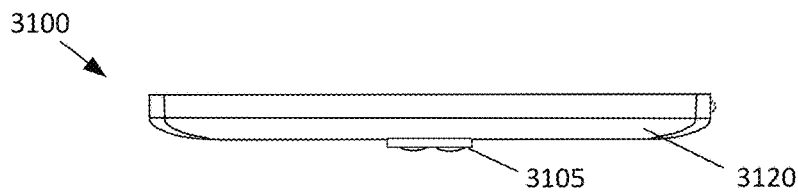
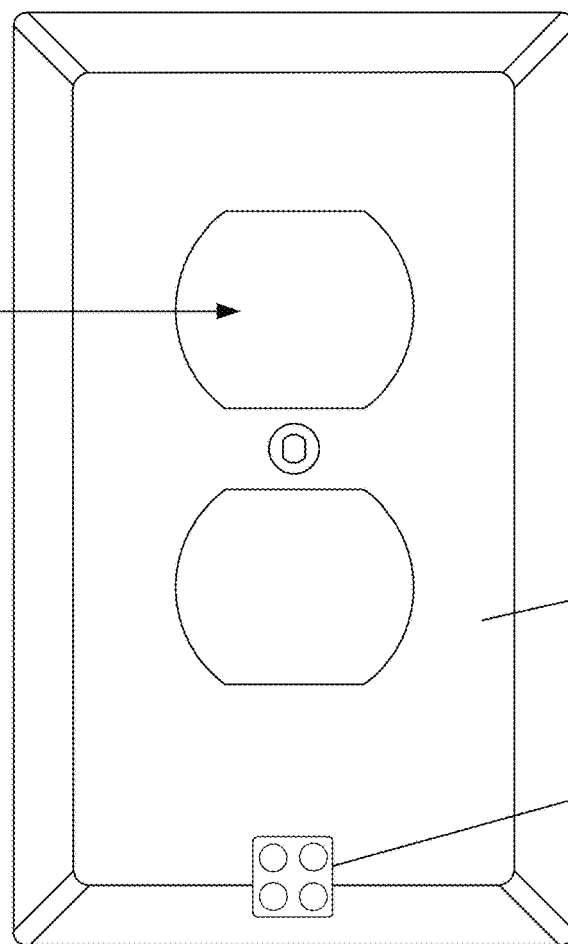
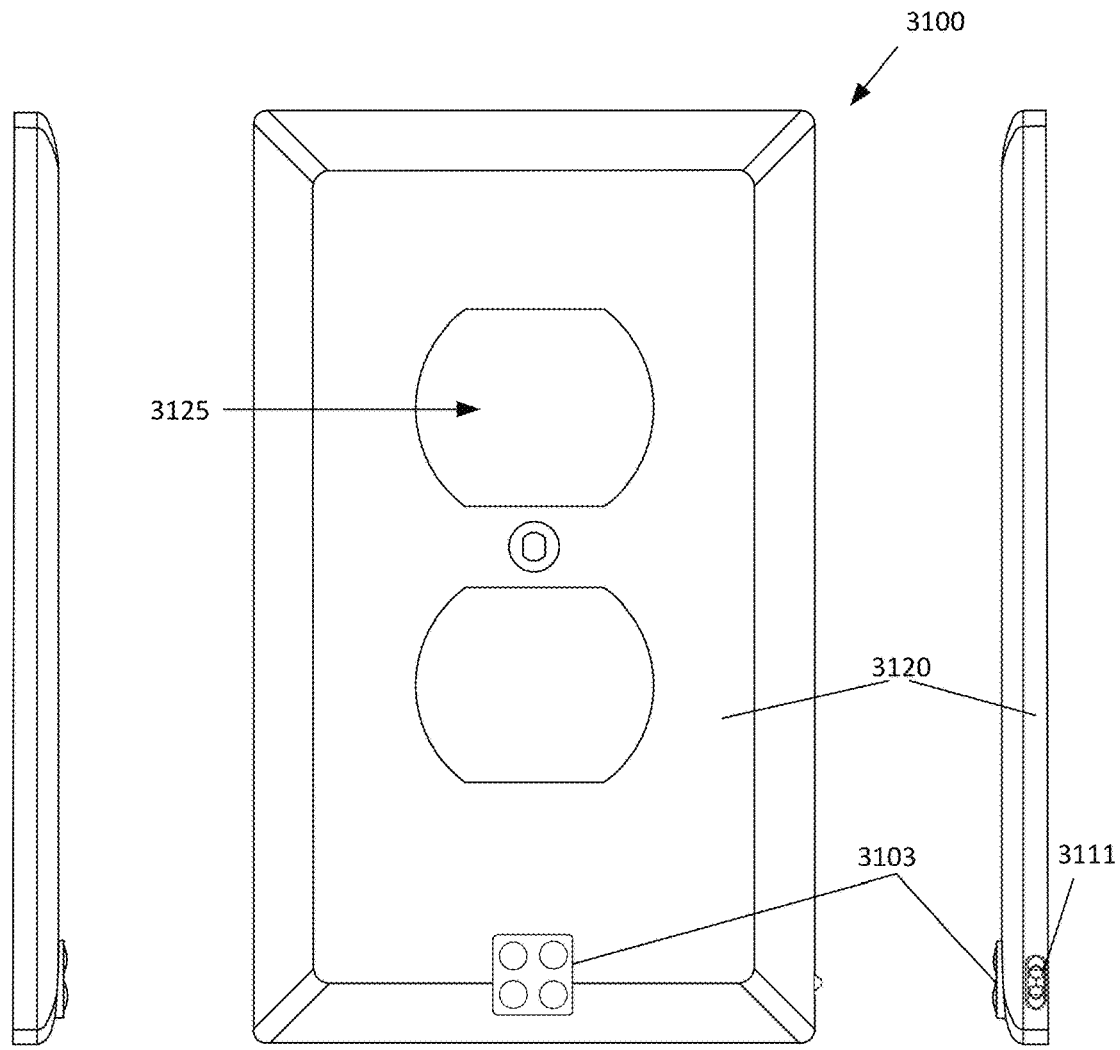
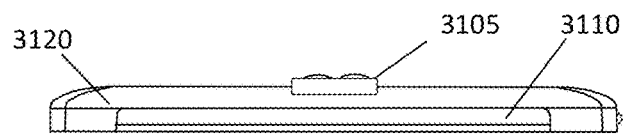
Fig. 46M
Fig. 46N     Fig. 46O     Fig. 46P
Fig. 46Q

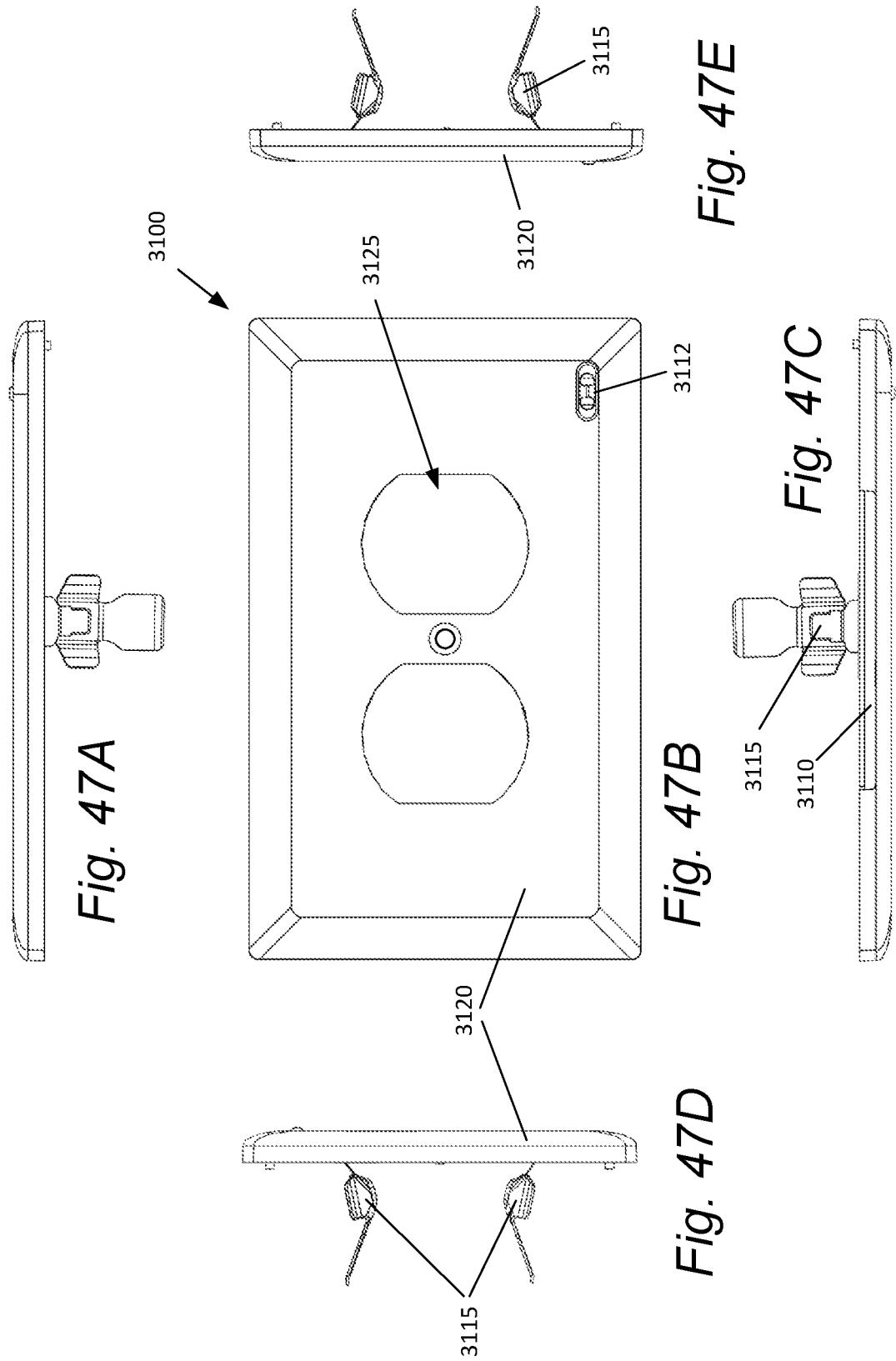

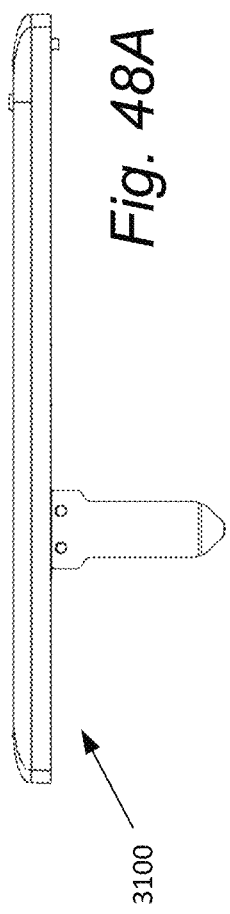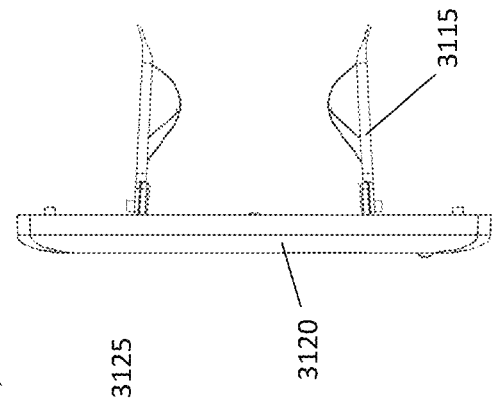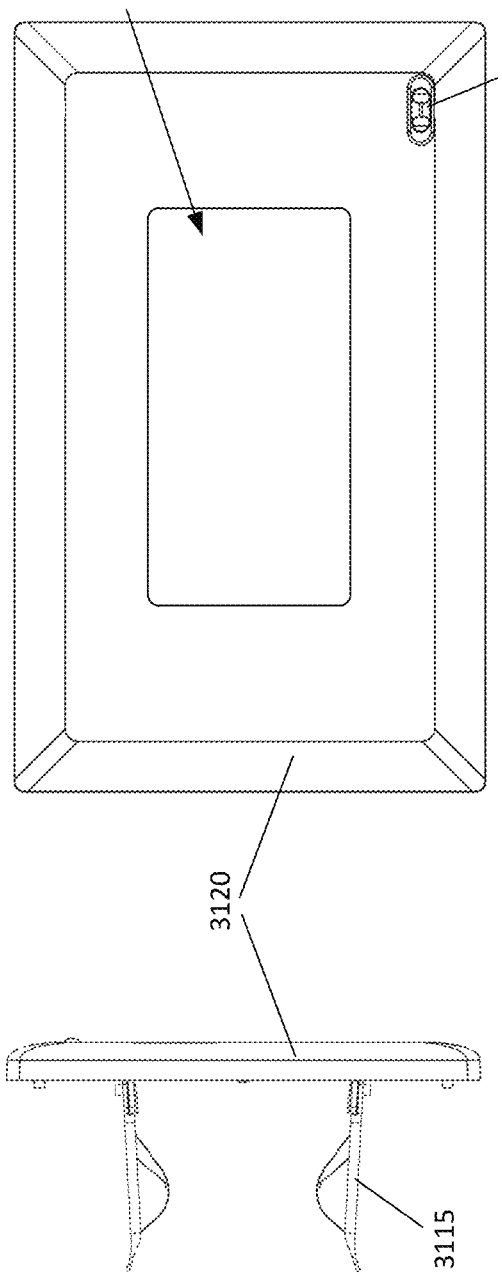

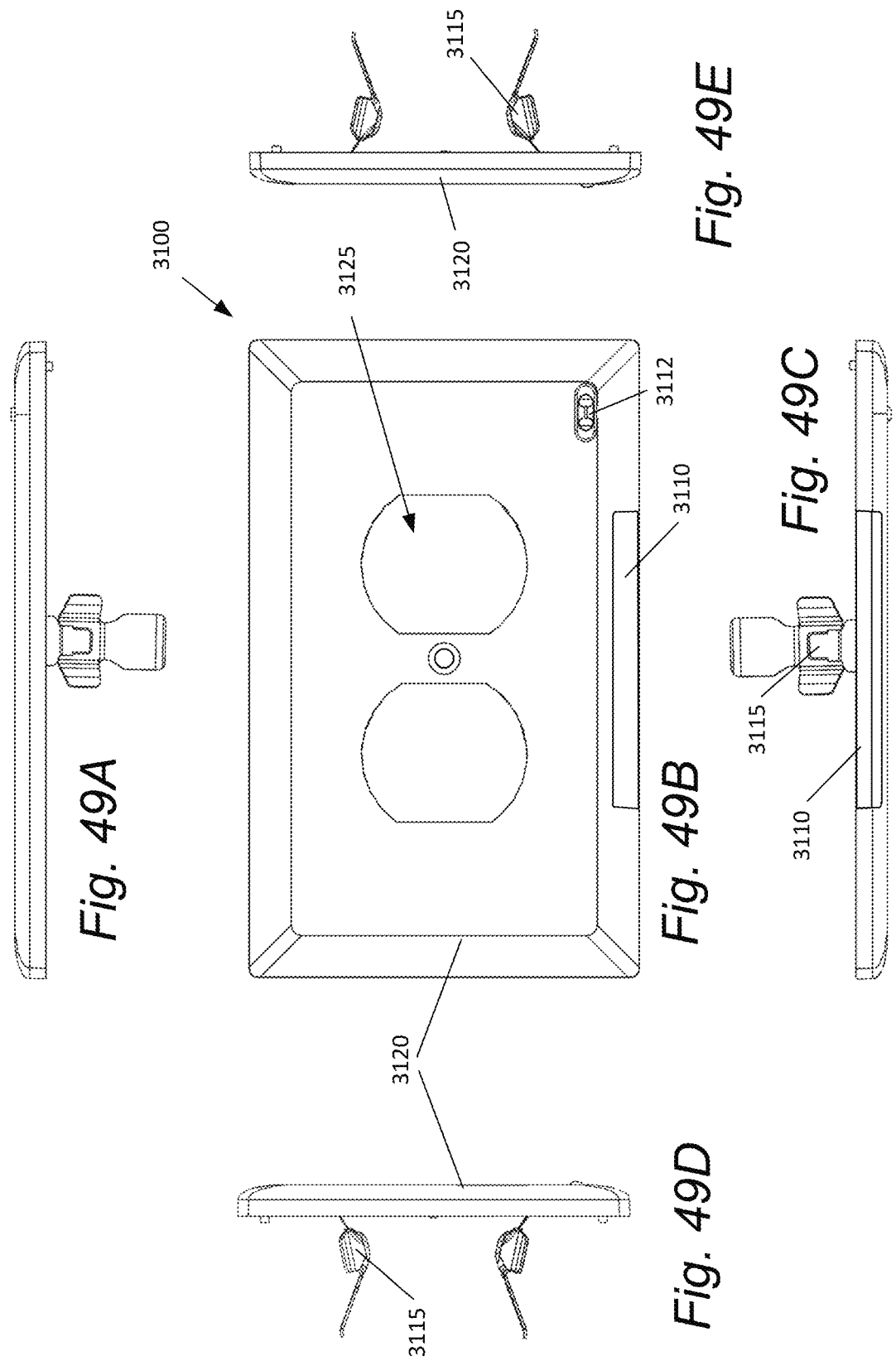

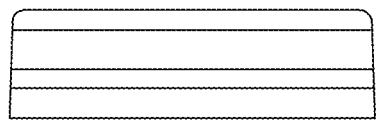
Fig. 49Y
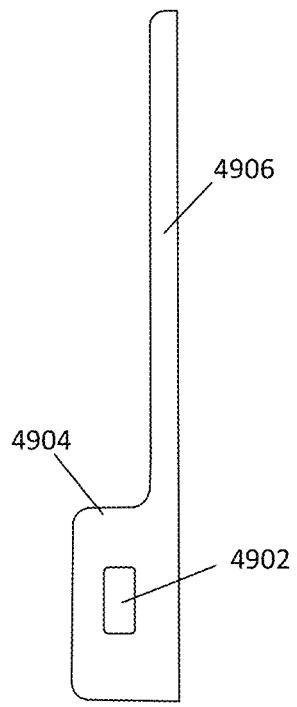 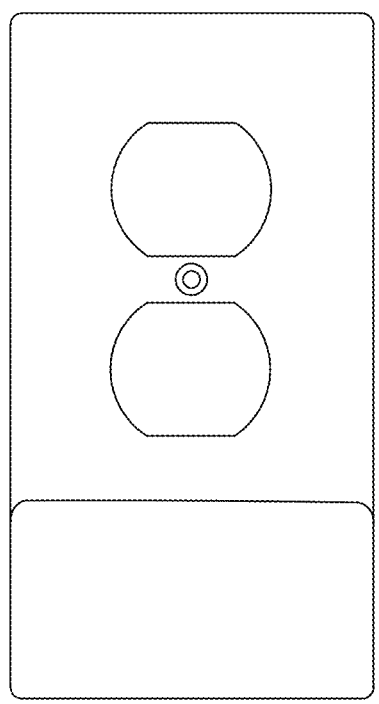 
Fig. 49U  Fig. 49V  Fig. 49W
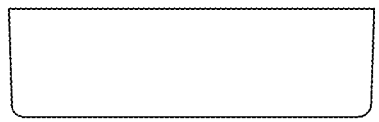
Fig. 49X

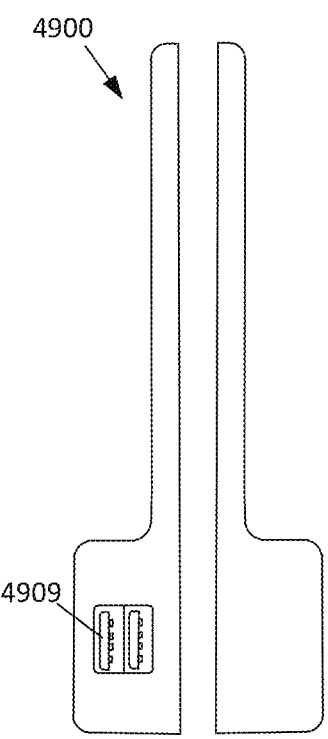 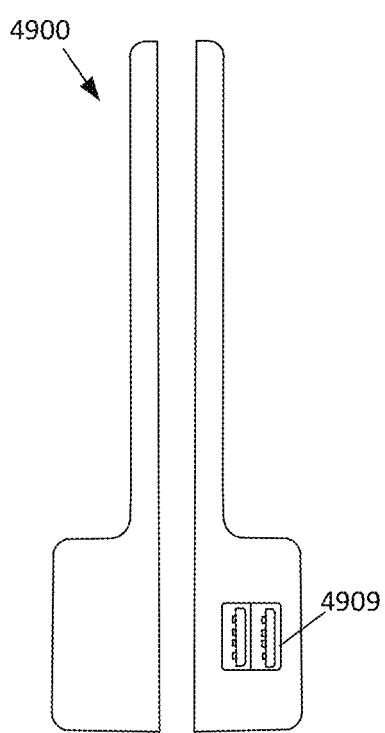
Fig. 49AF    Fig. 49AG

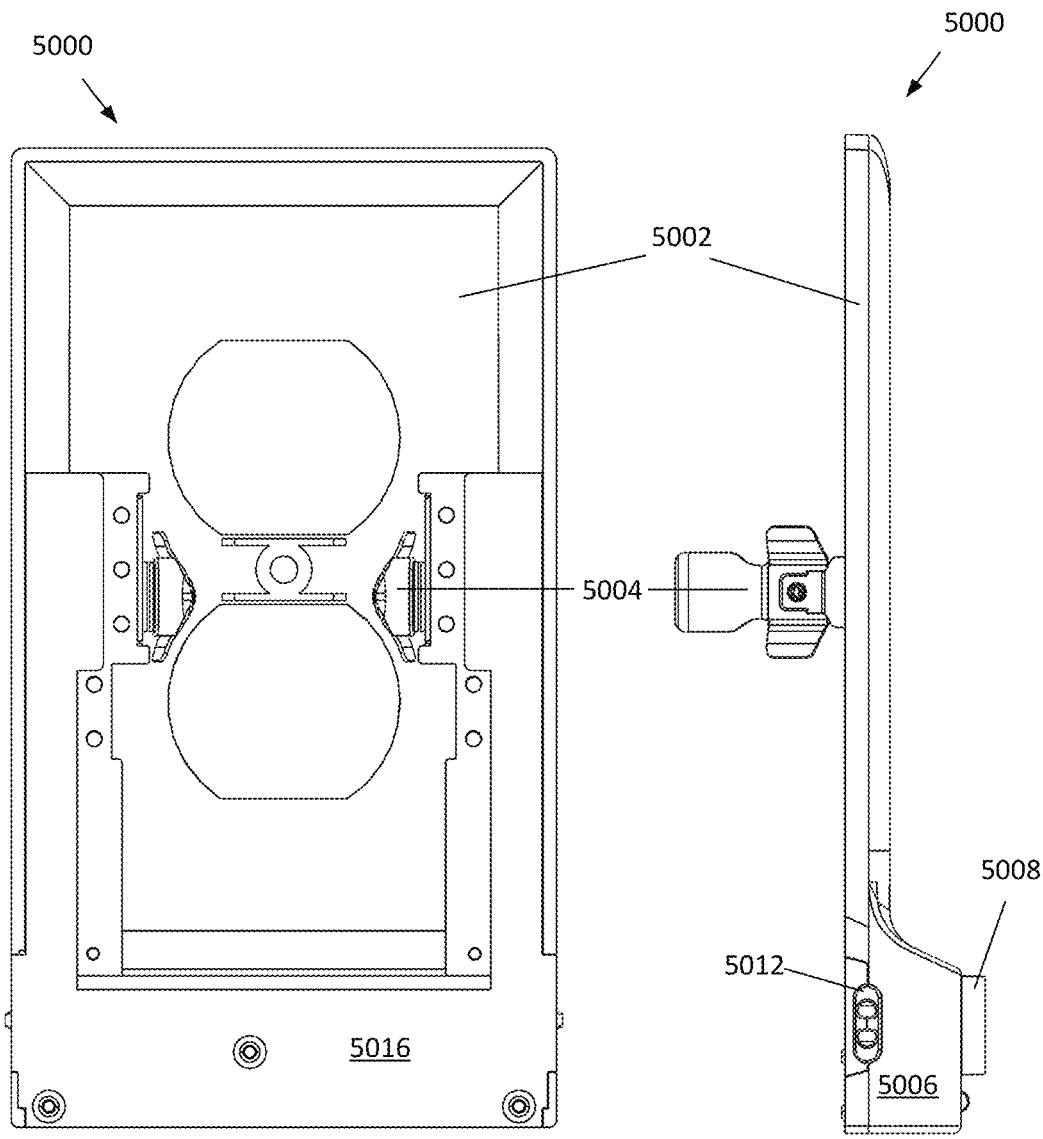
*Fig. 50E*  *Fig. 50F*

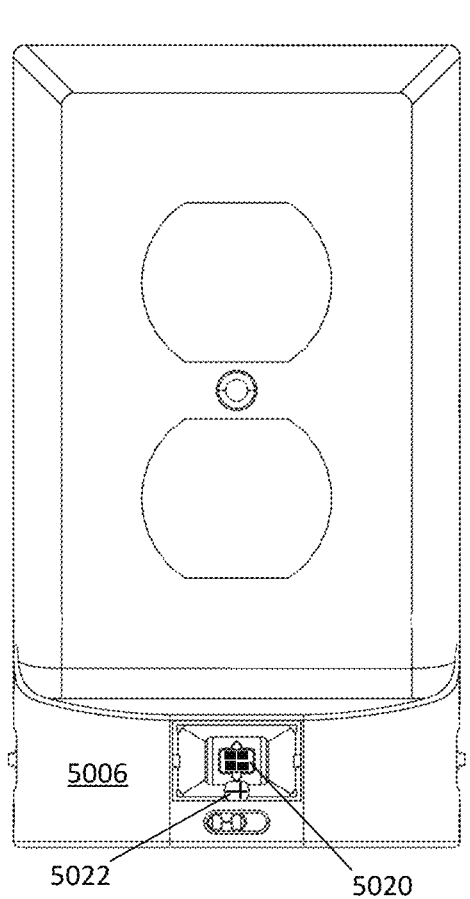
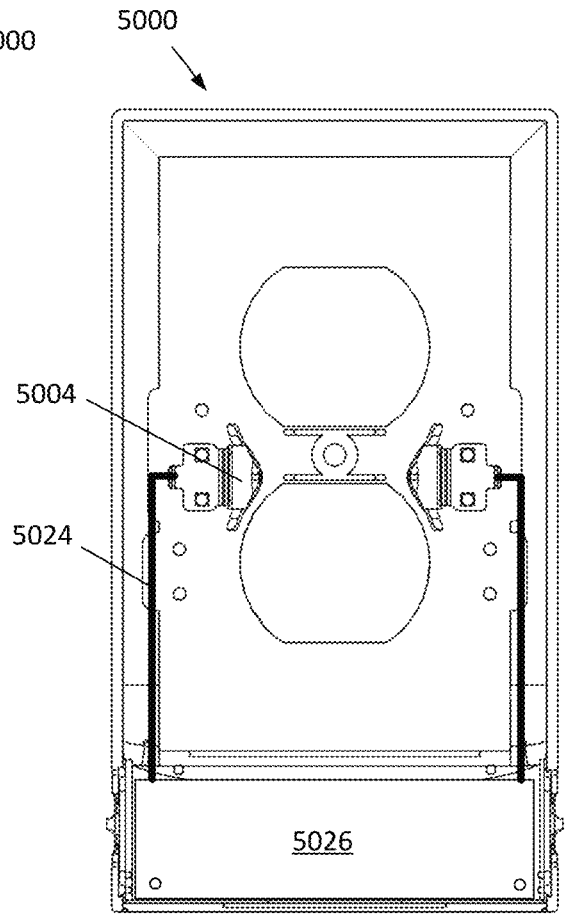
*Fig. 50I*    *Fig. 50J*
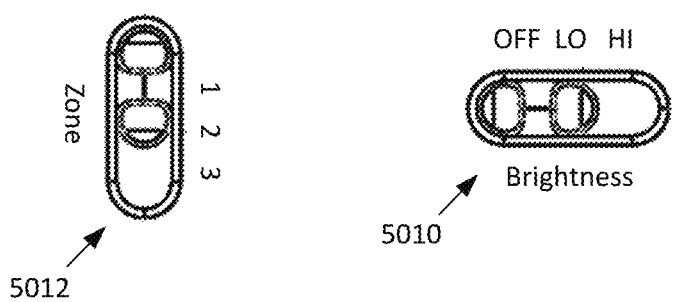
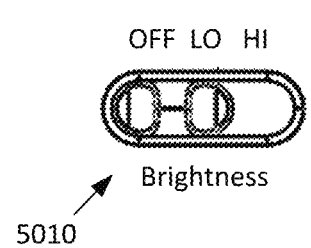
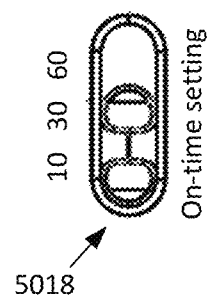
*Fig. 50K*    *Fig. 50L*    *Fig. 50M*

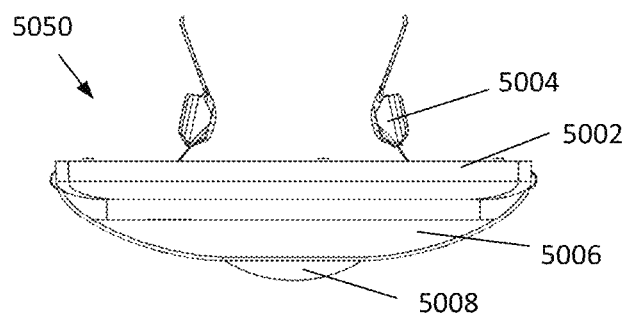
Fig. 50N
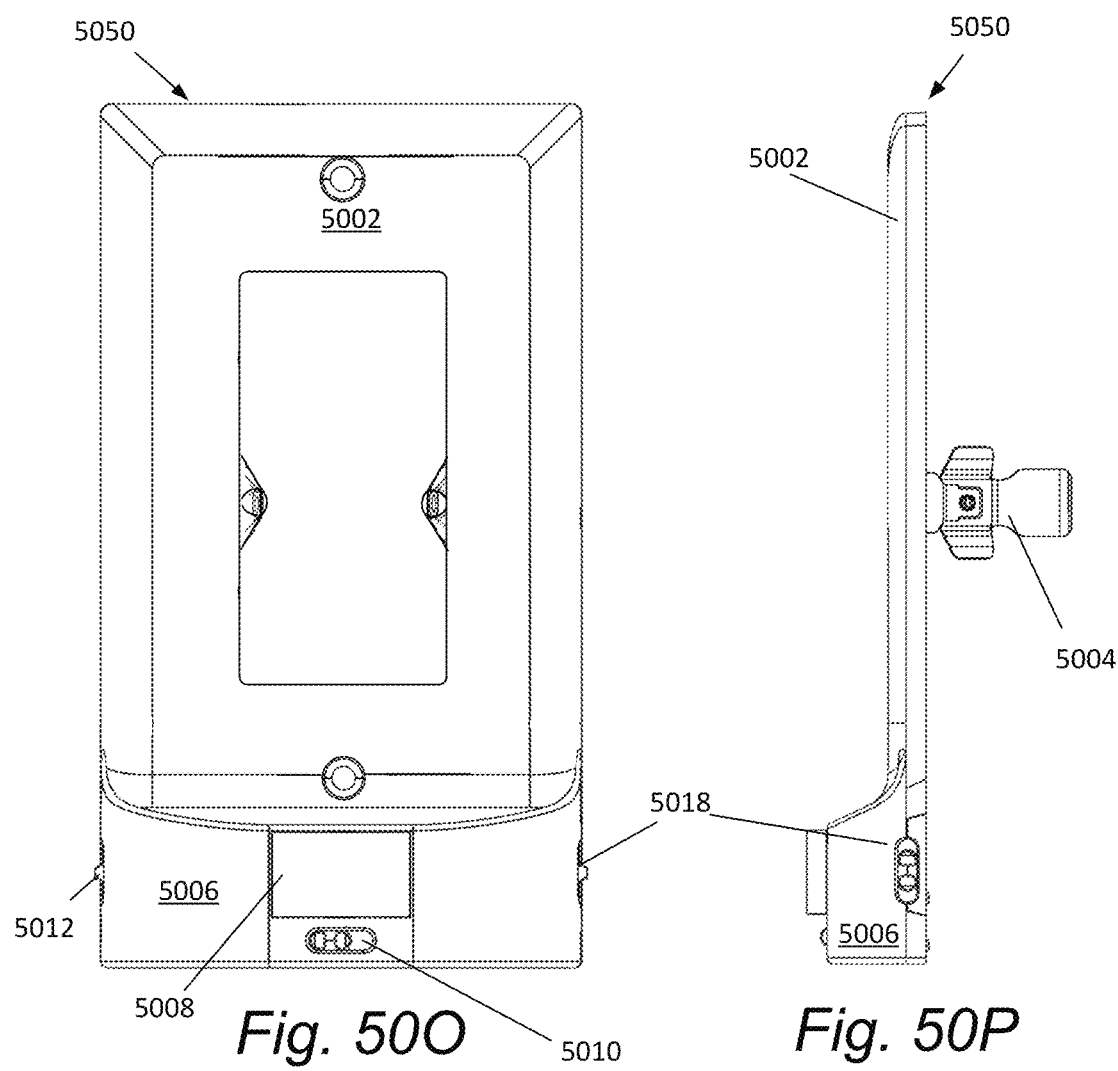
Fig. 50O
Fig. 50P
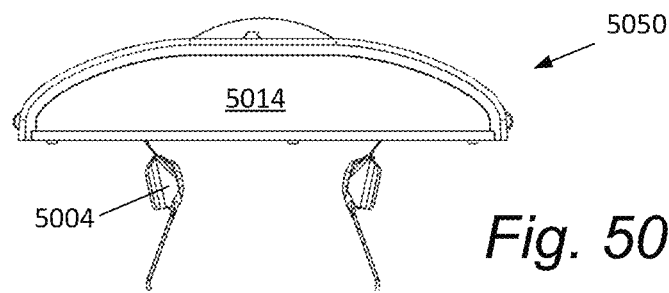
Fig. 50Q

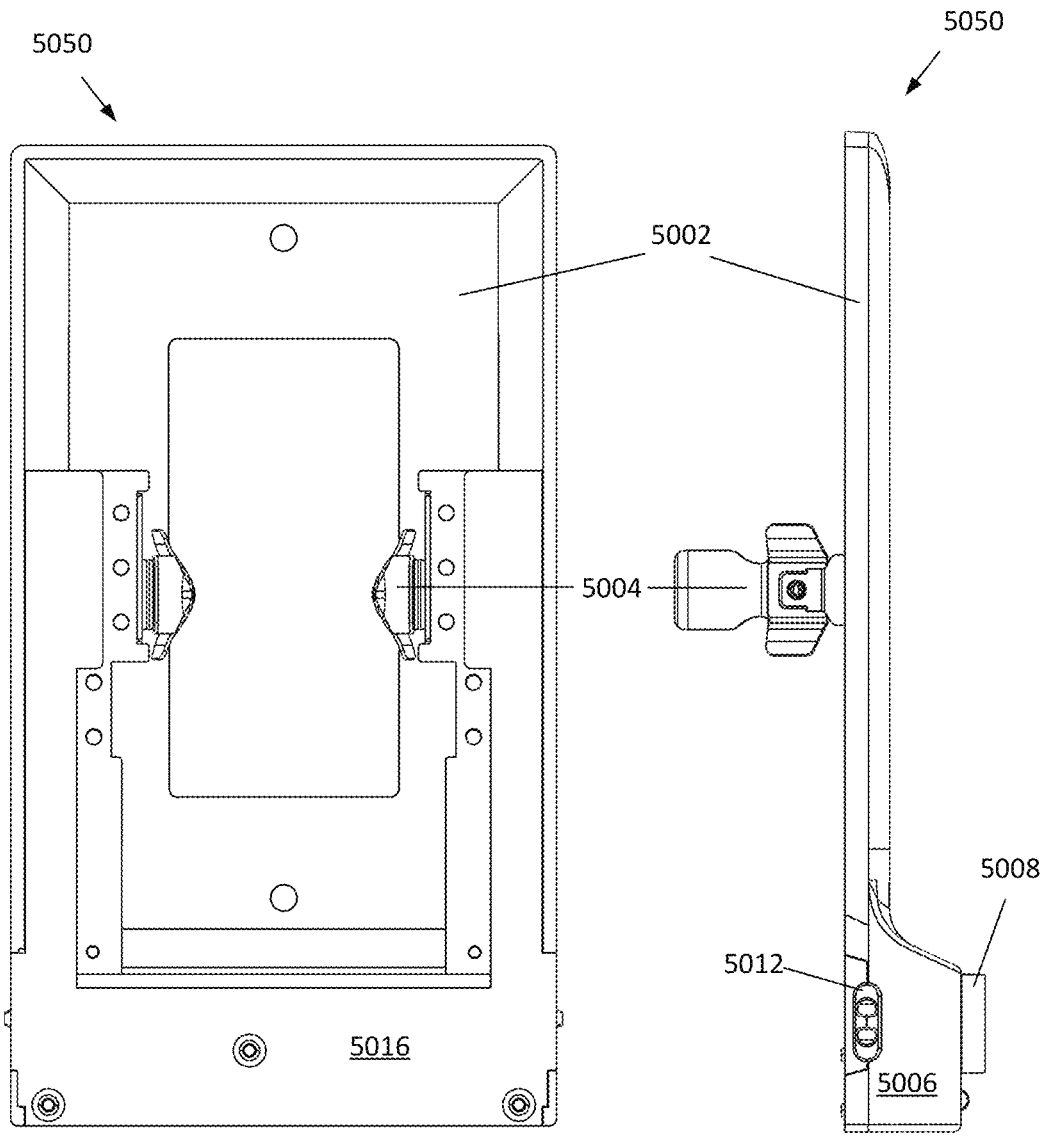
*Fig. 50R*  *Fig. 50S*

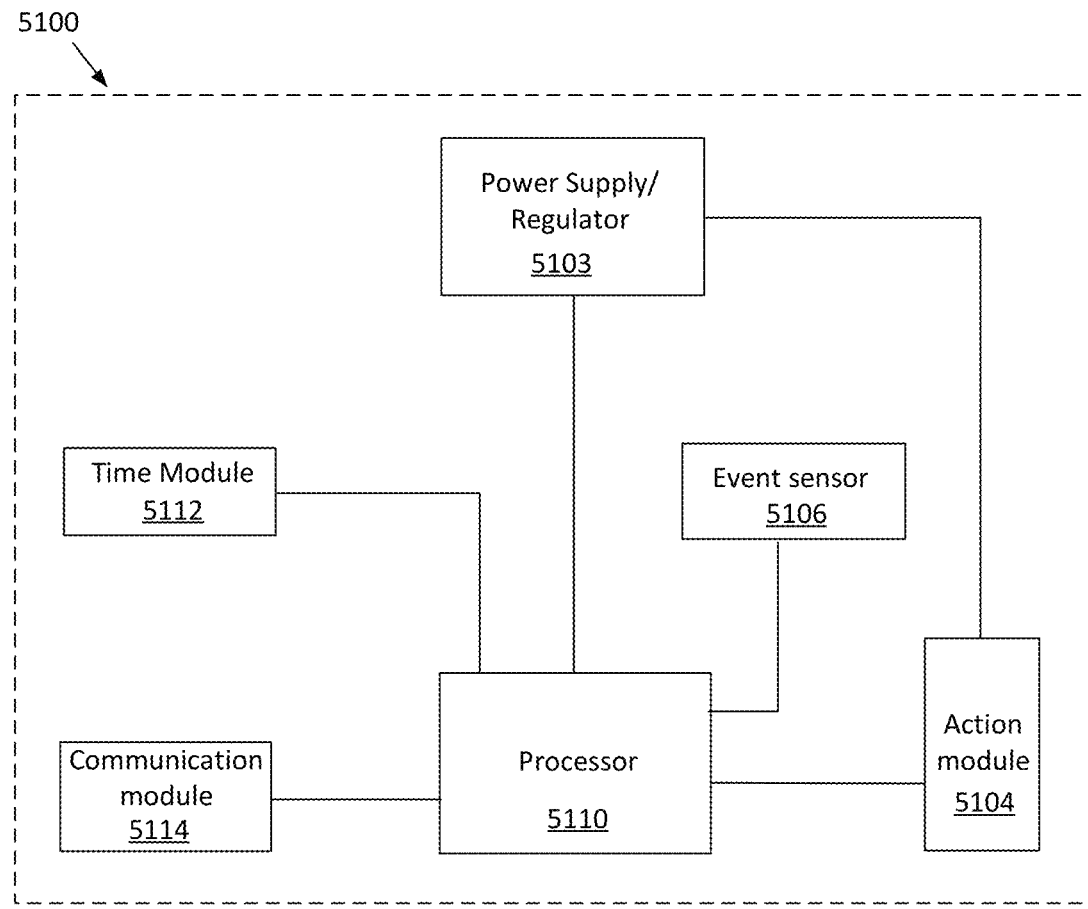
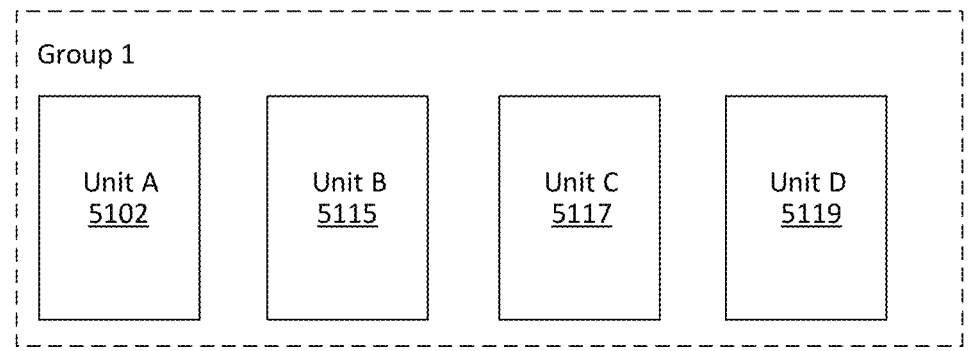
Fig. 51A

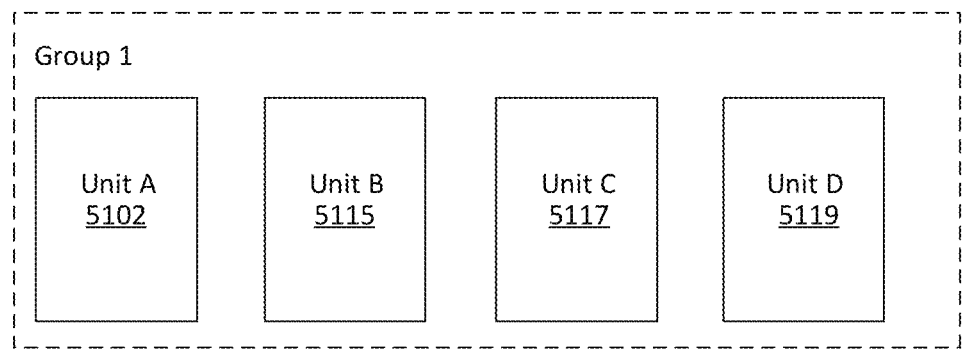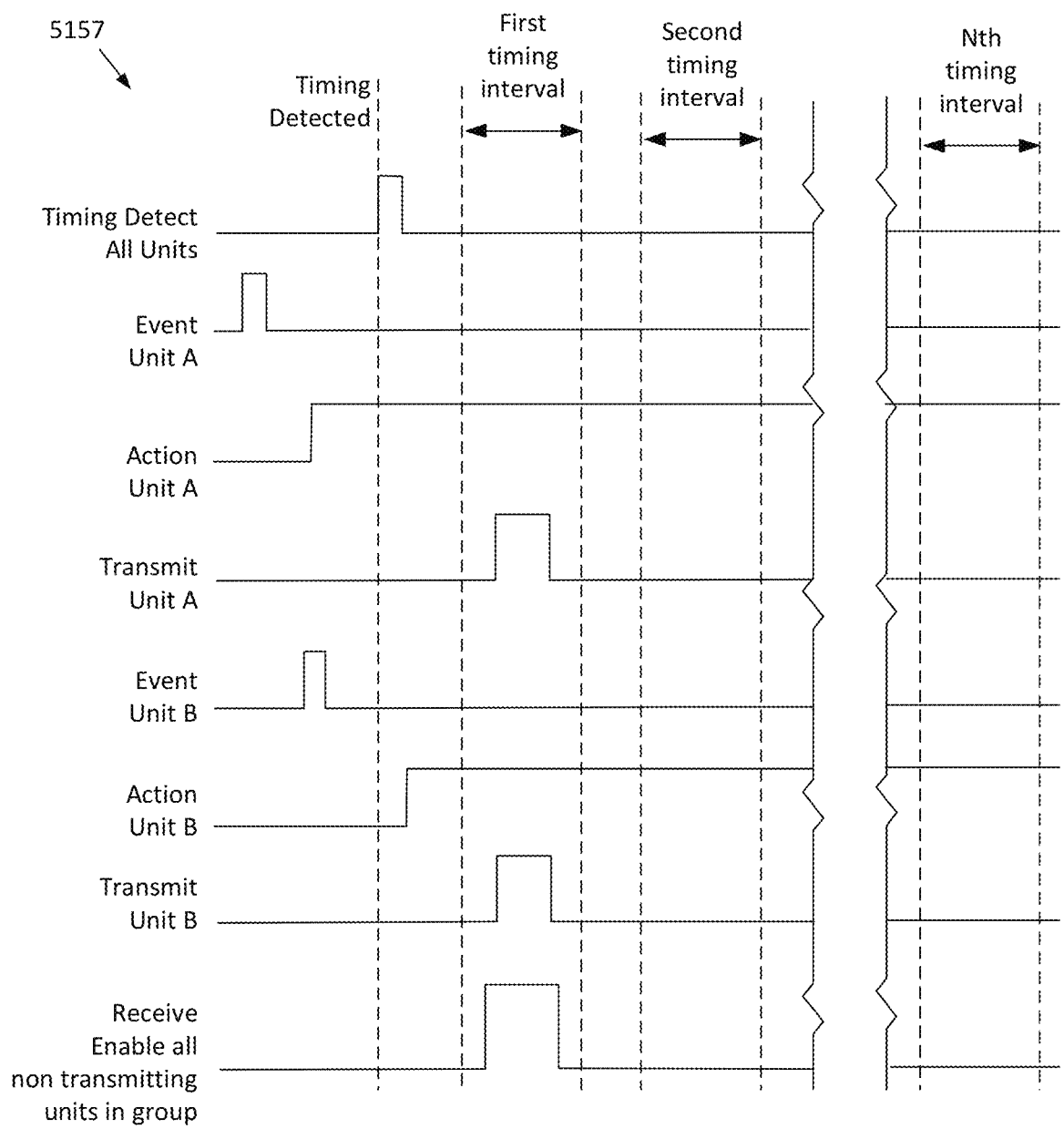
Fig. 51F

| Zone | # of Units | Code | Repeat | Channel/Phase | Sub-Channel |
|---|---|---|---|---|---|
| 1 | 4 | 1 | 1x | 1 | 6 |
| 2 | 6 | 1 | 1x | 2 | 6 |
| 3 | 2 | 1 | 1x | 3 | 6 |
| ⋮ | ⋮ | ⋮ | ⋮ | ⋮ | ⋮ |
| 8 | 1 | 11011 | 3x | 6 | 10 |
| 9 | 0 | 11100 | 3x | 6 | 18 |
| 10 | 0 | 11101 | 3x | 6 | 22 |
| ⋮ | ⋮ | ⋮ | ⋮ | ⋮ | ⋮ |

ENVIRONMENT SENSING ACTIVE UNITS

RELATED APPLICATIONS

The present application incorporates the following applications and patents by reference in their entireties:

U.S. Provisional Application No. 62/579,033, filed on Oct. 30, 2017;
U.S. Provisional Application No. 62/536,452, filed on Jul. 24, 2017;
U.S. Provisional Application No. 62/522,691, filed on Jun. 21, 2017;
U.S. Provisional Application No. 62/460,094, filed on Feb. 17, 2017;
U.S. Provisional Application No. 62/279,831, filed on Jan. 18, 2016;
U.S. Provisional Application No. 62/081,539, filed on Nov. 18, 2014;
U.S. Provisional Application No. 62/027,784, filed on Jul. 23, 2014;
U.S. Provisional Application No. 61/906,651, filed on Nov. 20, 2013;
U.S. Provisional Application No. 61/836,972, filed on Jun. 19, 2013;
U.S. Provisional Application No. 61/778,386, filed on Mar. 12, 2013;
U.S. Provisional Application No. 61/720,131, filed on Oct. 30, 2012;
U.S. Provisional Application No. 61/574,344, filed on Aug. 1, 2011;
U.S. Design patent No. 29/680,151, filed on Feb. 13, 2019, issued as D887,250;
U.S. Design patent No. 29/679,782, filed on Feb. 8, 2019, issued as D880,984;
U.S. Design patent No. 29/676,104, filed on Jan. 8, 2019;
U.S. Design patent No. 29/676,102, filed on Jan. 8, 2019, issued as D881,137;
U.S. Design patent No. 29/629,812, filed on Dec. 15, 2017, issued as D887,819;
U.S. Design patent No. 29/608,301, filed on Jun. 20, 2017, issued as D849,513;
U.S. Design patent No. 29/608,300, filed on Jun. 20, 2017, issued as D849,512;
U.S. Design patent No. 29/608,299, filed on Jun. 20, 2017, issued as D849,511;
U.S. Design patent No. 29/608,297, filed on Jun. 20, 2017, issued as D847,076;
U.S. Design patent No. 29/608,296, filed on Jun. 20, 2017, issued as D877,599;
U.S. Design patent No. 29/608,295, filed on Jun. 20, 2017, issued as D847,076;
U.S. Design patent No. 29/608,294, filed on Jun. 20, 2017, issued as D847,075;
U.S. Design patent No. 29/608,292, filed on Jun. 20, 2017, issued as D847,608
U.S. Design patent No. 29/599,679, filed on Apr. 5, 2017, issued as D845,108;
U.S. Design patent No. 29/598,255, filed on Mar. 23, 2017, issued as D819,426;
U.S. Design patent No. 29/594,007, filed on Feb. 14, 2017, issued as D832,224;
U.S. Design patent No. 29/594,005, filed on Feb. 14, 2017;
U.S. Design patent No. 29/594,003, filed on Feb. 14, 2017;
U.S. Design patent No. 29/594,002, filed on Feb. 14, 2017, issued as D832,223;
U.S. Design patent No. 29/551,208, filed on Jan. 11, 2016, issued as D809,899;
U.S. Design patent No. 29/522,406, filed on Mar. 30, 2015, issued as D810,697;
U.S. Design patent No. 29/522,404, filed on Mar. 30, 2015, issued as D781,241;
U.S. patent application Ser. No. 16/667,667, filed Oct. 29, 2019, published as US 2020-0136322 A1;
U.S. patent application Ser. No. 16/538,722, filed Aug. 12, 2019, published as US 2020-0036141 A1;
U.S. patent application Ser. No. 16/244,838, filed on Jan. 10, 2019; published as US 2019-0148892 A1, issued as U.S. Pat. No. 10,381,789;
U.S. patent application Ser. No. 16/244,819, filed on Jan. 10, 2019; published as US 2019-0148891 A1, U.S. Pat. No. 10,381,788;
U.S. patent application Ser. No. 16/244,781, filed on Jan. 10, 2019; published as US 2019-0148090 A1, issued as U.S. Pat. No. 10,373,773;
U.S. patent application Ser. No. 16/166,965, filed on Oct. 22, 2018, published as US 2019-0122832 A1;
U.S. patent application Ser. No. 15/920,047, filed on Mar. 13, 2018; published as 2018-0301882 A1, issued as U.S. Pat. No. 10,404,045;
U.S. patent application Ser. No. 15/870,832, filed on Jan. 12, 2018; published as US 2018-0241146 A1, issued as U.S. Pat. No. 10,109,945;
U.S. patent application Ser. No. 15/708,082, filed on Sep. 18, 2017; published as US 2019-0020156 A1, issued as U.S. Pat. No. 10,644,461;
U.S. patent application Ser. No. 15/496,872, filed on Apr. 25, 2017, published as US 2017-0229853 A1;
U.S. patent application Ser. No. 15/486,280, filed on Apr. 12, 2017, published as US 2017-0222417 A1; issued as U.S. Pat. No. 9,917,430;
U.S. patent application Ser. No. 15/486,277, filed on Apr. 12, 2017, published as US 2017-0222414 A1, issued as U.S. Pat. No. 9,899,814;
U.S. patent application Ser. No. 15/486,273, filed on Apr. 12, 2017, published as US 2017-0222364 A1, issued as U.S. Pat. No. 9,871,324;
U.S. patent application Ser. No. 15/481,318, filed on Apr. 6, 2017, published as US 2017-0214229 A1. issued as U.S. Pat. No. 9,882,361;
U.S. patent application Ser. No. 15/481,280, filed on Apr. 6, 2017, published as US 2017-0214188 A1, issued as U.S. Pat. No. 9,882,318;
U.S. patent application Ser. No. 15/428,099; filed on Feb. 8, 2017, published as US 2017-0208663 A1, issued as U.S. Pat. No. 9,832,841;
U.S. patent application Ser. No. 15/409,508, filed on Jan. 18, 2017, published as US 2017-0208657 A1, issued as U.S. Pat. No. 9,807,829;
U.S. patent application Ser. No. 15/406,404, filed on Jan. 13, 2017, published as US 2017-0125947 A1, issued as U.S. Pat. No. 9,742,111;
U.S. patent application Ser. No. 15/281,191, filed on Sep. 30, 2016, published as US 2017-0018890 A1, issued as U.S. Pat. No. 9,755,374;
U.S. patent application Ser. No. 15/280,491, filed on Sep. 29, 2016, published as US 2017-0018897 A1, issued as U.S. Pat. No. 9,774,154;
U.S. patent application Ser. No. 15/145,749; filed on May 3, 2016, published as US 2016-0248202 A1, issued as U.S. Pat. No. 9,787,025;
U.S. patent application Ser. No. 14/678,746, filed on Apr. 3, 2015, published as US 2015-0229079 A1, issued as U.S. Pat. No. 9,768,562;

U.S. patent application Ser. No. 14/549,143, filed on Nov. 20, 2014, published as US 2015-0075836 A1, issued as U.S. Pat. No. 9,362,728;

U.S. patent application Ser. No. 14/066,637, filed on Oct. 29, 2013, published as US 2014-0054060 A1, issued as U.S. Pat. No. 9,035,181;

U.S. patent application Ser. No. 14/066,621, filed on Oct. 29, 2013, published as US 2014-0054059 A1, issued as U.S. Pat. No. 9,035,180; and U.S. patent application Ser. No. 13/461,915, filed on May 2, 2012, published as US 2013-0032594 A1, issued as U.S. Pat. No. 8,912,442.

BACKGROUND

Modern buildings include wiring to deliver electrical power to lights, outlets, and other devices. The electrical wiring terminates in an electrical box in a wall, ceiling, floor or connected to another structural element. Connections are made to the wiring in the electrical box. For example, electrical wiring may be connected to switches or outlets by stab-in connectors or with screw terminals on the sides of the switch body. After installation, a cover plate is placed over the switch or outlet body to cover the opening to the box while allowing access to manually manipulate the switches and access the outlet receptacles.

BRIEF DESCRIPTION OF THE DRAWINGS

The accompanying drawings illustrate various examples of the principles described herein and are a part of the specification. The illustrated examples are merely examples and do not limit the scope of the claims.

FIGS. 1A-1D are views of two different switches, according to one example of principles described herein.

FIGS. 4A-4C show an illustrative active cover plate for a toggle light switch, according to one example of principles described herein.

FIGS. 6A-6E show one illustrative embodiment of a prong for an active cover plate, according to one example of principles described herein.

FIGS. 7A-7E show one illustrative embodiment of a prong for an active cover plate, according to one example of principles described herein.

FIGS. 8A-8E show one illustrative embodiment of a prong for an active cover plate, according to one example of principles described herein.

FIGS. 9A-9E show one illustrative embodiment of a prong for an active cover plate, according to one example of principles described herein.

FIGS. 16A-16E are diagrams of illustrative active cover plates and installation tools for multi-pole light switches, according to one example of principles described herein.

FIGS. 19A-19D include a flow chart and illustrations of a method for installing an active cover plate using an installation tool, according to one example of principles described herein.

FIGS. 22A-22G, 23A-23H, 24A-24AE, 25A-25J, 26A-26I, and 27A-27I show views of various active cover plates for double gang light switches, according to one example of principles described herein.

FIGS. 28A-28H show illustrative elements and techniques for securing prongs and routing wires in a multi-gang active cover plate, according to one embodiment of principles described herein.

FIGS. 29A-29I show illustrative elements and techniques for spacing conductors in a multi-gang active cover plate, according to embodiments of principles described herein.

FIGS. 31A-31F show one illustrative example of an active cover plate with a protrusion that provides additional volume for circuitry and/or sensors, according to one example of principles described herein.

FIGS. 32A-32F show one illustrative example of an active cover plate with a protrusion that provides additional volume for circuitry and/or sensors, according to one example of principles described herein.

FIGS. 33A-33G show one illustrative example of an active cover plate with a protrusion that provides additional volume for circuitry and/or sensors, according to one example of principles described herein.

FIGS. 34A-34G show one illustrative example of an active cover plate with a protrusion that provides additional volume for circuitry and/or sensors, according to one example of principles described herein.

FIGS. 35A-35G show one illustrative example of an active cover plate with a protrusion that provides additional volume for circuitry and/or sensors, according to one example of principles described herein.

FIGS. 36A-36G show one illustrative example of an active cover plate with a protrusion that provides additional volume for circuitry and/or sensors, according to one example of principles described herein.

FIGS. 37A-37G show one illustrative example of an active cover plate with a protrusion that provides additional volume for circuitry and/or sensors, according to one example of principles described herein.

FIGS. 38A-38G show one illustrative example of an active cover plate with a protrusion that provides additional volume for circuitry and/or sensors, according to one example of principles described herein.

FIGS. 39A-39G show one illustrative example of an active cover plate with a protrusion that provides additional volume for circuitry and/or sensors, according to one example of principles described herein.

FIGS. 40A-40E show one illustrative example of an active cover plate with a protrusion that provides additional volume for circuitry and/or sensors, according to one example of principles described herein.

FIGS. 41A-41G show one illustrative example of an active cover plate with a protrusion that provides additional volume for circuitry and/or sensors, according to one example of principles described herein.

FIGS. 42A-42G show one illustrative example of an active cover plate with a protrusion that provides additional volume for circuitry and/or sensors, according to one example of principles described herein.

FIGS. 43A-43G show one illustrative example of an active cover plate with a protrusion that provides additional volume for circuitry and/or sensors, according to one example of principles described herein.

FIGS. 45A-45I show on illustrative example of an active cover plate with a protrusion that provides additional volume for circuitry and/or sensors, according to one example of principles described herein.

FIGS. 47A-47G show one illustrative example of an active cover plate with a light pipe or other illumination along one or more of the side edges of the cover plate, according to one example of principles described herein.

FIGS. 48A-48E show one illustrative example of an active cover plate with a light pipe or other illumination along one or more of the side edges of the cover plate, according to one example of principles described herein.

FIGS. 51A-51H are diagrams representing the structure and functions of illustrative circuits for a connected active cover plate system, according to one example of principles described herein.

Throughout the drawings, identical reference numbers designate similar, but not necessarily identical, elements.

DETAILED DESCRIPTION

Figure 2A:
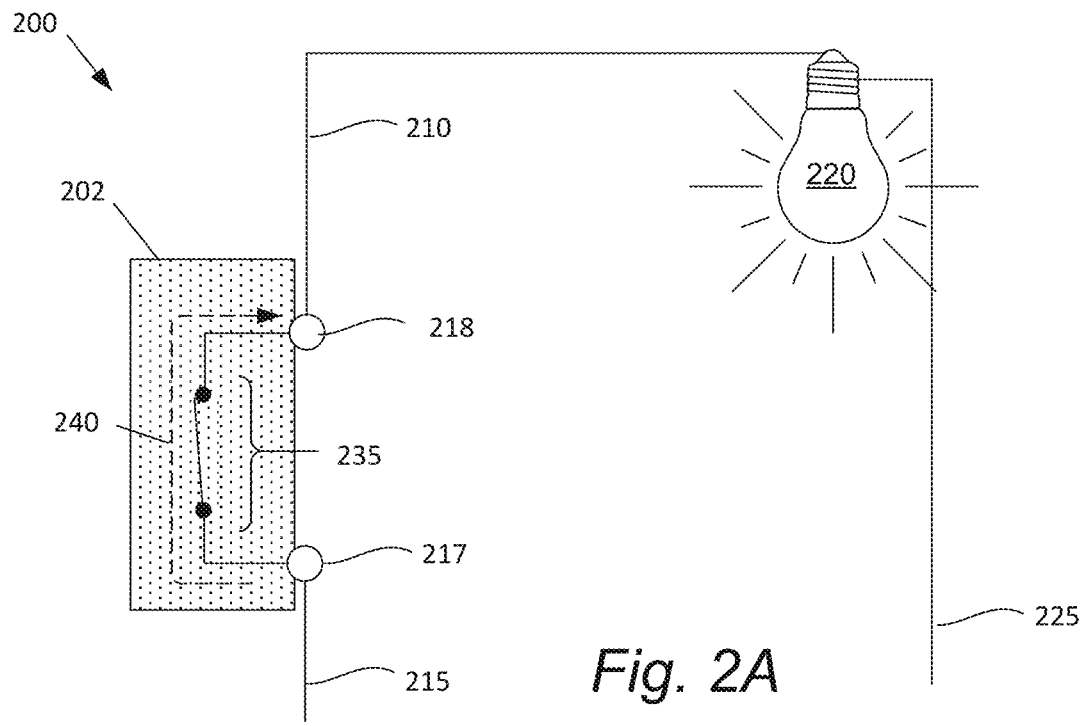
FIGS. 2A and 2B are diagrams of electrical systems that include a switch and a load controlled by the switch, according to one example of principles described herein.

Reference will now be made to the figures wherein like structures will be provided with like reference designations. In the following description, for purposes of explanation, numerous specific details are set forth in order to provide a thorough understanding of the present systems and methods. It will be apparent, however, that systems and methods may be practiced without these specific details. It is understood that the figures are diagrammatic and schematic representations of some embodiments of the invention, and are not limiting of the present invention, nor are they necessarily drawn to scale. Reference in the specification to "an example" or similar language means that a particular feature, structure, or characteristic described in connection with the example is included in at least that one example, but not necessarily in other examples. Additionally, features shown and/or described in connection with one figure may be combined with features shown and/or described in connection with other figures.

Switches and outlets are standard electrical receptacles/fixtures in modern homes. Switches are typically placed near entryways or doors so that a person entering or leaving an area can easily turn on or off the lights or appliances. The position of the switch installations makes them ideal for incorporating nightlights, guidelights, or illuminated images. For example, if a switch installation incorporated a nightlight, the nightlight would illuminate the entryway, the floor around the entryway and the light switch itself. The nightlight would provide a valuable reference point to allow a home owner to orient themselves and properly navigate the area.

While the attractiveness of nightlights incorporated into switch installations is clear, there are a number of significant challenges in designing a nightlight that is easy to install and provides the desired level of illumination without adverse effects.

Standard switches in North America (Canada, United States, Mexico, etc.) have two standard styles: toggle and décor. North American electrical receptacles are used as examples throughout the specification, but the principles described herein can be applied to a broad range of electrical receptacles. FIGS. 1A and 1B show a décor switch (100), also called a rocker switch. The switch (100) includes a rocker paddle (105) and a body (110). To change the state of the switch and its controlled load, the user depresses either the top or bottom of the paddle (105). This changes the internal state of contacts within the switch (105) to either connect or disconnect the electrical load from a power source. The body (110) of the switch includes two screw terminals (115, 120) and a yoke (130). The screw terminals (115, 120) serve as attachment points for electrical wiring. For example, a "hot" wire may be attached to one of the terminals and a traveler wire may be attached to the other terminal. The hot wire supplies electrical power to the switch and the traveler wire connects the switch to the electrical load. When the switch (100) is in the ON position, internal contacts connect the first screw terminal (115) to the second screw terminal (120) and electrical energy is available to the load. When the switch is in the OFF position, the internal contacts do not make a connection between the screw terminals and there is no electrical power available to the load.

The yoke (130) provides a structure to connect the switch (100) to a housing such as an electrical box. In some switches, the yoke or bracket (130) is metal and may be connected to a ground screw terminal (125). A ground wire may be connected to the ground screw terminal (125) to ensure that if there is a fault in the electrical system and electricity is applied to the yoke (130), this electricity will be dissipated through the ground wire.

FIGS. 1C and 1D show an illustrative example of a toggle switch (150). The switch (150) includes a toggle (165), a yoke (160), two screw terminals (172, 175) and a ground terminal (155). To operate the toggle switch (150) a user moves the toggle (165) either up or down to change the state of the internal contacts in the toggle switch (150). As discussed above, this either connects or disconnects the internal electrical path between the two screw terminals (172, 175). The yoke (160) in this example is metal and can be electrically connected to a ground wire using the ground screw terminal (155).

One method of connecting the wires to the screw terminals (172, 175) includes loosening the screws and wrapping the electrical wire around the shaft of the screw, then tightening the screw to sandwich the wire between the head of the screw and the switch body (170). FIG. 1D also shows an alternative mechanism for connecting wires to the screw terminals. This alternative connection uses stab-in connectors (177, 179). The end of the electrical wire is stripped and forced into the stab-in connectors (177, 179) to make an electrical connection with the internal contacts without utilizing screw terminals. Even when stab in connectors are used the screw terminals (172, 175) remain part of the electrical circuit.

FIG. 2A is a block diagram showing an illustrative electrical system (200) for controlling a load. In this example, the system (200) includes a switch (202), wiring (215, 210, 225) and an exterior load (220). In this case the exterior load (220) is illustrated as an overhead light, but the load could be any electrical load that can be controlled by a switch, including lamps, motors, fans, air conditioners, etc. Terminal A (217) of the switch (202) is connected to a hot wire (215). The hot wire (215) is part of the power distribution in the house or building and delivers electricity to the system. The switch (202) includes internal contacts (235) which control the flow of electrical current through the switch. In this case the internal contacts (235) are closed. This allows a current flow (240) through the switch to terminal B (218) which is connected to a traveler wire (210) that is connected to the load (220). The current passes through the load (220) and into the neutral wire (225). The neutral wire (225) acts as a sink for the electrical current.

Figure 2B:
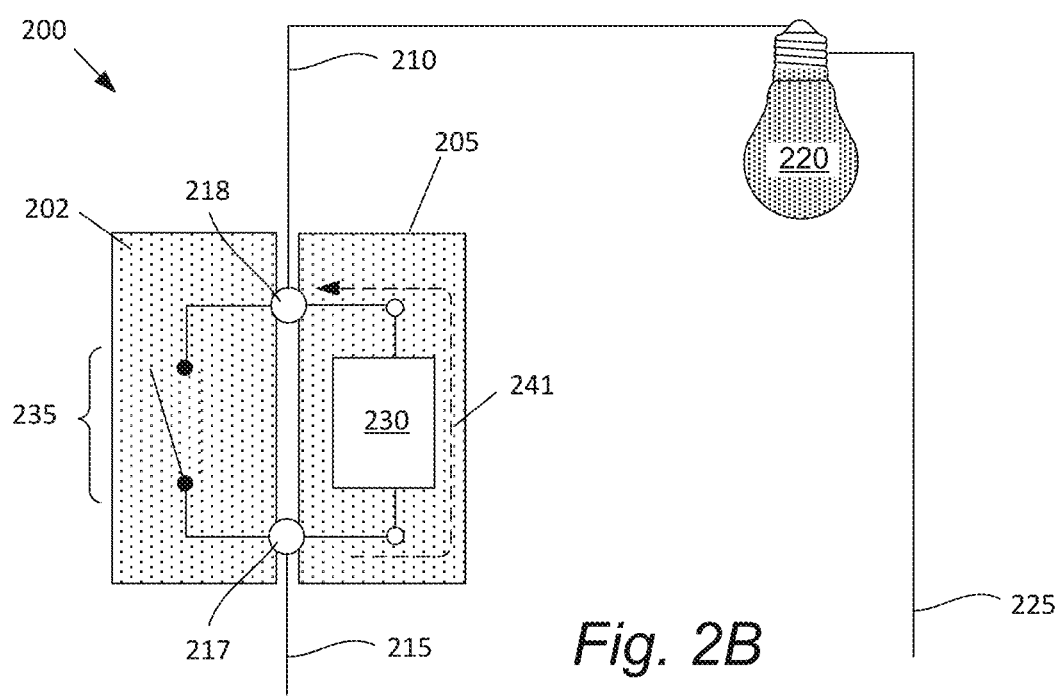

FIG. 2B is a block diagram showing an illustrative electrical system (200) for controlling a load (220) that has been modified by placing an active cover plate (205) over the switch (202). In this example, the internal contacts (235) are open so that no current flows through the switch (202) and the light (220) is nominally OFF. This creates a voltage differential across the terminals (217, 218), with terminal A (217) having a high voltage because it is connected to the hot wire (215) and terminal B (218) having a lower voltage because it is disconnected from the hot wire (215) and is connected to the neutral wire (225) through the load (220).

The active cover plate (205) contacts the terminals (217, 218) of the switch (202) to extract electrical power. Thus, in the configuration shown in FIGS. 2A and 2B, the active cover plate can only extract power when there is a voltage difference across the terminals (217, 218). When the internal contacts (235) are closed, the two terminals are electrically connected by the internal contacts and are at substantially the same voltage. There may be a very small voltage difference between the two terminals that is related to the contact resistance of the internal contacts. Ordinarily, this small voltage difference does not provide a useful amount of current. Thus, the load (230) inside the active cover plate (205) in the configuration shown in FIG. 2B may only have access to substantial amounts of electrical power when the internal contacts (235) are open and the switch is OFF.

The bypass current (241) passes from terminal A (217) to terminal B (218) through the load (230) in the active cover plate (205). Thus, the active cover plate (205) bypasses the switch (202) and independently introduces a current into the traveler wire (210) that then passes through the exterior load (220) and to the neutral wire (225).

Figure 3C:
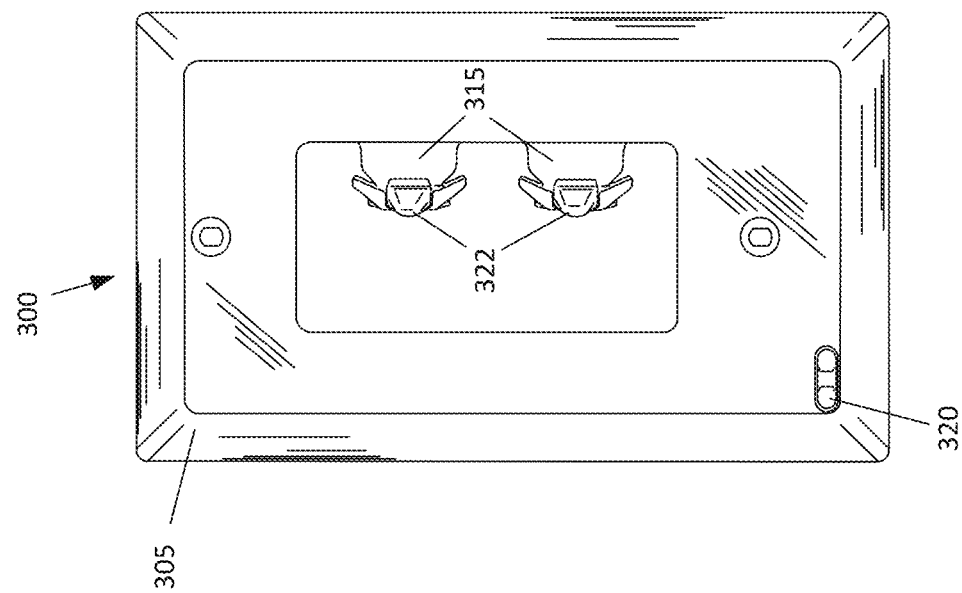
FIGS. 3A-3C show an illustrative active cover plate for a rocker light switch, according to one example of principles described herein.
Figure 3B:
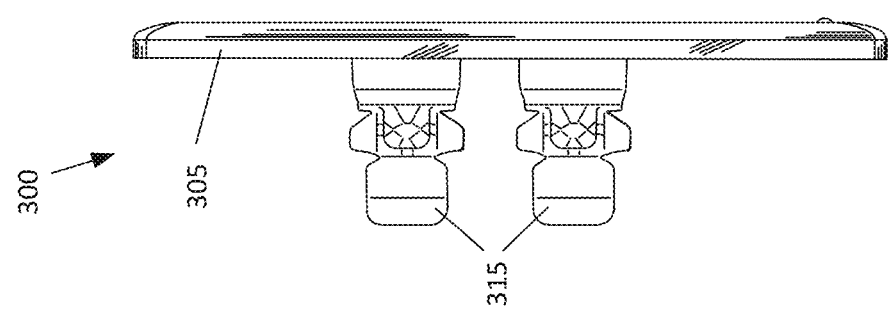
Figure 3A:
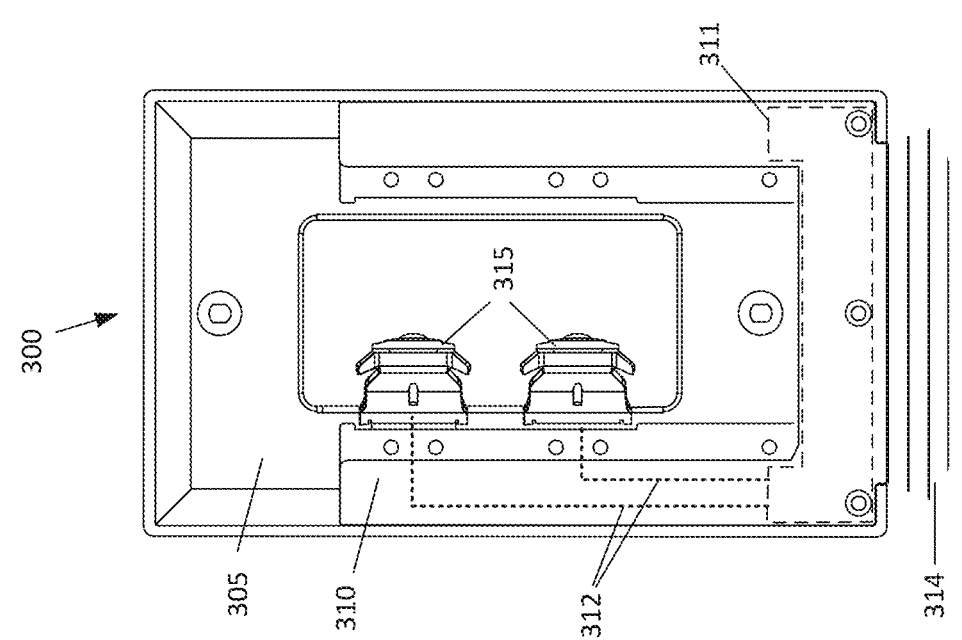

FIGS. 3A, 3B and 3C show a rear, side, and front view, respectively, of an illustrative active cover plate (300) for a rocker or décor light switch (see e.g. FIGS. 1A, 1B). FIG. 3A shows that the active cover plate (300) includes a face plate (305), a back plate (310), and two prongs (315) extending rearward from the face plate (305). The prongs (315) are configured to contact the screw terminals (115, 120; FIG. 1A) of the décor light switch (100; FIG. 1A). A circuit board (311) represented by the dashed shape is sandwiched between the face plate (305) and the back plate (310). The circuit board (311) is connected to the prongs by conductors (312) represented by the dotted lines. When electrical power is available at the prongs (315) (i.e. when there is a voltage difference between the prongs) the circuit board (311) can produce illumination (314). In this case, the illumination (314) extends downward from a bottom edge of the active cover plate (300). There are a wide variety of other ways that the active cover plate (300) could be configured. For example, the illumination may project out of different locations and/or be presented in different patterns. The illumination may be a continuous bar or may be segmented into two, three or more segments. The illumination could be produced by individual LEDs, LED filaments or other light sources. The location and size of the circuit board is just one example. In other embodiments, the circuit board may be a different size such as a simple rectangle and/or may be divided into multiple sections or may be in other locations with respect to the cover plate. Further, the prongs may have different shapes, quantities and locations. For example, there may be two, three, four or five prongs at various locations and with various shapes on the cover plate. Several illustrative examples are described below.

FIG. 3B shows a side view of the active cover plate (300) with the prongs (315) extending rearward from the face plate (305). FIG. 3C shows a front view of the active cover plate (300) with the prongs (315) visible through the rectangular aperture of the face plate (305). The prongs (315) include contacts (322) that may be configured to contact the side screw terminals of a light switch (see e.g. 115, 120; FIG. 1A-1B).

In general, users of active cover plates may desire some amount of control over the light output or other functionality within the active cover plate. For example, the user may install an active cover plate over a light switch in an entryway and another active cover plate over a light switch in an adult bedroom. The user may want high levels of illumination near the entryway, but lower levels of illumination in the adult bedroom. Additionally or alternatively, the user may wish to turn the illumination function off for a period of time. Further, the user may wish to perform any number of other operations, including changing the color or color temperature of the illumination. The switch/lens cover (320) can provide this control by allowing the user to manually select various functions of the cover plate (300).

FIGS. 4A, 4B and 4C show a front, side, and rear perspective view, respectively, of an illustrative active cover plate (400) for a toggle or standard light switch (see e.g. FIGS. 1C, 1D). FIG. 4A shows a front of the active cover plate (400), including the face plate (405) and the switch (420) in the lower left corner of the face plate. FIG. 4B shows a side view of the active cover plate (400) with prongs (415) extending rearward from the faceplate (405).

FIG. 4C shows that the active cover plate (400) includes a faceplate (405), a back plate (410), and two prongs (415) extending rearward from the face plate (405). The prongs (415) are configured to contact the screw terminals (172, 175; FIG. 1D) of the toggle light switch (150; FIG. 1D). The prongs (415) include insulating hoods (412) and contact surfaces (422). The insulating hoods (412) provide for smooth installation and prevent undesired electrical contact with surrounding conductors when the cover plate is installed over the switch (150, FIG. 1C). The contact surfaces (422) are configured to contact the screw head or other conductors of the side screw terminals (172, 175; FIG. 1D) on the light switch.

Figure 5:
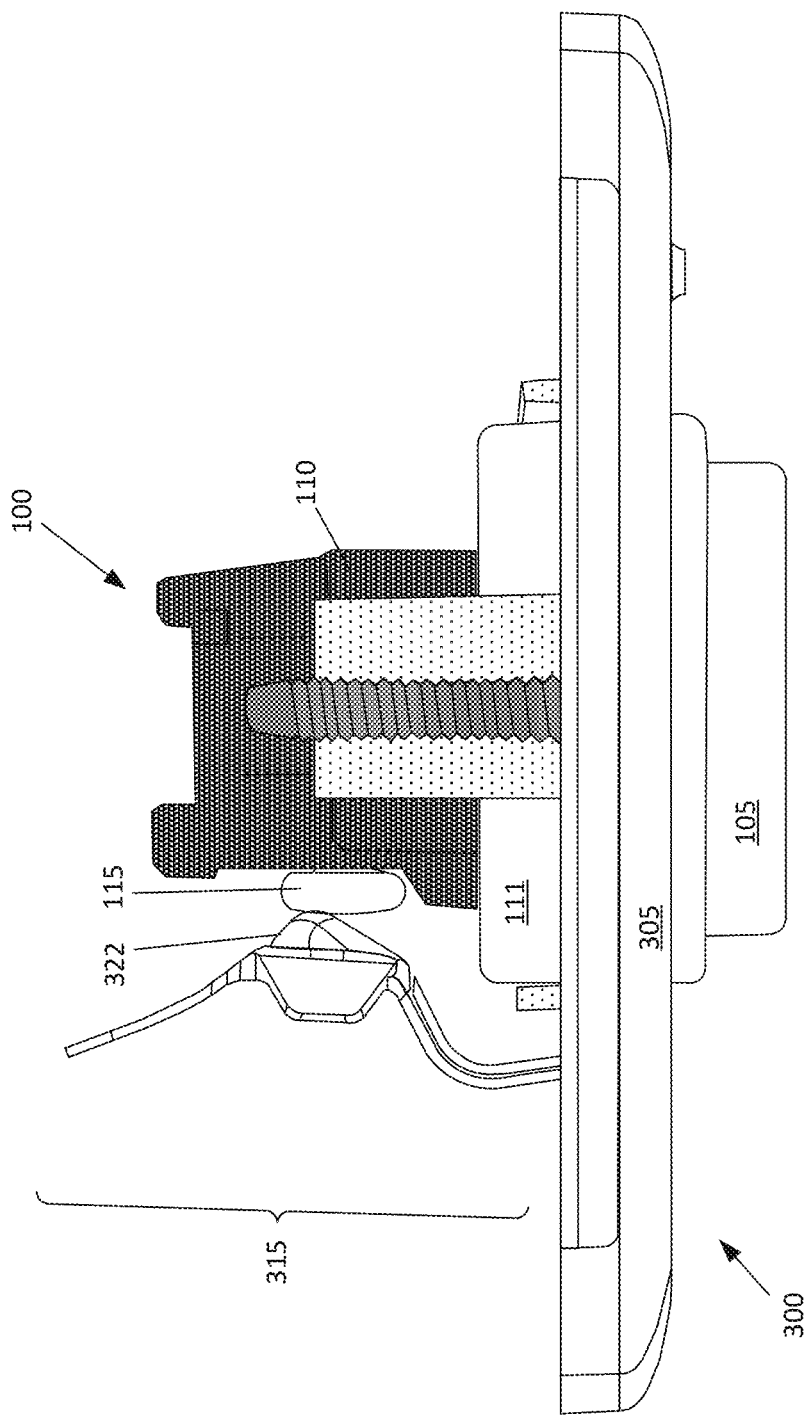
FIG. 5 shows an active cover plate installed over a rocker light switch, according to one example of principles described herein.

FIG. 5 is an end view of an active cover plate (300) installed over a décor switch (100). The faceplate (305) of the active cover plate fits around the rocker/paddle (105) of the light switch (100). The prongs (315) extend rearward around the shoulder (111) of the switch body (110) so that the contact surfaces (322) electrically contact the screw terminals (115, 120, FIGS. 1A, 1B). The contact between the contacts (322) and the screw terminals (115) supplies electrical power to the circuit in the active cover plate (300). This is only one example of a technique for extracting power from the switch or wiring. A variety of other techniques could also be used. For example, the cover plate may have wires with a stripped portion or spade connectors that could be attached to the screw terminals on the switch or directly to the wiring that supplies electrical power to the switch.

FIGS. 6A-6E show one illustrative embodiment of a prong (600) for an active cover plate. FIG. 6A is a top view of the exemplary prong (600). FIG. 6B is a front view, FIG. 6C is a bottom view, FIG. 6D is a side view and FIG. 6E is a back view of the prong (600). This prong (600) may be used in any of a variety of active cover plates, including active cover plates for rocker/décor light switches that have two or four prongs. For example, this prong or other prongs may be used for both toggle and rocker light switches. As discussed above, the prong may be attached to the faceplate/back plate and extends rearward from the faceplate.

In this example, the prong includes both front (608) and rear insulation (604). This insulation may protect the conductive elements of the prong from contact with other conductive elements that may be present during installation or operation of the active cover plate. The front insulation (608) may insulate against electrical contact with the metal yoke of light switches or other elements and the rear insulation (604) may insulate against electrical contact with electrical conductors in the electrical box and against contact with conducting electrical boxes.

In this case, the insulating cover (617, FIG. 6D), comprising the rear insulation (604), front insulation (608), side ramps (606) and main ramp (612), may all be formed as a single piece of insulating material, with the front insulation (608) connected to the rear insulation (604) along a bottom edge(s) by a living hinge(s) (610). The living hinge (610) in this example is a thin piece of plastic that bends to allow the front insulation (608) and rear insulation (604) to sandwich the flexible conductor (603) between them. The front and rear insulation (608, 604) can be joined using any of a number of techniques, including sonic welding, adhesive, heat pressing, cold pressing (such as compressing a stake or post that connects the front and rear insulation), or other suitable technique. In this example, the top portions of the front and rear insulation are joined by a sonic welding joint (613) as shown in FIG. 6E. The rear insulation (604) includes a depression (618) that mates with the backside of the contact (622). This produces a join line (616) between the front and rear insulation.

In this case the flexible conductor (603) is a flexible metal strip that forms both the base (602) which is secured to the faceplate, backplate or other element, and the contact (622) which is formed in the flexible metal strip. A variety of other conductors could be used including wire, flexible circuitry, conductive plastic or other appropriate conductor. The prong may have any of a variety of shapes, including the shape shown in FIGS. 6A-6D. For example, the prong (600) may have an elbow or bend (607) that allows the prong to reach around the shoulder of a rocker/décor light switch (see e.g. FIGS. 5, 17B).

The contact (622) protrudes out of an aperture in the insulation. The contact may be formed in any of a number of ways. It may be an integral part of the flexible metal strip or it may be a separate piece, such as a rivet or other appropriate conductor that is electrically connected to the flexible conductor (603). The contact (622) in this example has a generally oval or elliptical shape. This shape allows for contact with screw terminals with different locations/sizes on a range of different light switches. In this example, the primary or major axis of the contact is at an angle with respect to a vertical line of symmetry of the prong and with respect to a vector that is perpendicular to the rear surface of the face plate. This rotation may serve a number of purposes, including preventing arcing between structures on the light switch.

The prongs may also include a number of ramps (606, 612) surrounding the contact. As discussed previously, the ramps (606, 612) allow the active cover plate to be installed more easily. The side ramps (606) allow for vertical motion of the active cover plate to align the prongs with the screw terminals and the aperture in the face plate with the light switch toggle and/or rocker. The main ramp (612) in this case is a short, curved shape. This shape is sufficient to guide the prongs around the outlet and outward when the screws in the screw terminals are screwed out. In other words, the main ramps (612) are just long enough not to catch between the head of the screw and the body of the outlet when the screws are out. The length of the main ramp (612) in this example is significantly shorter than in some other embodiments. The length of the main ramp (612) may be short to prevent interference with other elements in the box. In light switch installations, the body of the light switch is often narrower than outlets. This tends to have the prongs protrude into the central area of the box in a switch installation rather than along the walls in outlet installations. This may bring the prongs into closer proximity to (and potentially into contact with) wires in the box. This may be for a number of reasons: first, there may be a number of wire bundles, wire nuts and other elements in the receptacle box. In some instances, it was found that long main ramps may contact these elements in the receptacle box and lift the contacts away from the screw terminals. This can be mitigated by shortening the main ramps and rapidly curving the main ramp away from the switch body (outward). Second, when these prongs are used in two prong configurations (see e. g. active cover plates shown in FIGS. 3A-4C) because both prongs are on the same side of the switch body, there may be reduced need for the prongs to guide the light switch cover plate around the body of the light switch. The prongs can be inserted on the appropriate side of the light switch and then the cover plate moved into place to align the aperture in the face plate of the cover plate with the toggle or rocker of the light switch.

FIGS. 7A-7E show one illustrative embodiment of a prong for an active cover plate. FIG. 7A is a top view of the exemplary prong (715). FIG. 7B is a front view, FIG. 7C is a side view, FIG. 7D is a rear view and FIG. 7E is a perspective view of the prong (715). This prong (715) may be used in any of a variety of active cover plates, including active cover plates for toggle light switches that have two or four prongs. As discussed above, the prong (715) may be attached to the faceplate/back plate and extends rearward from the faceplate (see e.g. FIGS. 16B-16E).

In one illustrative embodiment, four of these prongs (715) may be used in an active cover plate with four prongs for a toggle light switch as shown in FIGS. 16B-16E and 19B-19D. This configuration will work with a variety of light switches including single pole switches (two screw terminals and a ground terminal), three-way switches (three screw terminals and ground terminal) and four-way (four screw terminals and ground terminal) light switches. Illustrative examples of these light switches are shown in FIGS. 1C, 1D, 13 and 14.

As shown in FIGS. 7A-7E, the prong (715) in this embodiment may be different in some respects than other illustrative prongs described herein. In this configuration, the prongs (715) may be straighter than in other embodiments. This may be for a number of reasons. The toggle light switches (see e.g. FIGS. 1C, 1D, 13 and 14) vary in width but typically do not have the wide shoulders and recessed screw terminals of the rocker/décor switches. Consequently, the bend or elbow in the prongs more specifically designed for rocker light switches may not be needed (see e.g. FIGS. 6A-E and FIGS. 9A-9E for examples of prongs specifically designed for rocker light switches). Further, the straight/upright configuration of the prongs (715) may allow for an easier installation over the lights switches.

In this example, the prong (715) includes a flexible conductor (711), a base (702) with mounting apertures (720), rear insulation (704), front insulation (708), an off-axis contact (722), side ramps (706), and a main ramp (712). The front and rear insulation (708, 704) may be separate pieces that are joined to each other or may be formed as a single piece that is folded or formed around the contact (722). As shown in FIGS. 7A, 7C, and 7D, the front and rear insulation (708, 704) may be joined by a joining post (724) that can be swaged, heat staked, cold staked, glued, etc., to join the front and rear insulation. A variety of other techniques could also be used to join the front and rear insulation (708, 704), such as sonic welding, mechanical fasteners, etc. As discussed above, the front and rear insulation (708, 704) may be designed to protect the conductive elements of the prong from contact with other conductive elements that may be present during installation or operation of the active cover plate. In this case, the insulating cover, comprising the rear insulation (704), front insulation (708), side ramps (706) and main ramp (712) may all be formed as a single piece of molded material, with the front insulation (708) connected to the rear insulation (704). This connection could be formed in a variety of ways, including using a living hinge(s) (710). The main ramp in this embodiment, is generally angled away from the contact and relatively straight and short. This shape can assist in guiding the prongs around the outlet and outward when the screws in the screw terminals are screwed out. As discussed above, the length of the main ramp (712) may be short to prevent interference with other elements in the box.

FIGS. 8A-8E show one illustrative embodiment of a prong (815) for active cover plates. FIG. 8A is a top view of the exemplary prong (815). FIG. 8B is a front view, FIG. 8C is a bottom view, FIG. 8D is a side view, and FIG. 8E is a rear view of the prong (815). This embodiment has some similarities with the prong described above and shown in FIGS. 6A-6E and includes an elbow (821). The prong (815) can be used in any of a variety of active cover plates, including active cover plates for rocker light switches that have two or four prongs. However, as with other prong designs, the prong and/or principles that it embodies may be used in conjunction with a variety of other configurations of light switches, including toggle light switches.

In this example, the prong (815) includes a base (802) with mounting apertures (820), rear insulation (804), front insulation (808), an off-axis contact (822), side ramps (806), and a main ramp (812). The front and rear insulation (808, 804) may be separate pieces that are joined to each other or may be formed as a single piece that is folded or formed around the contact. As shown in FIGS. 8A, 8D, and 8E, the front and rear insulation (808, 804) may be joined by a joining post (824) that can be swaged, heat staked, cold staked, glued, etc., to join the front and rear insulation (808, 804). A variety of other techniques could also be used to join the front and rear insulation, such as sonic welding, mechanical fasteners, etc. As discussed above, the front and rear insulation (808, 804) may be designed to protect the conductive portions of the prong from undesirable contact with other conductive elements that may be present during installation or operation of the active cover plate. In this case, the insulating cover (817), comprising the rear insulation (804), front insulation (808), side ramps (806) and main ramp (812) may all be formed as a single piece of molded material, with the front insulation (808) connected to the rear insulation (804). This connection could be formed in a variety of ways, including using a living hinge(s) (810) and securing it with the joining post (824).

The main ramp (812) in this embodiment generally has a forward/inwardly curving profile. This forward leaning profile may place the tips/ends of the ramps closer together than the contacts. This profile may be counter intuitive, particularly in four prong configurations (see e.g. FIG. 17A) because the main ramps of the opposing prongs obscure the opening between the prongs and would interfere with the switch passing between the prongs. However, when the prongs are installed with the aid of an installation tool (see e.g. FIG. 17E) the prongs and main ramps are positioned outward and the ramps become more vertical and assist the user in guiding the cover plate over the electrical receptacle (see e.g. FIGS. 17C, 18, and 19).

FIGS. 9A-9E show one illustrative embodiment of a prong (915) for an active cover plate. This prong is similar in many respects to the prong shown in FIGS. 6A-6E and FIGS. 8A-8E. FIG. 9A is a top view of the exemplary prong (915). FIG. 9B is a front view, FIG. 9C is a side view, FIG. 9D is a rear view, and FIG. 9E is a bottom view of the prong (915). In this example, the prong (915) includes a base (902) with mounting apertures (928), rear insulation (904), front insulation (908), an off-axis contact (922), side ramps (906), and a main ramp (912). The base (902) may include wire attach features (926) and mounting features (928) such as apertures. The front and rear insulation (908, 904) may be separate pieces that are joined to each other or may be formed as a single piece that is folded or formed around the contact. These are only examples. Prongs could have a number of variations and alternative features. In this embodiment, the contact (922) may be round, rectangular, or some alternative geometry instead of an off-axis oval. In this embodiment, the prong (915) includes an indentation in the rear insulation (932) that conforms to the back side of the contact (922). In this example, the front insulation (908) uniformly covers the front of the prong and wraps around to the rear insulation. The joint/joining line (930) between the front and rear insulation occurs on the back side of the contact. The front and back insulation (908, 904) can be joined together along this joint/join line (930) using a variety of techniques including sonic welding and/or adhesive.

As discussed above, when secured to a faceplate as part an active cover plate the main ramps are very close in their relaxed position (without the install tool in place). The elbows (921) allow the prongs to fit around the shoulders of décor light switches. It should be noted, that although these prongs are specifically designed to be used with décor/rocker light switches, they may be used with toggle light switches or in other situations as well.

The prongs shown and described above and in other locations in documents incorporated by reference are only illustrative examples. A number of different geometries, materials, and configurations could be used. For example, the geometry of the prongs could be changed to any appropriate configuration that was adapted to fit or contact the screw terminals of the light switches. For example, as discussed in previously filed documents, there may be one or more contacts on a prong. The insulation configurations may be different. The conductors used may have different geometries, including using wires as the strip conductors. The number of prongs may be adapted to specific or general electrical receptacle configurations. These and any of a number of other modifications could be made within the teachings and principles described herein.

Figure 10A:
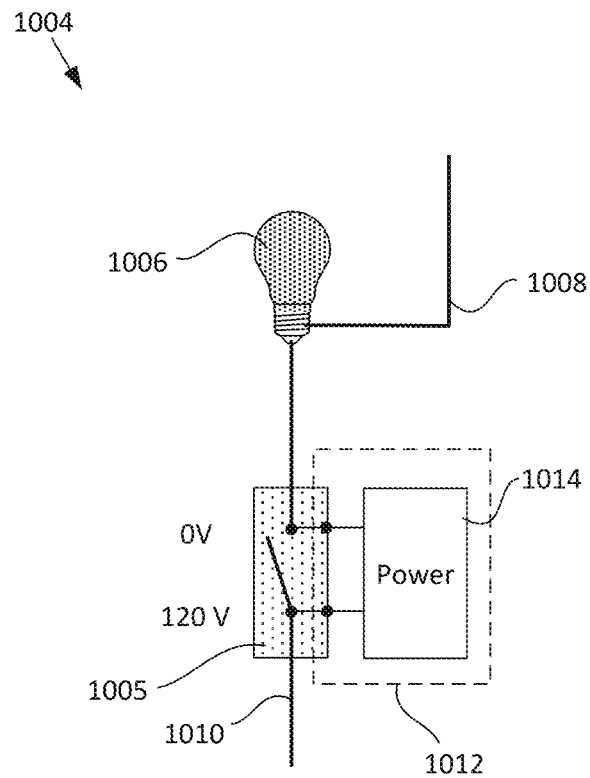
FIGS. 10A and 10B are diagrams of illustrative circuits that include light switches, loads and active cover plates connected over the light switches, according to one example of principles described herein.

FIG. 10A shows a block diagram of an electrical system (1004) that includes an active cover plate (1012) that is installed over a switch (1005) which is connected to a hot wire (1010) and controls an external load (1006). When the switch is in the open position (as shown), one terminal of the switch has 120V and the other terminal has a lower voltage (shown here as 0V). In this configuration, the active cover plate (1012) has access to the voltage difference between the two terminals and can extract power from the switch by passing a current from a first terminal of the switch, through the circuit (1014) and into the lower voltage terminal (labeled "0V"), through the external load (1006) and into the neutral wire (1008). As mentioned elsewhere, there may be a limit to the amount of current and/or power that can be utilized by the circuit (1014) before the external load (1006) reacts in an undesirable way (for example a light bulb may flash or illuminate).

Figure 10B:
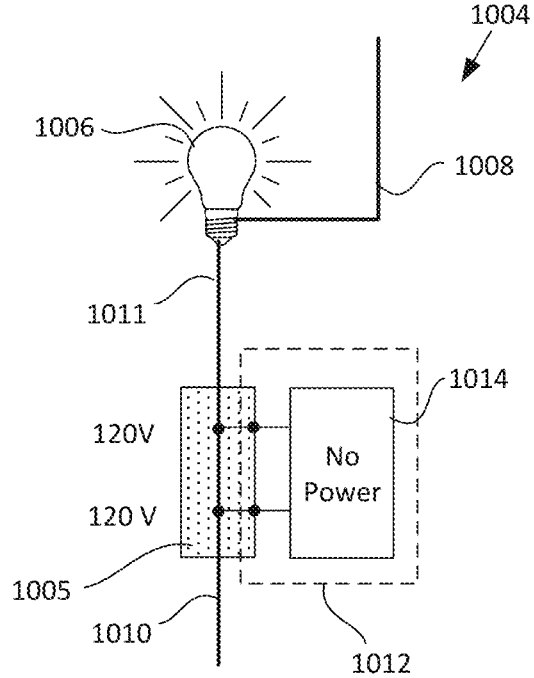

FIG. 10B shows the same electrical system (1004) with the light switch (1005) in the ON position. In this position, the hot wire (1010) is connected to the traveler wire (1011) and electrical current flows directly to the load (1006) and out the neutral wire (1008). The two terminals are electrically connected in the switch and have the same approximate voltage at each terminal. In this case the circuit (1014) in the active cover plate (1012) does not have access to power because the two terminals have the same voltage potential (120V).

The examples given above are only illustrative circuit designs. There are a number of other configurations and circuit designs that could be used in accordance with the principles described. There may be additional techniques that provide larger amounts of power from a switch without causing undesirable behavior by the load controlled by the switch. For example, users who turn on a light switch typically want the area to be illuminated immediately. This is because the user is typically stepping into a room and needs the illumination to help them navigate and/or see the contents of the area. However, users may not particularly care that lights immediately turn off when a switch is turned off. For example, upon going to bed, a user may appreciate that the lights don't immediately turn off, because the gradual dimming of the lights provides their eyes time to adjust to the darkness and gives them time to get to the bed before the room is entirely dark.

This desirable "dimming" effect can be utilized to extract energy from the light switch circuit and store it in an active cover plate or other device. According to one embodiment, after the light switch is turned off, the circuit in the active cover plate allows relatively large amounts of current to flow through the circuit so that the light gradually dims. A capacitor, battery, or other storage device can tap into the current that is still flowing through the circuit and light as it dims. In one example, the mechanical switch itself is disconnected, but a significant amount of current passes through the parallel circuit in the active cover plate, charging the capacitor or other storage device. As the device charges, this current flow decreases and the lights gradually dim. In one embodiment, an ultra-capacitor is charged over the course of several seconds while the lights dim. The ultra-capacitor is then discharged to charge a lithium ion battery. However, this is only one embodiment. A variety of other embodiments could be used. For example, a fast charging battery could be charged during the dimming of the light and be used as a battery source to supply energy to the circuit at a later point or when the lights are on.

Other implementations for extracting power from light switch circuits includes never turning the light on and simply allowing the parallel circuit in the active cover plate to conduct all the power required by the load connected to the switch. Thus, when the light is on, the circuit could extract a significant amount of power from the current flow without disrupting the lighting. This creates the significant challenge of handling up to the maximum rated circuit capacity through the prongs or other contacts. Several approaches could be used individually or in combination to address this. For example, one approach would be to monitor current flow through the prongs and cover plate circuitry and throttle the flow if it became excessive or exceeded the current draw the prongs or circuitry were rated for. A similar approach would be to monitor the temperatures of the prongs and/or circuitry. If the temperatures were high, the circuit could shut down or reduce the amount of current. Other approaches may include circuitry that detects arcing or excessive contact resistance at the prongs. If arcing, heating or an increase in contact resistance was detected, the circuitry could shut down or throttle the current flow.

Figure 11A:
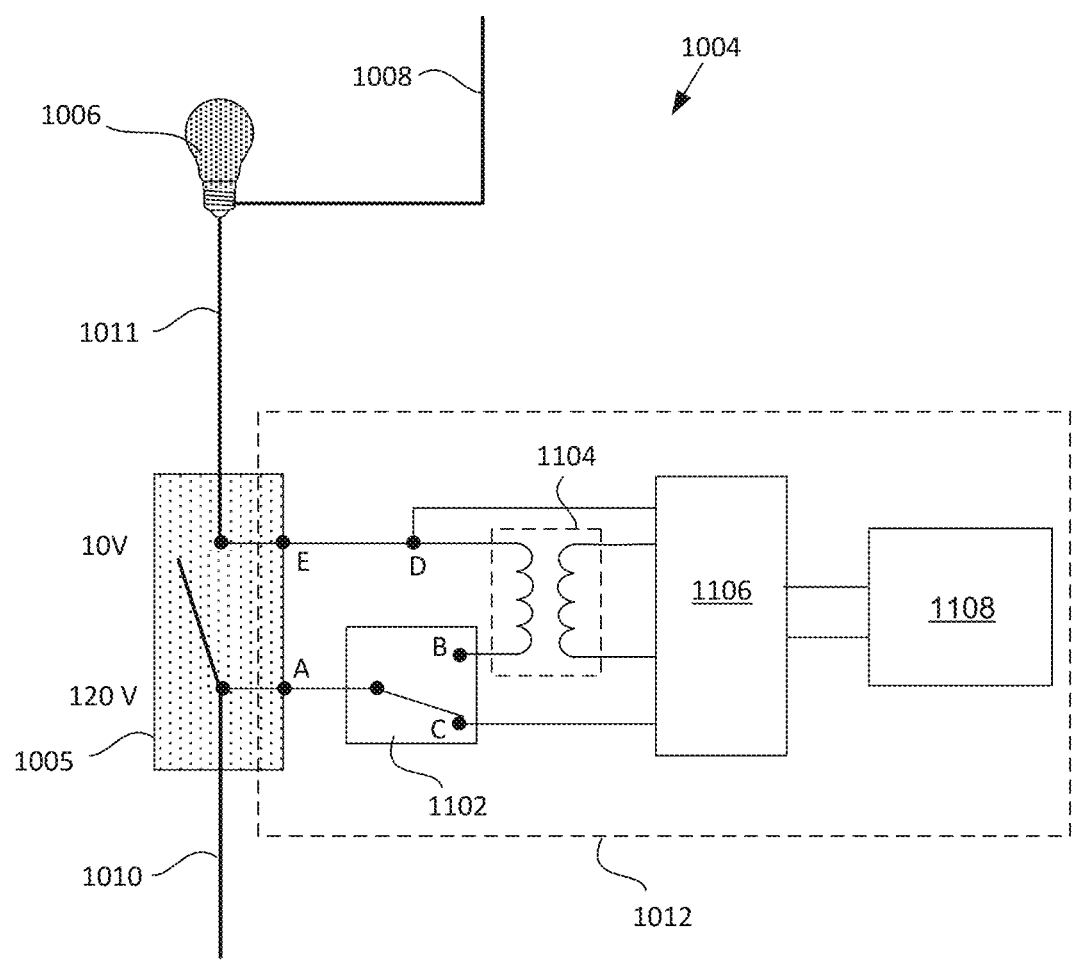
FIGS. 11A and 11B are diagrams of illustrative circuits that include light switches, loads and active cover plates connected over the light switches, according to one example of principles described herein.
Figure 11B:
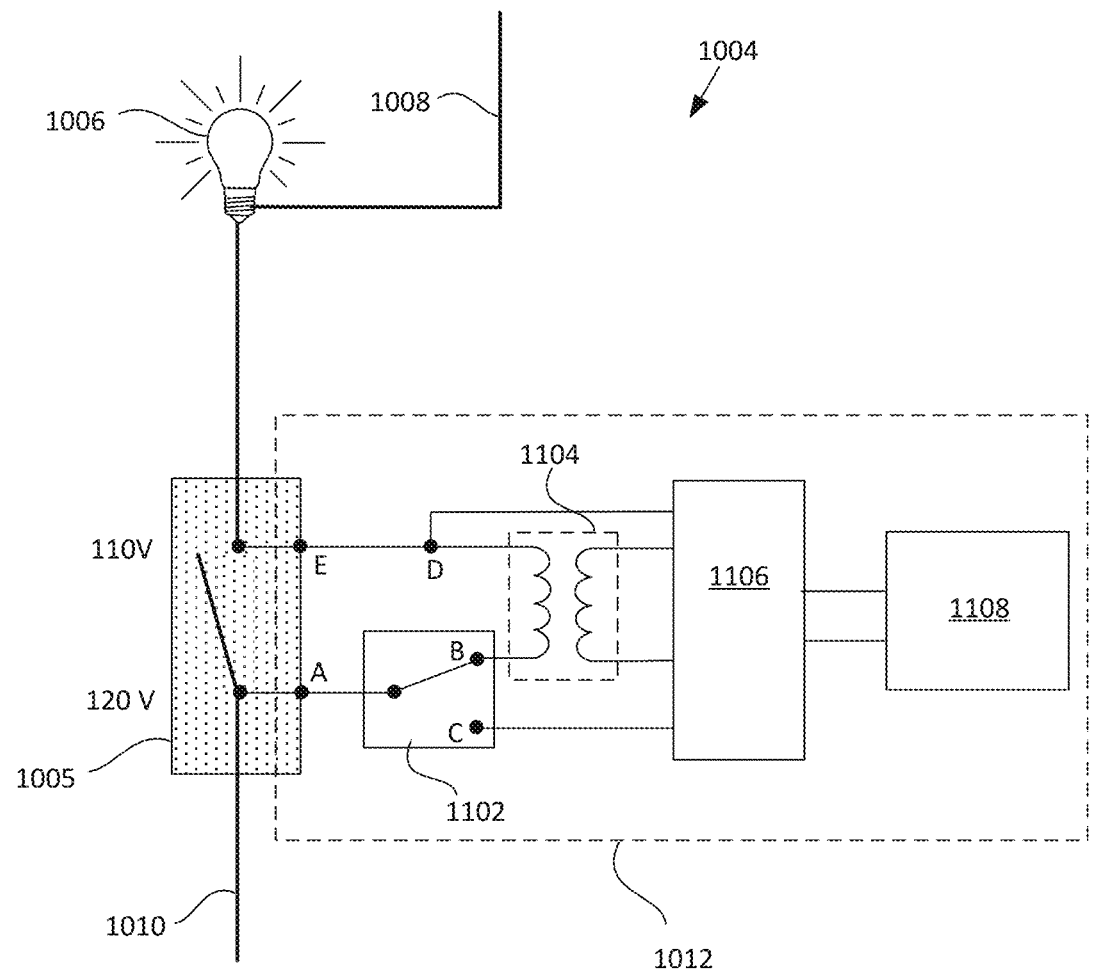

FIGS. 11A and 11B show an illustrative electrical system (1004) that includes an active cover plate (1012) that is installed over a switch (1005) connected to a hot wire (1010) and a traveler wire (1011) and typically controls an external load (1006). In this example, the electrical system (1004) includes circuitry that allows the active cover plate (1012) to obtain power when the light switch is on or off. As shown in FIG. 11A, when the switch (1005) is in the open position (as shown), one terminal of the switch has 120V and the other terminal has a lower voltage (shown here as 10V). In this configuration, the active cover plate (1012) has access to the voltage difference between the two terminals and can extract power from the switch by passing a current from a first terminal of the switch, through the circuitry and into the lower voltage terminal (labeled "10V"). The current then passes through the external load (1006) and into the neutral wire (1008). As mentioned elsewhere, there may be a limit to the amount of current and/or power that can be utilized by the active cover plate circuit before the external load (1006) reacts in an undesirable way (for example a light bulb may flash or illuminate). To obtain power regardless of the on or off state of the load, the active cover plate (1012) includes an internal switch (1102), a regulator (1106) and a load (1108). The internal switch (1102) includes three nodes (A, B, and C). Node A is the input node and the internal switch can connect node A to either node B or node C. When there is a voltage difference across the switch terminals (nodes A and E) the internal switch (1102) may make a connection from node A to node C. This connects the voltage to the regulator (1106). The regulator is also connected to node D/E. The regulator (1106) can modify/condition the voltage/current that is available and supply it to the load (1108). In this configuration, the transformer (1104) is not electrically connected and does not have substantial current passing through it.

FIG. 11B shows the same electrical system (1004) but the load (1006) is ON and receiving power through the active cover plate (1012). In this example, the two terminals A and E of the switch (1005) remain open and have different voltages. Terminal/node A has the input line voltage (nominally 120 V). The internal switch (1102) connects node A and node B. Node B is connected to one leg of a transformer (1104). The electrical current flows from node A to node B, through the transformer and out to node D and node E. In this case there is some voltage drop through the transformer leg BD. This was arbitrarily selected to be a 10 volt drop, which is reflected in the 110 voltage at node E. The opposite leg of the transformer (1104) is connected to the regulator (1106) which uses the power transferred by the transformer (1104) to power the load (1108). Consequently, the electrical power supplied to the load (1006) passes from node A to node E through the cover plate (1012).

The configurations shown in FIGS. 11A and 11B allow the active cover plate (1012) to obtain power whether the load is off or on. This is significant because it allows the active cover plate (1012) installed over a light switch to support a wider range of loads, including loads that need a constant power source. For example, loads that may need a constant power source include networking, sensor, and actuation loads. In one embodiment, the light switch may include a motion or other occupancy sensor(s) that communicate wirelessly to other devices and/or cover plates. The active cover plate (1012) may include any number of additional components, including capacitors or batteries to better accommodate transient power events.

Figure 12:
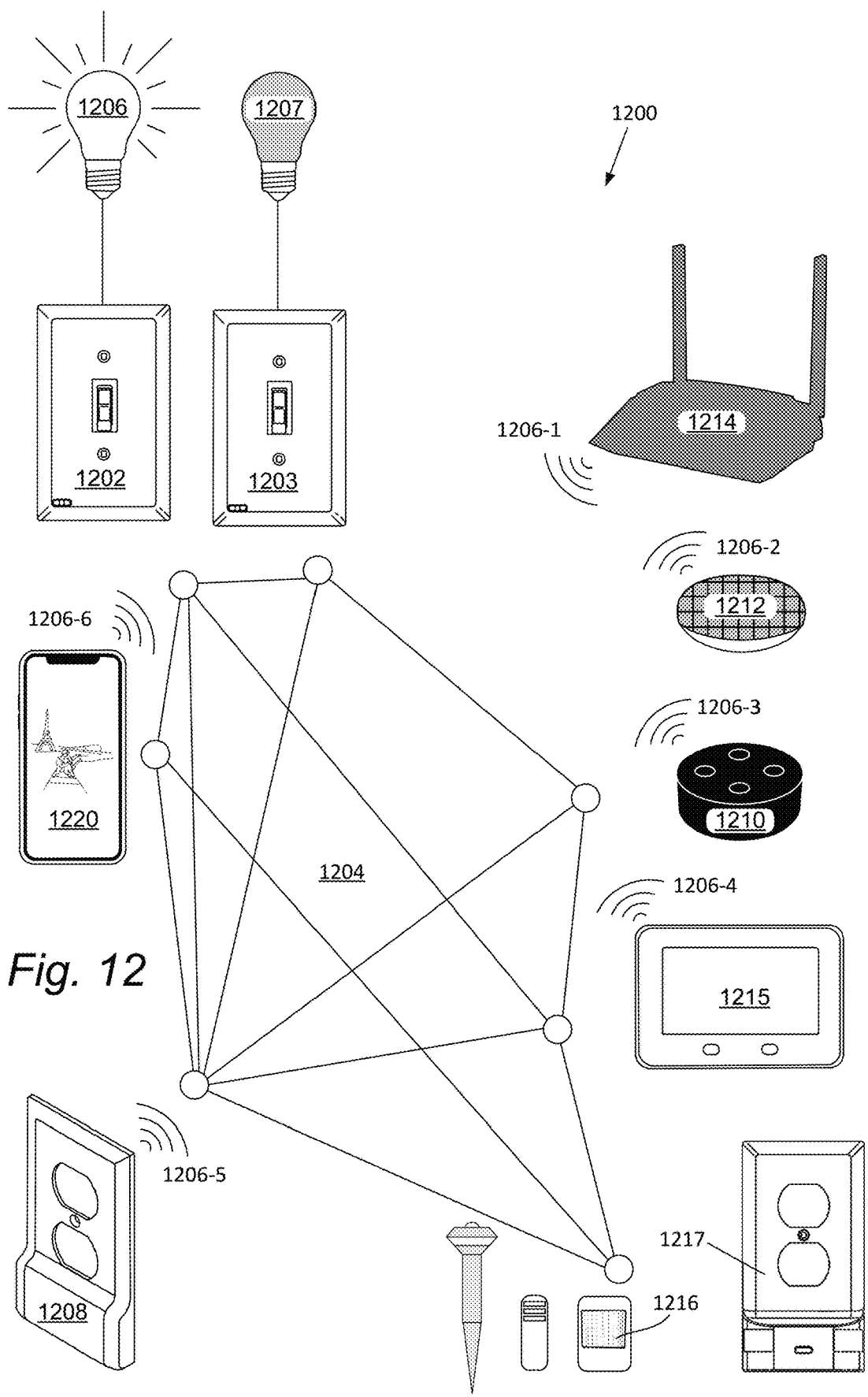
FIG. 12 is a diagram of a system for controlling loads with active cover plates, according to one embodiment of principles described herein.

FIG. 12 shows an illustrative system (1200) that uses various active cover plates (1202, 1203, 1208, 1217) to control various loads, provide illumination and/or sense environmental conditions. In one embodiment, several of the active cover plates (1202, 1203) contain a circuit that includes the principles described with respect to FIGS. 11A and 11B. Specifically, the active cover plates (1202, 1203) are capable of activating a load without changing the position of the manual switch. In this example, a first active cover plate (1202) has activated the load (1206) by routing the current through the cover plate while the manual light switch remains off. The second active cover plate has switched the load (1207) off. Thus, control of the internal switch (1102, FIG. 11A, 11B) in the active cover plates (1202, 1203) provides for control of their respective loads (1206, 1207). The active cover plates (1202, 1203) may have wireless or wired interconnectivity to send and receive signals from other devices. In this example, the active cover plates (1202, 1203) connect to a network (1204) as represented by the nodes adjacent to the active cover plates. The network may be of any appropriate type, including a mesh network, a broadcast network, Bluetooth Low Energy (BLE), Thread, Zigbee, Z-Wave, 802.11 based mesh networks, or other appropriate or future developed network. Although the network is illustrated as being a network with interconnected nodes, other network topologies and protocols may be appropriate. For example, master/slave or broadcast networks may be used. A second WiFi network (1206-1 to 1206-6) is also shown. However, because the WiFi network may consume a large amount of power, power constrained devices such as battery powered sensors (1216) and active cover plates (e.g. 1202, 1203) connected to light switches may use the lower power mesh network protocol (1204). In other embodiments, the active cover plate(s) mounted over light switches may actuate to manually change the position of the switch mounted in the electrical box upon receiving an externally or internally generated command.

The system (1200) may also include various mobile devices (1220), routers (1214), various smart devices such as Google Home (1212) or Amazon's Alexa (1210) devices, various home security devices (e.g. 1215), motion active cover plates (1217), and various sensors (1216). In one embodiment, an active cover plate (1208) can be used as a bridge to translate/relay data from the mesh network (1204) to devices that use other protocols. For example, if the network uses Zigbee or Z-Wave, the bridge active cover plate (1208) could translate the communications into another protocol such as Wi-Fi or BLE so that more devices could participate. One significant consideration of which protocol to use for the mesh network is the power consumption required to participate. It may be beneficial for devices that have limited power input or reserves for the network/protocol to have lower power requirements. Examples of devices with more limited available power may include battery or solar powered sensors, mobile devices, active cover plates connected to sensitive loads, etc. Network protocols that have lower power requirements may include BLE, Zigbee, security communications in designated or other bands (e.g. 433 MHz, 900 MHz, 1800 MHz, etc.) and Z-Wave networks. Future arising networks and custom networks may also be used. In this example, the bridge active cover plate (1208) is shown as a cover plate that is configured for outlets, where there are fewer power restrictions than light switches. Consequently, it has access to more power and can transmit and receive at multiple frequencies and with higher powered protocols than other devices with more limited power.

In one example, a user may wish to turn off a light (1206) but is out of the house. Using their mobile phone (1220), the user communicates over the internet/cell network to the router (1214) which may not have direct access to the low power protocol/mesh network to control the BLE lighting control active cover plate (1202). The router sends a Wi-Fi signal which is accepted by the bridge active cover plate (1208) and translated into BLE protocol and passed through the mesh (1204) to the lighting control active cover plate (1202) which then changes the configuration of its internal switch or other element to turn the light (1206) off. For example, the configuration of the internal switch may be changed from making a connection between terminals A and B (as shown in FIG. 11B) to making a connection between A and C (as shown in FIG. 11A).

The previous examples are directed to single pole switches that have two screw terminals for connection of hot and neutral wires and one additional screw terminal for connection of a ground wire. These single pole switches are used where only one switch controls the exterior load. However, the principles described herein also apply to situations where multiple switches control the load and multi-pole switches are used. For example, three-way and four-way switches are used in rooms with multiple entrances, such as hallways, stairways, and larger rooms. One light switch is located at each entrance so that a user entering from any entrance can control the overhead lights. The electrical system is configured so that changing the state of any switch results in a change in the load state. Consequently, the lights can be turned ON or OFF from any entryway/switch.

The embodiments described above are only illustrative. The network may have more components or less components than illustrated. For example, a group of active cover plates that contain motion detectors (e.g. 1216, 1217) or other sensors may communicate between each other without other components or networks. For example, there may be a network of motion sensing active cover plates that include one or more cover plates with motion sensors. There may be additional active cover plates that are connected to the network or receive commands from the network that do not have motion or other sensors. When motion is detected by an active cover plate, it may send a signal to other active cover plates that signals them to take an action. For example, a motion sensing active cover plate (1217) may be located near an entrance to a home. When the motion sensing active cover plate (1217) senses motion, it may take an internal action (such as illuminating the surrounding area or turning on an exterior light) as well as sending a signal to other active cover plates that are connected to its network or subnetwork. These active cover plates may then respond by taking appropriate actions such as illuminating, increasing illumination, decreasing illumination, turning off illumination, forwarding the command/signal to other active cover plates, etc. In some embodiments, a subnetwork or channel may be manually or electronically selected by a user to group the cover plates. For example, a user may select a "group 1" designation for an entryway motion detector active cover plate and hallway guidelight active cover plates. This can be performed manually by moving a switch on the selected active cover plates to a position labeled "1". After this grouping, when the motion detector guidelight (e.g. 1217) at the entryway detects motion, it will illuminate and signal other guidelights in the group to also illuminate. This signaling could be accomplished through electronic, sound, optical or other communication techniques. Guidelights that are not in "group 1" will not illuminate. In another example, the user may have two motion sensing active cover plates in different entryways to a kitchen, with illuminating active cover plates mounted over the kitchen counter. The user designates this group of active cover plates as "group 2". If either of the motion sensing active cover plates detects motion, they send a signal that causes the illuminating active cover plates over the kitchen counter to brighten for a specific amount of time after motion ceases to be detected. There are a variety of other implementations. For example, each active cover plate in a group may be configured to detect motion. Upon sensing motion, a first active cover plate sends an optical signal to any other guidelight in its group by flashing its lights in a manner that isn't detectable by the user. Any active cover plate in the group that detects this optical signal then illuminates and repeats the signal. In this situation, the active cover plates in the group may sequentially illuminate as the optical signal spreads throughout the group. In this example, strict grouping may not be necessary because only those cover plates that can optically see/receive the signal from adjacent cover plates turn on.

Figure 13:
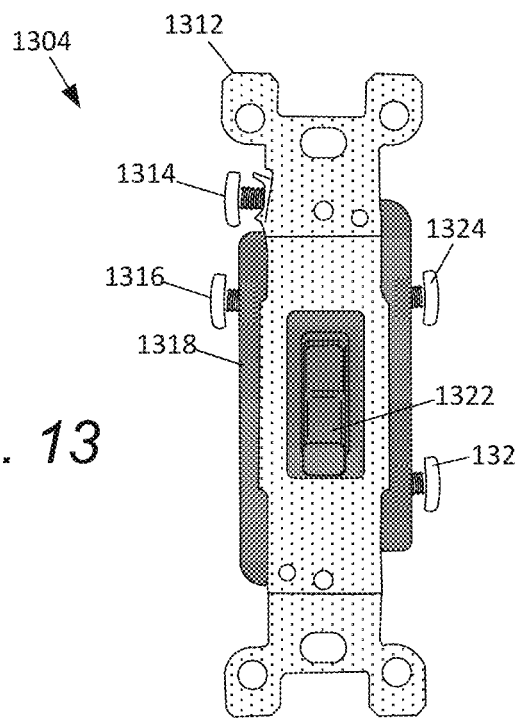
FIG. 13 shows one example of a three-way light switch, according one example of principles described herein.

FIG. 13 is a front view of an illustrative three-way switch (1304). This three-way switch (1304) includes a body (1318), and a yoke/mounting bracket (1312) attached to the body. A ground screw terminal (1314) is connected to the bracket (1312). The bracket (1312) also includes various apertures and threaded holes for mounting of the switch (1304) to an electrical box and for mounting a face plate over the switch. The switch (1304) also includes three screw terminals (1316, 1320, and 1324). These screw terminals allow electrical wires to be mechanically fastened and electrically connected to the switch. A toggle (1322) allows the user to mechanically change the position of internal contacts to change the electrical configuration of the switch. For example, a first screw terminal (1324) may be electrically connected to a second screw terminal (1320). However, when a user mechanically moves the toggle upward to a new location, the internal contacts may be reconfigured to connect the first screw terminal (1324) to a third screw terminal (1316).

This is just one embodiment of a three-way switch. A variety of other three-way switch configurations may also be used in conjunction with the principles described. For example, the three-way switch may have a rocker rather than a toggle, or the wiring may be connected to stab in connectors on the rear of the switch body rather than directly to the screw terminals. The three-way switch and other switches described herein may also include various sensors and actuators. For example, the switches may include motion detectors and/or actuators to remotely/automatically control the loads/lights connected to the switch.

Figure 14:
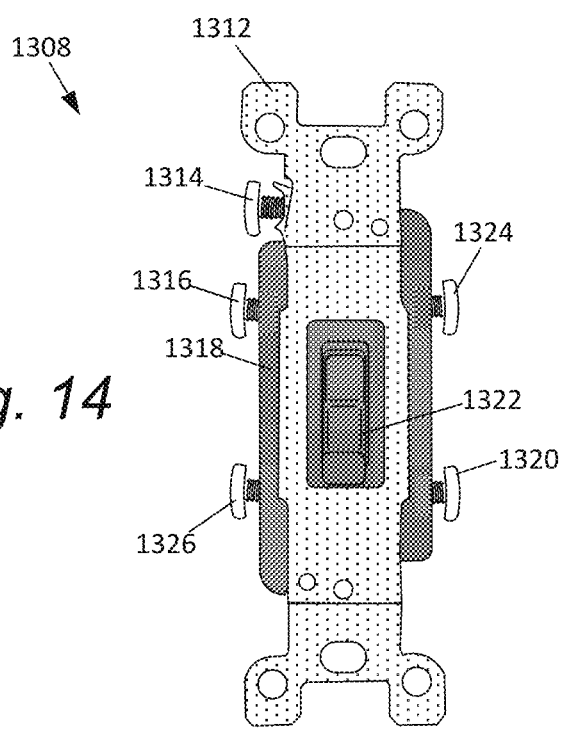
FIG. 14 shows one example of a four-way light switch, according one example of principles described herein.

FIG. 14 is a front view of an illustrative four-way switch (1308). The four-way switch may include many of the same features as a three-way switch. For example, this four-way switch (1308) includes a body (1318), and a yoke/mounting bracket (1312) attached to the body. A ground screw terminal (1314) is connected to the bracket (1312). However, in additional to the three screw terminals (1316, 1320, 1324), the four-way switch (1308) also includes a fourth screw terminal (1326). Although the toggle (1322) allows the user to mechanically change the electrical configuration of the switch, the internal contacts are different than in a three-way switch. In this example, in a first configuration a first screw terminal (1324) may be electrically connected to a second screw terminal (1320) and the third screw terminal (1316) may be connected to the fourth screw terminal (1326). However, when a user mechanically moves the toggle upward to a new location, the internal contacts are reconfigured to connect the first screw terminal (1324) to the fourth screw terminal (1326) and the third screw terminal (1316) is connected to the second screw terminal (1320). The above example is only illustrative of the principles described. Different switches may have various other implementations.

Examples of electrical systems that include three-way and four-way switches are given below. Unlike illustrative single pole switches shown and described in FIGS. 1A-1D, these multi-pole switches do not have a preferred orientation. For single pole switches, it is standard practice to mount the switches so that moving the toggle upward turns the light ON and moving the toggle downward turns the light OFF. Mounting a single pole light switch upside down would result in counterintuitive operation for the user. Because single pole light switches have a consistent mounting configuration, the location of the screw terminals is also fairly consistent (typically on the right of the switch when facing the front of the switch). Thus, the two prongs on active cover plates intended for use with single pole switches (see e.g. FIGS. 3A, 3B, 3C, 4A, 4B, 4C, 5) can be located to consistently contact the screw terminals. However, for three-way and four-way switches, simply repositioning the toggle/rocker of any switch in the electrical system will change the state of the load/lights. Thus, three-way and four-way light switches can be mounted upside down or right side up without interfering with the user's operation. This makes the locations of the screw terminals less predictable.

Further, as the configuration of the electrical system changes as a result of users reconfiguring various light switches, the electrical interconnections between the various screw terminals also changes. A pair of screw terminals that can supply electrical power to an active cover plate in a first configuration may not be able to supply electrical power in a second configuration. Thus, for an active cover plate to reliably receive electrical power, the active cover plate may be configured to contact multiple screw terminals and select the screw terminals that have electrical power for a given configuration.

Figure 15A:
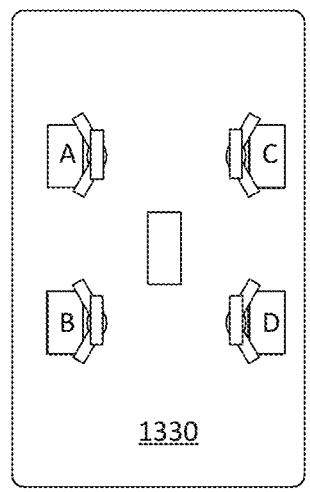
FIGS. 15A-15C are diagrams of illustrative prongs and active cover plates for multi-pole light switches, according to one example of principles described herein.

FIG. 15A is a diagram of a rear view of an active cover plate (1330) that includes four prongs (A, B, C, D) and is configured to be compatible with both three-way and four-way light switches. When the cover plate (1330) is placed over a three-way switch, one of the prongs will not connect with a screw terminal. For example, the cover plate (1330) may be placed over the three-way switch (1304, FIG. 13) and prong A may contact the first screw terminal (1324), prong B may contact the second screw terminal (1320) and contact C may contact the third screw terminal (1316). Prong D will rest on the body (1318) of the switch (1304) and will not make contact with a screw terminal. If the three-way switch (1304) is mounted upside down, prong C may contact the second screw terminal (1320), contact D may contact the first screw terminal (1324) and prong A may contact the third screw terminal (1316) with prong B resting on the body (1318) and may not contact a screw terminal. Thus, this configuration, which includes more prongs on the active cover plate than there are screw terminals on the light switch accommodates multiple light switch mounting orientations.

For four-way switches, the prongs (A, B, C, and D) of the active cover plate (1330) may contact all four of the screw terminals when the light switch is mounted upside down or right side up. However, there is no requirement that each of the prongs contact a screw terminal. The active cover plate can extract power from the light switches if there is a voltage difference between the screw terminals that will support electrical current flow.

Figure 15B:
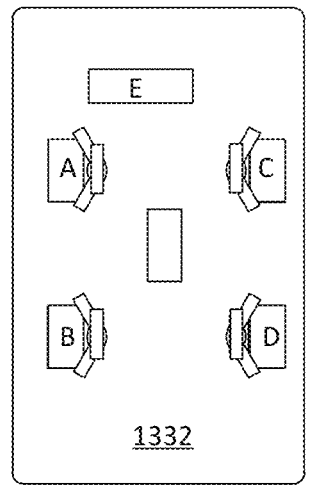

FIG. 15B shows an alternative configuration of an active cover plate (1332). In this configuration, a fifth prong (E) has been added to the other prongs (A, B, C, and D). This prong will make electrical contact with the ground screw terminal. It may contact the yoke of the light switch (which is connected to the ground wire) or directly contact the ground screw terminal.

Figure 15C:
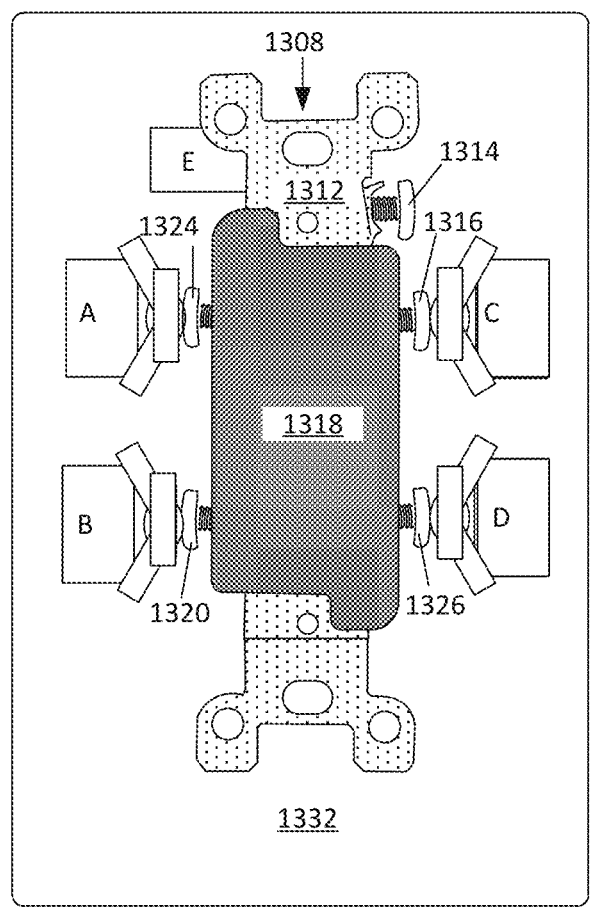

FIG. 15C shows a rear view of an active cover plate (1332) installed over a four-way switch (1308) that includes a light switch body (1318). For purposes of illustration, electrical wires are not shown connected to the screw terminals but are assumed to be in place. In this example, prong A may contact the first screw terminal (1324), prong B may contact the second screw terminal (1320) and contact C may contact the third screw terminal (1316), and prong D may contact the fourth screw terminal (1326). Prong E contacts the conductive bracket/yoke (1312) that is electrically connected to a ground screw terminal (1314).

In general, an active cover plate for installation over a multi-pole light switch may include a face plate and at least three prongs extending rearward from the faceplate to electrically contact terminals of the multi-pole switch. A circuit in the active cover plate is connected to and draws power from the prongs. However, as discussed above, there may not be a voltage difference between a given pair of these prongs that will support electrical current flow. Thus, the circuit in the active cover plate will have to select or reselect the screw terminals that have a voltage difference each time the electrical system is reconfigured.

However, the inclusion of four prongs can make installation more difficult. All four prongs are placed around the light switch body, with two prongs on each side of the light switch body. To correctly install the active cover plate the prongs are directed into the space around the light switch but inside of the receptacle box.

FIGS. 16A, 16B, and 16C show an install tool (1600) and its use in spreading the prongs apart. FIG. 16A shows an install tool (1600) that may be used to spread the prongs before installation. This install tool (1600) is inserted between the prongs. In this example, the installation tool (1600) includes a body (1603), a handle (1602), stand offs (1606), a toggle slot (1612), and tapered extensions (1608). The handle (1602) is configured to be grasped by the user and is used to manipulate the install tool (1600) during an installation.

The stand-offs (1606) are configured to contact the rear surface of the face plate of the active cover plate and locate the tapered extensions (1608) at a correct height off the rear surface. The tapered extensions (1608) are configured to be inserted between the prongs, with the tips of the extensions being closer together than the prongs. When the install tool (1600) is inserted between the prongs, the prongs slide along the tapered outer edge of the extensions (1608), gradually spreading apart as the tool (1600) continues to be inserted between the prongs. When a shoulder (1604) contacts the prongs, the install tool is fully inserted between the prongs and the cover plate is ready to install over the light switch. The fully inserted install tool is shown in FIGS. 16B and 16C.

FIG. 16B is a perspective view of a toggle install tool (1600) installed between the prongs (1616) of a toggle style active cover plate (1614). The aperture (1618) is configured to receive the toggle light switch handle. The handle can extend through the slot (1612) and can pass into the aperture (1618).

FIG. 16C shows the shoulder (1604) contacting the prongs. The prongs (1616) are bent outward to fit over the switch body.

Figure 16D:
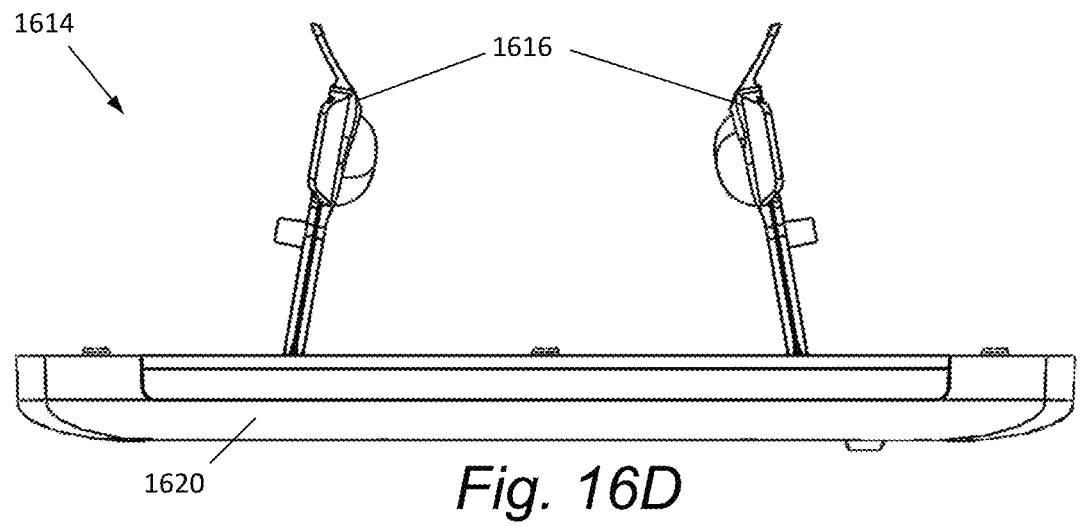
Figure 16E:
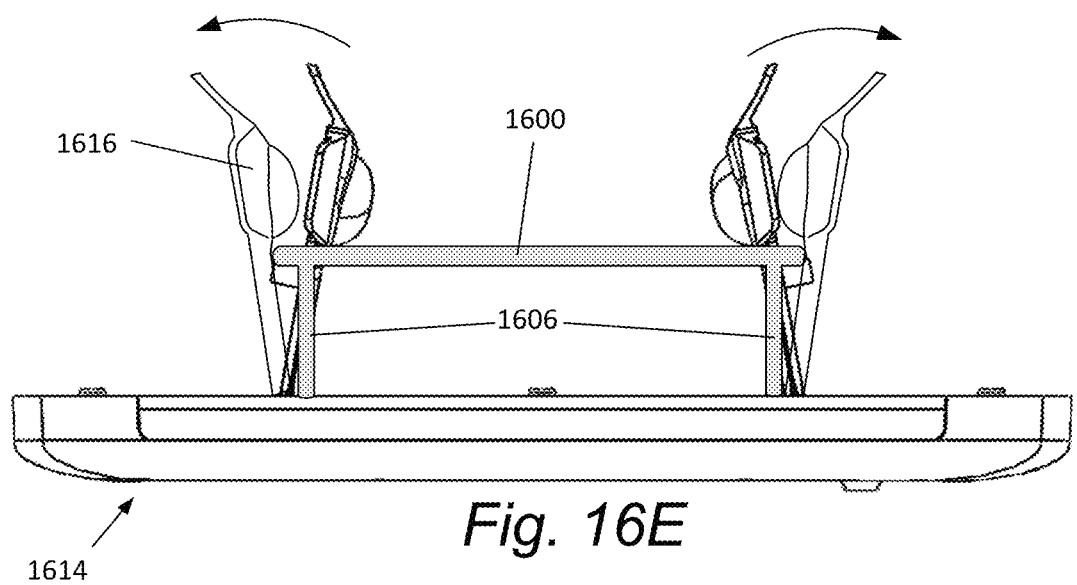

Now referring to FIGS. 16D and 16E of the four-prong toggle active cover plate (1614), FIG. 16D shows a bottom view of the active cover plate (1614) with a profile side view of the prongs (1616). The prongs are connected to the faceplate (1620) and/or the backplate. As shown in FIG. 16D the prongs may be angled inward. In other embodiments, the prongs may have an even greater inward angle. Consequently, it may be difficult to spread and maneuver all four of the prongs around a light switch while lining up the cover plate to interface with the light switch.

When the install tool (1600) is installed (FIG. 16E) the prongs (1616) move/bend outward. The standoffs (1606) position the install tool (1600) at the correct/desired height. The install tool/active cover plate (1600/1614) are then ready to be installed over the toggle light switch.

Figure 17A:
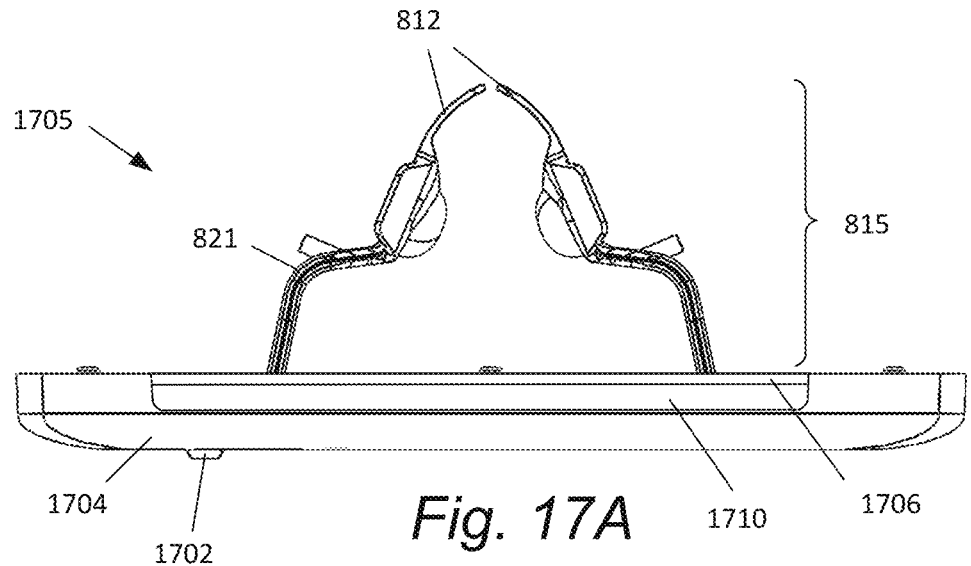
FIGS. 17A-17D are diagrams of illustrative active cover plates, prongs, and installation tools for multi-pole light switches, according to one example of principles described herein.
Figure 17B:
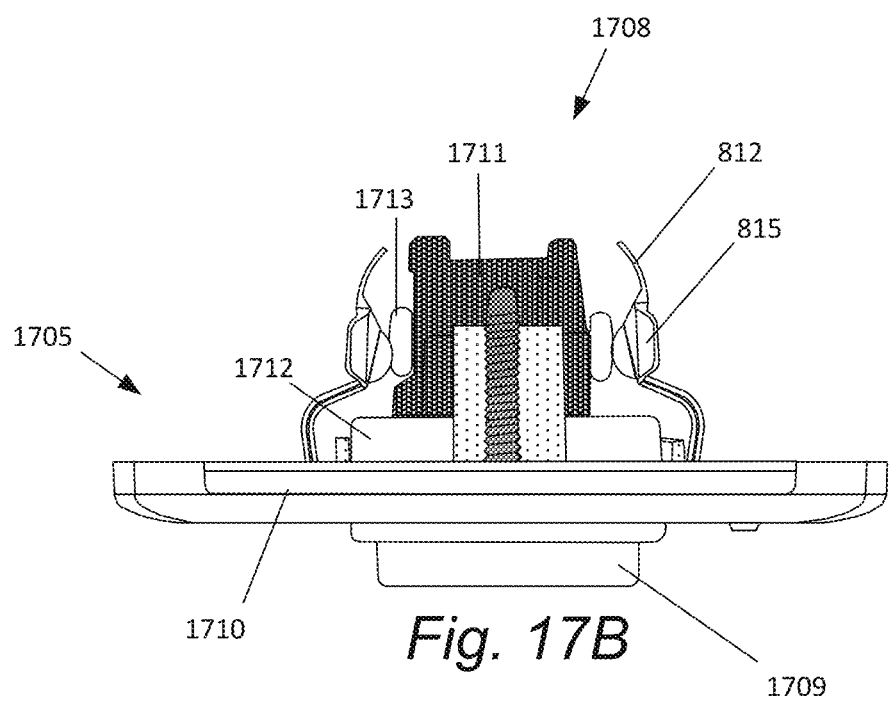

FIGS. 17A-17E are pictures showing an illustrative embodiment of a four-prong active cover plate (1705) for installation over a décor/rocker light switch (1708, FIG. 17B). The prongs (815) in this embodiment may be different in some aspects than shown in other examples. In this configuration, the prongs include a bend or elbow (821), with the prong extending more directly upward as it leaves the back of the cover plate and then bending inward. As discussed above, this bend (821) can allow the prongs (815) to reach around shoulders (1712, FIG. 17B) on décor light switches (1708). These shoulders (1712) are present in at least some décor designs as a result of the wider face of the rocker/paddle (1709) that is exposed for user interaction. This larger/wider rocker (1709) may be desirable for a number of reasons, including easier manipulation of the rocker by the user. However, behind the rocker face there is no need for the width to continue. To save materials, expense and weight, the designers of the light switches decrease the width of the switch body (1711). This results in a design where the screw terminals (1713) are recessed behind the shoulder. In some cases, the width of the body (1711) where the screw terminals (1713) are located can be significantly narrower than the face of the switch. This is reflected in FIG. 17A, where the prongs in their relaxed position have a relatively narrow gap between the contacts on the opposing prongs to accommodate the relatively narrow switch body (1711) and closely spaced screw terminals (1713). However, the prongs have the flexibility and configuration to also contact more widely spaced screw terminals (i.e. screw terminals of three and four-way light switches which tend to have wider bodies).

The main ramps (812) of the décor prongs are different in some respects than other prongs. As shown in FIG. 17A, the main ramps (812) extend inward with a reverse curve, so that the tips of the ramps on opposing prongs may actually be closer together than the contacts. This may be counter intuitive because one of the functions of the main ramps (812) is to guide the active cover plate over and around the light switch body. However, with the tips of the ramps (812) very close together in the four-prong cover plate, it could be difficult to manually spread the prongs apart and around the light switch body during the installation of the cover plate. FIG. 17A is a bottom view of the illustrative four prong active cover plate for décor light switches. This image also shows the tips of the prongs coming very close to each other. Also shown in FIGS. 17A, 17B are various additional elements of the active cover plate, including the face plate (1704), the switch/sensor cover (1702), the light pipe (1710), and back plate (1706).

As discussed above, the inclusion of four prongs can make installation more difficult. All four prongs are placed around the light switch body, with 2 prongs on either side of the light switch body, in the space around the light switch but inside of the receptacle box. In one embodiment shown in FIGS. 17C and 17D, an install tool (1714) is used to spread the prongs before installation. This install tool (1714) is inserted between the prongs (815). In this example, the install tool (1714) for the décor light switch active cover plates (1705) is different in some respects than the install tool (1600, FIGS. 16A-16C, 16E) for the toggle active cover plate (1614). In this example, the décor install tool includes a body (1703), handle (1716) on one end of the body, a tapered extension (1720) on the other end of the body, and shoulders (1718). The décor install tool (1714) may not need standoffs because it is secured in place by the bend/elbow (821) in the prongs (815). Further, the décor install tool (1714) does not need a slot or space in the extension because the extension will not interfere with the relatively low-profile rocker (1709, FIG. 17B) on the light switch. The handle (1716) is configured to be grasped by the user and is used to manipulate the install tool (1714) during an installation. When the install tool (1714) is inserted between the prongs (815), the prongs slide along the tapered outer edge (1722) of the extension (1720), gradually spreading apart as the tool (1714) continues to be inserted between the prongs (815). When a shoulder (1718) contacts the prongs (815), the install tool (1714) is fully inserted between the prongs (815) and the cover plate (1705) is ready to install over the light switch.

Figure 17C:
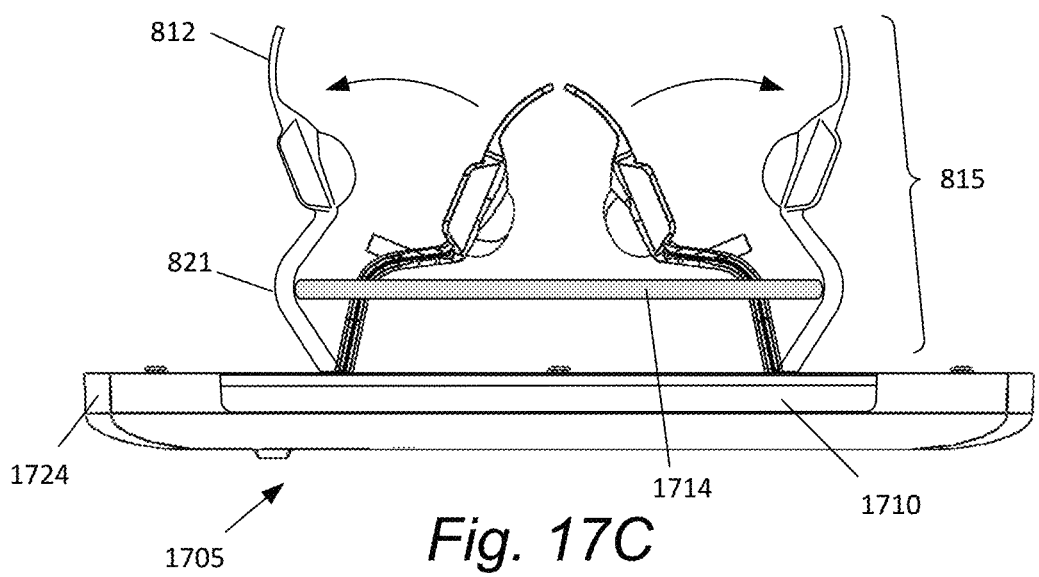
Figure 17D:
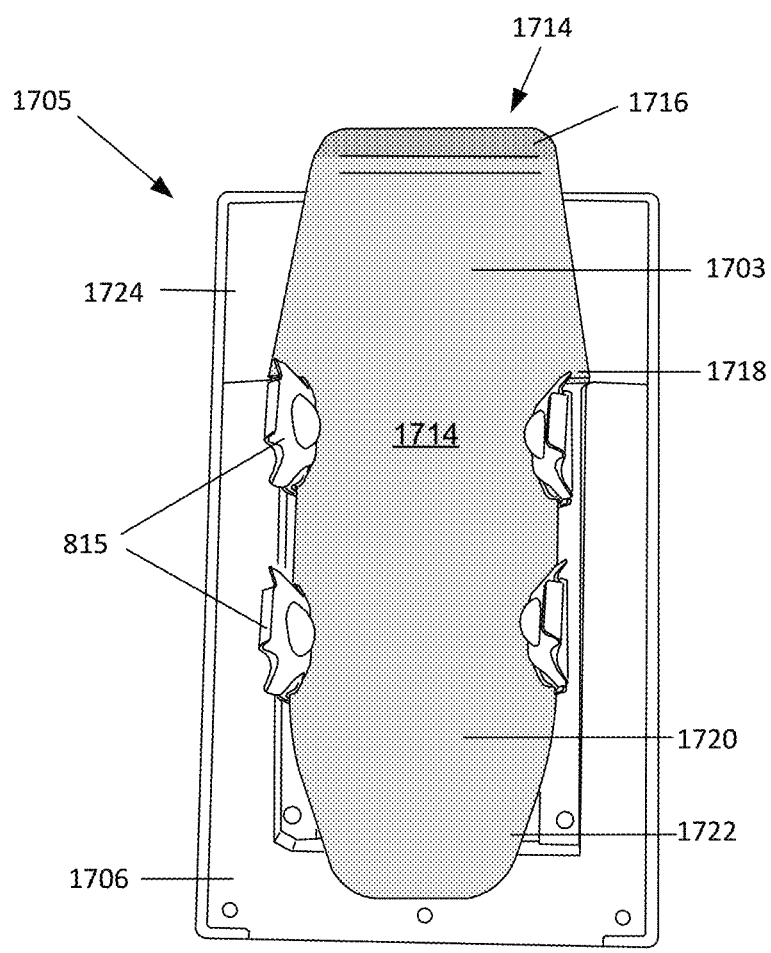

The inserted install tool (1714) is shown in FIGS. 17C and 17D. The install tool (1714) has been inserted between the prongs (815) and has spread the prongs apart with the shoulders (1718) contacting the edges of the prong. With the install tool (1714) in place, the main ramps (812) (the portion of the insulation that extends farthest rearward from the cover plate) are nearly vertical and are configured to guide the cover plate (1705) over the décor/rocker light switch (1708, FIG. 17B). The edges of the insertion tool rest in the elbow of the prongs. Specifically, FIGS. 17D and 17E are diagrams of the install tool (1714) being inserted between the prongs (815). The prongs (815) move outward as the install tool (1714) is inserted.

Figure 18:
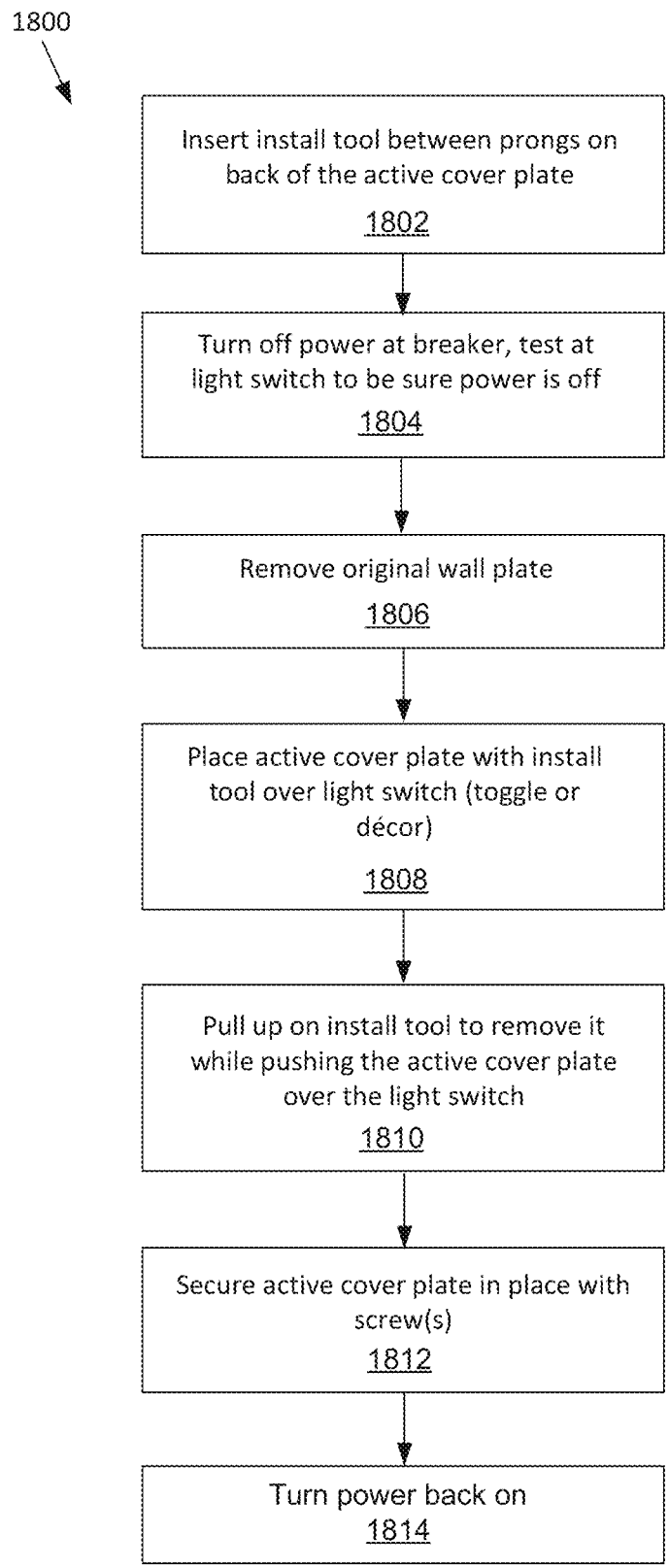
FIG. 18 is a flow chart for installing an active cover plate over an electrical receptacle, according to one embodiment of principles described herein.

FIG. 18 is a flow chart (1800) showing one illustrative method for installing an active cover plate over a receptacle such as a light switch. At some point in the process, the install tool may be inserted between the prongs on the back of the cover/cover plate (step 1802). This may occur at the factory where the install tool may be inserted between the prongs prior to packaging the cover plate. Alternatively, a user may insert an install tool that is separate from the cover plate. For example, an install tool may be provided separately and used to install multiple cover plates. The step of inserting an install tool may be performed at any time prior to the placing of the active cover plate over the electrical receptacle. For example, the install tool may be placed between the prongs prior to packaging of the active cover plate.

The power is turned off at the breaker and the light switch is tested to be sure that the power is off (step 1804). For example, the light switch could be flipped on and off after the breaker is shut off to determine if the light or other load receives electrical power. The original cover plate is then removed (step 1806). Additionally or alternatively, a meter or other sensor could be used to check for power at the light switch after the original cover plate is removed.

After the power is off and the original cover plate is removed, the active cover plate with the install tool in place is placed over the light switch (toggle, décor, or other) (step 1808). The install tool is between the prongs and holds the prongs apart so that the prongs can be placed around the light switch body. As the active cover plate is moved over the light switch body and the prongs are on either side of the light switch body, the install tool can be removed by sliding the install tool upward/downward from between the prongs. This allows the prongs to relax somewhat and contact the sides of the light switch body. While removing the install tool, the active cover plate can be pushed farther over the light switch until the toggle or rocker of the light switch engages with the corresponding aperture in the cover plate (step 1810). The active cover plate can then be secured in place with screw(s) to connect it to the light switch body (step 1812). With the active cover plate in place, the power can be turned back on (step 1814).

The method given above is only an illustrative example. There may be a number of variations to the method shown. For example, the order of the steps may be changed, additional steps may be added, and some steps may be removed. For example, the cover plate may be installed without turning the power off if the installing individual is an electrician who is both comfortable and knowledgeable about working with live circuits. In some embodiments, the active cover plate may not include fasteners such as a screw. A variety of techniques may be used to secure the active cover plate over the switch. For example, the active cover plate may snap into place or use magnets or other connection elements. An additional step that could be added is testing the active cover plate to determine if the lights in the cover plate illuminate when the area is dark and the mechanical control switch on the cover plate (if any) is in the ON position. In some situations, the step of pulling the install tool to remove it may be separate from the step of pushing the functional wall plate over the light switch. Although these steps can be performed together the steps could be performed sequentially or the prongs themselves may pull the cover plate into position over the light switch. Additionally, in some situations an installation tool may be configured differently or not used at all.

FIGS. 19A-19D show one exemplary method (1900) for installing the active cover plates (1614) over light switches. In this method, the install tool (1600) is inserted between the prongs (1616) on the back of the active cover plate/active cover plate as shown in FIG. 19B (step 1902). The active cover plate (1614) with the install tool (1600) in place can be installed over the light switch (step 1904). This step can be the same for both toggle and décor light switches. FIG. 19C shows the active cover plate (1614) with the install tool (1600) being placed over a toggle light switch (1304). The install tool (1600) holds the prongs (1616) apart so that they pass around the body of the light switch (1304). In this case the toggle extends through the slot in the install tool (1600). The installer then pulls up on the handle of the install tool (1600) to remove it from between the prongs (1616) and pushes the active cover plate farther onto/over the light switch (step 1906). This is shown in FIG. 19D. In some situations, the active cover plate (1614) may simply snap over the light switch (1304) without any additional action from the user. In other situations, the user may push the active cover plate over the electrical receptacle or light switch until the active cover plate is flush with the wall and/or the desired portion of the electrical receptacle protrudes through apertures in the active cover plate. The active cover plate can then be secured in place with screws (step 1908) or other fastening technique.

In addition to the single gang light switch installations shown above, there may be a number of other light switch installation types. For example, double gang light switches are used where it is desirable for two different loads to be separately controlled from the same location. For example, at an entryway, it may be desirable for there to be a first switch to control an exterior light and a second switch to control an interior light. Typically, these lights switches are single pole, three-way or four-way light switches that are installed adjacent to each other in a double sized outlet receptacle box. A double gang configuration is only one example; the principles described can also be applied to triple gang light switch configurations, quadruple gang light switch configurations, etc.

Figure 20:
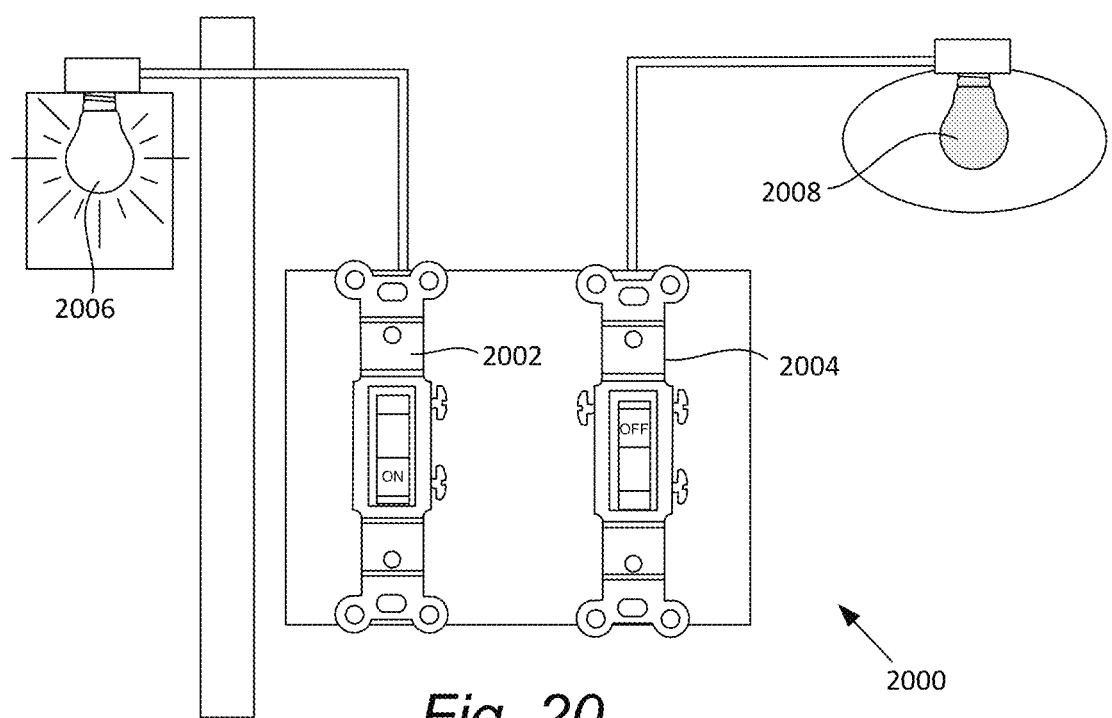
FIG. 20 is an illustrative diagram of an electrical system that includes a double gang light switch installation that controls two separate loads, according to one example of principles described herein.
Figure 21:
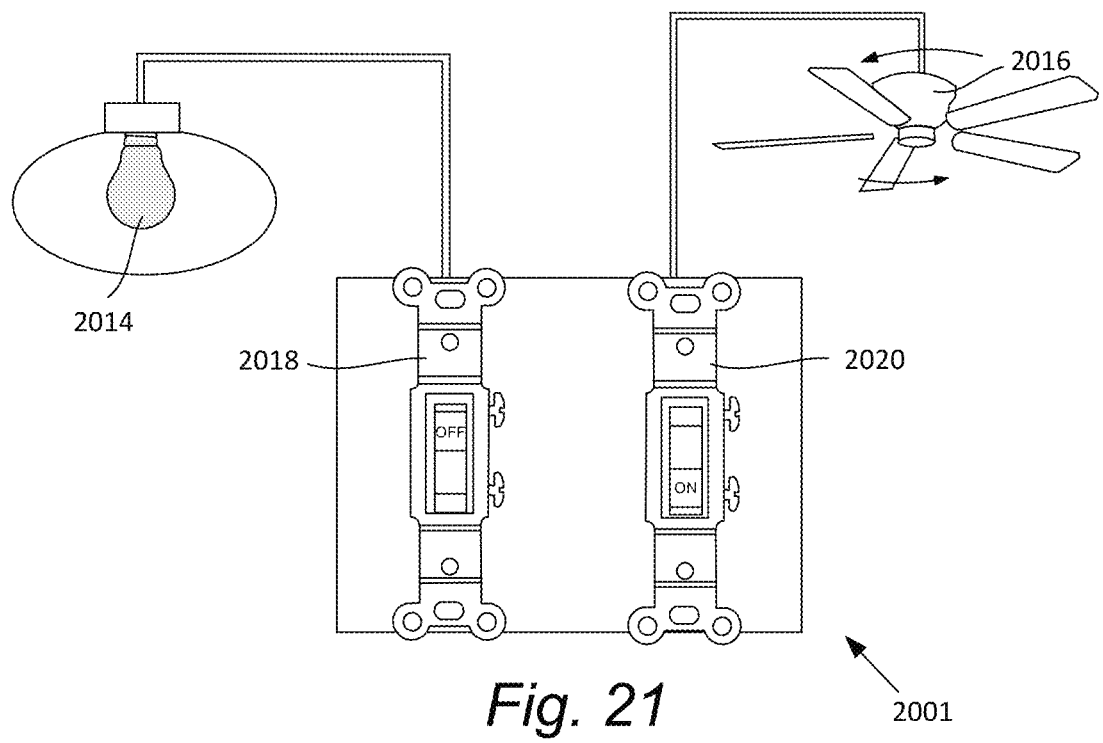
FIG. 21 is another illustrative diagram of an electrical system that includes a double gang light switch installation that controls two separate loads, according to one example of principles described herein.

FIGS. 20 and 21 show two different double gang switch installations (2000, 2001). In a first installation (2000) shown in FIG. 20, the switch (2002) on the left controls a porch light (2006) and the switch (2004) on the right controls an interior room light (2008). A user may wish for the porch light (2006) to remain on at night while the interior room light (2008) is switched off. To install an active cover plate over this switch installation, it can be desirable for the active cover plate to draw power from the room light switch (2004) on the right instead of the porch light switch (2002) on the left. As discussed previously, this is because there is no voltage difference across the screw terminals of the porch light switch when the porch light switch is on. The users may want to have the interior illuminated by the active cover plate at night but still leave the porch light (2006) or other exterior light on. This can be accomplished by having the active cover plate draw power from the right light switch (2004) which is switched off when the room is dark.

FIG. 21 shows an opposite light switch configuration (2001). In this case, the left light switch (2018) controls the room light (2014) and the right light switch (2020) controls the overhead fan (2016). The light switch (2014) in the room may be off at night but the overhead fan (2016) may continue to operate (i.e. overhead fan switch (2020) may be left on a significant portion of the time). Thus, in this case, it is desirable for the active cover plate placed over the double gang light switches (2018, 2020) to draw power from the room light switch (2018) on the left instead of the overhead fan switch (2020) on the right because this light switch is off when the room is dark. Consequently, to be suitable for a broad range of situations and users, an active cover plate for multi-gang light switches may be able to draw power from one light switch or the other, or from both. There are many approaches that could be used to resolve this issue. In one embodiment, the double gang active cover plates could be reconfigurable during manufacturing without additional or specialized parts for any given configuration. This approach is further described with respect to FIGS. 28A-28H and 29A-29I. This may facilitate the assembly of active cover plates with prongs on either the right or the left side.

Figure 22A:
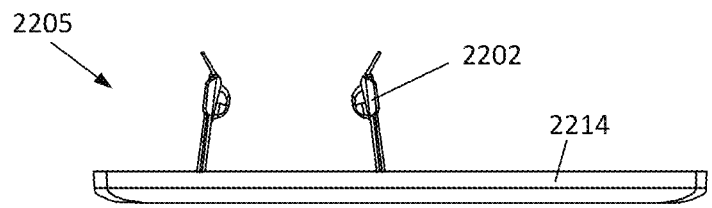
Figures 22B, 22C, 22D:
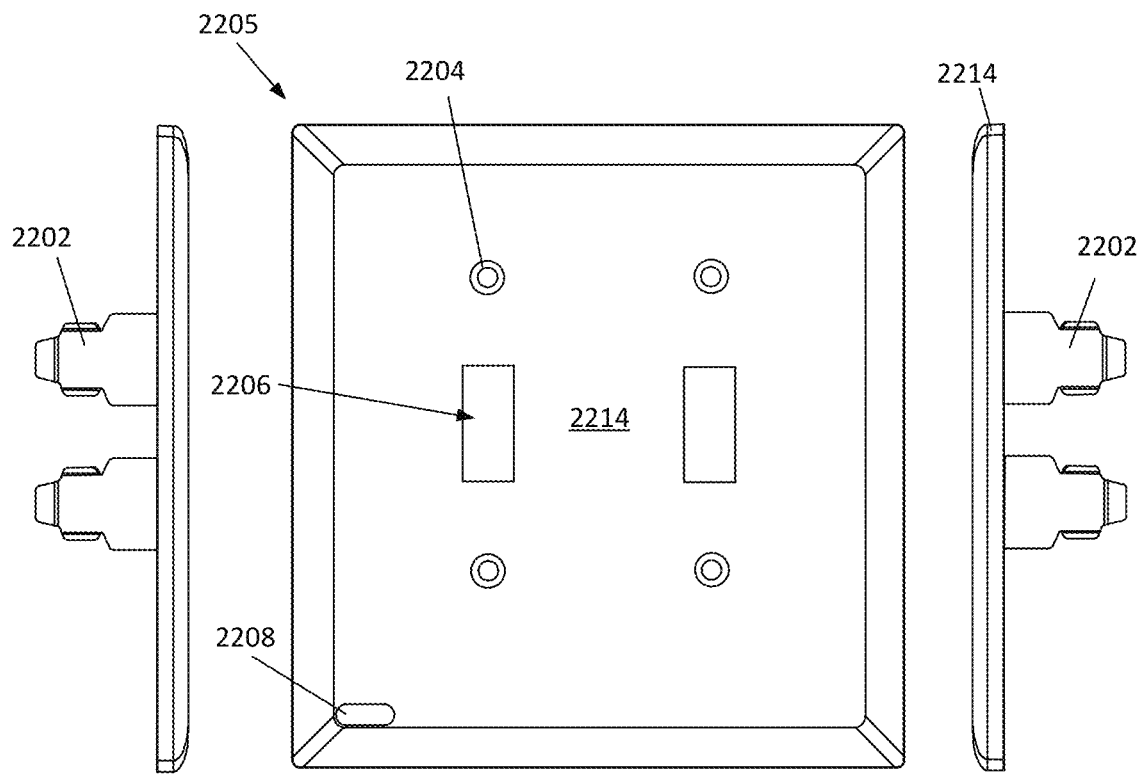
Figure 24A:
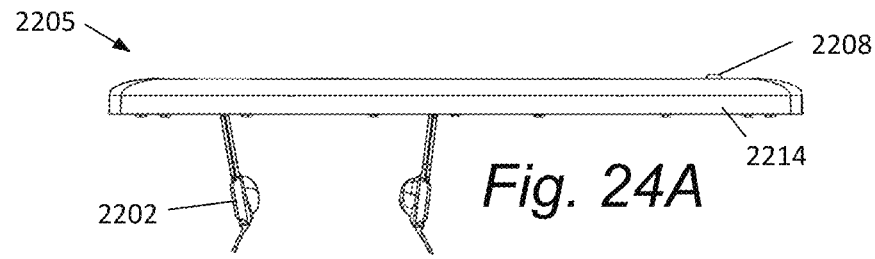
Figure 24B:
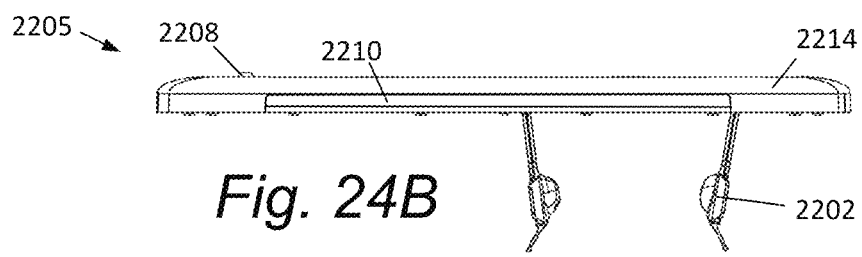

FIGS. 22A-22E show one example of an active cover plate (2205) for double gang light switches. FIG. 22A shows a top view of the active cover plate (2205) with the prongs (2202) extending out from the rear of the faceplate (2214). FIG. 22B shows a side view of the active cover plate (2205) and the rear/outboard side of the prongs (2202). FIG. 22C shows a front view of the active cover plate (2205). In this embodiment, the active cover plate includes a faceplate (2214) with apertures (2204) for connectors and apertures (2206) to accept the toggle light switch handles. This example shows a switch/light sensor cover (2208) in the lower left-hand corner. The shape, size and location of the switch/light sensor cover could be selected in a variety of ways. For example, the switch/light sensor cover (2208) may be in the center, right or higher up on the plate. It could also have a variety of shapes including round, oval, or any other suitable shape. A number of examples of active cover plates with alternative sensor sizes, shapes, and locations are shown in FIGS. 24R-24EE.

Figure 22E:
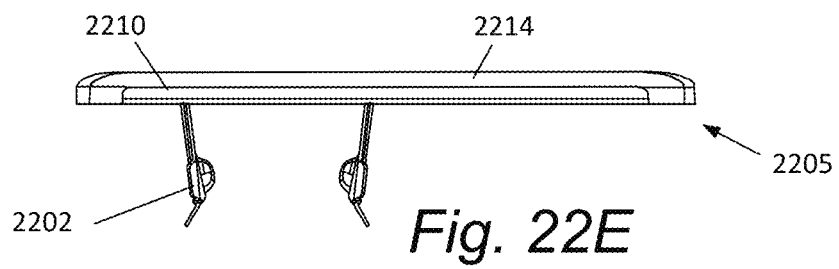

FIG. 22D shows the right side view of the active cover plate with prongs (2202) extending from the faceplate (2214). FIG. 22E shows a bottom view of the active cover plate (2205) and prongs (2202) with the light pipe (2210) on the bottom edge of the faceplate (2214). As discussed above the light pipe allows for light from the LEDs to be conducted out of the active cover plate. The light pipe (2210) could have a variety of different shapes and sizes. A variety of these alternative embodiments are shown in FIGS. 24A-24Q. In this example, the light pipe (2210) has a length that extends across the majority of the bottom edge of the face plate (2214). As discussed and shown below, the light pipe could have a different length and/or geometry.

Figure 22F:
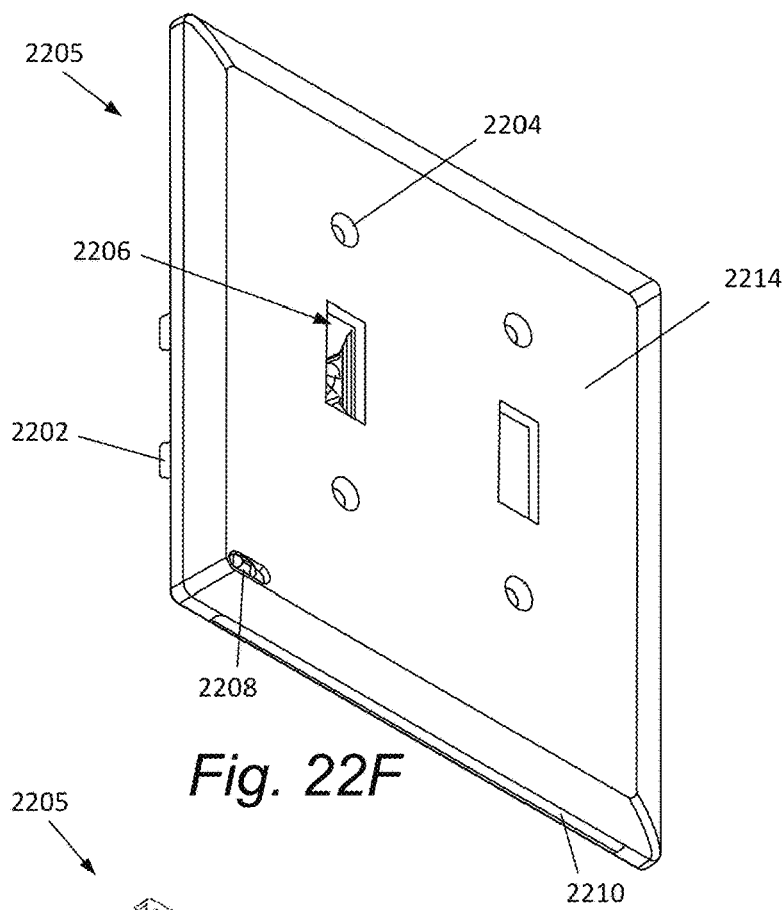

FIG. 22F shows a front perspective view of the active cover plate (2205) with the light pipe (2210) along the bottom edge of the faceplate (2214). Visible in this view are the apertures (2206) to accept light switch toggles, fastener apertures (2204), light sensor/switch (2208) and some portions of the prongs (2202).

Figure 22G:
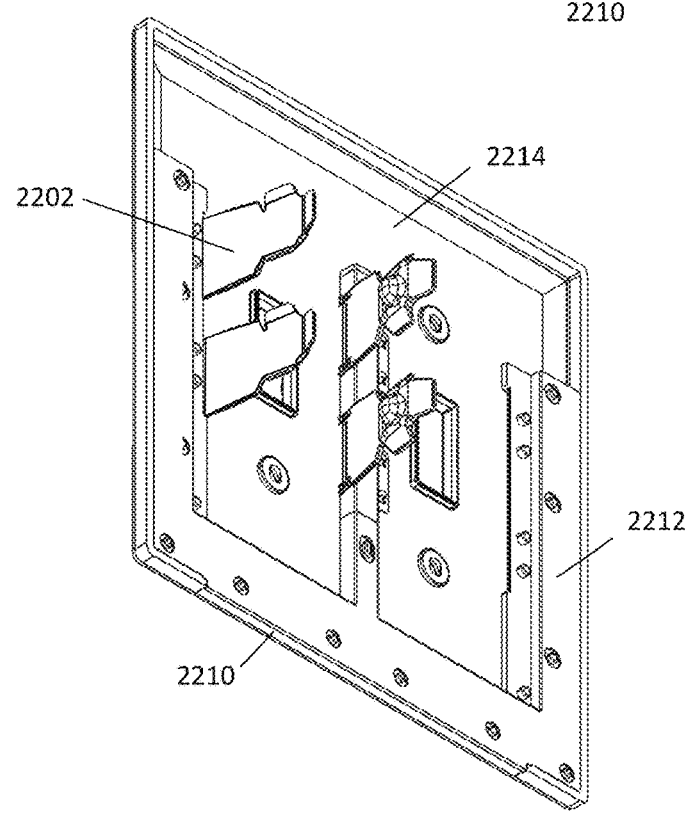

FIG. 22G shows a rear perspective view of the active cover plate (2205). Visible in this is the rear surface of the faceplate (2214), the prongs (2202) mounted to the back of the faceplate, the light pipe (2210) and the back plate (2212). In this example, the prongs are mounted around the opposite light switch aperture. In FIGS. 22A-22F, the prongs are mounted around the left light switch aperture when viewing the active cover plate from the front. In FIG. 22G, the prongs are mounted around the right light switch aperture (viewing the active cover plate from the front). The back plate (2212) covers/encapsulates the internal circuitry, wiring and may help secure at least some of the prongs in place. The prongs (2202) shown are only illustrative and could have a variety of other configurations. For example, the prongs could be mounted in a different location (e.g. mounted on the other side of the rear of the face plate to contact the screw terminals of the other light switch). Further, there could be a different number of prongs, for example, there could be one prong (used in conjunction with a separate conduction mechanism), two prongs, three prongs, or five or more prongs. The prongs could have a significantly different shape and configuration than shown in FIGS. 22A-22G.

Figure 23A:
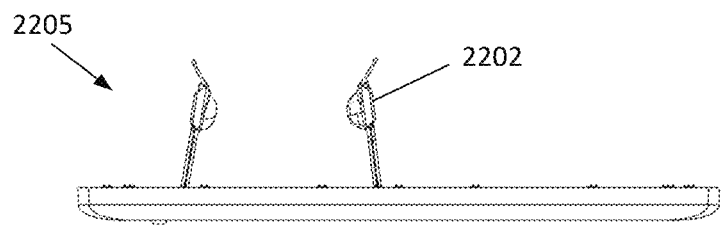
Figures 23B, 23C, 23D:
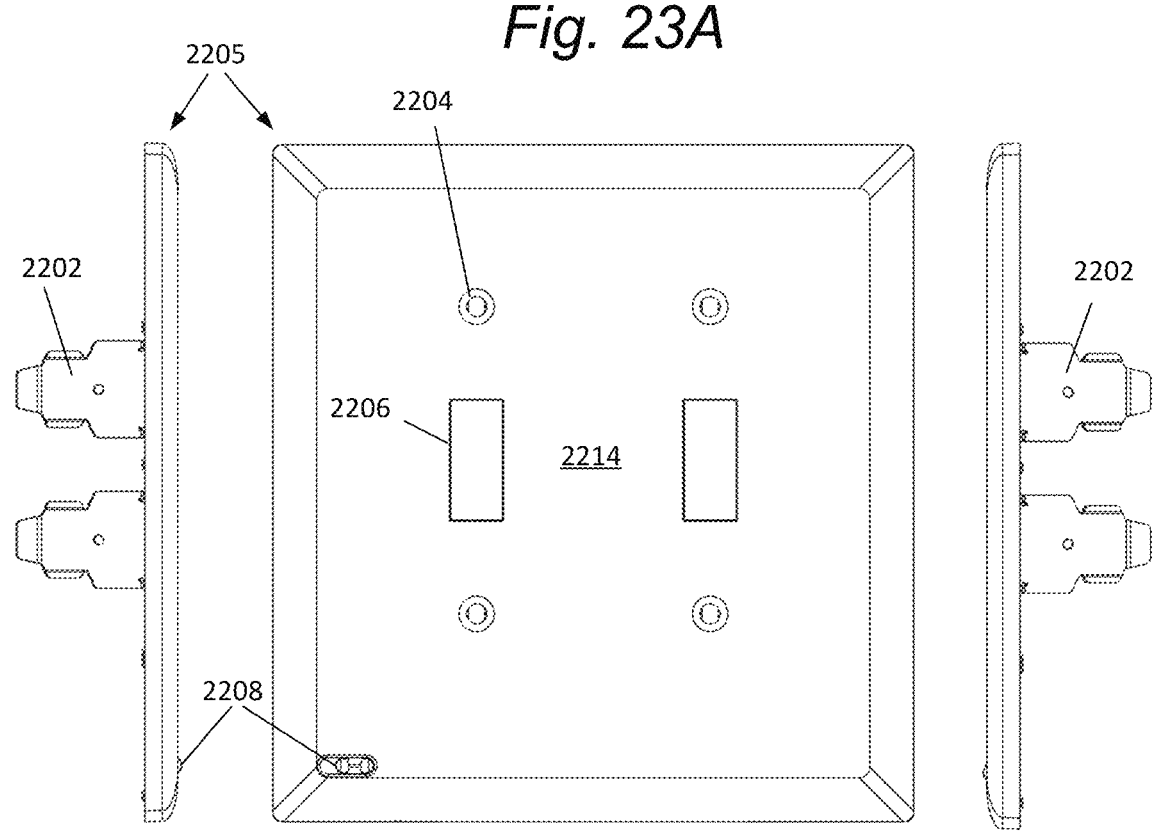
Figure 23E:
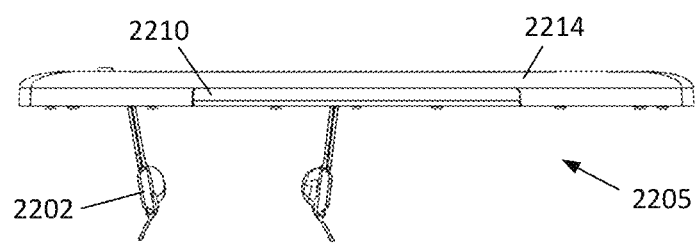

FIGS. 23A-23H show another embodiment of the active cover plate (2205) for double gang light switches. FIG. 23A shows a top view of the active cover plate (2205) with the prongs (2202) extending out from the rear of the plate. FIG. 23B shows a side view of the active cover plate (2205). FIG. 23C shows a front view of the active cover plate (2205) that includes a faceplate (2214) with apertures for connectors (2204), apertures (2206) to accept the toggle light switch handles, and a switch/light sensor cover (2208) in the lower left-hand corner. FIG. 23D shows the opposite side view and FIG. 23E shows a bottom view with the light pipe (2210). In this example, the light pipe is significantly shorter than the light pipe shown in FIGS. 22A-22G. The light pipe in this embodiment is closer to half the overall length of the bottom edge rather than extending across a majority of bottom edge of the face plate.

FIG. 23F shows a rear perspective view of the active cover plate. Visible in this view is the rear surface of the faceplate (2214), the prongs (2202) mounted to the back of the faceplate, the toggle apertures (2206) and the back plate (2212). The back plate may cover/encapsulate the internal circuitry, wiring and may help secure at least some of the prongs in place. As discussed above, the prongs (2202) shown are only illustrative and could have a variety of other configurations.

FIG. 23G shows a front perspective view of the active cover plate (2205). Visible in this view are the toggle apertures (2206) in the faceplate (2214), fastener apertures (2204), switch/light sensor (2208), the shorter light pipe (2210) and some portions of the prongs (2202). FIG. 23H shows another front perspective view that shows the top edge of the active cover plate (2205).

FIGS. 24A-24G are bottom views of the active cover plate (2205) that show a number of exemplary embodiments of the light pipe and prong configurations. Throughout FIGS. 24A-24G, various types, geometries and locations of prongs (2202) and switch/lens covers (2208) are shown to demonstrate that the faceplate (2214), light pipe (2210), prongs (2202) and switch/lens covers (2208) designs are mutually independent and can be combined/configured in a variety of ways. For example, a wide range of light pipe designs can be combined with various prong and switch/lens cover designs.

In FIG. 24A the active cover plate (2205) includes prongs (2202) that are located on the left, the tip of the switch/lens cover (2208) on the right, but there is no light pipe visible. In this embodiment, the light pipe may be located on a different edge of the faceplate (2214) or at least a portion of the material that forms the cover plate may be translucent/transparent. Alternatively, the cover plate may not have a lighting functionality and consequently no light pipe is required. FIG. 24B shows the prongs (2202) mounted on the opposite side of the face plate (2214) of the active plate (2205) and a moderate length light pipe (2210) extending across its bottom edge. As discussed above, the prongs (2202) may be shifted to the opposite side of the plate (2205) to draw power from a different light switch. The switch/lens cover (2208) is on the left.

Figure 24C:
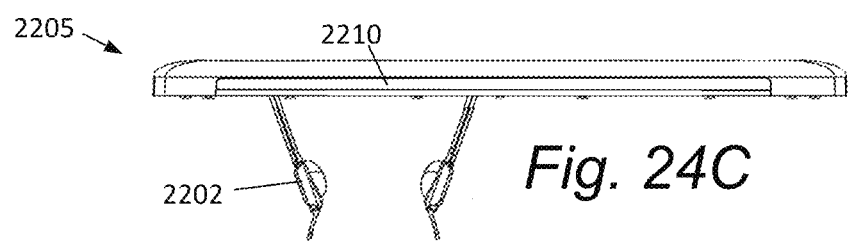
Figure 24D:
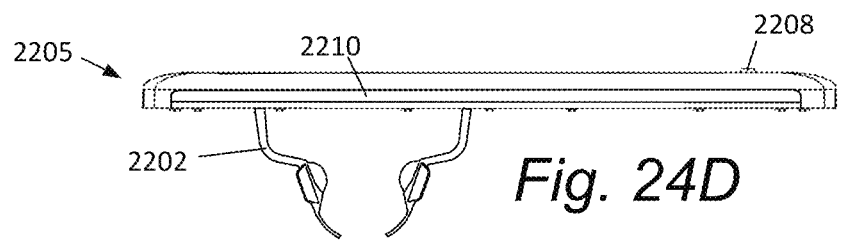
Figure 24E:
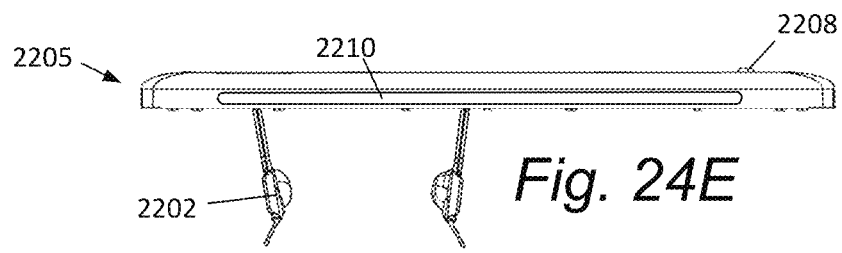

FIG. 24C shows an active cover plate (2205) that includes a longer light pipe (2210) with prongs (2202) on the left that have a different angle than shown above. In general, the angle and position of the prongs (2202) can be selected to contact the broadest range of screw terminals on a target group of electrical receptacles. The switch/lens cover may be present but not visible in this view (see e.g. FIGS. 25A-25E). FIG. 24D shows an active cover plate (2205) with a longer light pipe (2210) with a set of prongs (2202) with an elbow that are on the left. FIG. 24E shows an active cover plate (2205) with prongs (2202) on the left and the switch/lens cover (2208) on the right. In this example, the light pipe (2210) is symmetrical and a different geometry than previous examples. The light pipes may have a range of different shapes and sizes. In this example, the light pipe (2210) has rounded ends.

Figure 24F:
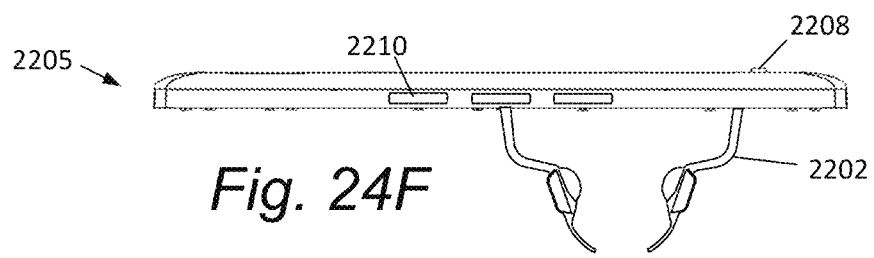
Figure 24G:
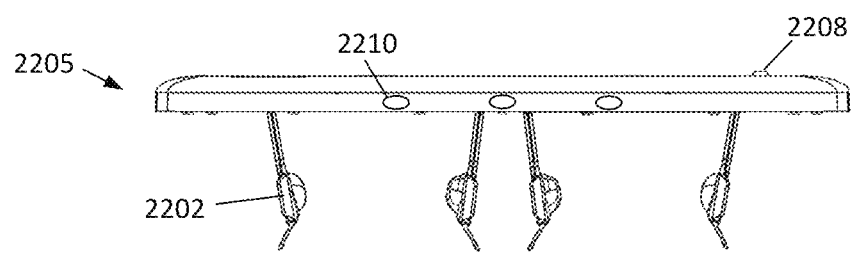

FIG. 24F shows an active cover plate (2205) with a segmented light pipe (2210) along its bottom edge. The light pipe (2210) may have any number of segments and these segments may have any appropriate size, shape and spacing. In this example, both the switch/lens cover (2208) and the rocker style prongs (2202) are on the right. FIG. 24G shows an active cover plate (2205) for a double gang installation with segmented light pipe (2210) that includes three apertures. These apertures may have any shape or size, including round, oval, ovaloid, oblong, elliptical, egg-shaped, ellipsoidal, arched with one or more flat surfaces, rectangular with one side arched, or other shape. This example also shows that the active cover plate (2205) may have any number of prongs (2202), including prongs that surround both apertures of the double gang active cover plate. This may provide a number of advantages, including being able to power the active cover plate from either or both of the light switches it is installed over.

Figure 24H:
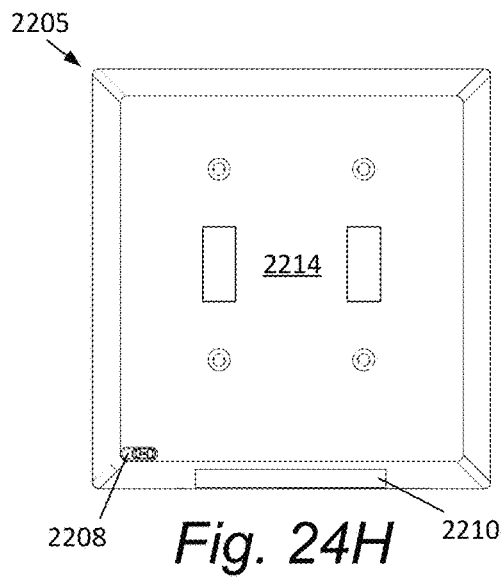
Figure 24I:
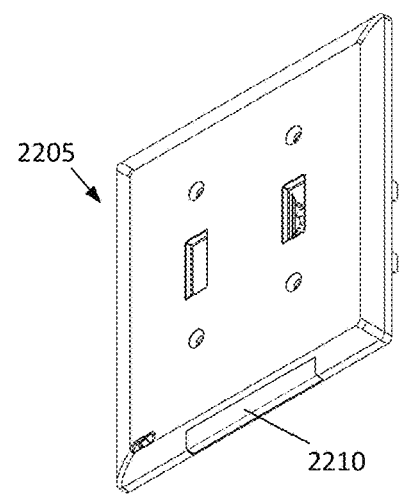
Figure 24J:
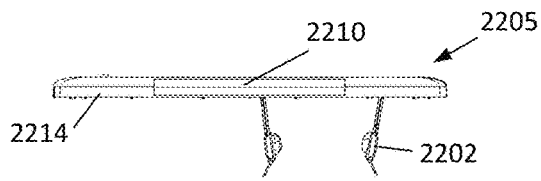

As shown in FIGS. 24A-24G and other figures, the light pipe (2210) design is independent of the prongs (2202) and the style of the active cover plate (2205). Any light pipe design could be used with any style of active cover plate (e.g. outlet, GFCI, rocker, toggle, or other active cover plate design). Any light pipe design could be used with any prong style, number of prongs, or prong configurations, including any prong design that is shown, including prongs with elbows, straight prongs, prongs on the left or right or both, prongs with other designs that are disclosed in documents incorporated by reference herein, future prongs, etc. For FIGS. 24A-24G, additional views of the active cover plates, including top, side, front and back views are shown in other figures (see e.g. FIGS. 22A, 22B, 22C, 22D, 23A, 23B, 23C, 23D, 25A, 25B, 25C, 25D, 27A, 27B, 27D, etc.). These additional figures show and describe the elements shown in FIGS. 24A-24G. FIGS. 24H-24L show additional examples of cover plates with various styles of light pipes. For example, FIGS. 24H-24Q show various views of an active cover plate (2205) with a light pipe (2210) that wraps around the front surface of the faceplate (2214). FIG. 24H shows an active cover plate (2205) with a faceplate (2214) with toggle apertures and a light sensor/switch (2208) on the lower left of the plate. The light pipe (2210) wraps around to the front of the faceplate (2214). This allows for light to be projected at higher angles into the room. This may be desirable in some situations where more uniform illumination throughout the room is preferred. However, these wrap around light pipes may also shine into the user's eyes. Consequently, the light pipes may include textures or be illuminated by multiple LEDs or other larger area light source to avoid hot spots. FIG. 24J shows a bottom view of the cover plate (2205) with the light pipe (2210) and prongs (2202) extending from the back of the faceplate (2214). FIG. 24I shows a front perspective view of the active cover plate (2205) with a wrap around light pipe (2210). Side and top views of the active cover plate are shown in other figures (see e.g. FIGS. 22A, 22B, 22D, 23A, 23B, 23D, 25A, 25B, 25D, 27A, 27B, 27D).

Figure 24K:
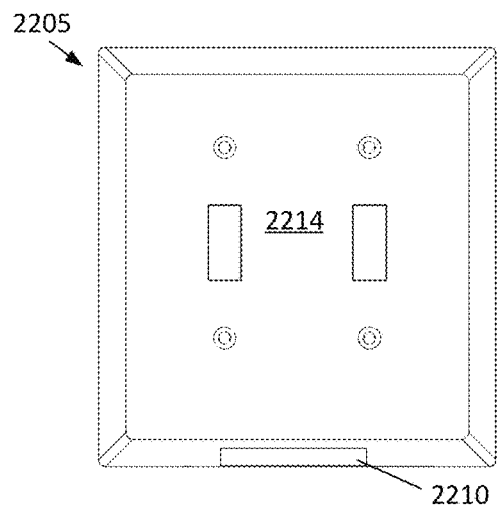
Figure 24L:
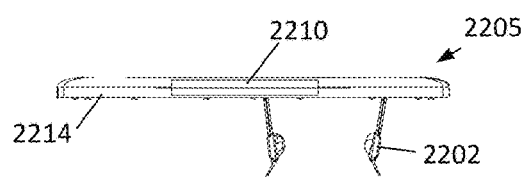

FIGS. 24K and 24L show various views of an active cover plate (2205) with a light pipe (2210) that wraps around the front surface of the faceplate (2214). FIG. 24K shows an active cover plate (2205) with a faceplate (2214) with toggle apertures. The light pipe (2210) wraps around to the front of the faceplate (2214) and is shorter than the light pipe shown in FIGS. 24H, 24I and 24J. As discussed above, the wrapping of the light pipe onto the front surface of the faceplate allows for light to be projected at higher angles into the room. FIG. 24L shows a bottom view of the cover plate (2205) with the light pipe (2210) and prongs (2202) extending from the back of the faceplate (2214). Side and top views of the active cover plate are shown in other figures (see e.g. FIGS. 22A, 22B, 22D, 23A, 23B, 23D, 25A, 25B, 25D, 27A, 27B, 27D). For example, FIGS. 22A, 22B, and 22D show top and side views of the active cover plate. The rear of the active cover plate in this and other examples is not visible during use and many have a variety of configurations.

Figure 24M:
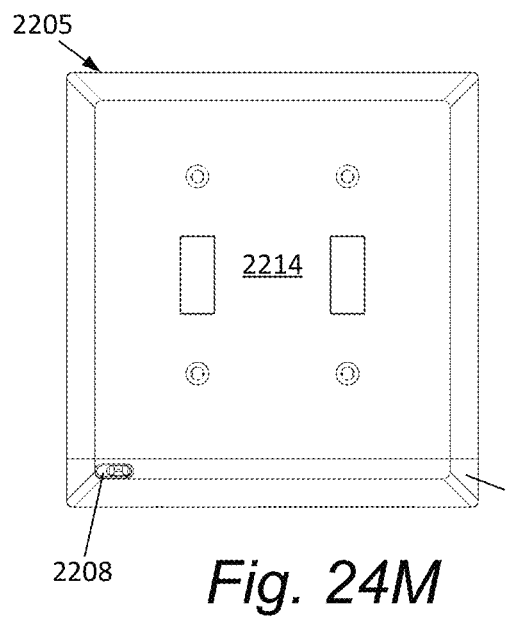
Figure 24N:
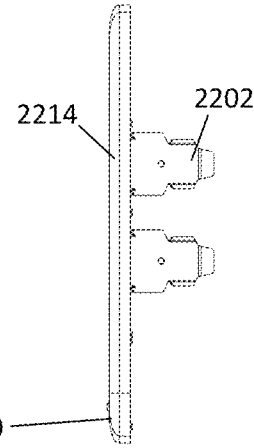
Figure 24O:
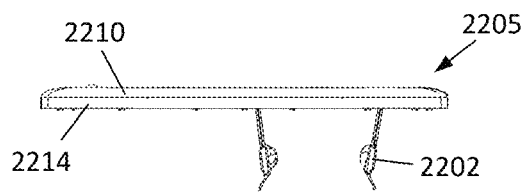

FIGS. 24M-24O show various views of an active cover plate (2205) with a light pipe (2210) that includes/is formed from the bottom portion of the faceplate (2214). For example, the bottom portion of the faceplate (2210) may be transparent or translucent. FIG. 24O shows a bottom view of the cover plate (2205) with the light pipe (2210) and prongs (2202). FIG. 24N shows a right side view of the active cover plate (2205) with the faceplate (2214) and prongs (2202). The left side view may be substantially similar (a mirror image) to the right side view shown in FIG. 24N. The light sensor/switch (2208) labeled in FIG. 24M may or may not be present in all embodiments. Top views of this embodiment are shown in other figures (see e.g. FIGS. 22A, 23A).

Figure 24P:
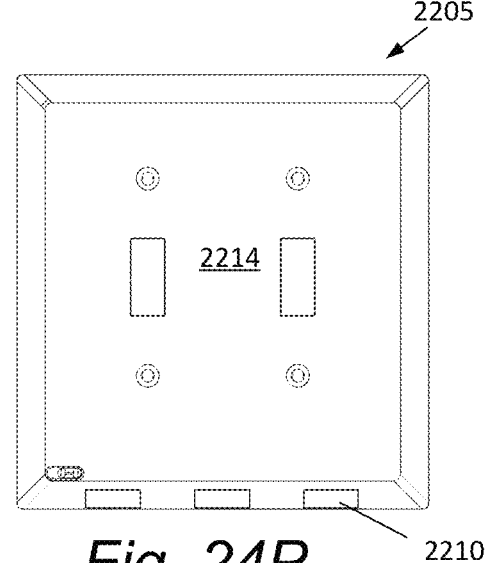
Figure 24Q:
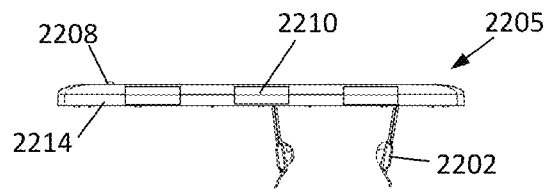
Figure 24R:
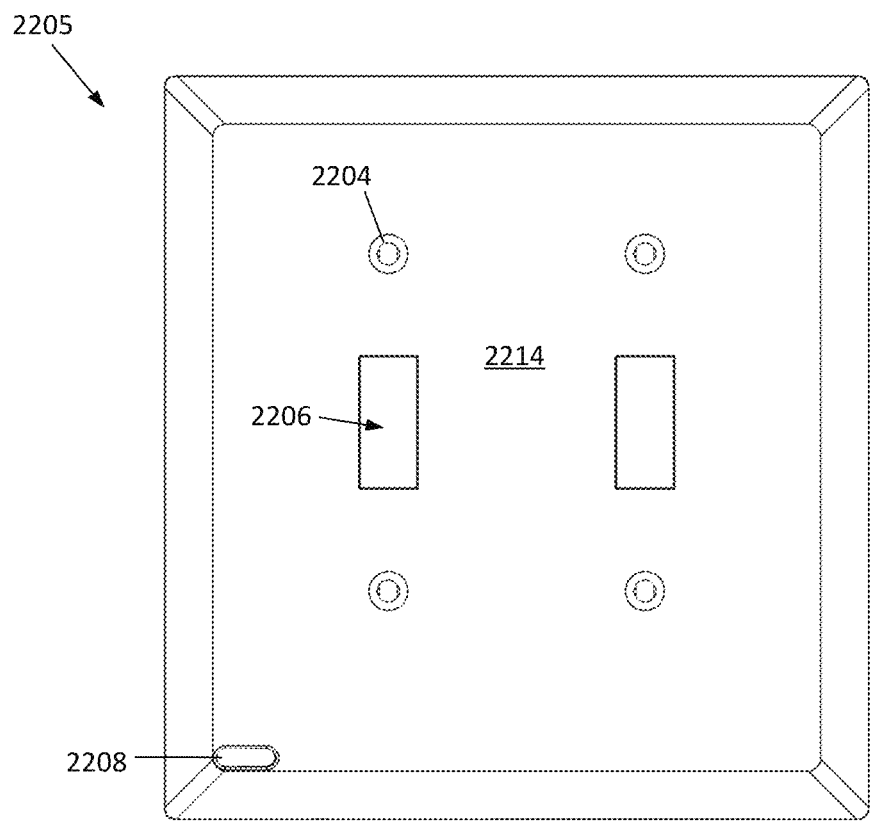

FIGS. 24P and 24Q show various views of an active cover plate (2205) with a segmented light pipe (2210) that wraps around the front surface of the faceplate (2214). FIG. 24P shows an active cover plate (2205) with a faceplate (2214) with toggle apertures. The light pipe segments (2210) wrap around to the front of the faceplate (2214). As discussed above, this allows for light to be projected at higher angles into the room. FIG. 24Q shows a bottom view of the cover plate (2205) with the light pipe (2210) and prongs (2202) extending from the back of the faceplate (2214). Side and top views of the active cover plate are shown in other figures (see e.g. FIGS. 22A, 22B, 22D, 23A, 23B, 23D, 25A, 25B, 25D, 27A, 27B, 27D). For example, FIGS. 22A, 22B, and 22D show top and side views of the active cover plate (2205). The rear of the active cover plate in this and other examples is not visible during use and many have a variety of configurations.

FIG. 24R shows a front view of an active cover plate (2205) with toggle apertures (2206) and fastener apertures (2204) in the faceplate (2214). As discussed above, the light sensor aperture/cover (2208) may have a variety of shapes and locations. In this example, a light sensor aperture/cover/switch (2208) is in the lower left-hand corner of the faceplate and has a generally oval shape. For example, it may take the form of a switch, a lens cover, or a combination of both. The cover (2208) may have any of a variety of three dimensional shapes, including protruding shapes like a dome, flat, or inward shapes such as a concave shape. Other views of this configuration are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24S:
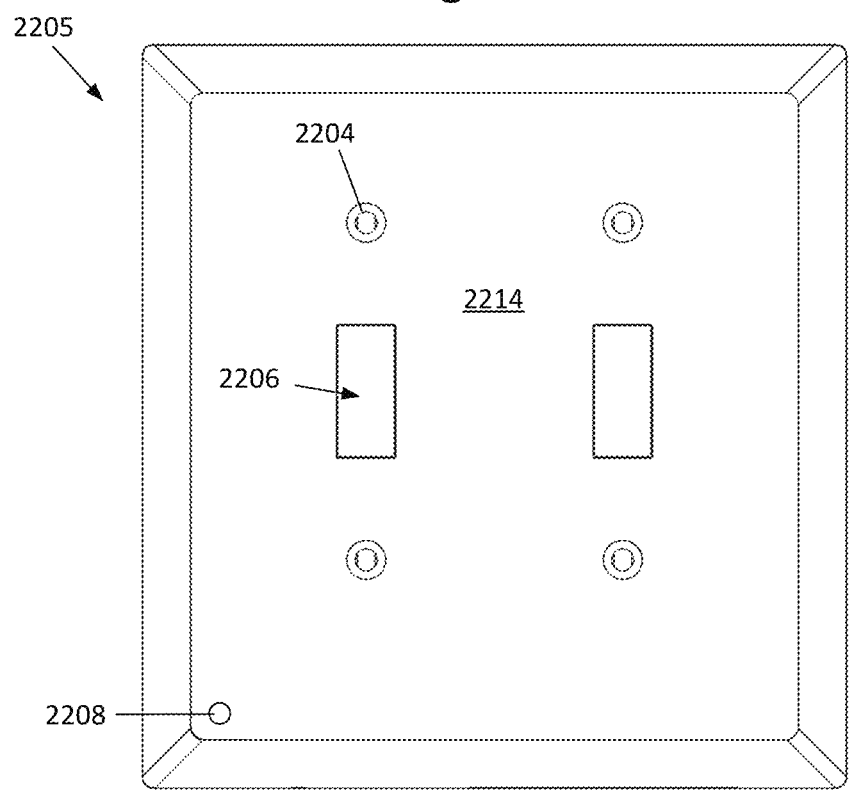

For example, FIG. 24S shows a light sensor aperture/cover (2208) that is round and located in the lower left corner of the face plate (2214), slightly spaced away from the edges. FIG. 24S also shows a front view of an active cover plate (2205) with toggle apertures (2206) and fastener apertures (2204) in the faceplate (2214). Other views of this configuration are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24T:
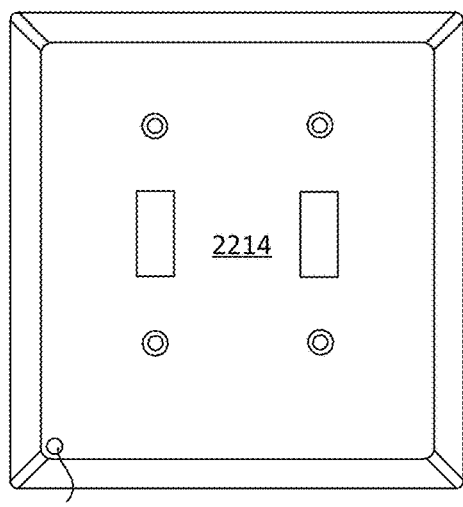
Figure 24U:
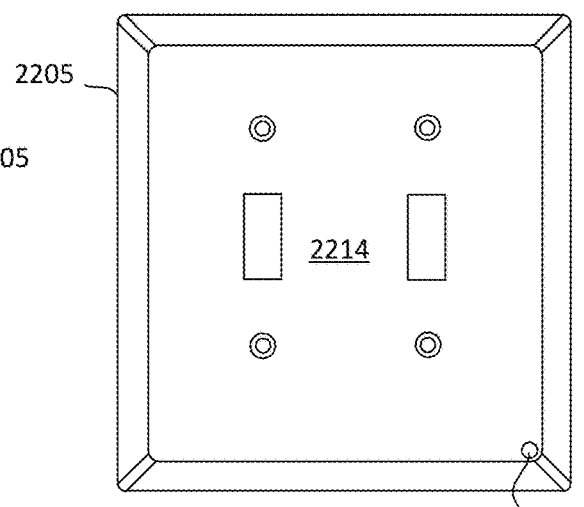
Figure 24V:
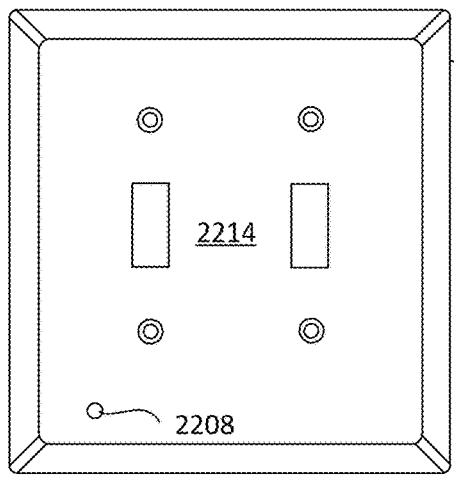
Figure 24W:
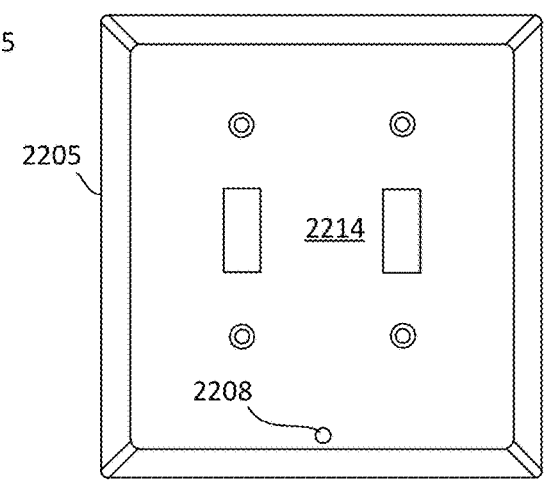

FIGS. 24T-24Y show various other exemplary embodiments of an active cover plate (2205) with a light sensor/switch/lens cover or other apertures (2208) in the faceplate. FIG. 24T shows a slightly larger round aperture/cover (2208) in the faceplate (2214) that is proportionally located closer to the rounded corner of the active cover plate (2205). FIGS. 24U, 24V, and 24W show the round aperture/cover in various locations on the active cover plates (2205). FIG. 24U shows the round aperture/cover (2208) in the opposite corner of the faceplate (2214). FIG. 24V shows an active cover plate (2205) with a round aperture/cover (2208) spaced away from the edges of the faceplate (2214). This may accommodate circuit boards with light sensors in various other locations. FIG. 24W shows the round aperture/cover (2208) in the center region of the faceplate (2214) of the active cover plate (2205). Other views of these configurations are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24X:
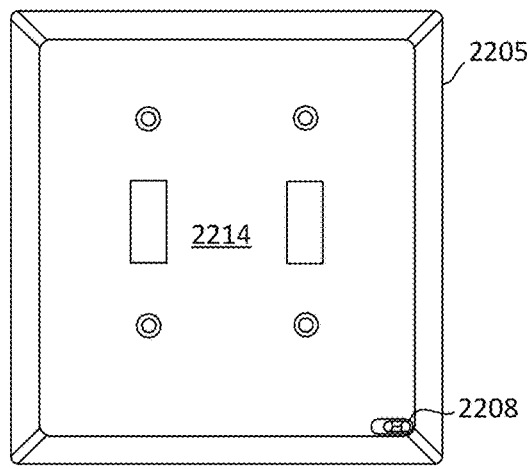
Figure 24Y:
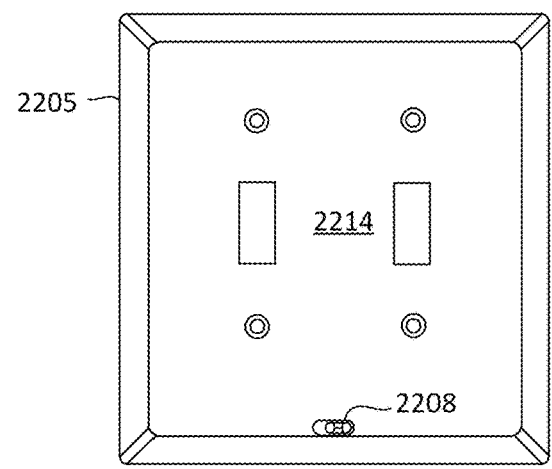

FIGS. 24X and 24Y show an active cover plate with the switch cover/light sensor aperture (2208) located at various locations along the lower portion of the faceplate (2214). Additional views of these configurations are shown in other figures. For example, top, left side, right side, bottom and rear views are shown in FIGS. 23A, 23B, 23D, 23E, and 23F respectively. Alternative bottom views are shown in FIGS. 24A-24G, with the exceptions that the switch/cover (2208) may be absent or have a different configuration or location and the prongs (2202) may have a variety of other configurations.

Figure 24Z:
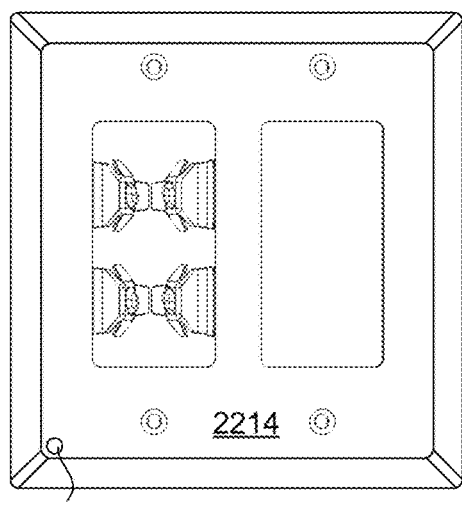
Figure 24A:
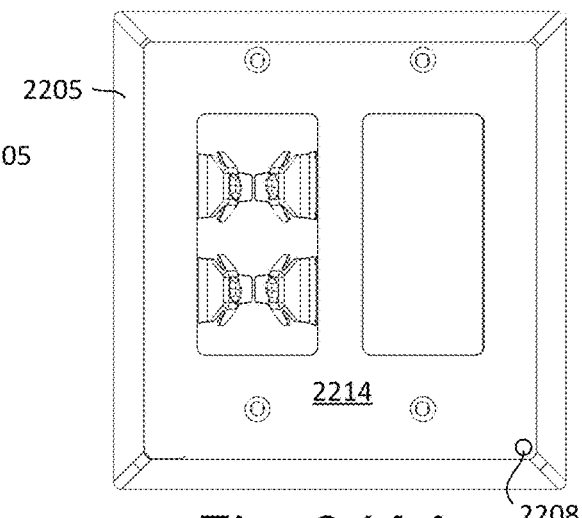
Figure 24A:
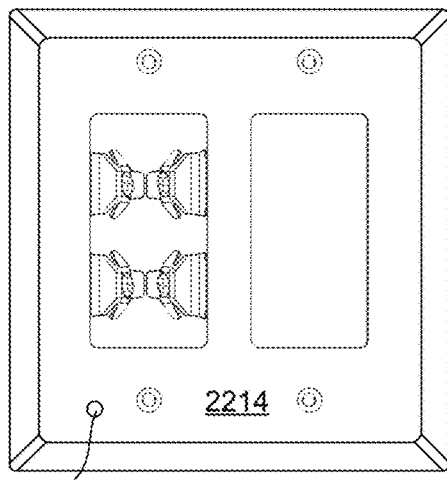
Figure 24A:
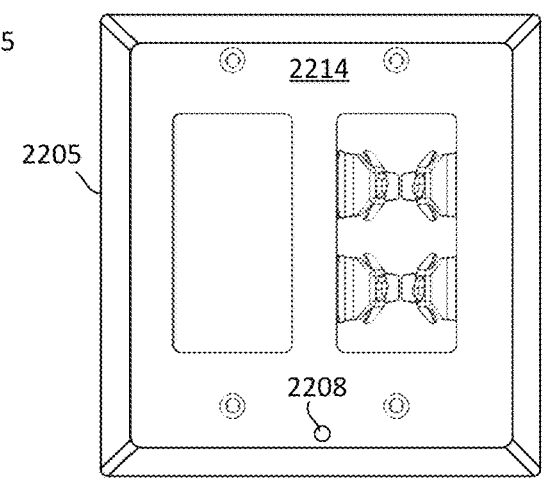
Figure 24A:
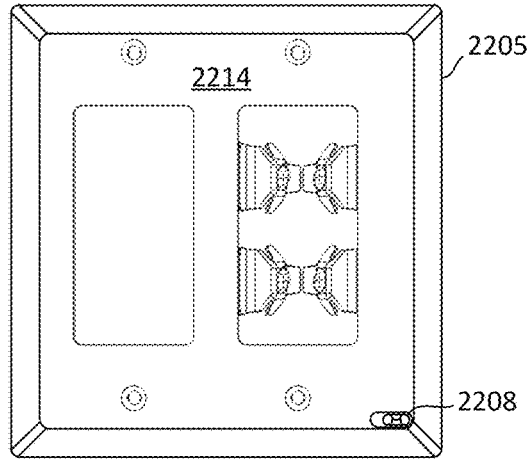
Figure 24A:
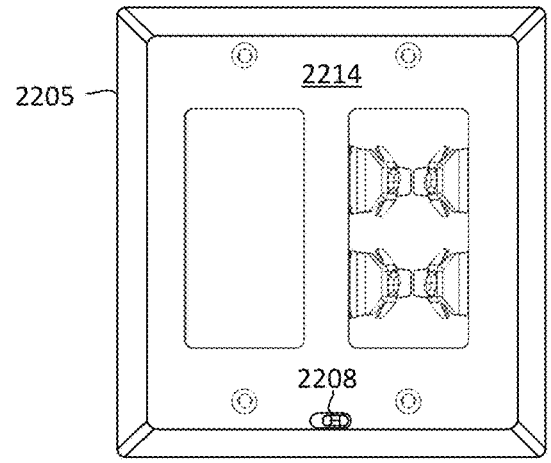
Figure 25F:
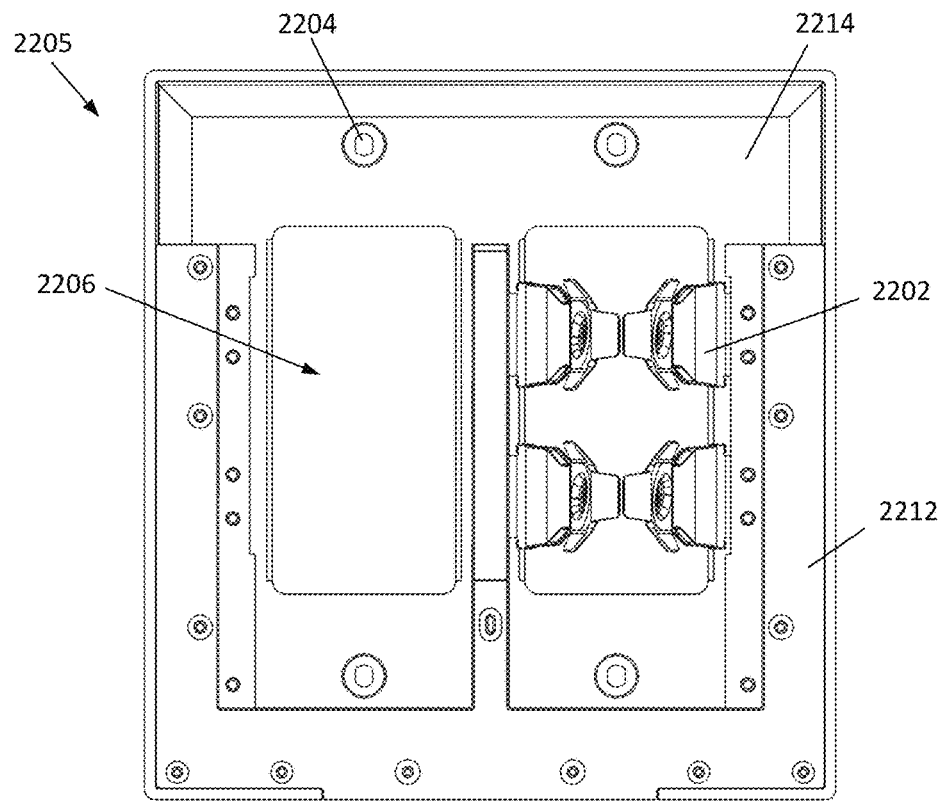
Figure 25G:
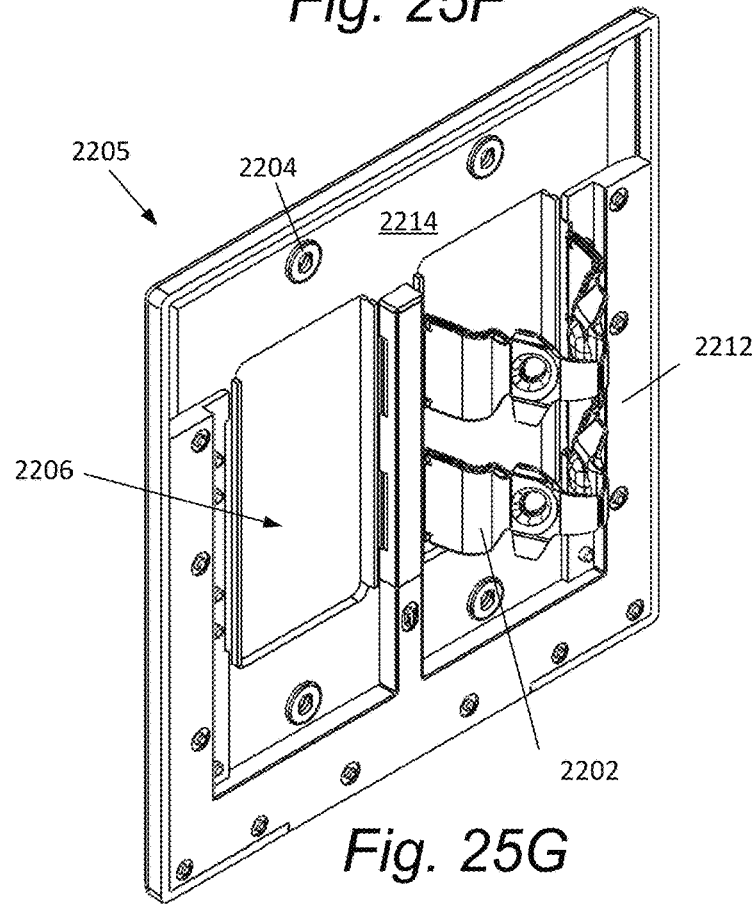

FIGS. 24Z-24AE are front views of various illustrative active cover plate (2205) configured for double gang rocker light switch installations. FIG. 24Z shows a front view of an active cover plate (2205) with rocker apertures and fastener apertures in the faceplate (2214). In this example, the light sensor aperture/cover (2208) is round and in the lower left-hand corner. As discussed above, the light sensor aperture/cover (2208) may have a variety of shapes and locations. Other views of this embodiment are shown in various other figures. For example, FIG. 25A is the top view, FIGS. 25B and 25D are side views, and FIG. 25E is one example of a bottom view. FIGS. 25F and 25G are examples of rear views. Alternative bottom views are shown in FIGS. 24A-24G, with the exceptions that the switch/cover (2208) may be absent/have a different configuration/location and the prongs (2202) may have a variety of configurations.

Figure 26A:
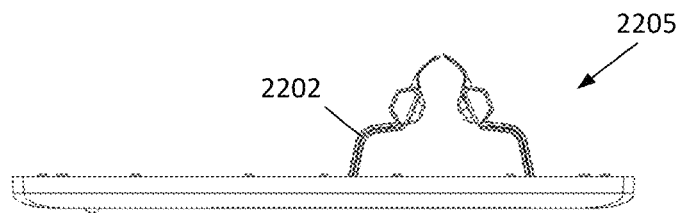
Figures 26B, 26C, 26D:
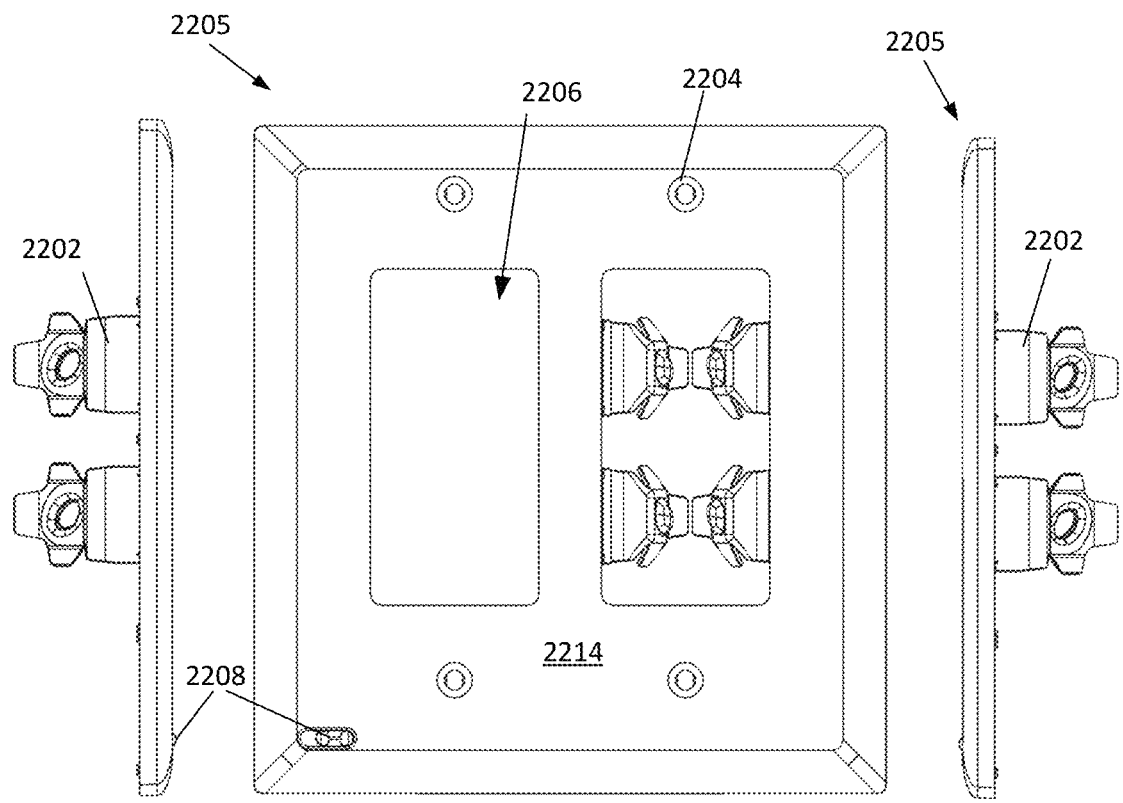
Figure 26E:
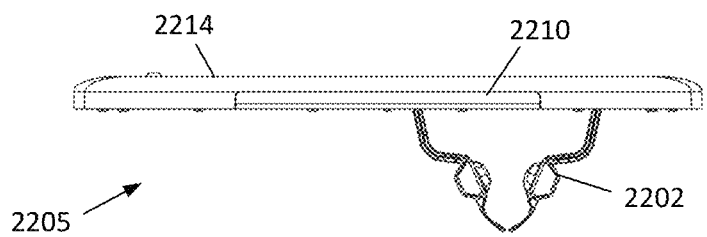
Figure 26F:
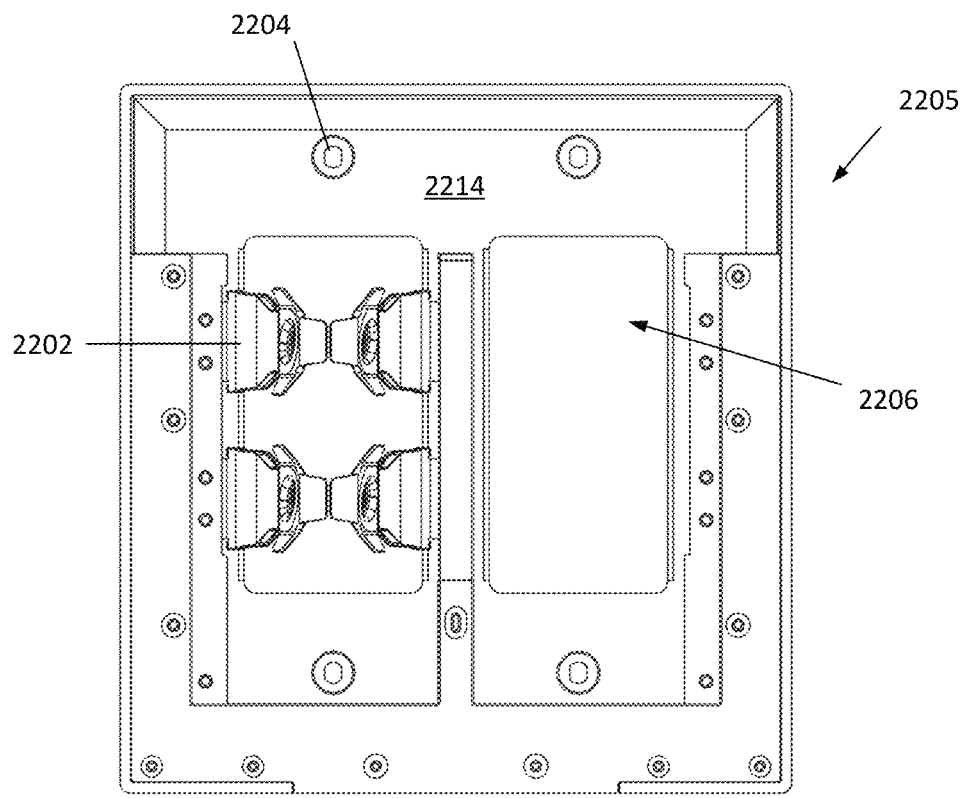
Figure 26G:
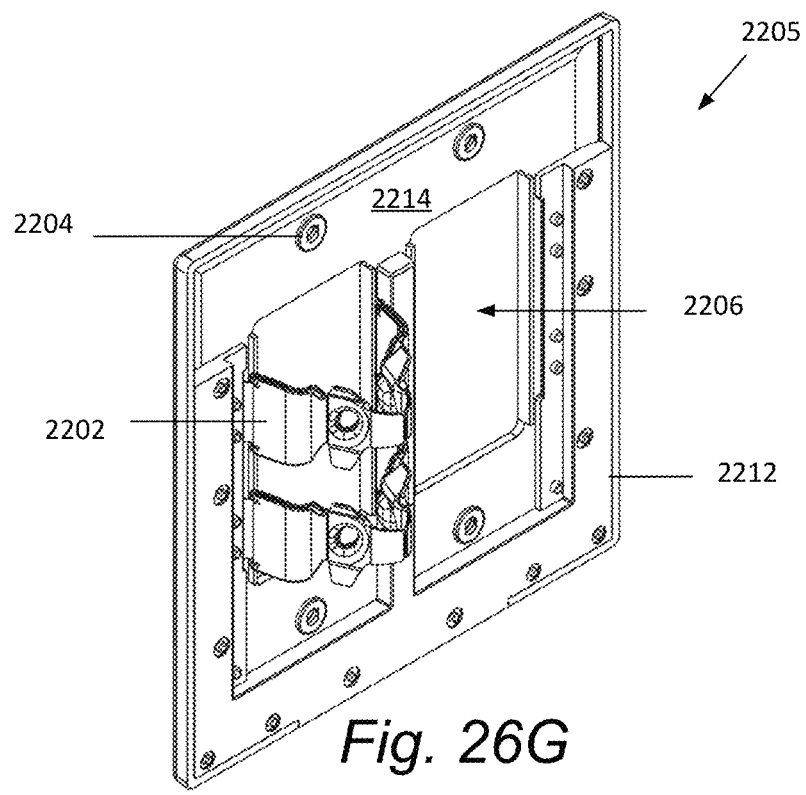

FIG. 24AA shows an active coverplate (2205) with a light sensor aperture/cover (2208) that is round and located in the lower right corner of the faceplate (2214), slightly spaced away from the edges. FIGS. 24AB-24AE show active cover plates (2205) with various other exemplary embodiments of light sensor or other apertures. FIG. 24AB shows a cover plate (2205) with the round aperture/cover (2208) spaced away from the edges of the faceplate (2214). This may accommodate circuit boards with light sensors in various other locations. FIG. 24AC shows the round aperture/cover (2208) in the center of the bottom edges of the active cover plate (2208). FIGS. 24AD and 24AE show the switch cover/light sensor aperture (2208) located at various locations along the lower portion of the face plate (2214). Other views of this embodiment are shown in various other figures. For example, FIG. 26A is the top view, FIGS. 26B and 26D are side views, and FIG. 26E is one example of a bottom view. FIGS. 26F and 26G are examples of rear views. Alternative bottom views are shown in FIGS. 24A-24G, with the exceptions that the switch/cover (2208) may be absent/have a different configuration/location and the prongs (2202) may have a variety of configurations.

FIGS. 25A-25I show one illustrative embodiment of an active cover plate (2205) for double gang rocker switches. FIG. 25A shows a top view of the active cover plate (2205) with the prongs (2202) extending out from the rear of the plate. FIG. 25B shows a side view of the active cover plate (2205) with prongs (2202) extending rearward. FIG. 25C shows a front view of the active cover plate (2205). In this embodiment, the active cover plate includes a faceplate (2214) with apertures for connectors (2204) and large rectangular apertures (2206) to accept the rocker light switch paddles. The prongs (2202) are shown through the left aperature. This example shows a switch/light sensor cover (2208) in the lower left-hand corner. As discussed herein, the switch cover/light sensor aperture may a variety of shapes and locations.

FIG. 25D shows the opposite side view and FIG. 25E shows a bottom view of the active cover plate (2205) with prongs (2202) and with the light pipe (2210). As discussed above the light pipe allows for light from the LEDs to be conducted out of the active cover plate. The light pipe (2210) could have a variety of different shapes and sizes. In this example, the light pipe (2210) has a length that extends across only a portion of the bottom edge of the faceplate (2214). As explained previously, the light pipe (2210) can have a range of sizes and configurations.

Figure 25H:
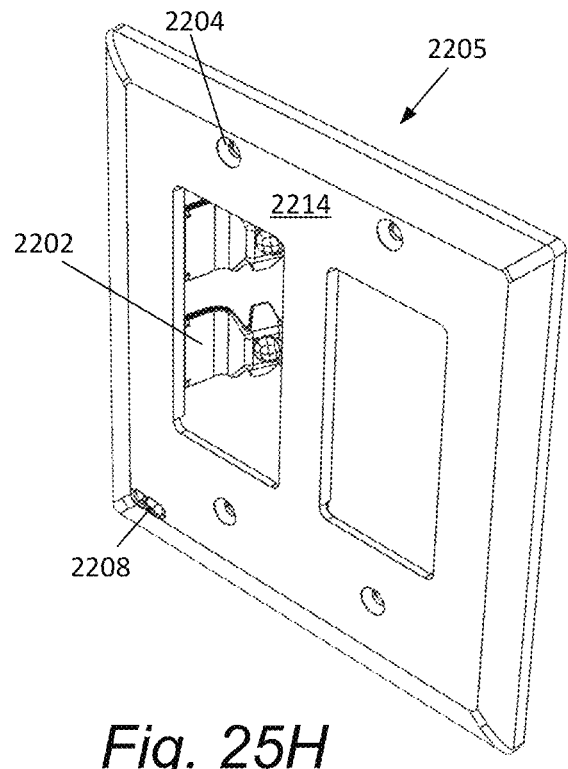
Figure 25I:
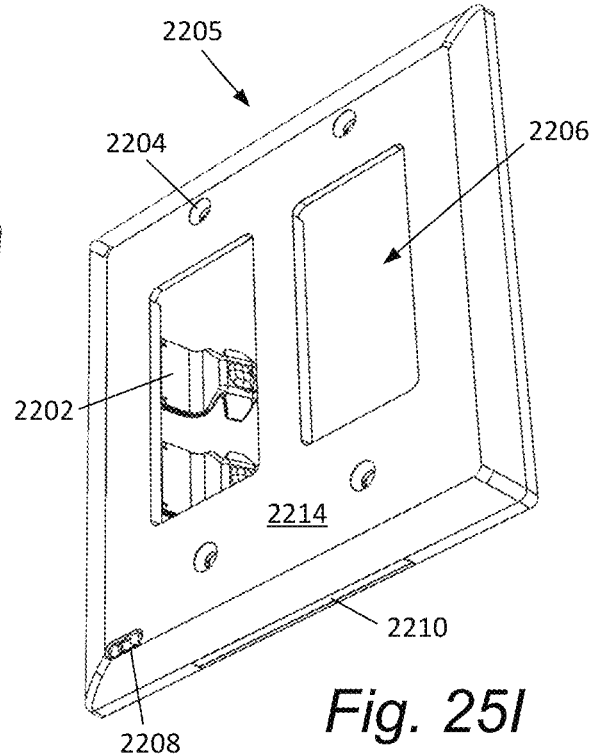
Figure 25J:
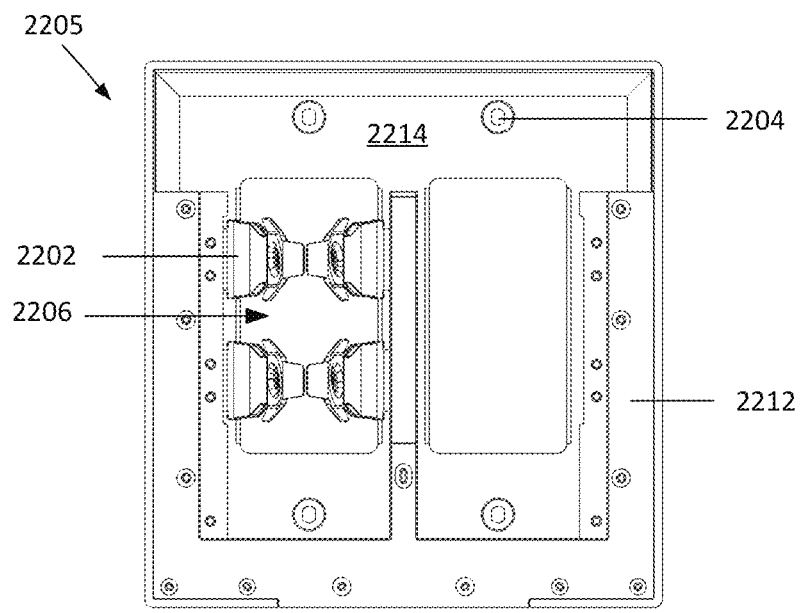

FIGS. 25F-25J show various views of the active cover plate (2205). FIGS. 25F-25G show a rear view and a rear perspective view, respectively. Visible in these views is the rear surface of the faceplate (2214), the prongs (2202) mounted to the back of the faceplate, and the back plate (2212). The back plate (2212) covers/encapsulates the internal circuitry, wiring and helps secure at least some of the prongs in place. Also shown are the fastener apertures (2204) and the apertures (2206) to accept the light switch rocker. The prongs (2202) shown in the figures are only illustrative and could have a variety of other configurations. FIGS. 25H and 25I show front perspective views of an embodiment of the active cover plate (2205) with a switch handle (2208) that may protrude out of the faceplate (2214). Also shown are apertures (2206) for the rocker switches and apertures for the fasteners (2204) with prongs (2202) extending rearward from the faceplate (2214). The light pipe (2210) is shown on the bottom side of the faceplate in FIG. 25I. FIG. 25J shows an embodiment of the faceplate with the prongs (2202) surrounding the opposite aperture (2206) of the faceplate (2214). This view and other views also show the back plate (2212) and fastener apertures (2204).

FIGS. 26A-26I show one illustrative embodiment of an active cover plate (2205) for double gang light rocker switches with the prongs (2202) on the right-hand side when viewing the active cover plate (2205) from the front. This allows power to be extracted from the right-hand switch in the double gang light switch installation instead of from the left-hand switch (see e.g. the embodiment shown in FIGS. 25A-25I). FIG. 26A shows a top view of the active cover plate (2205) with the prongs (2202) extending out from the rear of the faceplate. FIG. 26B shows a side view of the active cover plate (2205) and prongs (2202). FIG. 26C shows a front view of the active cover plate (2205) and prongs (2202). In this embodiment, the active cover plate includes a faceplate (2214) with apertures for connectors (2204) and large rectangular apertures (2206) to accept the rocker light switch paddles. This example shows a switch/light sensor cover (2208) in the lower left-hand corner. As discussed above, the switch cover/light sensor aperture may a variety of shapes and locations.

FIG. 26D shows the opposite side view of the active cover plate (2205) and prongs (2202). FIG. 26E shows a bottom view of the active cover plate (2205) with prongs (2202) and a light pipe (2210). As discussed above the light pipe allows for light from the LEDs to be conducted out of the active cover plate. The light pipe (2210) could have a variety of different shapes and sizes. In this example, the light pipe (2210) has a length that extends across only a portion of the bottom edge of the face plate (2214).

Figure 26H:
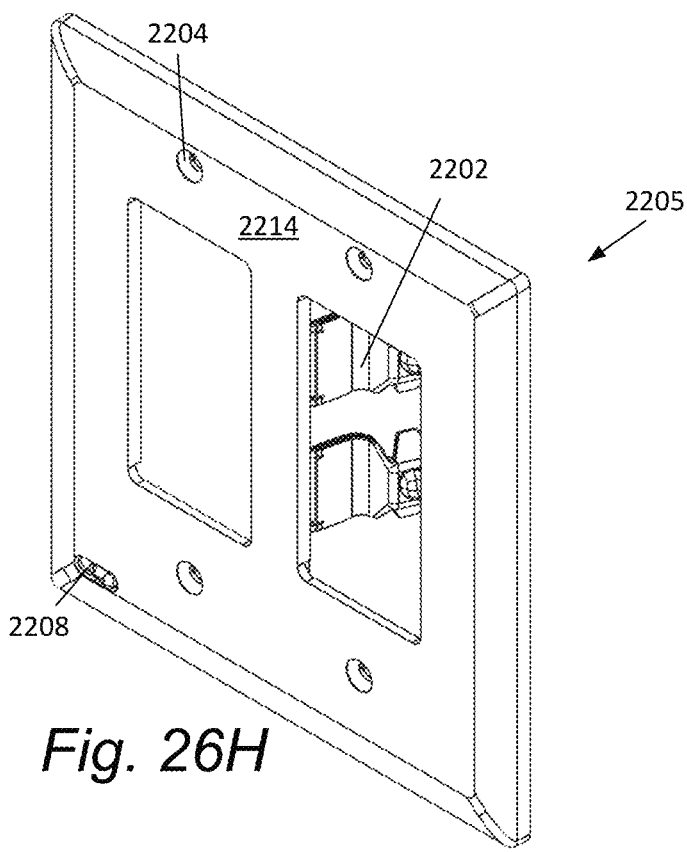
Figure 26I:
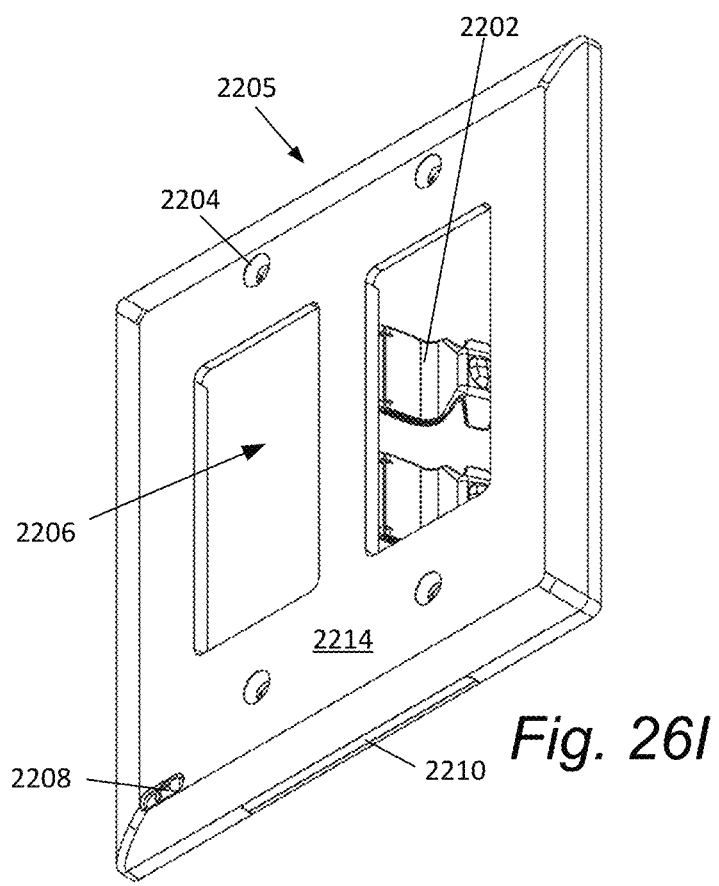

FIGS. 26F-26I show various views of the active cover plate (2205). FIGS. 26F-26G show, respectively, a rear view and a rear perspective view of the active cover plate (2205). Visible in these views are the rear surface of the faceplate (2214), the prongs (2202) mounted to the back of the faceplate and the back plate (2212). The back plate (2212) covers/encapsulates the internal circuitry, wiring and helps secure at least some of the prongs in place. The prongs (2202) shown are only illustrative and could have a variety of other configurations. FIGS. 26H and 26I show front perspective views of the active cover plate (2205) with apertures (2206) through which the prongs (2202) are visible. Also shown are the connector apertures (2208) in the faceplate (2214) The switch/lens cover/light sensor aperture (2208) on the lower left of the faceplate and the light pipe (2210, FIG. 27I) is shown along the lower edge of the faceplate (2214).

Figure 27A:
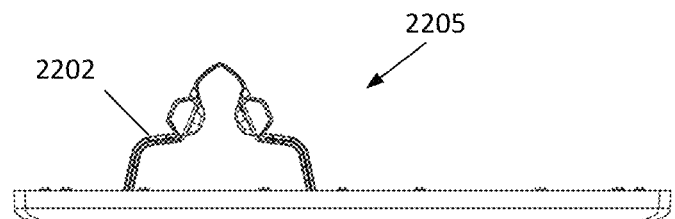
Figures 27B, 27C, 27D:
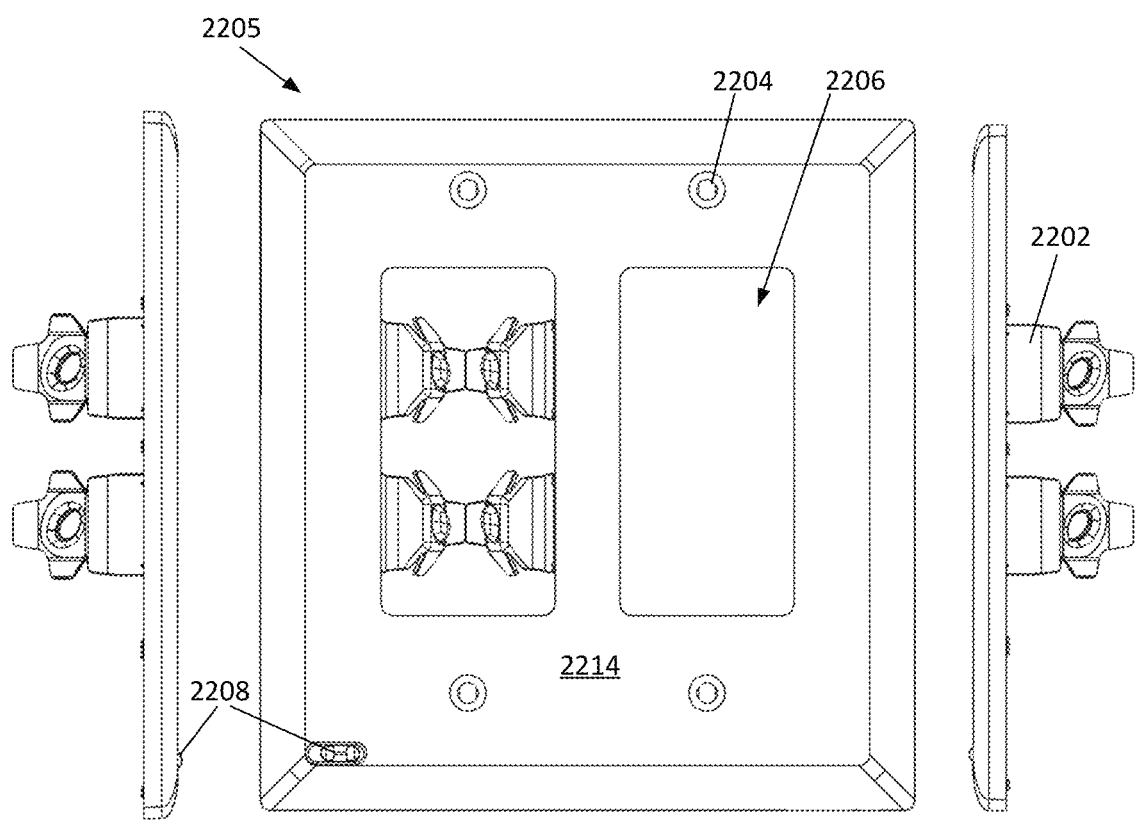

FIGS. 27A-27I show one illustrative embodiment of an active cover plate (2205) for double gang rocker switches with the prongs (2202) on the left-hand side when viewing the active cover plate from the front. This allows power to be extracted from the left-hand switch in the double gang light switch installation instead of from the right-hand switch (compare the embodiment shown in FIGS. 26A-26I). FIG. 27A shows a top view of the active cover plate (2205) with the prongs (2202) extending out from the rear of the plate. FIG. 27B shows a side view of the active cover plate (2205) with a portion of the switch/sensor cover (2208) extending from the faceplate. FIG. 27C shows a front view of the active cover plate (2205). In this embodiment, the active cover plate includes a faceplate (2214) with apertures for connectors (2204) and large rectangular apertures (2206) to accept the rocker light switch paddles. This example shows a switch/light sensor cover (2208) in the lower left-hand corner. As discussed above, the switch cover/light sensor aperture may have a variety of shapes and locations.

Figure 27E:
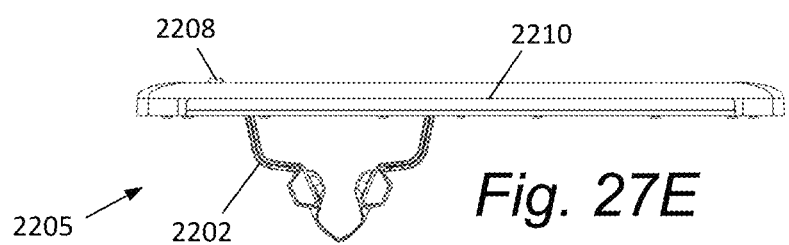

FIG. 27D shows the opposite side view of the active cover plate (2205) with prongs (2202) and FIG. 27E shows a bottom view with the light pipe (2210), prongs (2202), and sensor cover/switch (2208). As discussed above the light pipe allows for light from the LEDs to be conducted out of the active cover plate. The light pipe (2210) could have a variety of different shapes and sizes. In this example, the light pipe (2210) has a length that extends across a substantial portion of the bottom edge of the face plate (2214).

Figure 27F:
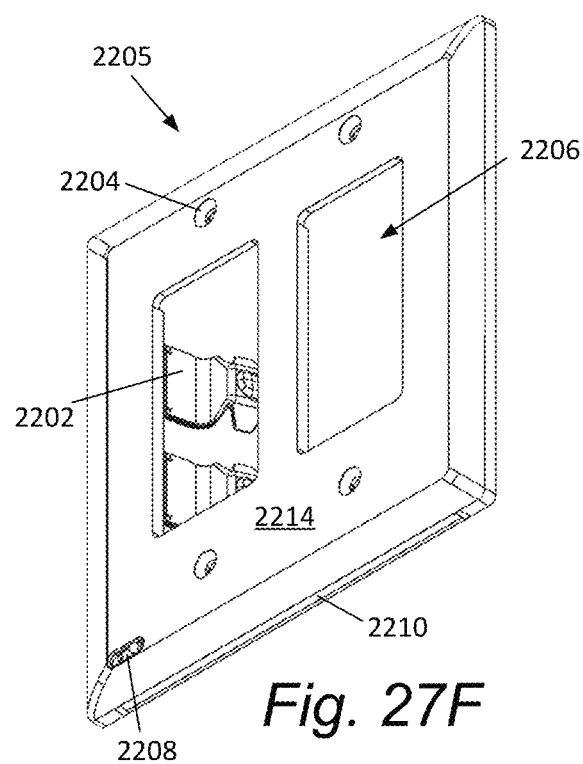
Figure 27G:
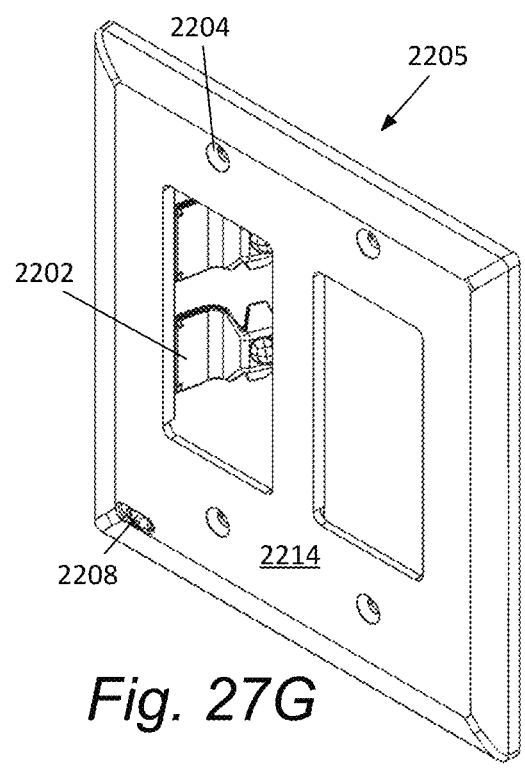
Figure 27H:
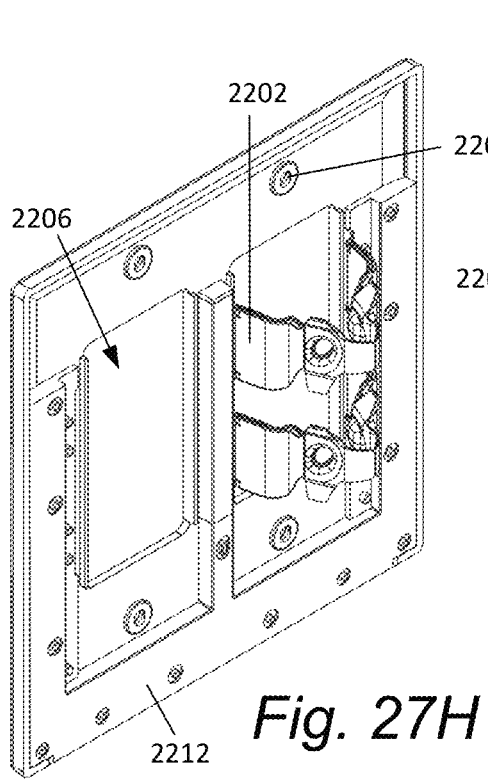
Figure 27I:
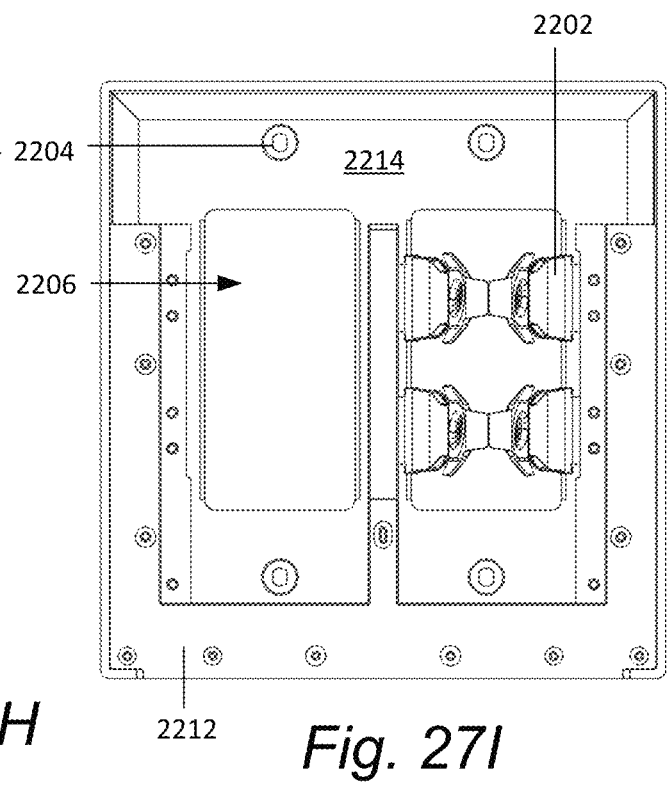

FIGS. 27F-27I show various views of the active cover plate (2205). FIGS. 27F and 27G show front perspective views of the active cover plate (2205). FIGS. 27H-27I show a rear perspective and rear views of the active cover plate (2205), respectively. Visible in these views the switch/sensor cover/lens (2208), the prongs (2202) mounted to the back of the faceplate (2214) around the apertures (2206), the light pipe (2210, FIG. 27F) and the back plate (2212, FIGS. 27H, 27I). Fastener apertures (2204) are configured to accept fasteners to hold the active cover plate in place over the electrical receptacle installation.

Figure 28A:
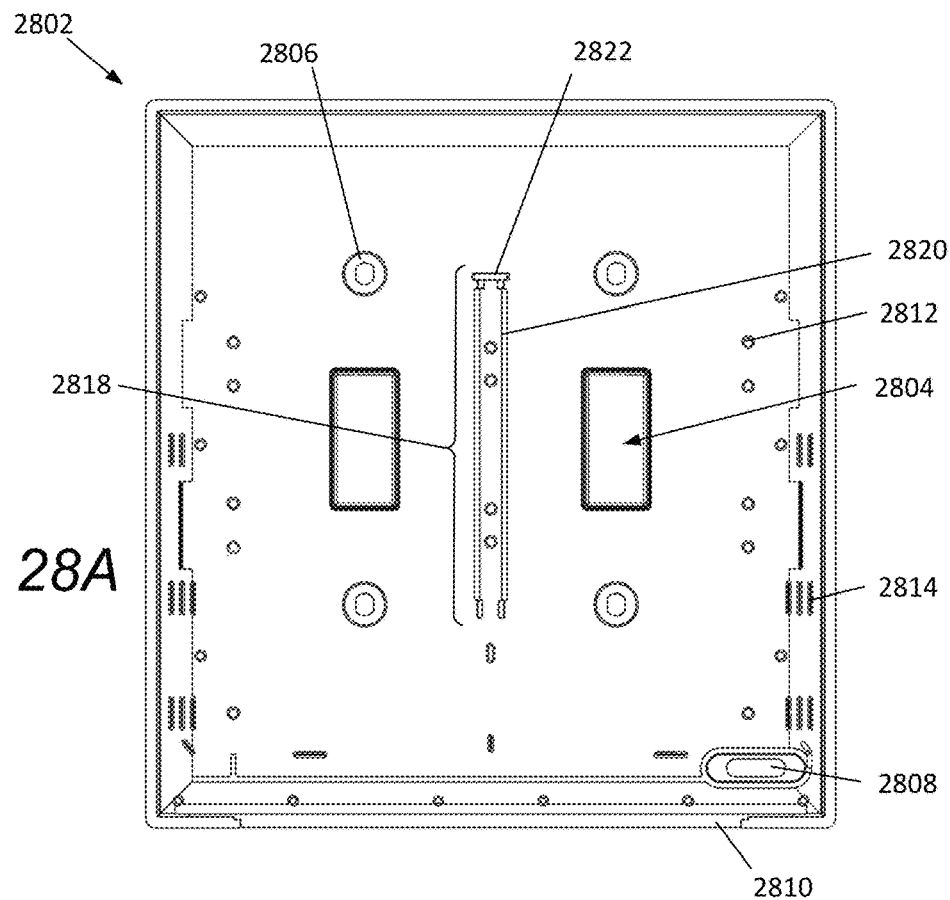

FIGS. 28A-28H show one illustrative example of an active cover plate design that allows for prongs to be selectively placed on either the right or the left side of a double gang active cover plate. As discussed above, these different configurations can allow the power to be drawn from either the right or the left light switch. FIG. 28A shows a face plate (2802) for double gang toggle active cover plate. The faceplate (2802) includes apertures (2804) for the toggle pieces to extend through, fastener apertures (2806) for the fasteners to pass through, a light pipe aperture (2810) and a sensor aperture (2808). In this illustrative example, the faceplate (2802) further includes a variety of posts (2812) that can be used to secure the prongs, back plate, circuit board, or other elements. There is a central prong attachment area (2818) that includes an end block (2822) and several channels (2820). These features in the central prong attachment area (2818) are designed to secure prongs in the central portion of the faceplate. There may also be a number of wire routing features (2814) that are included (these features are discussed with respect to FIGS. 29A-29I).

Figure 28B:
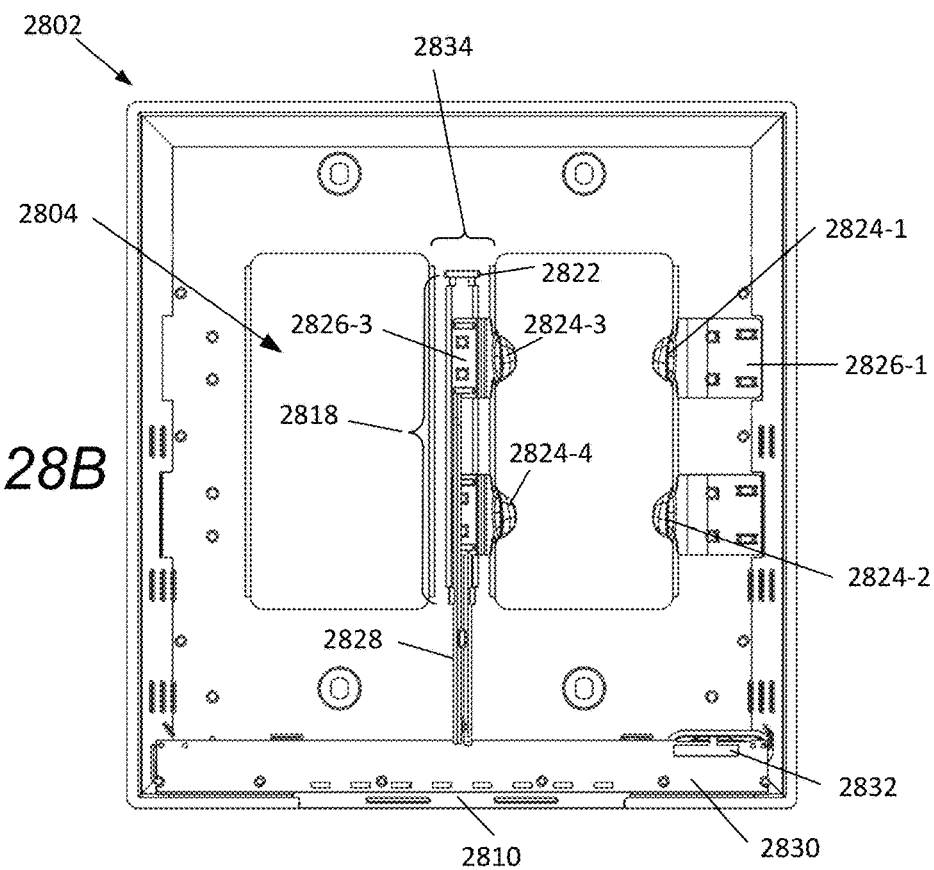

FIG. 28B shows a different embodiment of the faceplate (2802). In this embodiment, the faceplate is configured to be used as part of an active cover plate for a double gang rocker switch installation. The faceplate (2802) includes two larger apertures (2804) that allow the rocker paddles of the rocker light switches to extend through the faceplate and be accessible for manual manipulation. In between the two apertures (2804) there is a thin central bar (2834). The central prong attachment area (2818) is located on the thin central bar (2834).

Figures 28F, 28G:
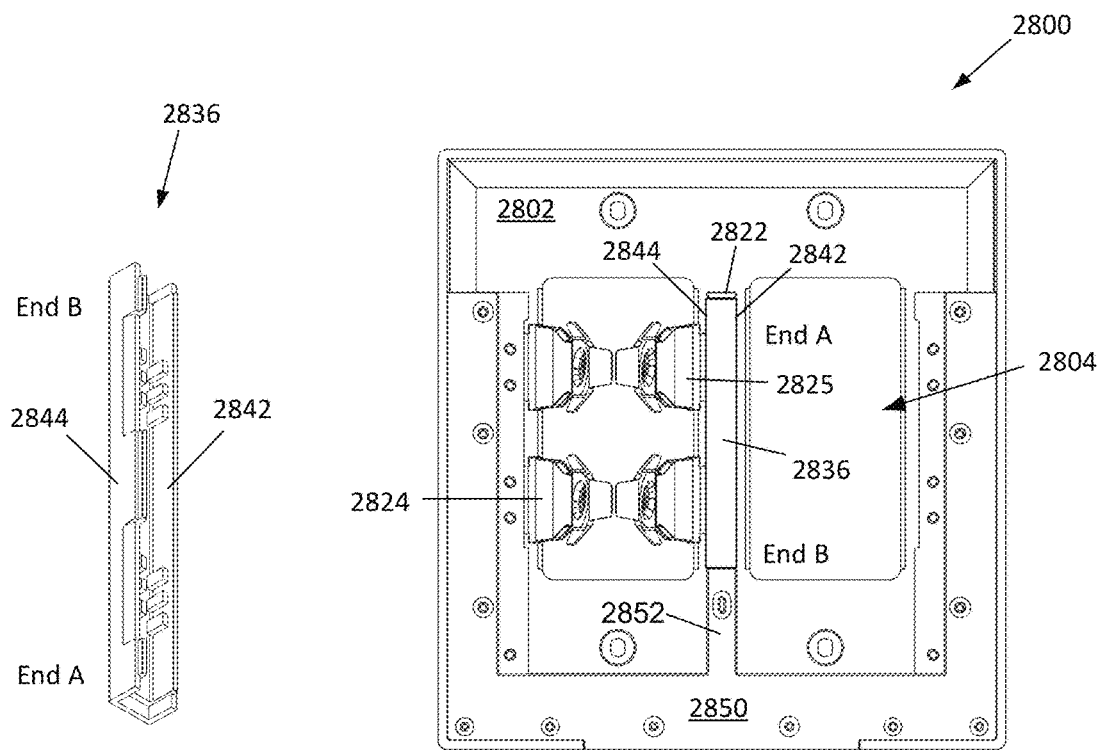

In this example, bases (e.g. 2826-1, 2826-3) of prongs (2824-1, 2824-1, 2824-3, 2824-4) are connected over posts (e.g. 2812, FIG. 28A). The prongs are located on the right side of the faceplate when viewing the faceplate from the back as shown in FIG. 28A. The prongs (2824-1, 2824-2) on the outboard side of the faceplate (2802) have a relatively large surface area on the faceplate to make a connection between the base of the prongs and the rear surface of the faceplate. However, the prongs (2824-3, 2824-4) that are located on the thin central bar (2834) have significantly less room to make the connection. Further, forces exerted by these prongs may cause deformation of the thin central bar (2934) unless it is reinforced. To address these issues, the prong bases (e.g. 2826-3) of the inboard prongs (2824-3, 2824-4) are significantly reduced so that the bases will fit in the central prong attachment area (2818) on the thin central bar (2834). Wires (2828) are shown connected to the two inboard prongs (2824-3, 2824-4) and connected to the circuit board (2830). A switch (2832) is also shown attached to the circuit board. Wires would also be connected to the outboard prongs (2824-1, 2824-2) but these wires are not shown in this figure. This embodiment is only illustrative of one of the many different ways the principles described could be implemented. For example, a variety of different prong types and numbers of prongs could be used. For example, one, two, three, four, five, six, seven, or more prongs could be used. The types of prongs could vary. For example, FIG. 28G shows different prongs that those shown in FIG. 29B.

FIG. 28C shows a U-shaped channel (2836) that is configured to be attached over and joined to the central prong attachment area (2818, FIG. 28A, 28B). The U-shaped channel (2836) may be designed to secure both of the inboard prongs to the faceplate, to reinforce the thin bar in the central portion of the face plate and be reconfigurable to allow for inboard prongs to be secured to and extend from either the right or the left of the thin bar (2834, FIG. 28B). In this example, the U-shaped channel (2836) includes a solid side (2842), a slotted side (2844), a number of hold down blocks (2840), and one or more sonic welding features (2846). Additionally, the channel may include recessed areas (2848) on either end. These recessed areas are designed to accept the end block (2822) molded into the face plate. Depending on which way the channel is oriented with respect to the faceplate the end block will fit in one or the other of the recessed areas (2848).

This is only one example of a channel that could be used. There could be a range of variations that could be used. For example, instead of multiple hold down blocks (2840), there could be only one. The channel could have a variety of shapes instead of a U shape, including rectangular, square, pyramidal, arched, or other shape. Instead of using sonic welding to secure the channel to the face plate a variety of other techniques could be used, including adhesive, cold or hot pressing, friction fit, snap fit or other suitable connection technique. Instead of having slots on one side, the channel could have slots on both sides or may not have slots at all.

FIG. 28D shows an end view of the illustrative U-shaped channel (2836), looking down its length. The hold down blocks (2840) are seen extending inward from the sides (2842, 2844; FIG. 28C) and the sonic welding features (2846) are shown extending downward from the sides.

FIG. 28E shows a cross section of the U-shaped channel (2836) connected to the faceplate (2802) and securing the prong base (2826) over the posts (2812). In this example, the sonic welding features extend into the channels (2820) in the face plate (2802). The sharp ridges of the sonic welding features are melted and joined to the face plate (2802) by the sonic welding process. The hold down blocks (2840) press downward on the upper surface of the prong base (2826) and push it against the surface of the faceplate and secure the prong base over the posts (2812). In this example, the slotted side (2844) of the channel is on the left side (as shown in the drawing) and the unslotted side (2842) is on the right side. The slots allow for the prong to extend out of the channel and upward/rearward from the face plate.

Thus, in this example, the channel (2836) secures the inboard prongs to the faceplate and, as shown in later drawings, can be reversed to allow for the prongs to be assembled and secured on the opposite side. Further, because of the channels relatively large cross section, greater moment of inertia, and secure connection with the faceplate, the channel may significantly reinforce the thin bar in the central portion of the faceplate. This can be important because the prongs may generate a substantial amount of spring force as they contact the screw terminals of light switches or other electrical receptacles they are installed over. This can produce moments on the thin central bar which may, over time, twist undesirably. The channel adds a significant amount of rigidity to prevent this twisting.

FIG. 28F shows another view of the U-shaped channel (2836) with its solid side (2842) and slotted side (2844). In this view one end of the channel is labeled End A and the opposite end is labeled End B. FIG. 28G shows an active cover plate (2800) with apertures (2804) for rocker light switches or double gang décor outlets. The U-shaped channel (2836) is secured in place on the rear of the face plate (2802). In this example, the End A is on the top side (the side farthest way from the circuit board and light pipe) and End B is located on the bottom (closer to the circuit board and light pipe). This allows the end block (2822) to fit into the recess (2848, FIG. 28C) in end A. The central upward extending portion (2852) of the back plate (2850) extends into the recess in end B.

This orientation of the channel (2836) allows the inboard prongs (2825) to extend to the left (looking at the active cover plate (2800) from the rear as shown in the FIG. 28G). Specifically, the slotted side (2844) of the channel (2836) is on the left and provides clearance for the inboard prongs (2825) to extend to the left. The solid side (2842) of the channel is on the right. The corresponding pair of outboard prongs (2824) are mounted to the far left of the active cover plate (2800).

Figure 28H:
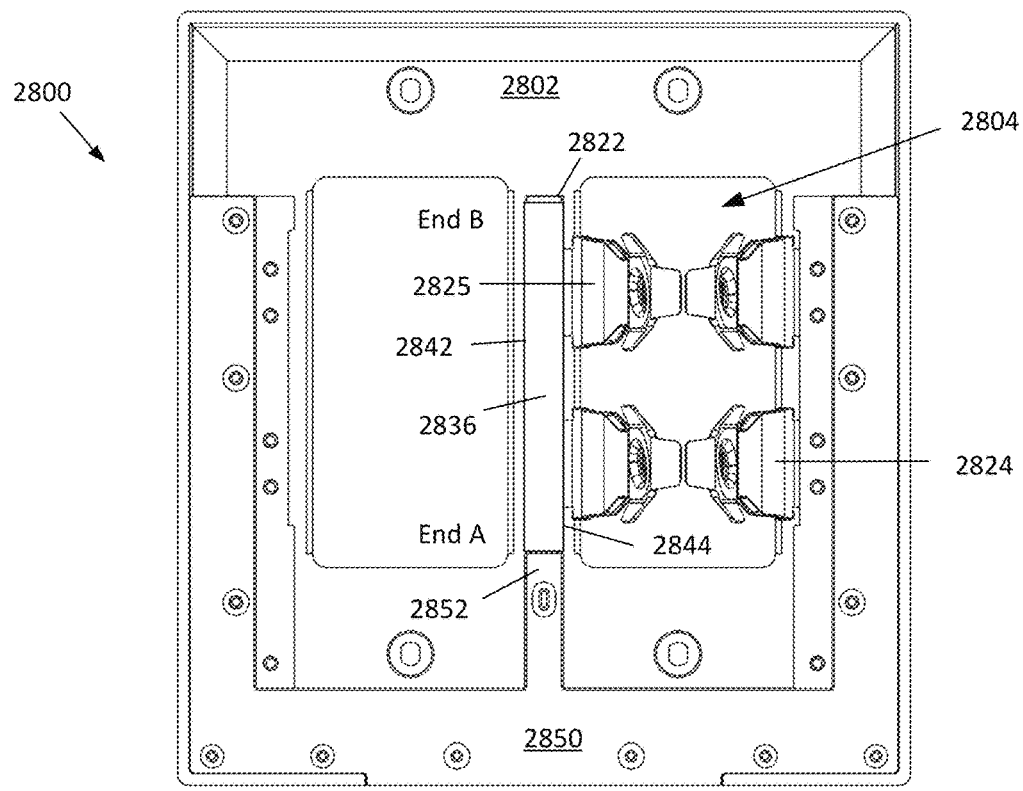

FIG. 28H shows the channel (2836) flipped to mount the opposite direction, so that End B is up, End A is down, and the slotted side (2844) is now facing the right and the solid side (2842) is on the left. This allows the inboard prongs (2825) to be secured to the central bar and extend to the right and around the aperture (2804) in the faceplate (2802). The central upward extending portion (2852) extends upward into End A and the block (2822) plugs End B. As before the corresponding outboard prongs (2824) are mounted opposite on the far right of the face plate (2802). The four prongs (2824, 2825) match the location of screw terminals on an electrical receptacle to allow for electrical power to be drawn. As discussed above, the electrical receptacle may be a light switch that may have two screw terminals, three screw terminals, four screw terminals or more.

In one example, the method for assembling the active cover plate (2800) that uses the channel may include the following steps. First, the prongs/wire/circuit board assembly is placed on the rear of the face plate. This may involve placing the prongs over the posts, placing the circuit in position, and, if the wires are not already soldered in place, soldering the wires to the prongs and/or circuit board and placing the wires into the wire channels/guides. The back plate is then put in place and then the channel is placed over the prong attachment area on the central portion of the faceplate. The back plate and channel are then secured in place. This is only one illustrative example of a method for assembling an active cover plate. The steps may be reordered, additional steps may be added, or steps may be removed. For example, there may be a step where the orientation of the prongs and channel are selected so that the inboard prongs extend in the desired direction. The prongs and channel are then placed in the desired locations.

Figure 29A:
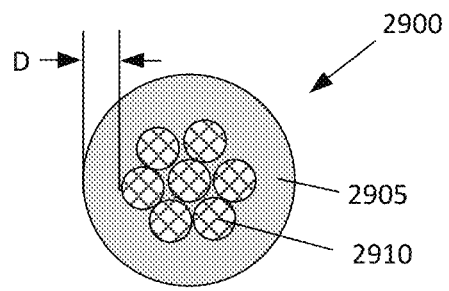
Figure 29B:
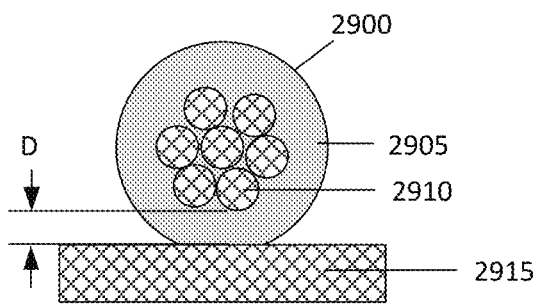
Figure 29C:
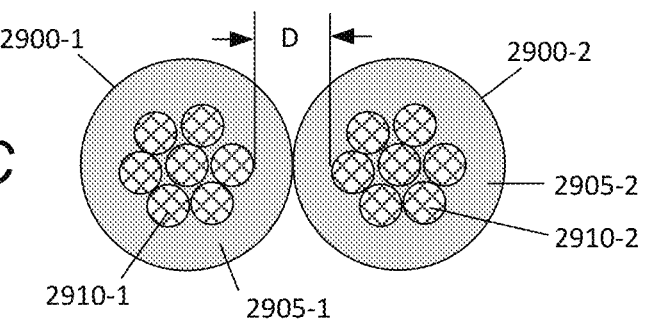

FIGS. 29A-29C show various wire configurations. Wires are used as electrical conductors to connect various electrical components together. In some embodiments of active cover plates, wires are used to connect the prongs to the circuit. FIG. 29A shows a cross section of an illustrative wire (2900). The wire (2900) may include one or more conductors (2910) (typically metallic threads or wires). The conductors (2910) may have various configurations and arrangements and may be surrounded by an electrically insulating sheath (2905). The insulating sheath (2905) may have a number of purposes, including holding the conductors (2910) together, protecting them from damage, and preventing undesirable electrical contact between the conductors and external elements. The level of insulation provided by the sheath (2910) is dependent on a variety of factors including the thickness of the sheath and the material the sheath is made from. The thickness of the effective insulation between conductors or the exterior of the wire is labeled D in FIG. 29A and subsequent figures.

FIG. 29B shows the dimensional thickness D between the conductors (2910) in the wire (2900) and an exterior conductive body (2915). In this case the dimensional thickness D is equal to the thickness of the insulation (2905). If the voltage difference between the conductors (2910) and the exterior body (2915) exceeds the level of insulation provided by the conductor, an electrical arc may form. Arcing may be undesirable for a number of reasons, including heating, degradation of the materials surrounding the arc, and loss of electrical power. FIG. 29C shows two adjacent wires (2900-1, 2900-2). In this case the arcing distance (D) is twice the amount of insulation (2905-1, 2905-2) thickness. In general, it can be desirable for the conductors (2910-1, 2910-2) to be spaced at or greater than some minimum distance that will prevent accidental arcing even under the most extreme circumstances. This minimum spacing as a function of voltage, materials, and design is specified in a number of standards including Underwriters Laboratory standards, printed circuit board standards, and various government or quasi-government standards such as the National Electrical Code.

Figure 29D:
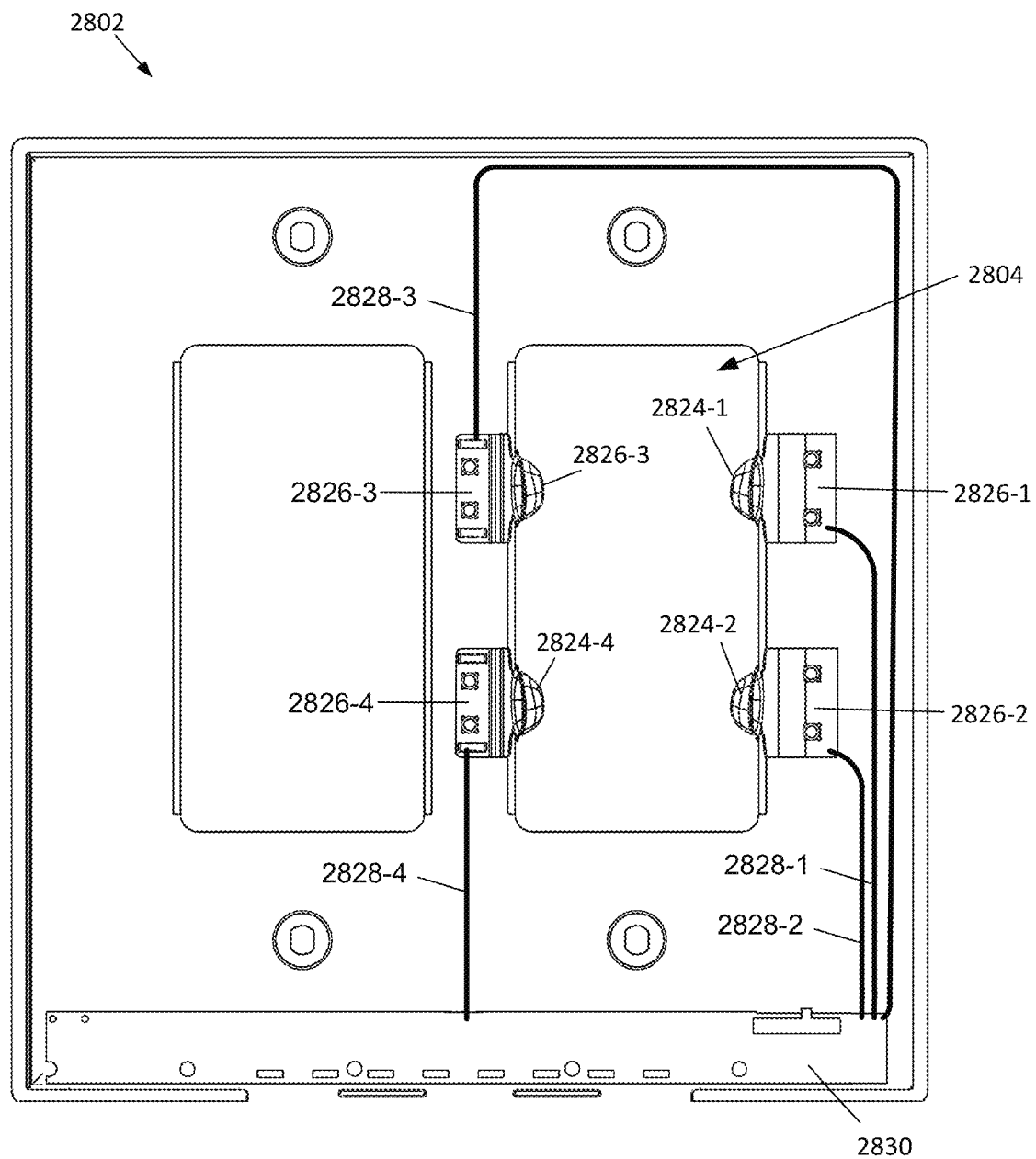

FIG. 29D shows a rear view of a faceplate (2802) with prongs (2824-1, 2824-2, 2824-3, 2824-4), wires (2828-1, 2828-2, 2828-3, 2828-4) and circuitry (2830) installed. The wires (2828-1, 2828-2, 2828-3, 2828-4) are connected to the bases (2826-1, 2826-2, 2826-3, 2826-4) of the prongs. The routing of the wires (2828-1, 2828-2, 2828-3, 2828-4) from the prongs (2824-1, 2824-2, 2824-3, 2824-4) to the circuit (2830) can be challenging. Each prong may have a different voltage present. For example, if the active cover plate is installed over a light switch connected to 120 volts alternating current (120 VAC), then the instantaneous voltage on the prong could be 170 V. If the active cover plate is installed over a light switch connected to 277 VAC, the instantaneous voltage will be higher. At the same time, an adjacent prong/wire may have much lower or negative voltage. Further, there may be transient surge voltages from a number of sources that are conducted by the prongs/wires. Consequently, it can be desirable to have a specific spacing between the wires in the active cover plate. As shown in FIG. 28D, the central portion of the face plate that separates the two apertures for the rocker switch paddles may be relatively narrow. The prong attachment and wiring are limited to the middle of the central portion. This leaves little room for additional spacing between wires (see e.g. FIG. 28C with adjacent wires) or for additional spacing between the wire from a first prong and the base of an adjacent prong (see e.g. FIG. 29B, where the wire is resting on a conductive element). The embodiment shown in FIG. 29D addresses this issue by routing the wire (2838-3) from the upper inboard prong (2826-3) around the top of the aperture (2804) and down the opposite outboard side of where may be more room to achieve the desired wire spacing. This is a viable option for wire routing. However, it may have several disadvantages. First, the wire (2828-3) passing around the aperture (2804) is long, leading to higher costs and to a higher wire resistance. Consequently, the wire (2828-3) may need to be a larger in diameter to reduce the electrical resistance and to follow safety regulations. Further, the back plate may need to be expanded to cover the wire routed around the aperture. The larger back plate may lead to increased costs and more mechanical interference between the cover plate and textures/obstructions surrounding the light switch installation. This larger back plate may result in the active cover plate not sitting flush with the wall after installation in some cases.

FIGS. 29E, 29F, and 29G show several embodiments that allow the wire (2828-3) from the upper inboard prong (2826-3) to pass over the base (2826-4) of the lower prong (2824-4) while maintaining the appropriate spacing. FIG. 29E is a top view the central bar with the spring clips in place and the wires running downward toward the circuit board. For clarity, the cover (2826) is not illustrated. FIG. 29F shows a cross section AA of the central bar (2802), wire (2828-3) and standoff post (2812) from FIG. 29E. FIG. 29F additionally shows an inverted U-shaped cover (2836) that is placed over the middle portion of the bar, the bases (2826-3, 2826-4) of the prongs and the standoff post (2812). As described above, the cover (2836) may be secured in place using a number of techniques including cold pressing, hot pressing, gluing, or sonic welding. In this example, the U-shaped cover (2836) constrains the position of the wire (2826-3) over the top of the standoff post (2812) and secures the prong base (2826-4) over the standoff post and to the rear surface of the face plate (2802). By positioning the wire (2828-3) on top of the standoff post (2812), the required physical separation between the conductors (2910) from the first prong (2826-3) and the underlying base (2826-4) of the second prong (2824-4, FIG. 29E) is maintained.

FIG. 29G shows an additional or alternative mechanism for maintaining the distance between conductors (2910) in a wire (2828-3) and an exterior conductor (2826-4). In this example, the wire (2828-3) is surrounded by/includes an additional insulating layer (2907) in the location where the wire passes over the exterior conductor (2826-4). For example, the additional insulating layer (2828-3) may be a fiberglass or other sleeve that fits over the wire to provide the additional spacing. In this example, the standoff post (2812) may or may not be shorter than shown in FIG. 29F. The U-shaped cover (2836) provides stability and protection to secure the wire (2828-3) in place.

Figure 29H:
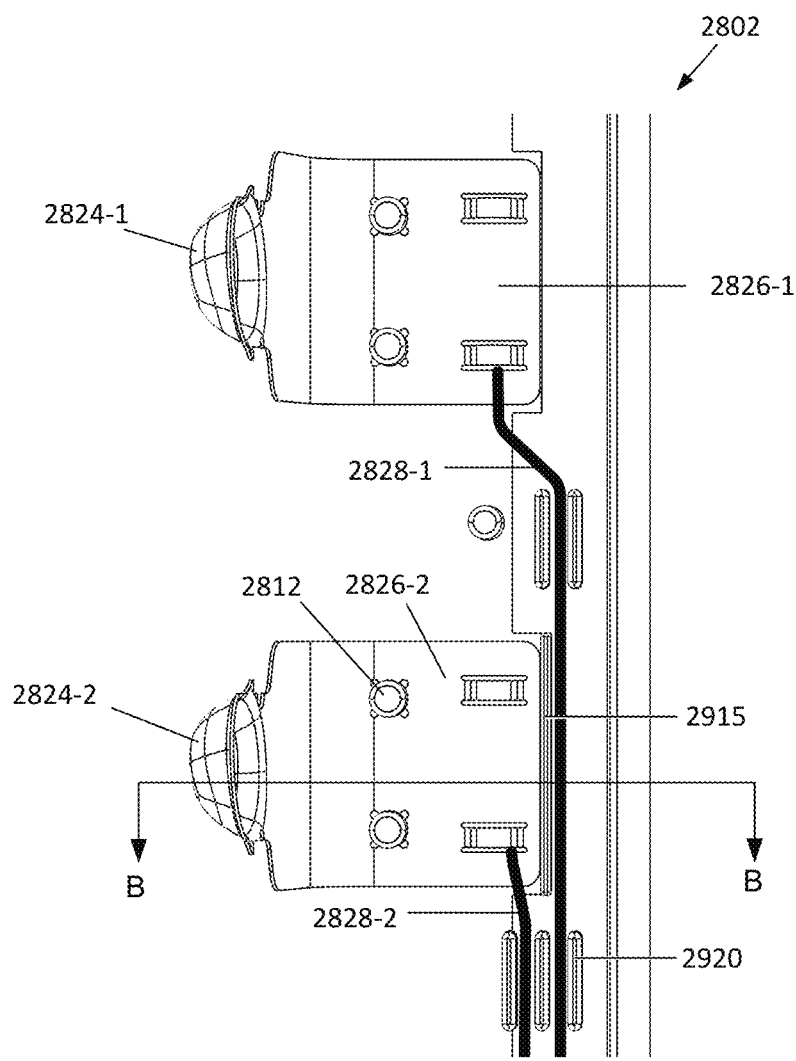
Figure 29I:
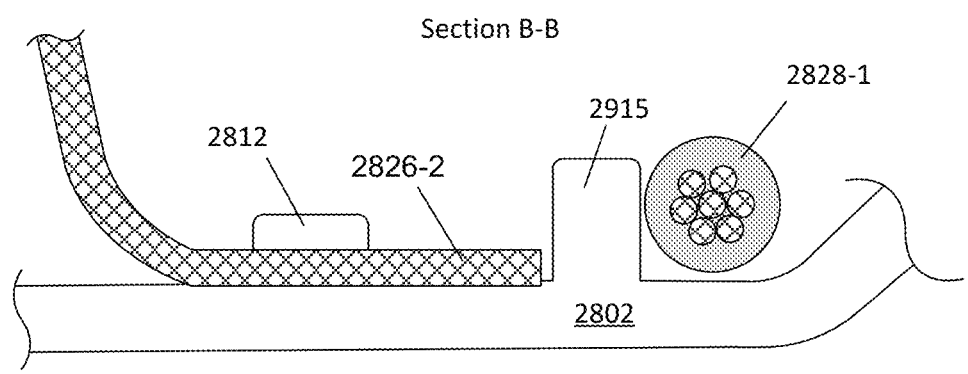

FIGS. 29H and 29I show one technique for routing the wires (2828-1, 2828-2) between outboard prongs (2824-1, 2824-2) in an active cover plate. In this example, the prongs (2824-1, 2824-2) are connected to the faceplate (2802) using posts (2812). Wires (2826-1, 2826-2) are connected to the bases (2826-2, 2826-2) of the prongs. FIG. 29I is a cross-section BB of FIG. 29H. One example of the wiring technique includes placing/forming a wall (2915) on the outboard side of the lower prong base (2826-2). The wall may be an integral part of the faceplate (2802), a part of another component, or may be a separate component. The wall (2915) ensures that the desired distance is maintained between the conductors in the wire (2828-1) and the base (2826-2).

Figure 30I:
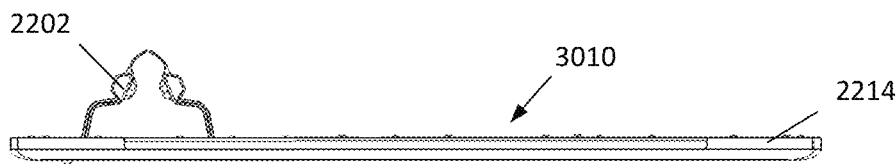
FIGS. 30A-30P show illustrative examples of multi-gang plates, according to one example of principles described herein.
Figures 30J, 30K:
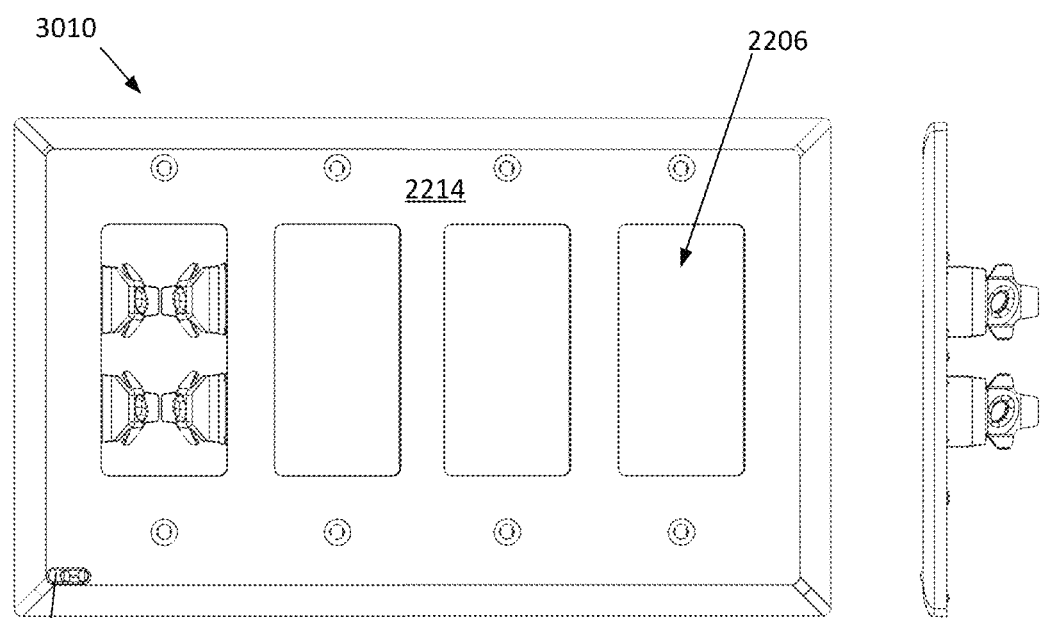
Figure 30L:
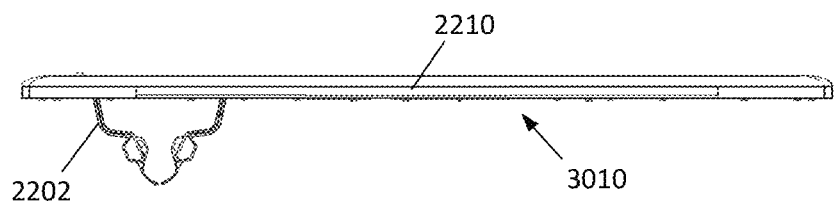
Figure 30M:
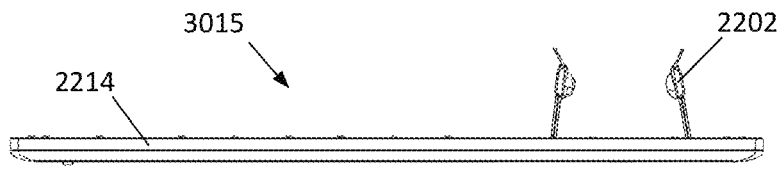
Figure 30N:
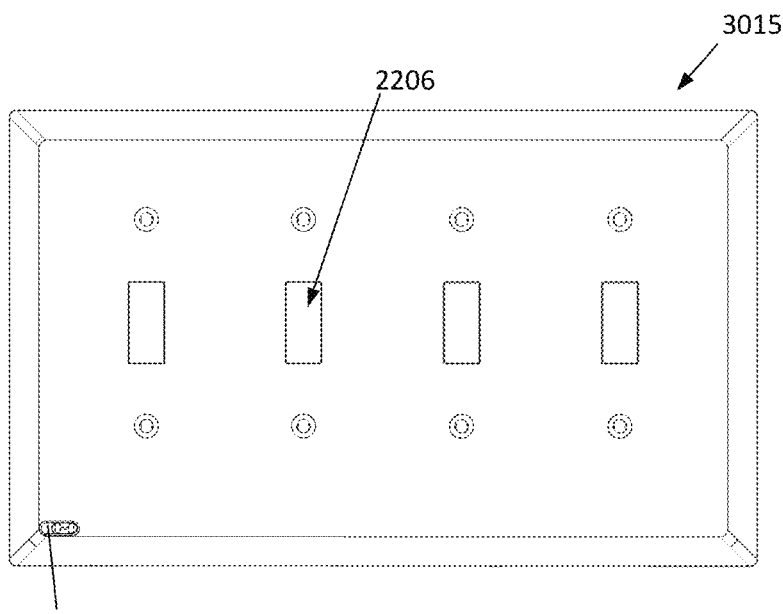
Figure 30O:
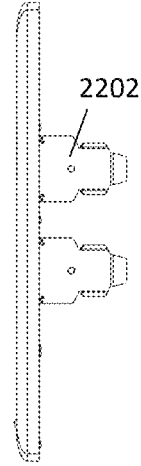
Figure 30P:
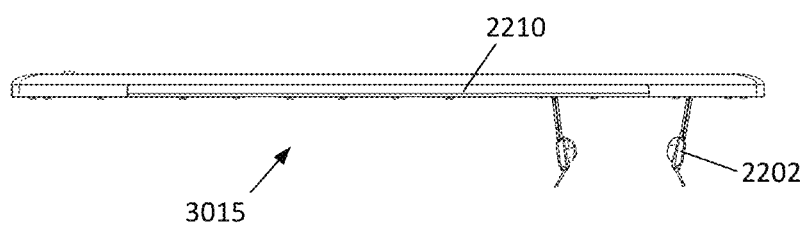

FIGS. 30A-30P show illustrative examples of additional multi-gang active cover plates. FIGS. 30A-30D show top, front, side and bottom views, respectively, of a triple-gang rocker cover plate (3000). Triple gang and other multi-gang electrical receptacles can be found in a variety of different locations. For example, when a home includes multiple lighting installations or lighting installations in multiple interconnected rooms, multi-gang light switch installations provide for convenient and often centralized control of the lighting. For example, in a home with an open floor plan, lighting may be used to visually segment the functions of the area. There may be recessed lighting near the TV and couches, a chandelier over the dining room table, work lighting in the kitchen, entryway lighting, accent lighting for art, etc. The multi-gang switch installations may be placed in any convenient location, such as an entryway or an opening between different functional areas. In this example, the multi-gang active cover plate (3000) includes three openings (2206) in the face plate (2214) for rocker light switches, with prongs (2202) located to draw power from the switch on the far left. The active cover plate (3000) can be secured in a variety of ways, including with apertures (2204) that can accept fasteners. In this example, the apertures (2204) are sized and positioned to allow screws to pass through the apertures and screw into threaded holes in the yokes of the various switches. A light pipe (2210) on the bottom edge allows for light to be projected out of the cover plate. A light sensor/lens/switch (2208) may also be present. As discussed above, these features may be sized and located in a variety of different configurations and combinations. As discussed above, the left side view may be substantially similar to the right side view. Further, the rear of the cover plate is not in view when the active cover plate is in use.

FIGS. 30E-30H show top, front, side and bottom views, respectively, of a triple-gang toggle cover plate (3005). In this example, the multi-gang active cover plate (3005) includes three openings (2206) in the face plate (2214) for toggle light switches, with prongs (2202) located to draw power from the switch on the far right. The prongs may be positioned to extract electrical power from any or all of the switches in the installations. One of the advantages of drawing power from more than one light switch may include better access to power (the active cover plate may still have access to electrical voltage even if one or more of the light switches in the on position), more distributed current distribution to avoid undesirable effects on the loads controlled by the switches, etc.

A light pipe (2210) on the bottom edge allows for light to be projected out of the cover plate. In this example, the light pipe (2210) extends along more than half of the bottom edge of the face plate. A light sensor/lens/switch (2208) may also be present. As discussed above, these features may be sized and located in a variety of different configurations and combinations. As discussed above, the left side view may be substantially similar to the right side view. Further, the rear of the cover plate is not in view when the active cover plate is in use.

FIGS. 30I-30L show top, front, side and bottom views, respectively, of a triple-gang toggle cover plate (3010). In this example, the multi-gang active cover plate (3010) includes four openings (2206) in the face plate (2214) for rocker light switches, with prongs (2202) located to draw power from the switch on the far left. As discussed above, the prongs may be positioned to extract electrical power from any or all of the switches in the installation. A light pipe (2210) on the bottom edge allows for light to be projected out of the cover plate. The active cover plate may also include a switch/lens/light sensor cover (2208). As discussed above, these features may be sized and located in a variety of different configurations and combinations. Further, the left side view of the quadruple gang active cover plate (3010) may be substantially similar to the right side view. Further, the rear of the cover plate is not in view when the active cover plate is in use.

FIGS. 30M-30P show top, front, side and bottom views, respectively, of a triple-gang toggle cover plate (3015). In this example, the multi-gang active cover plate (3015) includes four openings (2206) in the face plate (2214) for rocker light switches, with prongs (2202) located to draw power from the switch on the far right. As discussed above, the prongs may be positioned to extract electrical power from any or all of the switches in the installation. A light pipe (2210) on the bottom edge allows for light to be projected out of the cover plate. The active cover plate may also include a switch/lens/light sensor cover (2208). As discussed above, these features may be sized and located in a variety of different configurations and combinations. Further, the left side view of the quadruple gang active cover plate (3015) may be substantially similar to the right side view. The rear of the cover plate is not in view when the active cover plate is in use.

FIGS. 31A-31F show one illustrative example of an active cover plate (3100) with a protrusion (3105) that provides additional volume for circuitry and/or sensors. FIG. 31A is a top view of the active cover plate (3100). FIGS. 31B, 31C, 31D are, respectively, a front view, a side view, and a bottom view of the active cover plate. In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuitry. In this example, the protrusion (3105) includes a window for motion sensor and space for the motion sensor circuit. The active cover plate (3100) may include a variety of other elements, such as wireless transmission, illumination, etc. In this example, the active cover plate (3100) includes a light bar (3110) on the bottom edge of the faceplate. As discussed herein, the light bar(s) (if present) may have a variety of shapes, size, and locations.

There are several apertures (3125) in the faceplate (3120) to accept the electrical receptacle over which the active cover plate (3100) is configured to be fastened. In this embodiment, two apertures (3125) configured to fit over a duplex outlet are shown. However, as discussed herein, there may be a wide variety of apertures that could be formed in the faceplate. For example, apertures for toggle light switches, rocker light switches, multi-gang light switch installations, GFCI outlets, décor outlets, double outlet installations, and other electrical receptacles could be incorporated into the active cover plate.

FIG. 31E is a perspective view showing an embodiment of the active cover plate (3100) that includes an aperture (3125) for a rocker light switch and prongs (3115) that are adapted to contact a rocker light switch. There may be any number of prongs. For example, there may be two prongs, three prongs or four prongs. The protrusion (3105) extends from the face plate (3120) and the light pipe (3110) is located along one edge of the faceplate. FIG. 31F shows a rear perspective view of the faceplate (3120) without other associated components such as back plates, circuitry, and prongs. In this figure and other figures showing the back of the faceplate (3120), the faceplate shown includes a number of features which may or may not be present in a final design. In particular, the protrusion may be more open than shown. In this and other figures (e.g. FIGS. 31-44), if there is only one side view shown, the opposite side view may be substantially similar to the side view illustrated (e.g. a vertical mirror image). Further, the rear of the active cover plate in this and other embodiments is typically not in view of the user when installed because the rear of the active cover plate is against the wall or covering the electrical box.

FIGS. 32A-32F show one illustrative example of an active cover plate (3100) with a protrusion (3105) that provides additional volume for circuitry and/or sensors. FIG. 32A is a perspective view showing an embodiment of the active cover plate (3100) that includes an aperture (3125) for a rocker light switch (or décor outlet or GFCI outlet, depending on the prong configuration) and prongs (3115) that are adapted to contact a rocker light switch. There may be any number of prongs, for example, there may be two prongs, three prongs or four prongs. The protrusion (3105) extends from the face plate (3120). FIG. 32B shows a rear perspective view of the faceplate (3120) without other associated components such as back plates, circuitry, and prongs.

FIG. 32C is a top view of the active cover plate (3100). FIGS. 31D, 31E and 31F are, respectively, a front view, a side view, and a bottom view of the active cover plate. In this embodiment, the active cover plate (3100) includes a protrusion (3105) that extends outward from a faceplate (3120) with prongs (3115) extending from the rear of the faceplate (3120). The protrusion (3105) may have a wide range of shapes and be adapted to a variety of sensors and circuitry. In this example, the protrusion (3105) includes a window for motion sensor and space for the motion sensor circuit. The active cover plate (3100) may include a variety of other elements, such as wireless transmission, illumination, etc. A light bar or other illumination element is not explicitly shown in this example but may be present in any of a variety of forms. For example, the illumination or light bar may be present in the protrusion itself, on any edge/face of the faceplate, or in other appropriate locations and configurations.

There is an aperture (3125) in the faceplate (3120) to accept the electrical receptacle over which the active cover plate (3100) is configured to be fastened. In this embodiment, the aperture (3125) configured to fit over a décor outlet are shown. However, as discussed herein, there may be a wide variety of apertures that could be formed in the faceplate. For example, apertures for toggle light switches, rocker light switches, multi-gang light switch installations, GFCI outlets, décor outlets, double outlet installations, and other electrical receptacles could be incorporated into the active cover plate.

The décor aperture (3125) in the faceplate (3120) in this example will fit over rocker light switches, décor outlets, and GFCI outlets. By interchanging prongs, the active cover plate (3100) can be assembled to be compatible with any of these electrical receptacles. The prongs (3115) shown are specifically adapted for a rocker light switch. In this embodiment, there are four prongs shown, which allow the prongs to extract power from 3-way and 4-way switches in a variety of configurations. However, there may be a variety of other prongs used. Some alternative prongs may be used without any additional modification to the faceplate. As discussed above, GFCI outlets and décor electrical outlets are both compatible with the aperture (3125) and the faceplate (3120) may have posts to position and secure the various prongs (see e.g. 32B).

FIGS. 33A-33G show one illustrative example of an active cover plate (3100) with a protrusion (3105) that provides additional volume for circuitry and/or sensors. FIG. 33A is a top view of the active cover plate (3100). FIGS. 33B, 33C, 33D are, respectively, a front view, a side view, and a bottom view of the active cover plate. FIG. 33E is a front perspective view of the active coverplate. In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuitry. In this example, the protrusion (3105) includes a window for motion sensor and space for the motion sensor circuit. The active cover plate (3100) may include a variety of other elements, such as wireless transmission, illumination, light bar, etc. As discussed herein, the light bar/illumination (if present) may have a variety of shapes, sizes, and locations.

There is an aperture (3125) in the faceplate (3120) to accept the electrical receptacle over which the active cover plate (3100) is configured to be fastened. In this embodiment, one aperture (3125) is configured (due its shape, size, and to the prongs attached to the faceplate) to fit over a décor.

In the example shown in FIGS. 33A-33E, the active cover plate (3100) includes a faceplate (3120) and prongs (3115) that are configured for connection to outlet receptacles. However, as discussed above, a variety of other prongs could be used. FIG. 33F shows prongs that are configured for connection to light switches. When used in combination with the rectangular aperture (3125) in the faceplate (3120), the prongs (3115) are configured for connection to a single pole, 3-way, or 4-way rocker light switch. FIG. 33G shows a rear view of a faceplate (3120) without other components. As discussed above, this view of the faceplate shows a cover over the protrusion which may or may not be present. In some examples, the function of the cover is performed by the back plate.

Figure 34E:
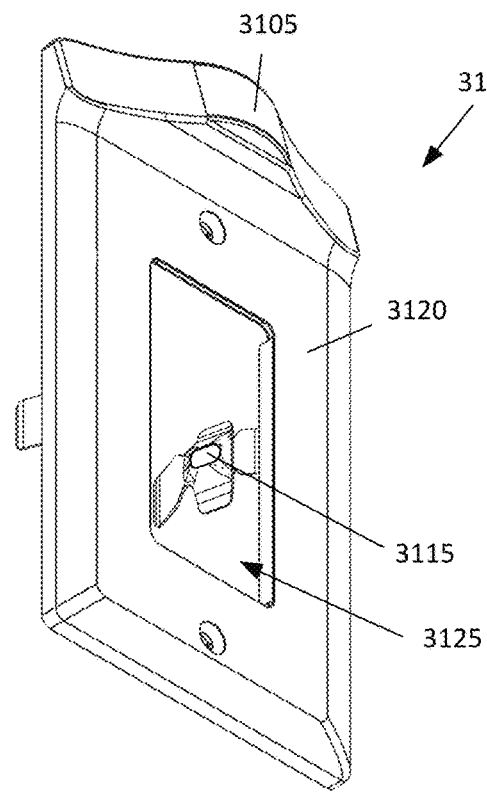
Figure 34F:
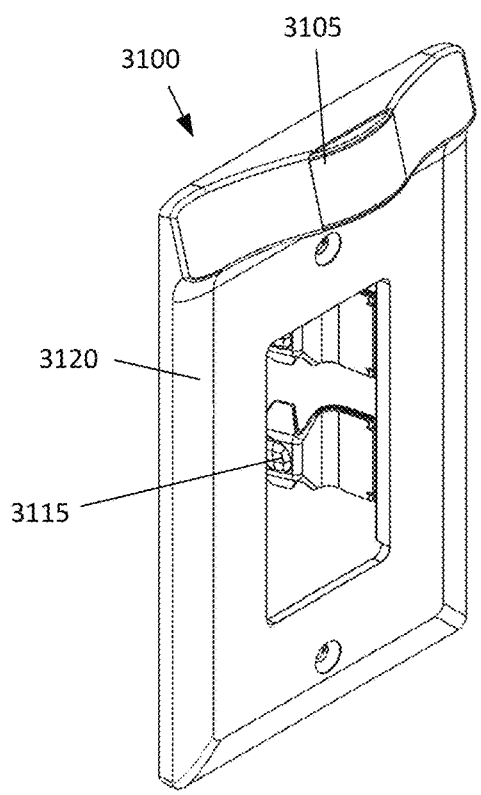
Figure 34G:
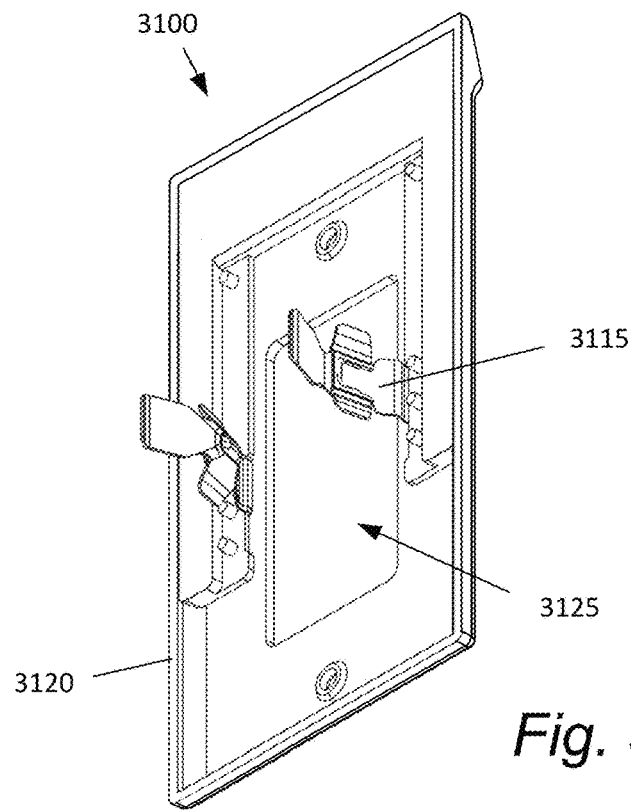

FIGS. 34A-34G show an illustrative example of an active cover plate (3100) with a protrusion (3105) that provides additional volume for circuitry and/or sensors. FIG. 34A is a top view of the active cover plate (3100). FIGS. 34B, 34C, 34D are, respectively, a front view, a side view, and a bottom view of the active cover plate (3100). FIGS. 34E and 34G are front and rear perspective views of the active cover plate (3100). In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuitry. In this example, the protrusion is upwardly angled for a better field of view for the motion sensor. There is an aperture (3125) in the faceplate (3120) to accept the electrical receptacle over which the active cover plate (3100) is configured to be fastened. In this embodiment, the one aperture (3125) is configured to fit over a décor outlet, rocker switch, or GFCI outlet. However, as discussed herein, there may be a wide variety of apertures that could be formed in the faceplate.

In the example shown in FIGS. 34A-34E and 34G, the active cover plate (3100) includes a faceplate (3120) and prongs (3115) that are configured for connection to outlet receptacles. However, as discussed above, a variety of other prongs could be used. FIG. 34F shows an illustrative embodiment of an active cover plate (3100) with prongs (3115) extending from the face plate (3120) that are configured for connection to light switches. When used in combination with the rectangular aperture (3125) in the faceplate (3120), the prongs (3115) are configured for connection to a single pole, 3-way, or 4-way rocker light switch.

FIGS. 35A-35G show one illustrative example of an active cover plate (3100) with a protrusion (3105) that provides additional volume for circuitry and/or sensors. FIG. 35A is a top view of the active cover plate (3100). FIGS. 35B, 35C, 35D, 35E, and 35G are, respectively, a front view, a side view, a bottom view, front perspective view, and rear perspective view of the active cover plate (3100). In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuitry. A light pipe or other illumination may be present. For example, there may be a light pipe on the bottom edge/surface of the active cover plate. There is an aperture (3125) in the faceplate (3120) to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 35A-35E and 35G, the active cover plate (3100) includes a faceplate (3120) and prongs (3115) that are configured for connection to outlet receptacles. However, as discussed above, a variety of other prongs could be used. FIG. 35F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 36E:
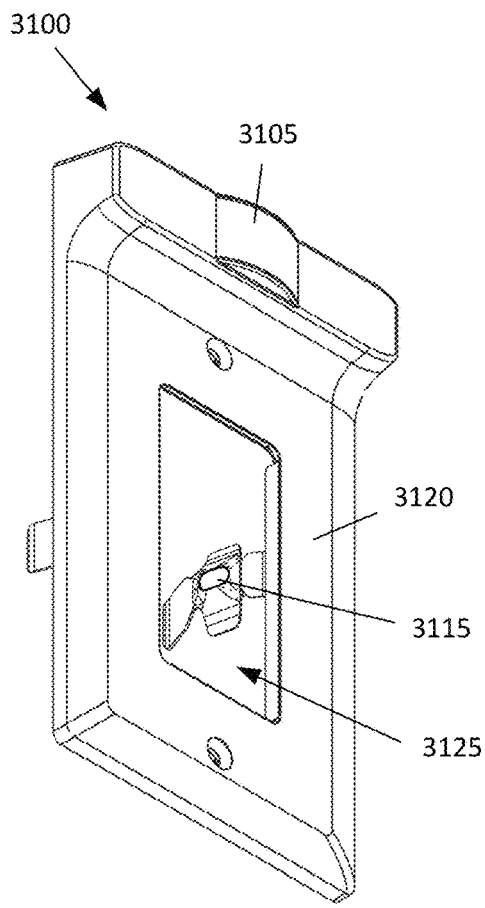

FIGS. 36A-36E show one illustrative example of an active cover plate (3100) with a protrusion (3105) that provides additional volume for circuitry and/or sensors. FIG. 36A is a top view of the active cover plate (3100). FIGS. 36B, 36C, 36D, and 36E are, respectively, a front view, a side view, bottom view and a front perspective view of this illustrative active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. In this example the protrusion may extend from the top of the faceplate (3120).

There is an aperture (3125) in the faceplate (3120) to accept the electrical receptacle over which the active cover plate (3100) is configured to be fastened. In this embodiment, the one aperture (3125) is configured to fit over a décor outlet (because of the prongs selected). However, as discussed herein, there may be a wide variety of apertures (3125) that could be formed in the faceplate.

Figure 36F:
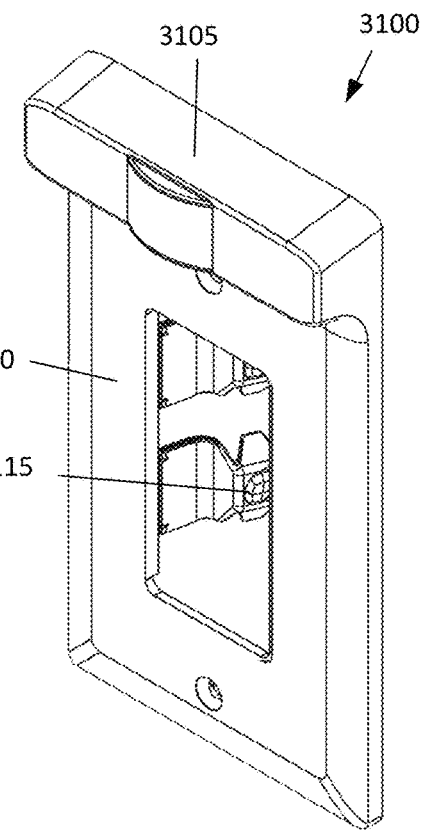
Figure 36G:
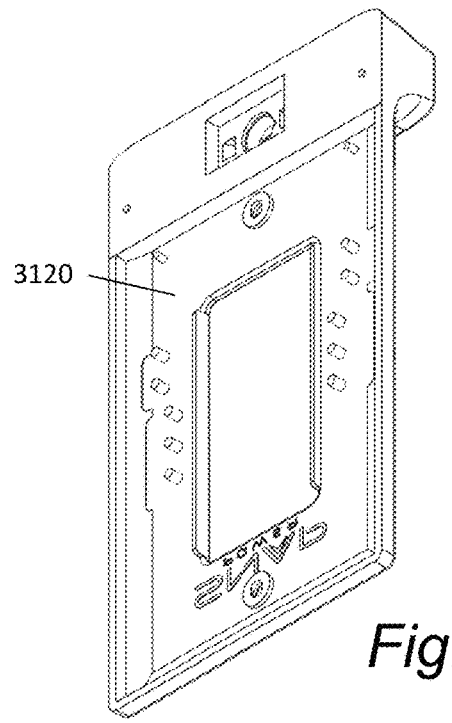

In the example shown in FIGS. 36A-36E, the active cover plate (3100) includes a faceplate (3120) and prongs (3115) that are configured for connection to outlet receptacles. However, as discussed above, a variety of other prongs could be used. FIG. 36F shows prongs (3115) that are configured for connection to light switches. When used in combination with the rectangular aperture (3125) in the faceplate (3120), the prongs (3115) are configured for connection to a single pole, 3-way, or 4-way rocker light switch. FIG. 36G shows a rear view of a faceplate (3120) without other components. This faceplate and other décor/rocker style faceplates can be configured to work over any of a number of different electrical receptacles by picking the appropriate prongs and connecting/fastening the prongs to the faceplate and electrically connecting the prongs to the internal circuitry.

FIGS. 37A-37G show an illustrative example of an active cover plate (3100) with a protrusion (3105) on the bottom of the faceplate (3120) that provides additional volume for circuitry and/or sensors. Although the protrusion (3105) is described and shown at the "bottom" of the faceplate (3120) this and other faceplates described herein could be installed in a variety of orientations, including right side up, upside down, and horizontally. Consequently, the protrusion may be above, below or to either side of the electrical receptacle. FIG. 37A is a top view of the active cover plate (3100). FIGS. 37B, 37C, 37D, 37E and 37G are, respectively, a front view, a side view, bottom view, front perspective view, and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) is configured to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 37A-37E and 37G, the active cover plate (3100) includes a faceplate (3120) and prongs (3115) that are configured for connection to outlet receptacles. However, as discussed above, a variety of other prongs could be used. FIG. 37F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 38A:
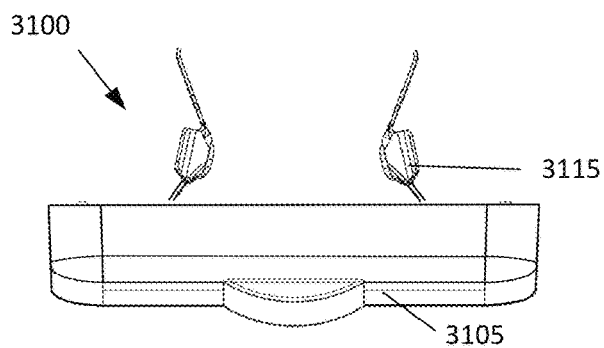
Figures 38B, 38C:
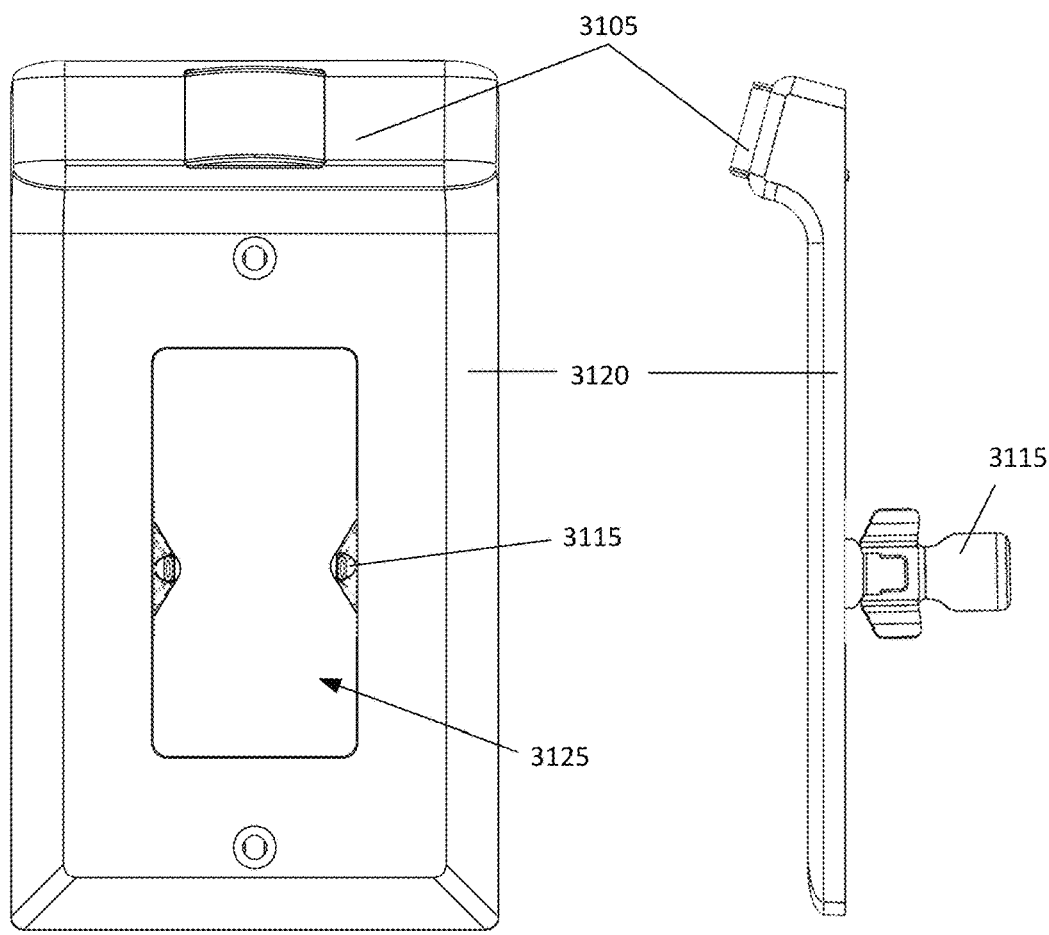
Figure 38D:
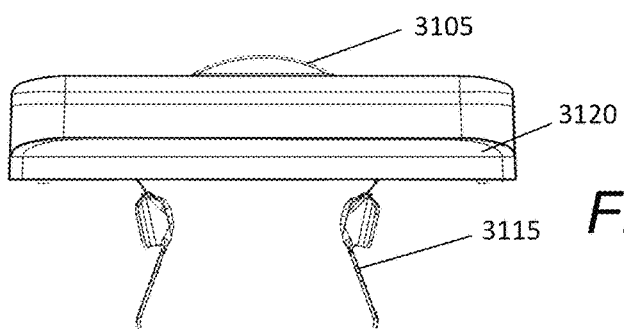

FIGS. 38A-38G show an illustrative example of an active cover plate (3100) with a protrusion (3105) that provides additional volume for circuitry and/or sensors. FIG. 38A is a top view of the active cover plate (3100). FIGS. 38B, 38C, 38D, and 38E are, respectively, a front view, a side view, bottom view, and front perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) is configured to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 38A-38E, the active cover plate (3100) includes a faceplate (3120) and prongs (3115) that are configured for connection to outlet receptacles. However, as discussed above, there a variety of other prongs could be used. FIG. 38F shows prongs (3115) that are configured for connection to light switches. When used in combination with the rectangular aperture (3125) in the faceplate (3120) and prongs (3115), the active cover plate (3100) can be configured for connection to a single pole, 3-way, or 4-way rocker light switch. FIG. 38G shows a rear view of a faceplate (3120) without other components.

Figures 39E, 39F:
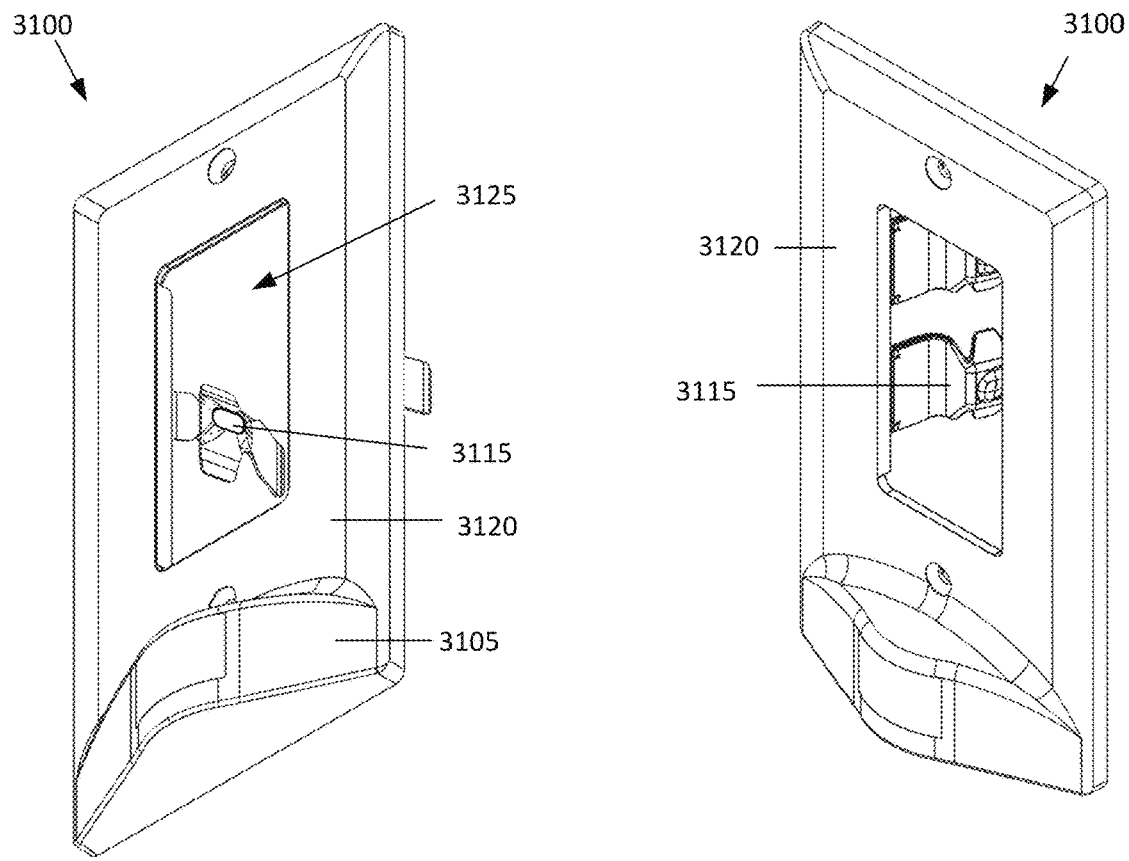
Figure 39G:
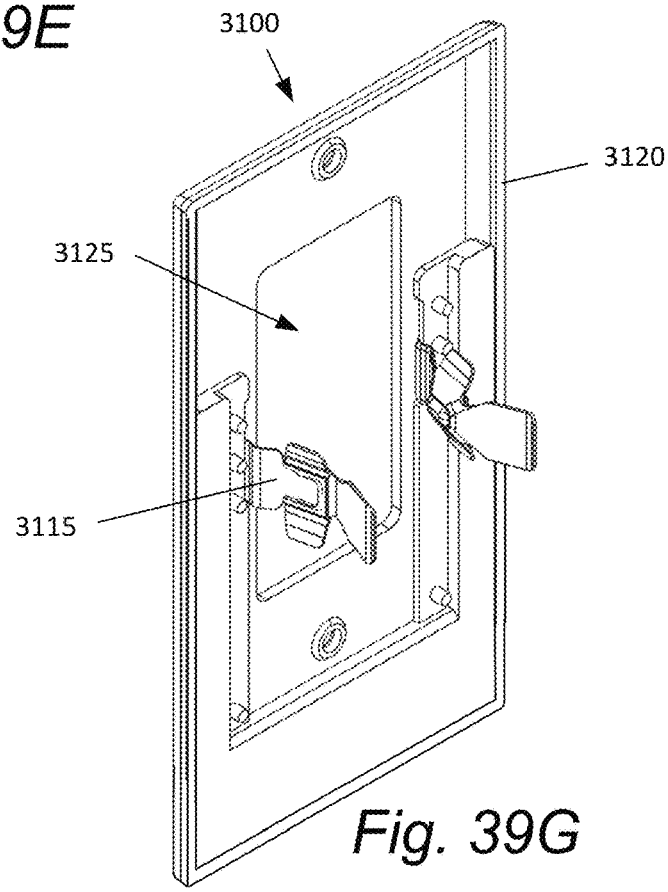

FIGS. 39A-39G show an illustrative example of an active cover plate (3100) with a protrusion that provides additional volume for circuitry and/or sensors. FIG. 39A is a top view of the active cover plate (3100). FIGS. 39B, 39C, 39D, 39E, and 39G are, respectively, a front view, a side view, bottom view, front perspective view and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) is configured to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 39A-39E and 39G, the active cover plate (3100) includes a faceplate (3120) and prongs (3115) that are configured for connection to outlet receptacles. However, as discussed above, a variety of other prongs could be used. FIG. 39F shows prongs (3115) that are configured for connection to light switches. When used in combination with the rectangular aperture (3125) in the faceplate (3120), the prongs (3115) are configured for connection to a single pole, 3-way, or 4-way rocker light switch. A different aperture and/or prongs could be used with a variety of the designs disclosed herein to fit over a duplex outlet and/or a toggle light switch.

FIGS. 40A-40E show illustrative examples of an active cover plate (3100) with a protrusion that provides additional volume for circuitry and/or sensors. FIGS. 40A and 40B are perspective views of active cover plates (3100). FIG. 40A is an active cover plate (3100) that is configured to connect to a light switch. FIGS. 40B, 40C, 40D, and 40E are a front perspective view, bottom, top, and side views, respectively, of an active cover plate (3100) that is configured for connection to an outlet.

FIG. 40A shows an active cover plate (3100) with a faceplate (3120) with an aperture (3125) and prongs (3115) for a rocker light switch. In this example, the protrusion (3105) is located at the top of the plate and is angled upward. The protrusion (3105) may include any of a number of sensors and circuitry, including motion sensor(s), air sensors, temperature sensors, or other sensors. As with other designs described herein, the circuitry may be entirely contained within the protrusion or may be distributed throughout the active cover plate.

FIG. 40B shows an active cover plate (3100) with a faceplate (3120), a protrusion (3105) on the upper portion of the faceplate and aperture (3125) through the faceplate. The prongs (3115) in this illustrative example are configured for outlets. While the protrusion (3105) is on the top of the faceplate in this example, the whole plate may be rotated and installed upside down, placing the protrusion (3105) at the bottom of the reoriented faceplate (3120). This applies to many or all of the designs presented herein. In some examples, the prongs may need to be relocated to allow them to contact the screw terminals when the faceplate is installed in a different position. In other situations, the prongs may be suitability configured for either orientation. For example, the prongs (3115) shown in FIG. 40A are configured to contact screw terminals of a rocker switch in either orientation. The sensors, actuators, or other circuitry in the protrusion may be advantageously positioned by selecting a desired orientation of the active cover plate over the electrical receptacle. For example, if the protrusion includes a motion sensor and the electrical receptacle is located in a lower position on the wall (such as over an outlet), it may be advantageous for the sensor to be located on the upper side of the faceplate and in the case shown in FIG. 40B, have the motion detector angled upward to better sense the motion of people moving about the room. However, if an active cover plate was located over a light switch (see e.g. 3100, FIG. 40A) then it may be desirable for the protrusion be on the lower side of the faceplate and the active cover plate may be reoriented to achieve this.

FIG. 40C shows a bottom view of the illustrative active cover plate (3100) shown in FIG. 40B. FIG. 40C shows the protrusion (3105), the faceplate (3120), and the prongs (3115). FIG. 40D shows a top view of the active cover plate of FIG. 40B, with the outlet style prongs (3115) and the face plate (3120) with the protrusion (3105) extending from the faceplate. FIG. 40E shows a side view of the same active cover plate (3100) and elements (3120, 3155, 3105).

FIGS. 41A-41G show an illustrative example of an active cover plate (3100) with a protrusion that provides additional volume for circuitry and/or sensors. FIG. 41A is a top view of the active cover plate (3100). FIGS. 41B, 41C, 41D, 41E, and 41G are, respectively, a front view, a side view, a bottom view, a front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) is configured to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 41A-41E, the active cover plate (3100) includes a faceplate (3120) and prongs (3115) that are configured for connection to outlet receptacles. However, as discussed above, a variety of other prongs could be used. FIG. 41F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 42E:
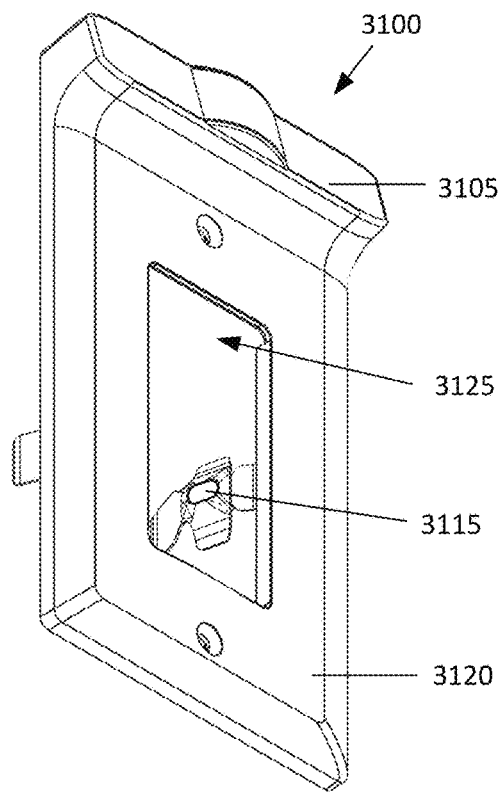
Figure 42F:
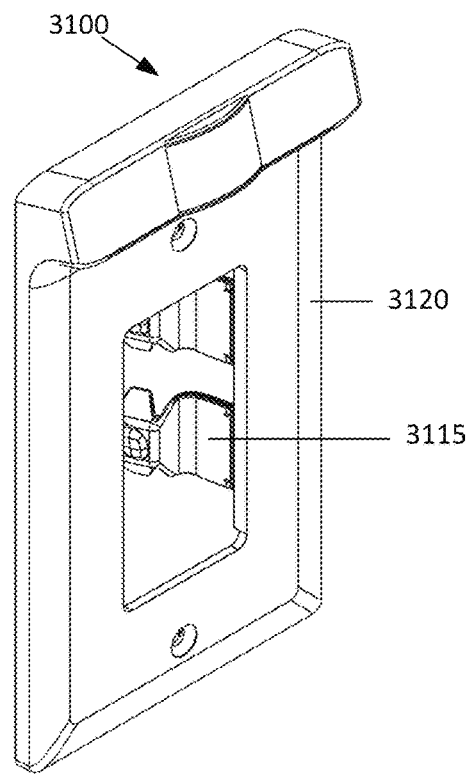

FIGS. 42A-42G show one illustrative example of an active cover plate (3100) with a protrusion (3105) that provides additional volume for circuitry and/or sensors, according to one example of principles described herein. FIGS. 42A-42G show an illustrative example of an active cover plate (3100) with a protrusion (3105) that provides additional volume for circuitry and/or sensors. FIG. 42A is a top view of the active cover plate (3100). FIGS. 42B, 42C, 42D, and 42E, are, respectively, a front view, a side view, bottom view, and front perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) to accept the electrical receptacle over which the active cover plate (3100) is configured to be fastened. In FIG. 42F, the prongs are configured to fit over a rocker light switch. However, as discussed herein, there may be a wide variety of apertures that could be formed in the faceplate.

Figure 42G:
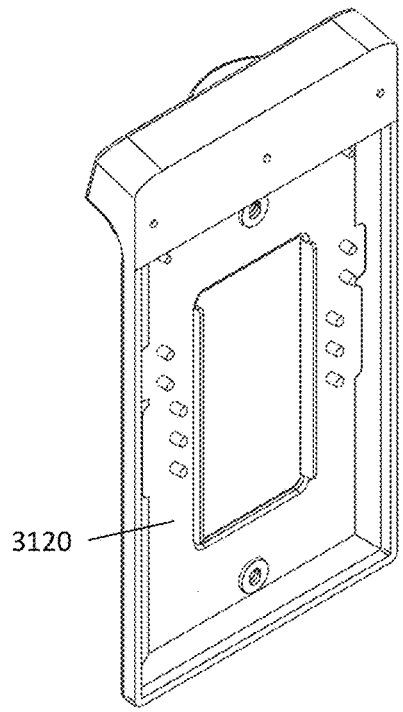

In the example shown in FIGS. 42A-42E, the active cover plate (3100) includes a faceplate (3120) and prongs (3115) that are configured for connection to outlet receptacles. However, as discussed above, a variety of other prongs could be used. FIG. 42F shows prongs (3115) that are configured for connection to light switches. When used in combination with the rectangular aperture (3125) in the faceplate (3120), the prongs (3115) are configured for connection to a single pole, 3-way, or 4-way rocker light switch. FIG. 42G shows a rear view of a faceplate (3120) without other components.

FIGS. 43A-43G show an illustrative example of an active cover plate (3100) with a protrusion that provides additional volume for circuitry and/or sensors. FIG. 43A is a top view of the active cover plate (3100). FIGS. 43B, 43C, 43D, 43E, 43F and 43G are, respectively, a front view, a side view, bottom view, front perspective view, another front perspective view and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. An aperture (3125) in the faceplate (3120) is configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate.

In the example shown in FIGS. 43A-43G, the active cover plate (3100) includes a faceplate (3120) and prongs (3115) that are configured for connection to outlet receptacles. FIGS. 43E and 43F are front perspective views of the active cover plate (3100) and show the apertures (3125) in the faceplate (3120) and protrusion (3105). FIG. 43G shows a rear view of the active cover plate (3100) with the faceplate (3120) including the prongs (3115) and back plate (3130). The light pipe (3110) may be formed in any desired configuration, shape or location. In this and other examples, the light pipe may be located on the bottom surface of the cover plate as shown in FIG. 43B. For example, all or part of the bottom surface of the active cover plate may be illuminated/transparent/translucent and serve as a light pipe as shown in FIGS. 44A-44II shown below.

Figure 44E:
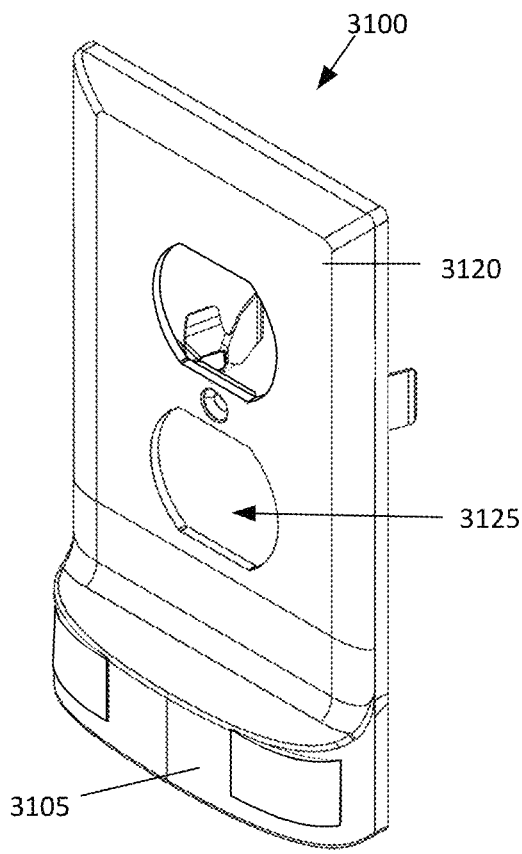
FIGS. 44A-44AI show illustrative examples of active cover plates with a protrusion that provides additional volume for circuitry and/or sensors, according to one example of principles described herein.
Figure 44F:
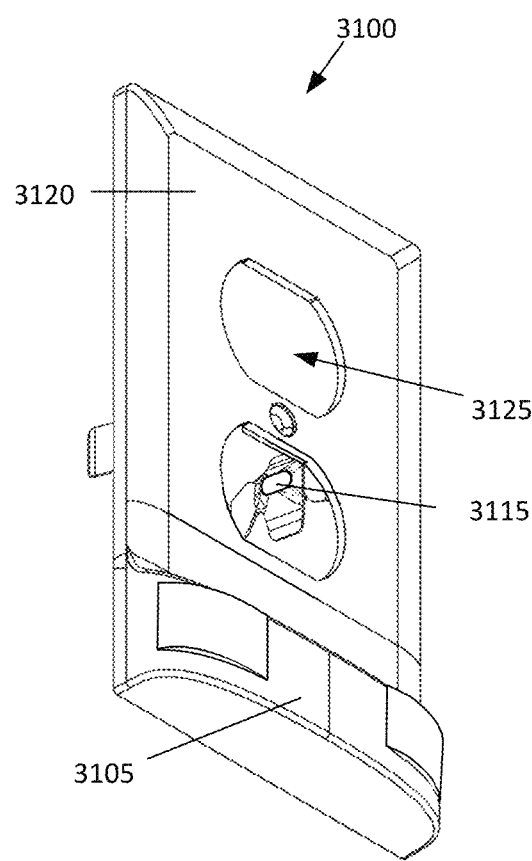
Figure 44G:
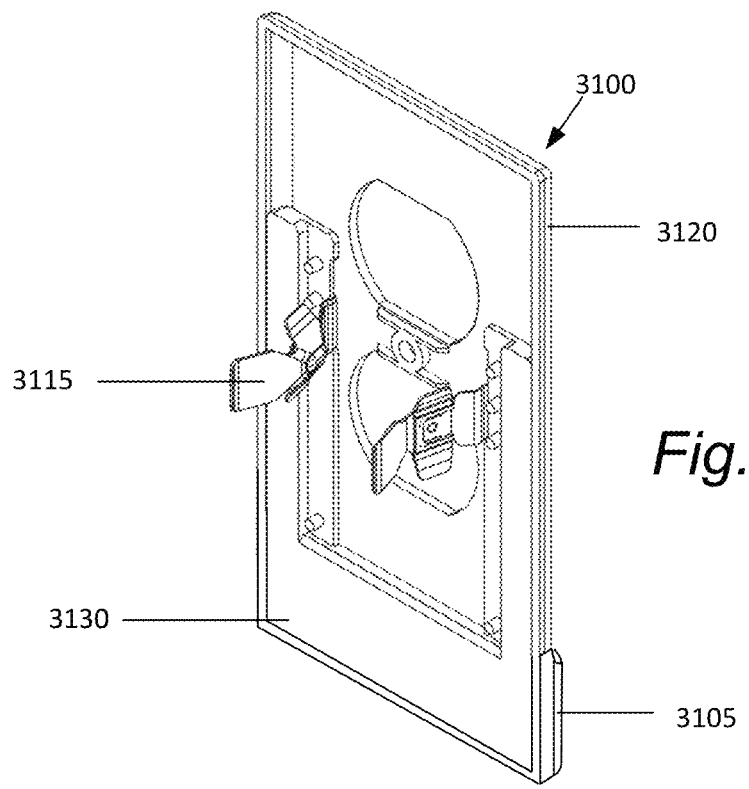
Figure 44H:
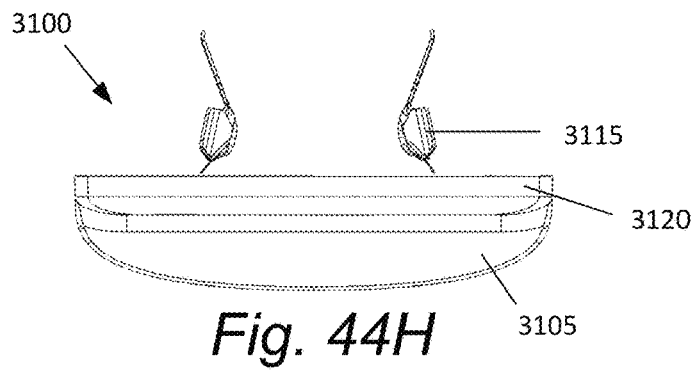
Figures 44I, 44J:
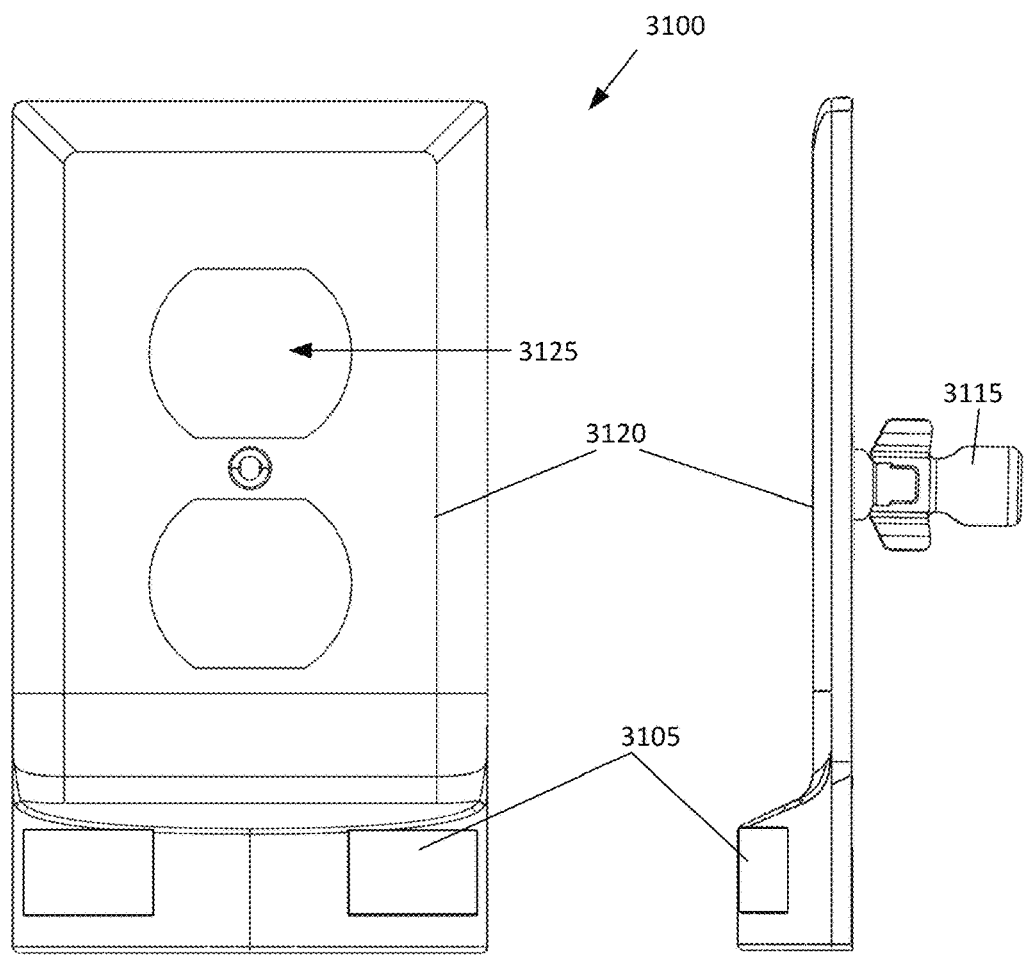
Figure 44K:
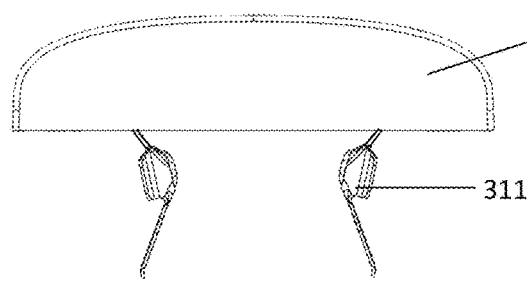
Figures 44A, 44Z:
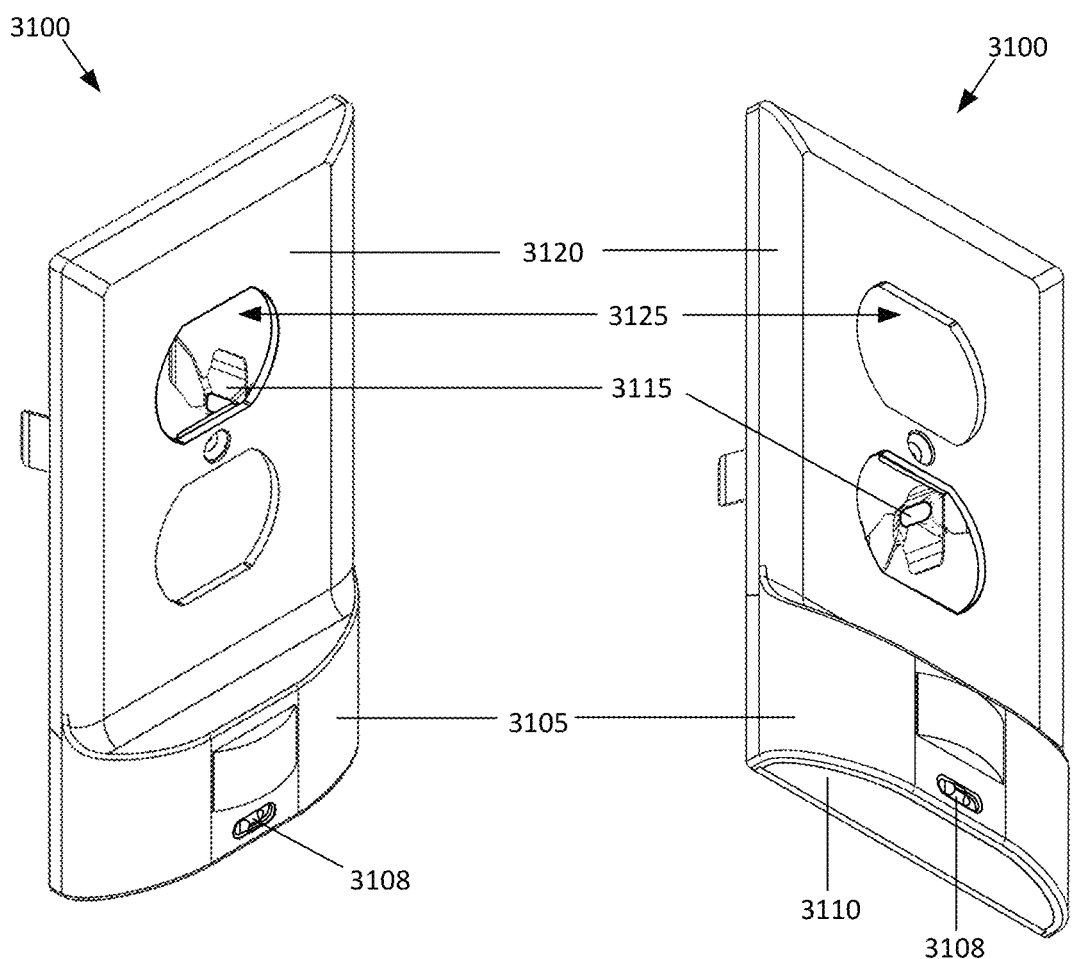
Figure 44A:
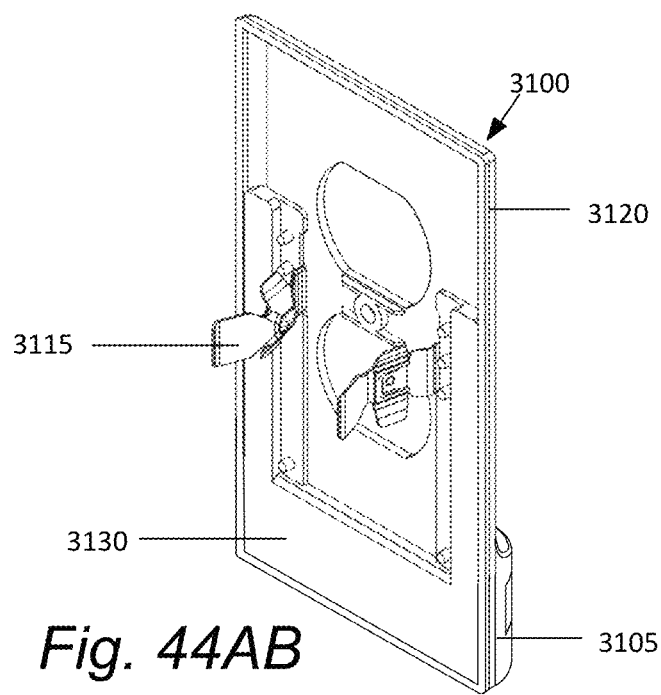

FIGS. 44A-44II show various illustrative examples of an active cover plate (3100) with a protrusion that provides additional volume for circuitry and/or sensors. FIG. 44A is a top view of the active cover plate (3100). FIGS. 44B, 44C, 44D, 44E, 44F, and 44G are, respectively, a front view, a side view, a bottom view, front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. In this example, the protrusion (3105) includes two windows for motion sensors that arch outward from the primary curve of the protrusion. These windows are placed on either side of the protrusion and may provide additional sensitivity and wider viewing angles for the motion sensor.

Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate.

In the example shown in FIGS. 44A-44G, the active cover plate (3100) includes a faceplate (3120) and prongs (3115) that are configured for connection to outlet receptacles. FIGS. 43E and 43F are front perspective views of the active cover plate (3100) and show the apertures (3125) in the faceplate (3120) and protrusion (3105). FIG. 44G shows a rear view of the active cover plate (3100) with the faceplate (3120) including the prongs (3115) and back plate (3130).

FIGS. 44H-44N show a different embodiment of the active cover plate (3100). In this embodiment, the windows for the motion sensors are flush with the exterior curve of the protrusion. FIGS. 44H, 44I, 44J, 44K, 44L, 44M, 44N are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. The available orientations may be subject to several limitations. For example, the orientation may be limited by obstructions around the electrical receptacle such as moldings or counters. The orientation may be limited by the ability of the prongs to contact the side screws or other electrified portions of the electrical receptacle.

FIGS. 44O-44U show a different embodiment of the active cover plate (3100). FIGS. 44O, 44P, 44Q, 44R, 44S, 44T, and 44U are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. This embodiment includes a switch/lens cover (2208) located on the protrusion. The switch/lens cover (2208) may serve one or more functions in this and other embodiments. It may be a light transmissive cover over a light sensor. This cover may have light focusing and/or light dispersive characteristics. It may be a manually manipulatable connection to a switch. It may be used as both of these functions at the same time. It may also have a variety of other functions such as covering or providing access to other sensors or actuators. Light pipe (3310) is also shown in FIGS. 44R and 44T. All or part of the lower surface of the active cover plate could be used as the light pipe. Additionally or alternatively, the light pipe(s) could be formed on other faces or edges of the active cover plate.

FIGS. 44V-44BB show a different embodiment of the active cover plate (3100). FIGS. 44V, 44W, 44X, 44Y, 44Z, 44AA, and 44BB are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuitry. In this example, a motion sensor lens is shown in the protrusion and a switch/lens cover (2208) is located below the motion sensor lens.

Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. This embodiment includes a switch/lens cover (2208) located on the protrusion. The switch/lens cover (2208) may serve one or more functions in this and other embodiments. Light pipe (3310) is shown in FIGS. 44Y and 44AA.

FIGS. 44AC-44AI show a different embodiment of the active cover plate (3100). FIGS. 44AC, 44AD, 44AE, 44AF, 44AG, 44AH, and 44AI are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. Apertures (3125) in the faceplate (3120) are configured to accept the electrical receptacle over which the active cover plate (3100) is configured to be fastened. In this embodiment, the apertures (3125) are configured to fit over a duplex outlet. As discussed and shown herein, the protrusion (3105) may have a wide range of shapes and be adapted to a variety of sensors and circuitry. In this example, a motion sensor lens is shown in the protrusion and a switch/lens cover (3108) is located below the motion sensor lens. The protrusion (3105) in this example is located closer to the bottom aperture and as a result, the overall vertical dimension of the plate is smaller. Light pipe (3310) is shown in FIGS. 44Y and 44AA.

Figure 45F:
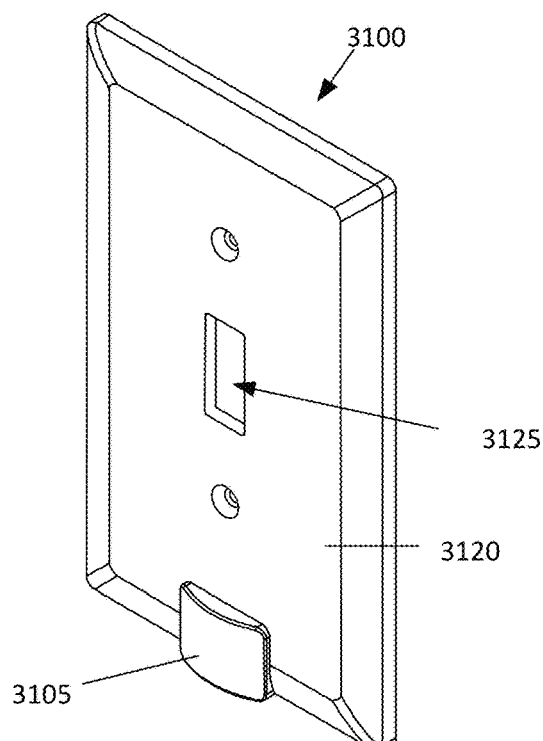
Figure 45G:
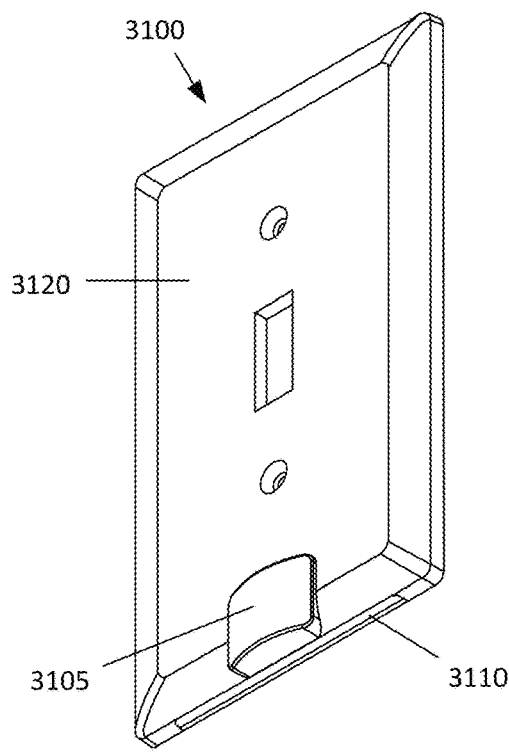
Figure 45H:
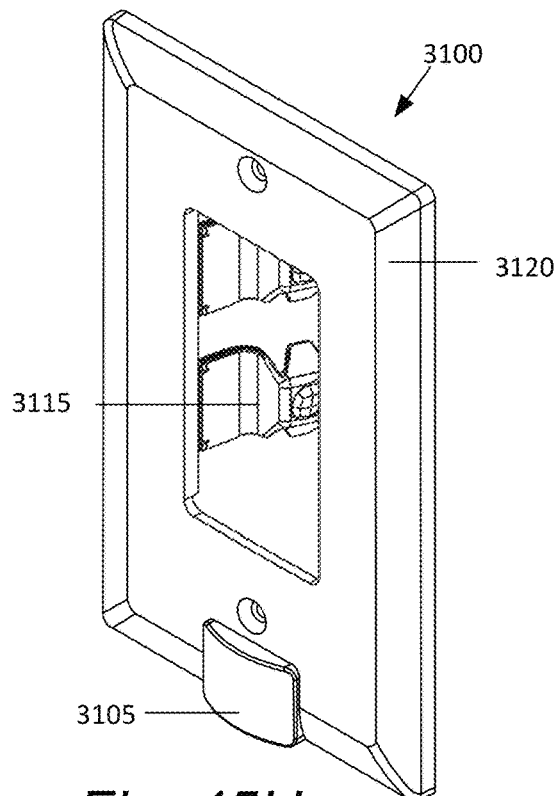
Figure 45I:
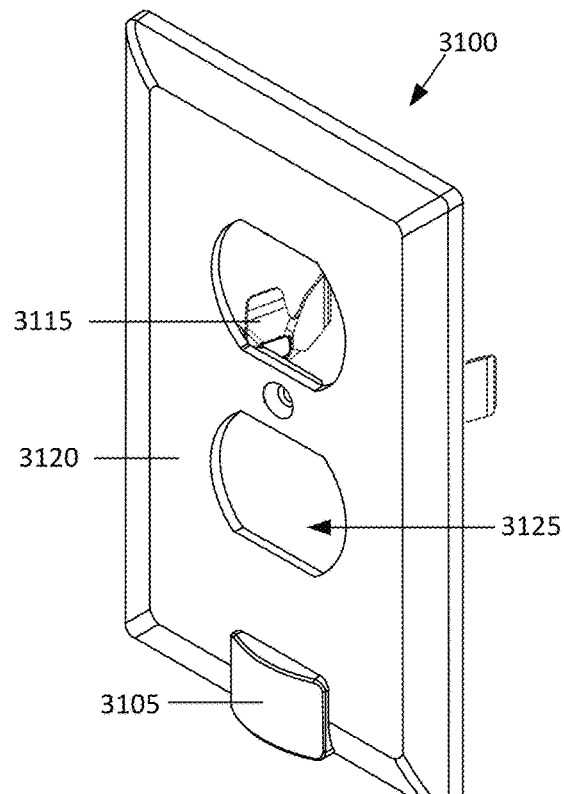

FIGS. 45A-45I show illustrative examples of an active cover plate (3100) with a protrusion that provides additional volume for circuitry and/or sensors. FIG. 45A is a top view of the active cover plate (3100). FIGS. 45B, 45C, 45D, 45E, 45F, and 45G are, respectively, a left-side view, a front view, a right-side view, a bottom view, a front perspective view, and another front perspective view of the active cover plate (3100). The active cover plate includes an aperture (3125), in the faceplate (3120) with the protrusion (3105) extending from the face plate. Although prongs can be used in conjunction with this design, the prongs are not shown in these figures, but are shown in numerous other figures herein. In this embodiment, the faceplate (3120) is configured to be compatible with a toggle light switch (3125). However, as with any of the previous designs, the faceplate may be configured to be compatible with any of a variety of electrical receptacles. For example, FIG. 45H shows a faceplate with an aperture that is compatible with a décor outlet or a rocker light switch. The prongs in FIG. 45H are configured for a rocker light switch but a variety of prongs compatible with a décor outlet could be attached to the faceplate. FIG. 45I shows an active cover plate (3100) with apertures (3125) and prongs (3115) for a duplex outlet. FIGS. 45A-45I also show a protrusion (3105) that extends from the front the faceplate (3125) with prongs (3115) extending from the rear of the faceplate. In this case the protrusion is an arched rectangular shape. However, as discussed and shown herein, the protrusion (3105) may have a wide range of shapes and be adapted to a variety of sensors and circuitry.

Figure 46A:
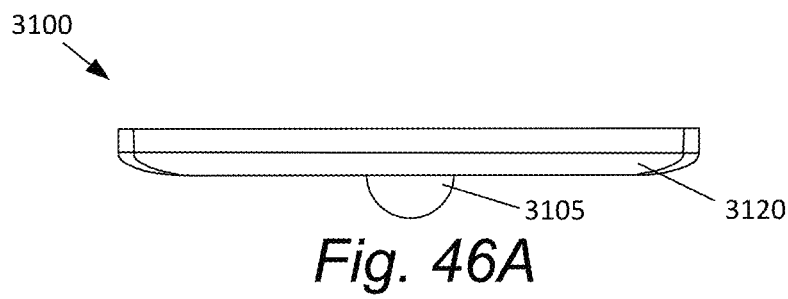
FIGS. 46A-46R show illustrative examples of active cover plates with additional functionality, according to one example of principles described herein.
Figures 46B, 46C, 46D:
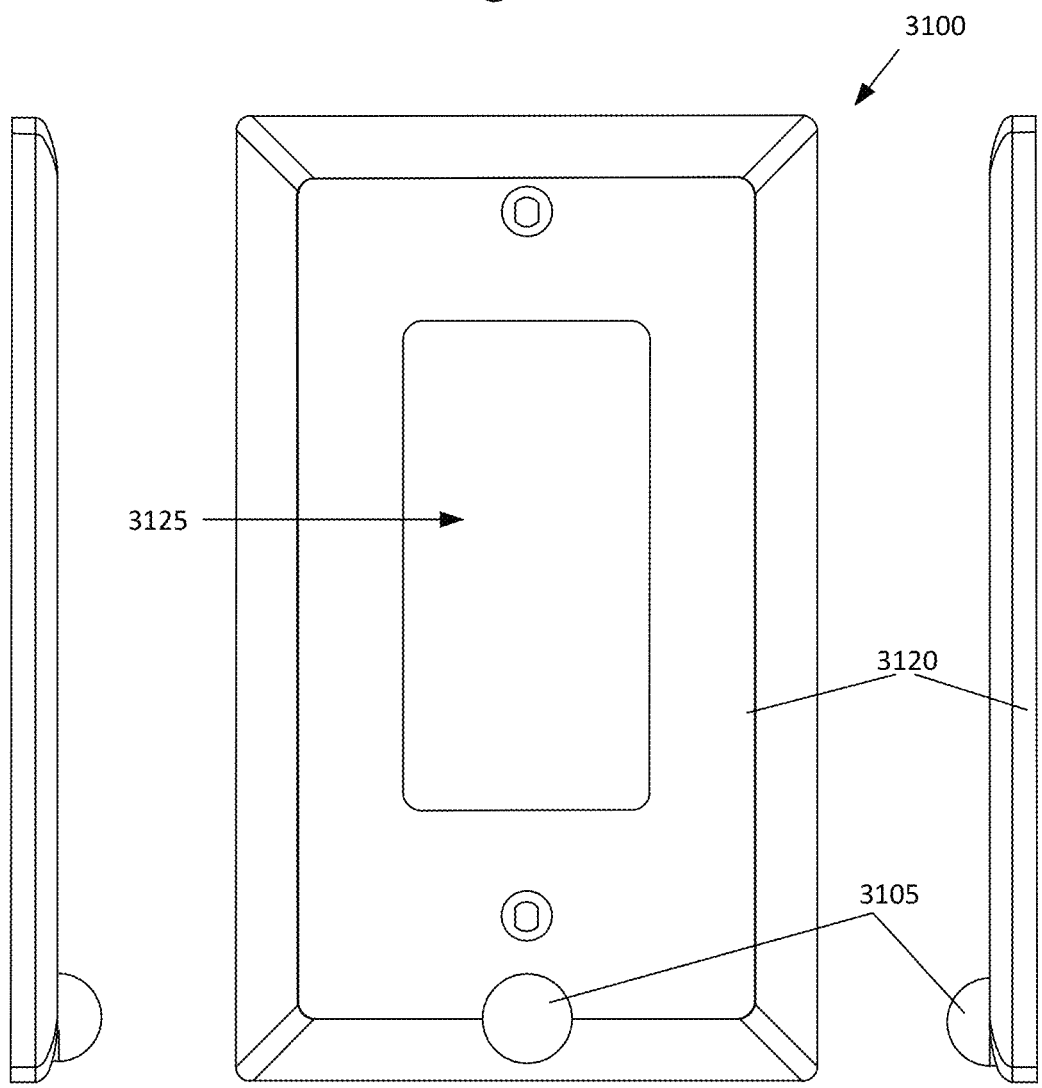
Figure 46E:
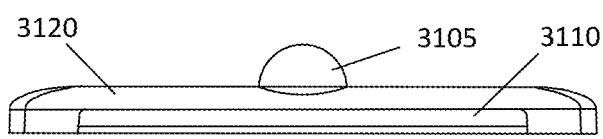

FIGS. 46A-46L show illustrative examples of an active cover plate (3100) with a protrusion that provides additional volume for circuitry and/or sensors. FIG. 46A is a top view of the active cover plate (3100). FIGS. 46B, 46C, 46D and 46E are, respectively, a left-side view, front view, a right-side view, and a bottom view of the active cover plate (3100) configured with a faceplate (3120) for use over a décor outlet, a GFCI outlet, or a rocker light switch. In this embodiment, the faceplate (3120) contains an aperture (3125) which is configured to be compatible with a rocker light switch, a décor outlet, or a GFCI outlet because all of these electrical receptacles have the same perimeter shape that extends through the cover plate. Although prongs can be used in conjunction with this design, the prongs are not shown in these figures, but are shown in numerous other figures herein. One specific example is shown in FIG. 46K, which is a perspective view of the active cover plate (3100) with prongs (3115) for connection to a rocker light switch visible through the aperture (3125) in the face plate (3120).

Figure 46F:
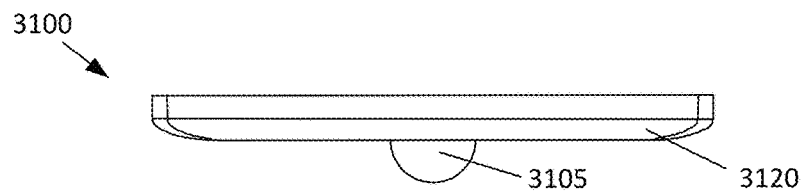
Figures 46G, 46H, 46I:
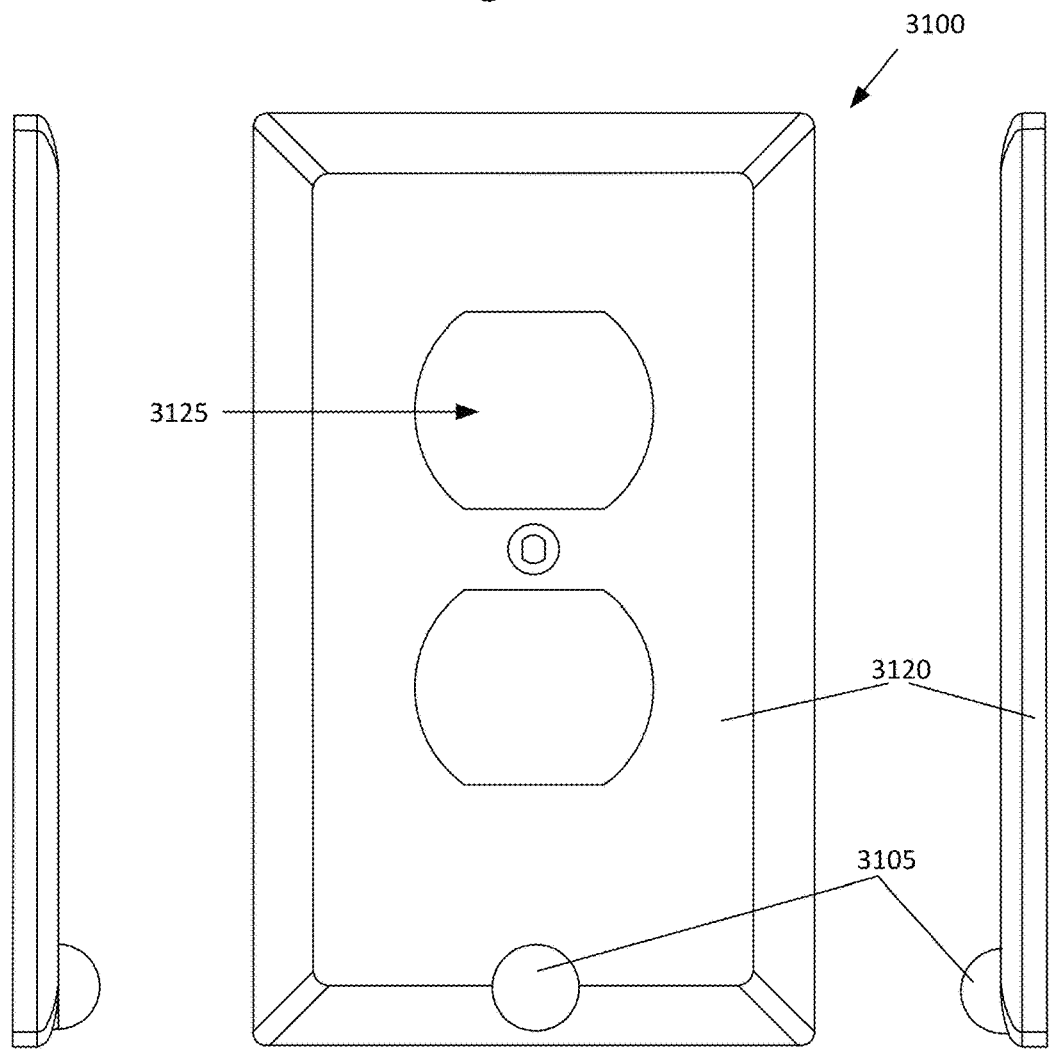

However, as with other designs taught herein, the faceplate may be configured to be compatible with any of a variety of electrical receptacles. For example, FIGS. 46F-46J show a faceplate with an aperture that is compatible with a duplex outlet. Specifically, FIG. 46F is a top view of the active cover plate (3100). FIGS. 46G, 46H, 46I, 46J and 46L are, respectively, a left-side view, front view, a right-side view, a bottom view and a front perspective view of the active cover plate (3100) configured with a faceplate (3120) with an aperture (3125) for use over a duplex outlet.

Figure 46J:
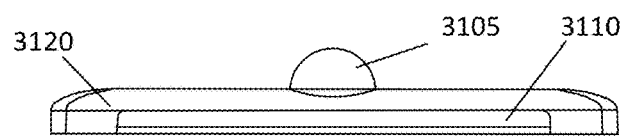
Figure 46R:
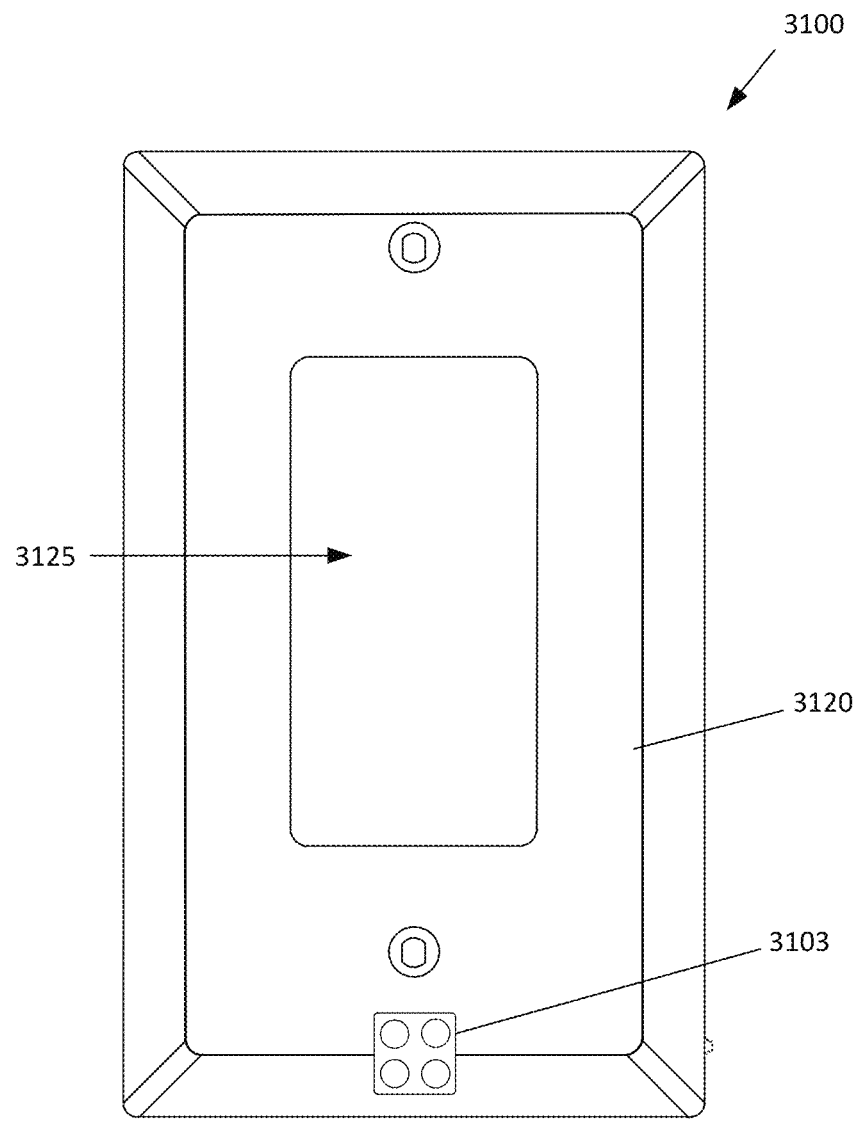

FIGS. 46A-46L also show a protrusion (3105) that extends from the front of the faceplate (3120) with prongs (3115) extending from the rear of the faceplate. In this case the protrusion has a domed circular shape. However, as discussed and shown herein, the protrusion (3105) may have a wide range of shapes and be adapted to a variety of sensors and circuitry. FIGS. 46J, 46K, and 46L show one example of a light pipe (3110) or other aperture that could be used for various purposes. The light pipe (3110) or aperture could have any of a variety of shapes and sizes, including those that are shown herein (see e.g. 24A-24L).

FIGS. 46M-46R show one example of an active cover plate (3100) that includes a face plate (3120) with at least one aperture (3125) and motion sensor (3103). As discussed above, the at least one aperture (3125) may be configured to accept any of a variety of electrical receptacles including duplex outlets, décor outlets, toggle switches, rocker switches, and any other appropriate electrical receptacle. FIG. 46M is a top view of the active cover plate, FIG. 46N is a left side view, FIG. 46O is a front view, FIG. 46P is a right-side view, and FIG. 46Q is a bottom of view of the active cover plate (3100). The bottom view in FIG. 46Q also shows a light pipe (3110). This light pipe may have any of a variety of configurations, including those shown herein with respect to other figures. The motion sensor (3103) in this example has a relatively low profile and may use a different geometric sensing and/or algorithmic approach to IR motion sensing than larger PIR motion sensors. The thinner PIR sensor may have any number of configurations, including a multi-lens configuration. This and other active cover plate (3100) shown herein may have any number of additional features, such as one or more switches (3111) that may allow for configuration of any of a number of features. These features may include illumination duration, sensing parameter adjustment, lighting parameter adjustment, transmitting or receiving parameter adjustment. In this example, the rear of the active cover plate (3100) is not shown. The switch(es) may be at any desired location on the active cover plate, including one or more of the sides, the front, or the rear of the active cover plate. The rear of the active cover plate is not visible when the active cover plate (3100) is installed. However, the rear of the active cover plate may have any of a variety of different connections to the electrical receptacle, including pins, prongs, pigtails, etc.

Figure 47F:
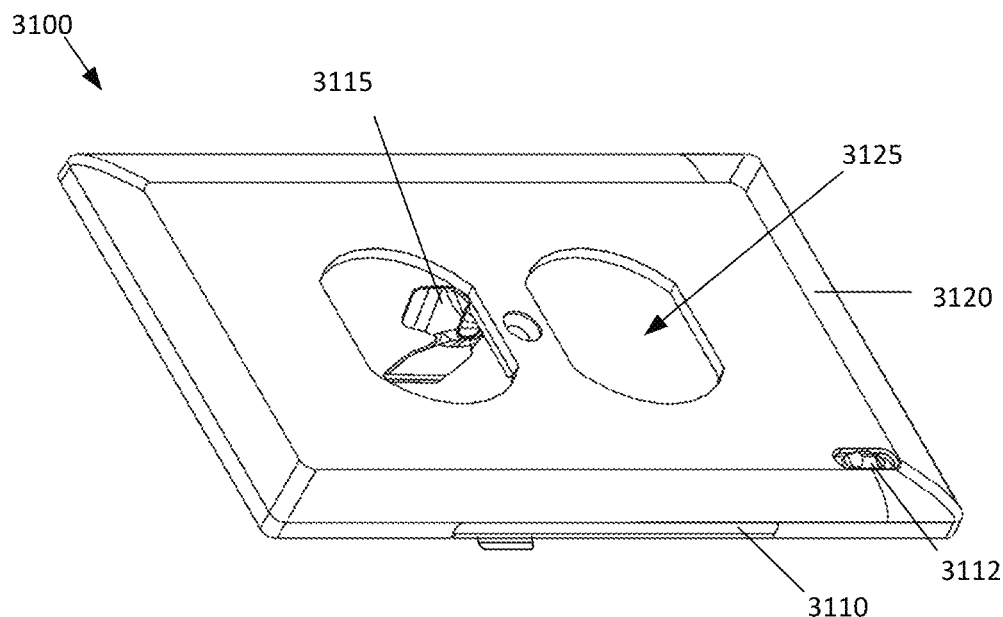
Figure 47G:
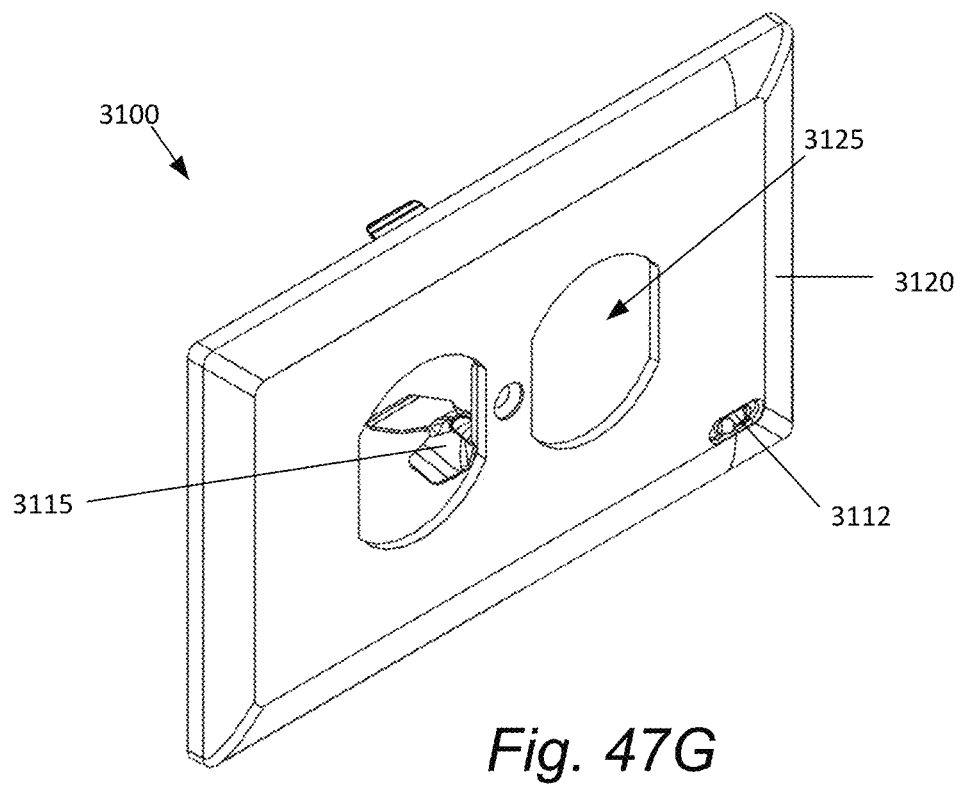

FIGS. 47A-47G, 48A-48E, and 49A-49G show examples of active cover plates (3100) that include a light pipe or other aperture (3110) along one of the long edges of the faceplate. As discussed previously, the light pipe (3110) may be formed from plastic and may serve multiple purposes, including protecting the circuitry and guiding light produced from internal elements to an exterior of the active cover plate. In the example shown in FIGS. 47A-47G the active cover plate (3100) includes a face plate (3120) with apertures (3125) configured to receive a duplex outlet. FIG. 47A is a top view of the active cover plate (3100). FIGS. 47B, 47C, 47D, and 47E are front, bottom, left, and right views, respectively of the active cover plate. Prongs (3115) extend from the rear of the face plate (3120). As discussed above, the prongs (3115), apertures (3125) and light pipe(s) (3110) may take a variety of shapes, sizes, locations and combinations. For example, the light pipe (3110) may have any of the configurations (or variations thereof) shown in FIGS. 24A-24Q or other configurations. In this example, the active cover plate also includes a light sensor cover/switch (3112). As discussed above, this light sensor cover/switch (3112) may have a variety of shapes, sizes, and locations, including those described herein (see e.g. 24R-24AE).

FIGS. 48A-48E show one illustrative example of an active cover plate (3100) that includes a faceplate (3120) with a rectangular aperture (3125) that is configured to fit over décor outlets, GFCI outlets and rocker switches. FIGS. 48A, 48B, 48C, 48D and 48E are, respectively, a top view, a front view, a bottom view, a left side view and a right side view. In this case the prongs (3115) are configured for connection to a GFCI outlet. The light pipe (3110) is located on a longer edge of the faceplate (3120). The light sensor cover/switch (3112) is located in one of the corners of the faceplate. Although the light pipe (3110) is shown on a specific side/edge, it may be located on other sides/edges or in combination with of two or more edges or faces. Further, the light pipe (3110) may have a variety of shapes and sizes.

FIGS. 49A-49G show one illustrative example of an active cover plate (3100) with a light pipe (3110) along one or more of the long edges of the faceplate (3120). FIGS. 49A, 49B, 49C, 49D, 49E, 49F and 49G are, respectively, a top view, a front view, a bottom view, a left side view, a right side view, a front perspective view, and another front perspective view. In this example, an active cover plate (3100) includes a faceplate (3120) with two apertures (3125) and prongs (3115) that are configured to fit over duplex outlets. The light sensor cover/switch (3112) is located in one of the corners of the faceplate. The light pipe (3110) is located on a longer side of the faceplate (3120) and wraps around the edge of the faceplate. Although the light pipe (3110) is shown on a specific side/edge, it may be located on other sides/edges or in combination with of two or more edges or faces. Further, the light pipe (3110) may have a variety of shapes and sizes as shown and described herein.

Figure 49F:
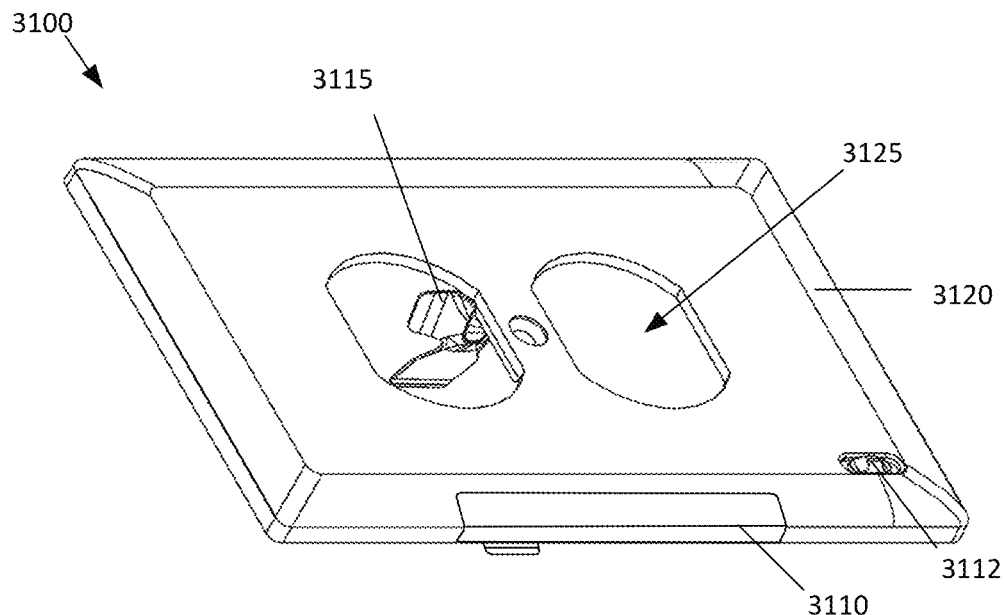
FIGS. 49A-49AG show illustrative examples of active cover plates with integrated functionality, according to one example of principles described herein.
Figure 49G:
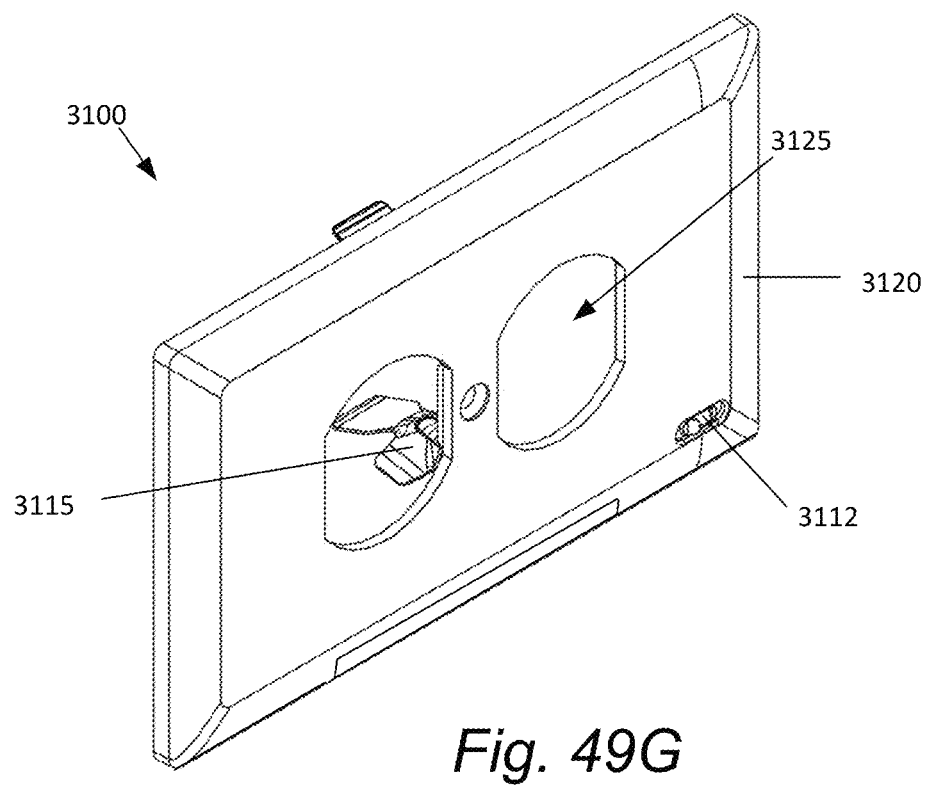
Figure 49H:
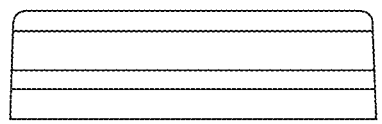
Figure 49I:
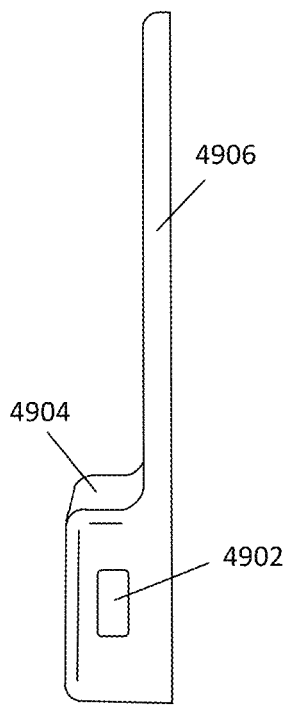
Figure 49J:
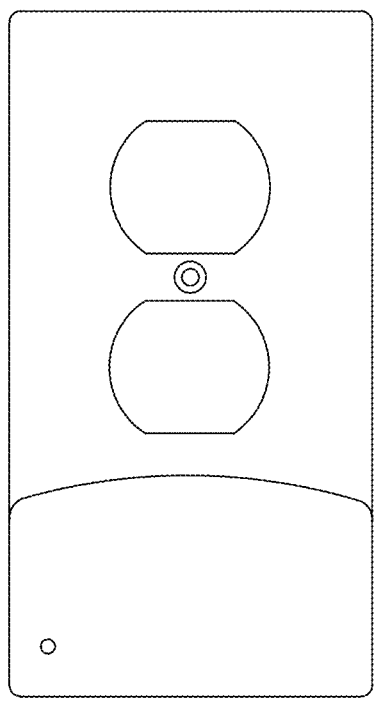
Figure 49K:
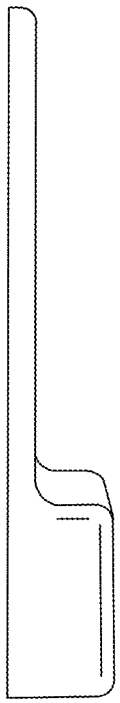
Figure 49L:
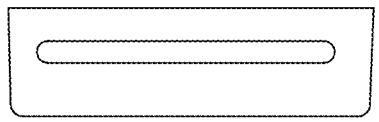
Figure 49M:
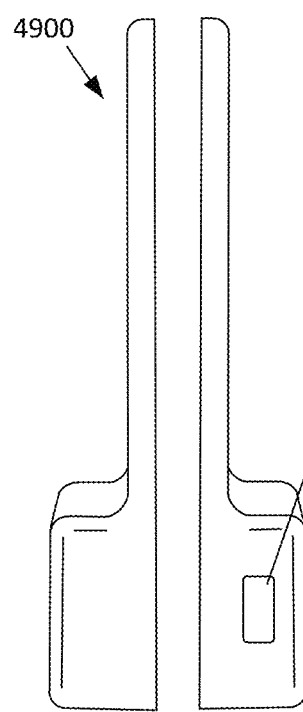
Figure 49N:
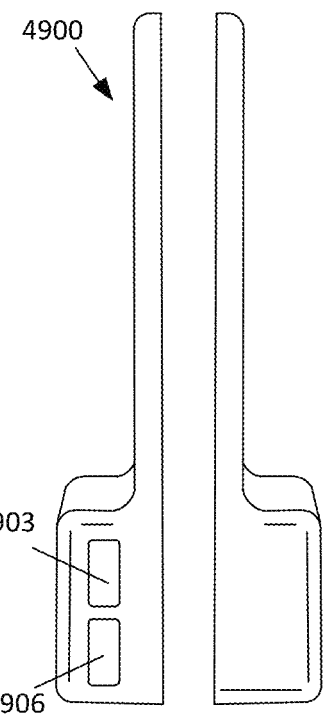
Figure 49O:
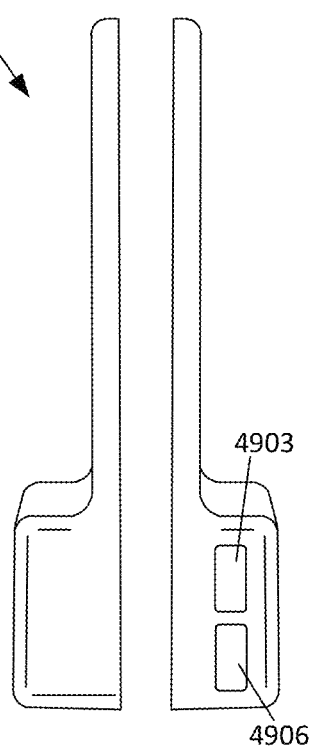
Figure 49P:
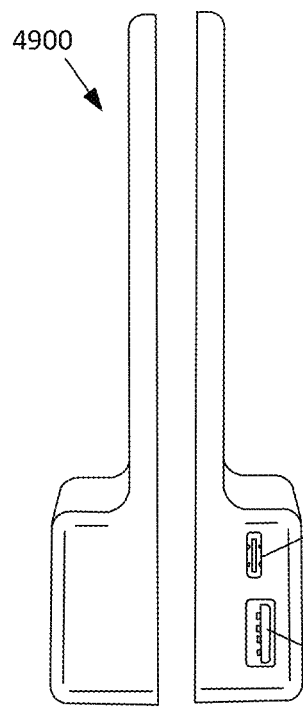
Figure 49Q:
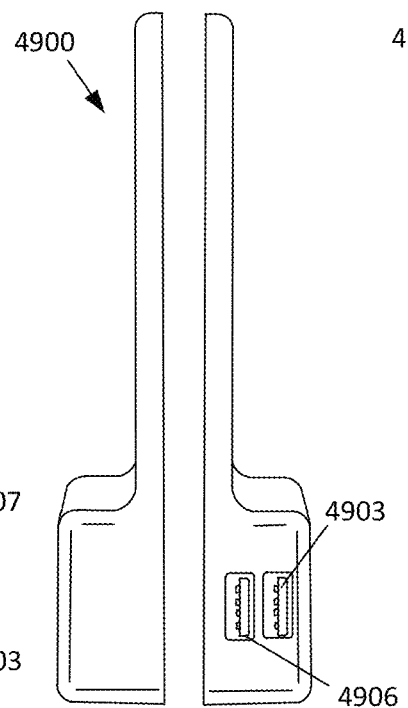
Figure 49R:
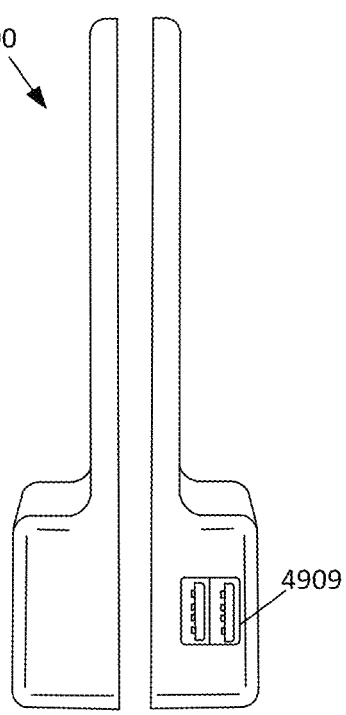
Figure 49S:
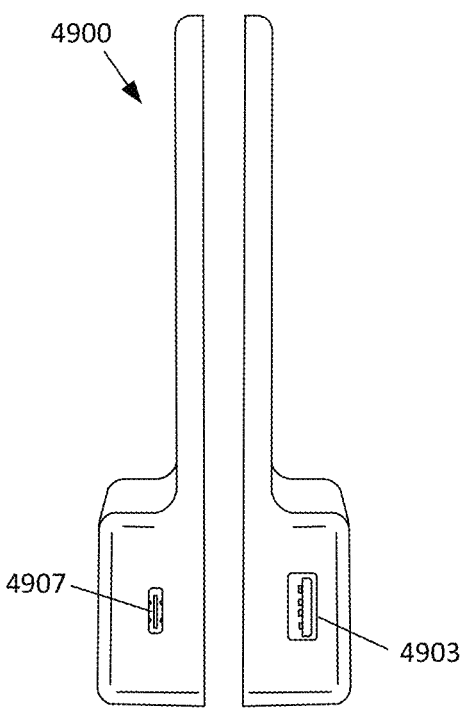
Figure 49T:
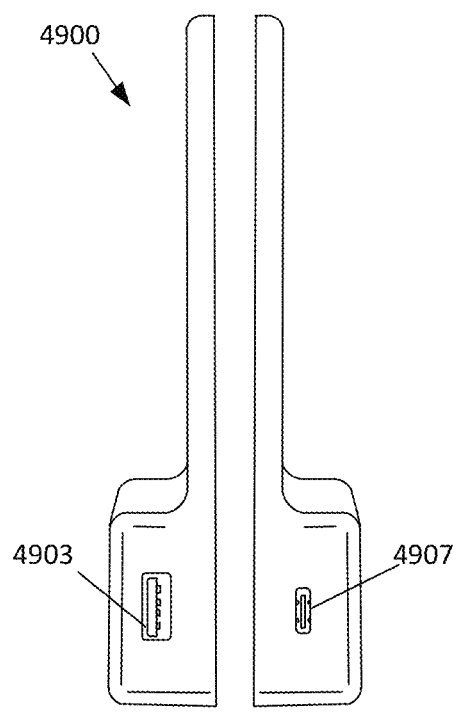
Figure 49Z:
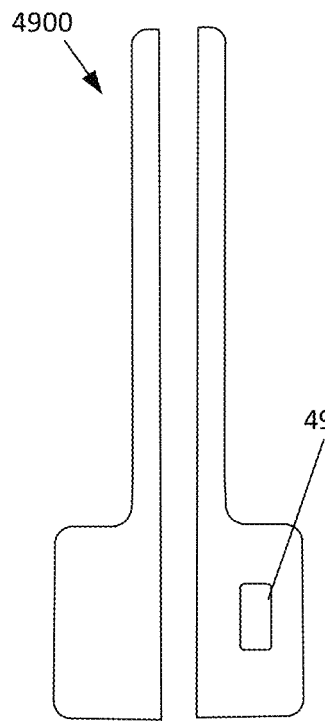
Figure 49A:
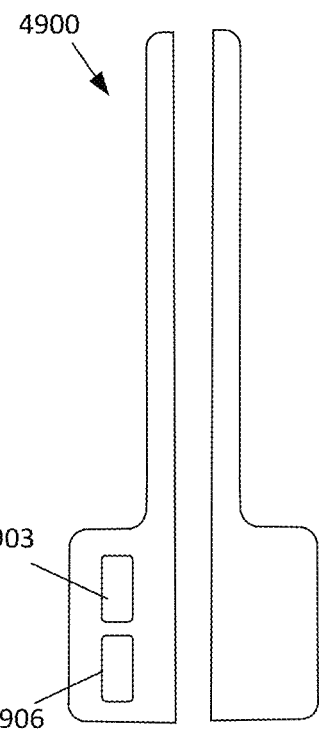
Figure 49A:
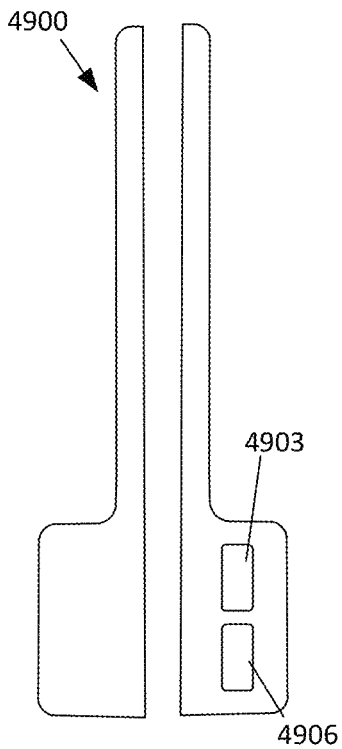
Figure 49A:
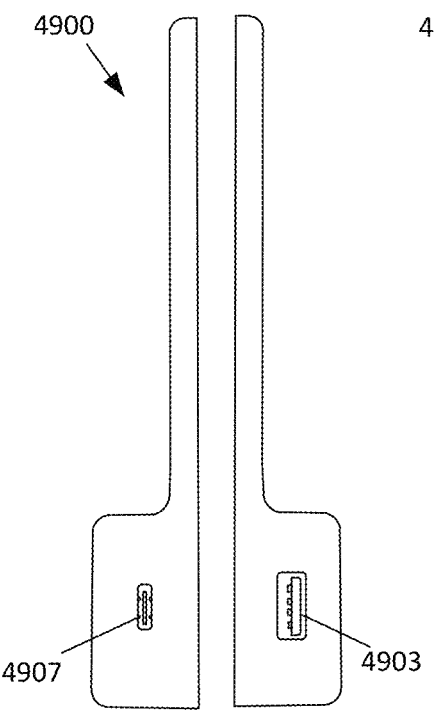
Figure 49A:
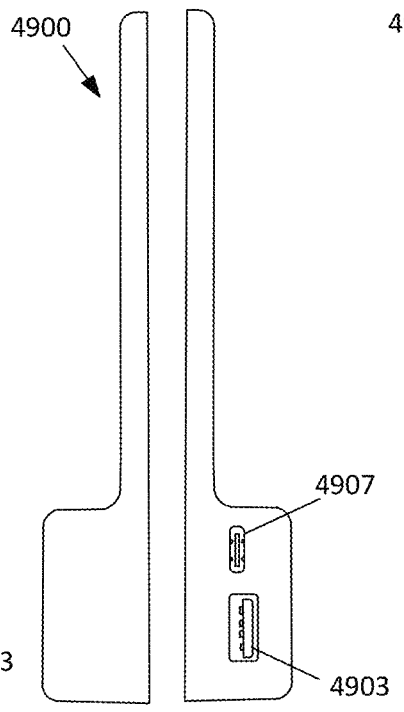
Figure 49A:
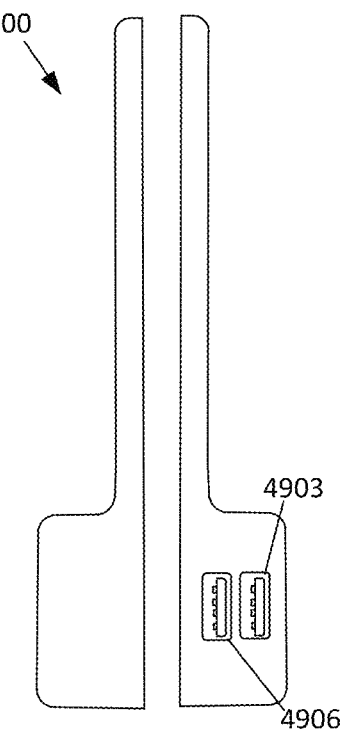

FIGS. 49H-49AG show examples of active cover plates (4900) that include a face plate (4906) and variety of charging port(s) (4902) that provide access to power. A protrusion (4904) may provide additional volume for the power conversion/conditioning circuitry. Any number of other features may be present including, but not limited to, switches, sensors, light pipes and other desired features. As discussed above, the active cover plate may have any number of apertures to accept features of the electrical receptacle over which it is installed. FIG. 49H shows a top view, FIG. 49I shows a left side view, FIG. 49J shows a front view, FIG. 49K shows a right-side view and FIG. 49L shows a bottom view of one illustrative example of an active cover plate (4900) with ports (4902). In this example, there is only one port (4902) (USB A port in this example) on one side (left side) of the protrusion (4904). However, there may be any number of ports located on or near the protrusion. The ports may be located on the front, sides, rear, top or bottom of the protrusion. For example, in FIG. 49M, the port (4902) is located on the right side of the protrusion (4904). In FIG. 49N, there are two ports (4903, 4906) on the left side of the cover plate (4900) that are positioned vertically with respect to each other. In FIG. 49O, there are two ports (4903, 4906) on the right-hand side of the active cover plate (4900) that are positioned vertically with respect to each other. FIG. 49P shows that there are two different ports (4903. 4907) located on the right-hand side of the active cover plate (4900). The ports may be any of a variety of different ports including USB A and USB C ports. In this example, there is one USB C port (4907) located vertically above the USB A port (4903). FIG. 49Q shows two USB A ports (4903, 4906) located horizontally adjacent to each other. These ports may be located on either the right, left, front, top or bottom of the active cover plate. FIG. 49R shows a single connector (4909) that includes two USB A ports. FIG. 49S shows a USB A port (4903) located on the right side of the active cover plate (4900) and a USB C port (4907) located on the left side of the active cover plate. FIG. 49T shows an active cover plate (4900) with this positioning reversed. Again, the rear of view of the active cover plate (4900) is not shown because it is not visible during use. Any of a variety of connection mechanisms may be used to extract power from the electrical receptacle, including, but not limited to any appropriate mechanism shown herein or incorporated herein. Further, left/right and top/bottom port variations are equally applicable to either side. For example, a left side orientation of a port combination also teaches/describes a right side orientation, and a USB A port below a USB C port also teaches/describes a USB C port below a USB A port.

FIG. 49Y shows a top view, FIG. 49U shows a left side view, FIG. 49V shows a front view, FIG. 49W shows a right-side view and FIG. 49X shows a bottom view of one illustrative example of an active cover plate (4900) with ports (4902). In this example, there is only one port (USB A port in this example) on one side (left side) of the protrusion. However, there may be any number of ports located on or near the protrusion. The ports may be located on the front, sides, rear, top or bottom of the protrusion. For example, in FIG. 49Z, the port (4902) is located on the right side of the protrusion. In FIG. 49AA, there are two ports (4903, 4506) on the left side of the cover plate that are positioned vertically with respect to each other. In FIG. 49AB, there are two ports (4903, 4906) on the right-hand side of the active cover plate (4900) that are positioned vertically with respect to each other. FIG. 49AC shows two ports, one located on the right side (4903) and one located on the left side (4907). In FIG. 49AD there are two different ports (4903, 4907) located on the right-hand side of the active cover plate (4900). The ports may be any of a variety of different ports including USB A and USB C ports. In this example, there is one USB C port (4907) located vertically above the USB A port (4903). FIG. 49AE shows USB A two ports (4903, 4906) located horizontally adjacent to each over. This example, and other examples given herein are only illustrative embodiments. These and other ports may be located on either the right, left, front, top or bottom of the active cover plate. FIG. 49AF shows a single connector (4909) that includes two USB A ports on the left-hand side. In FIG. 49AG shows an active cover plate (4900) with this positioning reversed. Again, the rear view of the active cover plate (4900) is not shown because it is not visible during use. Additionally, the front, top and bottom views of some embodiments (e.g. FIGS. 49M-49T, 49Z-49AG) are not shown because these views would be a substantial duplicate of other figures previously presented (e.g. FIGS. 49H, 49J, 49L, 49Y, 49V, 49X). Consequently, this paper discloses at least 5 views of every embodiment (e.g. 49I and 49K, 49M-49T, 49U and 49W, 49Z-49AG) illustrated without undue repetition of figures that are the same for each embodiment. As discussed above, any of a variety of connection mechanisms may be used to extract power from the electrical receptacle, including, but not limited to, any appropriate mechanism shown herein or incorporated herein. In FIGS. 49A-AG, the images on the left and right may at times be referred to be referred to as "left side" and "right side". However, this may refer to the locations on the image on the printed pages, not the physical object. For example, the image could be located on the left, and consequently be called the "left side" but show the right side of the physical object.

FIGS. 50A-50J show one illustrative example of an active cover plate (5000) with a protrusion that provides additional volume for circuitry and/or sensors. The active cover plate (5000) may be configured to accept one or more inputs to change its state. For example, the active cover plate may sense motion using any of a variety of techniques, including ultrasound, radio frequency sensing, passive infrared (PIR) techniques or any other appropriate technology. Additionally or alternatively, the active cover plate may accept other signals that indicate it should change state. For example, the active cover plate may sense motion (such as an individual entering the room) using a PIR sensor (or any other appropriate technique) and brighten to provide additional illumination in the room. Additionally or alternatively, the active cover plate may be controlled using wireless or wired signals. For example, the active cover plate may receive a signal that indicates a trigger has been reached (such as motion being detected by another active cover plate, an app communicating with the active cover plate, a remote control device sending a signal to the active cover plate) and adjust its state in response to that communication. The signals may be power-line communication or wireless communication.

Figure 50A:
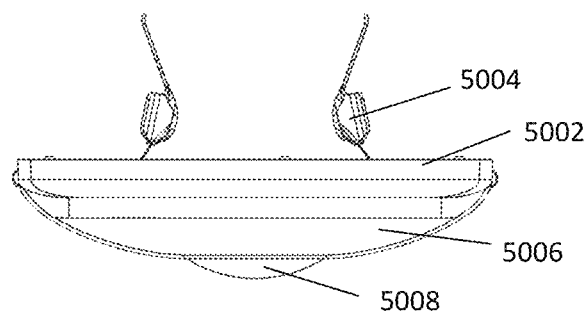
FIGS. 50A-50X show illustrative examples of active cover plates with protrusions that provide additional volume for circuitry and/or sensors, according to one example of principles described herein.

FIG. 50A is a top view of an active cover plate (5000) that shows a faceplate (5002), with prongs (5004) extending from the rear of the active cover plate, a protrusion (5006) extending from the front of the faceplate, and a PIR lens (5008) extending from the front of the protrusion.

Figure 50B:
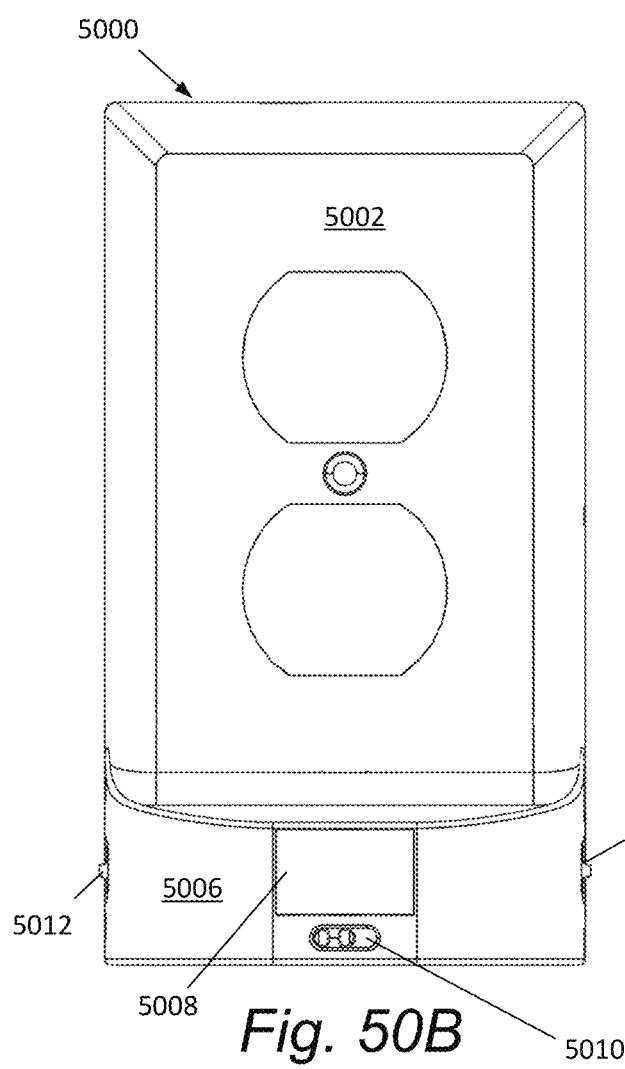

FIG. 50B is a front view of an active cover plate (5000), showing a faceplate (5002) that has two duplex holes passing through it, and a protrusion (5006) extending from the front of the faceplate and a PR lens (5008) extending from the front of the protrusion. In this example, the active cover plate includes three switches (5010, 5012, 5018) that can be used to manually configure parameters relating to the function of the active cover plate (5000).

Figure 50C:
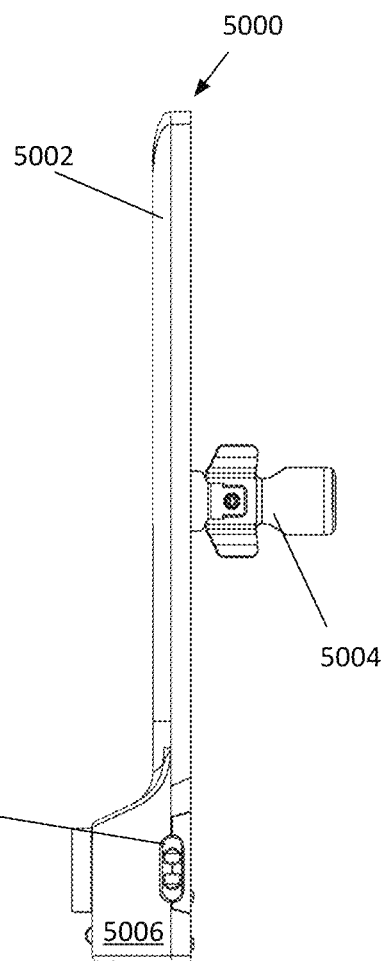

FIG. 50C is a right side view of an active cover plate (5000) showing the faceplate (5002) with the prongs (5004) extending from the rear of the faceplate (5002) and a protrusion (5006) extending from front of the faceplate. The right switch (5018) is also shown on the right side of the protrusion/face plate.

Figure 50D:
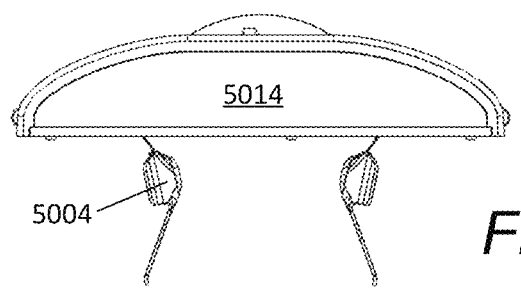

FIG. 50D is a bottom view of an active cover plate (5000) showing one example of a transparent or translucent window (5014) through which light can be transmitted to illuminate the surrounding area. Also shown are the prongs (5004) that are used to extract electrical power from an electrical outlet.

FIG. 50E and FIG. 50F are a rear view and a left side view, respectively, of an active cover plate (5000) showing a backplate (5016) that is connected to a rear surface of the face plate (5002). In this example, a base of the prongs (5004) are sandwiched between the face plate and the back plate. FIG. 50F shows the faceplate (5002) with prongs (5004) extending out of the rear of the faceplate (5002) and a protrusion (5006) extending from a front face of the faceplate (5002).

Figure 50G:
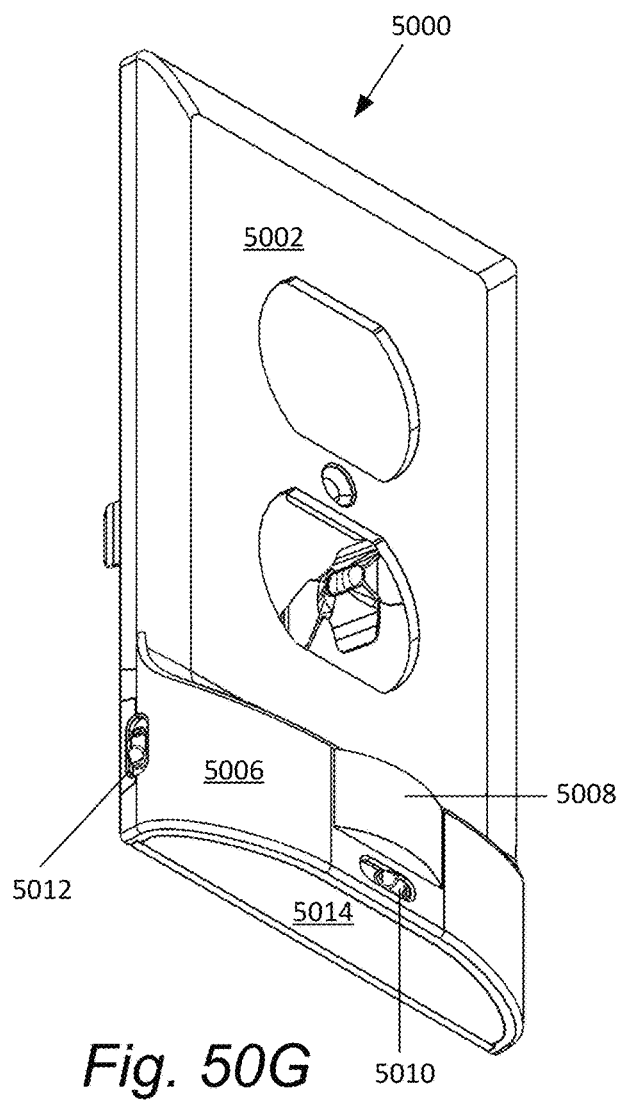

FIG. 50G is a bottom perspective view of an active cover plate (5000), showing the transparent or translucent window (5014) on the bottom side of the protrusion (5006), the front switch (5010) and one example of a PIR lens (5008). The left switch (5012) is also shown.

Figure 50H:
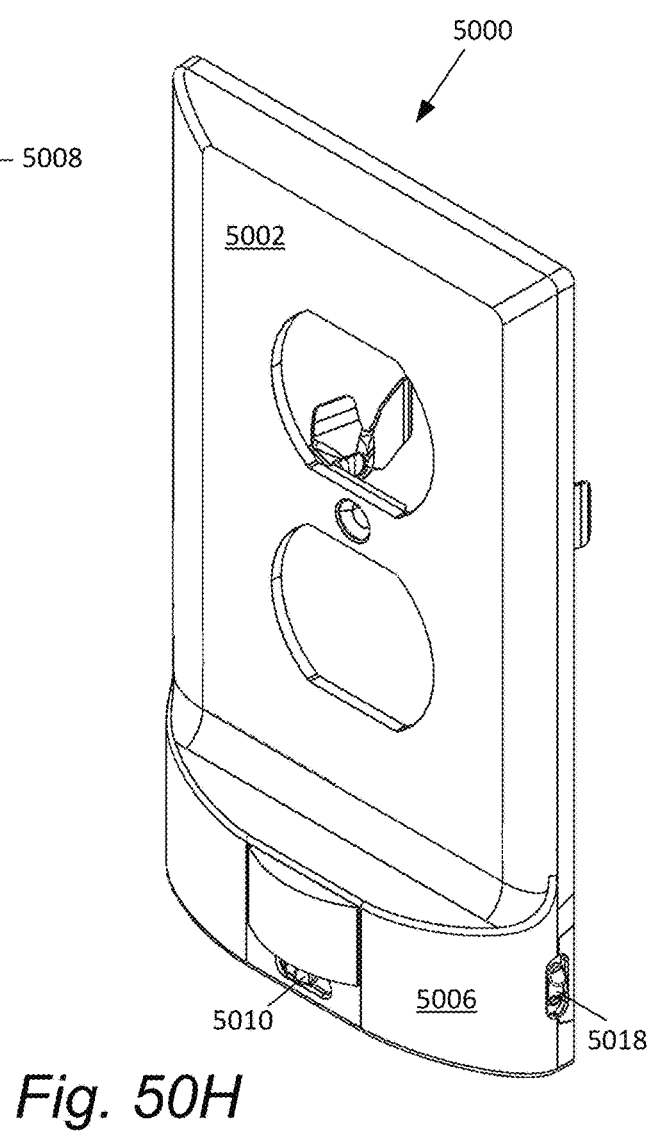

FIG. 50H is top perspective view of an active cover plate (5000) showing the face plate (5002), protrusion (5006), front switch (5010), and the right-side switch (5018). The active cover plates (5000) shown in FIGS. 50A-50H may be controlled by any combination of light sensors, motion sensors, and/or electrical signals.

FIG. 50I is a front view of an active cover plate (5000) with the PR lens (e.g. 5008, FIG. 50G) removed to show the PR sensor (5020) and the light sensor (5022), both of which reside in a cavity behind the PIR lens. FIG. 50J shows an illustrative embodiment of the active cover plate (5000) with the backplate removed to show the circuit board (5026) which is supplied with power by conductors (5024) connecting the prongs (5004) to the circuit board. The circuit board (5026) may have a variety of shapes and may provide a variety of functionality for the active cover plate (5000).

FIGS. 50K, 50L and 50M show views of the left, front and right switches according to one embodiment of principles described herein. The switches may be any appropriate type of switch including push button switches, toggle switches, momentary switches, touch sensitive switches, multiple position switches, etc. In this example, FIG. 50K shows the left switch (5012) which may be used to select one of three different zones for the active cover plate. As discussed herein, zones or groups may refer to active cover plates and other devices that interact to share information and/or take combined action. For example, when one unit senses motion, it may transmit a signal that is received and processed by other units in the group. All the units in the group can then use the information to take appropriate action (e.g. illuminating). Units outside of the group may or may not receive a signal from units outside of the group but will not take action based on the information. FIG. 50L shows the front switch (5010) which allows the user to select three different levels of brightness for the active cover plate lights. These brightness levels are OFF, LO, and HI. FIG. 50M shows the right switch (5018) which allows the user to select the On-time setting of the active cover plate. This setting allows the user to change how long the light remains on after motion stops being detected by the sensor in the active cover plate. These settings may have any appropriate time periods. For example, this setting allows the user to select 10 seconds, 30 seconds, and 60 seconds as the ON time or the settings may be 15 seconds, 1 minute, and 5 minutes, or any other appropriate time.

Figure 50T:
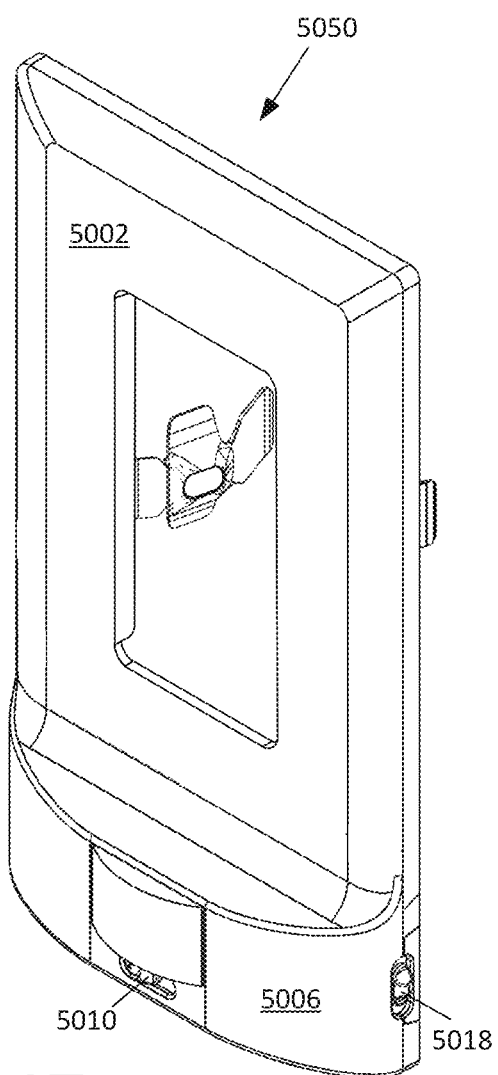
Figure 50U:
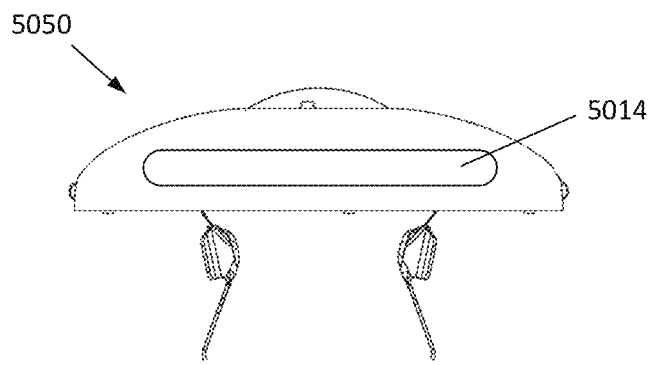

FIGS. 50N through 50T show an active cover plate (5050) that is configured to be installed over a décor outlet. The active cover plate (5050) may also be configured to be installed over a GFCI outlet if appropriate prongs were attached to the rear of the faceplate (5002). In the embodiment shown in FIGS. 50N through 50T, the active cover plate (5050) includes a face plate (5002), prongs (5004) extending from the face plate, a protrusion (5006), at least one sensor (5008, showing a PIR motion sensor/lens), and three switches (5010, 5012, 5018) and a light source/light pipe (5104). In this example, FIG. 50N is a top view of the active cover plate (5050) and FIGS. 50O, 50P, and 50Q are front, right side, and bottom views, respectively. In this example, the left side view may be substantially similar to the right side view and the rear of the cover plate is not visible when the active cover plate is installed/in use. FIG. 50R shows a rear view of the active cover plate (5050) with the back plate (5016) installed. FIG. 50S shows a right side view of the active cover plate (5050). FIG. 50T shows a perspective view of the active cover plate (5050). As discussed herein, the active cover plate shown in FIGS. 50N-50T could be used in a variety of configurations and over a variety of different electrical receptacles including GFCI outlets, décor outlets, and toggle rocker switches. In some situations, the only external geometric change that is required for the active cover plate to be used with different electrical receptacles is that the active cover plate needs to be configured with appropriate prongs for the target electrical receptacle. This may include changes to mounting configurations to support the appropriate prongs. Other changes may also be made, including changes to the internal circuitry.

Figure 50V:
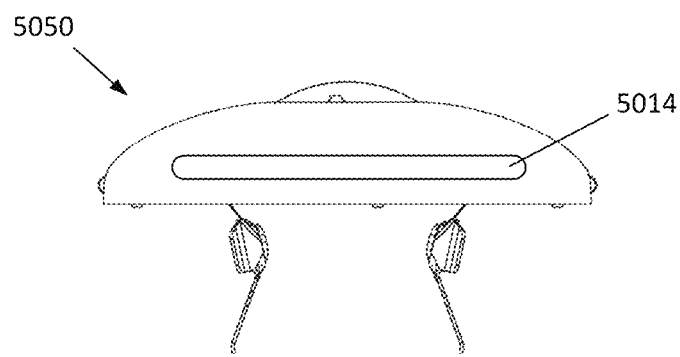
Figure 50W:
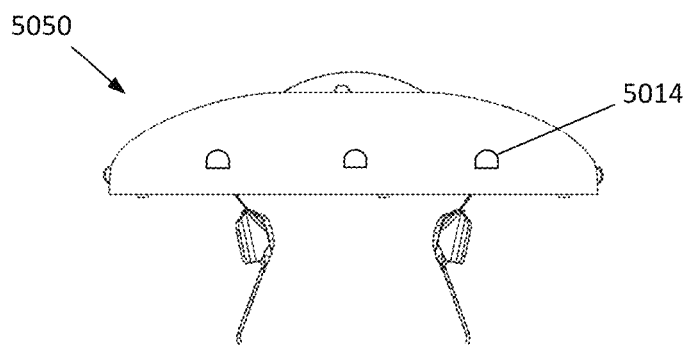
Figure 50X:
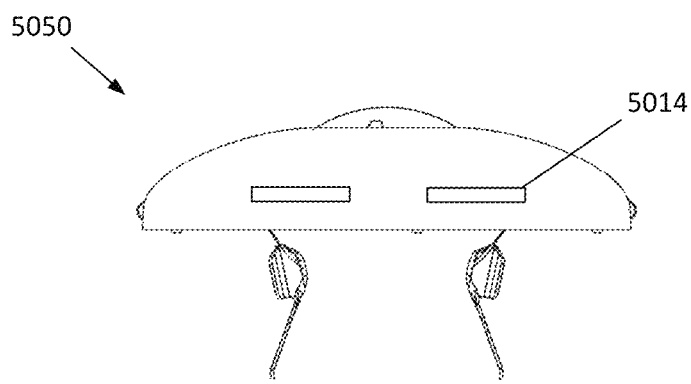

FIGS. 50U-50X show various configurations for light pipes (5014) on the bottom of the active cover plate (5050). For example, in FIG. 50U, the light pipe (5014) may be a relatively wide oval, racetrack shape, or rounded rectangle. In FIG. 50V, the light pipe (5014) may be narrower but may have approximately the same shape. The light pipe (5014) may have any of a variety of lengths, segments, and locations on the active cover plate (5050). For example, at least a portion of the light may be transmitted from the face of the active cover plate rather, or in addition to, light emitted from the bottom of the active cover plate. FIG. 50W shows a multiple segment light pipe (5014) that transmits light from an interior source to the exterior of the active cover plate (5050). FIG. 50X shows a light pipe (5014) shows that has multiple rectangular segments.

According to principles described herein, a nightlight may include a light source, a motion sensor that may be configured to produce a signal when motion is detected, a first user configurable switch that may be configured to group the nightlight with other compatible nightlights such that a wireless broadcast illuminates the other compatible nightlights in the group when motion is detected by the nightlight, a second user configurable switch configured to adjust the time the light source remains illuminated following detection of motion, a third user configurable switch configured to adjust brightness of the light source when motion is detected, wherein the third user configurable switch comprises an off, dim and bright setting; and a decision module configured to detect settings of the first, second, and third switches and configured to accept a signal from the motion sensor and illuminate the light source according the switch settings. In some examples, the nightlight may be an active cover plate and/or an electrical receptacle cover plate. The nightlight may be a cover plate that can be configured to be placed over a light switch, wherein the nightlight illuminates an overhead light controlled by the light switch.

FIG. 51A is a block diagram of an illustrative circuit (5100) for one example of zone controlled active cover plates. The circuit may be formed on the circuit board (e.g. 5026, FIG. 50J). Zone controlled active cover plates are active cover plates that are grouped into "zones" so that their functions can be controlled as a group. For example, a zone of guidelights may change state when a command is received from an external source. Additionally or alternatively, a zone of guidelights may illuminate when a signal is received from one or more of the active cover plates in the zone. For example, one active cover plate may sense motion, illuminate, and send a signal out to the other active cover plates in the zone, which can then illuminate. This may provide significant advantages for individuals navigating dark rooms or other spaces. For example, a zone of active cover plates may include a unit installed in a bedroom, a unit installed in a hallway, and a unit installed in a bath room. When a child gets up, the unit in the bedroom detects the motion, illuminates and sends an electronic message to the other units in the hallway and bathroom, instructing them to illuminate. The child can then safely navigate to the bathroom without turning on a light or waking others.

Each of the modules represented in this and other figures described herein are only exemplary. For example, when a module or other similar element is described, it may be made up from different submodules or alternative units/elements. FIG. 51A shows a power supply/regulator (5103) that regulates power and supplies it to other components in the circuit (5100). Other components include a timing component/module (5112), communication module (5114), a processor (5110), an event sensor (5106) and an action module (5104). The power supply (5103) provides power to one or more of the components. In this example, the power supply (5103) is directly connected to the processor (5110) and the action module (5104). The event sensor (5106) detects one or more events, such as temperature, motion, sound, humidity, etc., and communicates these events to the processor. The timing module (5112) may detect timing from an external source or may be a time keeping unit such as a crystal. The processor (5110) accepts input from the event sensor (5106) and timing module (5112) and may send commands to the communication module (5114) to transmit to other devices/ units and the action module (5104). The action module (5104) may take any appropriate action. For example, group 1 may include Unit A (5102), Unit B (5115), Unit C (5117), and Unit D (5119). Each of the units may include a circuit (5100).

Figure 51B:
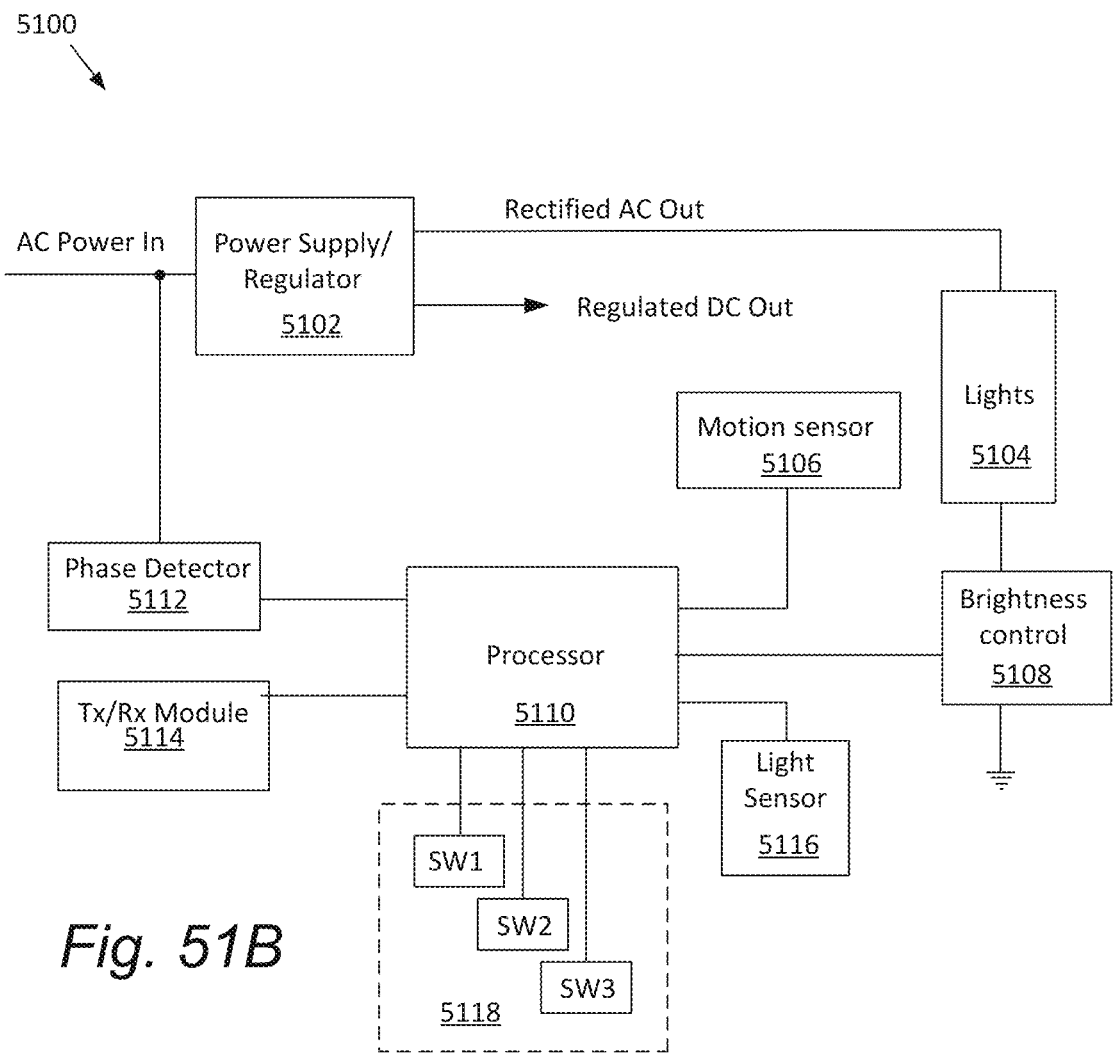

FIG. 51B shows an illustrative circuit (5100) that includes a power supply/regulator (5102) that accepts AC Power In and outputs Regulated DC Out and Rectified AC out. The AC Power In can be supplied by conductors (5024) and prongs (5004) such as those shown in FIG. 50J or in any other suitable manner. The Rectified AC Out can be supplied to lights (5104) or any other suitable circuit component. The regulated DC output may be created in a variety of ways, including using a linear regulator. The regulated DC output may have any suitable voltage, including 5 volts or 3.3 volts, to power chips in the circuit. For clarity, connections between the chips/blocks and regulated DC output are not shown in this diagram. A phase detector (5112) is connected to the AC Power In and has an output connected to a processor/micro-controller (5110). The phase detector (5112) may detect the phase of the AC power entering the circuit in a variety of ways, including for example, using a zero crossing detector/optical isolator to determine when the AC sine wave crosses the zero voltage threshold. The phase detector (5112) can then output a digital or analog signal to the processor (5110) so that the processor (5110) can use the phase of the AC signal for timing and communication purposes. A motion sensor (5106) may be used to detect motion around the active cover plate. In some embodiments, the motion sensor may include a passive infrared detector and integrate processor. The motion sensor (5106) may send an output to the processor/micro-controller (5110). Similarly, a light sensor (5116) may be connected to the processor (5110). At least one switch (5118) can be connected to the processor (5110) to accept input from a user. In this example, there are three switches (SW1, SW2, SW3) that allow the user to select settings such as the brightness of the light output, the amount of time the light is on, and the zone that an active cover plate is assigned to.

There may also be a Tx/Rx module (5114) that may transmit and receive electronic messages that influence the state of the active cover plate. In one embodiment, the processor (5110) may control a phase width modulated switch to control the brightness/turn ON/turn OFF the lights (5104). In this and other embodiments, there are a wide range of approaches/elements that can be used according to principles described herein. For example, timing or phase detection may be acquired using radio time standard broadcast at 10 Mhz, using a GPS to acquire a time, connecting to Wi-Fi or other wireless network to acquire a time stamp. The communication module (here shown as Tx/Rx module 5114) can use a variety of methods to communicate including but not limited to sound, lights, wireless signals, or other appropriate technique. The detector module may use a variety of methods to sense a range of environmental or other variables. For example, a motion or presence sensor may use a variety of techniques including PIR, ultrasound, radio, piezo electric, AI, sensing, GPS distortion, Wi-Fi distortion or other technique. The brightness control (5108) may use a range of techniques to control lighting or other variables including PWM, pulse frequency modulation (PFM), digital control, analog control such as current control and/or voltage control, triggering a silicon control rectifier (SCR). These are only a few examples of elements/techniques that could be used.

Figure 51C:
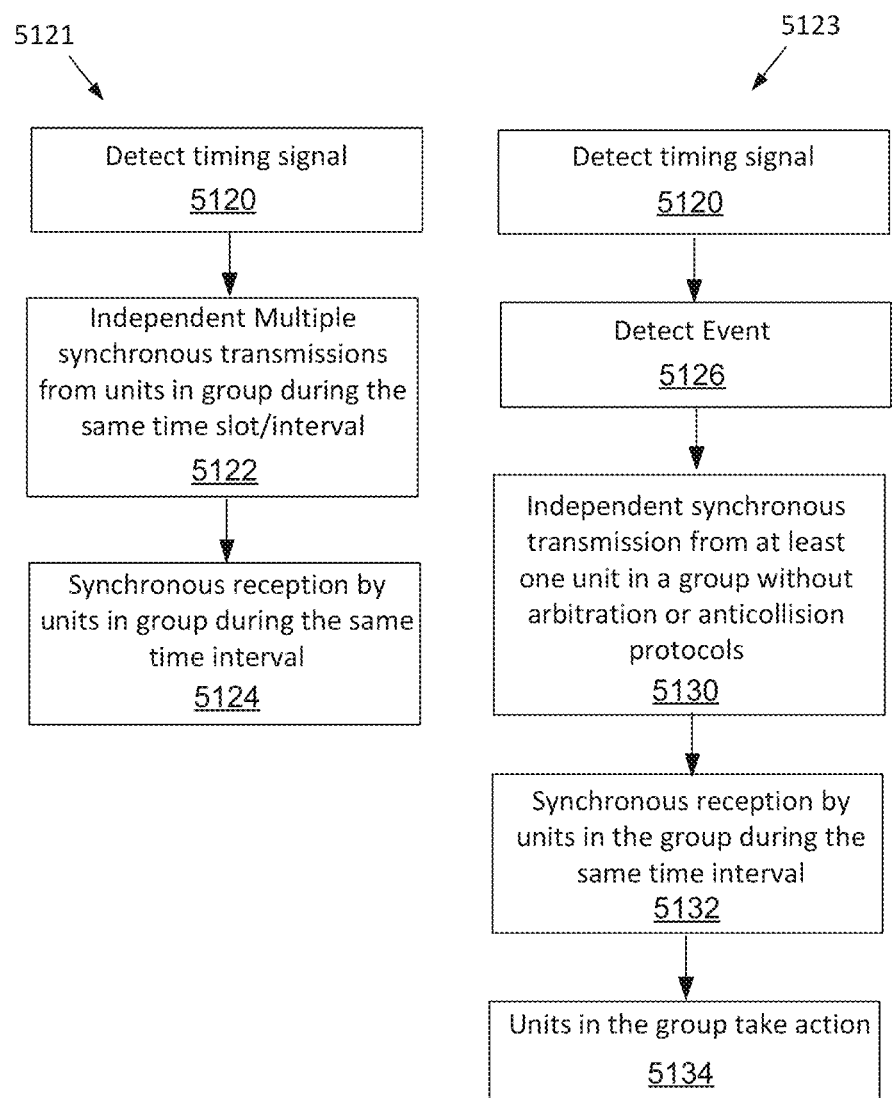

FIG. 51C shows two flow charts (5121, 5123) of illustrative methods for detecting timing signals, transmitting between units in the group, and receiving signals by the units in the group. In particular, the first flow chart (5121) includes detecting a timing signal (step 5120), making independent multiple synchronous transmissions from units in a group during the same time slot/interval (step 5122), and synchronous reception by units in the group during the same time interval (step 5124).

In a second method (5123), the timing signal is detected (step 5120), an event is detected (step 5126), and an independent synchronous transmission is made from at least one unit in a group without arbitration or anti-collision protocols (step 5130). The method further includes synchronous reception by units in the group during the same time interval (step 5132) and units in the group take action (step 5134).

In one embodiment, the interconnection between units includes a modulation scheme that allows for multiple and same time slot (synchronous) transmission without corruption or degrading the message. There is no need for arbitration or anti-collision in the protocol and no need to serialize transmissions. For example, there is no need for arbitration in wireless communication as a method for prioritizing one signal, category, or unit over another. In other systems, arbitration requires two way communications between units and may function by shortening or expanding the period a wireless note has to wait before it is allowed to transmit its next frame. The need for arbitration in some systems increase communication complexity, may require multipath communication between nodes and may increase latency for some signals.

Further, there is no need for anti-collision measures in the method. Collisions occur when nodes in a wireless system transmit over the top of each other (at the same time as each other). The messages may become garbled and receiving nodes may not be able to interpret the message(s). The idea of collision avoidance is that a node makes an announcement before it sends data to inform other nodes to keep silent. Other nodes which hear the announcement remain silent for some time to avoid transmitting over the data from the announcing node. However, as described herein, the system and method do not require arbitration or anti-collision techniques to be used.

Figure 51D:
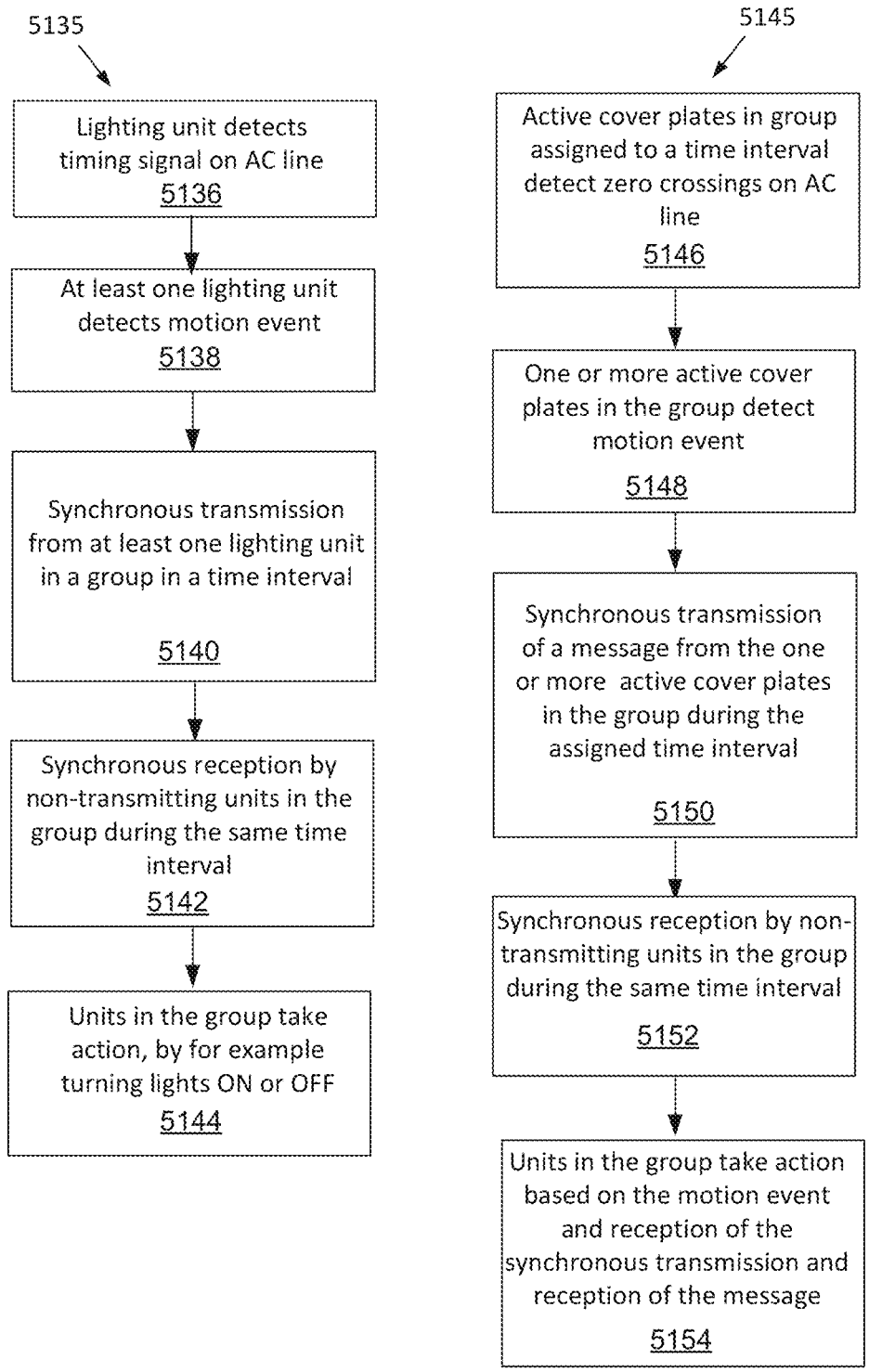

FIG. 51D shows two additional flow charts (5135, 5145) that provide additional examples of timing and transmission between units in a group. In this example, there is a group of lighting units that include one or more units that sense motion. In a first method (5135), a lighting unit detects a timing signal on an AC line that it is connected to (step 5136). At least one lighting unit detects a motion event (step 5138). At least one synchronous transmission is made from at least one lighting unit in a group in a time interval (step 5140). There is synchronous reception by at least one of non-transmitting units in the group during the same time interval (step 5142). The units in the group take action by, for example, turning light ON or OFF (step 5144). These lights may be on the units themselves or may be controlled by the units (e.g. as through a light switch the units are mounted over).

In a second flow chart (5145), active cover plates in a group may be assigned to a time interval that is determined by detecting zero crossings on an AC line (step 5146). One or more active cover plates in the group detect a motion event (step 5148). A synchronous transmission of a message from the one or more active cover plates in the group occurs during the assigned time interval (step 5150). Synchronous reception by non-transmitting units in the group occur during the same time interval (step 5152). The units in the group may take action based on the motion event and reception of the synchronous transmission and reception of the message (step 5154).

Figure 51E:
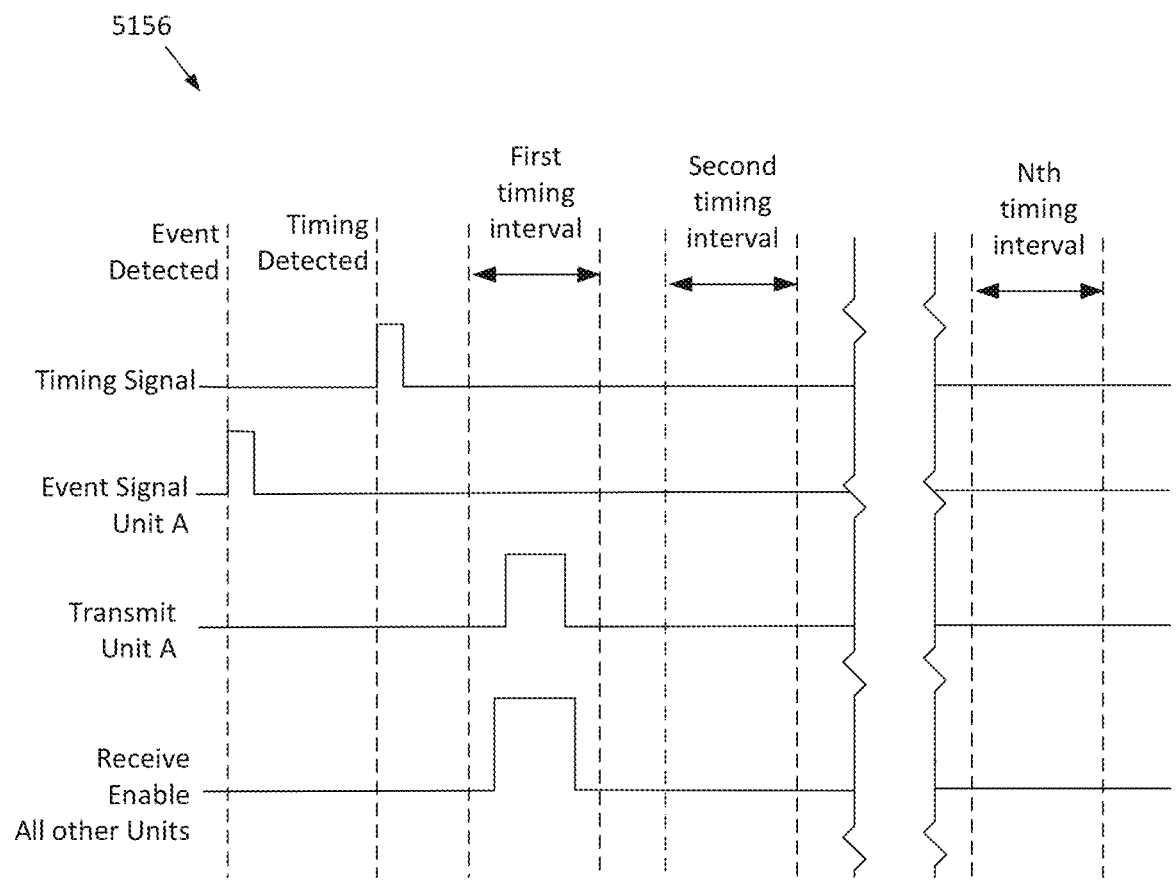

FIGS. 51E and 51F are illustrative timing diagrams for the operation of an active cover plate with zone control. In FIG. 51E, the timing diagram (5156) includes an event that is detected, timing that is detected, a first timing interval, and a second timing interval to an Nth timing interval. Graphed from left to right is a time sequence of signals, including a timing signal, an event signal at a unit (in this case Unit A), transmission from Unit A, and a receive enable signal or time period for all other units. For example, a Unit A may detect an event (such as motion) in the time period labeled "event detected". Because all the units are connected to the AC grid, they all detect a timing event (such as a zero crossing) and can all act in a synchronous fashion. In one example, the timing event may occur at different times for the various units (such as when the AC phase is different for different units in a building) but the units can still act synchronously without knowledge of phase differences between units. The units may have predetermined timing intervals, user selected timing intervals, dynamic time intervals or other intervals. For example, the send/receive timing interval may be the same for all units in the same group.

After detecting an event, Unit A waits until a designated timing interval (in this case the first timing interval) and then makes a transmission (broadcast) that announces that it has detected an event. The other units in the group have a receive enable period that matches the transmission timing interval. Consequently, the other units in the group receive the transmission from Unit A and are notified that an event has been detected. The units may only know that one of the units in the group has detected an event or they may know that a particular unit (Unit A) has detected an event. The units can then take appropriate action.

FIG. 51F is a timing diagram (5157) for a group of units that includes two units that detect an event (Unit A and Unit B). This timing diagram illustrates that there is no need for arbitration or anti-collision in the protocol and no need to serialize transmissions. In this diagram, all of the units detect a timing signal. For example, if the units are all connected to an AC line, the units may detect a zero crossing. They may repetitively detect the timing signal during every AC cycle. For example, they may detect positive to negative zero crossings, negative to positive zero crossings or both. Alternatively, they may not detect each crossing but may maintain timing for multiple cycles. However, in this example, the units detect the timing signal prior to making transmissions.

Unit A detects an event first and takes independent action ("Action Unit A" showing the signal going high). Unit A waits until a first timing interval to transmit that it has detected an event ("Transmit Unit A"). Unit B also detects an event and takes action at a specific point ("Action Unit B") and transmits during the same time period ("First timing interval") as Unit A. The receive enable for all non-transmitting units in the group is active during the first timing interval and may be slightly longer duration and/or begin earlier than the actual transmissions. This prevents receiving units from missing all or part of the transmission. The transmission from Unit A will not collide with the transmission from Unit B and will not add noise or cause reception problems for any of the other non-transmitting units in the group. In some examples, the simultaneous or near simultaneous transmission from both Units A and Units B results in better reception and/or stronger signal to the non-transmitting units. In one embodiment, neither unit has higher priority than the other and action taken by the non-transmitting unit(s) are identical regardless of which unit(s) detected the event.

Figure 51G:
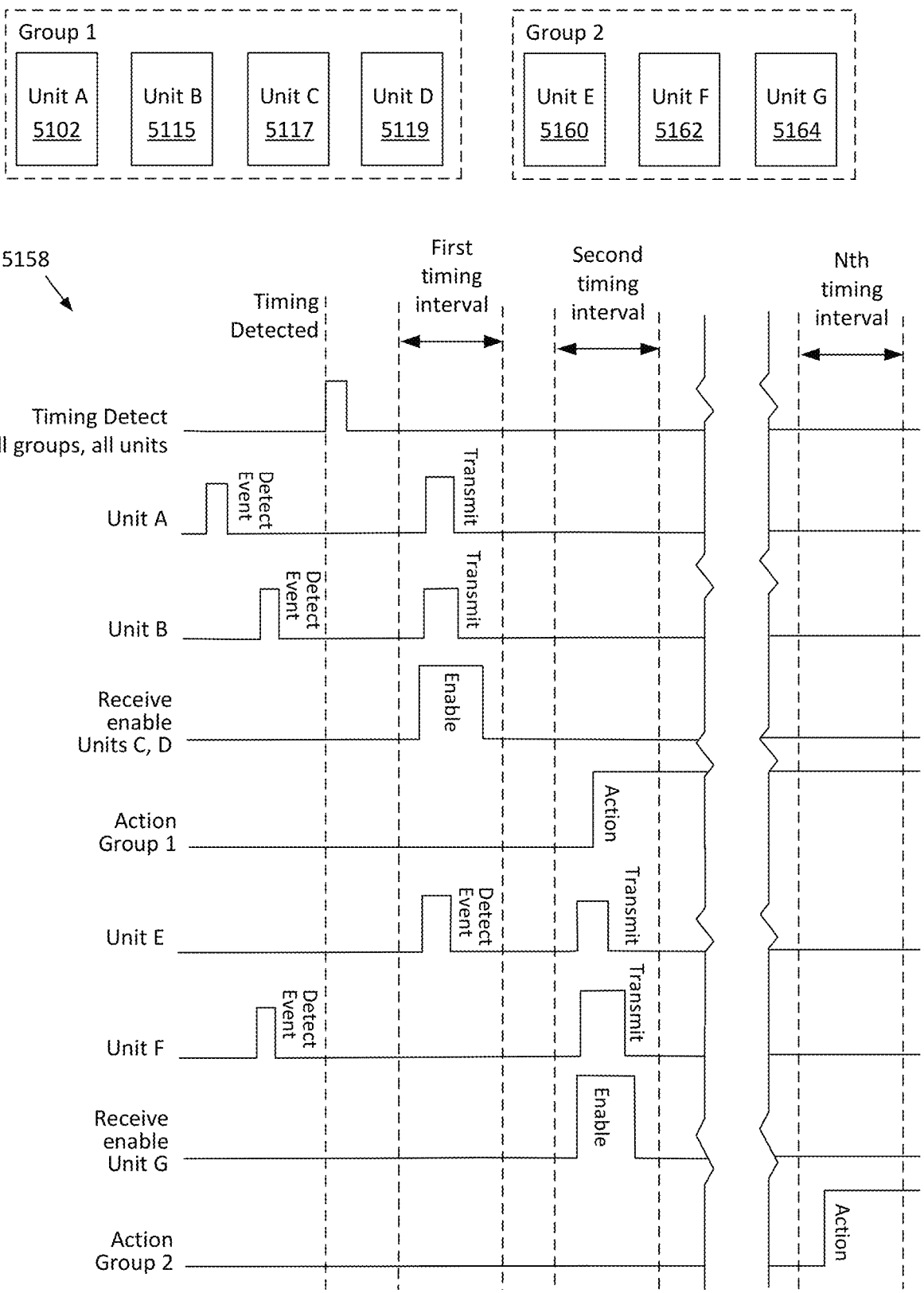

FIG. 51G is an illustrative timing diagram (5158) for two groups of units. In this example there are four units in Group 1: Unit A (5102), Unit B (5115), Unit C (5117), and Unit D (5119). There are three units in Group 2: Unit E (5160), Unit F (5162), and Unit G (5164). The timing diagram (5158) shows all groups and all units detecting timing ("Timing detected"). Unit A detects an event ("Detect Event") and after detecting a timing signal transmits ("Transmit") during the first timing interval. Unit B which is in Group 1 detects an event ("Detect Event") and transmits during the first timing interval ("Transmit"). Units C and D enable reception during the first timing interval ("Enable"). In this example, Units A, B, C, and D take action ("Action group 1") simultaneously in the second timing interval ("Action").

Units E and F detect events at various times ("Detect Event") with Unit E detecting an event during the first timing interval and Unit F detecting an event prior to the receiving/detecting the timing signal. These units are in Group 2 which has been assigned to transmit in the second timing interval ("Transmit"). The only remaining unit in Group 2, Unit G, enables receiving ("Receive enable Unit G") during the second timing interval ("Enable"). The units in Group 2 take action ("Action group 2") in the Nth timing interval ("Action"). There are a number of ways that the units may perform and take action, including but not limited to, those shown and above and described herein. For example, the number and composition of the units in the groups may vary according to user preferences and selections. The number of transmitting and receiving units may also dynamically change according to which units are currently sensing motion and which are not.

Figure 51H:
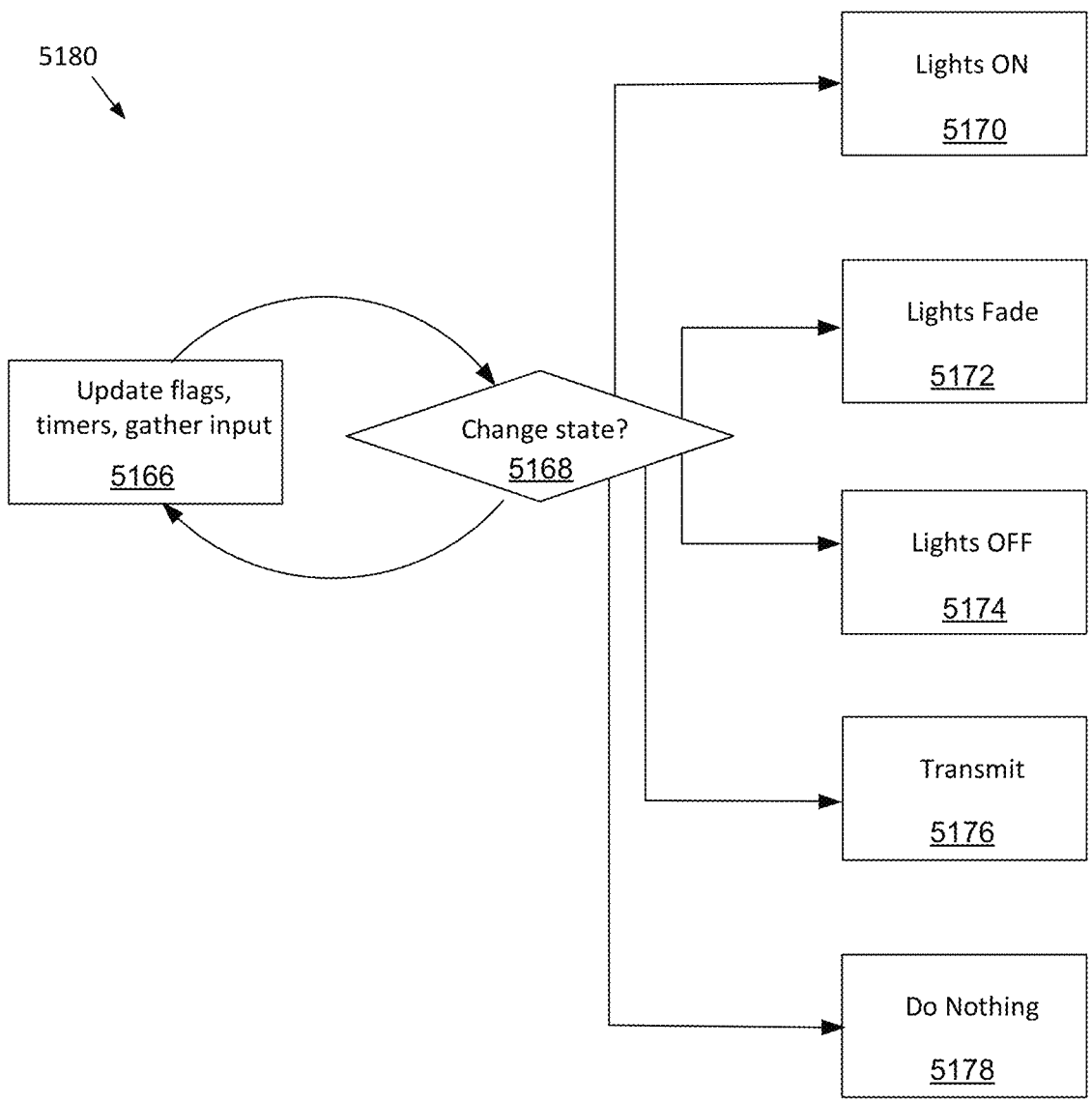

FIG. 51H shows an illustrative flow chart (5180) for operation of a unit. The blocks and actions shown below are only illustrative of principles described. In this example, there is a first block (block 5166) which gathers input, updates flags and operates timers. For example, all inputs could be polled, timer could be checked, the variable matrix could be updated and flags reviewed. If a zero crossing is detected, then a phase timer could be started. If motion is detected and/or transmission is received then the light timer can be started/restarted. A decision (block 5168) is made, based on the updated flags, timers, and input about state changes. For example, the state may be changed to turn lights ON (block 5170) or take other action. In one embodiment, the state may be changed to turn the lights ON if the light timer has not expired and the ambient light level is low. The lights may fade (block 5172) for example, if the timer for the lights being on has expired. The light may be turned off (block 5174) if the fade timer has expired. The unit may transmit/broadcast a message (block 5176). Or the unit may take no action ("do nothing", block 5178). For example, the unit may transmit if the phase timer has expired and motion has been detected and transmission has not previously occurred for a particular sensed event.

One challenge for zoned active cover plates is that active cover plates in one zone may transmit electronic signals at the same time as active cover plates in a second zone. For packetized transmissions, this may not pose a significant issue, because the packets are addressed to particular units or nodes. However, for simpler systems, having simultaneous transmissions by different units may cause interference with the function of the zone. As discussed and shown above, one technique for resolving this issue may be to allocate time-based transmission windows to the various zones. Thus, only the units in the zone designated for a specific time window will be transmitting during that time. However, absent a synchronized clock or time signal, the various active cover plates will not know when their assigned transmission window occurs.

Figure 52A:
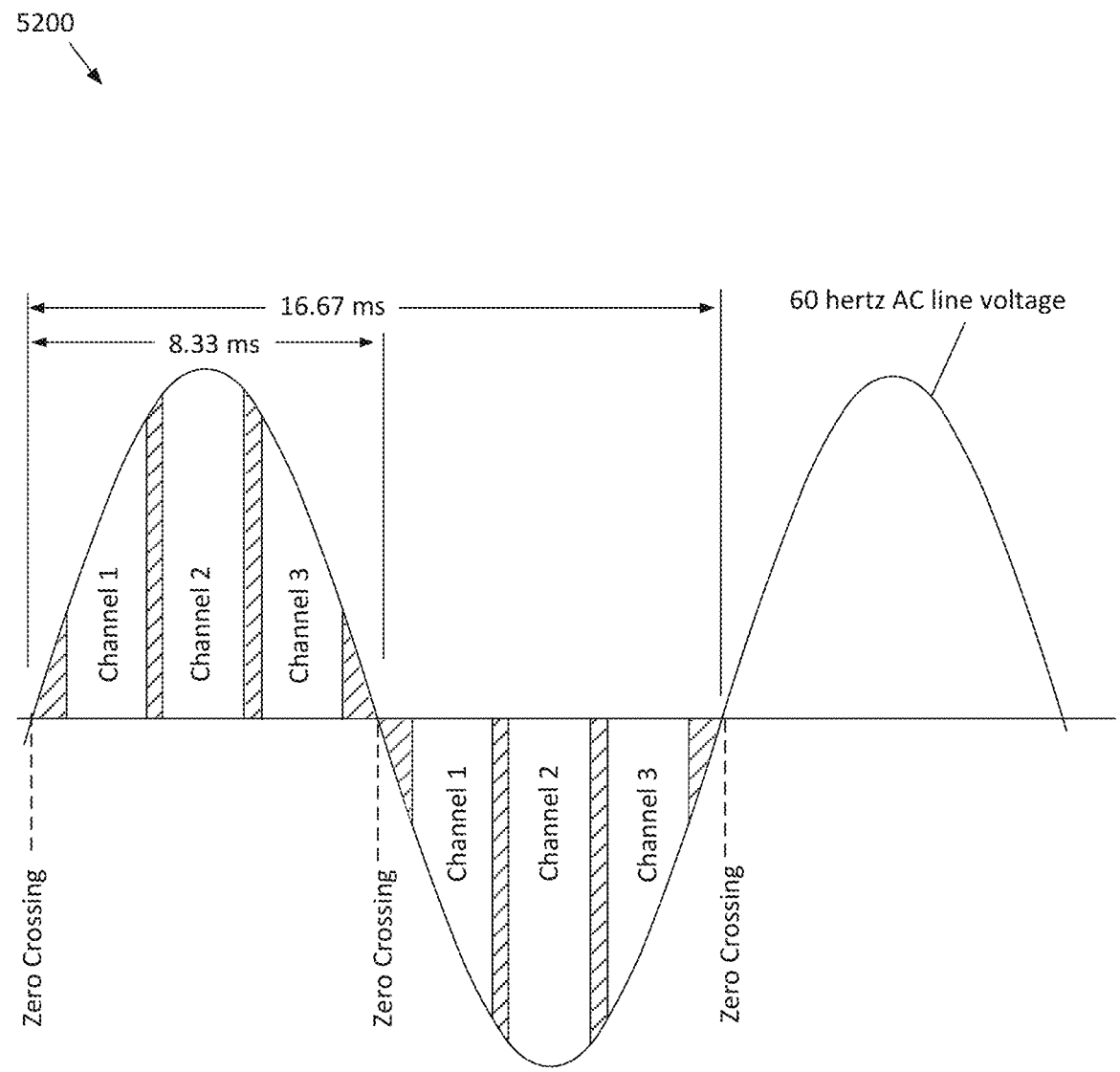
FIGS. 52A-52G show various examples of timing diagrams and allocation of time slots to different zones of active cover plates, according to one example of principles described herein.

FIGS. 52A-52G show various examples of timing diagrams and allocation of time slots to different zones of active cover plates. The AC signal is a sine wave with a voltage that regularly fluctuates between a positive value and a negative value. As the AC signal regularly crosses between positive values and negative values or between negative values and positive values, it has a transitory value of zero volts. Detection of this value of zero volts is called zero crossing detection. Because of the defined and regular shape of the AC sine wave, the detection of the zero crossing allows for all units connected to the AC power to synchronize with all other units in the zone. FIG. 52A shows an illustrative AC sine wave. In the United States, the standard sine wave for power delivered to many homes and businesses is 120 RMS volts, 60 Hz. This means that the root mean square voltage value of the sine wave is 120 volts, but the peak positive and negative voltages are around 170 V. The 60 Hz value means that there are a total of 60 cycles of the AC sine wave per second. This means that each cycle of the AC sine wave has a duration of 16.67 milliseconds. Each full cycle of the AC sign wave has a positive half cycle and a negative half cycle. Each half cycle begins and ends at a zero crossing. A half cycle of the AC sine wave takes 8.33 milliseconds to rise from zero volts to a peak and back to zero volts. In the embodiment shown FIG. 52A, each half cycle lasting 8.33 milliseconds is divided into a number of time windows that are labeled Channel 1, Channel 2, and Channel 3. The shaded regions under the curves are guard regions that provide a buffer between the channels so that uncertainties, measurement errors, operational delays, etc. do not cause signals from one channel to bleed into an adjacent channel's window. The division of the sine wave into three channel windows is arbitrary. The sine wave may be divided into any number of channel windows according to capabilities of the supporting electronics and needs of the system. Each zone of active cover plates are assigned to a specific channel. Consequently, the embodiment shown in FIG. 52A can support three different zones inside the same house/transmission area. This is only one example of a timing technique. There are a variety of other implementations that could be used. In general, each implementation may include the following elements: sensing of a time event (such as a zero crossing), dividing up time periods into different slices (channels) and then using those time slices to divide/separate transmissions. There is no requirement for a sinusoid or any other signal pattern to be present or detected.

Figure 52B:
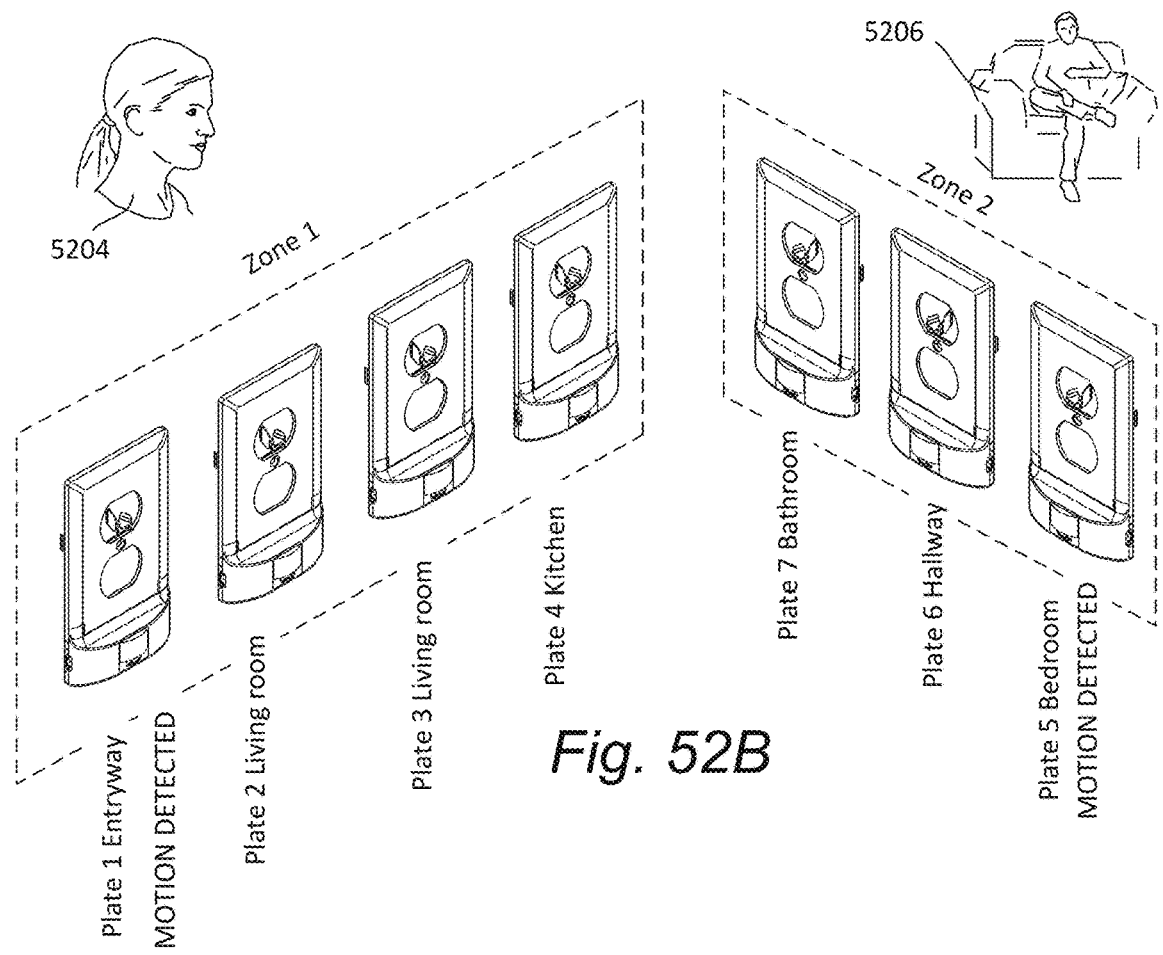

FIG. 52B shows seven active cover plates that are divided into two different zones. In Zone 1, there are 4 active cover plates: plate 1 is installed in the entryway to a home, plates 2 and 3 are installed in the living room adjacent to the entryway. Plate 4 is installed in the kitchen connected to the living room. In Zone 2 there are 3 active cover plates: plate 5 is installed in a bedroom, plate 6 is installed in a hallway outside of the bedroom, and plate 7 is installed in a bathroom connected to the hallway. A woman (5204) opens the door and triggers the motion detector of plate 1 in the entryway. Substantially simultaneously, a man (5206) who is sitting in a chair in the bedroom moves and triggers plate 5's motion detection. Consequently, one plate in each of zone 1 and zone 2 has detected motion and will illuminate. Plate 1 should send a signal (either wired, wireless, optical, or other signal) to other units in its zone (Plate 2, Plate 3, Plate 4). Additionally, Plate 5 should send a signal to Plate 6 and Plate 7. However, if they both transmit at the same time, the two signals could interfere or be misinterpreted. However, in the system shown and described herein, the two signals do not interfere. Even though there are multiple plates (in different zones) detecting motion and transmitting signals and multiple plates receiving signals, the signals do not interfere and in some cases are additive. The signals from the different zones will not interfere with signals transmitted by different zones.

Figure 52C:
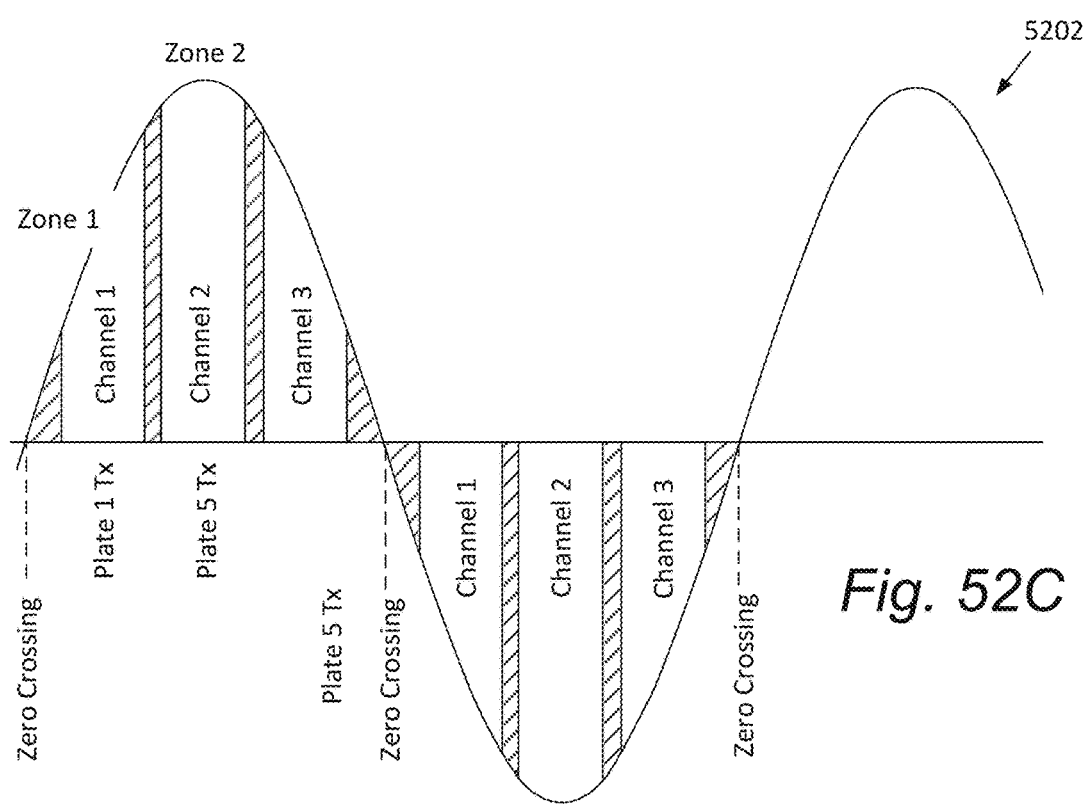

FIG. 52C shows how an AC line voltage could be used as a synchronizing time signal that allows all the active cover plates to transmit in specific time windows to avoid interference. As discussed above, each 8.33 millisecond half cycle is divided into three time windows that are labeled Channel 1, Channel 2, and Channel 3. Each zone is specifically assigned to transmit/receive during only one of those time windows. In this example, all active cover plates in Zone 1 are assigned to transmit and receive in the time window of Channel 1. Plates in Zone 1 that detect motion will transmit the "I saw motion" signal only during the channel 1 time window. If a plate in Zone 1 has not detected motion, it will listen for signals and only accept signals that are transmitted during the Channel 1 time window. The plates in Zone 2 have been assigned to the Channel 2 time window and will only transmit during this window and will only accept messages received during this window. Consequently, the transmissions of Plate 1 in Zone 1 will not interfere with the transmission of Plate 5 in Zone 2. The transmissions will be at different times and the receivers in the different zones will listen at different times. Using the AC line voltage to synchronize the timing of these windows works because each of the active cover plates is connected to the same AC line voltage and receives the same signal. Thus, when the woman comes in the front door, all the active cover plates in Zone 1 illuminate and when the man simultaneously moves in the bedroom all the active cover plates in Zone 2 illuminate. In some embodiments, one zone may be connected to a different phase of the AC line voltage. In this instance, all the active cover plates do not receive the same line voltage, but as shown below, the timing scheme still works.

Figure 52D:
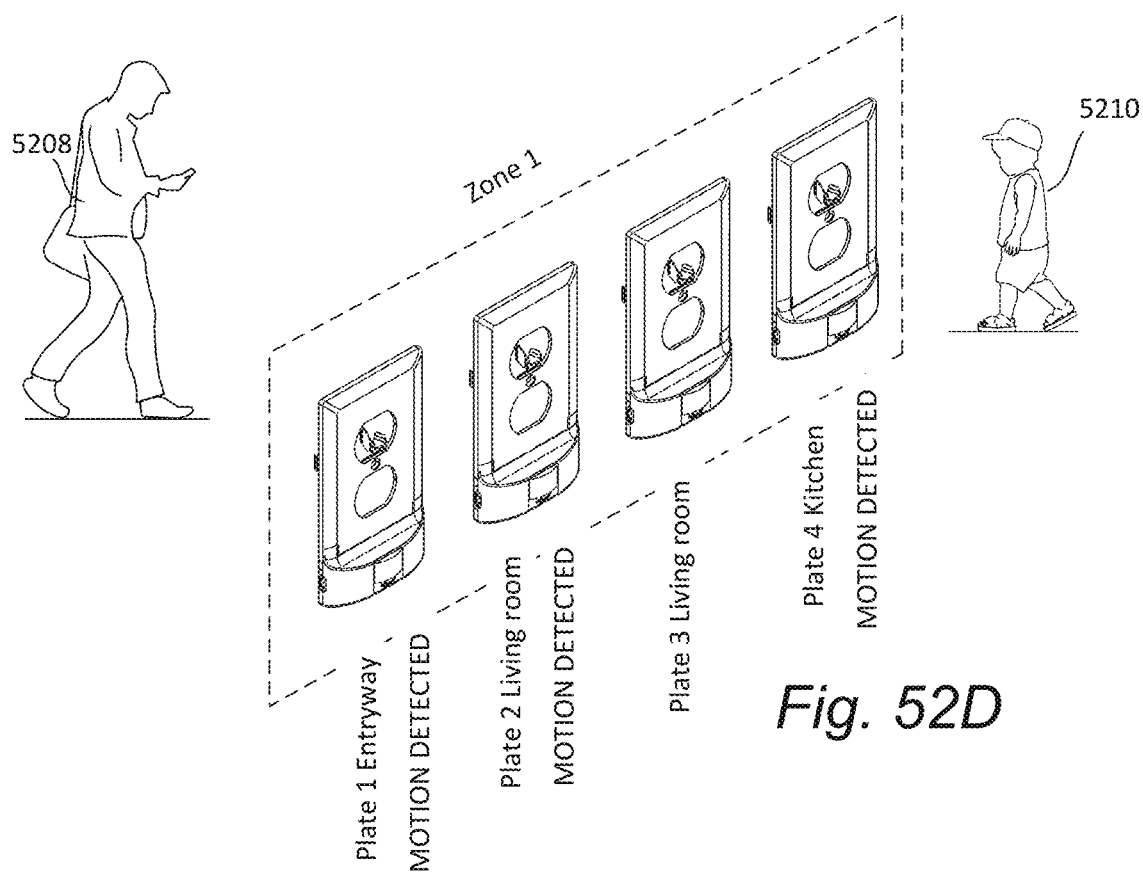
Figure 52E:
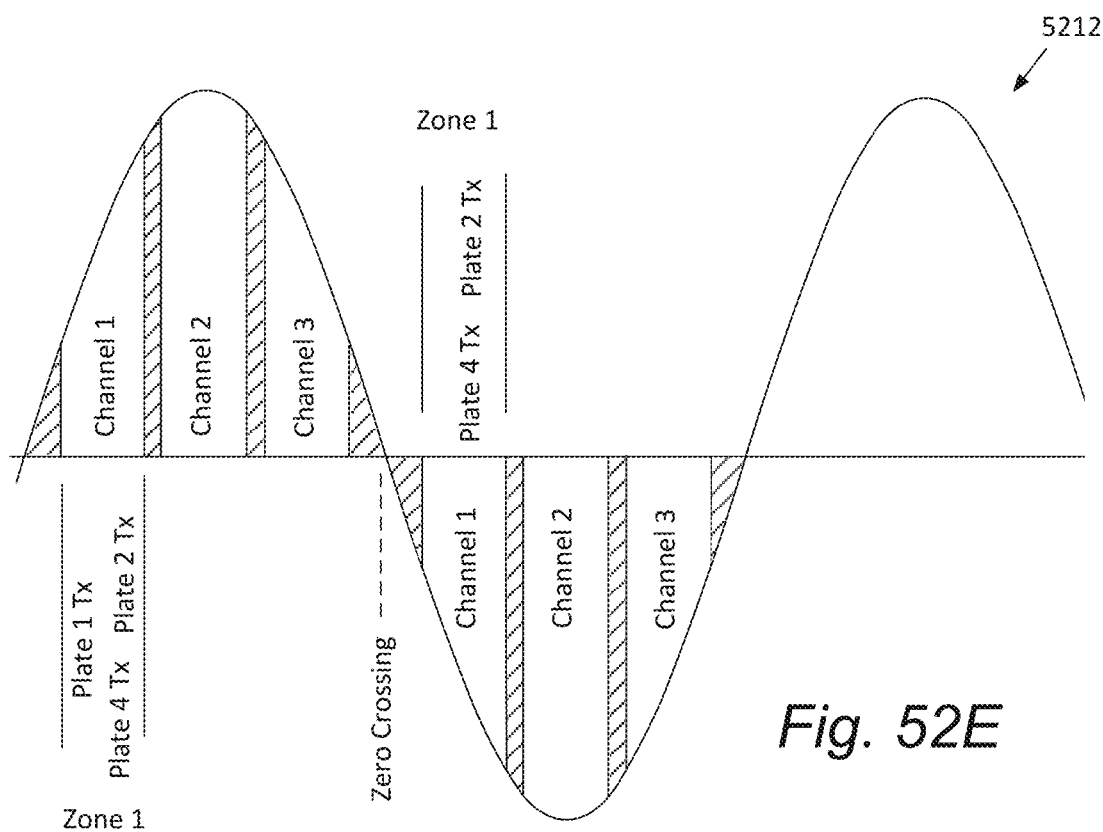

FIGS. 52D and 52E show what happens when two motions sensors in the same zone are triggered at the same time. In this example, a man is coming home and triggers the motion sensor in Plates 1 and 2 while the child, running to greet the man, triggers Plate 4. Consequently, Plates 1, 2 and 4 should transmit signals in the Channel 1 time window at the same time. Ordinarily, this could cause problems because near simultaneously transmitted signals could interfere with each other, preventing Plate 3 from correctly interpreting the received signals. However, in this case the signals from all three of the plates are relatively simple and additive, meaning that because multiple plates transmit at the same (or nearly the same) time, the signal has a greater magnitude. This would be the case, for example, if the transmission was simply a tone at the carrier frequency. The receiver in Plate 3 listens during the channel 1 time window for a signal. If the signal is present, it illuminates. More signal magnitude in the Channel 1 time window from multiple transmissions simply makes it more likely that Plate 3 will detect the signal. Thus in the first half cycle, three plates transmit during the channel 1 time window. The man keeps moving through the room and is only detected by Plate 2 in the next time cycle. The child continues to trigger Plate 4 in the kitchen. Consequently, in a later half cycle (shown here as the next cycle for clarity), Plate 4 and Plate 2 will transmit an "I saw motion" signal to all the plates in the zone.

However, the concern may arise that external noise in the transmission frequency band may give rise to Plate 3 interpreting the external noise as a command to turn ON. This can be mitigated in a number of ways, including requiring that the signal is transmitted and received three consecutive times (or more). In other embodiments, the transmissions may be sent for two half cycles, not sent during the third half cycle and then resent two more times in the fourth and fifth half cycles (a digital 11011). The receiver/processor could be looking for this code of transmissions and only illuminate when that code was received. In yet other embodiments, the transmission of a code, key or repetition of the signal could occur entirely within one channel time window.

Figure 52F:
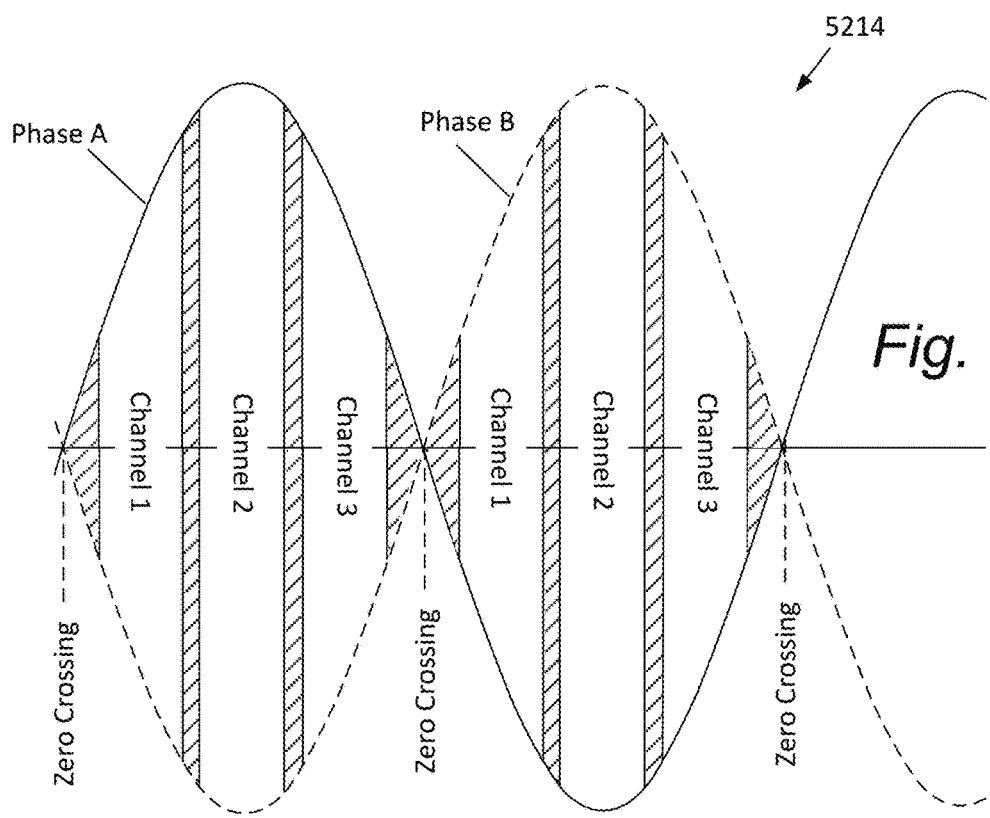
Figure 52G:
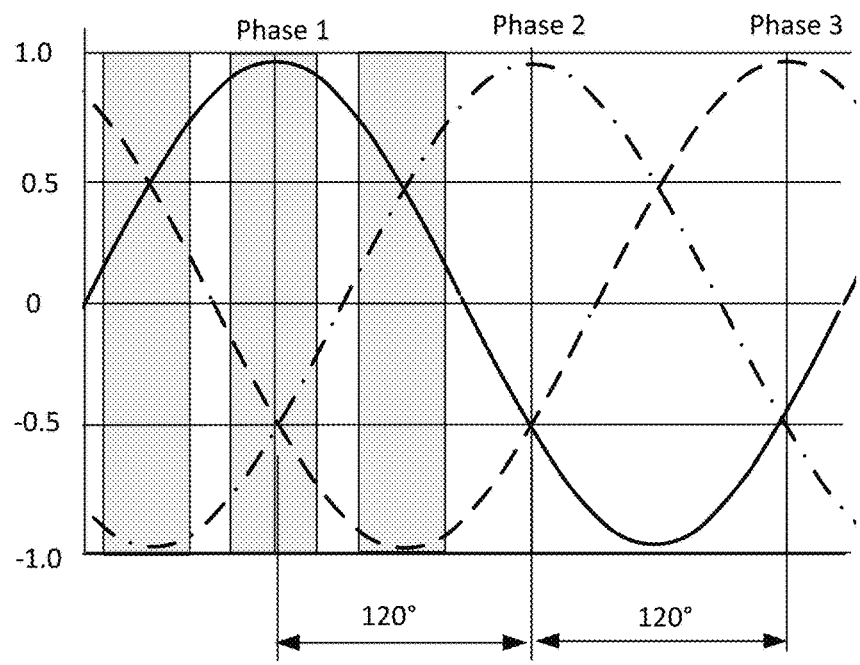

FIG. 52F shows a graph of a split-phase waveform that may be encountered in some homes. In single split phase power there are two phases. In this example the solid line labeled Phase A shows a first sinusoidal waveform and the dashed line labeled Phase B shows a second waveform. Split-phase power is used in residential settings because it saves conductor material over a single phase system. Typically, half of the outlets/loads would run on one phase and the other half of the outlets/loads would run on the other phase. It may initially appear that because of the different phases (Phase 1 is 180 degrees out of phase with Phase 2) that the system and principles described above would break down. However, this is not the case. The zero crossing occurs at the same time for both waveforms, and by having the channel 1 time window open at the same time for both the positive and negative halves of the signal, all the time windows line up and the active cover plates can be time synchronized without access to external clock signals or purchase/design of a highly accurate clock for each plate. The same principle can be applied to the three phase powerline voltage shown in FIG. 52G. Specifically repeating time windows can be used to align transmit/receive windows in differently phased AC line voltages.

FIGS. 53A-53G show illustrative flowcharts describing methods and principles for operation of zone controlled active cover plates. There are a number of variables/parameters that could be used in relationship to these methods and principles. These variables/parameters may include, but are not limited to user defined variables, predetermined variables, timers and flags. For example, user defined variables may include:
Light Brightness: OFF, LO, HI; designates how bright light are when turned on by sensor/signal.
Light time out: 10, 30, 60 seconds or other appropriate/desired time period; designates how long lights will remain on after motion is detected and/or valid Rx from other plates in the zone is received.
Channel assignment: 1, 2, 3 . . . 10; designates channels (e.g. time slots) when Tx/Rx can occur for active cover plates in zones assigned to the channel.
Predetermined variables may include:
Designated signal count: 1-10; a number of times the Tx signal must be received prior to indicating a Rx signal has been received, used to reduce false positive signals.
Timers may include:
Phase timer: 0 to 8.33 milliseconds; tracks time from zero crossing signal to increment channel flag
Fade timer: counts down time between steps in PWM decrement for fading
Light timer: 10, 30, 60 seconds or other appropriate/desired time periods; measures the amount of time that the lights have been ON, when the light timer expires the lights are turned OFF.
Flags may include:
Fade flag: 0, 1; a high value indicates the light should be fading
Signal count: 1 to 10; a flag indicating the number of repeated transmissions received with a correct pattern and in the correct channel. A valid Rx signal is received when the signal count equals (or exceeds) the designated signal count.
Zero crossing flag: 0, 1; high value designates that a zero crossing has been detected.
Channel flag: 1,2,3 . . . 10) designates which channel is currently active for Tx/Rx (e.g. the current phase window in the 60 Hz signal, or other timing scheme).
These parameters are only illustrative and the principles and methods described herein are operable with a wide range of parameter sets, including sets that are larger, smaller, or have a different composition than the specific examples given herein.

Thus, according to principles described herein, an active cover plate may include prongs configured to contact screw terminals of an electrical receptacle, thereby supplying electrical power to the active cover plate. The active cover plate may include a motion sensor configured to detect motion in an area around the active cover plate and produce a sensor output signal indicating that motion has been detected. The active cover plate may also include a light sensor configured to detect ambient light in an area around the active cover plate and produce a light level signal. The active cover plate may include a wide range of action modules, including a light module configured to illuminate the area around the active cover plate. In some examples, the active cover plate may include a communication module configured to broadcast a signal indicating that motion has been detected in the area around the active cover plate and a processor module that may be configured to perform a number of operations, including but not limited to: accept the sensor output signal indicating that motion has been detected, accept the light level signal indicating that the area around the active cover plate is dark; instruct the light module not to illuminate the area around the active cover plate; instruct the communication module to broadcast a signal indicating that motion has been detected in an area around the active cover plate.

The active cover plate may also include a user input configured to instruct the processor not to illuminate the light module when the area is dark and motion is detected, and a user input configured to instruct the processor to broadcast a signal indicating that motion has been detected. The active cover plate may also include a first manually manipulatable switch configured to instruct the processor not to illuminate the light module when the area is dark and motion is detected. The active cover plate may also include a second manually manipulatable switch configured to instruct the processor to broadcast a signal indicating that motion has been detected while the light module is not illuminated.

As discussed above an active cover plate may include a communication module that broadcasts the signal to all active units within range and all active cover plate that receive the signal check: 1) light sensor 2) that the receiving unit is in the same group/channel/zone. According to some embodiments, the broadcast signal as no arbitration/anti-collision measures and/or may be received by all units within range and acted upon by all units within range and in the same group. In some embodiments, the broadcast may be repeated by receiving units.

Figure 53A:
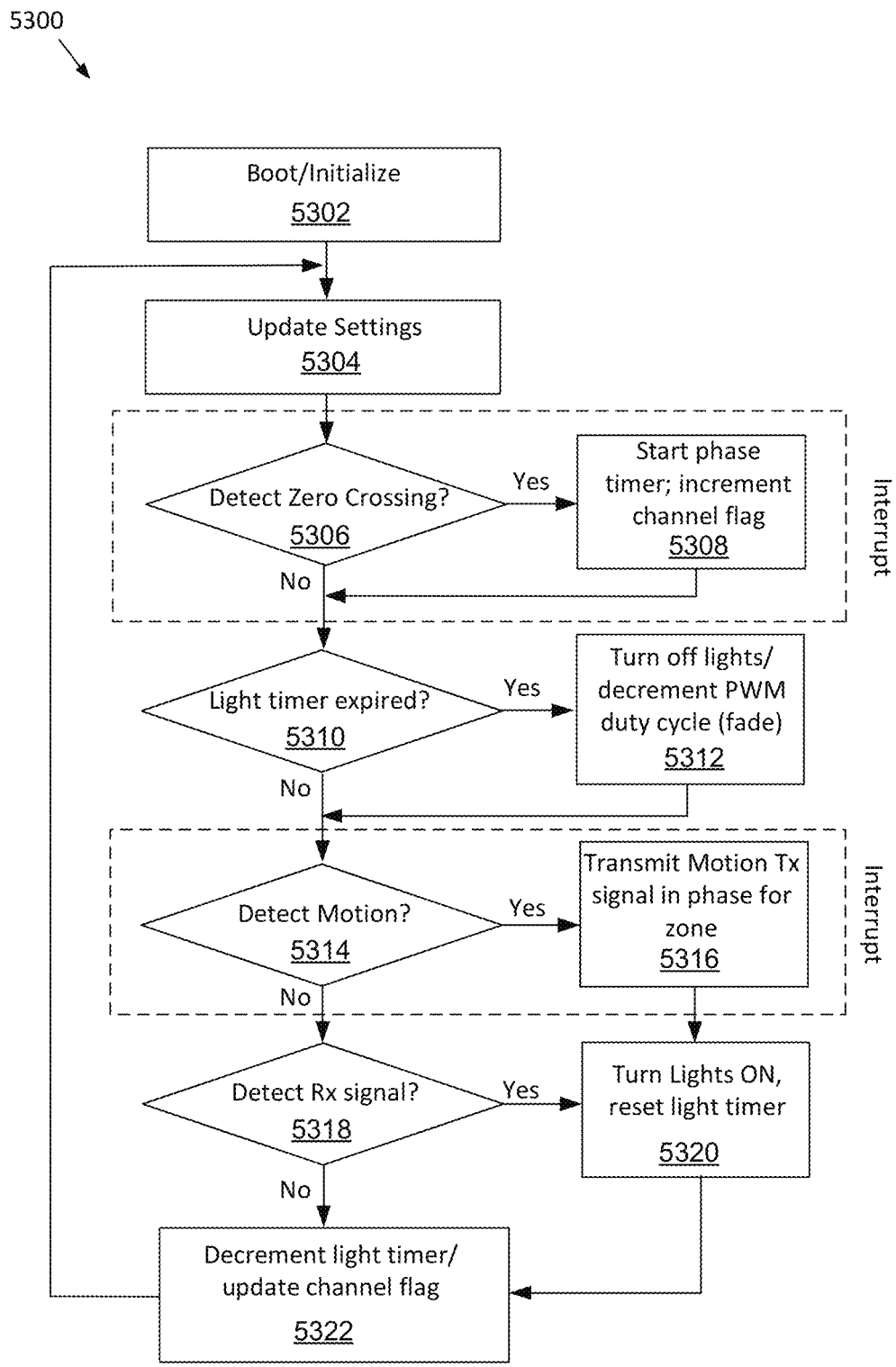
FIGS. 53A-53G show illustrative flowcharts describing methods and principles for operation of connected active cover plates, according to one example of principles described herein.

FIG. 53A is an illustrative flowchart (5300) of the operation of a zone controlled active cover plate. In a first step, power is applied to the active cover plate and it boots/initializes (step 5302). The boot/initialize step is further described in FIG. 53B. The cover plate next updates settings (5304). This step is further described in FIG. 53C. The cover plate then begins monitoring the AC line voltage for zero crossings (step 5306). If a zero crossing is not detected, the process moves to step 5310. If a zero crossing is detected, the process moves to step 5308 and the cover plate starts a phase timer to track when the cover plate's assigned channel time window will open/close. The cover plate may also increment the channel flag.

In step 5310, the cover plate determines if the light timer has expired. The light timer tracks the amount of time that the light in the cover plate has been ON after the active cover plate has detected motion or received a signal from one of the active cover plates in its group. The amount of time that the light stays on may be predetermined or may be set by a user. When the light timer expires ("Yes"), the light in the cover plate will fade to a lower illumination levels or turn OFF as described in step 5312. Step 5312 is further described in FIG. 53D. If the light timer has not expired then the active cover plate will determine if motion has been detected (step 5314). If motion is detected (step 5316) then the active cover plate will transmit an "I saw motion" signal to other active cover plates in its zone (step 5316) and then move to step 5320 where it will turn the lights ON (if they are not already ON) and reset the light timer so that the light will continue to be ON for the specified period of time after motion was detected. For example, if motion is continuously detected or detected on intervals that are shorter than the length of the light timer, then the light would remain ON. Similarly, if an Rx signal is detected (step 5318, further described in FIG. 53E) then the process moves to step 5320 and turns the lights ON and resets the light timer. One embodiment of step 5320 is further described with respect to FIG. 53F. If neither motion or Rx signals are detected then the process moves to step 5322 where the light timer is decremented (to count down to turn off the light) and the channel flag is updated. One embodiment of step 5322 is further described with respect to FIG. 53G. The channel flag indicates which time window the active cover plate is operating in and dictates whether the "I saw motion" signal can be transmitted and whether Rx signals received are in the valid/designated time window. From step 5322, the process may return to the update settings step (5304) and repeats the process. This flow chart is referred to and elaborated on in the following figures.

In some embodiments the processor in the active cover plate may be fast enough to cycle through the process described above so quickly that delays between the steps may not be noticeable or affect the function. However, operating the processor at high speeds may not be desirable from an energy consumption and heat dissipation perspective. Consequently, it may be desirable for the processor to sleep for a period of time before taking additional action. Further, because some of the events (i.e. detecting zero crossing, detecting motion) require immediate action, it may be valuable to configure one or more of the steps as an interrupt that will wake the processor from a low power state and/or stop other processes that are in progress so that quick action can be taken.

Figure 53B:
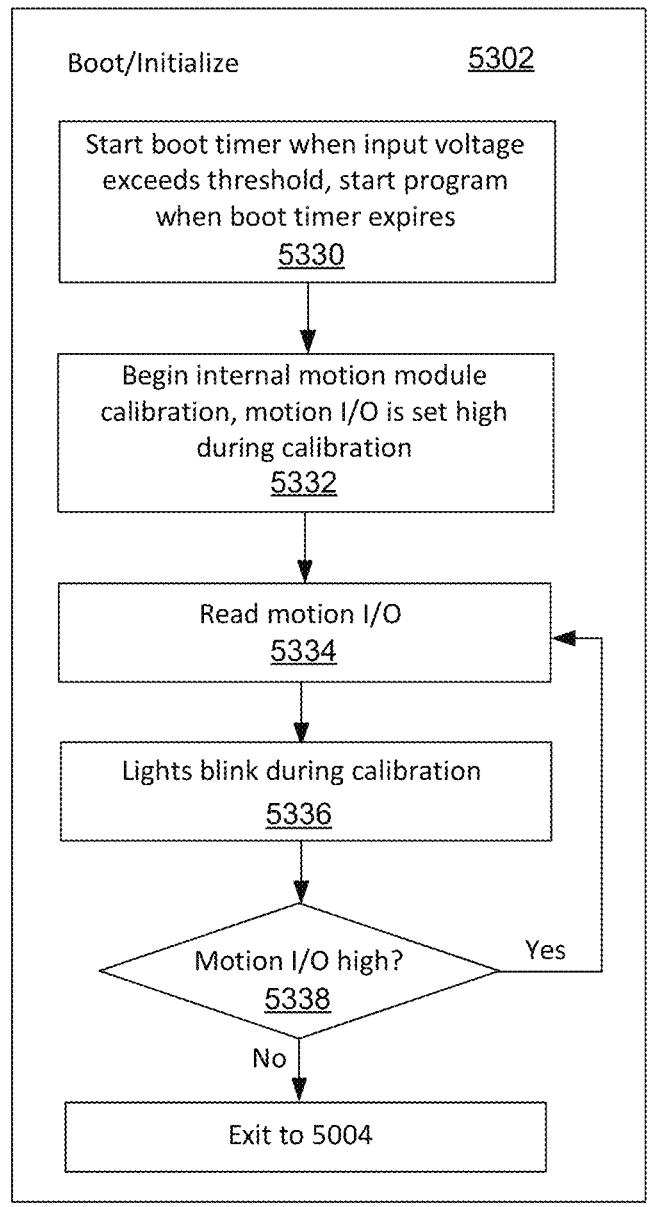

FIG. 53B shows an illustrative flowchart that describes one embodiment of a boot/initialize step 5302. In this example, the boot/initialization begins by starting a boot timer when the input voltage (to the microprocessor) exceeds a threshold. The program starts when the boot timer expires (step 5330). This allows time for the input voltage to stabilize before the program begins.

Internal motion module calibration begins and the motion I/O pin on the processor is set high during this calibration (step 5332). The internal motion module may calibrate the PIR sensor and other control parameters during this time. The processor continues to monitor the motion I/O pin (step 5334). For the convenience and information of the user, the lights may be configured to blink during this process (step 5336), indicating that the unit has power and is booting up. The processor determines if the motion I/O pin remains high (step 5338). If it does ("Yes") then the program loops back to step 5334 and continues to monitor the pin and wait for the calibration to complete. If the pin is low ("No") then the program exits this step and goes to step 5004 in the main flow chart (5300, FIG. 53A).

In some embodiments, the active cover plate may communicate to the user using the lighting module or through other means such as a sound. For example, if the active cover plate may indicate that it is in a particular state by blinking, flashing, fading illumination, changing colors/patterns, etc. The active cover plate may indicate that it received a particular signal by taking any of a number of actions, including chiming, sounding an alarm, illuminating, changing illumination, sending a wireless signal to other units, a network, or other device(s), etc.

Figure 53C:
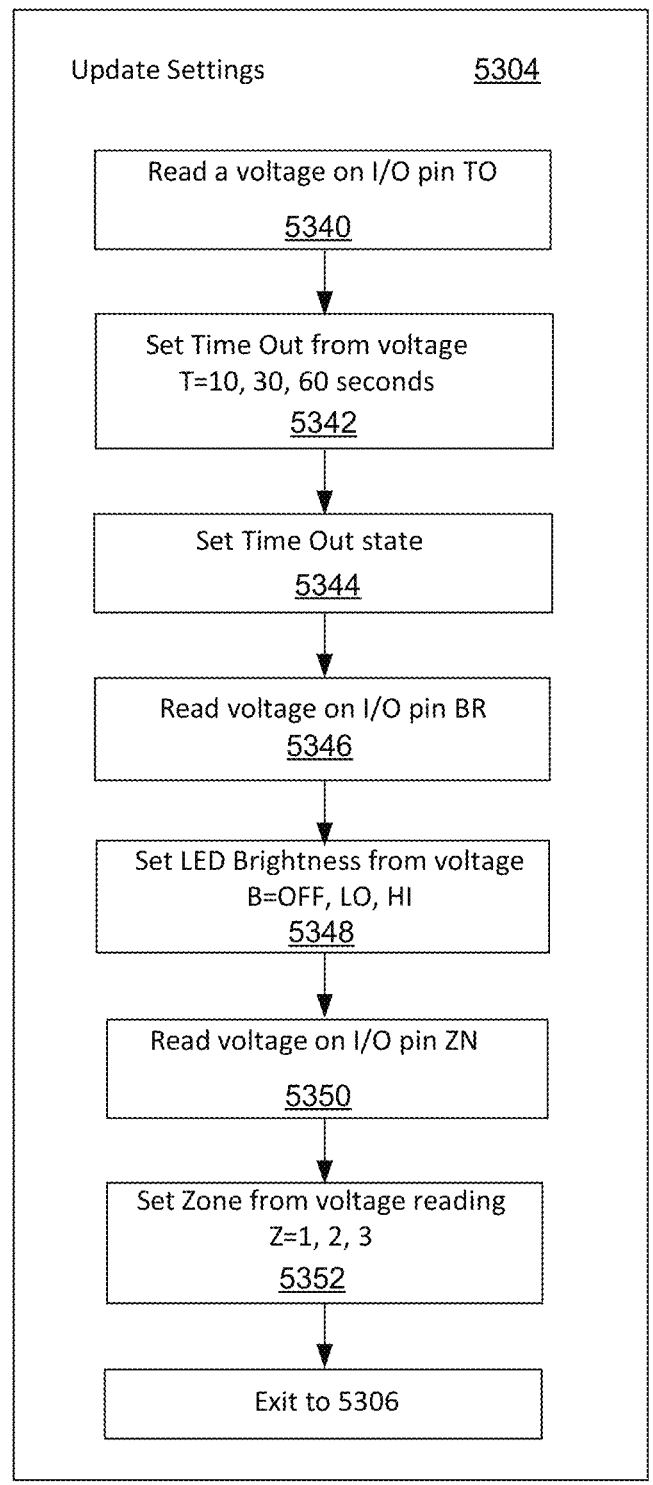

FIG. 53C provides more illustrative detail about updating the settings (step 5304) of the main flow chart (5300, FIG. 53A). To update the settings, a voltage is read from an I/O pin for the Time Out values (TO) (step 5430). The time out value may be the amount of time in seconds that the lights will remain on. The light timer counts until it reaches the time out value, then the light timer expires and the lights are turned off or fade to a lower level. In this example, the time out value may be determined (step 5342) from the voltage produced from the user selected position of a three position switch accessible on the exterior of the active cover plate.

In a next step, the time out state may be set (step 5344). For example, the time out state may require that lights turn immediately OFF, that the lights dim to a predetermined brightness, or that the lights fade over a period of time to OFF. Next the processor reads a voltage on the I/O brightness (BR) pin (step 5346). In this example, the brightness value may be determined from the voltage produced from the user selected position of a three-position switch accessible on the exterior of the active cover plate. For example, the switch (and other switches described herein) may be used to set one of three different voltages on the BR pin. The first voltage may be the regulated DC voltage that is accessible to all the chips. The second voltage may be ½ or ⅔ of the regulated voltage and may be produced by a voltage divider or other circuitry. The third voltage may be zero volts which may be produced by the switch connecting the pin to ground. For example, if the regulated DC voltage is 3.3 volts, if the BR pin reads 3.3 volts the user has selected the bright (HI) setting for the lights. If the BR pin reads 1.6 volts then the user has selected the "LO" setting for the lights. If the BR pin voltage is zero, the user wants the light to be OFF. If the user has selected this setting, then the light will remain OFF even if motion is detected and/or a valid Rx signal is received/transmitted. Thus, the user defined brightness settings are set from the user input as measured at a designated pin on the microprocessor (step 5348).

The microprocessor next reads the voltage from the zone (ZN) pin (step 5350). In some embodiments, the zone pin may be similarly controlled by the position of a three position switch. One switch position may correspond to a low voltage and indicate that the user has selected zone 1 for the active cover plate. Similarly, different voltage/switch positions indicate other zones. The zone for the active cover plates is then set from the voltage reading (step 5352) and the process exits to step 5306 in the main flow chart.

The method described above is only one example. As with any of the methods describe herein, there could be a number of additional steps, steps omitted, steps divided into sub-steps, or the reordering of steps. For example, if there is interference (such as from a neighbor with the same product and using the same zones), the zone control could be turned off and each active cover plate or other unit could act independently or be reprogrammed to eliminate the interference. In some examples, when the room lights switch ON or the room is otherwise lighted, the active cover plate/unit may sense increased light levels and signal the LEDs to fade off. If the LEDs are off, the plate/unit may still keep transmitting sensing events such as motion detection. In some embodiments, LEDs may be configured to produce a low level of lighting and then brighten to a higher level of illumination when an event is sensed, an environmental variable is detected, or a signal is received. After a period of time, the LEDs may dim back to the low lighting level.

Figure 53D:
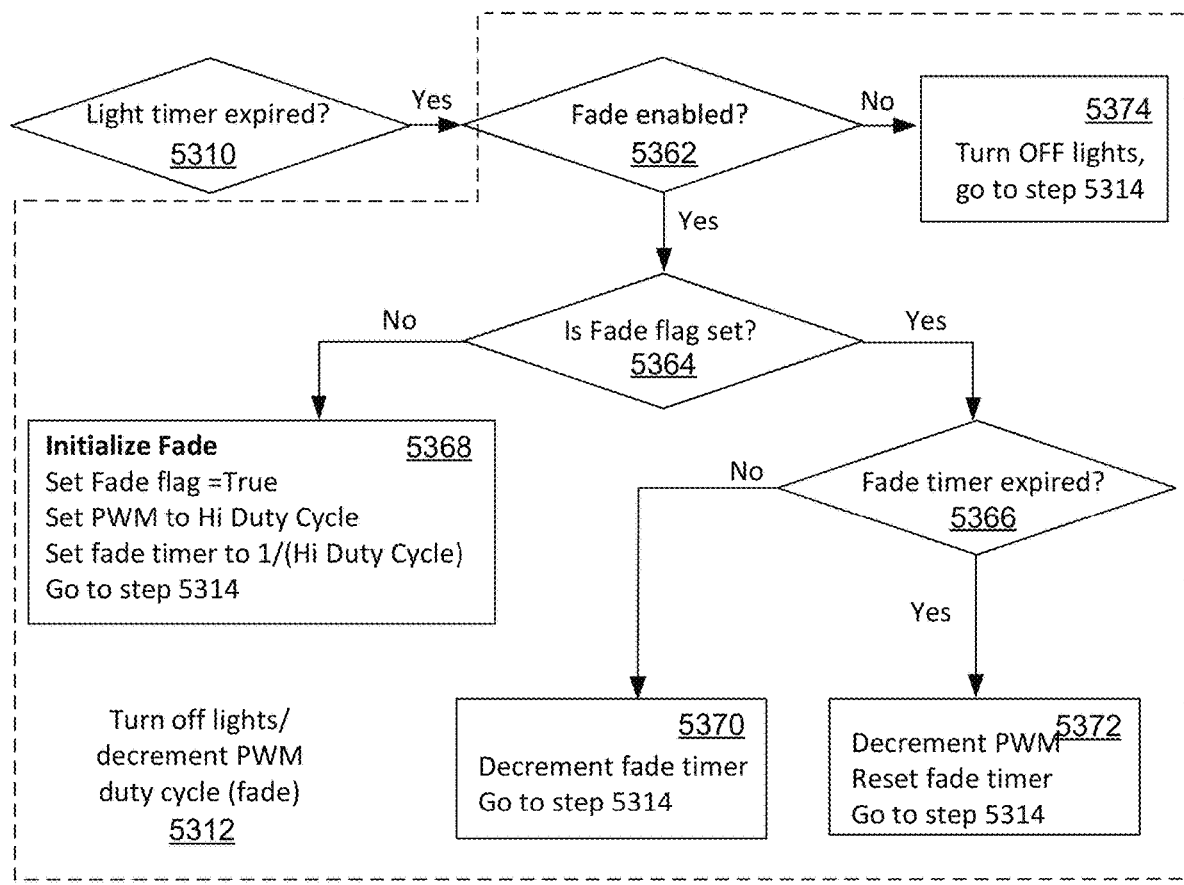

FIG. 53D is a flow chart of an illustrative method and principles to turn off lights/decrement the phase width modulation variable (PWM) duty cycle to fade the light (step 5312). To enter this flow chart, a determination is made that the light timer has expired (step 5310). If the light timer has expired it means that the lights should either be turned OFF or that the lights should fade. The next step may be to determine if fade is enabled (step 5362). If fade is not enabled ("No") then the lights are turned off and the process proceeds to step 5014 in the main program (step 5374). If the fade is enabled ("Yes" step 5362), then it is determined if the fade flag is set (step 5364). If the fade flag is set ("Yes" step 5364), then the fade is already in process and will continue until the fade timer expires (step 5366). The fade timer may determine the amount of time between PWM steps in the fading process. If the fade timer has expired, then the PWM is decremented (to turn OFF the light) (step 5372) and the process exits to step 5314 in the main flow chart. If the fade timer has not expired ("No", step 5366), then the fade timer is decremented (step 5370) and the process exits to step 5314 in the main flow chart. If the fade flag is not set ("No", step 5364) it means that the fade process is not in process but should be started. The next step is to initialize the fade process (step 5368) which may mean that the fade flag is set to true, the PWM variable is set to the high duty cycle, the value of the fade timer is selected, and any other appropriate initialization that could occur to start the fade process. The process then could, for example, return to step 5014 in the main flowchart.

In any of the flow charts in this paper or any paper incorporated by reference, the steps, their order and inter-relationship, and descriptions are merely examples. A variety of modifications to the steps could be undertaken. For example additional steps may be added, existing steps could be removed, steps may be split into additional steps, and steps may be combined or reordered. For example, there may be some amount of variation in the input power to the circuit. Although full way rectification of the input AC may be used, the PWM frequency of the fade routine may produce intermodulations of 120 Hz/60 Hz and cause beat effects. High frequency PWM may resolve this issue. For example, if the PWM frequency is about three orders of magnitude higher than the base frequency of 60-120 Hz, the PWM frequency may be on the order of tens of kHz. This will make any beat effects invisible to the human user. There is also the possibility that the system may incorporate timing by referencing zero crossings. Every time the system encounters a certain time threshold, it turns the light on. This is similar in some aspects to a triac dimmer. During the fade routine, the system may gradually change the threshold until the light never turns on. In this case, the brightness of the light may be equivalent to the area under the curve and the area under the curve may accumulate according to the sinusoid. Additionally, the fade routine can compensate for non-linear LED brightness as a function of current.

Figure 53E:
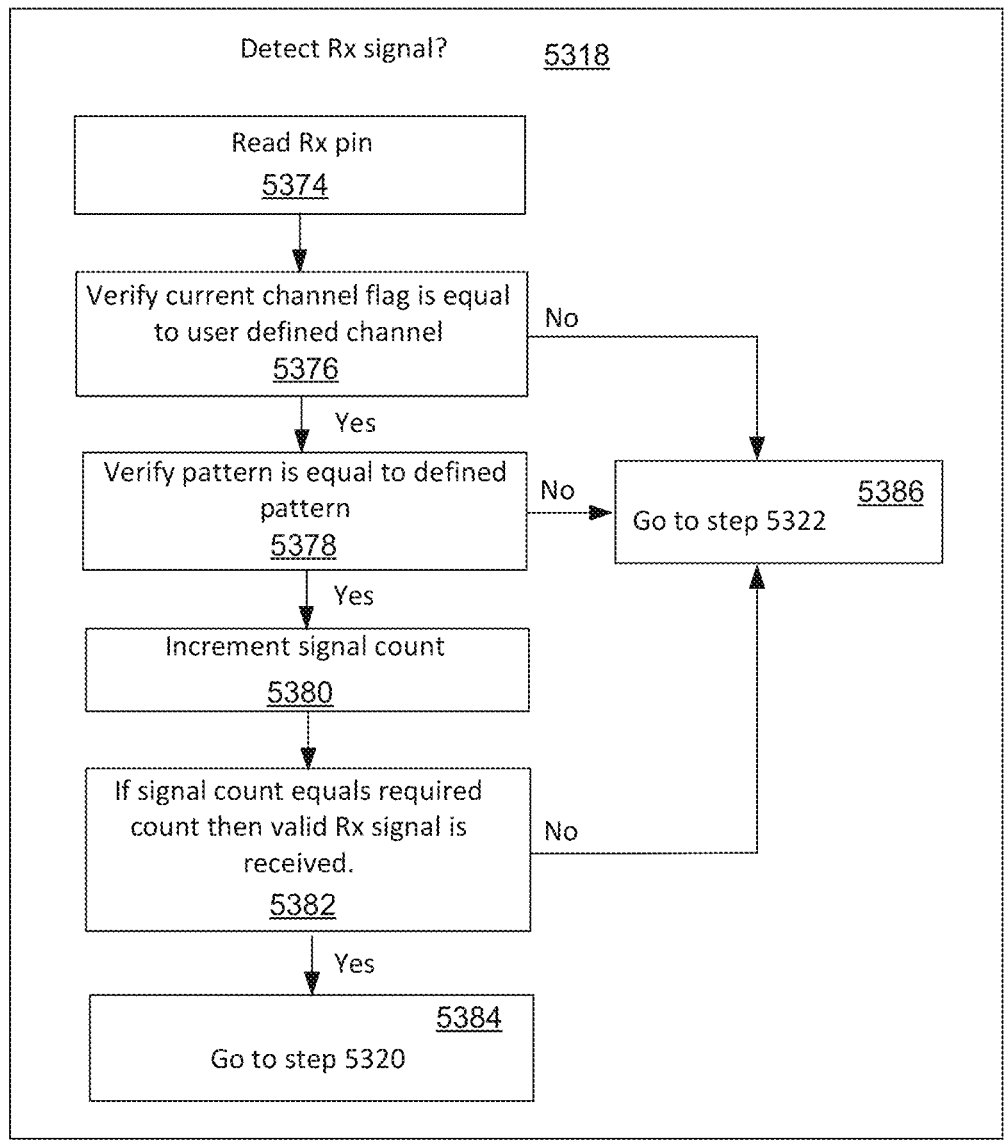

FIG. 53E shows additional information about the step of detecting a received (Rx) signal (step 5318) and verifying that it is valid. In a first step the voltage value of the Rx pin is read (step 5374). The current channel flag is checked to determine if it is equal to the user defined channel for the active cover plate (step 5376). This verifies that the signal was received in the proper time window. If the signal was not received in the proper time window ("No"; step 5376) then the process exits to step 5322 (step 5386). If the signal was received in the proper time window ("Yes", step 5376) then the pattern of the signal is compared to a defined pattern to verify that the signal is valid (step 5378). For example, if the defined pattern has a digital signature (i.e. 10111) then the pattern of the received signal is compared to determine if it matches the digital signature. If there is no defined pattern or if there is simply irrelevant energy present in the transmission frequency at the defined time window, then the verify pattern step may be skipped. If the pattern of the signal does not match the defined pattern ("No", step 5378) then the process exits to step 5322 (step 5386). However, if the pattern of the signal is verified ("Yes"; step 5378) then the process proceeds to step 5380 wherein the signal count is incremented. In the following step (step 5382) if the signal count equals the required count then a valid Rx signal has been received. For example, if the signal must be received three times in three different cycles, then the required count would be three. If the signal count does not equal the required count ("No" step 5382) then the process goes to step 5386 and exits to step 5322 in the main flow chart. If the signal count equals the required count ("Yes" step 5382) then the process goes to step 5384 and exits to step 5320 in the main flow chart. This means that a valid Rx signal has been detected and the lights should turn ON.

Figure 53F:
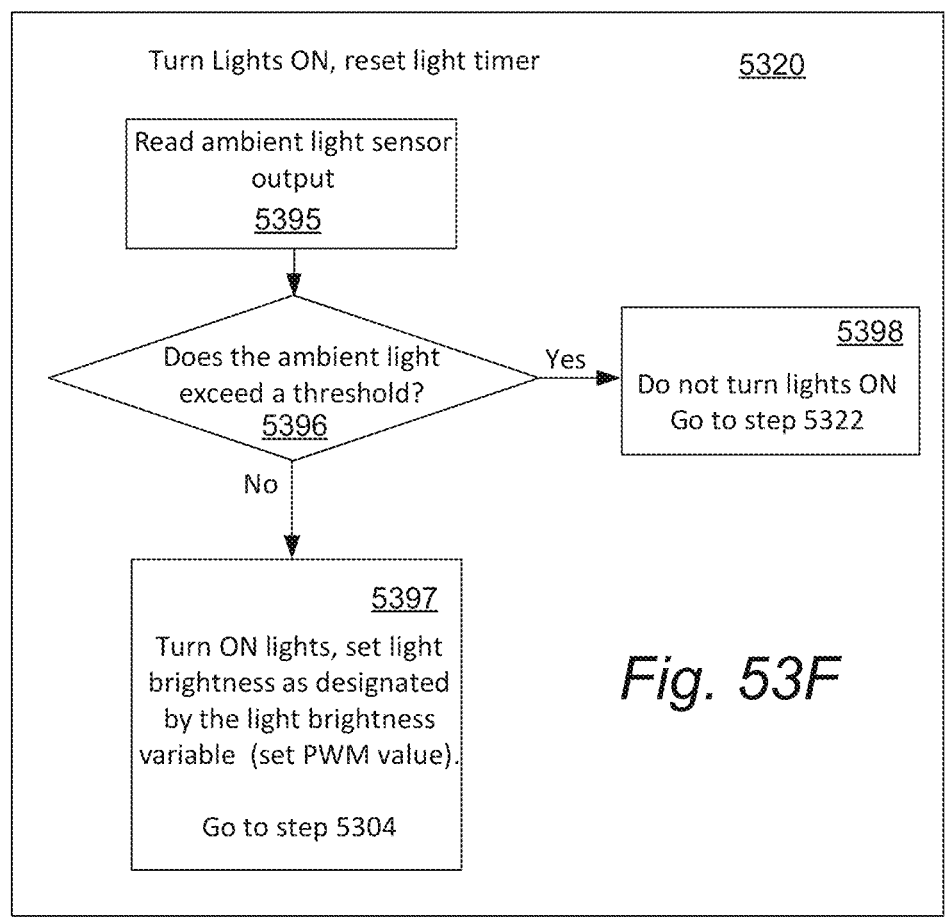

FIG. 53F is a flow chart of an illustrative process for turning the lights ON and resetting the light time as recited in step 5320 in the main flow chart (FIG. 53A). In this example, the ambient light sensor output is read (step 5395) and then the ambient light sensor output is compared to a threshold (step 5396). If the ambient light sensor output exceeds the threshold ("Yes", step 5396) then the lights are not turned ON (step 5398) because the room is already illuminated. For example, if the room is illuminated by light from overhead bulbs or from sunlight through a window there is no need for the active cover plate to illuminate. The process then exits to step 5322. This is only one example. In this and other examples, the principles may be applied in a variety of ways. For example, it may be desirable to have the light come on in some cases even though room or area is illuminated. This may be useful in a variety of way including when the light coming on signals something in addition to providing lighting.

If the ambient light sensor output does not exceed a threshold ("No", step 5396) the room or area around the active cover plate is dark and the process proceeds to step 5397. The lights are turned ON and the brightness of the light is set as designated by the light brightness variable. This can be done in a variety of ways, including setting the PWM value for the PWM switch (5108, FIG. 51). The process then exits to step 5322 or step 5304 in the main flow chart (FIG. 53A).

Figure 53G:
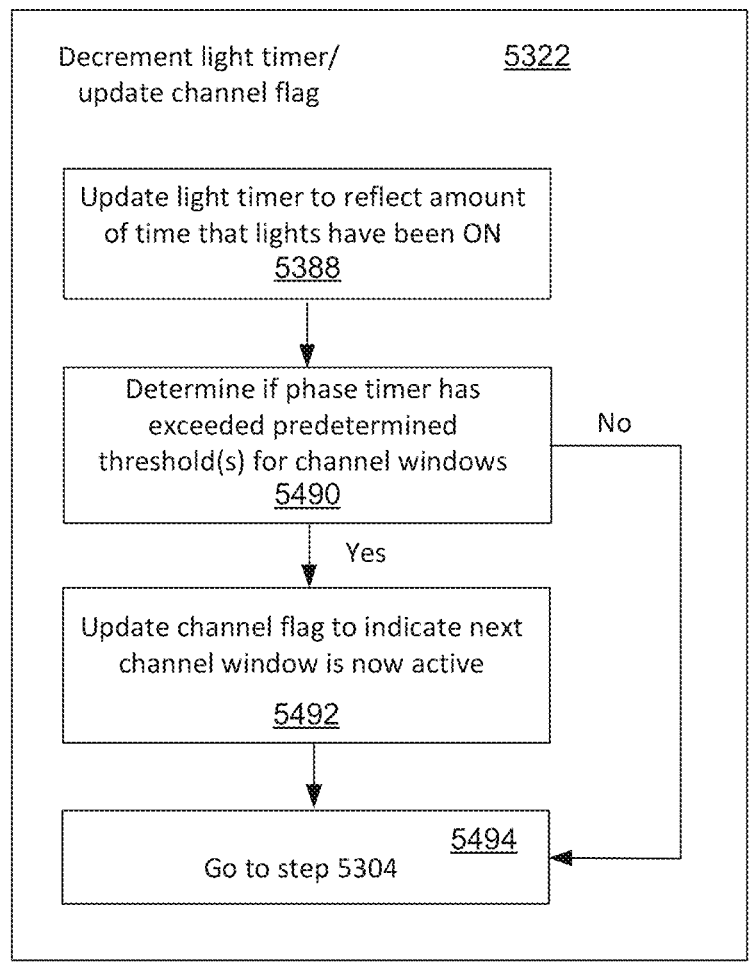

FIG. 53G shows one illustrative method for decrementing the light timer and updating the channel flag as described in step 5322 of the main flow chart. In this example, the light timer can be updated to reflect the amount of time that the lights have been ON (step 5388). In a next step, it is determined if the phase timer has exceed a predetermined threshold for one or more channel windows (step 5490). For example, if a half cycle of the AC sinewave is 8.3 milliseconds long, the phase timer may count from 0 to 8.3 milliseconds. The predetermined thresholds may indicate the beginning and/or end of time windows within each half cycle. For example, the first window (Channel 1) may open at 1 millisecond after the zero crossing is detected and close at 2 milliseconds. The second window (Channel 2) may open at 3 milliseconds and close after 4 milliseconds. The third window (Channel 3) may open at 5 milliseconds and close at 6 milliseconds. Thus the predetermined thresholds for beginning a channel window may be 1, 3, and 5 milliseconds and the predetermined threshold for ending a window may be at 2, 4, and 6 milliseconds.

If the phase timer indicates that a predetermined threshold for beginning a channel time window has not been exceeded ("No"; step 5490) then the channel flag is not updated and the process proceeds to step 5494 which instructs the process to exit to step 5304 as shown in the main flow chart in FIG. 53A. If the phase timer indicates that a predetermined threshold for beginning a channel time window has been exceeded ("Yes"; step 5490) then the process proceeds to step 5492 where the channel flag is updated to indicate that the (next) channel window is now active. For example, if the phase timer showed that the elapsed time from the zero crossing detection was 1.05 milliseconds, then the predetermined beginning threshold for channel 1 has been exceeded and the channel flag should be updated to "1" to indicate that channel 1 is now active and active cover plates that are assigned to channel 1 may transmit and receive messages.

In any of the flow charts in this paper or any paper incorporated by reference, the steps, their order and inter-relationship, and descriptions are merely examples. A variety of modifications to the steps could be undertaken. Additional steps may be added, existing steps could be removed, steps may be split into additional steps, and steps may be combined or reordered. For example, in FIG. 53G additional steps for turning off the channel flag (updating the channel flag) after the time window has expired could be included so that the guard bands between the channels are observed rather than immediately transitioning between flags when the beginning threshold is exceeded.

Figures 54A, 54B:
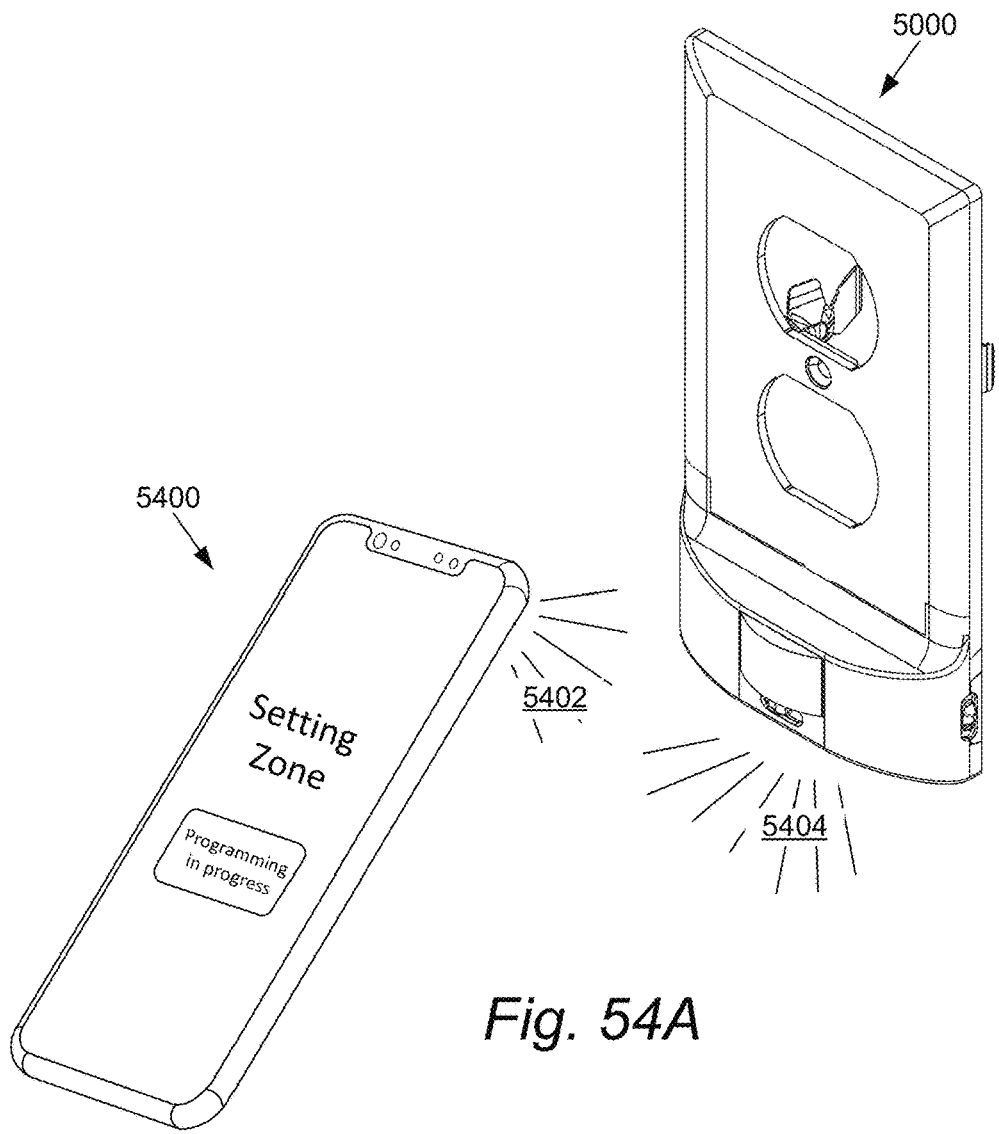
FIG. 54A shows one illustrative technique for programming a zone controlled active cover plate, according to one example of principles described herein.
FIG. 54B shows one illustrative chart of information that could be included in a zone controlled active cover plate system, according to examples of principles described herein.

FIG. 54A shows one illustrative technique for programming a zone controlled active cover plate (5000). In this example an app is downloaded onto a mobile or other device (5400). The mobile device (5400) may systematically illuminate its flashlight/photo flash feature (5402) to communicate with the light sensor (5022, FIG. 50I) in the active cover plate (5000). The light sensor accepts this input and allows the user to program one or more parameters within the active cover plate. For example, the user may program the zone the active cover plate is to be grouped in, the Rx code that should be transmitted, the number of times the code should be repeated, the channel or phase that the active cover plate is to be placed in, the light sensitivity of the ambient light sensor (this determines how dim the room must be before the light in the active cover plate illuminates), the motion sensitivity of the motion detector (for example, if the motion sensor is consistently tripped by a cat going through a cat door, the motion sensitivity could be decreased so that the active cover plate ignores the cat but still triggers when people are in the room), the brightness of the active cover plate lights, the amount of time the active cover plates are ON before fading or turning off, the color of the light in the active cover plate (for example, if the active cover plate contains multicolor LEDs as a light source, the output color could be selected), the transmission frequency or frequencies that the transmissions should be sent on, or any other appropriate parameter. These other appropriate parameters include anything that could improve the function and/or reliability of the active cover plate. For example, these parameters could include frequency hopping parameters, process steps, new programming, updates, reprogramming the external switches, etc.

The active cover plate (5000) may respond to the optical transmission of information using its own light source (5404). For example, the light source could pulse, flash, or otherwise illuminate to indicate a variety of programming steps or states. For example, the light (5404) may flash several times to indicate that it is ready to accept programming or that the programming is complete. The mobile device (5400) may detect this activity using its own camera.

While optical communication is described above for communication with an active cover plate, any other appropriate communication protocol may be used. For example, the active cover plate may include WiFi transmit/receive capabilities, Bluetooth capabilities, home automation protocols and/or any other appropriate protocol, hardware or other appropriate technology.

FIG. 54B shows one illustrative chart of information that could be included in a zone controlled active cover plate system. This information could be preset, selected by a user, or transmitted/programmed in any number of ways, including the technique shown above in FIG. 54A. For example, the first line (for Zone 1) shows that there are 4 units in the zone, that the transmission code is a "1" and that it only needs to be communicated once (the required count) to be considered a valid signal, that all the active cover plates will transmit during the channel 1 time window and that the sub-channel is 6, which indicates that the transmission/carrier frequency for Tx/Rx is at 433.2 MHz. In contrast, zone 8 has only one active cover plate in the zone (the user may be working to add more to the zone) and has a transmission code/pattern of "110011" which must be transmitted and received three times before it will be considered valid. The assigned channel for zone 8 is channel 6. This indicates that the time in the half wave cycle has been divided up, not into 3 time windows but into at least 6 time windows to create 6 channels. Ordinarily, only one zone is permitted to transmit in the same time window, however, in this case the sub-channels indicate that different frequencies are used within the same channel. The sub-channel 10 indicates that the transmit/receive frequency is 433.3 MHz, the sub-channel 18 indicates that the transmit/receive frequency is 433.5 MHz and the sub-channel 21 indicates that the transmit/receive frequency is 433.6 MHz. Additionally or alternatively, a frequency hopping technique could be used to transmit signals. Frequency hopping is a method of transmitting radio signals by rapidly changing the carrier frequency around many distinct frequencies occupying a larger spectral band. This has several advantages over fixed frequency transmission. The frequency hopping/spread spectrum signals are highly resistant to narrow band interference because the signal hops to a different frequency band. The frequency hopping signals add minimal interference to narrow band communications (and vice versa) and can consequently share a frequency band with many types of conventional transmissions with minimal mutual interference.

Figure 55A:
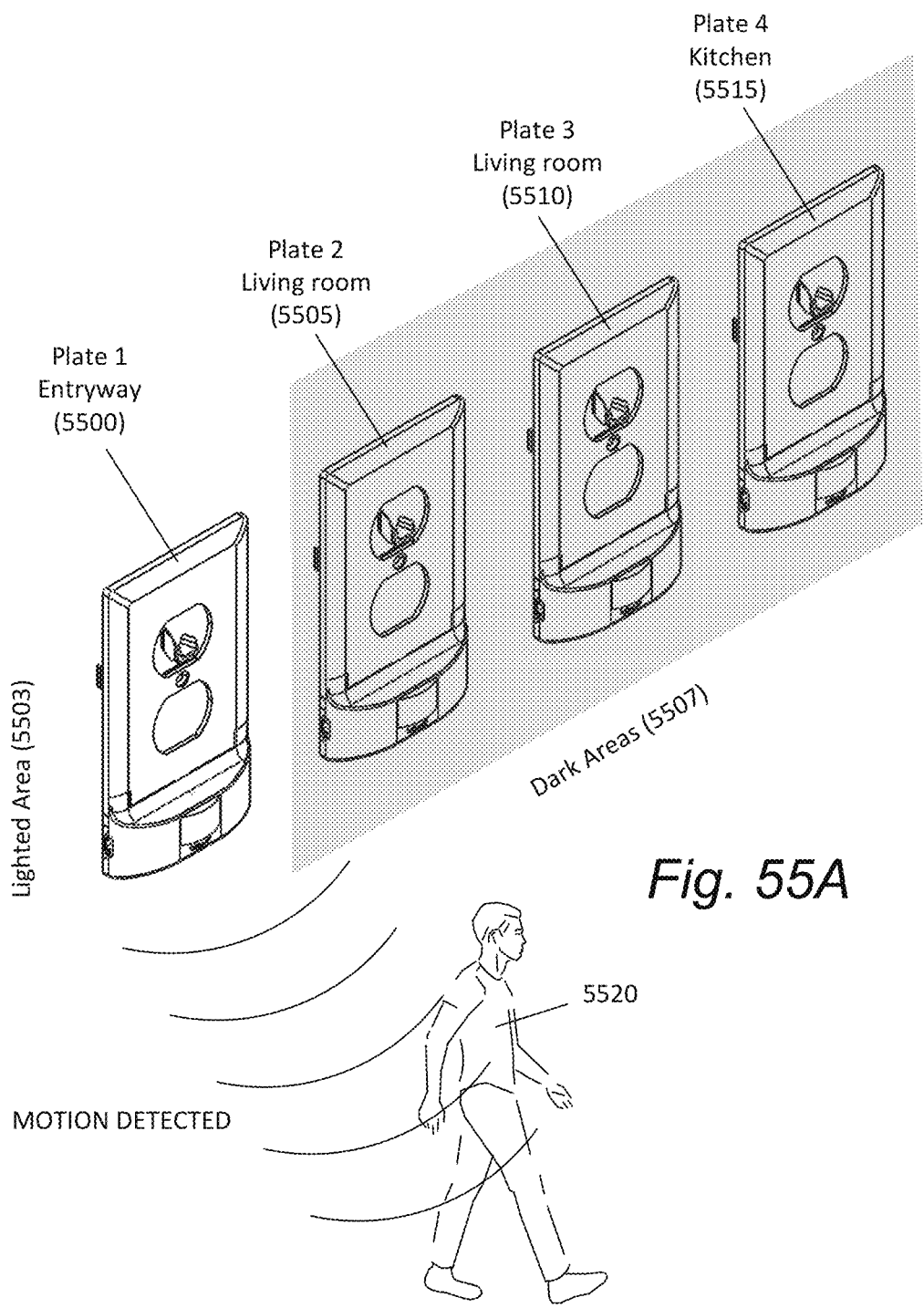
FIGS. 55A-55C show illustrative examples of the operation of a group of active cover plates, according to examples of principles described herein.
Figure 55B:
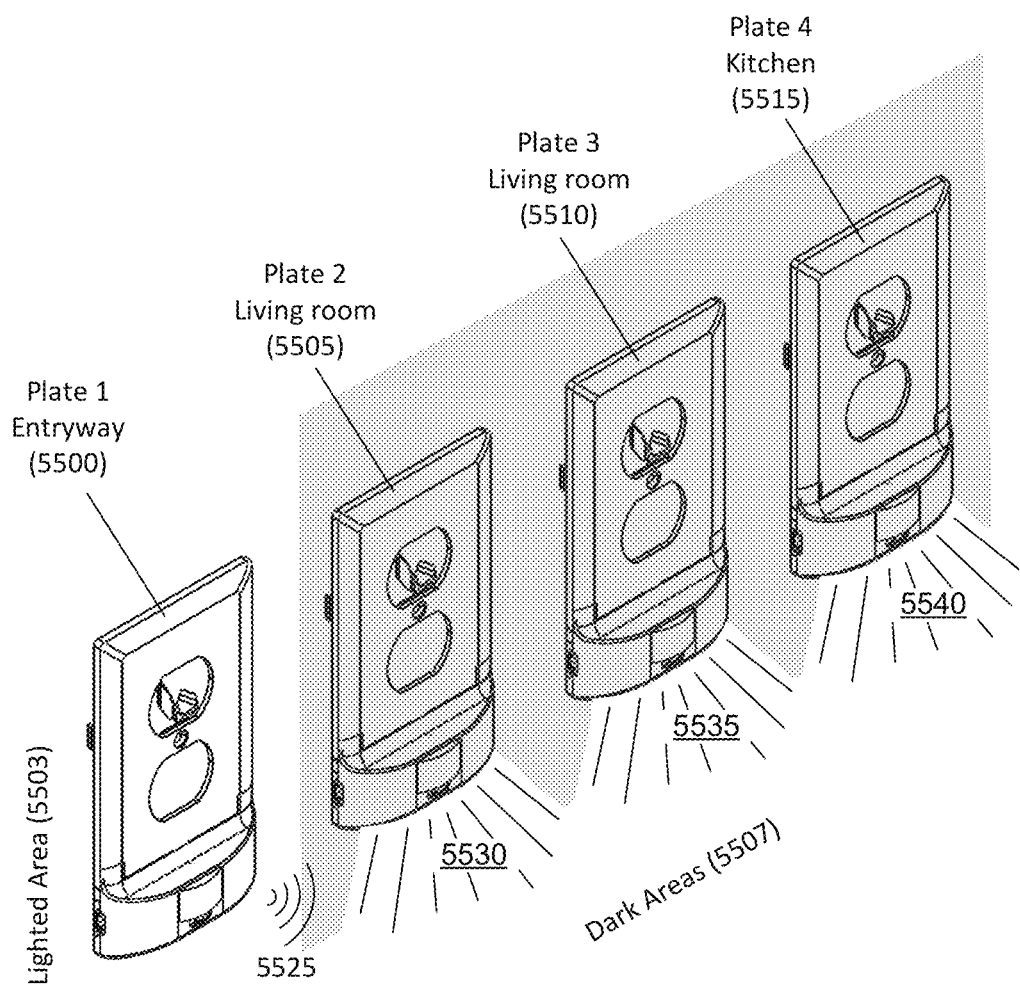
Figure 55C:
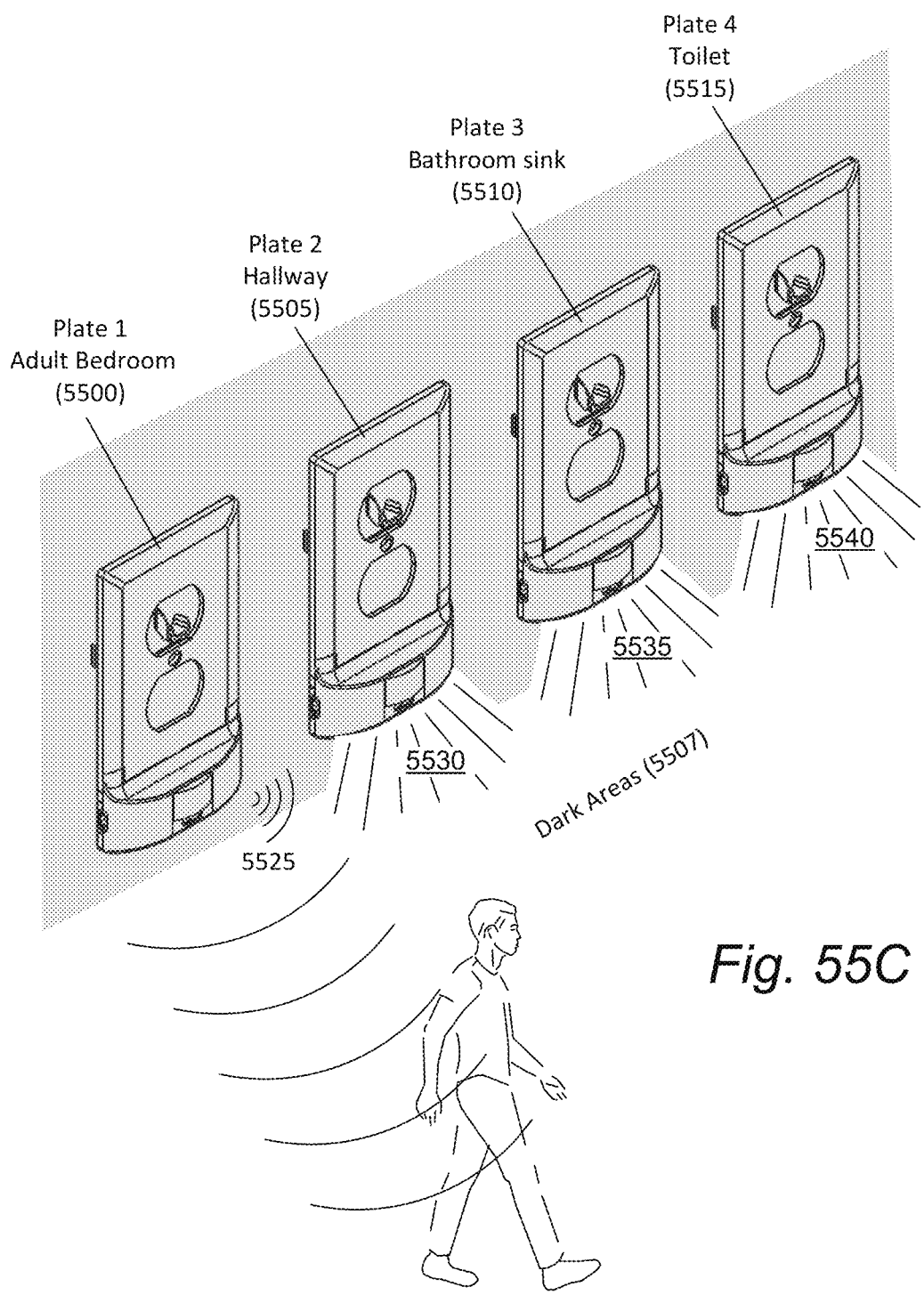

FIGS. 55A, 55B and 55C show illustrative examples of the operation of a group of active cover plates. In this example there are four active cover plates, one active cover plate (Plate 1, 5500) that is in a lighted area (5503) and three active cover plates (Plate 2, 5505; Plate 3, 5510; Plate 4, 5515) that are in dark areas (5507). For example, the first plate (5500) may be installed in an entryway that is lighted either by ambient or artificial light. The other active cover plates (5505, 5510, 5515) are in dark areas such as a living room (5505, 5510) and a kitchen (5515). The active cover plates may communicate with each other in a variety of ways. For example, they may use a mesh network, broadcast communication, one-way communication, two-way communication, packetized communication, master/slave communication, a combination of communication methods or other appropriate communication. The communication mechanism/protocol may include any of a variety of different approaches, including wireless, wired, optical or other communication techniques. In one example, each of the active cover plates (5500, 5505, 5510, 5515) is configured to broadcast a signal when it senses a change in a predetermined parameter. For example, these predetermined parameters may include presence of an object, absence of an object, motion of an object, electrical or wireless signals produced by an object, sound, temperature, humidity, presence or absence of water, light, elapsed time, or other desired parameter. Other active cover plates receive/sense the signal and determine if they should take action based on the signal. In the illustrative implementation shown in FIG. 55A, the first active cover plate (5500) senses an object (5520). As discussed above, the active cover plates may use a variety of different techniques for sensing objects, the presence of objects, and/or motion of objects. For example, the active cover plate could use ultrasound, radio frequency signals, detection of signals produced by the object (e.g. a mobile device may produce signals that can be detected by the active cover plate), infrared/temperature signatures, visible images, sound, etc.

When the active cover plate senses a desired/selected parameter, such as motion of an object, it broadcasts a signal that can be received by other active cover plates. In some examples, the active cover plates receive the signal and rebroadcast it, actively respond to the signal by broadcasting/sending a different signal, or may not take additional signaling action. Regardless of what signaling action is taken, the active cover plates that receive the signal determine if they are intended recipients for the signal. If they determine that they are, they may take an appropriate (predetermined) action.

In the example shown in FIG. 55B, all of the active cover plates (5505, 5510, 5515) in the dark areas illuminate in response to receiving a signal (5525) from the first active cover plate (5500) that it detected motion. The first active cover plate (5500) may or may not illuminate when it detects motion. In this example, the first active cover plate (5500) does not illuminate even though it detected a change in a parameter it was monitoring (such as motion of an object). There may be a number of advantages to this approach. For example, if motion of a person was sensed in a lighted area (e.g. Lighted Area, 5503), there is no need for the active cover plate in that area to illuminate. However, in darker areas (e.g. Dark Areas, 5507), it may be desirable for other active cover plates (e.g. 5505, 5510, 5515) to illuminate to light the path of the person. By not illuminating the active cover plate in the lighted area, energy can be conserved, while still illuminating dark areas where additional lighting (5530, 5535, 5540) is needed. Further, the dark areas (5507) can be illuminated before the person enters the dark areas. This can improve safety and reliability of the system. For example, some of the active cover plates may not be positioned/configured to directly sense the person as they enter the dark area but they will still illuminate when they receive a signal from an active cover plate that does sense motion of the person. For example, one active cover plate may be located outside of a kitchen, while other active cover plates are distributed around the kitchen. All the active cover plates in this example are configured to communicate with the others when they sense motion. The active cover plates in the kitchen may not directly detect a person before they enter the kitchen. There may be a variety of reasons for this, including but not limited to, objects on a counter covering the sensor of active cover plates on the back splash, active cover plates are located on a far side of an island and are facing away from the person entering the kitchen, the active cover plates in the kitchen may be too far away to sense the motion, and/or the viewing angle of one or more active cover plates in the kitchen may not be optimal for detection of the motion. However, because there may be one or more active cover plates outside the kitchen (e.g. in a hallway, adjoining room, or entryway), the combined sensing capabilities of the active cover plate system can detect the person before they enter the room. This distributed motion sensing system increases both the number of sensors that combine to detect parameters and the range/coverage of the system.

For some implementations, interference between units (e.g. where units are in the same groups/zone in two adjacent houses) could potentially be a problem. In some embodiments, the units could be reprogrammed with the phone app/phone shown in FIG. 54A could be used to reprogram the devices to move their transmissions/reception to a different channel/time zone. For example, the phone/app could send a basic unlock code that unlocks a settings section of the processor and allows for the code to be altered. The modifications and/or program could be stored in nonvolatile memory/programmable flash.

In FIG. 55C, all of the active cover plates are in the dark areas (5507). In this example, Plate 1 (5500) is in an adult bedroom, Plate 2 (5505) is in a hallway, Plate 3 (5510) is in a bathroom over a sink and Plate 4 (5515) is in the bathroom next to a toilet. In this example, the user has determined that they do not want the light in active cover plate 1 (5500) to illuminate when motion is sensed. This could be for a variety of reasons, including but not limited to, wanting to keep the room dark regardless of motion in the bedroom. For example, if there are multiple people sleeping in the bedroom, it may be undesirable for the light to come on when one person gets up because the light may disturb the sleep of the other person. Additionally, it may be undesirable for the light to come on when it senses motion such as a person rolling over in bed. Consequently, the light on the active cover plate (5500) may be turned off by using a switch to select the lighting off option, through wireless or wired communication, or through other appropriate techniques. However, the active cover plate (5500) may still be configured to transmit a signal (an "I saw motion" signal or other signal) to the other active cover plates (5505, 5510, 5515) in the group. Consequently, the active cover plates (5505, 5510, 5515) will illuminate the hallway, bathroom sink area, and toilet area. This allows a user to get up in the night, have the hallway and bathroom illuminated before they get there while still keeping the bedroom dark. They can then exit the dark bedroom into the hallway and bathroom. When they are finished in the bathroom/hallway the active cover plates will automatically turn off when they stop sensing motion (and the lighting timer has expired). For example, the user may select a short lighting time setting/dim setting for the cover plates in the hall if they move through the hallway quickly, but may have a longer lighting time setting for the active cover plate in the bathroom. This would avoid the issue of having the lights go off in the bathroom if there are periods of relative stillness while the user is in the bathroom. The ability to select settings for the individual active cover plates provides for a customized experience. In the example above, a user gets out of bed to go to the bathroom, but the active cover plate in the bedroom does not illuminate, the hallway lights dimly illuminate, providing guidance/orientation to the user, while the bathroom lights are on brighter and illuminate longer. This may provide time for the user's eyes to adjust to brighter light as they are moving into the bathroom. As they are in the bathroom and may not be moving a lot, the bathroom active cover plates will remain illuminated for a longer period of time (e.g. 1 minute or 5 minutes) while the active cover plate(s) in the hallway may fade to off. The fading to off minimizes lighting into the bedroom. Further, the fade to off rather than snapping off avoids sudden changes in lighting that may cause disruption to sleep and/or disorientation. The fade provides time for the user's eyes to adjust to lower light levels and/or time to move to a desired location. In some examples, some of the active cover plates or other units in the group may be set to "detect motion and illuminate" but do not transmit to other units in the group. For example, the bathroom active cover plates may be set to illuminate but not transmit to other units. This may prevent active cover plates in the hallway from repeatedly illuminating when motion is sensed in the bathroom. As the user exits the bathroom, the light from the bathroom will illuminate a portion of the hall and the hallway active cover plates will directly sense motion and illuminate as the user moves through the hallway to the bedroom. The active cover plate (5500) in the bedroom will remain off (not illuminate) throughout the example. Additionally, if the bathroom/hallway is shared, then other people moving through the area will not illuminate the active cover plate in the adult bedroom.

This feature (turning off one or more of the active cover plate lights while still allowing the active cover plate to transmit motion to other units in its group) can be useful in a variety of other situations. For example, it may be desirable that the person, animal or object triggering the motion sensor to be unaware that their motion has been sensed. This could be the case when it is desired to monitor motion through an entry door. The active cover plate next to the entry door may have its lighting feature turned off, but still transmit to other active cover plates/units within the house. For example, an active cover plate in a study may illuminate when motion is sensed at a garage door. This would provide notification to a user in the study (or other location) that motion was sensed at the garage door. If the motion (entry of a person from the garage) was unexpected, the user could take mitigating action.

In another example, an active cover plate or other unit could be placed in a child's bedroom but its light could be turned off (all the time or only during specific times of the night). However, the active cover plate could be in a group with one or more active cover plates in a hall, bathroom, parent's bedroom, den or other location. By turning off the light in the child's bedroom (all the time or using a timer or other mechanism to turn it off during a desired time frame), motion of the child in the bedroom does not illuminate the bedroom and consequently doesn't wake the child up or wake up other children in the room. In some situations, the timer may be preprogrammed or may be able to be programmed on the while in use. Additionally or alternatively, the cover plate may have a user input that controls/influences the timing. If the child is awake and up, the parents could be notified by illumination of the active cover plate or other unit in the den, hallway, or their bedroom. Although the descriptions above use lighting as the signaling mechanism, a wide range of other signaling mechanisms could be used, including a sound (such as a chime), a change in lighting (such as a change in color, intensity, or illumination pattern), a signal to a mobile device, a smell (such as an air freshener/oil diffuser) dispensing unit, etc. For example, if a child gets out of bed in the night, an oil diffuser could dispense lavender to help them go back to sleep. For pets, an active cover plate (or group of active cover plates or other units) could monitor and report motion of the pet. For example, an active cover plate could monitor a cat door and notify the owner that their cat entered/left the cat door without illuminating. The cat has excellent night vision and would not need the additional light. Additionally, scents that animals enjoy (catnip, some essential oils, scents that the animal associates with their owner or other calming experience) could be dispensed.

As discussed above, the signaling unit may not illuminate even though it may have the capability and is situated to do so. This is contrary to the standard practice and understanding in the field, where if a unit detects motion and the area is dark, the unit illuminates. This is the normal and accepted operation of motion activated lights. They illuminate when motion is detected to illuminate the moving object and its surroundings. For example, when a person approaches a motion activated light, the light is triggered and illuminates the area to allow the person to more easily navigate the area and to alert the owner of the light that someone has moved into the sensor area of the light. This allows the owner of the light to more easily see/identify the person or other moving object.

However, in a variety of examples described herein, the signaling unit does not illuminate even though it has the capability to do so and the conditions are correct for illumination (e.g. motion has been detected, the surrounding area is dark and sufficient power is available). The signaling unit not illuminating addresses a problem that has not been previously recognized/addressed by motion activated linked lights. In particular, it may not be desirable to illuminate the area where motion is occurring. For example, if you wish to maintain night vision, not disturb the object/entity triggering the motion detector, or do not wish to illuminate an area where others are resting/sleeping. This is a longstanding but unrecognized and unmet need.

In some examples, the active cover plates or other units may not illuminate in a way that is directly visible to the triggering person/animal. For example, one or more active cover plates in a group may sense motion and illuminate at a different light frequency (e.g. in the IR or other frequency) that would provide illumination for night vision goggle or night vision security cameras. Additionally, an active cover plate could signal the user/owner that an active cover plate has been triggered. The user/owner may then be able to monitor the area where the active cover plate or other unit has been triggered using the night vision equipment and additional IR illumination that is provided by the active cover plate or other units. For example, if the user is a pet owner, they could monitor the behavior of their pets in the house or yard to ensure that they are safe, healthy and are not escaping or undesirably interacting with other animals/humans. If the user is passionate about nature, they could watch animals that have triggered the devices. If there is a security risk, the user could take appropriate action. In some cases, the active cover plates could be placed in an area that is not directly visible to the user such as an outbuilding, a back door to a garage, or a gate to a yard. If someone enters or moves in these areas, the user would be notified, but the person/object triggering the signal may or may not be notified.

Additionally or alternatively, the first unit/nightlight/plate (5500) and other units in the group (5505, 5510, 5515) may illuminate even when the area(s) is lighted. This may be useful in a variety of situations where signaling is important. For example, a user may wish to be notified if motions or other environmental parameters are sensed even if the room they are in is illuminated. Consequently, the unit(s) may be configured to illuminate even if the area is dark. The examples given herein may be using the term "nightlight" and "illumination" as an example, the principles could be extended to a variety of different configurations. For example, the units or action modules within the units may be equipped with a variety of actuators including speakers that could operate along the principles described herein. For example, if one unit detects an environmental parameter, it may not take any action, except to signal other units. These units may chime or given another indication that the environmental parameter has been sensed. These units may also take action to influence the environmental variable. For example, a pest, pet or other animal may be detected in an unwanted area of the house/yard. One or more of the units may use an ultrasonic signal to deter the animal.

As discussed herein, the active unit that sends a signal (i.e. the "signaling unit") may not illuminate even though it may have the capability and is situated to do so. This is contrary to the standard practice and understanding in the field, where if a unit detects motion and the area is dark, the unit illuminates. However, because the signaling unit does not illuminate even though it has the capability to do so and the conditions are correct for illumination (e.g. the surrounding area is dark and sufficient power is available). The signaling unit not illuminating addresses a problem that has not been previously recognized/addressed by motion activated linked lights. In particular, it may not be desirable to illuminate the area where motion is occurring. For example, if you wish to maintain night vision, not disturb the object/entity triggering the motion detector, or do not wish to illuminate an area where others are resting/sleeping.

Thus, in one example, a nightlight may include a light source, a motion sensor, wherein the nightlight is configured to broadcast a signal when motion is detected, and a first user selectable mode comprising a sleep mode wherein the nightlight detects motion and sends out the signal but does not illuminate the light source. The nightlight may include a second user selectable mode wherein the nightlight detects motion, sends out the signal and illuminates the light source. The nightlight may also include a third user selectable mode, wherein the nightlight detects motion, does not send out a signal and illuminates the light source. The signal may comprise a broadcast to other nightlights in proximity to the nightlight. The signal may include an optical signal that may be accepted and rebroadcast by the other nightlights. The nightlight may further include a user configurable group setting and wherein the signal comprises an RF signal to other nightlights that have been configured to have a same group setting as the nightlight. The night light may also include an ambient light sensor and a fourth user selectable mode, wherein the ambient light sensor determines that ambient light exceeds a threshold and the nightlight broadcasts the signal to the other nightlights. In response, the other nightlights in dark areas may illuminate in response to receiving the broadcasted signal.

Thus, according to principles described herein, an active unit may include a sensor to detect a change in an environmental variable and transmit a sensor signal and an action module configured to influence the environmental variable. The active unit may also include a communication module, a processor module configured to accept the sensor signal and determine if the environmental variable exceeds a threshold and to instruct the action module not to take action to influence the environmental variable, and instruct the communication module to transmit a signal to other active units that the environmental variable has exceeded the threshold. In one embodiment, the action module may include a light source. The active unit may be configured by user input to instruct the processor module not to illuminate when the area is dark and motion is detected. The active unit may further be configured by user input to instruct the processor to broadcast a signal indicating that motion has been detected.

Figure 55D:
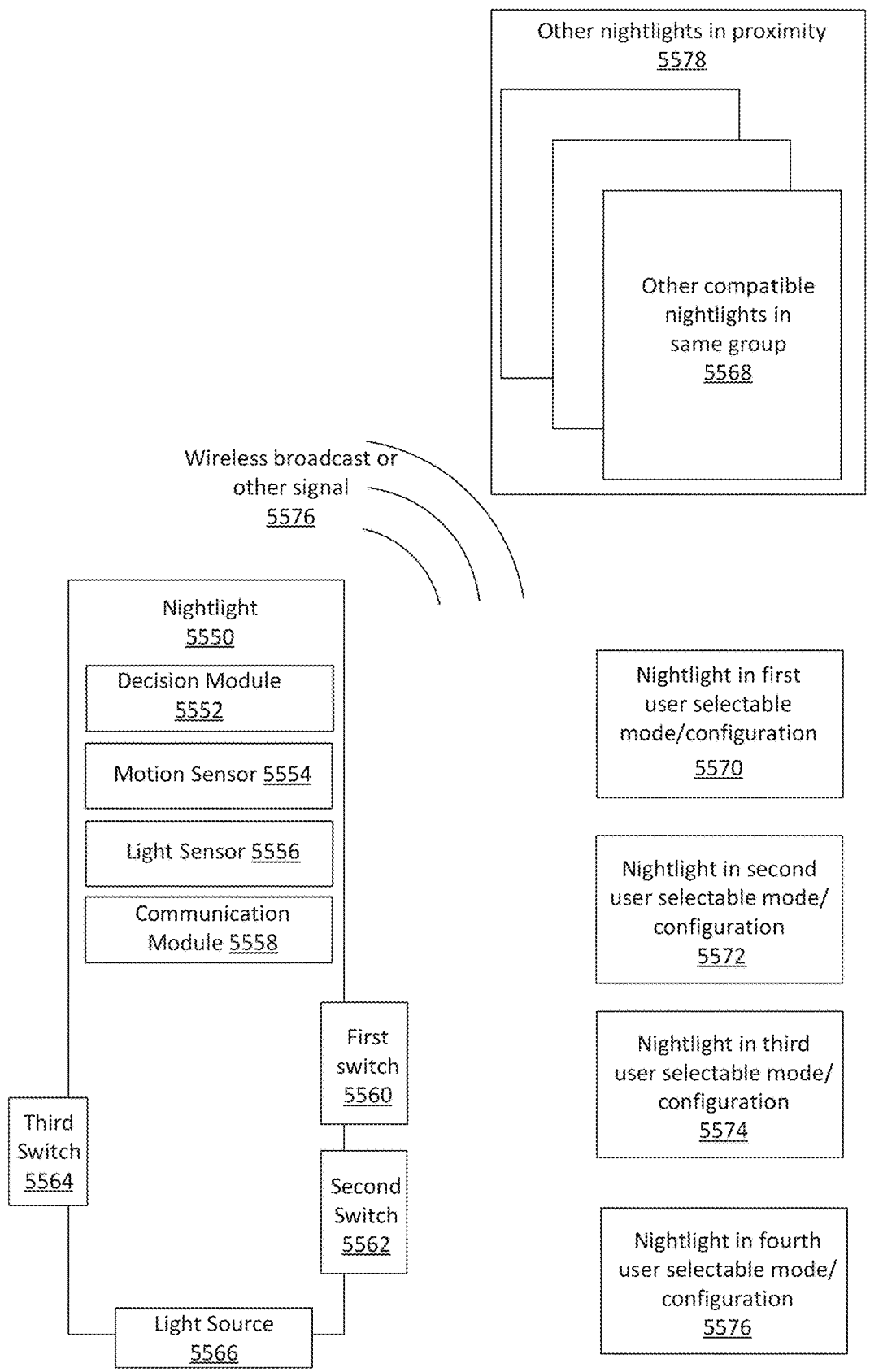
FIG. 55D shows an illustrative example of a nightlight, according to one example of principles described herein.

FIG. 55D shows one example of a nightlight (5550) and its interaction with other units. As described herein, a nightlight (5550) may include a light source (5566), a motion sensor (5554) configured to produce a signal when motion is detected, and a first user configurable switch (5560) configured to group the nightlight with other compatible nightlights (5568) such that a wireless broadcast (5576) illuminates the other compatible nightlights (5568) in the group when motion is detected by the nightlight (5550). A second user configurable switch (5562) may be configured to adjust brightness of the light source (5566) when motion is detected, wherein the second user configurable switch (5562) comprises off, dim and bright settings. The nightlight (5550) may include a decision module (5552) configured to detect settings of the first and second switches and configured to accept a signal from the motion sensor (5554) and illuminate the light source (5566) according to settings of the switches (5560, 5562). The decision module (5552) may be digital or analog and may include a processor and/or hardwired logic to make decisions and process signals and determine settings. For example, settings of switches and readings of sensors may be in the form of an analog or digital voltage, current, resistance or other parameter. These parameters may be accepted by the decision module and converted into digital format for processing and/or may be processed in an analog fashion by analog circuit components.

In some embodiments, the nightlight (5550) may take the form of an active cover plate and/or an electrical receptacle cover plate, but as described herein, the nightlight may have a variety of forms. For example, the nightlight (5550) may be a cover plate that can be configured to be placed over a light switch, wherein the nightlight (5550) illuminates an overhead light controlled by the light switch. The switches (5560, 5562) can be placed in a number of configurations including configurations that create a first user selectable mode/configuration (5570) ("sleep mode") wherein the first user configurable switch (5560) is configured such that the nightlight broadcasts (5576) motion events (as detected by motion sensor 5554) to other compatible nightlights in a group (5568); and the second user configurable switch (5562) is configured such that the light source (5566) remains off when motion is detected by the motion detector/sensor (5554).

The nightlight (5550) may also be placed in a second user selectable mode/configuration (5572) (a "linked illumination mode") wherein the first user configurable switch (5560) is configured such that the nightlight (5550) broadcasts (by wireless broad cast 5576 or through other broadcast techniques) motion events to other compatible nightlights in a group (5568). The second user configurable switch (5562) is configured such that the light source (5566) turns on when motion is detected by the motion detector (5554).

The nightlight may also be configured in a third user selectable mode/configuration (5574) (a "stand alone mode") wherein the first user configurable switch (5560) is configured such that the nightlight does not broadcast motion events to other compatible nightlights in a group (5568) and the second user configurable switch (5562) is configured such that the light source (5566) turns on when motion is detected by the motion detector (5554).

In some embodiments, the nightlight (5550) may include a third user configurable switch (5564) configured to adjust the time the light source (5566) remains illuminated following detection of motion. In some examples, the ambient light sensor (5556) may be configured to measure ambient light. The nightlight (5550) may be configured to be in a fourth mode/configuration (5576), wherein the fourth mode is configured such that the decision module (5552) is configured to accept an output from the ambient light sensor (5556) and determine that the output exceeds a threshold (i.e. the area/room is well lit and there is no need for additional light) and when the output exceeds the threshold, the decision module (5552) does not illuminate the light source (5566) and sends the wireless broadcast (5576) to the other nightlights in the group (5568), and wherein the other nightlights in dark areas (i.e. their decision modules determine that output from their light sensors do not exceed a threshold, which may be somewhat different for each nightlight) illuminate in response to receiving the wireless broadcast (5576).

Thus, as described herein, a nightlight (5550) may include a light source (5566), a motion sensor (5554), and a first user selectable configuration (5570) comprising a sleep mode wherein the nightlight (5550) detects motion and sends out a signal (5576) to other nightlights (5578, 5568) but does not illuminate the light source (5566). The nightlight may include a second user selectable mode (5572) wherein the nightlight detects motion, sends out the signal (5576); and illuminates the light source (5566). The nightlight may further include a third user selectable mode (5574) wherein the nightlight detects motion but does not send out the signal (5576) and illuminates the light source (5566).

As discuss herein, the signal (5576) may comprise a broadcast to other nightlights (5578) in proximity to the nightlight (5550). The signal may include or consist of an optical signal that may be accepted and rebroadcast by the other nightlights (5578 and/or 5568). This rebroadcast may be performed by all the nightlights in proximity (5578) that receive the signal (5576) or the rebroadcast may be performed by a selected group of nightlights such as nightlights that are in the same group (5568). For example, the nightlight (5550) may include a user configurable group setting (i.e. via the settings of the first switch (5560) and the signal (5576) that includes an RF signal to other nightlights (5568) that have been configured to have a same group setting as the nightlight (5550). In some embodiments, the nightlight may further comprise an ambient light sensor (5556), wherein the ambient light sensor determines that ambient light exceeds a threshold and consequently does not illuminate the light source (5566) but sends the signal (5576) and the nightlight sends the signal to the other nightlights in the same group (5568), and wherein the other nightlights in the same group (5569) that are in dark areas illuminate in response to receiving the signal (5576).

Figure 56:
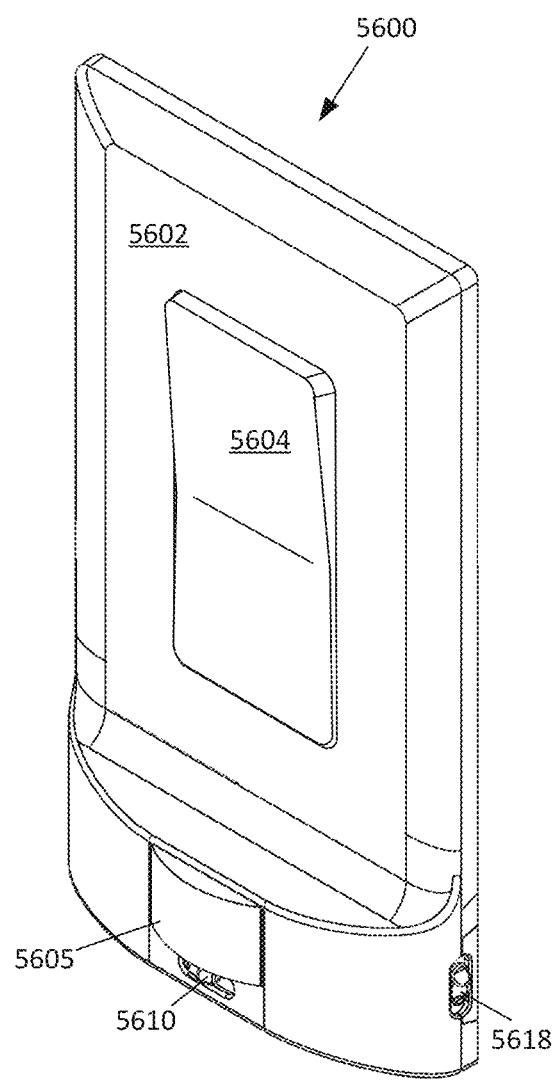
FIG. 56 shows one illustrative example of a motion sensing active cover plate configured for use with a light switch, according to one example of principles described herein.

FIG. 56 shows one illustrative example of an active cover plate (5600) that is configured for use with a light switch (e.g. 5604). As discussed above, active cover plates may be used on a variety of different electrical receptacles including toggle and rocker light switches. The active cover plates may have any of a variety of functions, including sensing a parameter and taking appropriate action based on the sensing information. In this example, the active cover plate (5600) may include a faceplate (5602), a motion detector (5605) and a variety of switches (5610, 5618) to configure the function of the active cover plate (5600). These switches or other settings may have a variety of functions, including those described above and subsequently shown.

Figure 57:
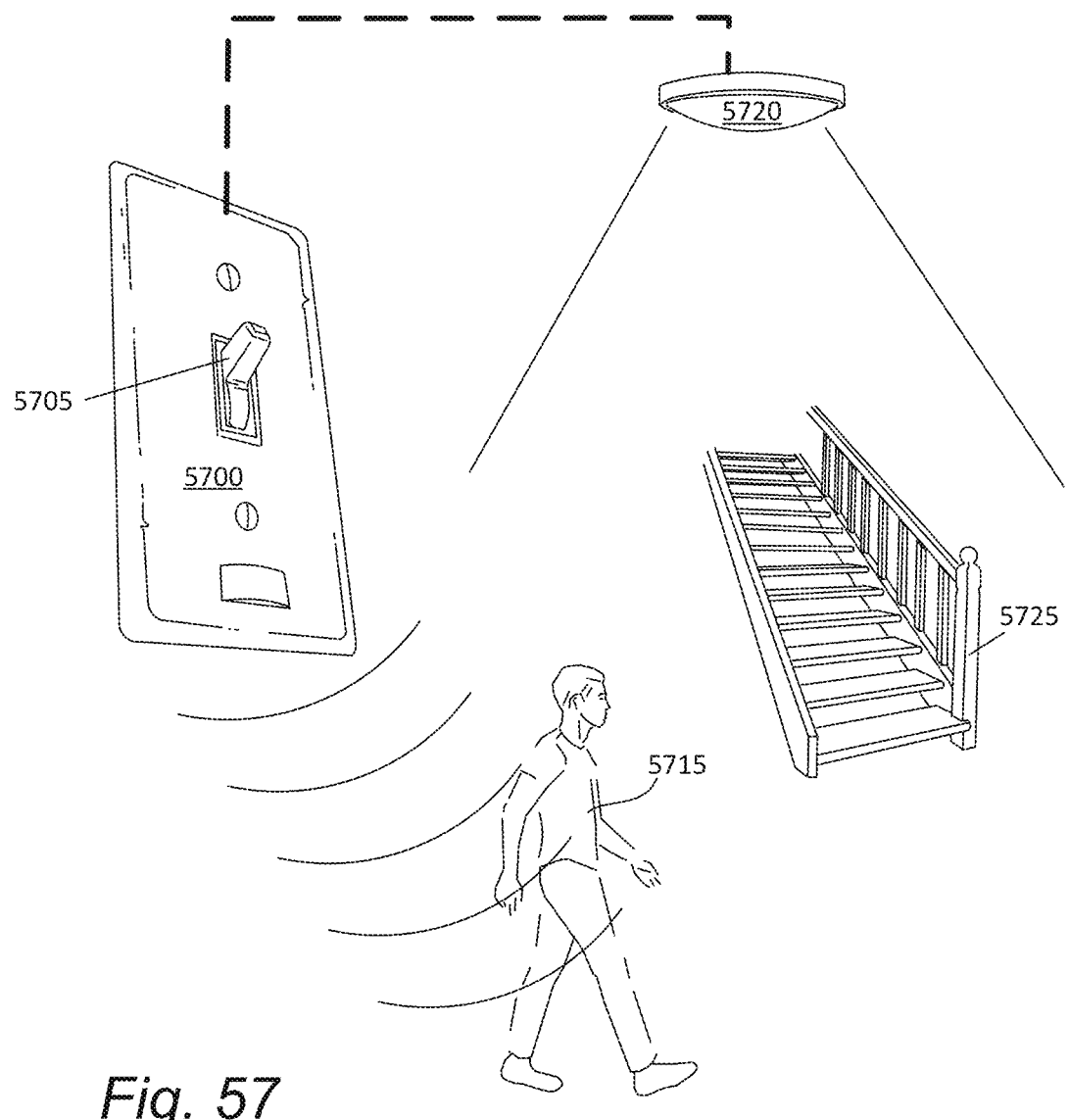
FIG. 57 shows an illustrative example of a motion sensing active cover plate that illuminates an overhead light when motion is sensed, according to one example of principles described herein.

FIG. 57 shows an illustrative example of an active cover plate (5700) configured to mount over a light switch (5705). In this example, the active cover plate (5700) senses motion or other parameters and may take one or more actions based in the information. The parameter may be any parameter described herein or any other desired parameter. For example, the active cover plate may sense smoke or detect activation of a fire alarm. The active cover plate may take appropriate action, which may include transmission of the detected information or other signal, unlocking a door, illuminating an exit indication, or illuminating an overhead light. The active cover plate may operate similarly based on any of a number of other parameters and situations. For example, the active cover plate may detect humidity and open a vent, activate a fan, transmit a signal to another device, or other appropriate action. In some cases, the active cover plate may mechanically or electrically actuate the switch that it is mounted over.

In the example shown in FIG. 57, the active cover plate (5700) detects motion of a person (5715) and illuminates an overhead light (5720) that the switch (5705) it is mounted over controls. However, the active cover plate could control/influence various loads/lighting that is not directly associated with the electrical receptacle it is mounted over. As discussed above, the active cover plate (5700) may bypass the switch (5705) to allow electrical current to flow through to the light (5720). The electrical current may be controlled or uncontrolled by the active cover plate (5700). In one example, a small amount of electrical current is allowed to bypass the light switch (5705) through the active cover plate (5700). This small amount of current may partially or fully illuminate an overhead light or other load. In this example, the overhead light (5720) illuminates a stairway (5725). For example, the overhead light (5720) may dimly illuminate to preserve the night vision of the individual while still providing adequate lighting to navigate the area. In addition to illuminating the overhead light, the active cover plate may or may not illuminate additional lights. For example, the cover plate may illuminate one or more of: a light bar, the light switch, the floor/wall/area in proximity to the stairs or other lighting unit and/or the cover plate area. If the individual desires additional illumination, they can then see the light switch to turn on the overhead light (5720).

There may be various ways to select or control the amount of current passing through the active cover plate. This may be desirable for a variety of reasons, including but not limited to, the capability to illuminate a variety of lighting types and configurations. For example, a large amount of current may be necessary to illuminate an incandescent load while a lower amount of current may be adequate to illuminate a fluorescent or LED load. Similarly, it may take more current to illuminate multiple bulbs than a single bulb or other lighting source. Consequently, it may be desirable for the amount of current passing through the active cover plate to be selected or actively controlled. There are a variety of approaches that could be used, including providing a user configurable switch that allows the user to select settings that influence the amount of current that passes through the active cover plate and/or the amount of illumination desired in the area when a parameter is sensed. In one embodiment, an amount of desired illumination in the area is selected or is predetermined and the active cover plate allows a current to pass into the controlled circuit and senses changes in the lighting that result. If the desired amount of lighting in the area is not detected, then additional current is passed into the circuit until the desired level of lighting is achieved.

In addition to a user mechanically manipulating a switch, there are a variety of different ways that the function of the active cover plate could be influenced/determined. For example, the active cover plate may include predetermined parameters, the active cover plate may communicate with other devices and receive parameters from the other devices, the active cover plate may sense the surroundings and make an algorithmic determination of what parameters/levels are applicable, the active cover plate may include other inputs (such as time, location, etc.) that allow it to make an algorithmic determination of what parameters/set points should be used, or other appropriate technique. In some embodiments, the active cover plate may detect or receive a signal that shows that a specific parameter has changed and may make a decision about what action should be taken. For example, if an active cover plate receives a signal that shows that motion has been detected in a stairway, the active cover plate may evaluate a number of additional parameters, including that state of the switch that it is mounted over, the time of day, the amount of light that is present in the area, if there are any alarms sounding, etc. Depending on which parameters/states are detected, the active cover plate may take appropriate action such as increasing the amount of light in the stairway, locking or unlocking a door, sending an additional signal to another device, or other appropriate action.

In some embodiments, the user may also select a parameter to be sensed. In some cases the active cover plates may have multiple sensors and a user may determine which sensor(s), parameter(s), or combination of sensor(s)/parameter(s) are used to take an appropriate action. For example, if an active cover plate includes both a light sensor and a motion sensor, the user may determine that the active cover plate should only be controlled by the light sensor (e.g. the active cover plate illuminates when it is dark regardless of whether motion is sensed) or controlled by the motion sensor (e.g. the active cover plate illuminates when it detects motion regardless of whether the area is light or dark), or a combination of the two parameters (e.g. the active cover plate illuminates when it is dark in the area and motion is detected), or other appropriate combination of parameters/actions. For example, an active cover plate may include a transmitter that can send various signals to other devices. Additionally or alternatively, the active cover plate may make one or more of these selections/configuration settings by itself or they may be predetermined and stored in the active cover plate. The active cover plate may be configured by the user in a variety of ways, including manually flipping a switch, using another device to communicate with the active cover plate (e.g. wireless or optical communication with the active cover plate), manipulating a power source to the active cover plate (for example, a light switch may be toggled on/off in a specific sequence to program an active cover plate mounted over the light switch), using touch sensitive pads, or through a variety of other techniques.

Figure 58:
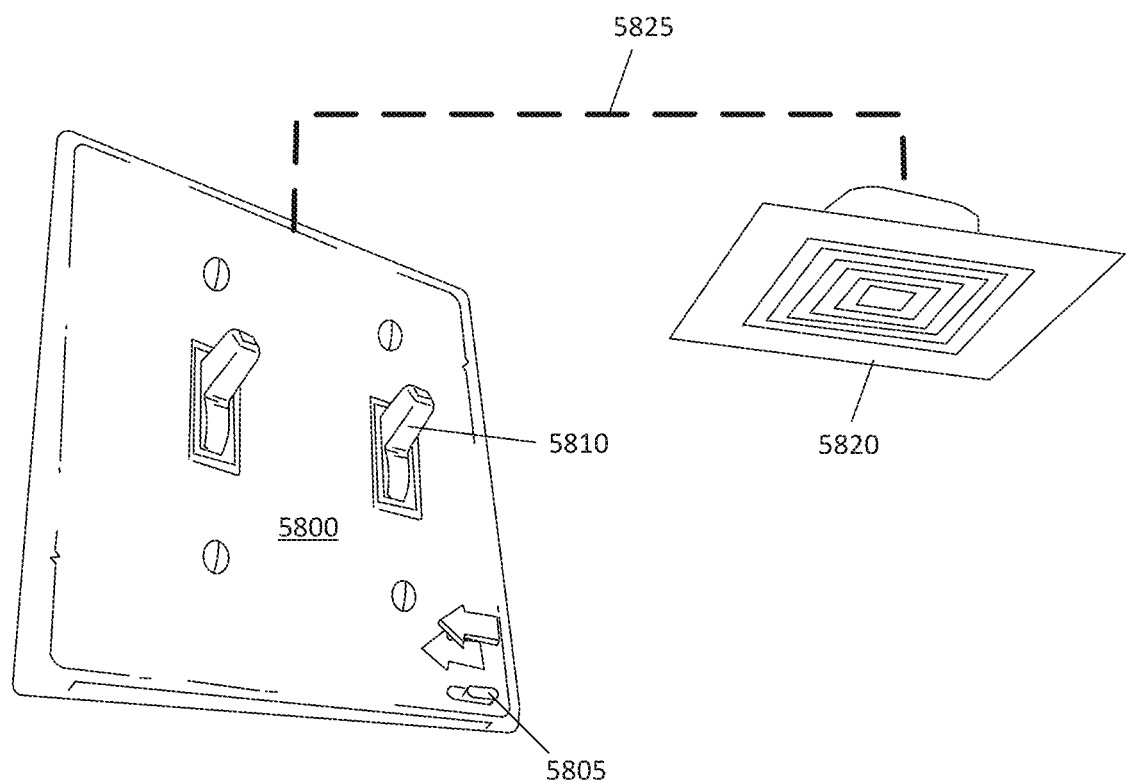
FIG. 58 shows an illustrative example of an active cover plate that controls a load, according to one example of principles described herein.

FIG. 58 shows an illustrative example of an active cover plate that controls a load. In this example, the load is a fan such as those found in bathrooms. In some situations, it may be desirable for a fan to remain running for a period of time after a bathroom is used. For example, after a person takes a shower it may be desirable for the fan to continue running for a period of time to remove water vapor from the room. However, if the fan is left on after the user exits the bathroom, the user may be required reenter the bathroom to turn the fan off after all the moisture has been removed. This may requires the user to remember to turn the fan off after a specific amount of time. The user may not wish to take this additional action, may forget to take this action, or may turn off the fan before all the moisture has been removed.

In this example, the active cover plate (5800) is a double gang plate that covers both the switch for the overhead light and the switch for the fan. The switch for the fan is connected to the switch by electrical conductors (5825). In this embodiment there is a switch (5805) on the face of the active cover plate (5800). As described above, this may provide the user with options to select one or more parameters or actions. For example, the user may move the switch (5805) to the right to activate a timer that automatically continues the fan (5820) operation for a predetermined period of time. The active cover plate (5800) may activate the fan (5820) in response to any of a number of parameters, including sensing the light in the room, activation of the fan or light switch, sensing increased humidity, sensing motion in the bathroom, or other appropriate parameter or situation. The active cover plate (5800) keeps the fan running for a period of time that may be present or conditional on one or more parameters or sensed variables. For example, the active cover plate may keep the fan running for 5 minutes after the last motion in the room was sensed or for 10 minutes after the light is turn off or other parameter.

Figure 59A:
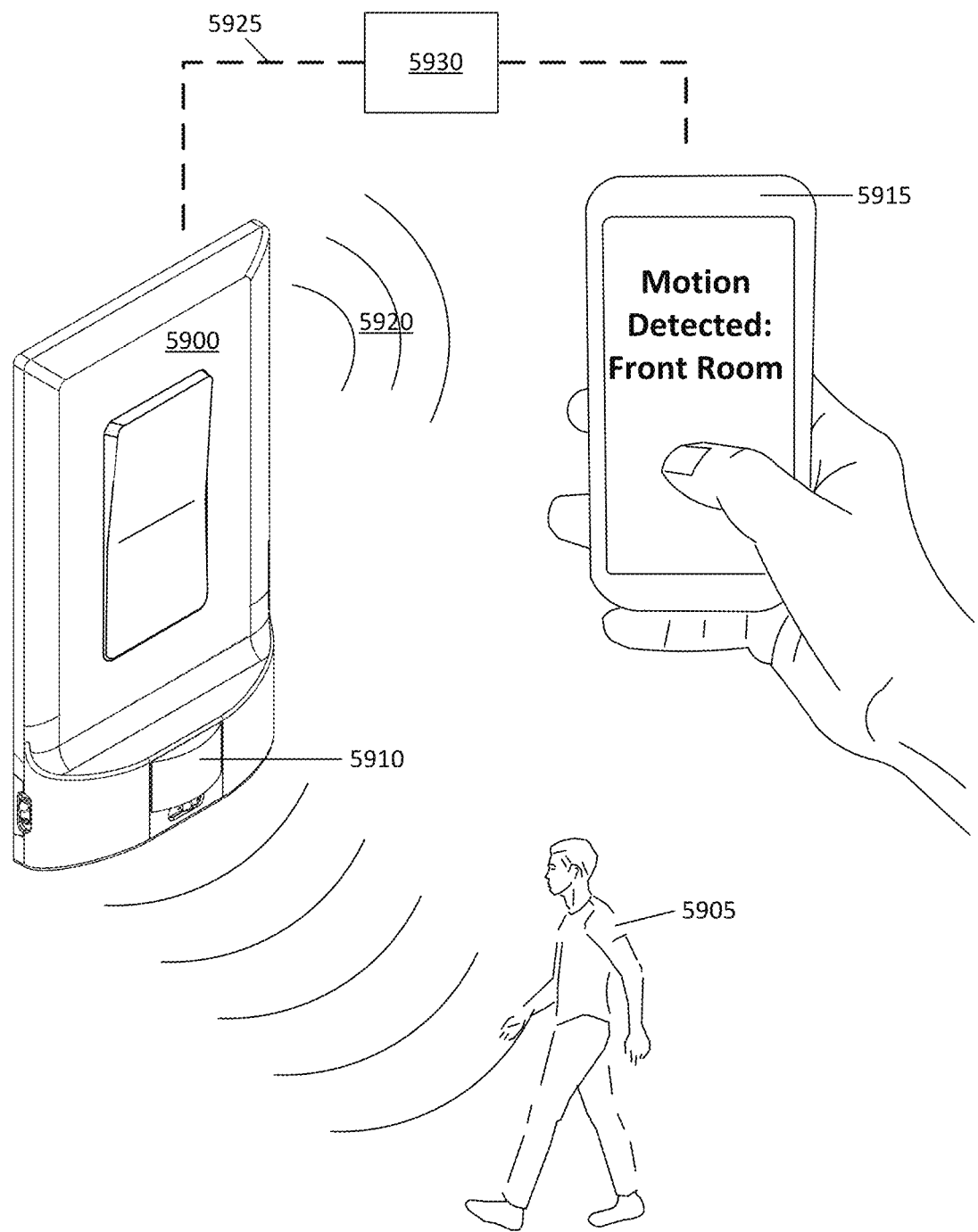
FIG. 59A shows an illustrative example of an active cover plate with wireless communication, according to one example of principles described herein.

As discussed above, active cover plates may communicate in a variety of ways with a variety of other devices/objects. In the example shown in FIG. 59, an active cover plate (5900) senses motion of a person (5905) and communicates that information with a mobile device (5915). This communication may take place in a variety of ways, including direct communication (5920) with the mobile device, communication through a network with a mobile device, and/or communication (5920) through a bridge device (5930) with the mobile or other device.

Thus, as described and taught herein an active switch cover plate may be configured to control power to the attached load. For example, an active switch cover plate may be configured to illuminate an overhead light. In one embodiment, an active switch cover plate may include an extraction element that may be configured to extract power from a switch that the active switch cover plate is configured to be installed over, thereby supplying electrical power to the active switch cover plate. The active switch cover plate may also include a motion sensor configured to detect motion in an area around the active switch cover plate and a load module configured to supply electrical energy to a load controlled by the switch in response to motion detected by the motion sensor. The extraction element may include prongs configured to contact screw terminals of the switch or other configurations. The active switch cover plate may also include a processor or other evaluation module that is configured to accept a signal output by the motion sensor indicating that motion has been detected and instructing the load module to activate. The active switch cover plate may also include a light sensor configured to detect ambient light in an area around the active cover plate and produce a light level signal. The active switch cover plate may also include a light module configured to illuminate the area around the active switch cover plate and a user input to control aspects of the active switch cover plate's operation. In some embodiments, a user input may include a manually manipulable switch on the active cover plate. This manually manipulatable switch may have a variety of functions, including but not limited to adjusting load module settings to supply more or less power to the load. The load module may electrically bypass the receptacle switch to supply electrical power to the load. The load may be an overhead light and sufficient power may be supplied by the load module to illuminate the overhead light. In one embodiment, the active switch cover plate may include a manually manipulable switch to control the amount of power supplied to the load by the load module. In one embodiment, the load module supplies sufficient power to dimly illuminate one or more overhead lights that are controlled by the receptacle switch. The active switch cover plate may or may not change the configuration of the receptacle light switch. Additionally or alternatively, the active switch cover plate may include an actuator configured to change the configuration of the receptacle light switch.

Figure 59B:
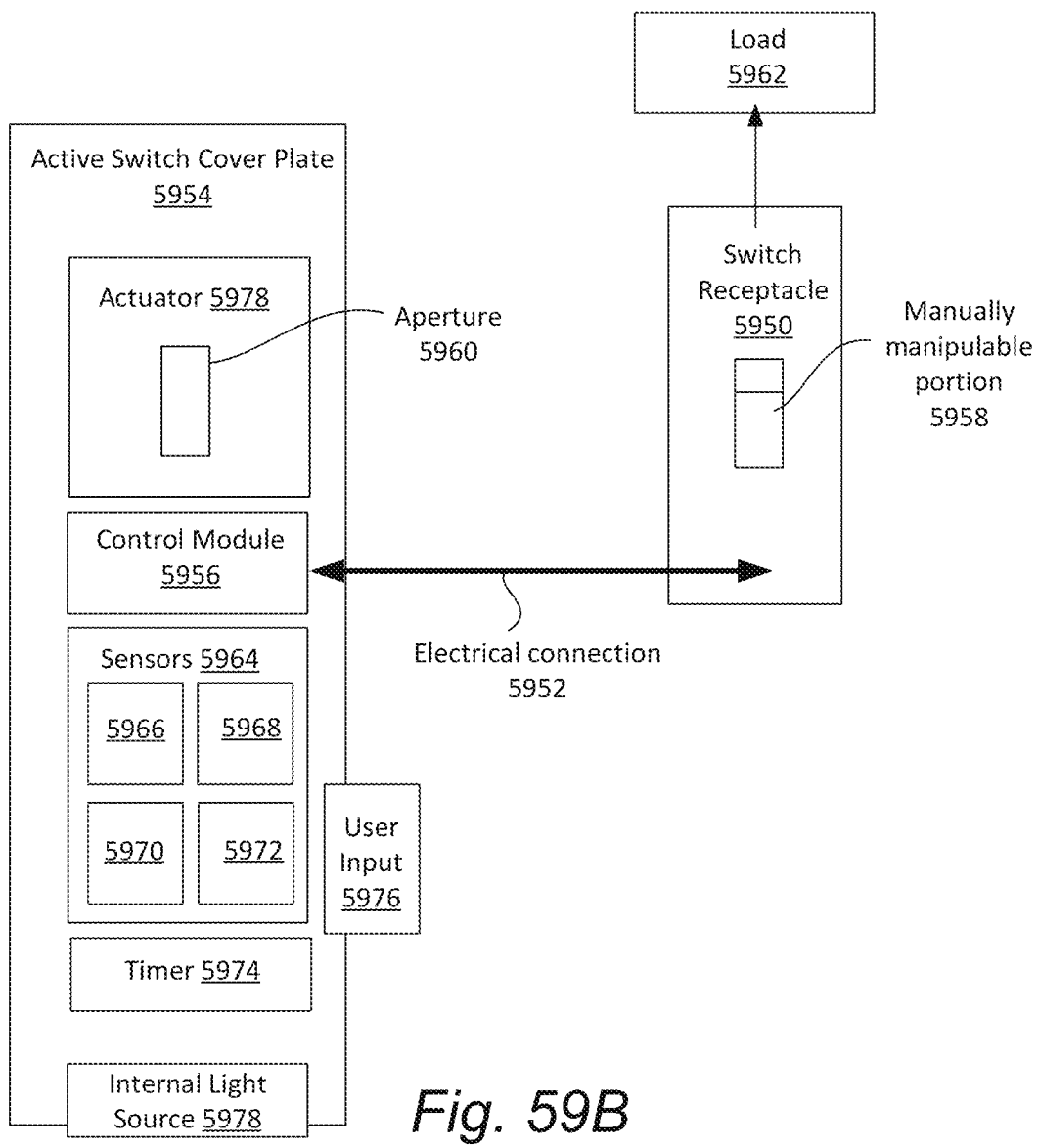
FIG. 59B shows an illustrative example of an active switch cover plate, according to one example of principles described herein.

FIG. 59B shows one example of an active switch cover plate (5954) may be configured to be installed over a switch receptacle (5920) and may include an electrical connection (5952) to the switch receptacle. This electrical connection may include prongs and/or connectorized connections. These connectorized connections may include cords extending from the switch/cover plate, connectors/contacts on one or more of the switch/cover plate or other types of connections. Additionally or alternatively, the electrical connection may include prongs configured to contact screw terminals of the switch receptacle or other configurations. In some embodiments, the electrical connection may be configured to extract power from the switch receptacle, thereby supplying electrical power to the active switch cover plate.

The active switch cover plate (5954) may also include a control module (5956) configured to control electrical energy passing through a load (5962) connected to the switch receptacle (5950). The active switch cover plate (5954) may be configured to leave the manually manipulable portion (5958) of the switch receptacle accessible for manual manipulation. For example, the active switch cover plate may be configured with an aperture (5960) that leaves a handle (5958) to the switch receptacle (5920) available for normal use by the user. In some examples, the active switch cover plate may include one or more sensors (5964), including a sensor (5966) that may be configured to monitor behavior of the load (5962) and/or electrical energy passing to the load and produce an output signal. The control module (5956) may be configured to change an amount of electrical energy passing through the load based on the output signal produced by the sensor. For example, if the load (5962) is a light, the sensor (5966) may be a light sensor and may detect brightening of the area as the electrical energy is supplied to the light and produce a corresponding output signal. The control module (5956) can use this output signal to control the brightness of the light to the desired level and to avoid undesirable effects such as flashing. In embodiments where the sensors (5964) include a motion detector (5968), it may trigger the control module to supply electrical energy to the light (or any other load) and the light sensor may detect illumination from the light and the control module may make adjustments to the electrical energy based on the output of the light sensor. If the load is a fan, the sensors (5964, 5970, 5972) include a temperature sensor, humidity sensor, microphone, or any other sensor that measures an environmental variable that is influenced by operation of the fan. In one embodiment, the active switch cover plate may include a motion sensor (5968) configured to detect motion in an area around the active switch cover plate and the control module may be configured to supply electrical energy to the load (5962) connected to the switch receptacle (5950) in response to motion detected by the motion sensor.

As shown in previous figures, wherein the electrical energy controlled by the control module (5956) may bypass the switch receptacle (5950) by passing through the electrical connection (5952). For example, the electrical energy can pass through the active switch cover plate (5954) rather than through the switch (5920) the cover plate is mounted over.

In some embodiments, the active switch cover plate (5954) may include a timer (5974) and the control module (5956) may be configured to control the electrical energy at least partly based on the timer. The active switch cover plate may include a user input (5976) to control aspects of the active switch cover plate's operation. The user input (5976) may take a variety of forms including a manually manipulable switch on the active cover plate, wherein the manually manipulatable switch on the active cover plate adjusts one or more of the operating parameters of the active switch cover plate. For example, the switch could adjust the amount of electrical power supplied to the load, the amount of time that power is supplied, any of a number of thresholds (such as motion threshold, light threshold, or other environmental variable), or other parameter. For example, the user input (5976) could be used to manually set a power level such that it is sufficient to illuminate lights connected to the switch receptacle to a desired illumination level. For example, the user may desire that the active switch cover plate may dimly illuminate one or more overhead lights that are controlled by the switch receptacle. In other embodiments, the user input (5976) may be through a different type of interface on the active cover plate or via wireless communication with an exterior device such as an app running on a mobile device.

In some examples, the active switch cover plate (5954) may include an actuator (5978) configured to change a position of the manually manipulable portion (5958) of the switch receptacle (5950), thereby changing the electrical configuration of the switch receptacle. In one embodiment, the active switch cover plate may be configured to change a position of the manually manipulable portion of the switch receptacle when motion is detected and the light sensor detects that the area is dark. The actuator (5978) may or may not leave the light switch in a particular configuration or available for manual manipulation in all positions. In some embodiments, the actuator/active switch cover plate leaves the manually manipulable portion (5958) of the switch receptacle (5950) open for use at any time by the user. In one example, the active switch cover plate/actuator accommodates user input to the manually manipulable portion even when the actuator has moved the position of the manually manipulable portion or is in the process of moving the manually manipulable portion.

In some examples, the active switch cover plate (5954) may include its own internal light source (5978). The internal light source may be controlled independently from other loads or may be controlled in conjunction with the loads. For example, when motion is detected, the internal light source (5978) may be illuminated independently or together with the load (5962) connected to the switch receptacle (5950). As discussed herein, the light from the internal light source (5978) may be projected outside of the active switch cover plate to illuminate the area surrounding it. The description above is only illustrative of principles described herein and may take a variety of different forms based on the situation and the desires of the user.

Figure 60A:
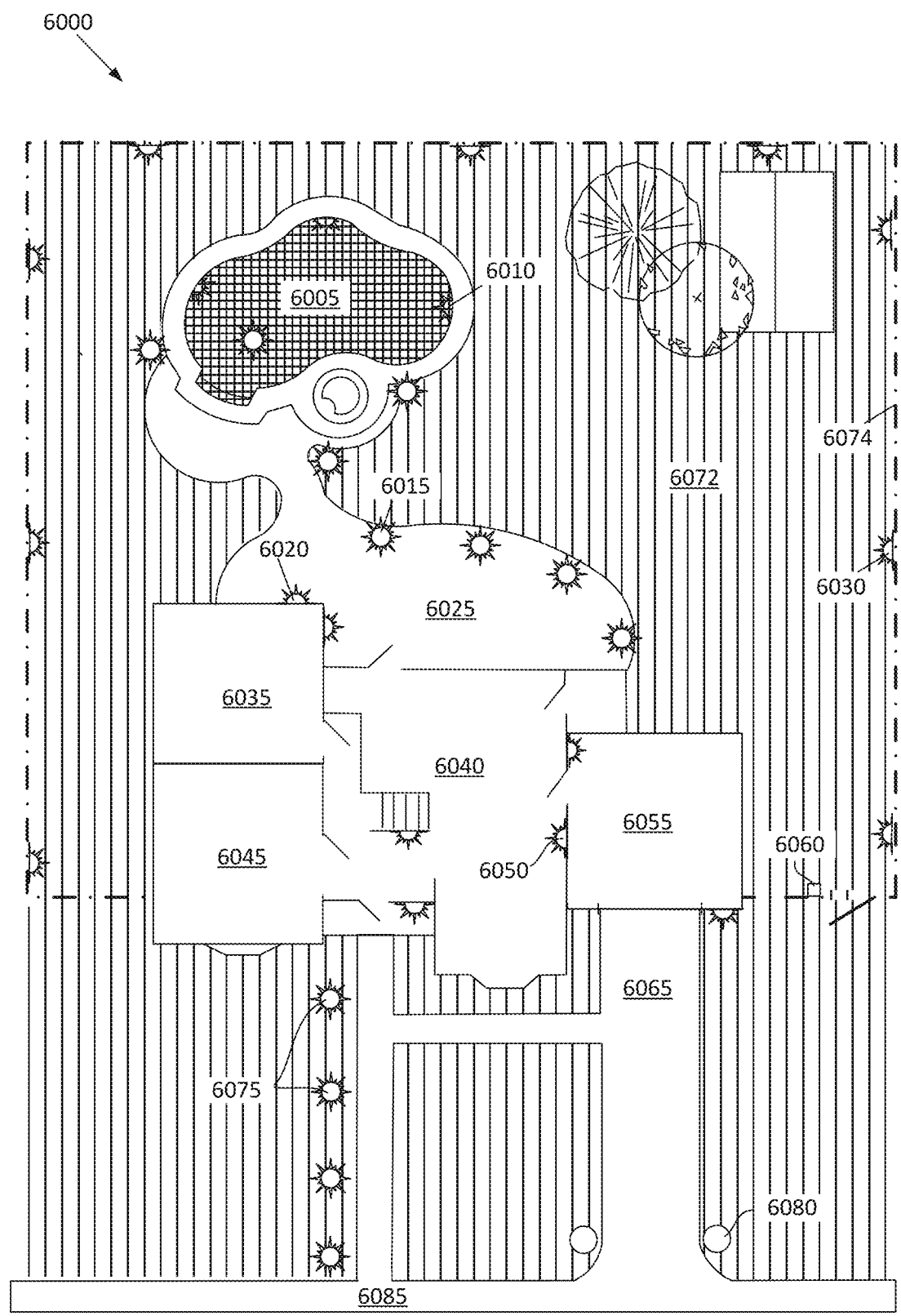
FIGS. 60A-60C shows illustrative features and methods of a connected lighting system, according to one example of principles described herein.

FIG. 60A shows a plan view of a house and yard (6000) that incorporate both outdoor and indoor connected lighting. In this example, the house and yard (6000) include a house with various rooms such as the garage (6055), a central area (6040), and bedrooms (6035, 6045). The yard may include sidewalks (6085), a driveway (6065), a patio (6025), a pool (6005), lawn (6072), a fence (6074) illustrated by dash dot lines, and other features such as trees and outbuildings. This is only one example. The principles described herein can apply to a wide variety of different living arrangements.

In this example, there are a variety of distributed units (6010, 6015, 6020, 6030, 6050, 6060, 6075, 6080) that may include a variety of sensors and active components. As discussed above the sensors may include a range of options, including light sensors, environmental sensors such as light, temperature, humidity, motion, vibration, microphones, cameras, gas sensors and other sensors. The active components may include a range of different devices including lights, mechanical actuators such as speakers, relays, latches, etc., electronic modules (receivers, transmitters, storage, logic, or other modules). There may be other modules such as power generating modules, power storage modules, power conditioning modules, etc. The distributed units may have a range of configurations and shapes, including configurations that can be altered by the user. For example, the distributed units may have mechanical switches that can be manipulated by a user, electronic configuration options, mechanical configuration options and other options that can be selected by a user to obtain the desired configuration for a particular use, location or situation. In this example, there are distributed units (6075) along a walkway, units (6080) at the driveway (6065), unit(s) (6060) at a gate, units (6030) along a fence (6074), units (6020) mounted to an exterior of the dwelling, units (6015) along the patio (6025), units (6010) around or in the pool (6005), as well as a variety of units (6050) inside the dwelling.

Figure 60B:
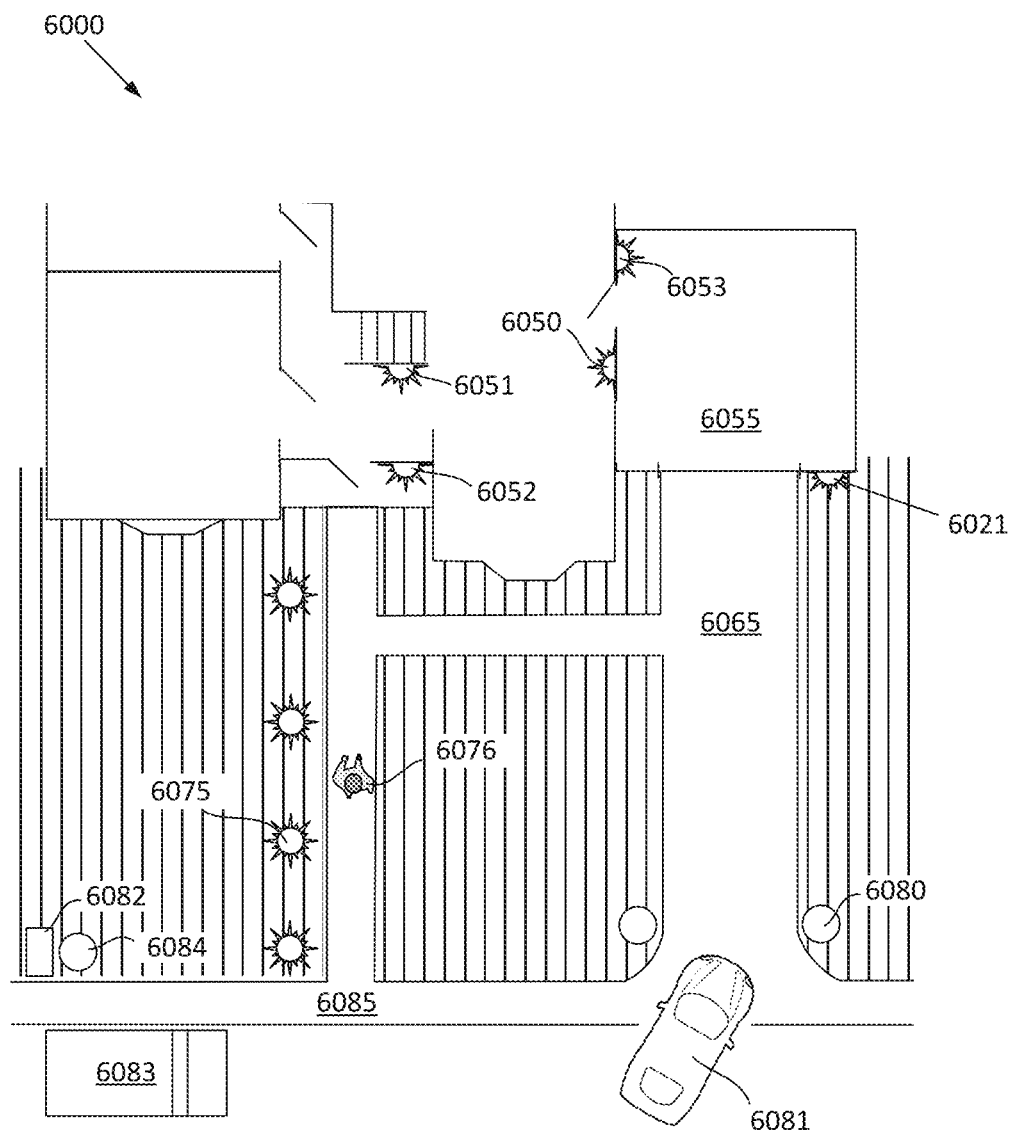

FIG. 60B shows the front portion of the house and yard (6000). For example, there may be distributed units (6075) that are located along a walkway. These units (6075) may have a variety of sensors and active components. In one embodiment, at least one of the units (6075) may include a proximity or motion detector and be connected to other units. For example, one or more of the units (6075) may detect a person (6076) walking up the path and transmit a signal to other units such as other units along the walkway, a unit (6052) on the porch, a unit in an entryway on the interior of the house (6051) or other units. If the area is dark, these additional units may provide additional lighting that may provide a number of benefits, including illuminating the path of the person (6076) in advance, providing notice to people in the house that someone is approaching (e.g. through taking some action such as illuminating, illuminating in a specific color or pattern, sounding a chime, etc.), or other benefit. As discussed above, the units may connect to a variety of other devices, including bridge devices, mobile devices, home security systems, environmental control units or other devices or entities. For example, if visitors are not desired/expected, the units could sound an alarm, lock doors, turn on sprinklers, activate cameras or take other action. In some examples, the person (6076) on the walkway may be a delivery person who sets a package on the porch. The unit (6052) on the porch may include a variety of functions that may facilitate the delivery/receipt of the package. For example, the unit (6052) may illuminate, indicating where the delivery person should place the package. The unit (6052) or another unit may include a sensor that detects changes in the environmental surroundings (for example using light, RF or ultrasound). This may allow the unit (6052) to detect when the package is placed on the porch and when it is picked up. The unit (6052) may send a signal to a unit or other device on the interior of the home to indicate a package has been delivered. The interior unit/device (for example, unit 6051) may indicate visually or audibly that someone has approached the house and/or left something at the house. This indication may be temporary or may continue until conditions change (e.g. the package is removed, the door is opened, the owner acknowledges the indication, etc.). This may assist the homeowner in timely receipt of the packages and reduce the chance of theft.

In the lower left of FIG. 60B there is a mailbox (6082) and illustrated next to the mailbox is a unit (6084). This unit (6084) may have any or all of the features and functions discussed herein. In this example, the unit (6084) is configured as a sensor. This unit (6084) and other units shown may or may not be drawn to scale. For example, the unit (6084) is drawn larger than scale for purposes of illustration. This unit and other units described herein may have a variety of physical and functional configurations and locations. For example, the unit (6084) may be placed on the mailbox, in the mailbox, attached to the post of the mailbox, or may be placed elsewhere, such as on a post in the lawn, in shrubbery or other landscaping feature. The unit may have a variety of sensors, including motion sensors, proximity sensors, presence sensors, etc. For example, if the unit is located outside the mailbox, it may detect the presence of a mail delivery person, vehicles parked/moving near the mailbox or yard, or other objects. The unit may have a variety of different sensors or configurations. In one embodiment, the unit is placed on the mailbox and may detect the vibration/motion/light change of the mailbox being opened and objects being placed/removed from the mailbox. In other embodiments, the unit may be placed inside the mailbox and may detect motion, pressure, change in objects surrounding it, light from opening of the mailbox, vibration, sound, etc. This unit could then communicate in a variety of ways that the environment has changed, or an event has occurred. This communication may be to any unit or device. For example, this exterior unit (6084) may communicate with an interior unit (6051) that is over a console table in the entryway where mail is typically placed or sorted upon entering the home. The interior unit (6051) may chime, illuminate, communicate with other devices or take other action to indicate that mail has arrived. In one embodiment, the interior unit may illuminate until it detects a change that indicates that the mail has been retrieved (e.g. additional motion on a walkway, followed by motion/removal of the mail at the mail box, and/or a change in objects that are on the credenza, etc.). This is only one example of interaction between interior and exterior units.

Another example may include units (6080) that are located in proximity to a driveway (6065). These units (6080) may include any active element or function. In one embodiment, the units (6080) may consistently illuminate when the area is dark regardless of motion that is detected or may brighten when motion is detected to mark the location of the driveway. The units may have characteristics that allow them to be distinguished from other lights and objects so that the user can be confident they are driving into the right location. For example, the units may have a unique illumination pattern or color or may be brighter than other illumination in the area. The units may only illuminate at specific times (e.g. in the evenings before midnight, or when they receive a signal that a vehicle is approaching). For example, there may be additional units (e.g. 6084) that may detect motion/approach/presence of a vehicle (6081) before the vehicle arrives. The units (6080) flanking the driveway may illuminate or brighten prior the arrival of the vehicle at the driveway when they receive the signal from the other disparate unit(s).

Units (e.g. 6021) mounted to the exterior of the house and/or in the yard/surrounding area may have a variety of interactions with interior units (e.g. 6051, 6052, 6050, 6053). For example, if an exterior unit detects motion without motion in the interior of the house (e.g. late at night, without a door opening), the exterior unit may take different action than when it appears that the owner has exited the house into the yard. For example, if no exit by the user is detected and an exterior unit (6021) detects motion, it may sound an alarm and/or illuminate one or more interior units, or illuminate more brightly, or illuminate differently than it would otherwise. For example, if the user has exterior night vision cameras, the unit may provide additional infrared illumination so that the camera has better lighting and view of the surroundings. For example, the illumination may make additional objects visible including the parked vehicle (6083) and sidewalk (6085) and exterior of garage (6055).

Figure 60C:
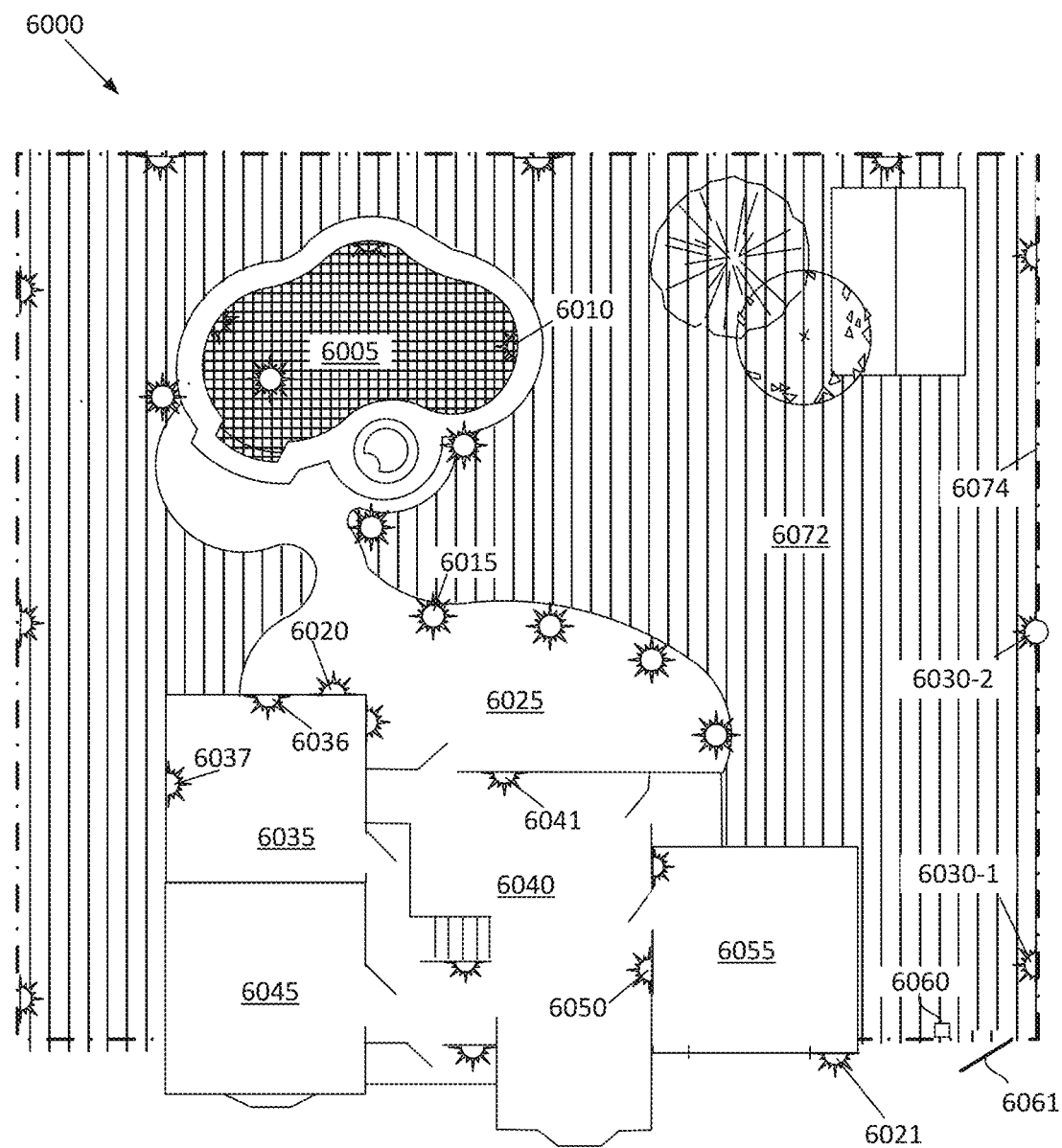

FIG. 60C shows the backyard portion and interior of the house (6000). In this example, there is a gate (6061) in the side yard that provides access to the rear of the house. There may be a number of units (6021, 6060, 6030-1) that are located in proximity to the gate (6061). For example, there may be a unit (6021) located on the exterior of the home, there may be a unit (6060) that is located near the gate (6061) and there may be a unit (6030-1) that is located on the interior of the yard. The combination of these units can provide insight into the use of the gate and communicate with other units to take appropriate action. For example, if the exterior unit (6021) detects motion/presence prior to the gate unit (6060) detecting the gate motion, it can be inferred that the person/animal/object is entering the backyard from the front of the house. If one or more of the units on the fence (6030-2, 6030-1) detect motion/presence before the gate unit (6060) triggers, it can be inferred that the animal/person/object is exiting the backyard to the front of the house. This information may be useful in a variety of situations. For example, the units could respond to motion at the gate and this response could be different depending on the direction of travel through the gate. For example, if motion through the gate from the outside is detected by the units (e.g. 6021, 6060) then units could be activated in the backyard/house. If the entry is determined to be benign, then lighting/units around the fence and patio could be activated/brighten/change. In some examples units within the house could activate to alert the homeowner of the entry/exit. For example, a chime could sound, a warning could be annunciated, a unit could illuminate/change illumination, a message could be sent to a mobile device, a camera could begin recording, doors could lock/unlock, or other appropriate action could be taken. For example, if neighborhood children enter the backyard, a gate to the pool area could be locked when they enter the backyard, the lights (6010) in the pool could be turned on, and units in the interior could be activated. If they approach the pool or house, additional units (e.g. 6030, 6015, 6020) track their location/motion. If intruders are anticipated, the units in the backyard could flash and/or sound an alarm to draw attention to the entry. The security of the doors could be checked. The above descriptions are only examples of principles that described possible unit functions and interactions. The principles are not limited to the specific examples given.

In some examples, the distribution of units/sensors could be used to more concretely provide location information for animals, people and objects. For example, if it is desirable for the location of a dog to be tracked in the yard/house, the distribution of sensors throughout the area could provide an instantaneous or time sequence of the dog's location. In some embodiments, the sensors on the units may have limited range, sensitivity, and/or field of view. By simply communicating which sensors detect motion, the approximate location of the dog can be ascertained. For example, if the dog is resting on the patio, an exterior sensor (6020) may detect the dog's motion/presence. If the dog gets up and goes to the fence (e.g. near fence unit 6030-2) and further motion in the yard is not detected, it can be inferred that the dog exited the yard within the sensing area of the fence unit (6030-2). The owner can then be notified that the dog has left the yard and check the appropriate location to see if the dog dug under the fence, if the fence needs repair or if the dog jumped the fence at that location. Further, the owner can then take appropriate action to retrieve the dog from the neighboring property. Similarly, if the dog exited the back yard through the gate, the units can detect the exit and appropriate action can be taken (e.g. retrieve the dog, secure the gate, etc.).

In one example, the first active unit and second active unit may be active cover plates that are configured to be installed over electrical receptacles, and wherein the sensor module in the first active unit comprises a light sensor and a motion sensor and wherein the action module in the first active unit comprises an illumination source, and wherein the second active unit comprises a sensor module comprising a light sensor and a motion sensor, and the action module in the second active unit comprises an illumination source. In some embodiments, the first active unit checks the ambient light sensor before illuminating, and if the surroundings are bright then the first active unit doesn't turn on the illumination source, but still signals the second active unit.

In some embodiments, the communication module of the first active unit may broadcast a signal to the second active unit. In general, this broadcast signal may be received/acted on by an unlimited number/all of active units that are within range. As discussed above in some embodiments, the active units may be divided into groups and only the group that the first active unit belongs to will take action. The signal from the first active unit may be made under a variety of circumstances, including when the first active unit is configured not to take action, is in a lighted area, or other circumstances. In some embodiments, the broadcast takes place without arbitration or anti-collision measures and may use synchronous timing for the broadcast, but the active unit(s) may or may not take other asynchronous actions.

In some embodiments, the active units may be active cover plates that are configured to be installed over electrical receptacles. These active cover plates may include a faceplate and prongs that extend off the back of the faceplates. The active units may also include outdoor active units, which may be powered in a variety of ways, including batteries and/or solar power. In some examples, solar cells may charge a battery or capacitor to provide power when the area is dark. These active cover plates installed over the electrical receptacles may be indoors or may be installed on outdoor outlets. There may be wireless communications between the active cover plates and the other active units that are not installed over outlets. As used herein, the term "active unit" refers broadly to active cover plates and to other units that contain circuitry and sense environmental parameters and/or take action based on environmental parameters. The active units may or may not have communication capabilities.

Figure 61A:
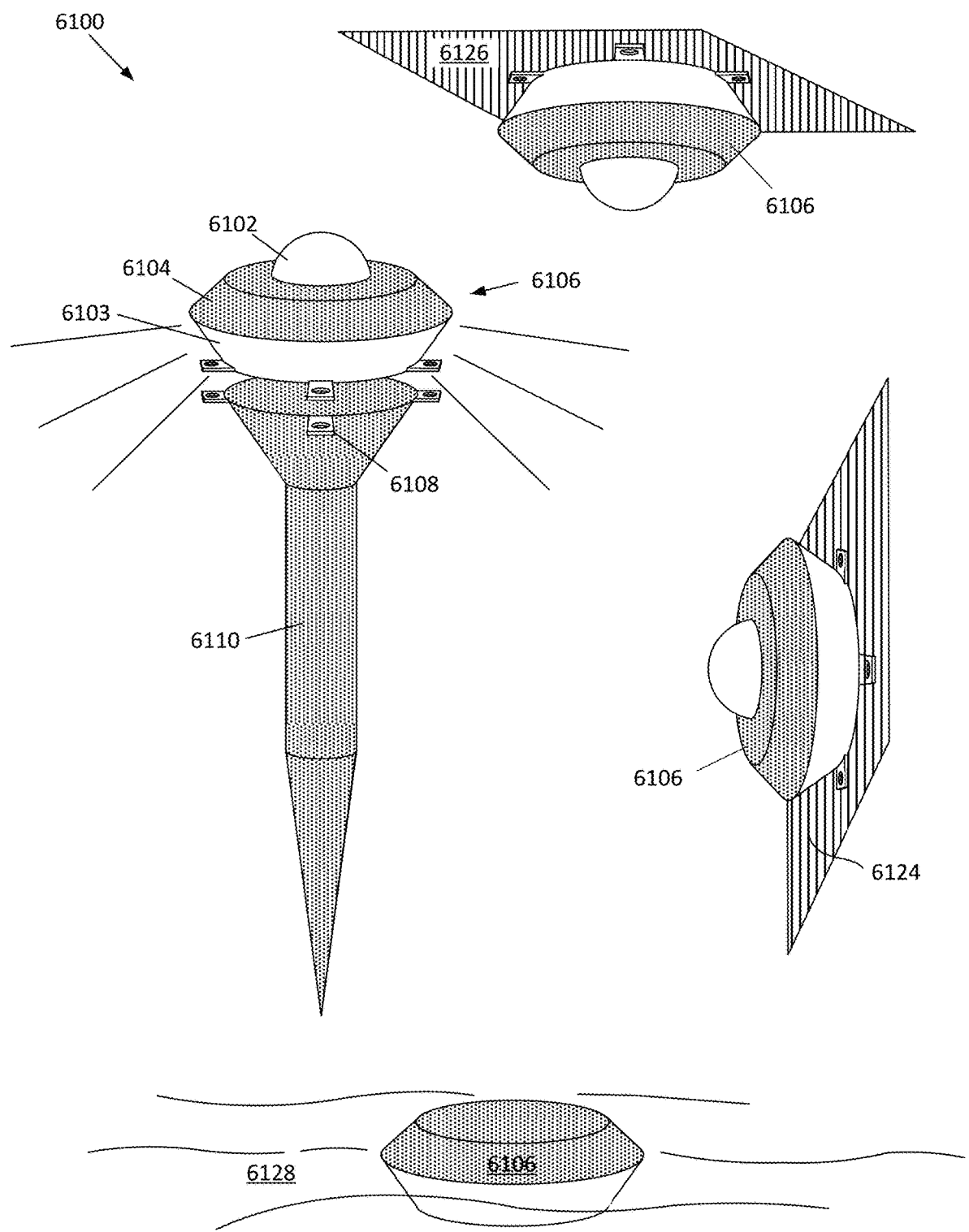
FIGS. 61A and 61B shows an illustrative example of a range of components that could be used in a connected lighting system, according to one example of principles described herein.

FIG. 61A shows one embodiment of a modular unit (6100) that could be used in a variety of ways. In this example, the modular unit may include an active unit (6106) and a spike (6110). The active unit (6106) may include motion/light sensor (6102), a body (6104) with solar panels, and an illuminating portion (6103). The active unit (6106) and spike (6110) may include a connection mechanism. In this case, the connection mechanism is shown as tabs with apertures that can be joined together. However, a variety of different mechanisms could be used, including twist, snap, magnets, slots, etc. to join the active unit (6106) to the spike (6110) or other surface/object. For example, the active unit (6106) may be attached to a ceiling (6126), a fence/wall (6124), or other surface. In some embodiments, an active unit (6106) may be placed on the ground or in water (6128). The active units may have a variety of configurations, including configurations that only include sensors, configurations that do not include sensors (such as the active unit shown in the water), or other configurations. As discussed above with respect to active cover plates and other units, these active units (6106) may connect/interact with a wide variety of other devices in a variety of ways, including those described above. For example, the active units may connect to or have very bright lights that may dazzle an intruder and highly illuminate them while preventing them from seeing anything behind the light.

Figure 61B:
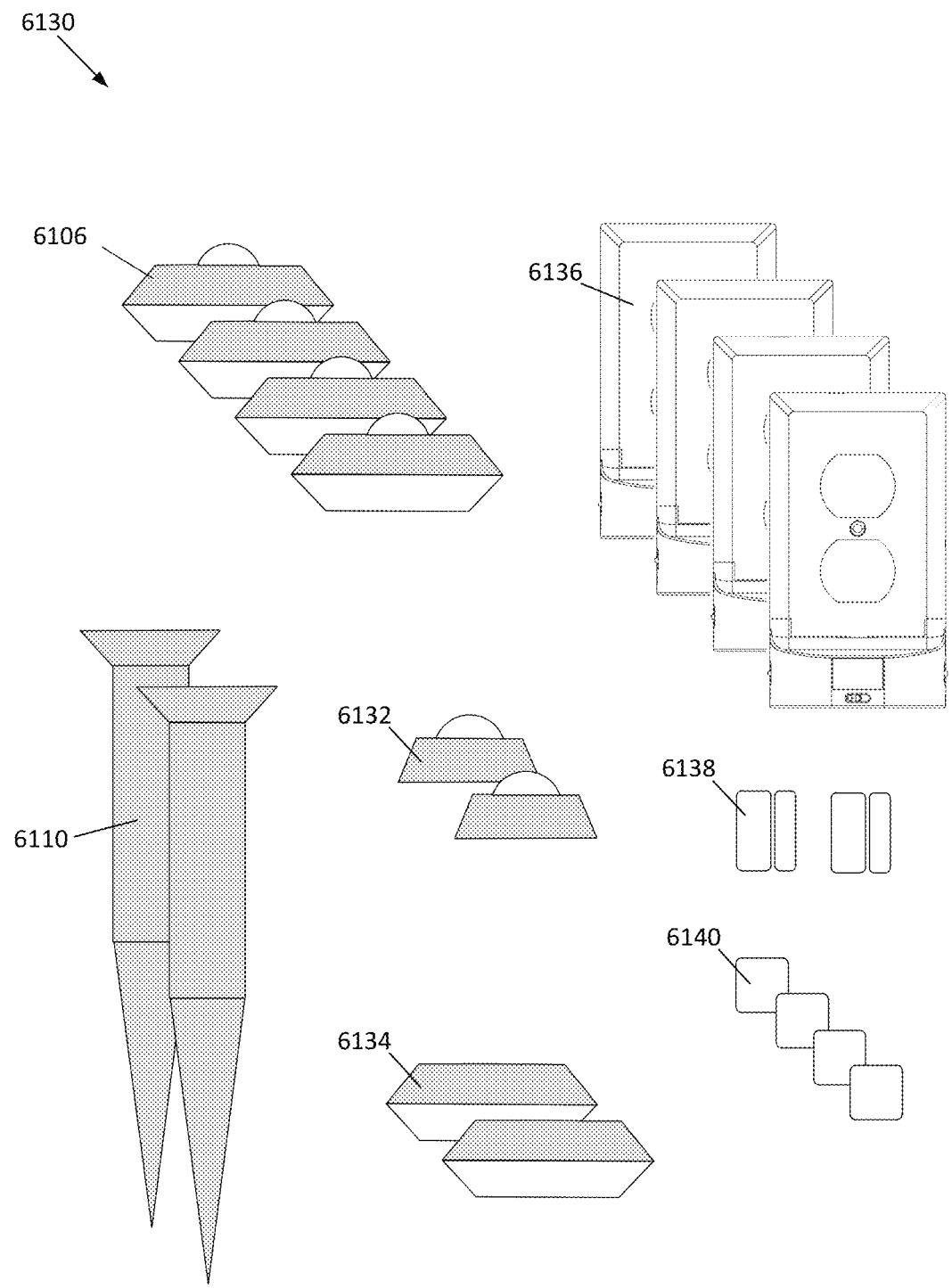

FIG. 61B shows an illustrative example of a kit (6130) that include multiple units that can be joined into a single group/zone. In this example, the kit includes several spikes (6110) that can be pushed into the ground/lawn, several active units (6106) that include lighting and motion sensors, two active units that only include sensors without lighting (6132), two units (6134) that don't include sensors but have lighting, a number of active cover plates (6136), and a variety of other sensors/units (6138, 6140). These other sensors/units may include magnetic sensors (6138) that could sense opening of doors/windows/gates, etc. Other sensors (6140) could include accelerometers, magnetometers, etc.

Figure 61C:
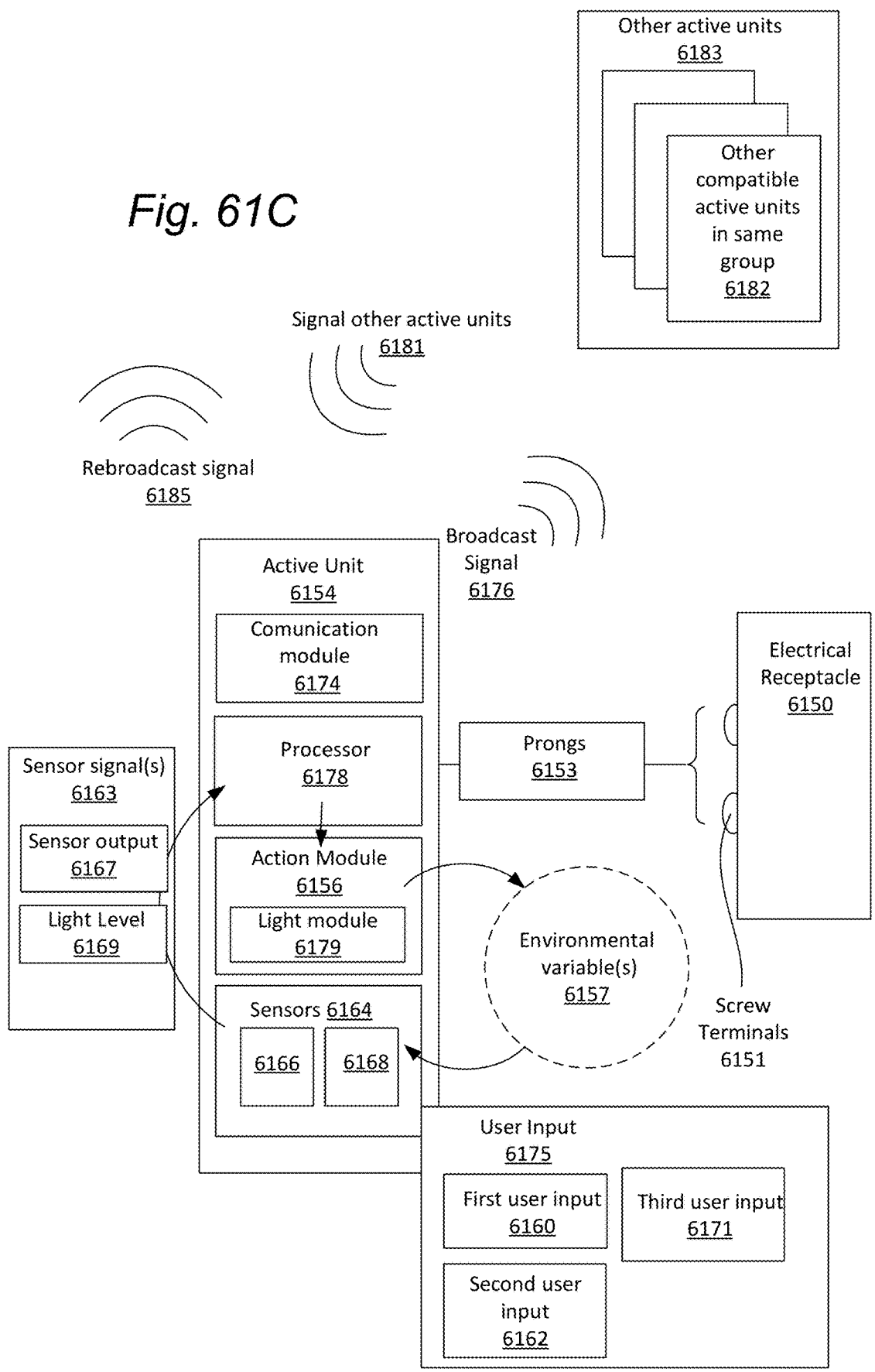
FIG. 61C shows one example of an active unit, according to one example of principles described herein.

FIG. 61C shows an illustrative active unit (6154) and its interaction with other units. In one embodiment, an active unit (6154) may include at least one sensor (6164) to detect a change in an environmental variable and generate a sensor signal (6163) and an action module (6156) configured to influence the environmental variable (6157). The active unit (6154) may include a communication module (6174) and a processor module (6178) configured to accept the sensor signal (6163). The processor (6178 and determine if the environmental variable (6157) exceeds a threshold and to instruct the action module (6156) not to take action to influence the environmental variable, and instruct the communication module (6174) to transmit a signal to other active units (6183) that the environmental variable has exceeded the threshold. In one example, the at least one sensor (6164) includes a motion sensor (6166) and the active unit (6154) may further be configured by user input (6175) to instruct the processor (6178) to broadcast a signal (6176) indicating that motion has been detected. The active unit (6154) may or may not include prongs (6153) that are configured to contact screw terminals (6151) of an electrical receptacle (6150), thereby supplying electrical power to the active unit (6154). For example, indoor active units may plug into an outlet, be an active cover plate, be battery operated or use alternative power sources. Outdoor active units may be solar powered, wirelessly powered, and/or operate on battery power.

In one example, sensor(s) (6164) may include a motion sensor (6166) configured to detect motion in at least a portion of the area around the active unit (6154) and produce a sensor output signal (6167) indicating that motion has been detected. The sensor(s) may also include a light sensor (6168) configured to detect ambient light in an area around the active unit and produce a light level signal (6169). The action module (6156) may include a light module (6179). The processor (6178) may be configured not to illuminate the light module (6179) when the area is dark and motion is detected. Consequently, in this example, the environmental variables in question are first, motion in the area surrounding the active unit and second, the amount of light in the area around the active unit. The active unit (6154) is fully capable of sensing the environmental variables and influencing at least one (by illuminating the light module to brighten the area) but, in this case is configured such that the light module intentionally remains unilluminated. However, the active unit may still send out/broadcast a signal (6176) to other active units. In one example, the processor (6178) is configured to instruct the communication module (6174) to broadcast a signal (6176) indicating that motion has been detected in the area around the active unit even though the processor has instructed the light module (6179) not to illuminate. In some embodiments, the processor (6178) may be configured to accept a sensor output signal (6167) indicating that motion has been detected, accept a light level signal (6169) indicating that the area around the active unit is dark, instruct a light module (6179) in the action module (6156) not to illuminate the area around the active unit, and instruct the communication module (6174) to broadcast a signal (6176) indicating that motion has been detected in an area around the active unit. The active unit (6154) may further include a first user input (6160) configured to instruct the processor (6178) not to illuminate the light module (6179) when the area is dark and motion is detected and a second user input (6162) configured to instruct the processor (6178) to broadcast a signal (6176) indicating that motion has been detected. This is only one example. In other configurations, the second user input may provide the instruction not to broadcast the signal and/or the first user input (6160) may instruct the light module (6179) to dimly illuminate or brightly illuminate. In some examples, the first user input includes a first manually manipulatable switch with a setting configured to instruct the processor not to illuminate the light module when the area is dark and motion is detected; and the second user input (6162) comprises a second manually manipulatable switch with a setting configured to instruct the processor to broadcast a signal indicating that motion has been detected while the light module is not illuminated. However, there are a number of different ways that the first user input (6160) and second user input (6162) could be sensed/input. For example, a touch screen or touch sensitive surface could be used. Additionally or alternatively, the input could be collected on a different device and transmitted to the active cover plate (6154). The communication module (6174) may be configured to broadcast a signal indicating that motion has been detected to all other active units (6183) within range. This broadcast signal (6176) may take a variety of forms include an optical signal and/or a radio frequency signal.

In some embodiments, the active unit may include a selectable group setting configured to designate groups of active units that communicate with each other. This may take the form of a third user input (6171) which may have a variety of different ways of being collected/stored/communicated. For example, the third user input (6171) may take the form of a multi-position mechanical switch where each position corresponds to a different group. The active unit may be configured to receive a signal from another active unit indicating that a change in the environmental variable has been detected. The processor (6178) may be configured to determine if the signal from another active unit (6181) is from an active unit in the same group (6182). If the signal is from another active unit in the same group the processor may accept the signal and determine to take no action based on a user selectable setting (e.g. user inputs 6175). This may occur even if all other indications indicate that the action module (6156) should be activated to influence the environmental variable(s) (6157) toward an otherwise desired state. This inaction also applied even though other active units are taking action to influence the environmental variable. In some examples, the active unit may be configured such that the processor, even if it does not illuminate the light module (6179) may rebroadcast (6185) the signal that was received or other indication that other active units have sent a signal.

Figure 62:
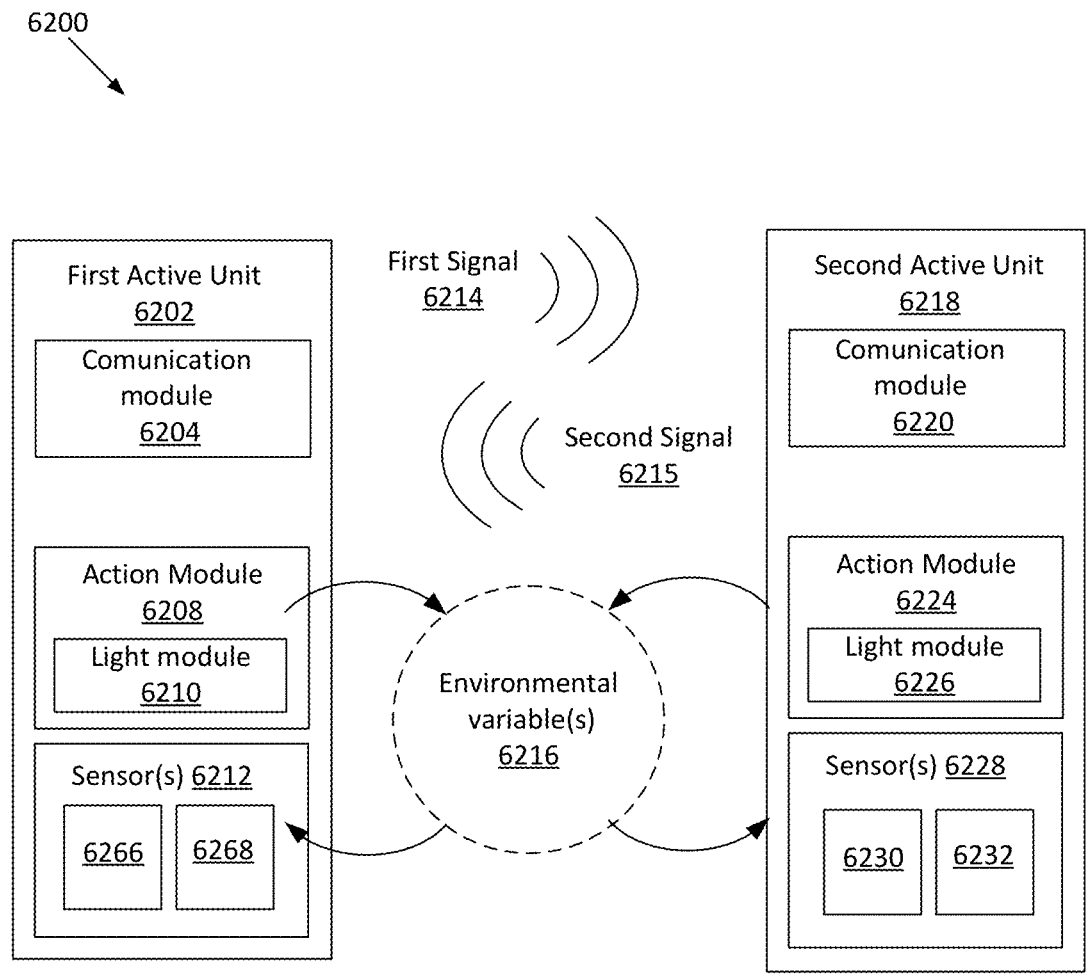
FIG. 62 shows one example of a first active unit and a second active unit, according to one example of principles described herein.

FIG. 62 shows an illustrative example of a lighting system (6200) that includes a first active unit (6202) that may include at least one sensor (6212), an action module (6208), and a communication module (6204). The system may also include at least one second active unit (6218). The sensor(s) (6212) may is configured to sense at least one environmental variable (6216), wherein the first active unit (6202) is configured such that when the environmental variable (6216) exceeds a threshold performing a designated action is indicated, wherein the first active unit (6202) transmits a signal (6214) indicating that the environmental variable (6216) has exceeded a threshold, and wherein the action module (6208) of the first active unit (6202) does not take the designated action. The designated action may be an action that influences/changes the environmental variable, such as illuminating an area when the area is dark, turning on a fan when the humidity is high, or opening/closing a vent in response to a temperature measurement. In other examples, the designated action may not be directly related to the environmental variable (for example, when motion is detected, turning on a light, sounding a chime, or locking/unlocking a door). The detected motion in the area is the environmental variable but it not directly influenced by turning on a light, sounding a chime, or other action. For example, just because a chime sounds doesn't mean that the motion will necessarily increase or decrease, particularly if the chime is sounding in a location that is distant to the location the action is taking place. Similarly, if a light is illuminated in a location that is distant from the location that the darkness/motion is sensed, it may not be directly related to the sensed environmental variable because the action does not substantially change the sensed environmental variable. Thus, the first action unit (6202) may sense an environmental variable (6216), signal (6214) the second active unit (6218) and the second active unit may take an action that is based on the signal. The action taken may or may not be directly related or directly influence the environmental variable (6216). Although the same environmental variable(s) (6216) is shown in the graphic, the first active unit and second active unit may sense the same or different environmental variables. For example, the first active unit may sense light and motion and the second active unit may sense position/state of an object (e.g. is a door/gate open or closed). The communication between the active units may contain a variety of information, including but not limited to, the active unit that is transmitting, the group of the active unit, the environmental variable that was sensed, etc. Additionally or alternatively, the signals may indicate that a threshold has been reached without further information. The active unit may take predetermined action based on the information received and/or information from their own sensors. In some situation, the actions may not be predetermined, but may be calculated based on an algorithm or determined by an artificial intelligence.

The second active unit (6218) may include an action module (6218) and a communication module (6220) but may not necessarily be identical to the first active unit (6202). In some situations, the second active unit (6218) may contain a sensor (6228) and a communication module (6220) but may not have an action module (see e.g. 6132, 6138, 6140 FIG. 61B) In some examples, the second active unit (6218) may be substantially identical in functions as the first active unit (6202) but may have different programming/settings. For example, the second active unit (6218) may include at least one sensor (6228), an action module (6224), and a communication module (6220). Additionally or alternatively, the second active unit (6218) may have substantially different mechanical structure (see e.g. 6106, 6136 FIG. 61B) than the first active unit (6202).

As discussed above, the first active unit (6202) may be configured by the user to take no action when an environmental variable (6216) that is sensed by the sensor (6212) in the first active unit indicates that the threshold has been exceeded. In some situations, while the first active unit (6202) may take no action with the action module (6208) to directly influence the environmental variable (6216), it may take indirect action by sending a signal/broadcast (6214) to other active units (e.g. 6218) or other devices. Additionally or alternatively, the action module (6208) of the first active unit (6202) may be configured to take no action when a signal (6215) is received by its communication module (6204), wherein the signal (6215) indicates that a sensor (6228) in the second active unit (6218) has sensed an environmental variable (6216) that has exceeded a threshold.

In some examples, at least one of the first active unit (6202) and second active unit (6218) in the lighting system may be an active cover plate (see e.g. the lighting system 6130, FIG. 61B). For example, one of the first active unit (6202) and second active unit (6218) may be installed over an electrical receptacle and one of the first active unit (6202) and second active unit (6218) may be an outdoor active unit. For example, the first active unit (6202) may be an outdoor unit and the second active unit (6218) may be an indoor active cover plate (see e.g. 6136) installed over an electrical receptacle. The first active unit (6202) may sense motion and the second active cover plate (6218) illuminates indoors. In other embodiments, the first active unit (6202) and second active unit (6218) may be active cover plates that are configured to be installed over electrical receptacles and the sensor (6212) module in the first active unit includes a light sensor (6266) and a motion sensor (6268) and the action module (6208) in the first active unit includes an illumination source (e.g. light module 6210). The second active unit (6218) may include a sensor module (6228) comprising a light sensor (6230) and a motion sensor (6232) and an action module (6224) in the second active unit includes an illumination source (6226). The first active unit (6202) may check the ambient light sensor (6266) before illuminating and if the surroundings are bright then the first active unit doesn't turn on the illumination source (6210), but still signals/broadcasts (e.g. 6214) to the second active unit (6218). The broadcast signal (6214) is received and processed by all active units that are within range of the broadcast signal (see e.g. FIG. 61C). The lighting system (6200) may include a plurality of active units (e.g. 6154, 6183, FIG. 61C; 6202, 6218), wherein the active units are divided into groups (see e.g. 6154, 6182, FIG. 61C) and only the group that the first active unit belongs to will take action based on a signal from the first active unit. In this example, the first active unit (6202) is in the same group as the second active unit (6218). The signal from the first active unit (6202) may be broadcast even when the first active unit is configured not to take action and when the first active unit is in a lighted area. The signals from the active units (6202, 6218) may be broadcast in a variety of ways, including without arbitration or anti-collision measures using synchronous timing for the broadcast. Additionally, the active units (e.g. 6202, 6218) may take synchronous or asynchronous action. For example, an active unit may take action as soon as it determines an environmental variable has changed, either by its own observation or by receiving information from other units or it may wait until other units are ready and they all take action together.

In some embodiments, the active units (e.g. 6202, 6218; FIG. 62) may include active cover plates (e.g. 6136; 5050, FIG. 50A-50T) that are configured to be installed over electrical receptacles. These active cover plates may include a faceplate and prongs that extend off the back of the faceplates. The active units may also include outdoor active units (6100, FIG. 61A) powered by solar cells. At least a portion of the active cover plate units and outdoor units may be grouped together in a group and may be connected using wireless communication. The active units in the group, both the indoor and outdoor units may illuminate in response to the one unit in the group detecting motion. All the units may illuminate or only a portion of the units.

Thus in one example, a system may include a first active unit comprising: at least one sensor (e.g. motion, light, temperature, humidity, microphone, gas sensor, or other sensor that detects an environmental variable or changing an environmental variable); an action module (e.g. one or more lights, a speaker, an actuator, load, fan, or a module that is configured to act on an external lights, loads, etc.), and a communication module. The system may include at least one second active unit. The sensor module of the first active unit is configured to sense at least one environmental variable that exceeds a threshold that indicates an action should be taken, and transmits a signal indicating that the environmental variable has exceeded a threshold, and wherein the action module of the first active unit does not take the action; and wherein the second active unit receives the signal and takes action based on the signal. The second active unit may include an action module and a communication module and may be substantially identical to the first active unit. For example, the second active unit may include at least one sensor, an action module, and a communication module. The first active unit may be configured by the user to take no action when an environmental variable that is sensed by the sensor in the first active unit indicates that the threshold has been exceeded. The action module of the first active unit may be configured to take no action when a signal is received by its communication module, wherein the signal indicates that a sensor in the second active unit has sensed an environmental variable that has exceeded a threshold. At least one of the first active unit and second active unit comprises an active cover plate. The active cover plate may be installed over an electrical receptacle and one of the first active unit and second active unit may be an outdoor active unit. For example, the first active unit may be an outdoor unit and the second active unit may be an indoor active cover plate installed over an electrical receptacle, wherein the first active unit senses motion and the second active cover plate illuminates indoors. In some embodiments, the active units may all be indoors or all outdoors.

In one embodiment, an active cover plate or other active unit may include a light source with a first lighting configuration and a second lighting configuration; an environmental light detector configured to detect an ambient light level; a sensor wherein the sensor is configured to detect presence, proximity, or motion of an object; and a controller. The environmental light detector may be configured to detect an ambient light level above a threshold and produce a first signal. The sensor may detect a presence, proximity or motion of an object, and may produce a second signal. The controller is configured to accept the first signal and the second signal and produce a third signal (such as a transmission or broadcast signal). For example, a system of active cover plates/units may include a light source with a first lighting configuration and a second lighting configuration; an environmental light detector configured to detect an ambient light level; a sensor wherein the sensor is configured to detect presence, proximity, or motion of an object; and a controller. The first active cover plate/unit may be configured to use the detector to detect an ambient light level above a threshold and produce a first signal and the sensor may be configured to detect a presence, proximity or motion of an object, and produces a second signal. The controller may be configured to accept the first signal and the second signal and produce a third signal transmitted wirelessly, wherein a second active cover plate/unit receives the third signal and changes from a first lighting configuration to a second lighting configuration. In some configurations, the first active cover plate/unit may not change its lighting configuration after accepting the first signal and second signal. In some examples the first active cover plate/unit may not change lighting configuration when the environmental light detector detects an ambient light level above a threshold. In other examples, the first active cover plate/unit may not change lighting configuration because it has been set/instructed/configured not to respond. In some illustrative systems, each active cover plate/unit further comprises a face plate and prongs extending rearward from the face plate to interface with side screw terminals on an electrical outlet or light switch. The third signal may include an asynchronous broadcast. The asynchronous broadcast, or other third signal may be configured to be received by an unlimited number of active cover plates/units. The limitation on how many active cover plates/units is not based on a mesh network protocol or other limited interaction between plates/units, but on the power of the signal received by the receiving unit. The power of the signal received may be based on any of a number of parameters, including the broadcast strength, the distance between the units, antenna configurations, and any intervening elements that may shield, absorb or block the third signal. In one embodiment, the third signal may include a synchronous transmission/broadcast without corruption or degrading the signal, such that the third signal does not require arbitration or anti-collision measures. The third signal may or may not be a serialized transmission. In some embodiments, each of the active cover plates/units may include a channel setting where the active cover plates/units on the same channel communicate. For example, each of the active cover plates/units may further include channel setting(s) wherein active cover plates on the same channel receive communication from other active cover plate on the same channel.

In some illustrative embodiments, an active cover plate/unit may include a faceplate configured to fit around outlets; prongs extending from faceplate to contact side screw terminal on outlets; and a light source. The plate/unit may include integrated electronics with a first switch configured to adjust brightness of the light source; a second switch configured to select a send/receive channel for wireless communications; and a third switch configured to select timeout duration. The first, second, and third switches are manually manipulatable for selection by the user.

In any or all of the embodiments above, the active cover plate may be configured to fit around outlets and/or to be programmed using a mobile device.

In one embodiment, a system may include a first active unit with at least one sensor module, an action module, and a communication module; and a second active unit. The sensor module of the first active unit senses at least one environmental variable that exceeds a threshold that indicates an action should be taken, and transmits a signal indicating that the environmental variable has exceeded a threshold, and wherein the action module of the first active unit does not take the action; and wherein the second active unit receives the signal and takes action based on the signal. The second active unit may include an action module and a communication module. The second active unit may include at least one sensor, an action module and a communication module. In some cases the second active unit may be substantially identical to the first active unit but may be configured to take action based on detected events, environmental variables, received signals, etc. The first active unit may be configured by the user to take no action when an environmental variable that is sensed by the sensor in the first active unit indicates that the threshold has been exceeded. For example, the action module of the first active unit may be configured to take no action when a signal is received by its communication module, wherein the signal indicates that a sensor in the second active unit has sensed an environmental variable has exceeded a threshold. In some embodiments, one or both of the first active unit and second active unit may be active cover plates that are configured to be installed over an electrical receptacle or one or both of the first active unit and second active unit may include an outdoor active unit. In one embodiment, the first active unit is an outdoor unit and the second active unit is an indoor active cover plate installed over an electrical receptacle, wherein the first active unit senses motion and the second active cover plate illuminates indoors. Additionally or alternatively, first and second active units are active cover plates configured to be installed over electrical receptacles, and wherein the sensor module in the first active unit may include a light sensor and a motion sensor and the action module in the first active unit may include an illumination source. The second active unit may include a sensor module with a light sensor and a motion sensor and the action module in the second active unit may include an illumination source. In some examples, the first or second unit checks the lighting sensor before illuminating. If the area is bright, it will not illuminate but will still signal the other unit.

In one embodiment, an active cover plate may include a light source with a first lighting configuration and a second lighting configuration; an environmental light detector configured to detect an ambient light level; at least one sensor wherein the sensor is configured to detect presence, proximity, or motion of an object; and a controller. The environmental light detector may detect an ambient light level above a threshold and produces a first signal. The sensor may detect a presence, proximity or motion of an object, and may produce a second signal; the controller may be configured to accept the first signal and the second signal and create a transmitted signal and/or send instructions to an action module.

In some examples, the active units may operate even when the area is illuminated and detect motions to send out a signal to other active units. For example, an active unit may operate continuously to gather information from its sensors regarding environmental parameters. In some embodiments, the active unit may operating in sunlight to detect motion and send a notification to other active units when an event occurs (e.g. the mailman/deliveryman drops off a package and the user may want a chime to ding, a door to unlock, or illuminate an active unit indoors, etc.).

The preceding description has been presented only to illustrate and describe examples of the principles described. This description is not intended to be exhaustive or to limit these principles to any precise form disclosed. Many modifications and variations are possible in light of the above teaching.

What is claimed is:

1. An active unit comprising:
   at least one sensor to detect a change in an environmental variable and generate a sensor signal;
   an action module configured to influence the environmental variable;
   a communication module;
   a processor module configured to accept the sensor signal and determine if the environmental variable exceeds a threshold and to instruct the action module not to take action to influence the environmental variable, and instruct the communication module to transmit a signal to other active units that the environmental variable has exceeded the threshold.

2. The active unit of claim 1, wherein the at least one sensor comprises a motion sensor and the active unit may further be configured by user input to instruct the processor to broadcast a signal indicating that motion has been detected.

3. The active unit of claim 1, wherein the active unit comprises prongs configured to contact screw terminals of an electrical receptacle, thereby supplying electrical power to the active unit.

4. The active unit of claim 1, wherein the at least one sensor comprises:

a motion sensor configured to detect motion in an area around the active unit and produce a sensor output signal indicating that motion has been detected; and a light sensor configured to detect ambient light in an area around the active unit and produce a light level signal.

5. The active unit of claim 1, wherein the action module comprises a light module, wherein the processor module is configured not to illuminate the light module when the area is dark and motion is detected.

6. The active unit of claim 1, wherein the communication module is configured to broadcast a signal indicating that motion has been detected in the area around the active unit.

7. The active unit of claim 1, wherein the processor module is configured to:
accept a sensor output signal indicating that motion has been detected,
accept a light level signal indicating that the area around the active unit is dark;
instruct a light module in the action module not to illuminate the area around the active unit; and
instruct the communication module to broadcast a signal indicating that motion has been detected in an area around the active unit.

8. The active unit of claim 1, wherein the active unit further comprises:
a first user input configured to instruct the processor not to illuminate the light module when the area is dark and motion is detected, and
a second user input configured to instruct the processor to broadcast a signal indicating that motion has been detected.

9. The active unit of claim 8, wherein the first user input comprises a first manually manipulatable switch with a setting configured to instruct the processor not to illuminate the light module when the area is dark and motion is detected; and the second user input comprises a second manually manipulatable switch with a setting configured to instruct the processor to broadcast a signal indicating that motion has been detected while the light module is not illuminated.

10. The active unit of claim 1, wherein the communication module is configured to broadcast a signal indicating that motion has been detected to all other active units within range.

11. The active unit of claim 10, wherein the broadcast signal indicating that motion has been detected comprises one of an optical signal and a radio frequency signal.

12. The active unit of claim 1, wherein the active unit comprises a user selectable group setting configured to designate groups of active units that communicate with each other.

13. The active unit of claim 1, wherein the active unit is configured to receive a signal from another active unit indicating that a change in the environmental variable has been detected.

14. The active unit of claim 13, wherein the processor is configured to:
determine if the signal is from another active unit in the same group as the active unit and accept the signal if it is from another active unit in the same group; and
determine that no action should be taken based on a user selectable setting.

15. The active unit of claim 13, wherein the processor is configured to rebroadcast the signal received.

16. A lighting system comprising:
a first active unit comprising: at least one sensor, an action module, and a communication module; and
at least one second active unit;
wherein the at least one sensor is configured to sense at least one environmental variable, wherein the first active unit is configured such that when the environmental variable exceeds a threshold performing a designated action is indicated, wherein the first active unit transmits signal indicating that the environmental variable has exceeded a threshold, and wherein the action module of the first active unit does not take the designated action; and wherein the second active unit receives the signal and takes the designated action based on the signal.

17. The system of claim 16, wherein the second active unit comprises an action module and a communication module.

18. The system of claim 16, wherein the second active unit is substantially identical in structure to the first active unit.

19. The system of claim 16, wherein the second active unit may include at least one sensor, an action module, and a communication module.

20. The system of claim 16, wherein the first active unit is configured by the user to take no action when an environmental variable that is sensed by the sensor in the first active unit indicates that the threshold has been exceeded.

21. The system of claim 16, wherein the action module of the first active unit may be configured to take no action when a signal is received by its communication module, wherein the signal indicates that a sensor in the second active unit has sensed an environmental variable that has exceeded a threshold.

22. The system of claim 16, wherein at least one of the first active unit and second active unit comprises an active cover plate.

23. The system of claim 16, wherein one of the first active unit and second active unit is installed over an electrical receptacle and one of the first active unit and second active unit may be an outdoor active unit.

24. The system of claim 16, wherein the first active unit may be an outdoor unit and the second active unit may be an indoor active cover plate installed over an electrical receptacle, wherein the first active unit senses motion and the second active cover plate illuminates indoors.

25. The system of claim 16, wherein the first active unit and second active unit may be active cover plates that are configured to be installed over electrical receptacles, and wherein the sensor module in the first active unit comprises a light sensor and a motion sensor and wherein the action module in the first active unit comprises an illumination source, and wherein the second active unit comprises a sensor module comprising a light sensor and a motion sensor, and the action module in the second active unit comprises an illumination source.

26. The system of claim 16, wherein the first active unit checks the ambient light sensor before illuminating and if the surroundings are bright then the first active unit doesn't turn on the illumination source, but still signals the second active unit.

27. The system of claim 16, wherein the communication module of the first active unit broadcasts a signal to the second active unit.

28. The system of claim 27, wherein the broadcast signal is received and processed by all active units that are within range.

29. The system of claim 27, wherein the system comprises a plurality of active units, wherein the active units are divided into groups and only the group that the first active unit belongs to will take action based on a signal from the first active unit, wherein the second active unit is in the same group as the second active unit.

30. The system of claim 16, wherein the signal from the first active unit is broadcast when the first active unit is configured not to take action and when the first active unit is in a lighted area.

31. The system of claim 16, wherein signals from the active units are broadcast without arbitration or anti-collision measures using synchronous timing for the broadcast and wherein the active units take asynchronous action.

32. The system of claim 16, wherein the active units comprise:
- active cover plates that are configured to be installed over electrical receptacles, the active cover plates comprise a faceplate and prongs that extend off the back of the faceplates;
- outdoor active units powered by solar cells;
- wherein the active cover plate and outdoor active units are grouped together in a group and wherein wireless communications between the active cover plates and the outdoor active units are configured to illuminate all units in the group in response to one unit in the group detecting motion.

* * * * *